US012004423B2

(12) United States Patent
Huh et al.

(10) Patent No.: US 12,004,423 B2
(45) Date of Patent: Jun. 4, 2024

(54) ORGANIC LIGHT EMITTING DEVICE

(71) Applicant: LG CHEM, LTD., Seoul (KR)

(72) Inventors: Jungoh Huh, Daejeon (KR); Sung Kil Hong, Daejeon (KR); Dong Uk Heo, Daejeon (KR); Miyeon Han, Daejeon (KR); Jae Tak Lee, Daejeon (KR); Junghoon Yang, Daejeon (KR); Heekyung Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 834 days.

(21) Appl. No.: 17/057,419

(22) PCT Filed: Jul. 25, 2019

(86) PCT No.: PCT/KR2019/009259

§ 371 (c)(1),
(2) Date: Nov. 20, 2020

(87) PCT Pub. No.: WO2020/022811

PCT Pub. Date: Jan. 30, 2020

(65) Prior Publication Data

US 2021/0217967 A1 Jul. 15, 2021

(30) Foreign Application Priority Data

Jul. 25, 2018 (KR) ........................ 10-2018-0086643

(51) Int. Cl.
*H01L 51/50* (2006.01)
*H10K 85/60* (2023.01)
(Continued)

(52) U.S. Cl.
CPC ....... *H10K 85/6574* (2023.02); *H10K 85/654* (2023.02); *H10K 50/11* (2023.02);
(Continued)

(58) Field of Classification Search
None
See application file for complete search history.

(56) References Cited

U.S. PATENT DOCUMENTS 10,367,147 B2 7/2019 Kim et al.
2009/0174315 A1 7/2009 Furukawa et al.
(Continued)

FOREIGN PATENT DOCUMENTS

EP 3524660 A1 8/2019
KR 10-2008-0095244 A 10/2008
(Continued)

*Primary Examiner* — Gregory D Clark
(74) *Attorney, Agent, or Firm* — Bryan Cave Leighton Paisner LLP

(57) ABSTRACT

An organic light emitting device having a first organic material layer that includes a compound of Chemical Formula 1 and the second organic material layer that includes a compound of Chemical Formula 2, Chemical Formula 1

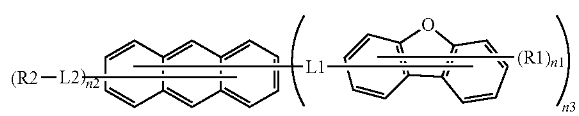

Chemical Formula 2

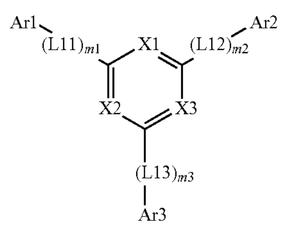

11 Claims, 2 Drawing Sheets

(51) Int. Cl.

| | |
|---|---|
| *H10K 50/11* | (2023.01) |
| *H10K 50/13* | (2023.01) |
| *H10K 50/18* | (2023.01) |
| *H10K 101/10* | (2023.01) |

(52) U.S. Cl.
CPC ........... *H10K 50/131* (2023.02); *H10K 50/18* (2023.02); *H10K 2101/10* (2023.02)

(56) References Cited

U.S. PATENT DOCUMENTS

| | | | | |
|---|---|---|---|---|
| 2019/0214571 | A1 | 7/2019 | Huh et al. | |
| 2019/0214572 | A1* | 7/2019 | Cho | C09K 11/06 |
| 2019/0296243 | A1* | 9/2019 | Suh | H10K 85/615 |

FOREIGN PATENT DOCUMENTS

| | | | |
|---|---|---|---|
| KR | 10-1593368 | B1 | 2/2016 |
| KR | 10-2016-0141359 | A | 12/2016 |
| KR | 10-2016-0141361 | A | 12/2016 |
| KR | 10-2017-0032414 | A | 3/2017 |
| KR | 10-1755986 | B1 | 7/2017 |
| KR | 10-2017-0134264 | A | 12/2017 |
| KR | 10-2018-0022190 | A | 3/2018 |
| KR | 10-2018-0037695 | A | 4/2018 |
| KR | 10-2018-0069423 | A | 6/2018 |
| KR | 10-2018-0103021 | A | 9/2018 |
| KR | 10-2018-0111558 | A | 10/2018 |

* cited by examiner

【FIG. 1】
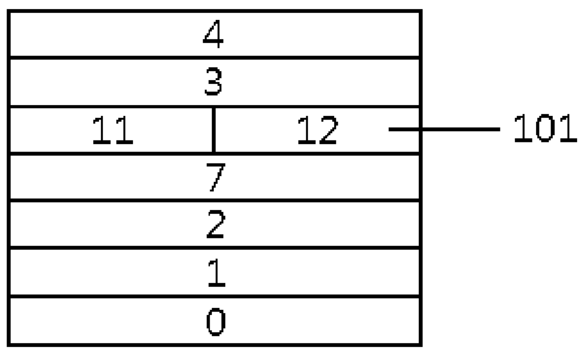
【FIG. 2】
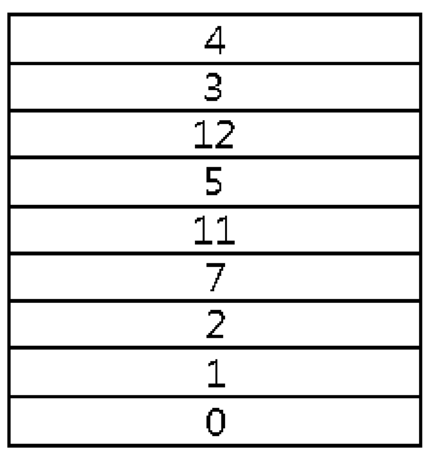

【FIG. 3】
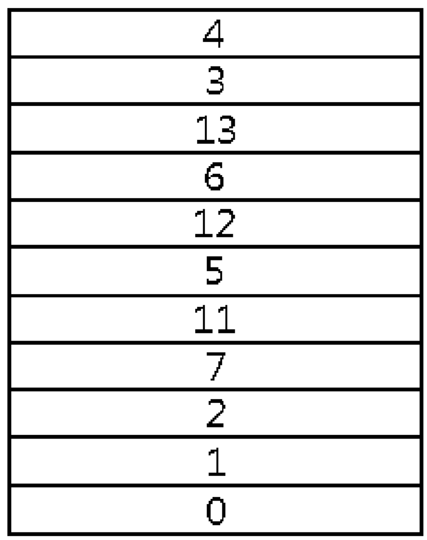
【FIG. 4】
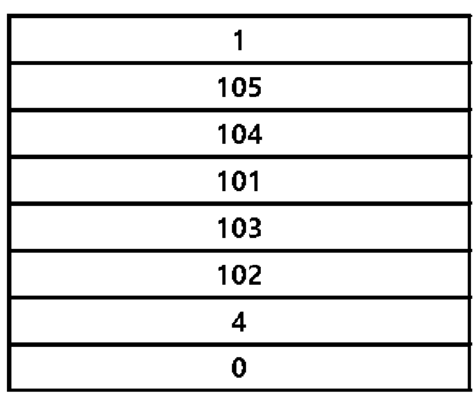

ORGANIC LIGHT EMITTING DEVICE

This application is a National Stage Application of International Application No. PCT/KR2019/009259, filed on Jul. 25, 2019, which claims priority to and the benefits of Korean Patent Application No. 10-2018-0086643, filed with the Korean Intellectual Property Office on Jul. 25, 2018, the entire contents of which are incorporated herein by reference.

TECHNICAL FIELD

The present disclosure relates to an organic light emitting device.

BACKGROUND

Interests and demands for a display field have been rapidly growing recently, and among display apparatuses, an organic light emitting device has received attention with low power consumption and potential of a thin device.

Accordingly, development of organic light emitting devices having excellent efficiency and long lifetime properties has been continued. Particularly, blue light emitting devices have problems of having significantly inferior efficiency and lifetime compared to green and red phosphorescent devices, and studies on methods to dramatically increase efficiency and lifetime of blue light emitting devices have been continued.

(Patent Document 1) Korean Patent Application Laid-Open Publication No. 10-2008-0095244

Technical Problem

The present disclosure describes an organic light emitting device having low driving voltage, high efficiency and long lifetime properties.

Technical Solution

One embodiment of the present disclosure provides an organic light emitting device including a first electrode; a second electrode provided opposite to the first electrode; and a first organic material layer and a second organic material layer provided between the first electrode and the second electrode, wherein the first organic material layer includes a compound of the following Chemical Formula 1, and the second organic material layer includes a compound of the following Chemical Formula 2.

Chemical Formula 1

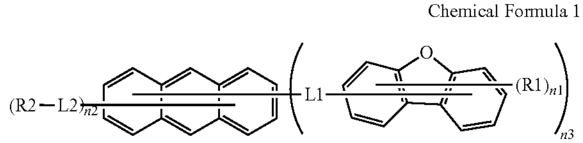

In Chemical Formula 1,

L1 and L2 are the same as or different from each other, and each independently a direct bond; or a substituted or unsubstituted arylene group, R1 and R2 are the same as or different from each other, and each independently hydrogen; deuterium; a halogen group; a cyano group; a nitro group; a substituted or unsubstituted alkyl group; a substituted or unsubstituted haloalkyl group; a substituted or unsubstituted haloalkoxy group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring, n1 is an integer of 0 to 7, and when n1 is 2 or greater, the two or more R1s are the same as or different from each other, n2 is an integer of 0 to 9, and when n2 is 2 or greater, the two or more -L2-R2s are the same as or different from each other, and n3 is 1 or 2, and when n3 is 2, substituents in the two parentheses are the same as or different from each other, and $1 \leq n2+n3 \leq 10$, Chemical Formula 2

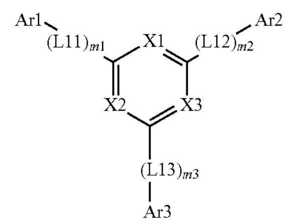

in Chemical Formula 2, at least one of X1 to X3 is N, and the rest are CR,

R and Ar1 to Ar3 are the same as or different from each other, and each independently hydrogen; deuterium; a cyano group; a nitrile group; a substituted or unsubstituted silyl group; a substituted or unsubstituted alkyl group; a substituted or unsubstituted haloalkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring, and at least one of Ar1 to Ar3 is of the following Chemical Formula 3, L11 to L13 are the same as or different from each other, and each independently a direct bond; a substituted or unsubstituted arylene group; or a substituted or unsubstituted divalent heterocyclic group, and m1 to m3 are each an integer of 0 to 3, and when m1 to m3 are each 2 or greater, substituents in the two or more parentheses are the same as or different from each other, Chemical Formula 3

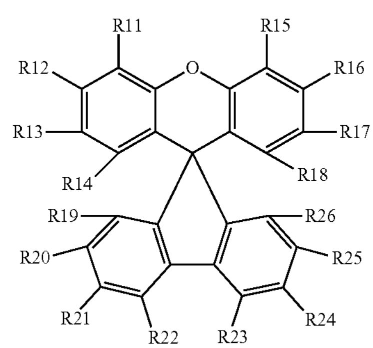

in Chemical Formula 3, any one of R11 to R26 is linked to any one of L11 to L13, and the rest are hydrogen; deuterium; a cyano group; a nitrile group; a substituted or unsubstituted alkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring.

Advantages

By an organic light emitting device of the present disclosure including a compound of Chemical Formula 1 in a first organic material layer and a compound of Chemical Formula 2 in a second organic material layer, a device having low driving voltage, excellent efficiency, and long lifetime can be obtained.

BRIEF DESCRIPTION OF THE DRAWINGS

FIGS. 1 to 4 illustrate examples of an organic light emitting device of the present disclosure.

REFERENCE NUMERAL

0: Substrate
1: Cathode
2: Electron Transfer Layer
3: Hole Transfer Layer
4: Anode
5: Organic Material Layer
6: Organic Material Layer
7: Hole Blocking Layer or Electron Control Layer
11: Light Emitting Layer 1
12: Light Emitting Layer 2
13: Light Emitting Layer 3
101: Light Emitting Layer
102: Hole Injection Layer
103: Hole Transfer Layer
104: Hole Blocking Layer or Electron Control Layer
105: Electron Injection and Transfer Layer

DETAILED DESCRIPTION

Hereinafter, the present specification will be described in more detail.

An organic light emitting device of the present disclosure includes a first electrode; a second electrode provided opposite to the first electrode; and a first organic material layer and a second organic material layer provided between the first electrode and the second electrode, wherein the first organic material layer includes a compound of the following Chemical Formula 1, and the second organic material layer includes a compound of the following Chemical Formula 2. By the first organic material layer and the second organic material layer each including a dibenzofuran-based compound or a xanthene-based compound including an oxygen (O) atom at the same time, a device having excellent properties may be obtained by increasing a migration rate of electrons.

Particularly, according to one embodiment of the present disclosure, the first organic material layer and the second organic material layer may be provided adjacent to each other. Herein, by the first organic material layer and the second organic material layer each including a dibenzofuran-based compound or a xanthene-based compound including an oxygen (O) atom at the same time, molecular arrangements favorably occur by the influence of the substituents including an oxygen (O) atom when forming an organic material layer film, which hardens a film quality, and is thereby effective in improving a device lifetime. In addition, a rate of electron migration increases by decreasing a barrier between interfaces, and a decrease in the voltage, an increase in the efficiency and an increase in the lifetime are obtained in a device.

Chemical Formula 1

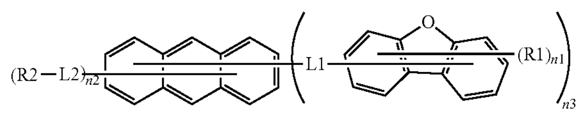

In Chemical Formula 1,

L1 and L2 are the same as or different from each other, and each independently a direct bond; or a substituted or unsubstituted arylene group, R1 and R2 are the same as or different from each other, and each independently hydrogen; deuterium; a halogen group; a cyano group; a nitro group; a substituted or unsubstituted alkyl group; a substituted or unsubstituted haloalkyl group; a substituted or unsubstituted haloalkoxy group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring, n1 is an integer of 0 to 7, and when n1 is 2 or greater, the two or more R1s are the same as or different from each other, n2 is an integer of 0 to 9, and when n2 is 2 or greater, the two or more -L2-R2s are the same as or different from each other, and n3 is 1 or 2, and when n3 is 2, substituents in the two parentheses are the same as or different from each other, and $1 \leq n2+n3 \leq 10$, Chemical Formula 2

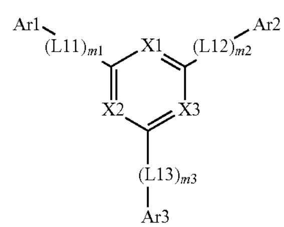

in Chemical Formula 2, at least one of X1 to X3 is N, and the rest are CR,

R and Ar1 to Ar3 are the same as or different from each other, and each independently hydrogen; deuterium; a cyano group; a nitrile group; a substituted or unsubstituted silyl group; a substituted or unsubstituted alkyl group; a substituted or unsubstituted haloalkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring, and at least one of Ar1 to Ar3 is of the following Chemical Formula 3, L11 to L13 are the same as or different from each other, and each independently a direct bond; a substituted or unsubstituted arylene group; or a substituted or unsubstituted divalent heterocyclic group, and m1 to m3 are each an integer of 0 to 3, and when m1 to m3 are each 2 or greater, substituents in the two or more parentheses are the same as or different from each other, Chemical Formula 3

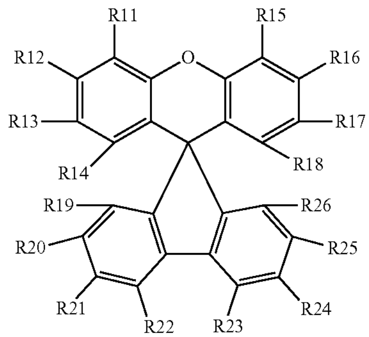

in Chemical Formula 3, any one of R11 to R26 is linked to any one of L11 to L13, and the rest are hydrogen; deuterium; a cyano group; a nitrile group; a substituted or unsubstituted alkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring.

In the present disclosure, the first organic material layer and the second organic material layer being provided 'adjacent' to each other means one surface of the first organic material layer and one surface of the second organic material layer being formed to be in contact with each other physically.

In the present disclosure, a description of a certain part "including" certain constituents means capable of further including other constituents, and does not exclude other constituents unless particularly stated on the contrary.

In the present disclosure, a description of a certain member being placed "on" another member includes not only a case of the one member adjoining the another member but a case of still another member being present between the two members.

Examples of substituents in the present disclosure will be described below, however, the substituents are not limited thereto.

The term "substitution" means a hydrogen atom bonding to a carbon atom of a compound is changed to another substituent. The position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present disclosure means being substituted with one, two or more substituents selected from the group consisting of deuterium; a halogen group; a cyano group (—CN); a nitro group; a silyl group; a boron group; an alkyl group; an alkenyl group; a haloalkyl group; a haloalkoxy group; a cycloalkyl group; an aryl group; and a heterocyclic group, or being substituted with a substituent linking two or more substituents among the substituents illustrated above, or having no substituents.

Examples of the substituents will be described below, however, the substituents are not limited thereto.

In the present disclosure, examples of the halogen group may include fluorine (—F), chlorine (—Cl), bromine (—Br) or iodine (—I).

In the present disclosure, the alkyl group may be linear or branched, and although not particularly limited thereto, the number of carbon atoms is preferably from 1 to 40. According to another embodiment, the number of carbon atoms of the alkyl group is from 1 to 20. According to another embodiment, the number of carbon atoms of the alkyl group is from 1 to 10. Specific examples of the alkyl group may include a methyl group, an ethyl group, a propyl group, an n-propyl group, an isopropyl group, a butyl group, an n-butyl group, an isobutyl group, a tert-butyl group, a pentyl group, an n-pentyl group and the like, but are not limited thereto.

In the present disclosure, the cycloalkyl group is not particularly limited, but preferably has 3 to 60 carbon atoms, and according to one embodiment, the number of carbon atoms of the cycloalkyl group is from 3 to 30. According to another embodiment, the number of carbon atoms of the cycloalkyl group is from 3 to 20. According to another embodiment, the number of carbon atoms of the cycloalkyl group is from 3 to 6. Specific examples thereof may include a cyclopropyl group, a cyclobutyl group, a cyclopentyl group, a cyclohexyl group, a cycloheptyl group, a cyclooctyl group and the like, but are not limited thereto.

In the present disclosure, the aryl group is not particularly limited, but preferably has 6 to 60 carbon atoms, and the aryl group may be a monocyclic aryl group or a polycyclic aryl group. According to one embodiment, the number of carbon atoms of the aryl group is from 6 to 30. According to one embodiment, the number of carbon atoms of the aryl group is from 6 to 20. When the aryl group is a monocyclic aryl group, examples thereof may include a phenyl group, a biphenyl group, a terphenyl group, a quaterphenyl group and the like, but are not limited thereto. Examples of the polycyclic aryl group may include a naphthyl group, an anthracenyl group, a phenanthrenyl group, a pyrenyl group, a perylenyl group, a triphenyl group, a chrysenyl group, a fluorenyl group, a triphenylenyl group, a phenalenyl group and the like, but are not limited thereto.

In the present disclosure, the fluorenyl group may be substituted, and two substituents may bond to each other to form a spiro structure.

When the fluorenyl group is substituted, a spirofluorenyl group such as

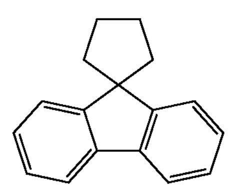 [SMILES: c1ccc2c(c1)-c1ccccc1C21CCCC1]

and

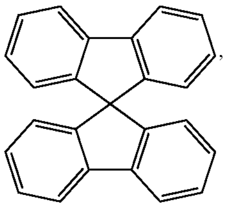 [SMILES: c1ccc2c(c1)-c1ccccc1C21c2ccccc2-c2ccccc21]

and a substituted fluorenyl group such as

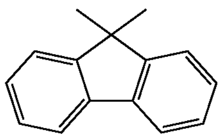

(9,9-dimethylfluorenyl group) and

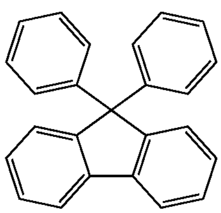 [SMILES: c1ccc(C2(c3ccccc3)c3ccccc3-c3ccccc32)cc1]

(9,9-diphenylfluorenyl group) may be included, however, the structure is not limited thereto.

In the present disclosure, the heterocyclic group is a cyclic group including one or more of N, O, S, P and Si as a heteroatom, and although not particularly limited thereto, the number of carbon atoms is preferably from 2 to 60. According to one embodiment, the number of carbon atoms of the heterocyclic group is from 2 to 30. Examples of heterocyclic group may include a pyridyl group, a furanyl group, a thiophenyl group, a dibenzofuranyl group, a carbazolyl group, a dibenzothiophenyl group, a naphthobenzofuranyl group, a naphthobenzothiophenyl group, a phenoxathiin group, a dibenzosilole group, an indenocarbazole group and the like, but are not limited thereto.

In the present disclosure, the descriptions on the heterocyclic group provided above may be applied to the heteroaryl group except for being aromatic.

In the present disclosure, the "ring" in the substituted or unsubstituted ring formed by bonding to each other means a hydrocarbon ring; or a heteroring.

The hydrocarbon ring may be aromatic, aliphatic or a fused ring of aromatic and aliphatic, and may be selected from among the examples of the cycloalkyl group or the aryl group except for those that are divalent.

In the present disclosure, the descriptions on the aryl group may be applied to the aromatic hydrocarbon ring except for those that are divalent.

In the present disclosure, the descriptions on the heterocyclic group may be applied to the heteroring except for those that are divalent.

In the present disclosure, the descriptions on the heteroaryl group may be applied to the aromatic heteroring except for those that are divalent.

In the present disclosure, the descriptions on the aryl group may be applied to the arylene group except for being divalent.

In the present disclosure, the descriptions on the heteroaryl group may be applied to the heteroarylene group except for being divalent.

According to one embodiment of the present disclosure, the first organic material layer is a light emitting layer.

According to one embodiment of the present disclosure, the first organic material layer is a light emitting layer, and the light emitting layer includes one or more types of the compound of Chemical Formula 1.

In another embodiment, the first organic material layer is a light emitting layer, and the light emitting layer includes the compound of Chemical Formula 1 as a host of the light emitting layer.

According to another embodiment, the first organic material layer is a light emitting layer, and the light emitting layer includes the compound of Chemical Formula 1 as a host of the light emitting layer, and may further include one or more types of a compound of the following Chemical Formula A and a compound of the following Chemical Formula B as a host. Herein, the compound of Chemical Formula 1, and a compound of the following Chemical Formula A and a compound of the following Chemical Formula B in the light emitting layer may have a weight ratio (weight of compound of Chemical Formula 1:weight of compound of Chemical Formula A and compound of Chemical Formula B) of 1:9 to 9:1.

Chemical Formula A

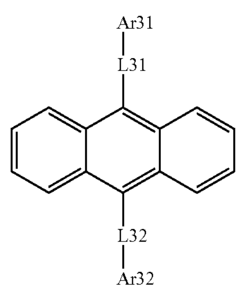

In Chemical Formula A,

L31 and L32 are the same as or different from each other, and each independently a direct bond; substituted or unsubstituted arylene having 6 to 60 carbon atoms; or substituted or unsubstituted heteroarylene having 2 to 60 carbon atoms and including any one or more heteroatoms selected from the group consisting of N, O and S, Ar31 and Ar32 are the same as or different from each other, and each independently substituted or unsubstituted aryl having 6 to 60 carbon atoms; or substituted or unsubstituted heteroaryl having 2 to 60 carbon atoms and including any one or more heteroatoms selected from the group consisting of N, O and S, Chemical Formula B

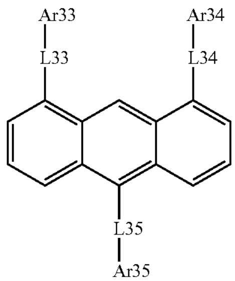

in Chemical Formula B,

L33, L34 and L35 are each independently a direct bond; substituted or unsubstituted arylene having 6 to 60 carbon atoms; or substituted or unsubstituted heteroarylene having 2 to 60 carbon atoms and including any one or more heteroatoms selected from the group consisting of N, O and S, and Ar33, Ar34 and Ar35 are each independently substituted or unsubstituted aryl having 6 to 60 carbon atoms; or substituted or unsubstituted heteroaryl having 2 to 60 carbon atoms and including any one or more heteroatoms selected from the group consisting of N, O and S.

In one embodiment of the present disclosure, the compound of Chemical Formula A is any one of the following structures.

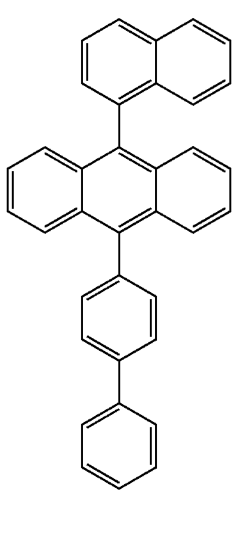

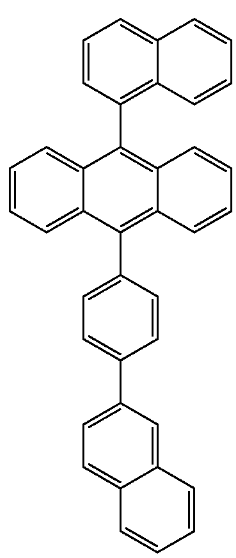

-continued

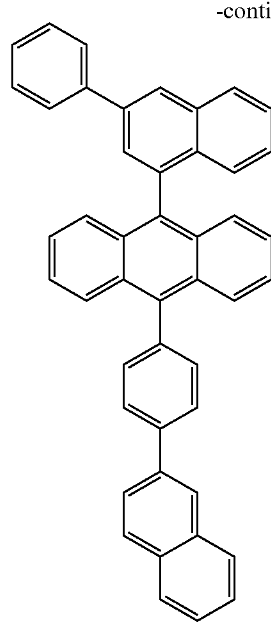

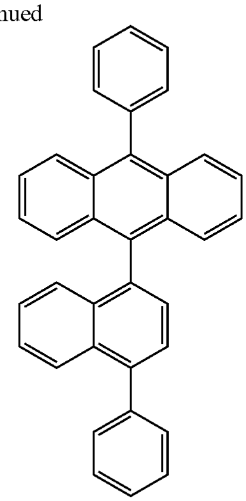

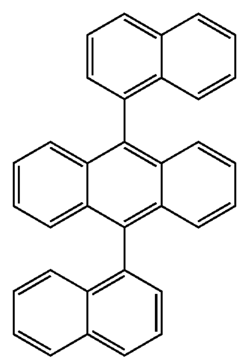

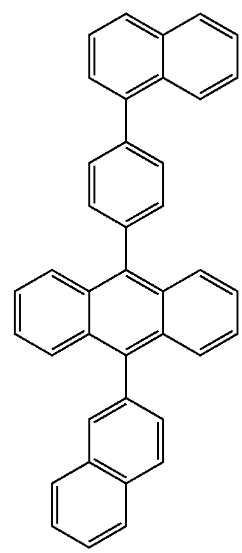

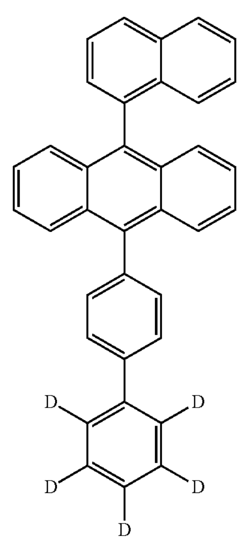

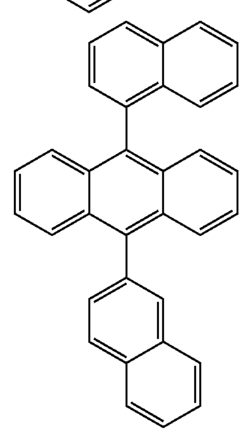

-continued
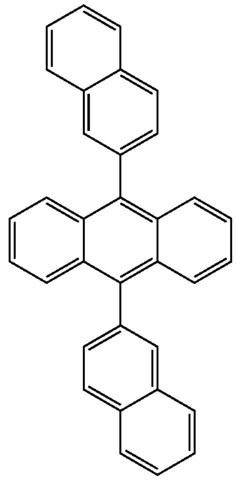
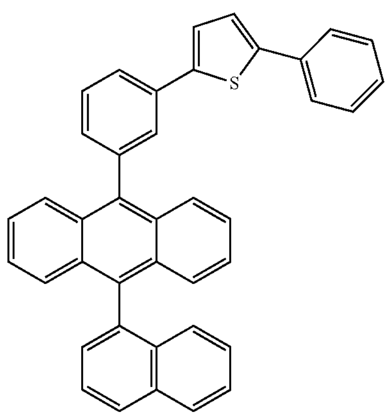
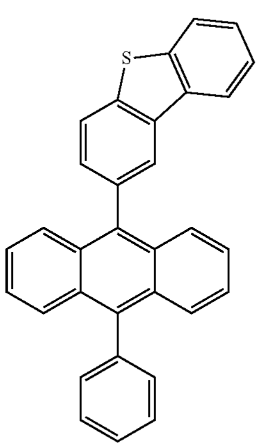
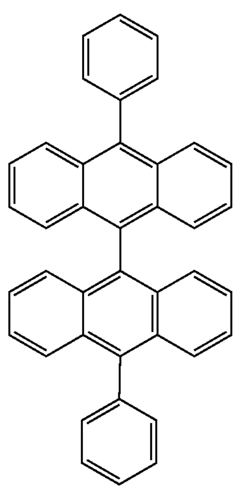
-continued
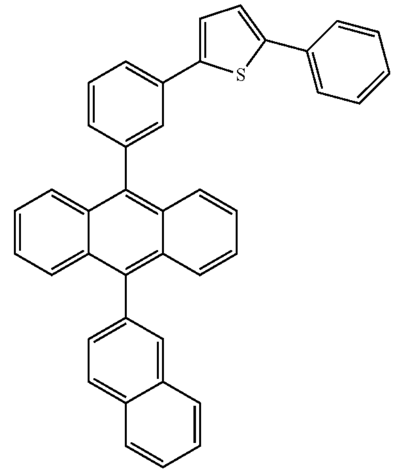
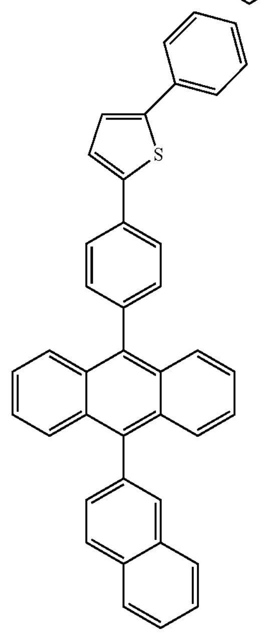
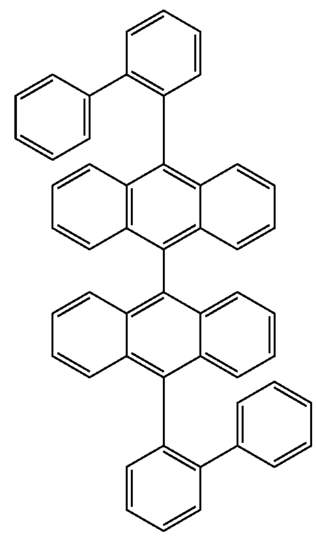
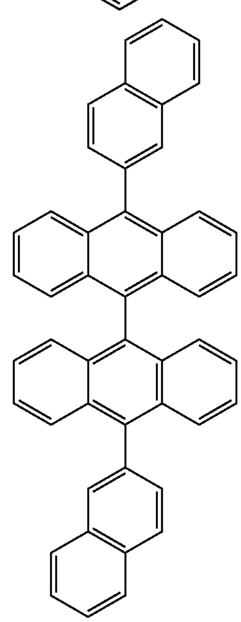
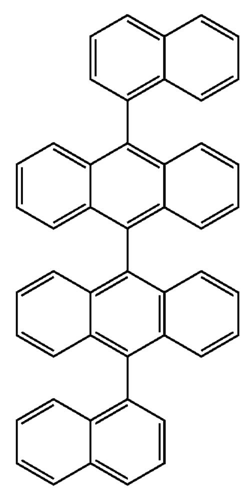

In another embodiment, the first organic material layer is a light emitting layer, and the light emitting layer includes the compound of Chemical Formula 1 as a host of the light emitting layer, and may further include a dopant. The dopant may be a fluorescent dopant or a phosphorescent dopant, and is preferably a fluorescent dopant. Herein, the dopant may be included in the light emitting layer in 0.1 parts by weight to 50 parts by weight and preferably in 1 parts by weight to 30 parts by weight based on 100 parts by weight of the host.

In the present disclosure, any one of the following structures may be used as the fluorescent dopant, however, the fluorescent dopant is not limited thereto.

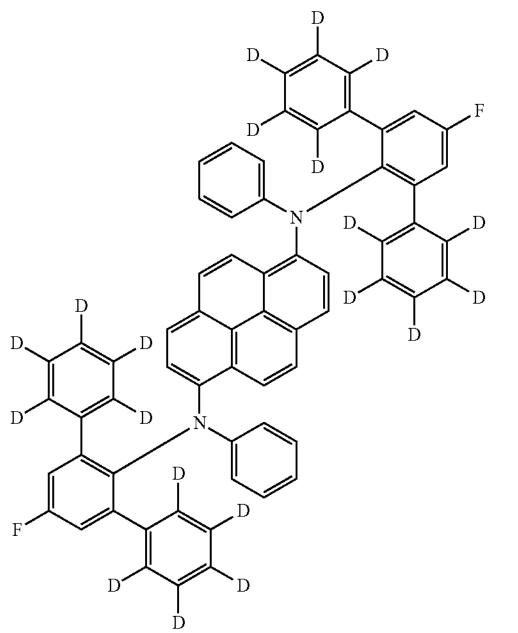

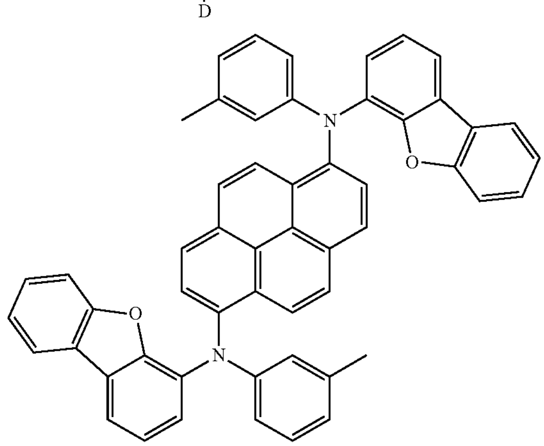

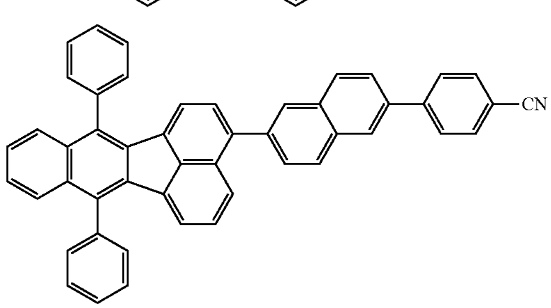

-continued

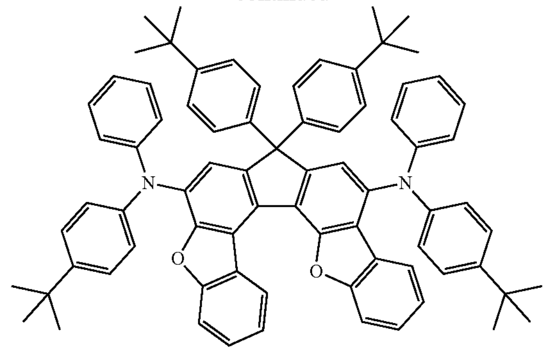

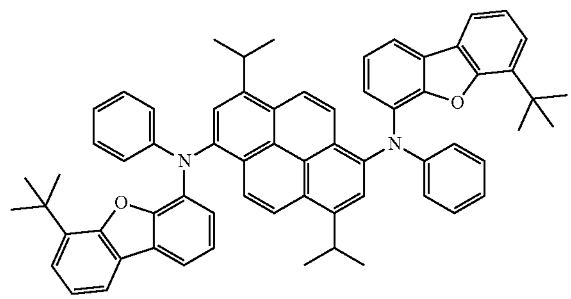

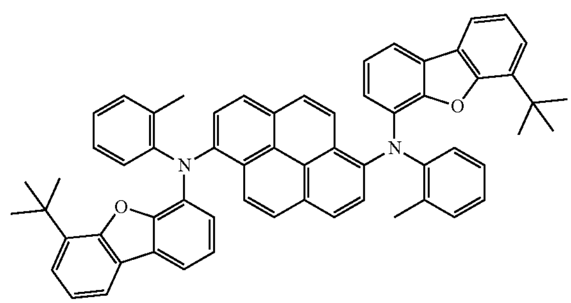

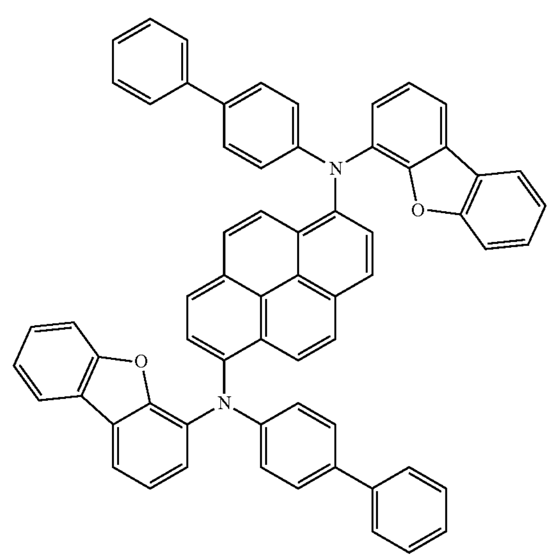

-continued
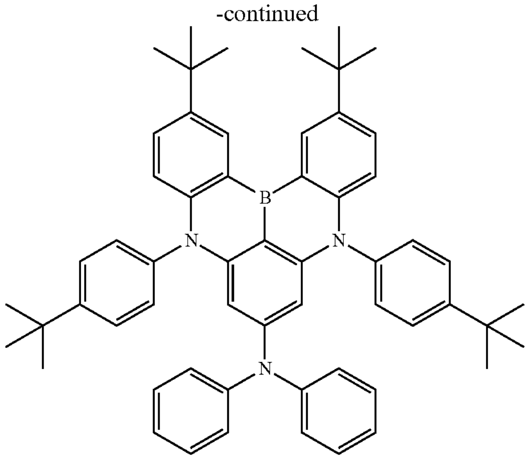
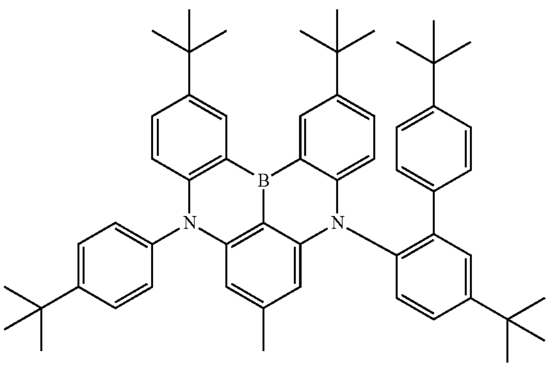
In the present disclosure, an Ir complex may be used as the phosphorescent dopant, and for example, any one of the following structures may be used, however, the phosphorescent dopant is not limited thereto.
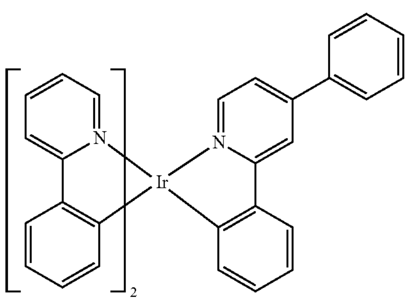
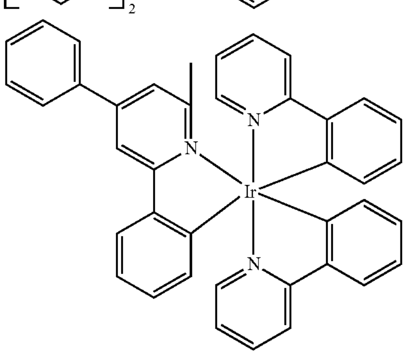
-continued
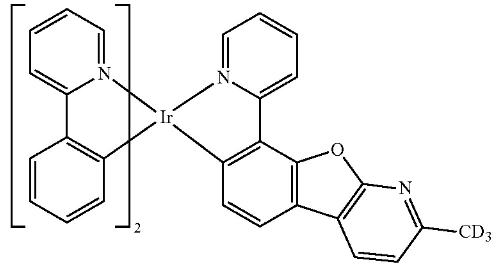
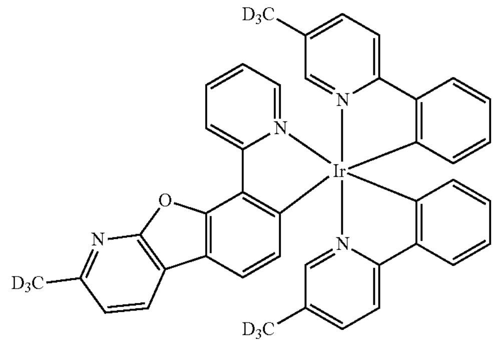
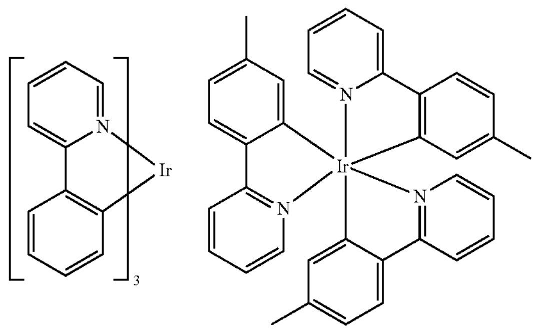
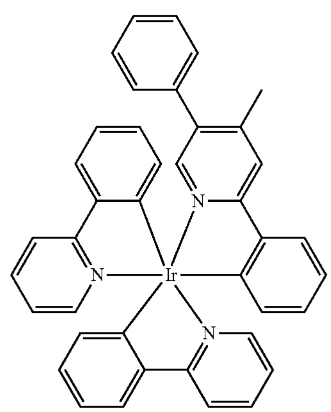

-continued

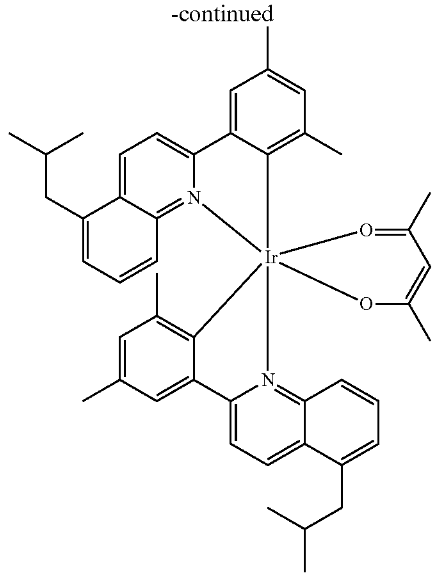

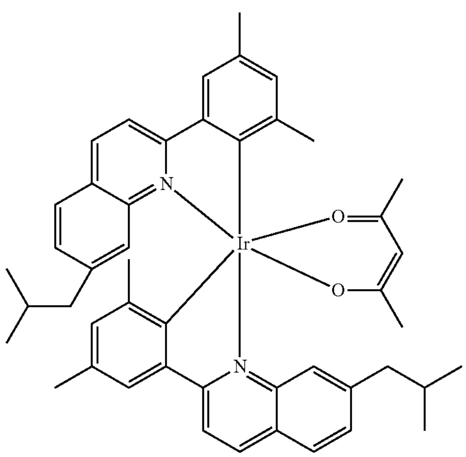

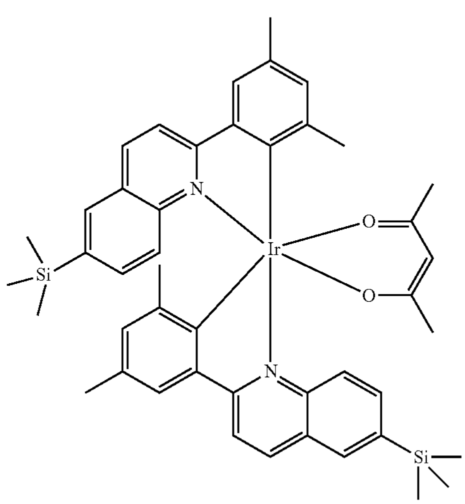

-continued

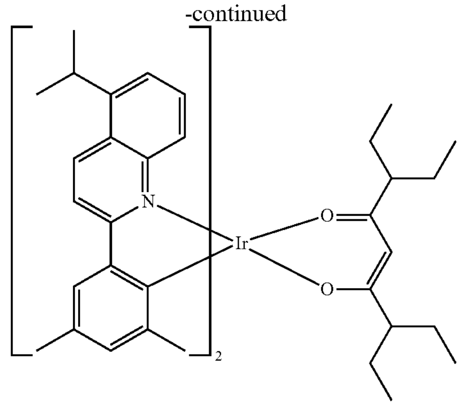

The first organic material layer includes the compound of Chemical Formula 1.

According to one embodiment of the present disclosure, n3 is 1 or 2, and when n3 is 2, substituents in the two parentheses are the same as or different from each other, and $1 \leq n2+n3 \leq 10$.

According to one embodiment of the present disclosure, n2 is an integer of 0 to 2, and when n2 is 2, the two -L2-R2s are the same as or different from each other.

According to one embodiment of the present disclosure, n1 is an integer of 0 to 2, and when n1 is 2, the two R1s are the same as or different from each other.

In one embodiment of the present disclosure, R1 is hydrogen; deuterium; a halogen group; a cyano group; a substituted or unsubstituted alkyl group having 1 to 20 carbon atoms; a substituted or unsubstituted aryl group having 6 to 60 carbon atoms; or a substituted or unsubstituted heterocyclic group having 2 to 60 carbon atoms, or bond to adjacent groups to form a substituted or unsubstituted aromatic hydrocarbon ring having 6 to 60 carbon atoms.

According to another embodiment, R1 is hydrogen or deuterium, or when n1 is 2, the two R1s bond to each other to form a substituted or unsubstituted aromatic hydrocarbon ring having 6 to 30 carbon atoms.

In another embodiment, R1 is hydrogen or deuterium, or when n1 is 2, the two R1s bond to each other to form a substituted or unsubstituted benzene ring, and form naphthobenzofuran.

According to another embodiment, R1 is hydrogen or deuterium, or when n1 is 2, the two R1s bond to each other to form a benzene ring, and form naphthobenzofuran.

According to one embodiment of the present disclosure, L1 is a direct bond; or a substituted or unsubstituted arylene group having 6 to 60 carbon atoms.

According to another embodiment, L1 is a direct bond; or a substituted or unsubstituted arylene group having 6 to 30 carbon atoms.

In another embodiment, L1 is a direct bond.

According to one embodiment of the present disclosure, L2 is a direct bond; or a substituted or unsubstituted arylene group having 6 to 60 carbon atoms.

According to another embodiment, L2 is a direct bond; or a substituted or unsubstituted arylene group having 6 to 30 carbon atoms.

In another embodiment, L2 is a direct bond; a substituted or unsubstituted phenylene group; a substituted or unsubstituted biphenylene group; a substituted or unsubstituted naphthylene group; or a substituted or unsubstituted phenanthrenylene group.

According to another embodiment, L2 is a direct bond; a phenylene group; a biphenylene group; a naphthylene group; or a phenanthrenylene group.

According to one embodiment of the present disclosure, R1 is hydrogen; deuterium; a halogen group; a cyano group; a substituted or unsubstituted alkyl group having 1 to 20 carbon atoms; a substituted or unsubstituted aryl group having 6 to 60 carbon atoms; or a substituted or unsubstituted heterocyclic group having 2 to 60 carbon atoms.

According to another embodiment, R1 is hydrogen; deuterium; a substituted or unsubstituted aryl group having 6 to 30 carbon atoms; or a substituted or unsubstituted heterocyclic group having 2 to 30 carbon atoms and including one or more of O, S and N as a heteroatom.

In another embodiment, R1 is hydrogen; deuterium; a substituted or unsubstituted phenyl group; a substituted or unsubstituted biphenyl group; a substituted or unsubstituted naphthyl group; a substituted or unsubstituted phenanthrenyl group; or a substituted or unsubstituted dibenzofuranyl group.

According to another embodiment, R1 is hydrogen; deuterium; a phenyl group; a biphenyl group; a naphthyl group; a phenanthrenyl group; or a dibenzofuranyl group.

In one embodiment of the present disclosure, the compound of Chemical Formula 1 is any one of the following structures.

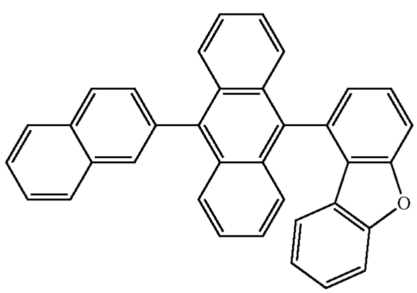

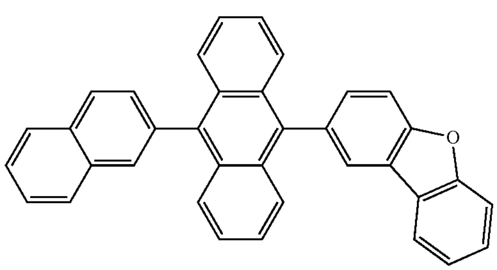

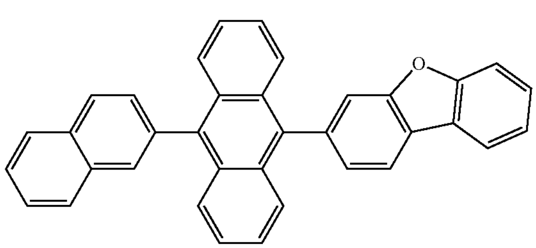

-continued

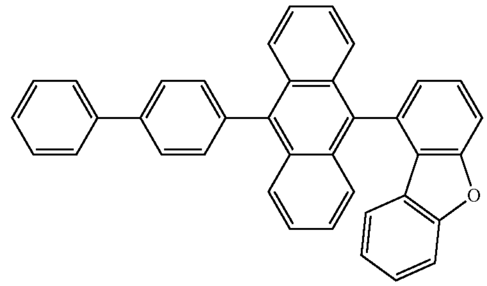

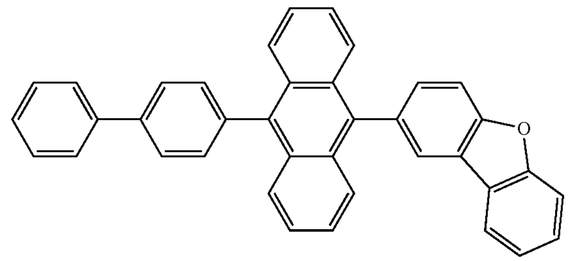

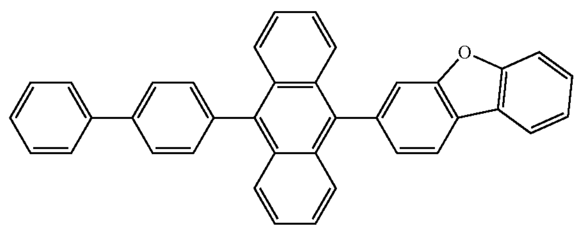

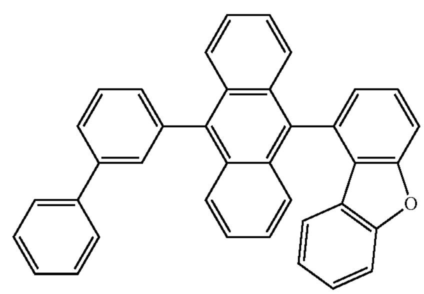

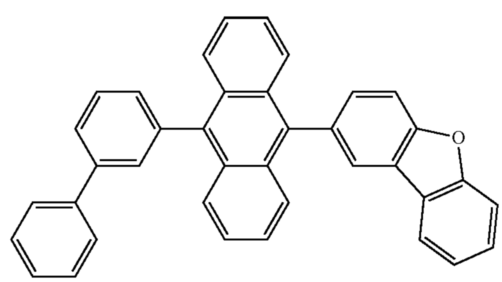

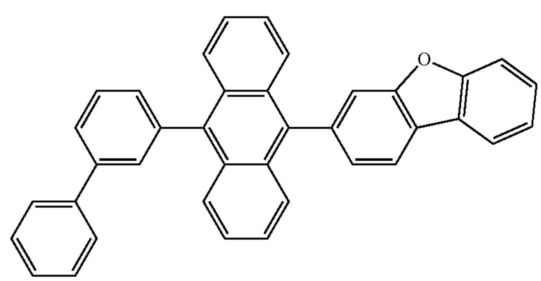

-continued
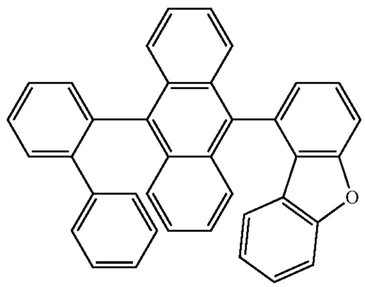
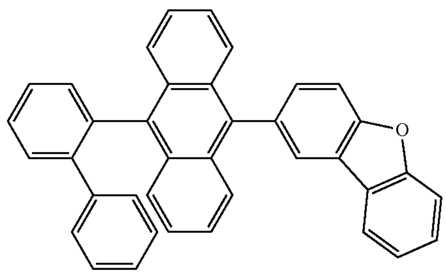
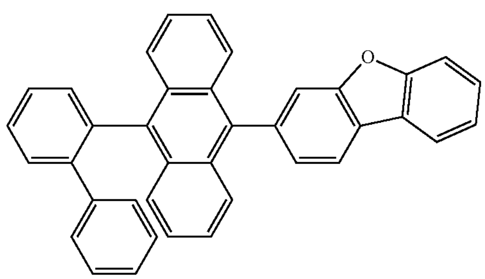
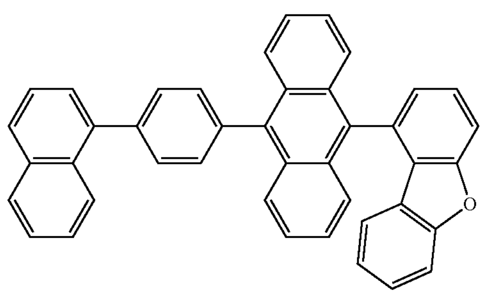
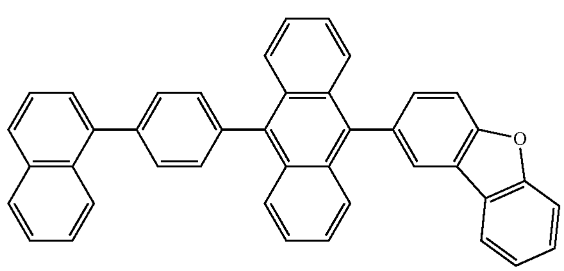
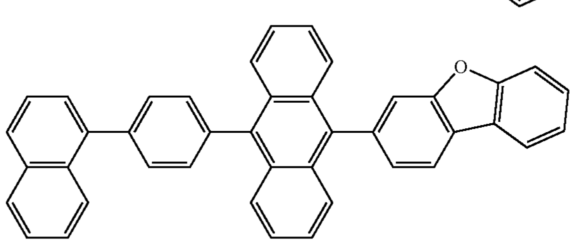
-continued
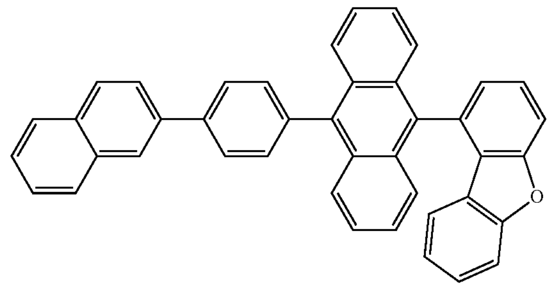
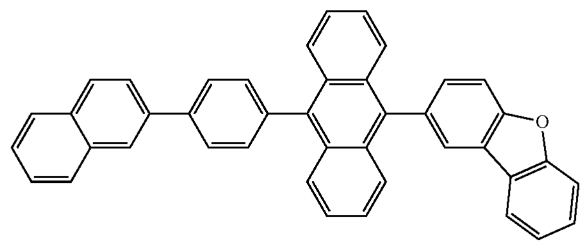
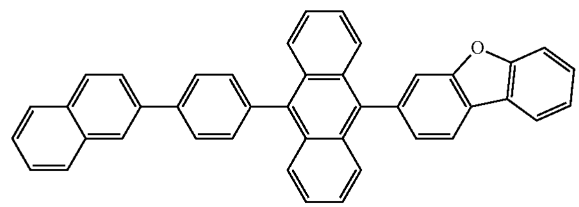
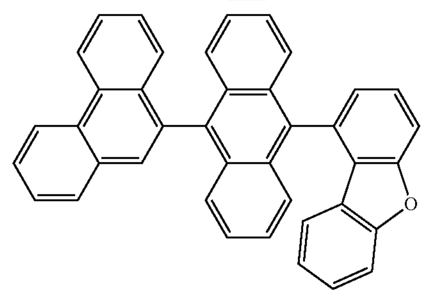
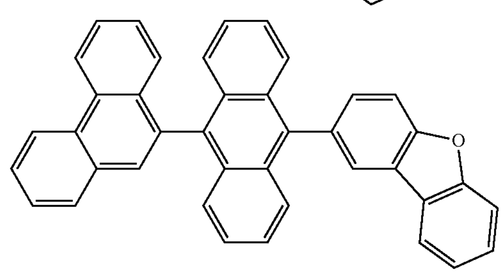
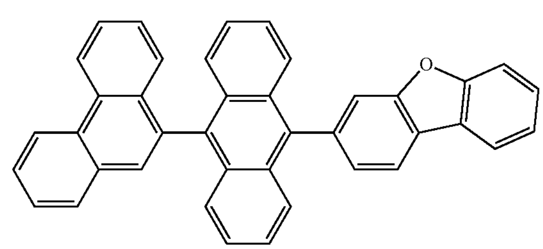

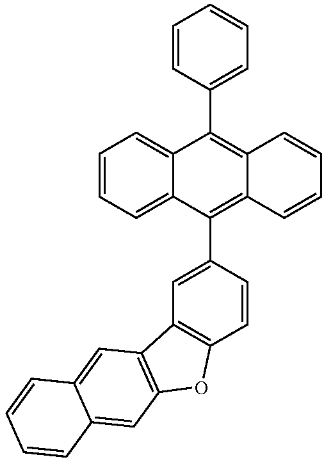
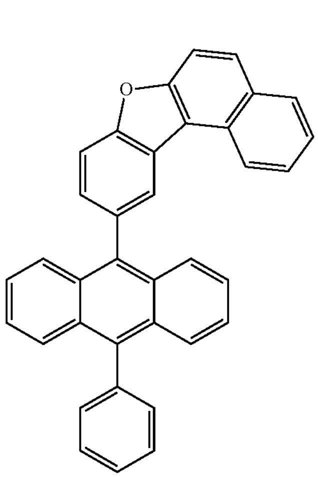
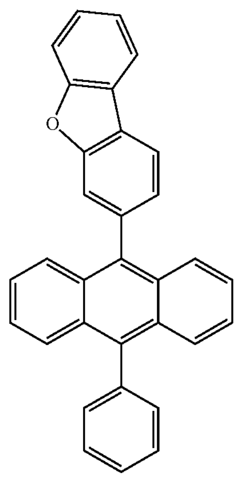
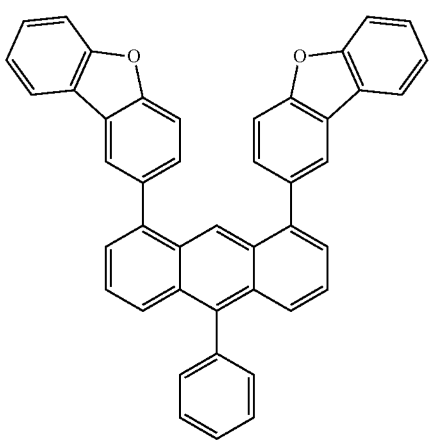
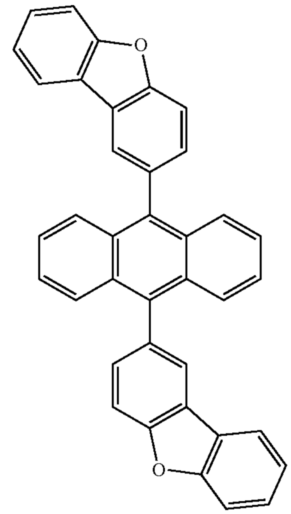
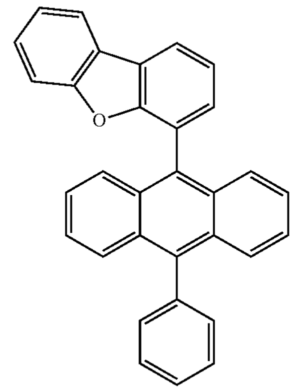
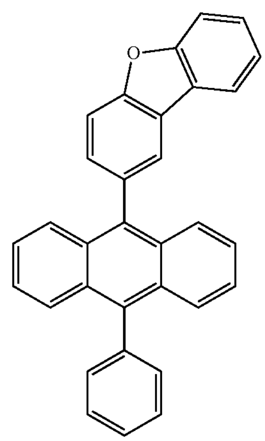
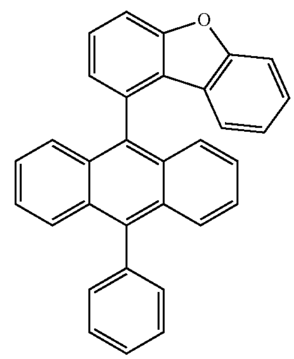
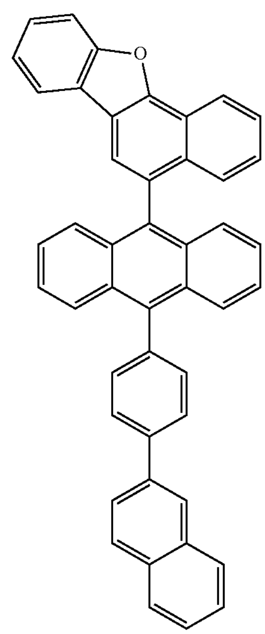

-continued

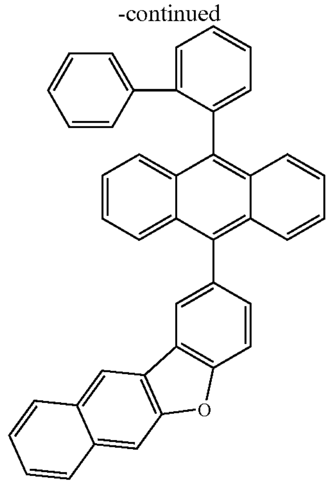

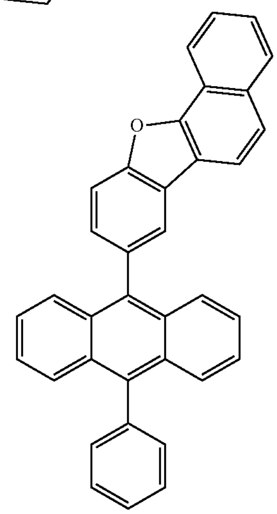

According to one embodiment of the present disclosure, the second organic material layer is a hole blocking layer or an electron control layer.

According to another embodiment, the first organic material layer is a light emitting layer, the second organic material layer is a hole blocking layer or an electron control layer, and the light emitting layer and the hole blocking layer or the electron control layer are provided adjacent to each other.

In one embodiment of the present disclosure, the second organic material layer is a hole blocking layer or an electron control layer, and the hole blocking layer or the electron control layer includes the compound of Chemical Formula 2.

The second organic material layer includes the compound of Chemical Formula 2.

According to one embodiment of the present disclosure, at least one of X1 to X3 is N, and the rest are CR.

According to one embodiment of the present disclosure, R and Ar1 to Ar3 are the same as or different from each other, and each independently hydrogen; deuterium; a cyano group; a nitrile group; a substituted or unsubstituted trialkylsilyl group having 1 to 20 carbon atoms; a substituted or unsubstituted triarylsilyl group having 6 to 30 carbon atoms; a substituted or unsubstituted alkyl group having 1 to 20 carbon atoms; a substituted or unsubstituted haloalkyl group having 1 to 20 carbon atoms; a substituted or unsubstituted cycloalkyl group having 3 to 30 carbon atoms; a substituted or unsubstituted alkenyl group having 2 to 20 carbon atoms; a substituted or unsubstituted aryl group having 6 to 60 carbon atoms; or a substituted or unsubstituted heterocyclic group having 2 to 60 carbon atoms and including one or more of 0, S, N and Si as a heteroatom, or bond to adjacent groups to form a substituted or unsubstituted ring having 3 to 30 carbon atoms, and at least one of Ar1 to Ar3 is of the following Chemical Formula 3.

According to another embodiment, R and Ar1 to Ar3 are the same as or different from each other, and each independently hydrogen; deuterium; a cyano group; a nitrile group; a substituted or unsubstituted trialkylsilyl group having 1 to 20 carbon atoms; a substituted or unsubstituted triarylsilyl group having 6 to 30 carbon atoms; a substituted or unsubstituted alkyl group having 1 to 20 carbon atoms; a substituted or unsubstituted haloalkyl group having 1 to 20 carbon atoms; a substituted or unsubstituted cycloalkyl group having 3 to 30 carbon atoms; a substituted or unsubstituted alkenyl group having 2 to 20 carbon atoms; a substituted or unsubstituted aryl group having 6 to 60 carbon atoms; or a substituted or unsubstituted heterocyclic group having 2 to 60 carbon atoms and including one or more of O, S, N and Si as a heteroatom, or An and R bond to each other to form a substituted or unsubstituted ring having 3 to 30 carbon atoms, Ar2 and R bond to each other to form a substituted or unsubstituted ring having 3 to 30 carbon atoms, and at least one of Ar1 to Ar3 is of the following Chemical Formula 3.

In another embodiment, R and Ar1 to Ar3 are the same as or different from each other, and each independently hydrogen; deuterium; a cyano group; a substituted or unsubstituted trialkylsilyl group having 1 to 20 carbon atoms; a substituted or unsubstituted triarylsilyl group having 6 to 30 carbon atoms; a substituted or unsubstituted haloalkyl group having 1 to 20 carbon atoms; a substituted or unsubstituted aryl group having 6 to 60 carbon atoms; or a substituted or unsubstituted heterocyclic group having 2 to 60 carbon atoms and including one or more of O, S, N and Si as a heteroatom, or Ar1 and R; or Ar2 and R bond to each other to form a substituted or unsubstituted aromatic hydrocarbon ring having 6 to 30 carbon atoms, and at least one of Ar1 to Ar3 is of the following Chemical Formula 3.

According to another embodiment, R and Ar1 to Ar3 are the same as or different from each other, and each independently hydrogen; deuterium; a cyano group; a substituted or unsubstituted trifluoromethyl group; a substituted or unsubstituted phenyl group; a substituted or unsubstituted biphenyl group; a substituted or unsubstituted terphenyl group; a substituted or unsubstituted naphthyl group; a substituted or unsubstituted carbazolyl group; a substituted or unsubstituted triphenylenyl group; a substituted or unsubstituted dibenzothiophenyl group; a substituted or unsubstituted dibenzofuranyl group; a substituted or unsubstituted phenoxathiinyl group; a substituted or unsubstituted phenanthrenyl group; a substituted or unsubstituted phenalene group; a substituted or unsubstituted benzocarbazolyl group; a substituted or unsubstituted pyridyl group; a substituted or unsubstituted indenocarbazolyl group; a substituted or unsubstituted trimethylsilyl group; a substituted or unsubstituted triphenylsilyl group; or a substituted or unsubstituted dibenzosilole group, or selected from the following structures, and the following structures may be substituted or unsubstituted.

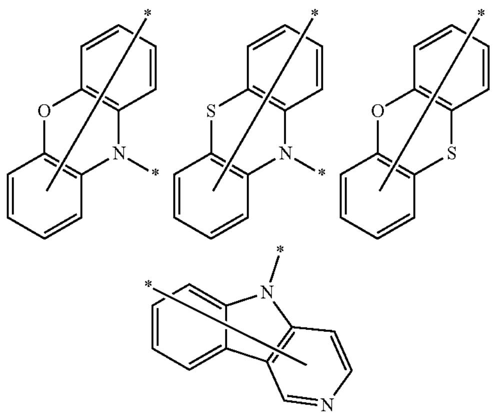

In the structures, * means a bonding position.

R and Ar1 to Ar3 may be unsubstituted or substituted with a substituent linking one or more of hydrogen; deuterium; a cyano group; a trifluoromethyl group; a trialkylsilyl group having 1 to 20 carbon atoms; a triarylsilyl group having 6 to 30 carbon atoms; an alkyl group having 1 to 20 carbon atoms; an aryl group having 6 to 30 carbon atoms; and a heterocyclic group having 2 to 30 carbon atoms and including one or more of O, S, N and Si as a heteroatom.

R and Ar1 to Ar3 may be unsubstituted or substituted with a substituent linking one or more of hydrogen; deuterium; a cyano group; a trifluoromethyl group; a trialkylsilyl group having 1 to 10 carbon atoms; a triarylsilyl group having 6 to 20 carbon atoms; an alkyl group having 1 to 10 carbon atoms; an aryl group having 6 to 20; and a heterocyclic group having 2 to 20 carbon atoms and including one or more of O, S, N and Si as a heteroatom.

R and Ar1 to Ar3 may be unsubstituted or substituted with a substituent linking one or more of hydrogen; deuterium; a cyano group; a trifluoromethyl group; a trimethylsilyl group; a triphenylsilyl group; a methyl group; a phenyl group; a biphenyl group; a naphthyl group, a dimethylfluorenyl group; a diphenylfluorenyl group; a dibenzofuranyl group; a dibenzothiophenyl group; and a carbazole group.

According to another embodiment, R and Ar1 to Ar3 are the same as or different from each other, and each independently hydrogen; deuterium; a cyano group; a trifluoromethyl group; a phenyl group; a biphenyl group; a terphenyl group unsubstituted or substituted with a pyridyl group; a naphthyl group; a carbazolyl group unsubstituted or substituted with a methyl group or a phenyl group; a triphenylenyl group; a dibenzothiophenyl group unsubstituted or substituted with a methyl group; a dibenzofuranyl group; a phenoxathiinyl group; a phenanthrenyl group; a benzocarbazolyl group; a pyridyl group; an N-phenylindenocarbazolyl group unsubstituted or substituted with a methyl group; a trimethylsilyl group; a triphenylsilyl group; or a dibenzosilole group substituted with a methyl group, or selected from among the following structures.

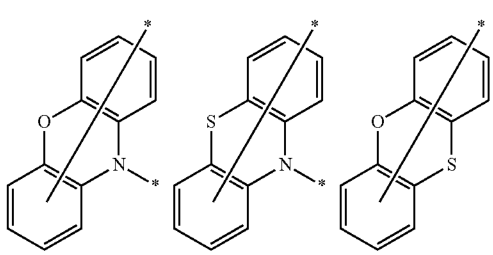

-continued

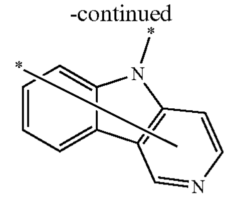

In the structures, * means a bonding position.

In one embodiment of the present disclosure, Ar1 and R; or Ar2 and R bond to each other to form substituted or unsubstituted benzene.

According to another embodiment, Ar1 and R; or Ar2 and R bond to each other to form benzene unsubstituted or substituted with a benzocarbazole group.

According to one embodiment of the present disclosure, L11 to L13 are the same as or different from each other, and each independently a direct bond; a substituted or unsubstituted arylene group having 6 to 60 carbon atoms; or a substituted or unsubstituted divalent heterocyclic group having 2 to 60 carbon atoms.

In another embodiment, L11 to L13 are the same as or different from each other, and each independently a direct bond; a substituted or unsubstituted arylene group having 6 to 30 carbon atoms; or a substituted or unsubstituted divalent heterocyclic group having 2 to 30 carbon atoms and including one or more of O, S, N and Si as a heteroatom.

According to one embodiment of the present disclosure, L11 to L13 are the same as or different from each other, and each independently a direct bond; a substituted or unsubstituted phenylene group; a substituted or unsubstituted biphenylene group; a substituted or unsubstituted naphthylene group; a substituted or unsubstituted fluorenyl group; a substituted or unsubstituted divalent dibenzothiophene group; a substituted or unsubstituted divalent dibenzofuranyl group; a substituted or unsubstituted divalent carbazolyl group; a substituted or unsubstituted divalent benzocarbazolyl group; a substituted or unsubstituted divalent indenocarbazolyl group; a substituted or unsubstituted divalent dibenzosilole group; a substituted or unsubstituted divalent phenoxathiinyl group; a substituted or unsubstituted divalent pyridyl group; a substituted or unsubstituted divalent thiophenyl group; or a substituted or unsubstituted divalent furanyl group, or selected from among the following structures, and the following structures may be substituted or unsubstituted.

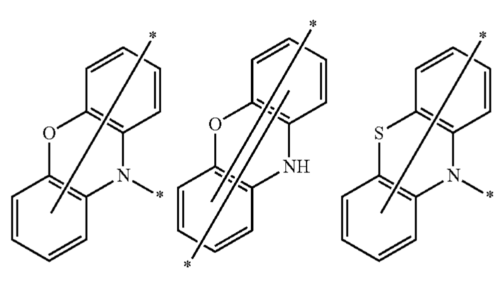

-continued

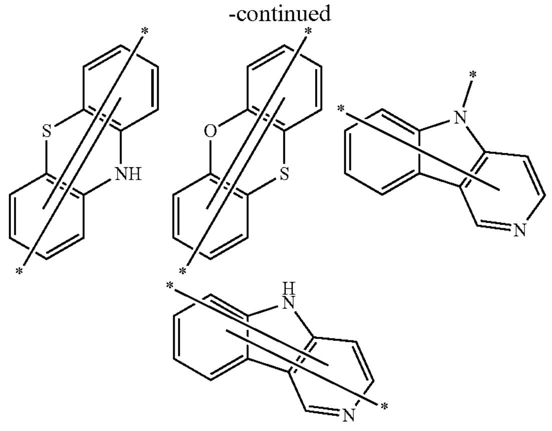

In the structures, * means a bonding position.

According to another embodiment, L11 to L13 are the same as or different from each other, and each independently a direct bond; a phenylene group unsubstituted or substituted with a methyl group, a phenyl group or a dibenzothiophenyl group; a biphenylene group; a naphthylene group; a dimethylfluorenyl group; a divalent dibenzothiophene group; a divalent dibenzofuranyl group; a divalent carbazolyl group unsubstituted or substituted with a phenyl group; a divalent benzocarbazolyl group unsubstituted or substituted with a phenyl group or a dimethylbiphenyl group; a divalent indenocarbazolyl group substituted with a methyl group; a divalent dimethyldibenzosilole group; a divalent phenoxathiinyl group; a divalent pyridyl group; a divalent thiophenyl group; or a divalent furanyl group, or the following structures.

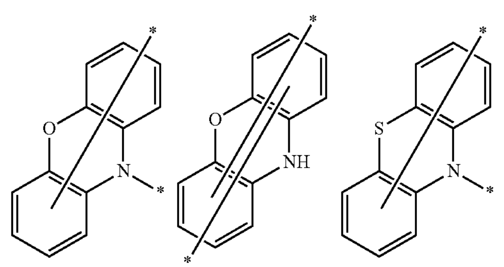

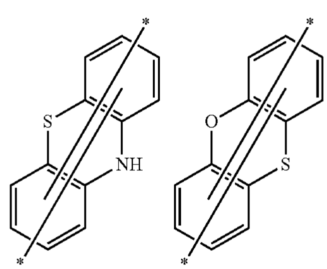

In the structures, * means a bonding position.

According to one embodiment of the present disclosure, one or two of Ar1 to Ar3 are of the following Chemical Formula 3.

Chemical Formula 3

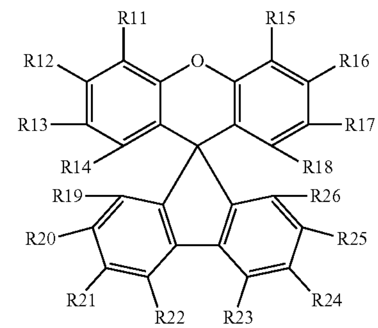

In Chemical Formula 3, any one of R11 to R26 is linked to any one of L11 to L13, and the rest are hydrogen; deuterium; a cyano group; a nitrile group; a substituted or unsubstituted alkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring.

In one embodiment of the present disclosure, any one of R11 to R26 is linked to any one of L11 to L13, and the rest are hydrogen; a substituted or unsubstituted alkyl group having 1 to 20 carbon atoms; or a substituted or unsubstituted aryl group having 6 to 60 carbon atoms, or bond to adjacent groups to form a substituted or unsubstituted aromatic hydrocarbon ring having 6 to 30 carbon atoms.

In another embodiment, any one of R11 to R26 is linked to any one of L11 to L13, and the rest are hydrogen; a substituted or unsubstituted methyl group; a substituted or unsubstituted butyl group; a substituted or unsubstituted phenyl group; a substituted or unsubstituted naphthyl group; or a substituted or unsubstituted fluorenyl group, or bond to adjacent groups to form a substituted or unsubstituted benzene ring.

According to one embodiment of the present disclosure, any one of R11 to R26 is linked to any one of L11 to L13, and the rest are hydrogen; a methyl group; a tert-butyl group; an n-butyl group; a phenyl group unsubstituted or substituted with a methyl group; a naphthyl group; or a dimethylfluorenyl group, or bond to adjacent groups to form a benzene ring.

According to one embodiment of the present specification, any one of R11 to R18 is linked to any one of L11 to L13, and the rest are hydrogen; a methyl group; a tert-butyl group; an n-butyl group; a phenyl group unsubstituted or substituted with a methyl group; a naphthyl group; or a dimethylfluorenyl group, or bond to adjacent groups to form a benzene ring.

According to one embodiment of the present specification, any one of R19 to R26 is linked to any one of L11 to L13, and the rest are hydrogen; a methyl group; a tert-butyl group; an n-butyl group; a phenyl group unsubstituted or substituted with a methyl group; a naphthyl group; or a dimethylfluorenyl group, or bond to adjacent groups to form a benzene ring.

According to one embodiment of the present specification, Chemical Formula 2 is any one of the following Chemical Formulae 201 to 203.

Chemical Formula 201

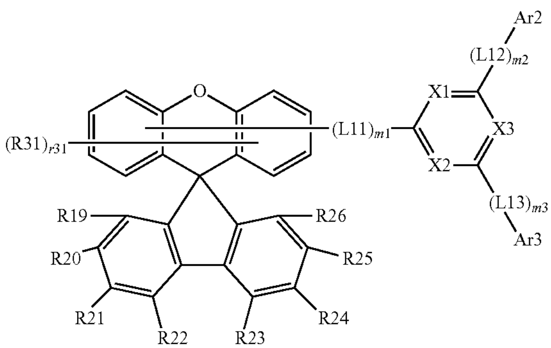

Chemical Formula 202

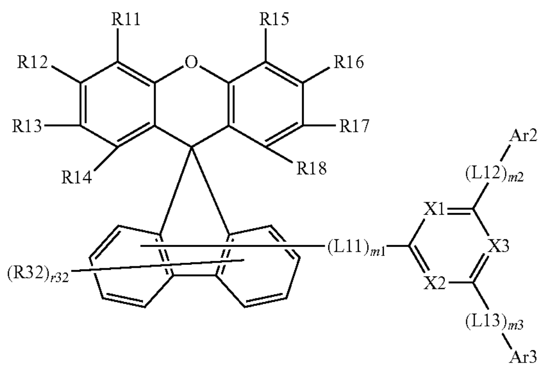

-continued

Chemical Formula 203

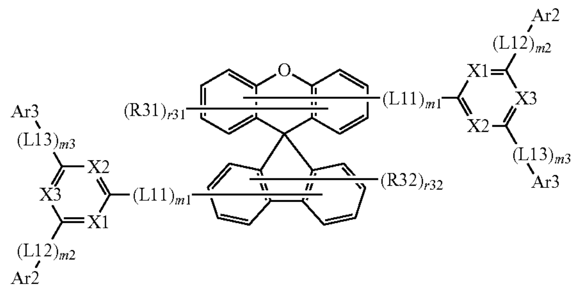

In Chemical Formulae 201 to 203,

X1 to X3, Ar2 to Ar3, L11 to L13, m1 to m3 and R11 to R26 have the same definitions as in Chemical Formulae 2 and 3, R31 and R32 have the same definitions as R11 to R26 in Chemical Formula 2, and r31 and r32 are an integer of 1 to 7.

In one embodiment of the present specification, Chemical Formula 2 is any one of the following structures.

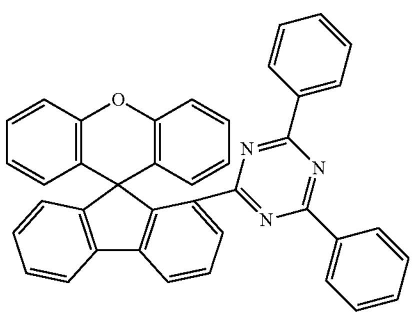

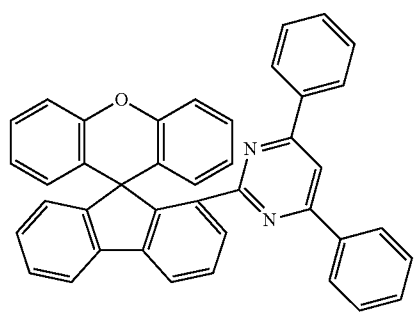

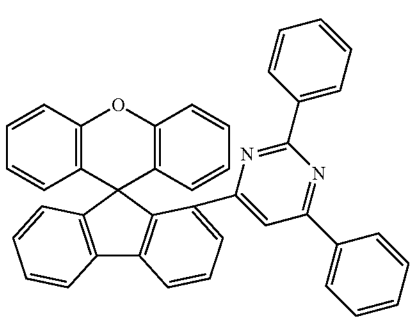

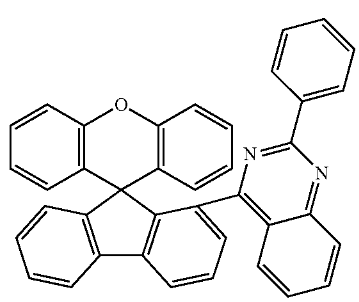

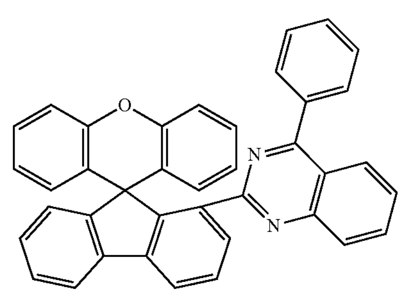

-continued
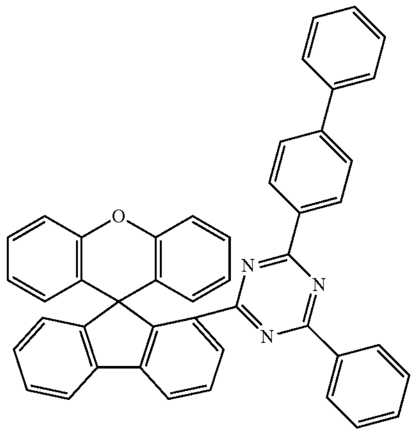
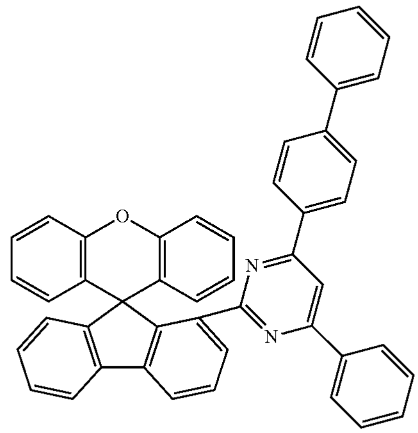
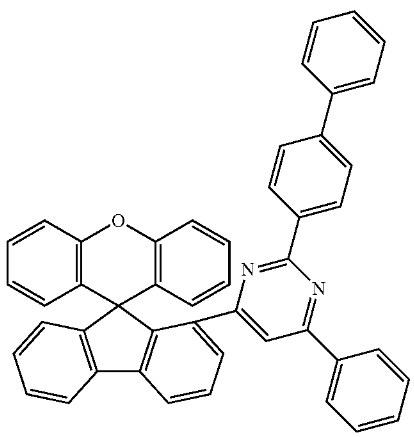
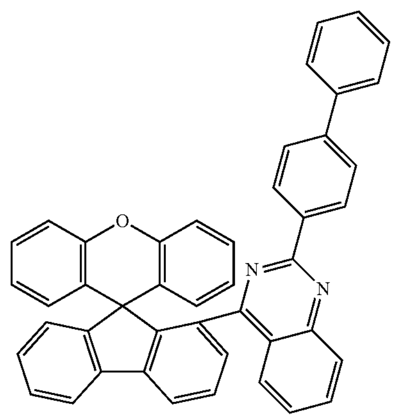
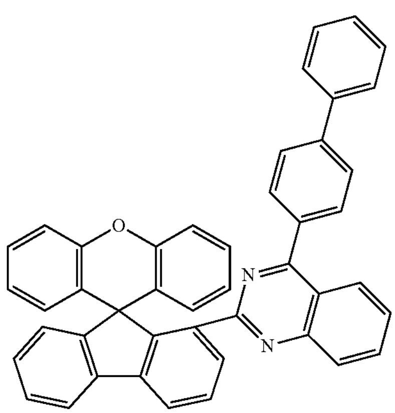
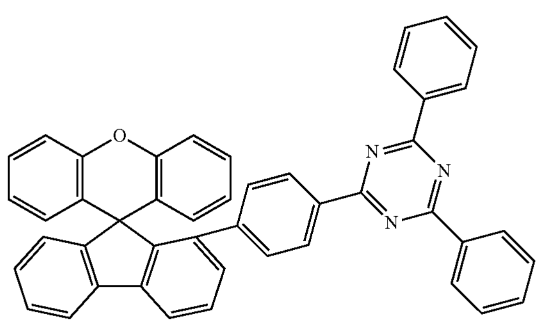
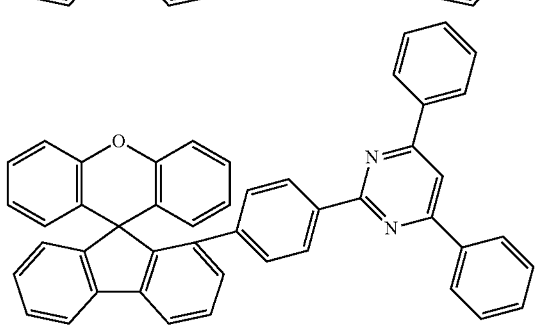
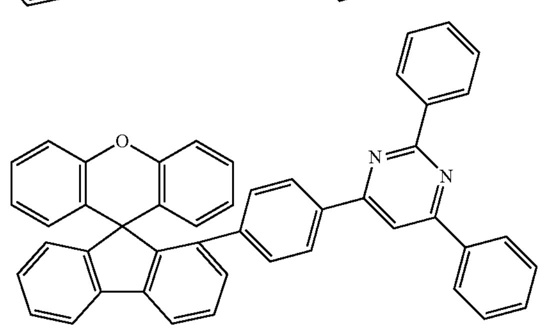

-continued
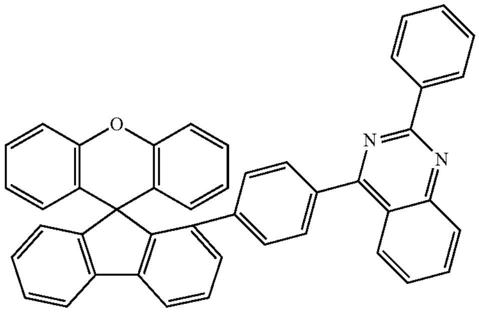
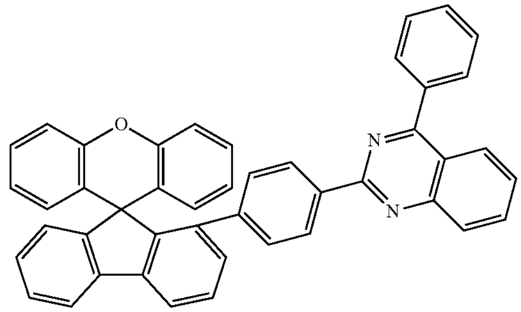
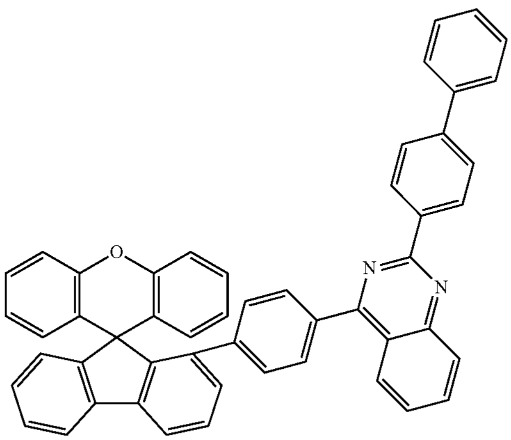
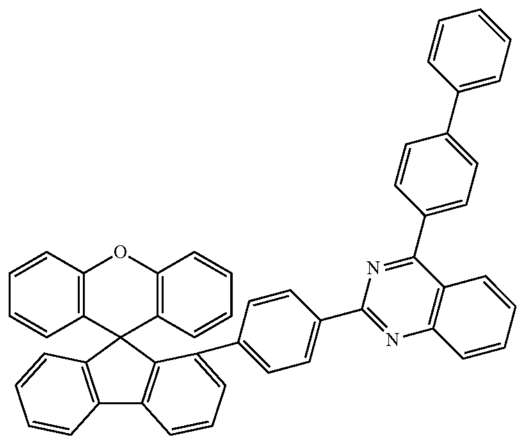
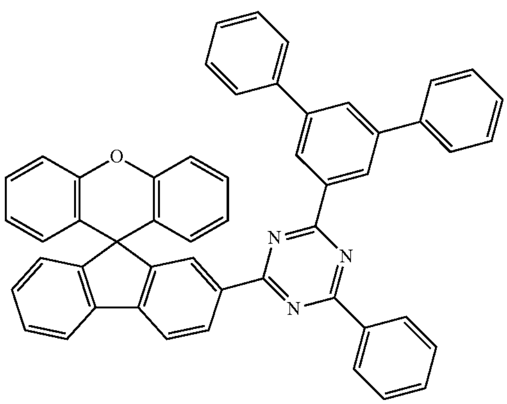
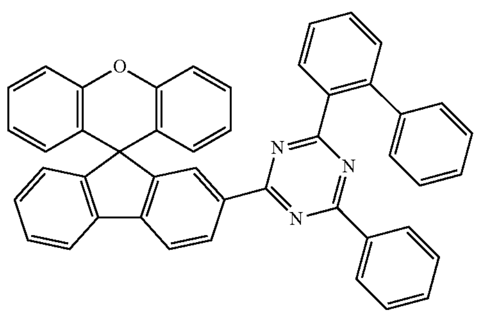
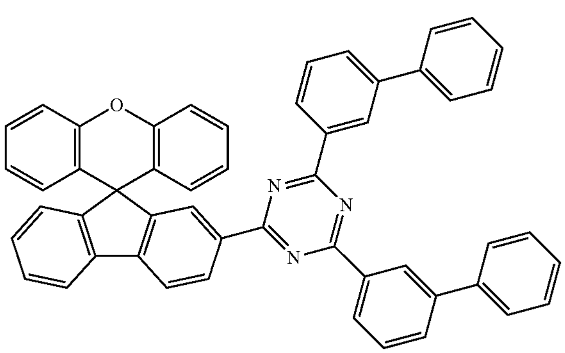
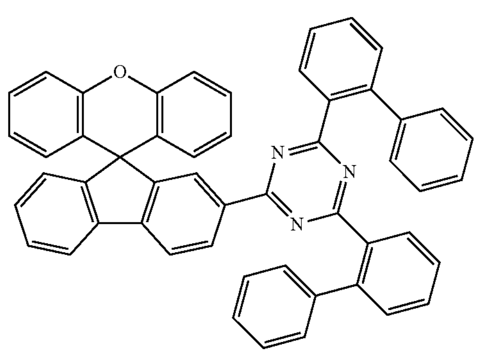

-continued
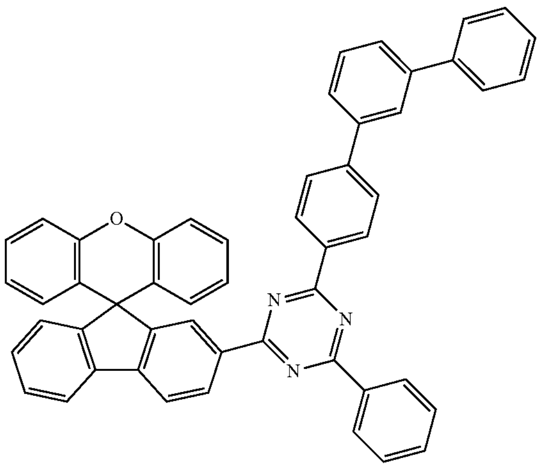
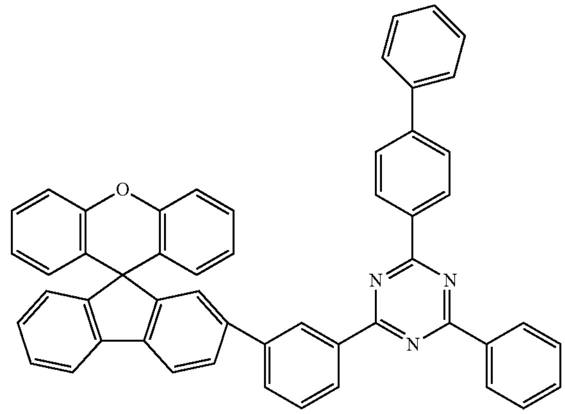
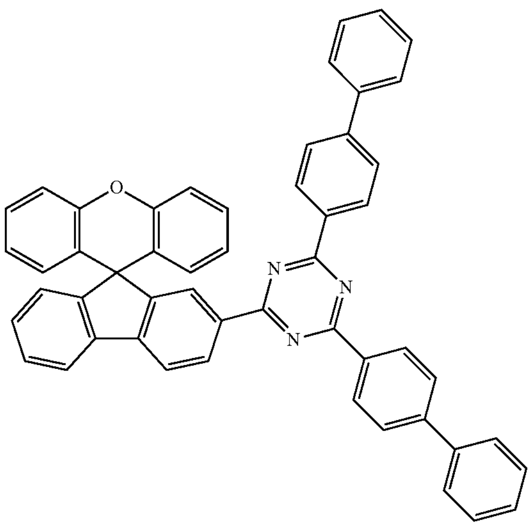
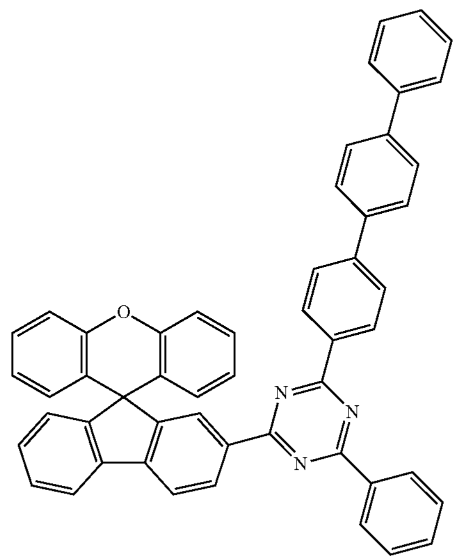
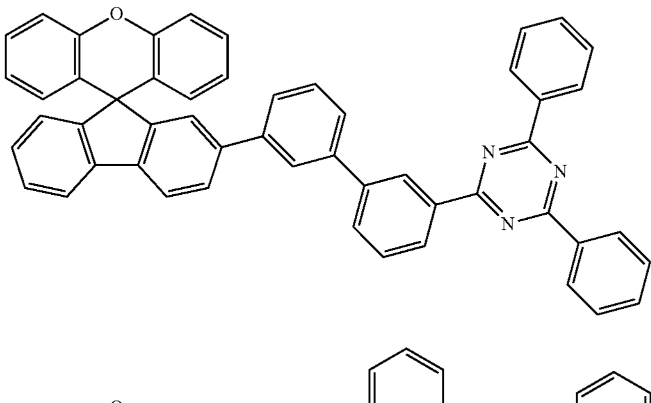
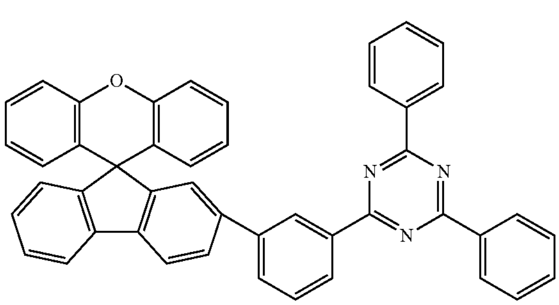
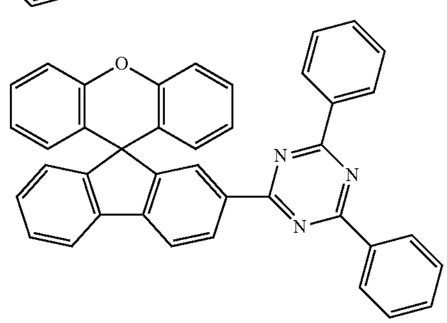

-continued
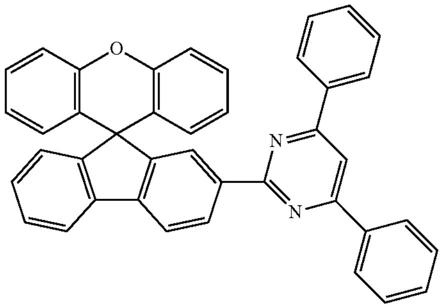
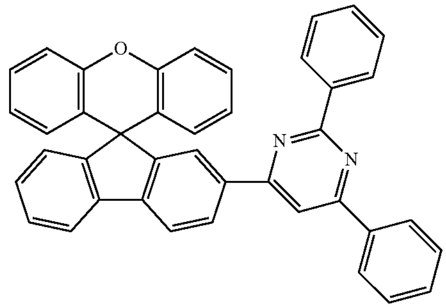
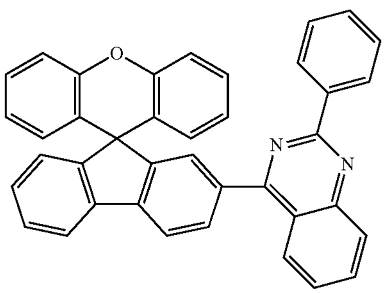
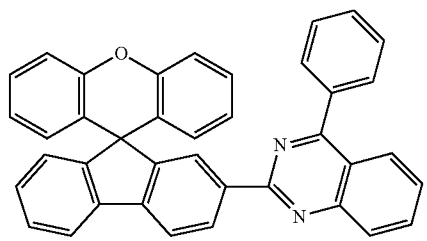
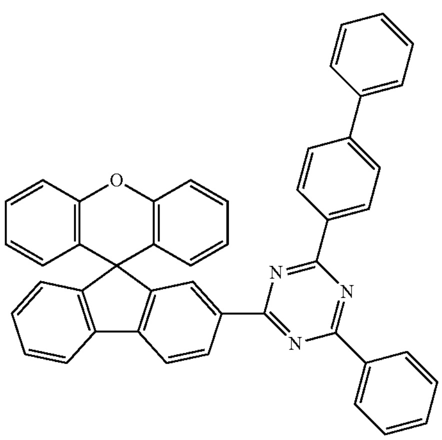
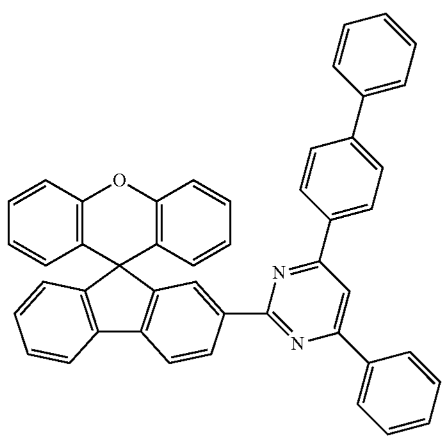
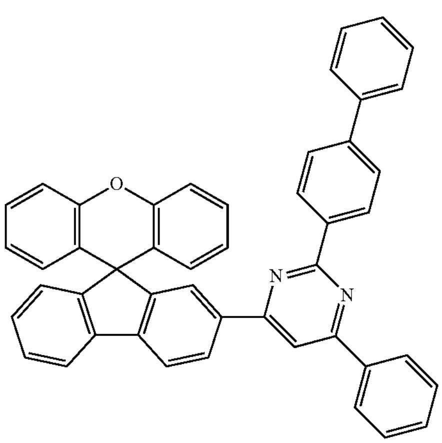
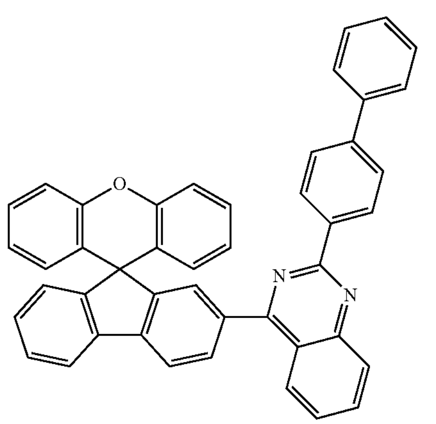

-continued
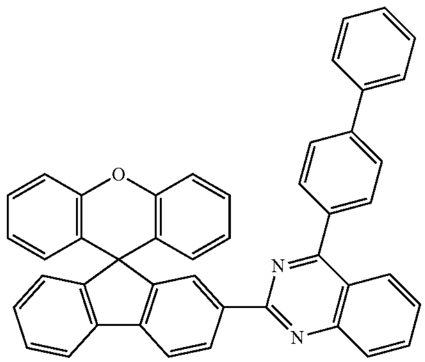
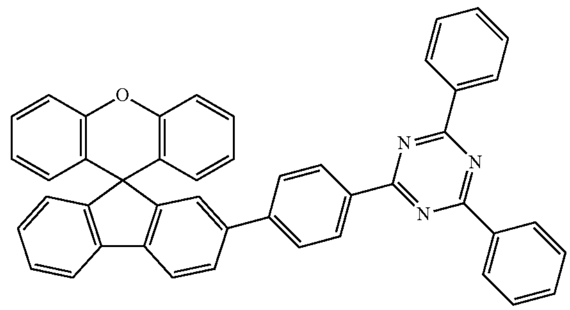
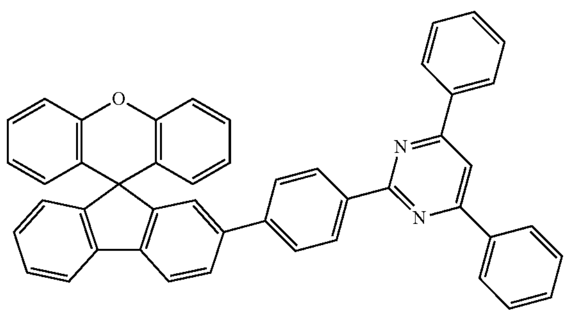
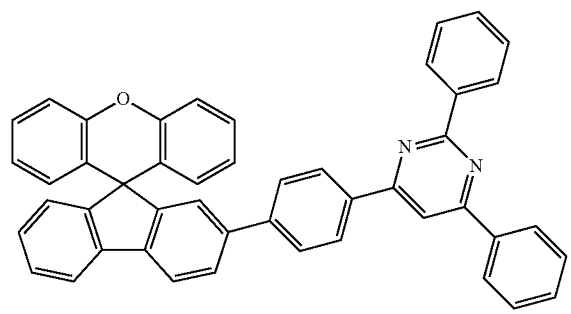
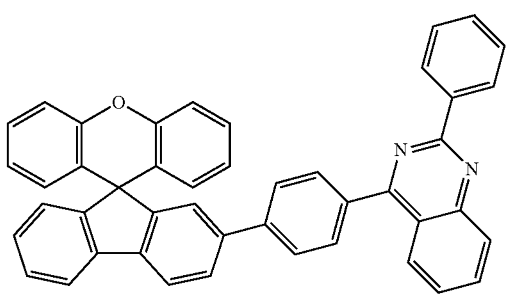
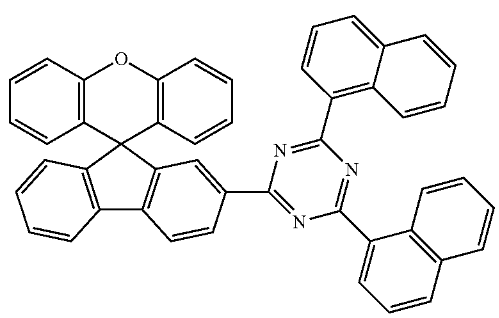
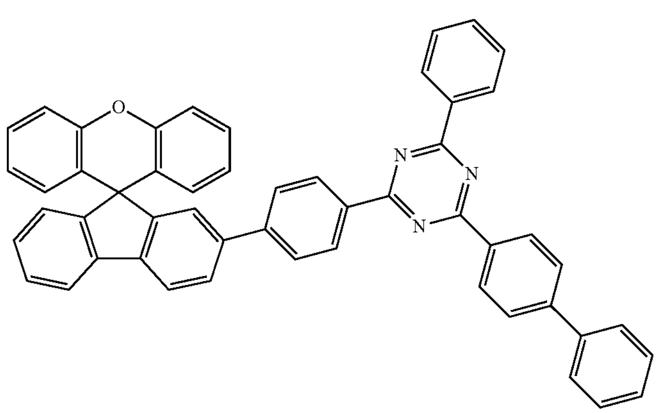
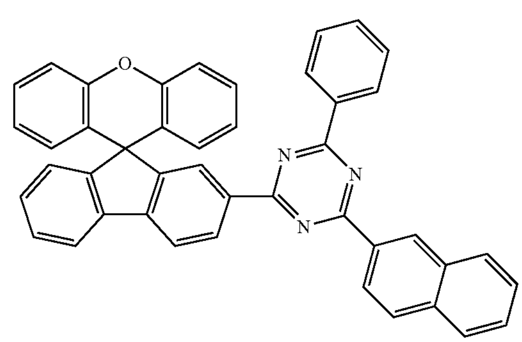

-continued
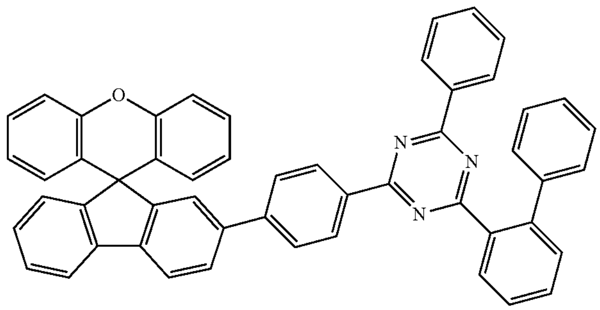
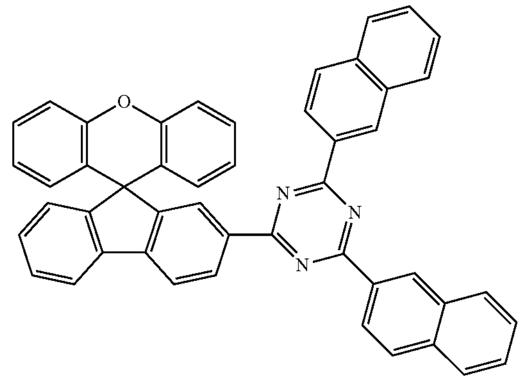
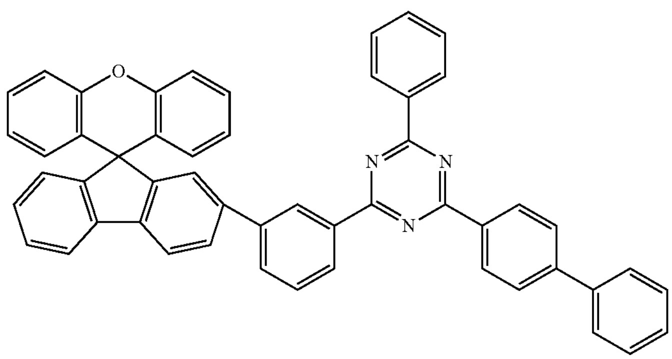
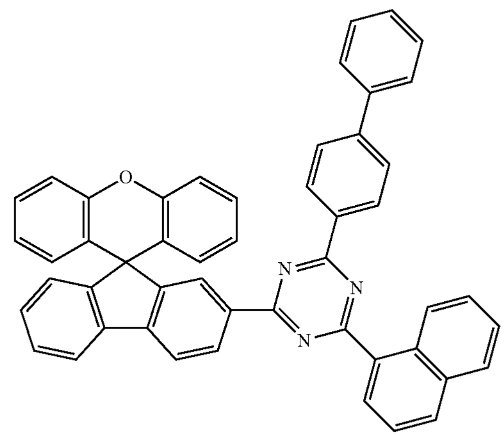
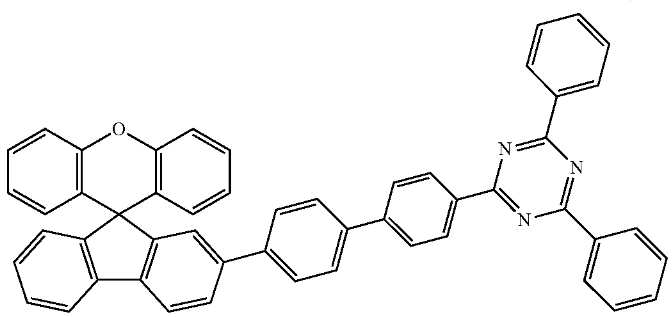
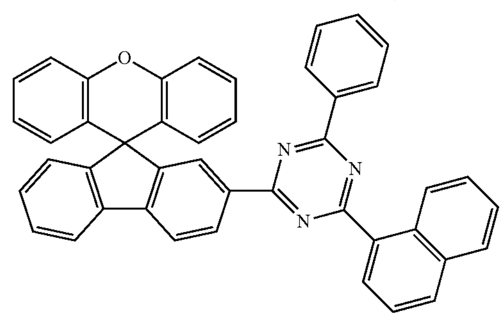
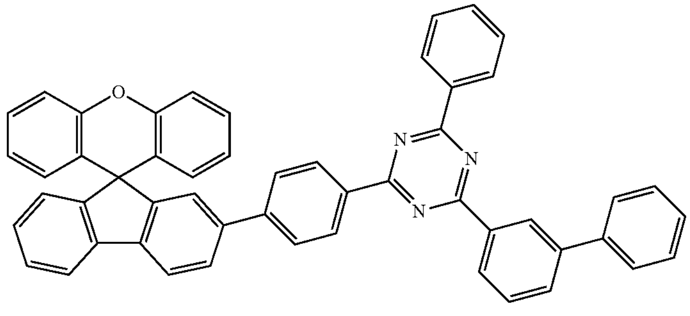

-continued
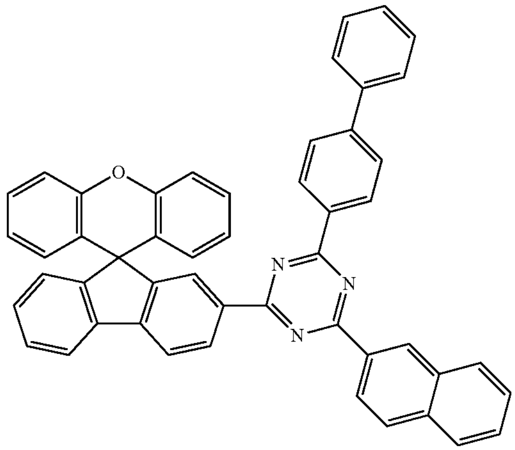
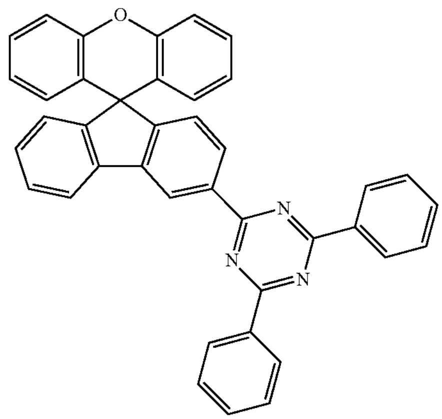
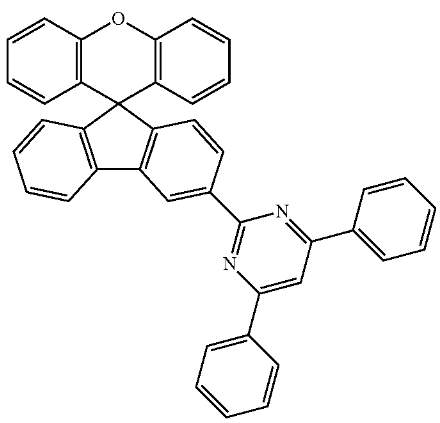
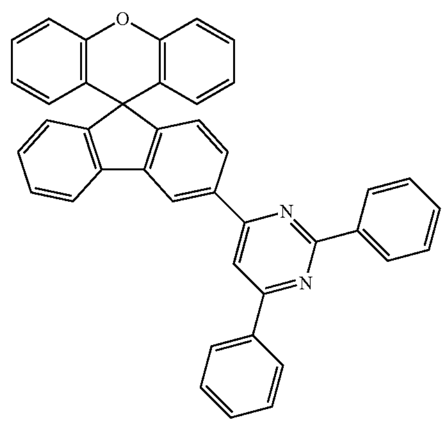
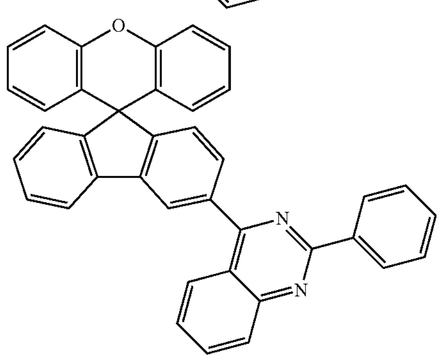
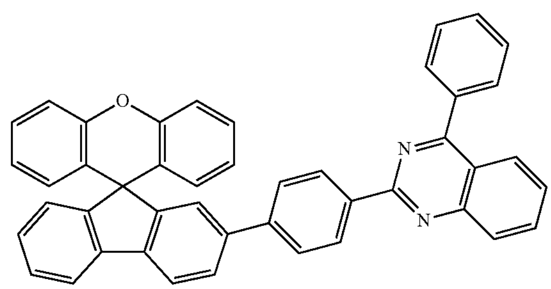
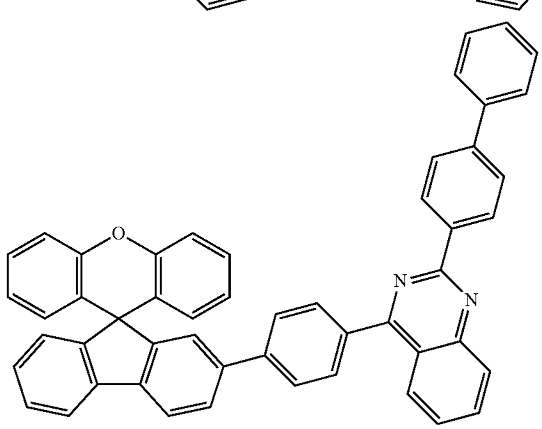
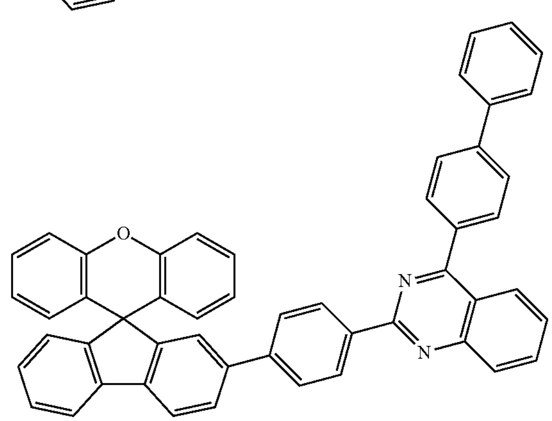

-continued
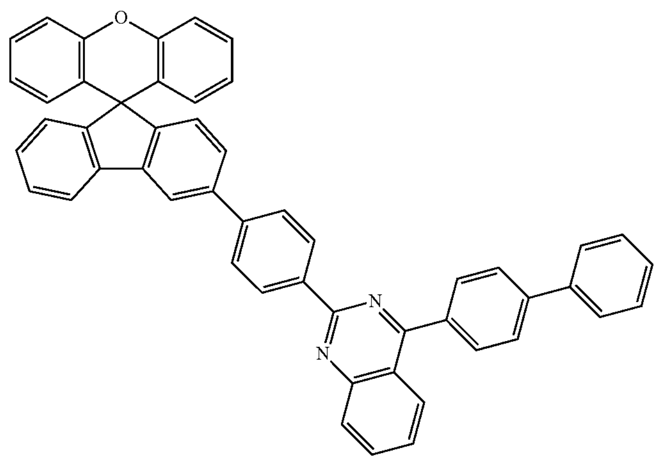
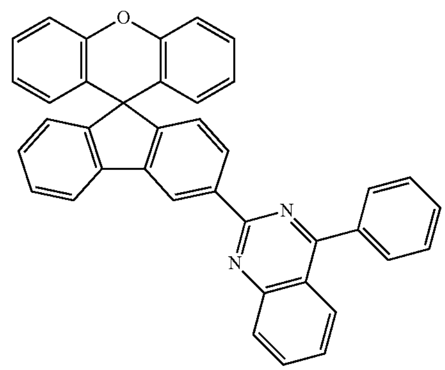
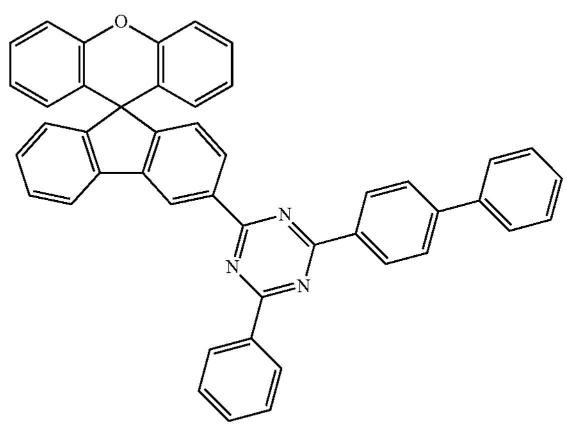
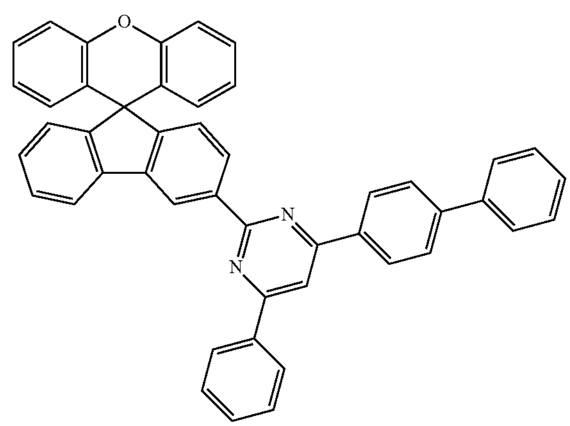
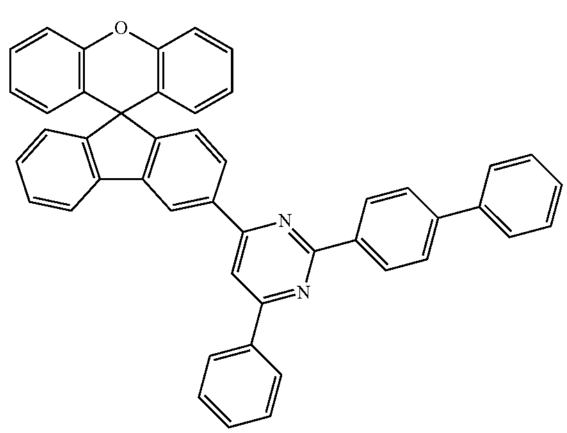
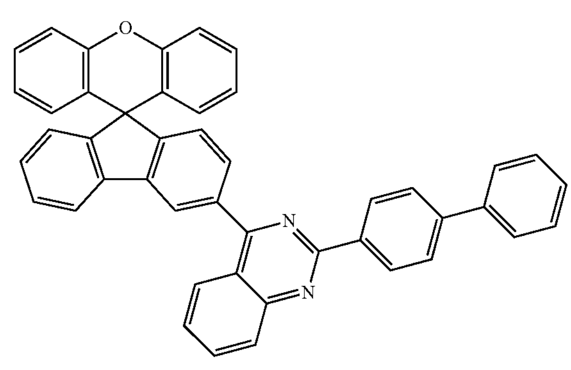

-continued
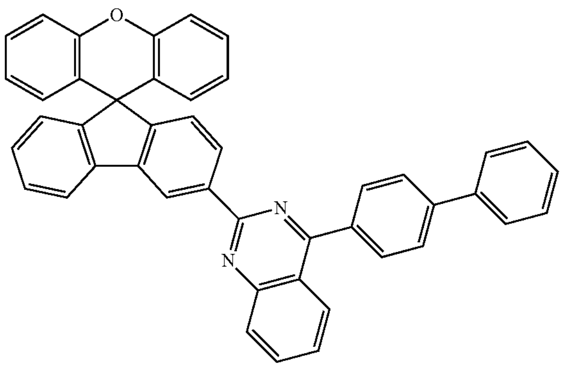
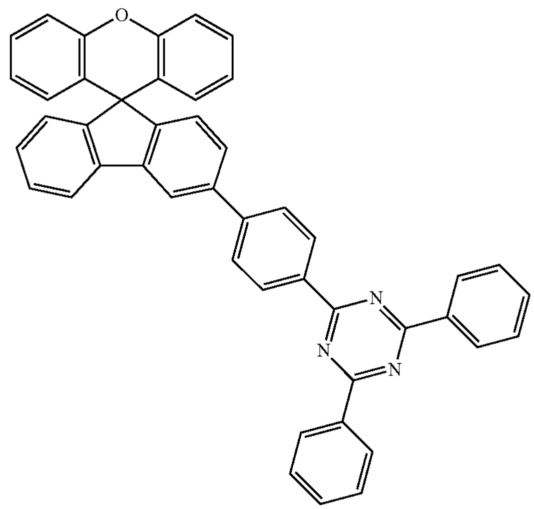
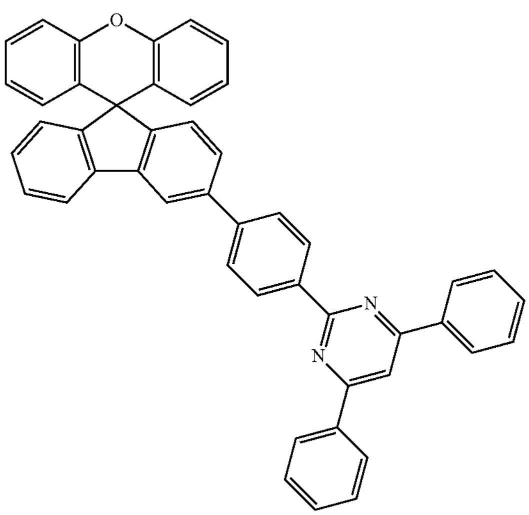
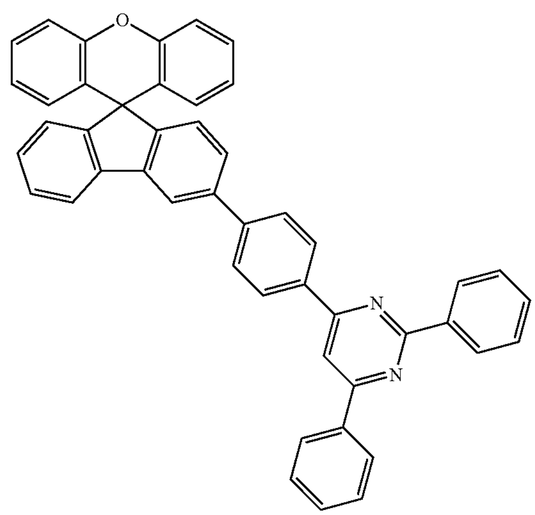
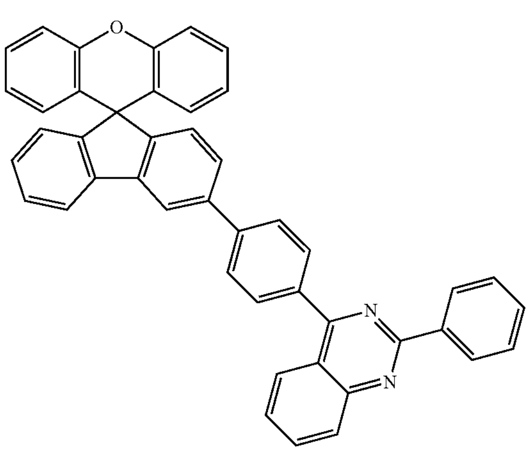
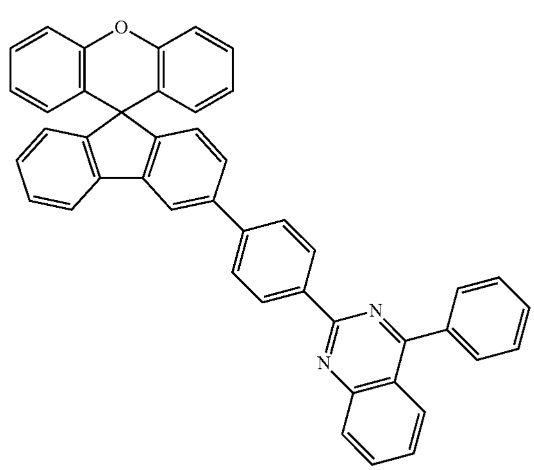

-continued
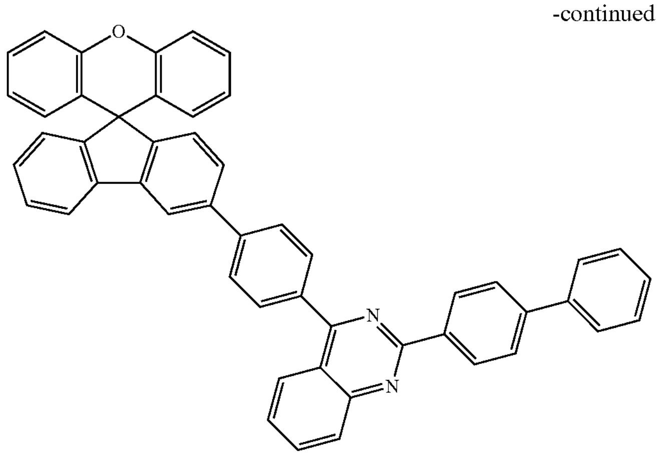
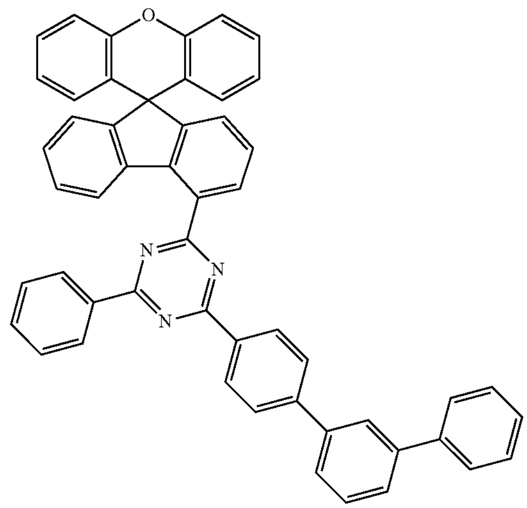
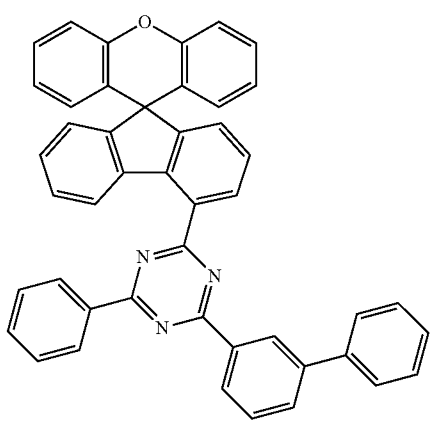
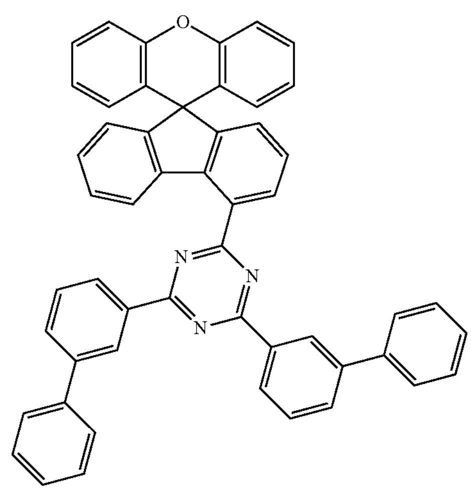
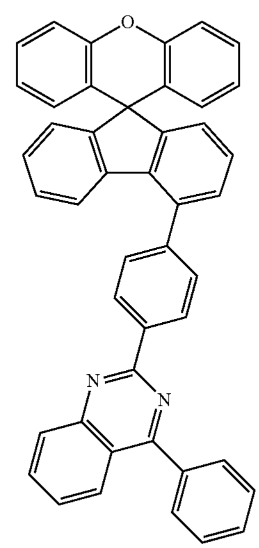
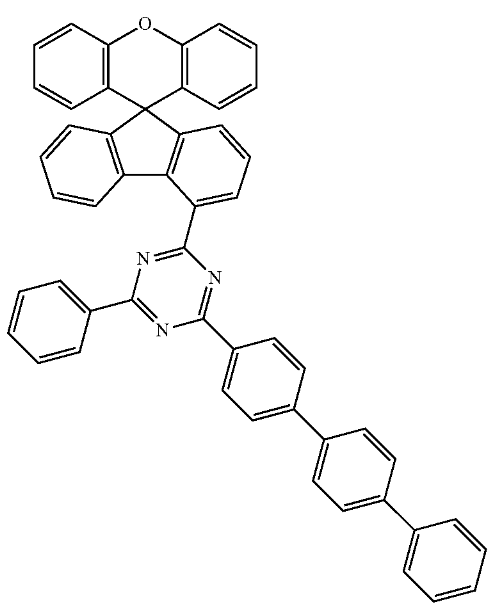
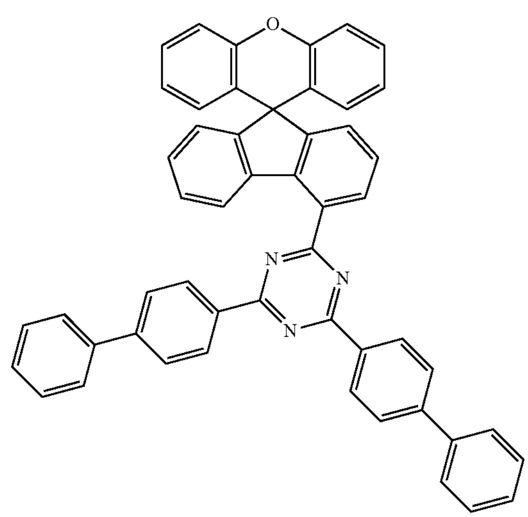

-continued
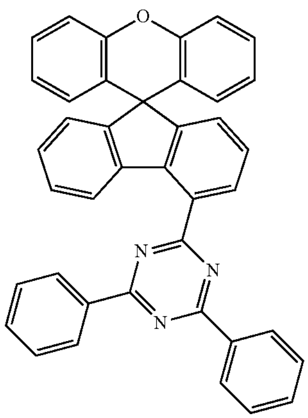
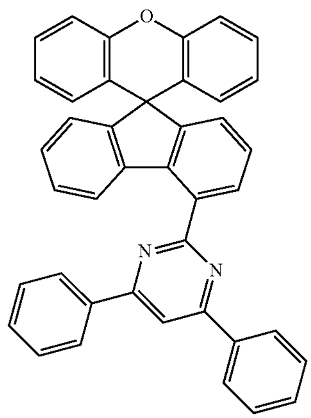
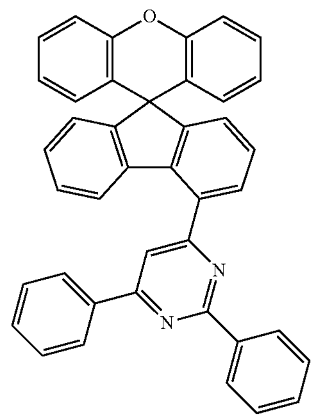
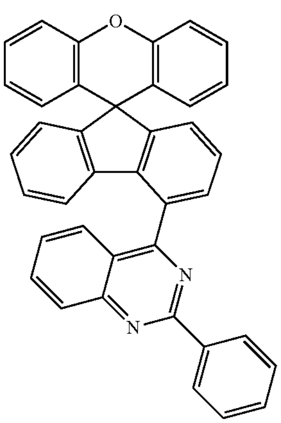
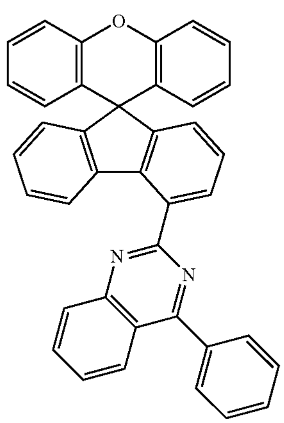
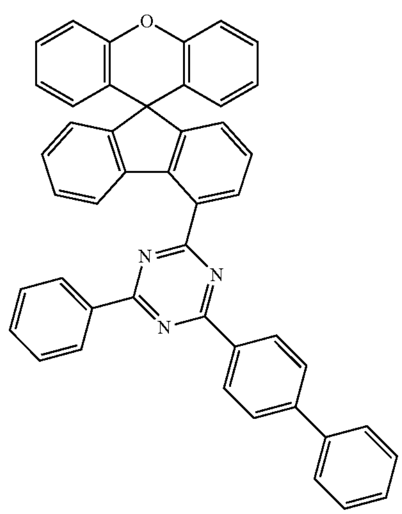
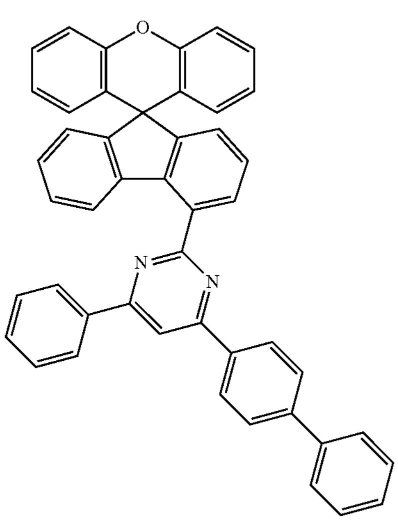
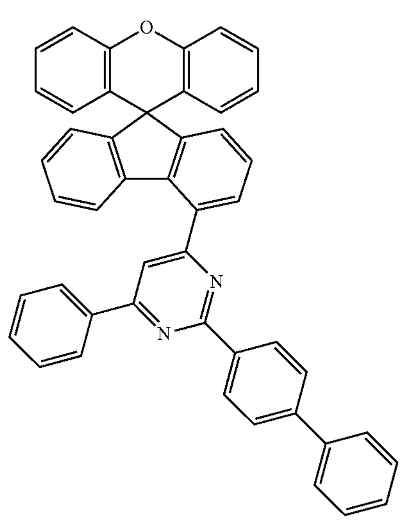

-continued
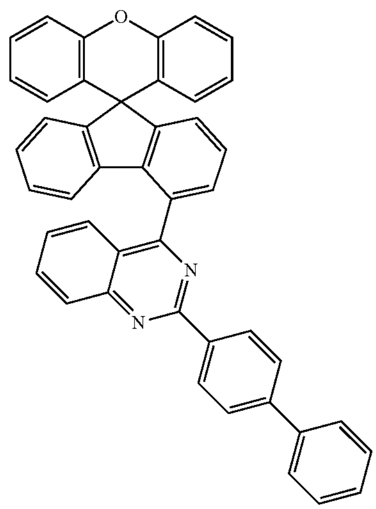
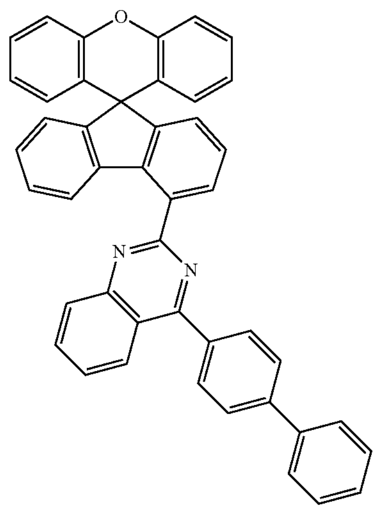
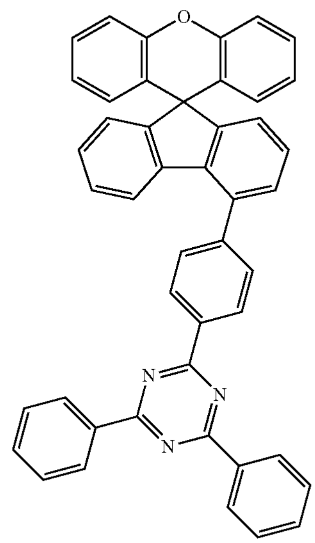
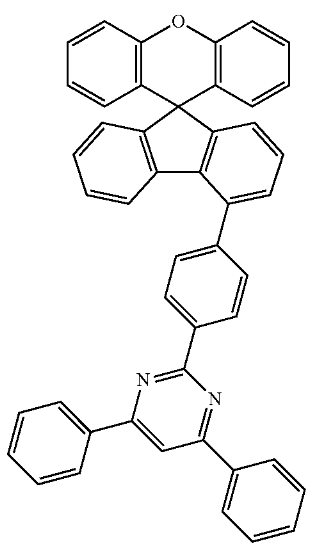
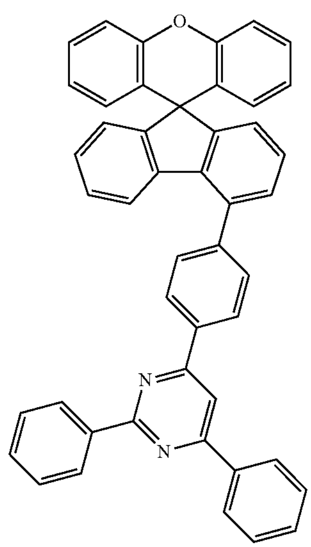
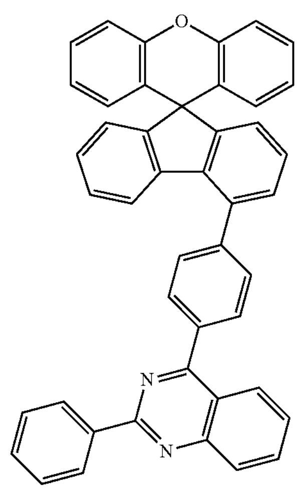
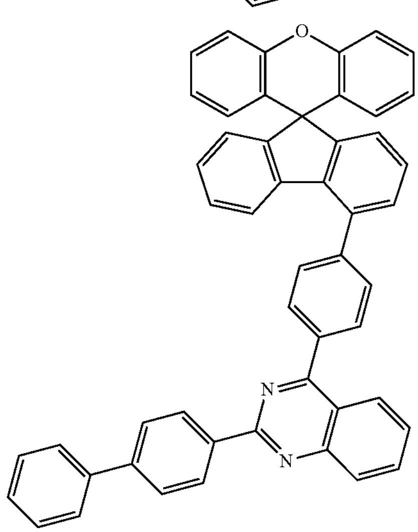
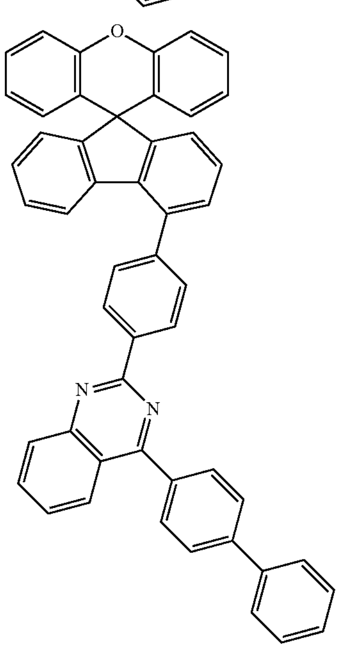
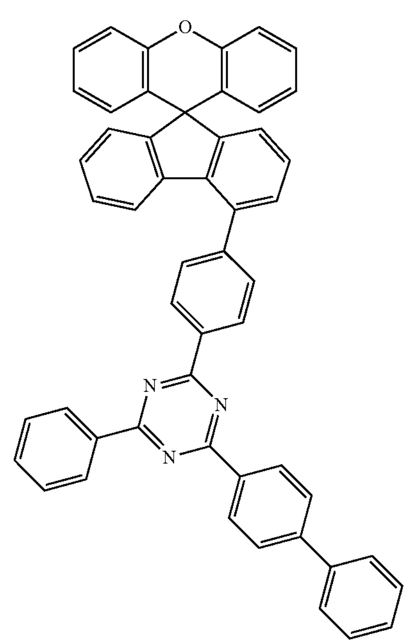

-continued
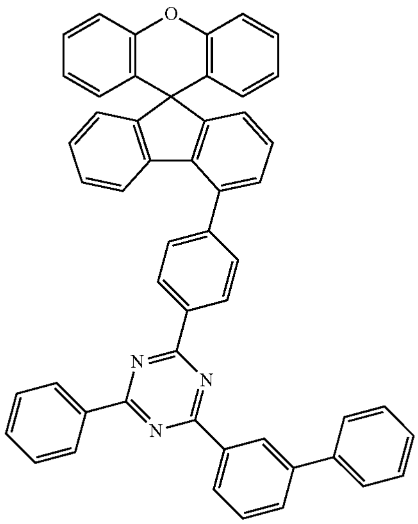
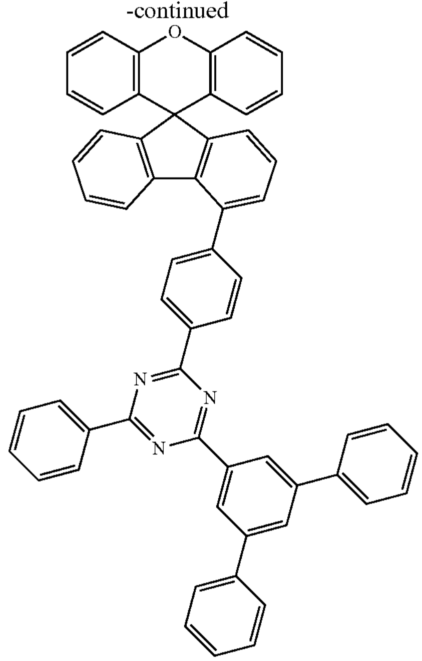
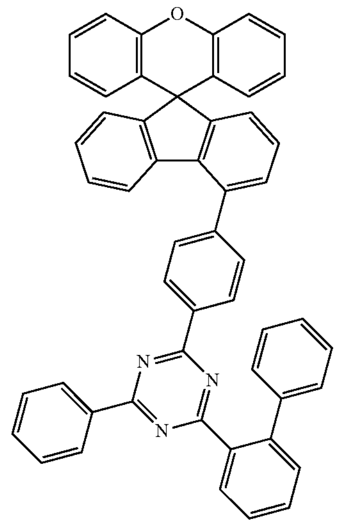
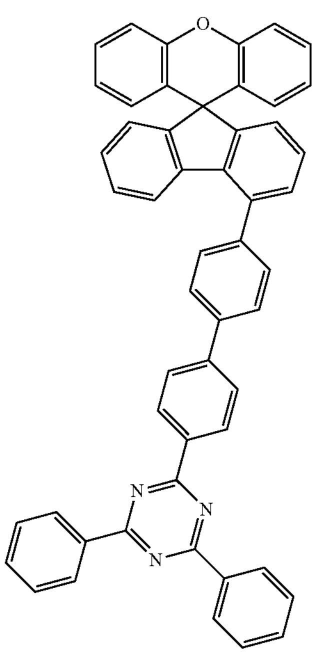
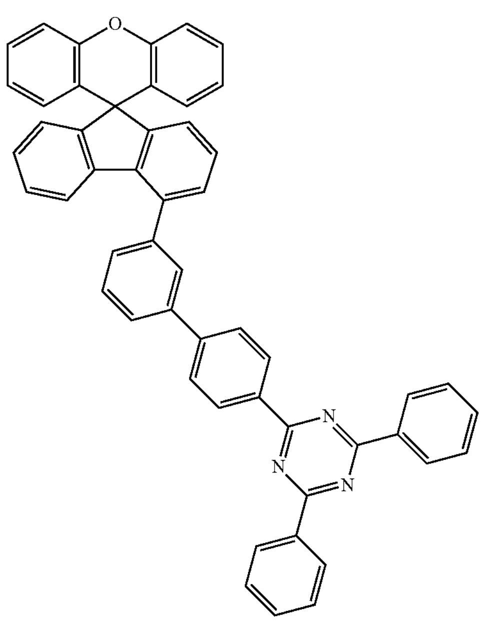

-continued
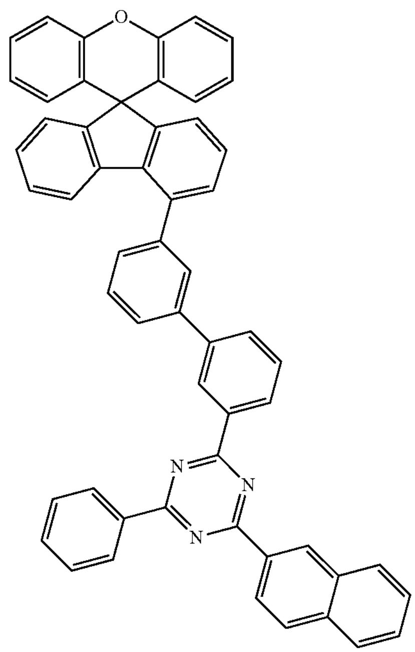
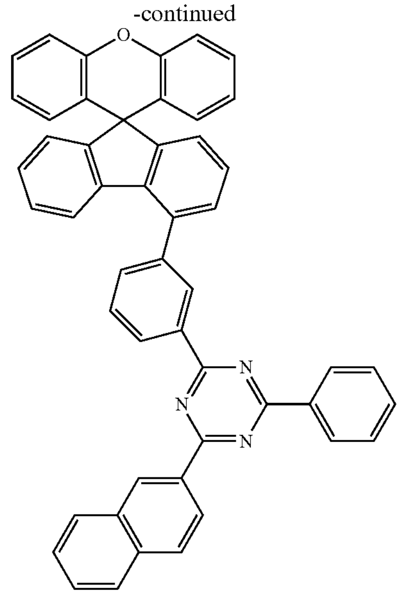
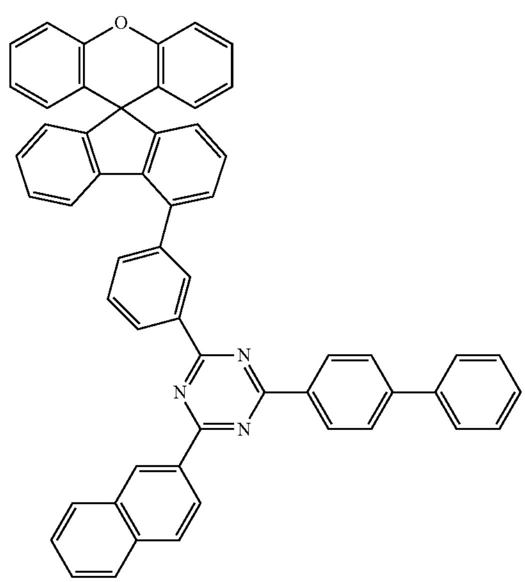
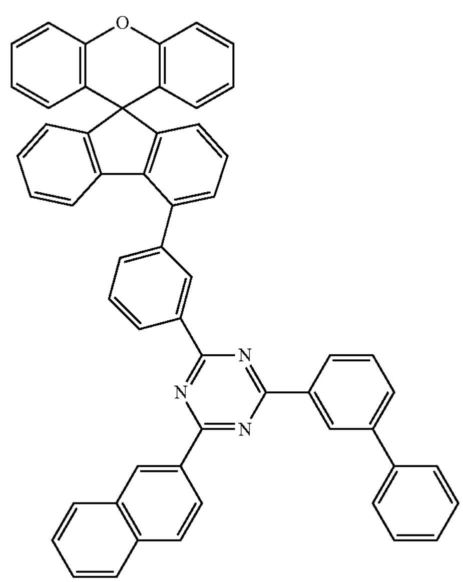

-continued
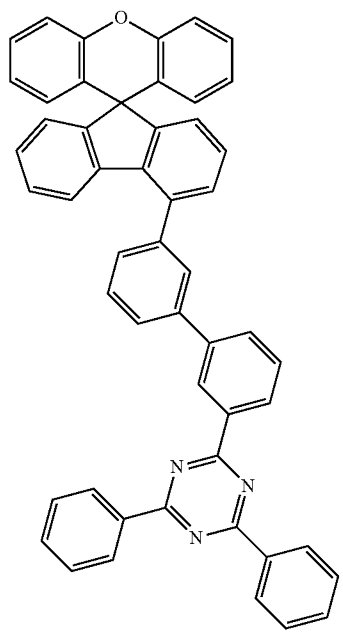
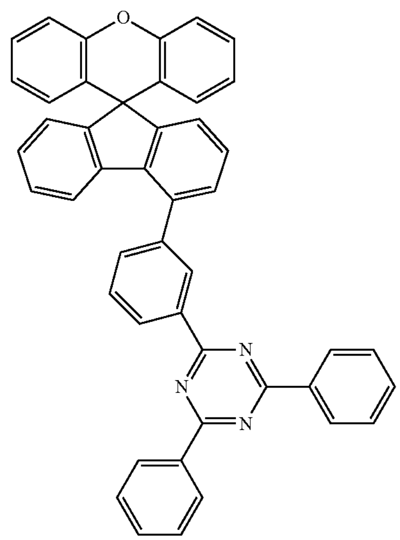
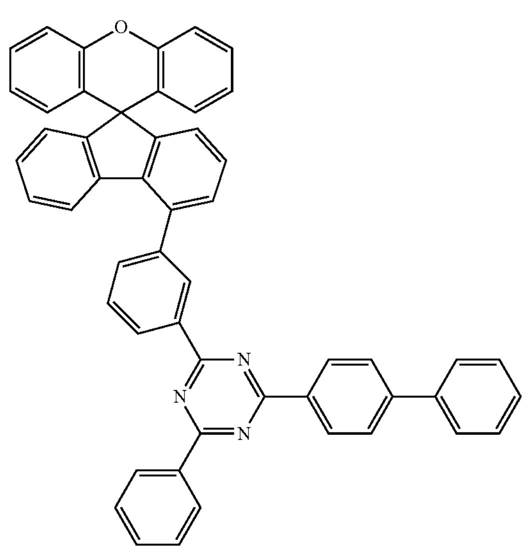
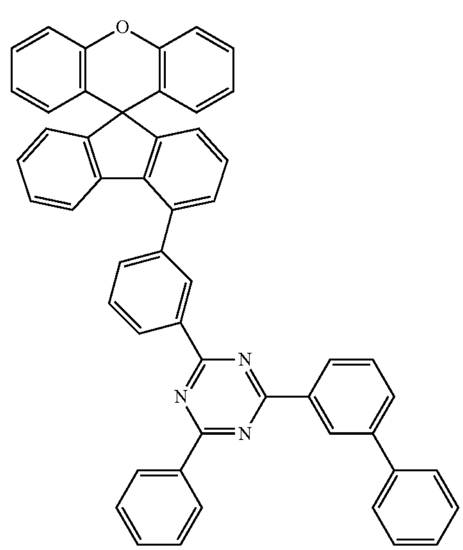

-continued
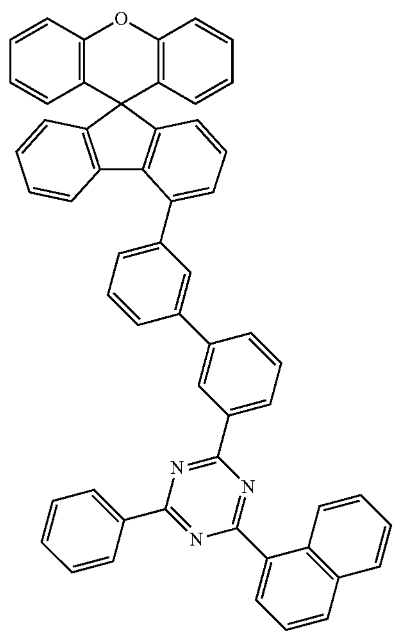
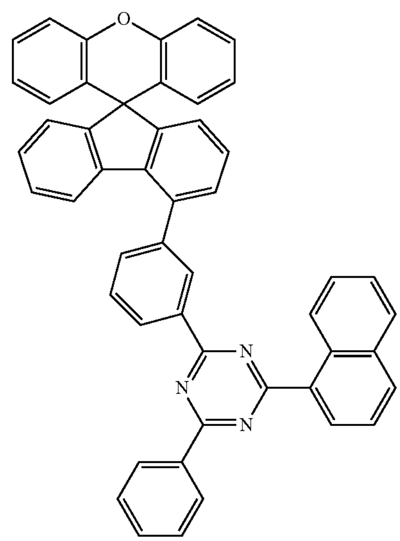
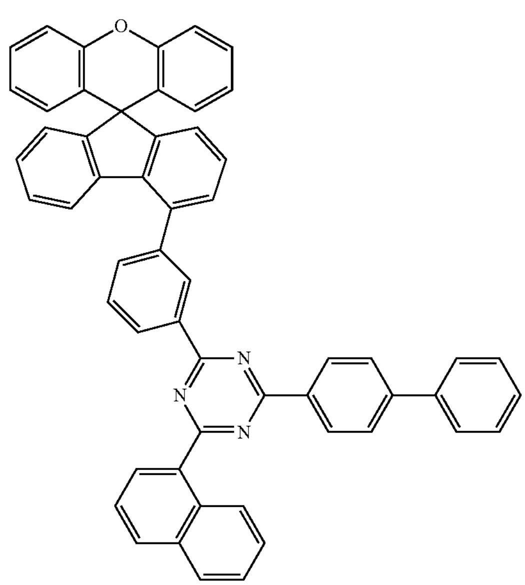
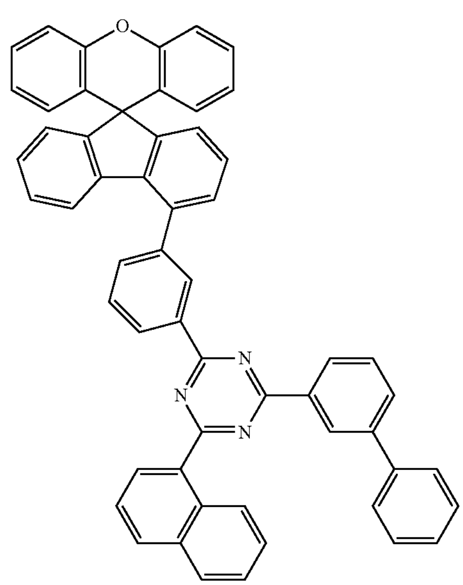

-continued
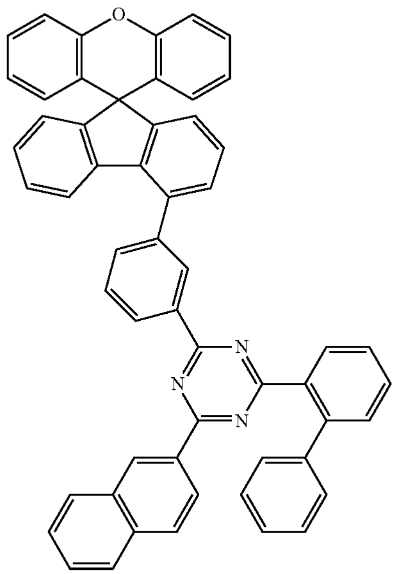
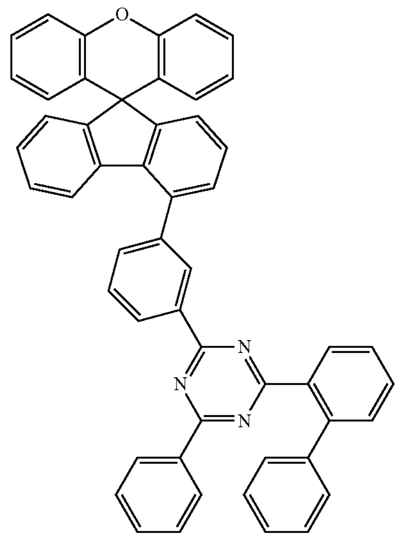
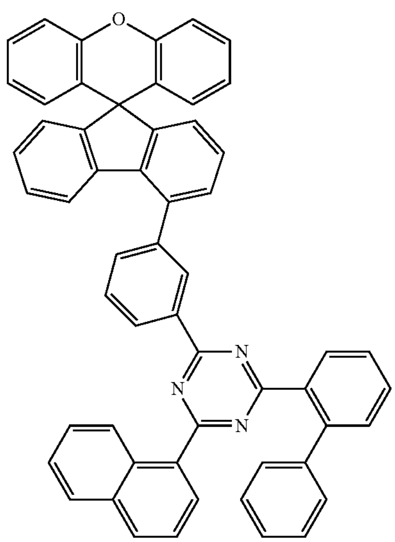
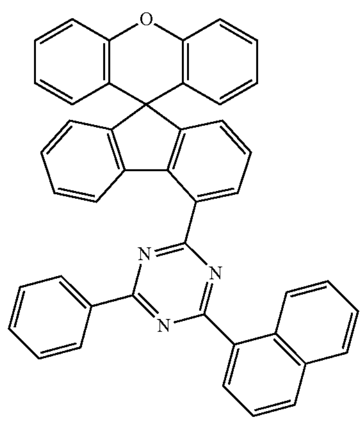
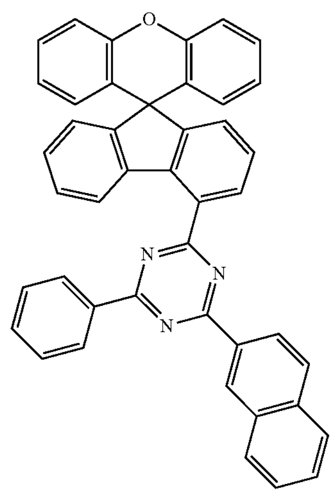
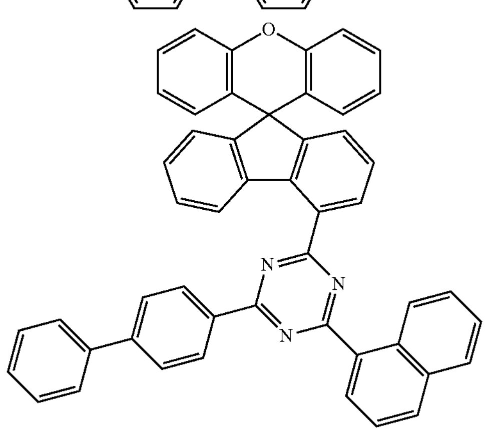
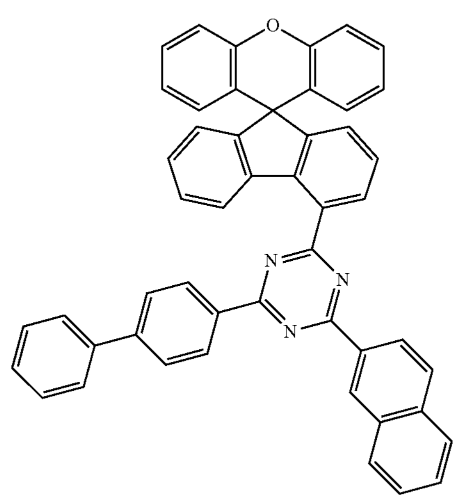

-continued
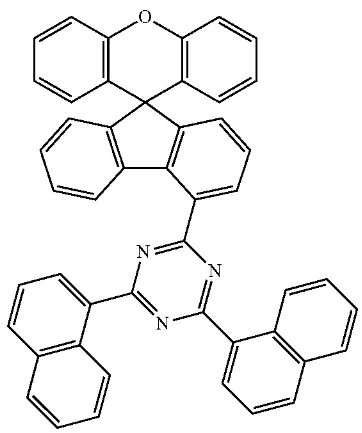
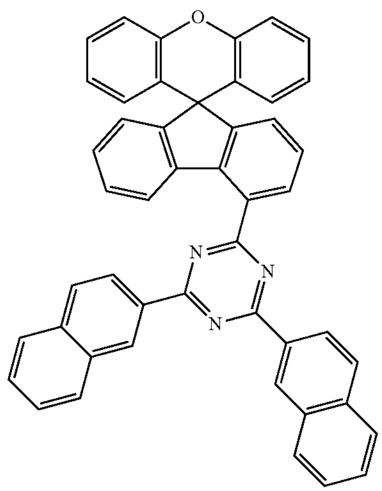
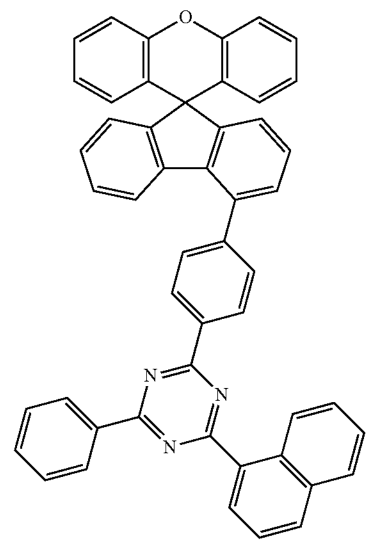
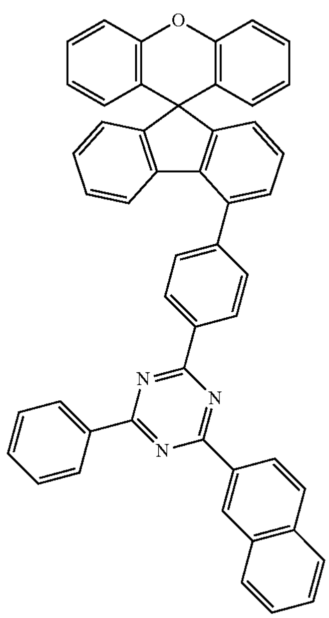
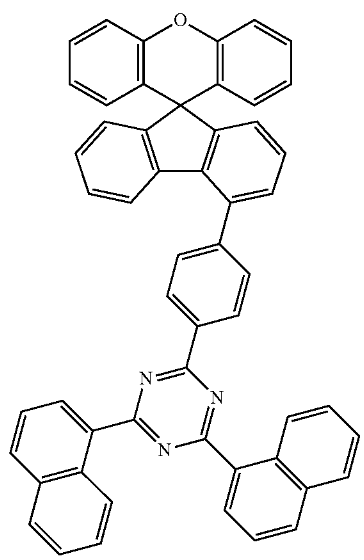
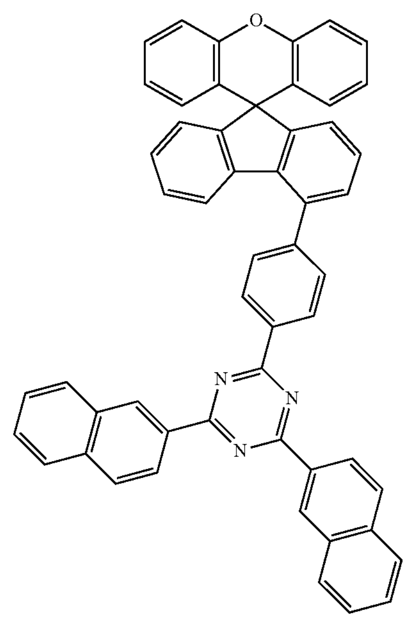
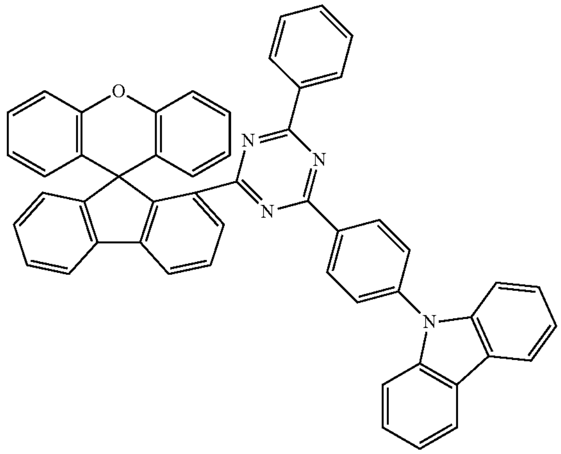
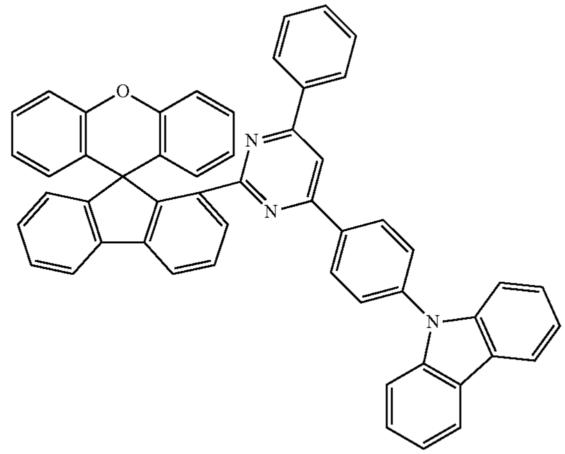

-continued
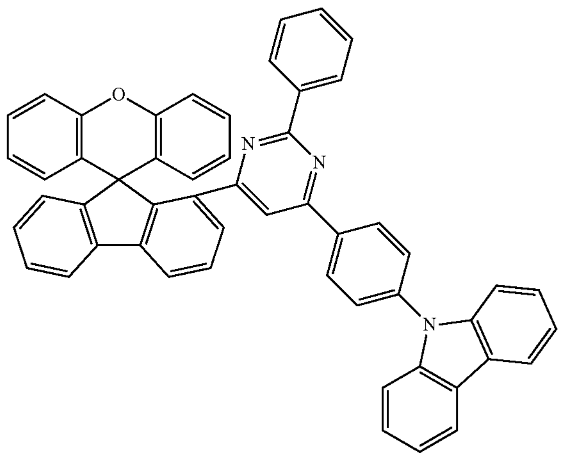
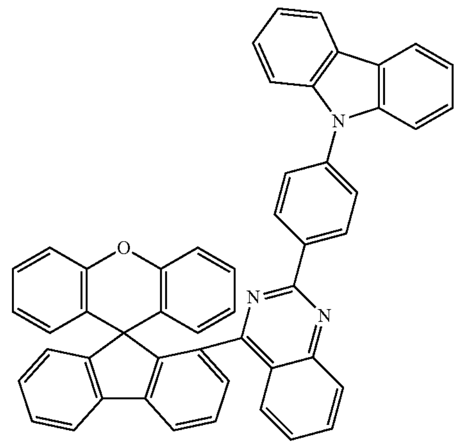
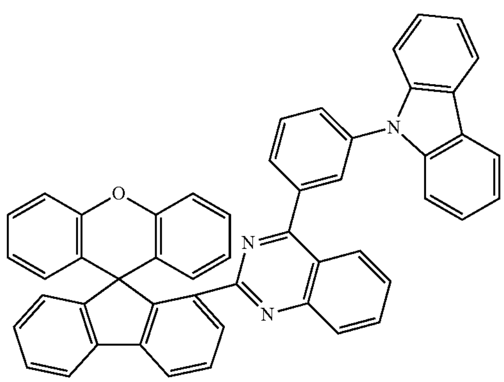
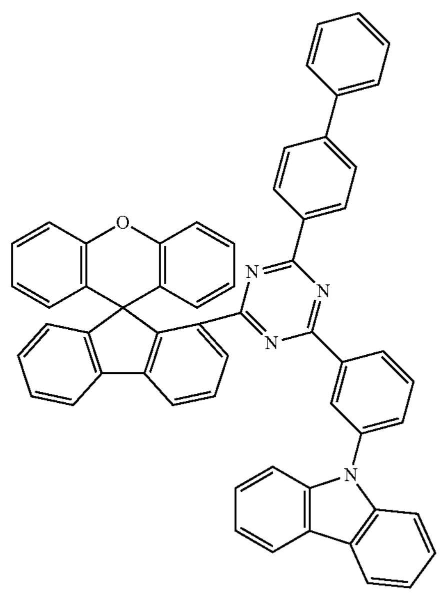
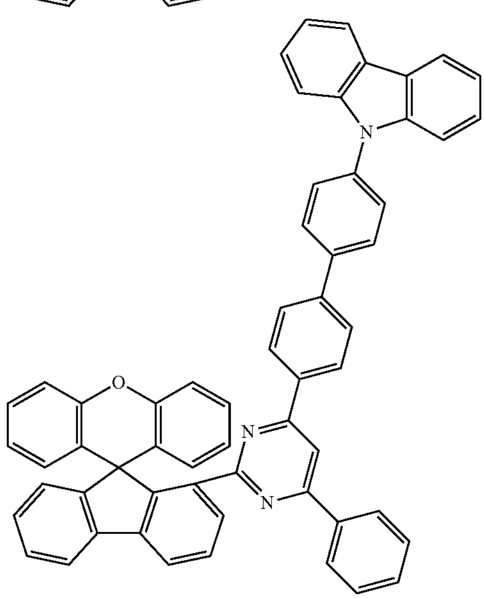
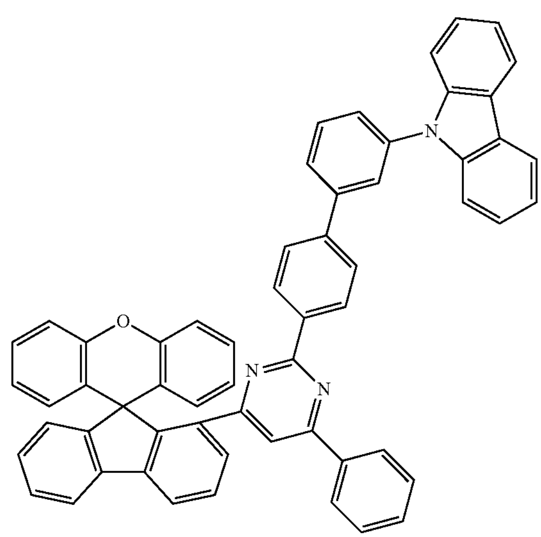

-continued
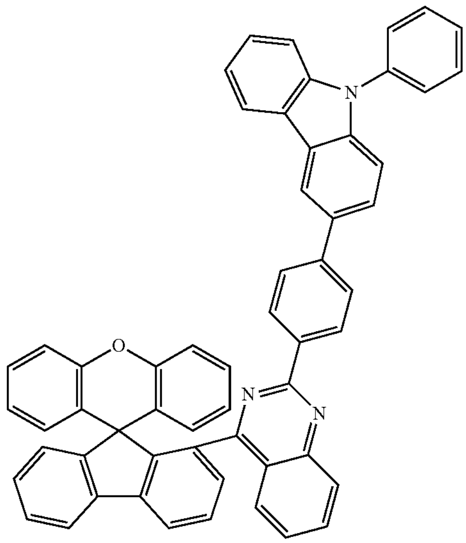
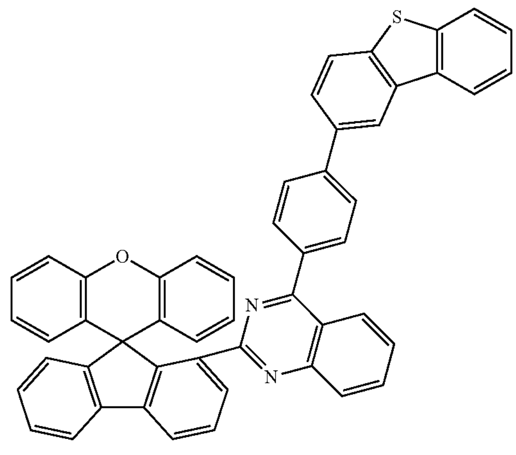
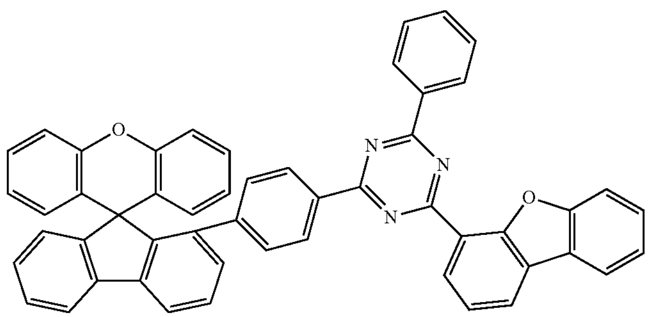
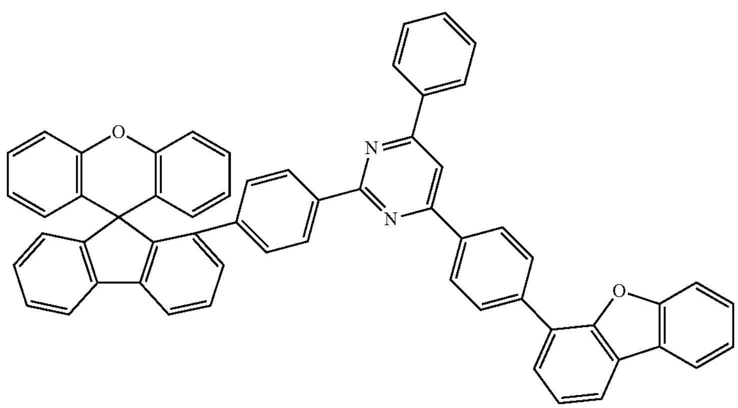
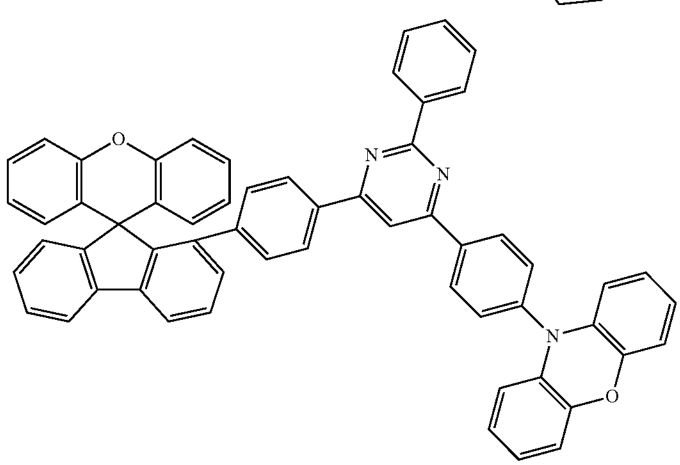

-continued
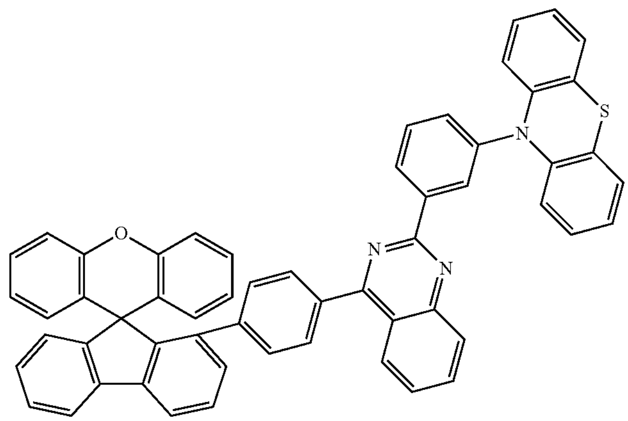
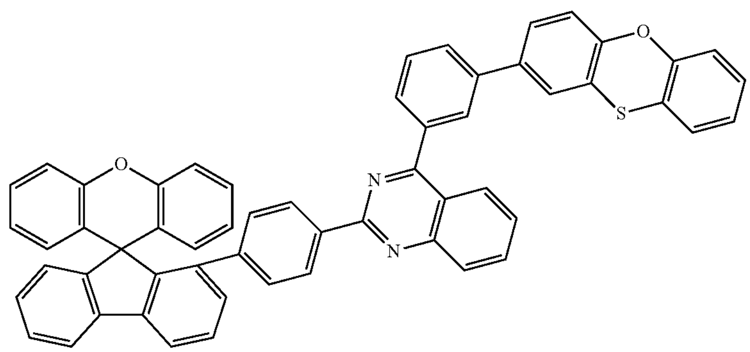
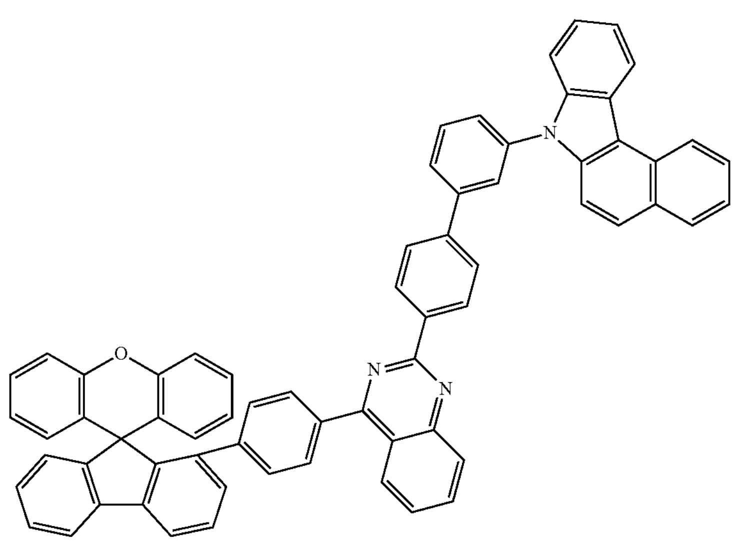

-continued
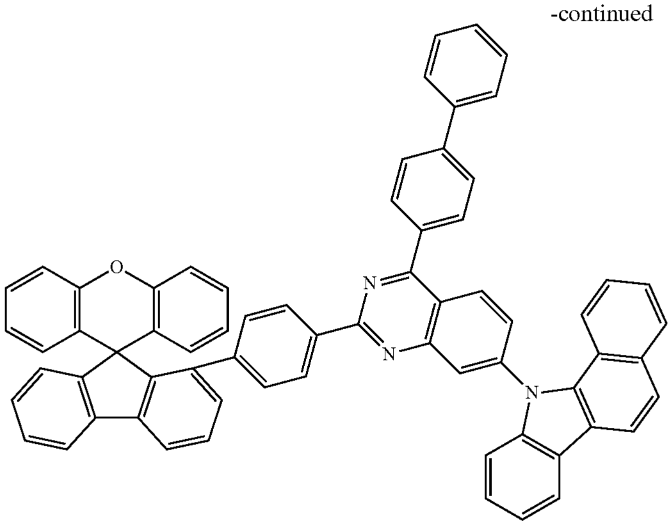
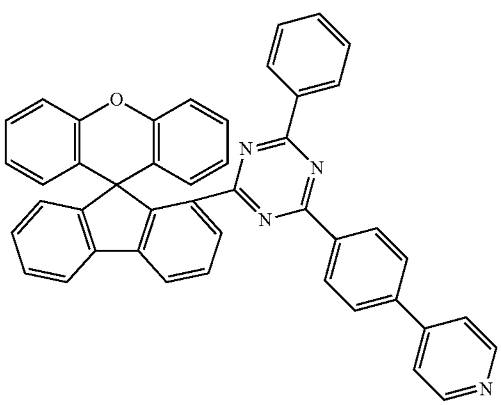
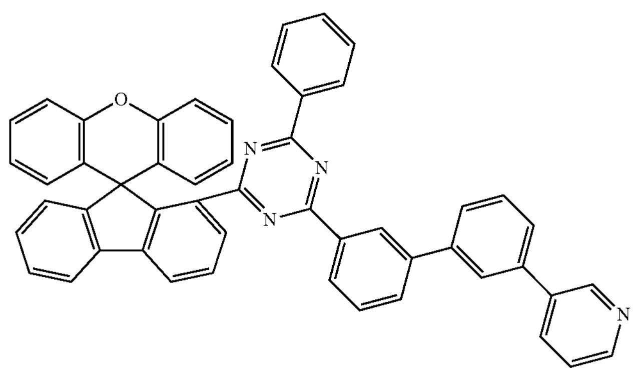
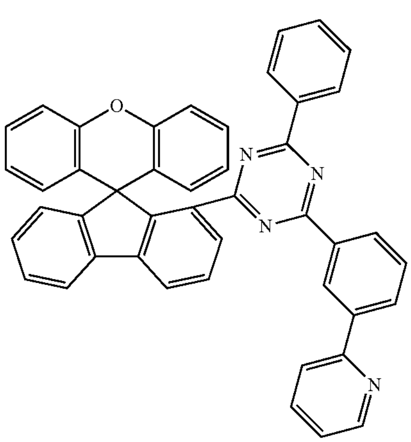
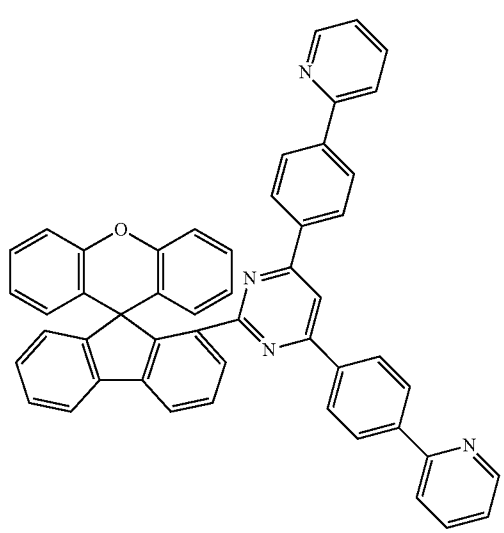

-continued
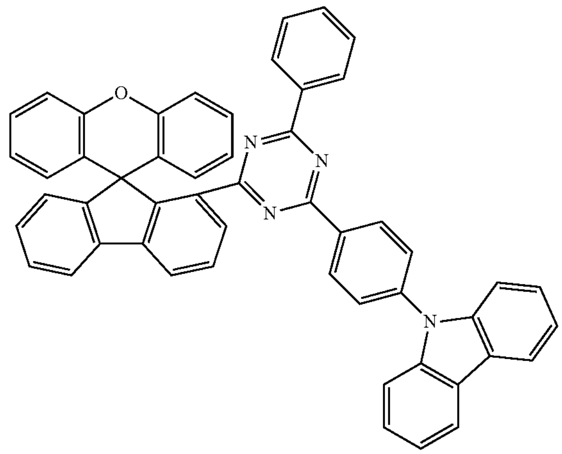
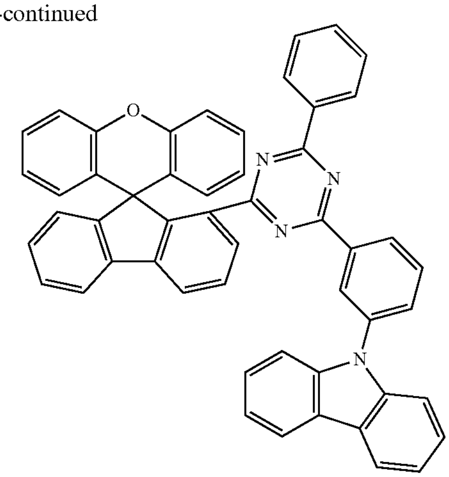
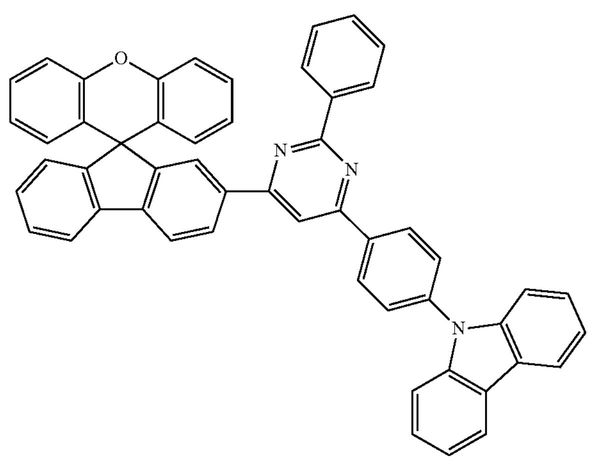
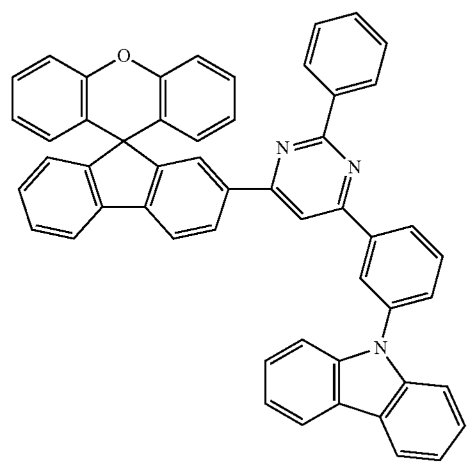
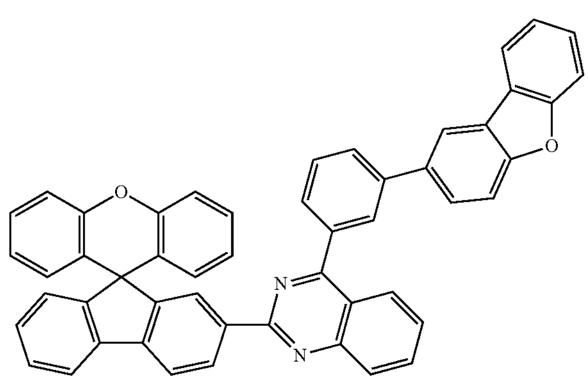
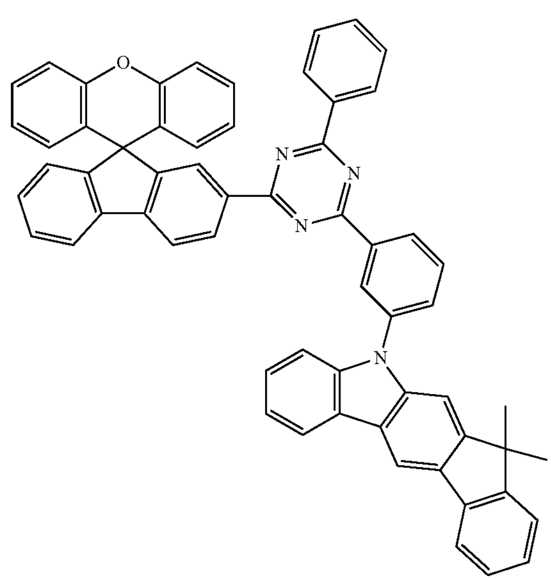

-continued
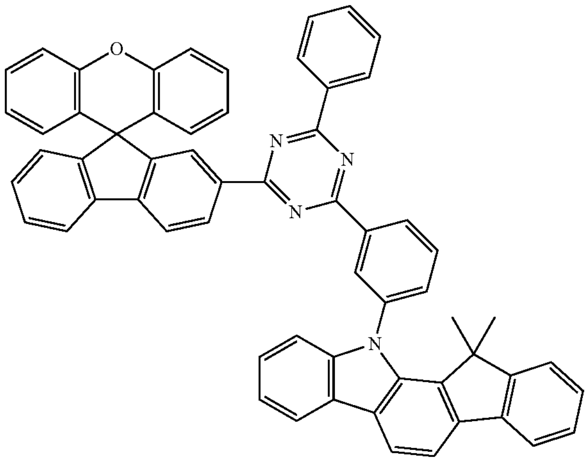
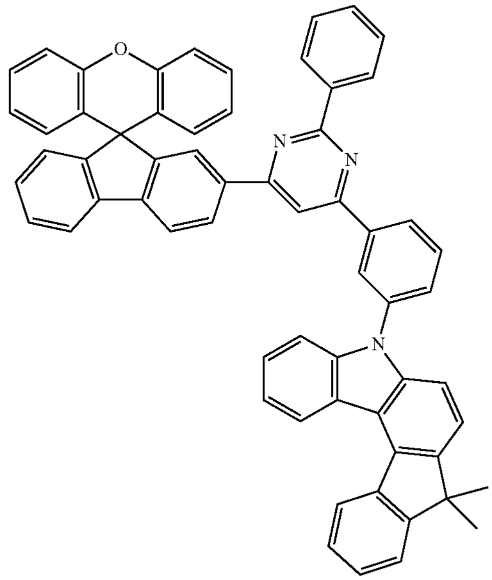
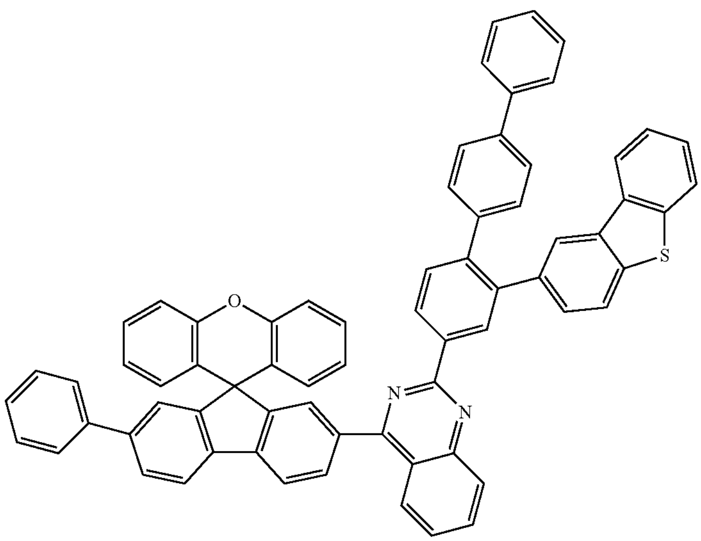
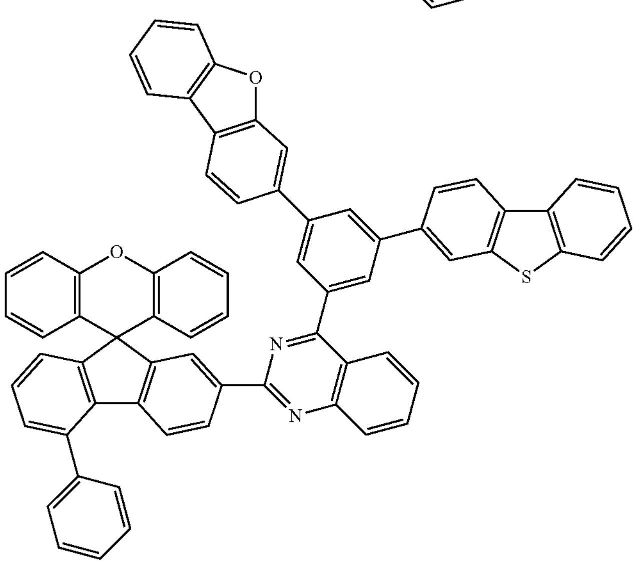

-continued
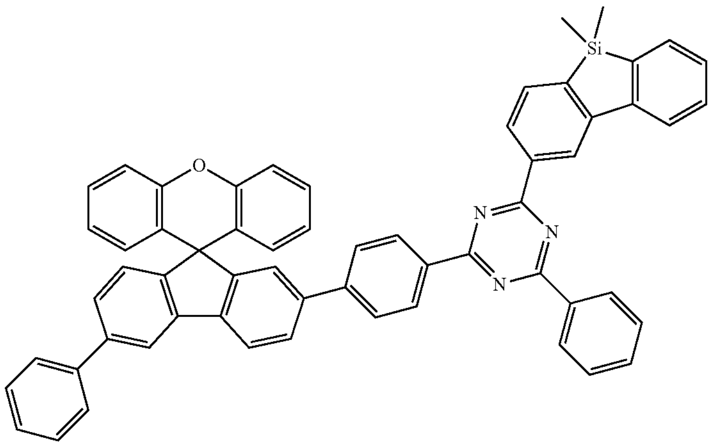
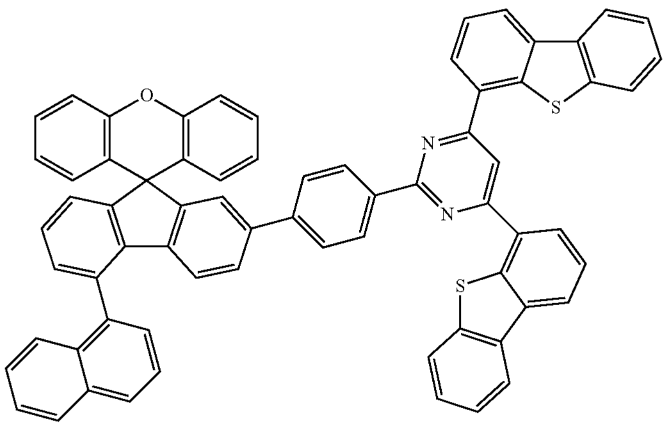
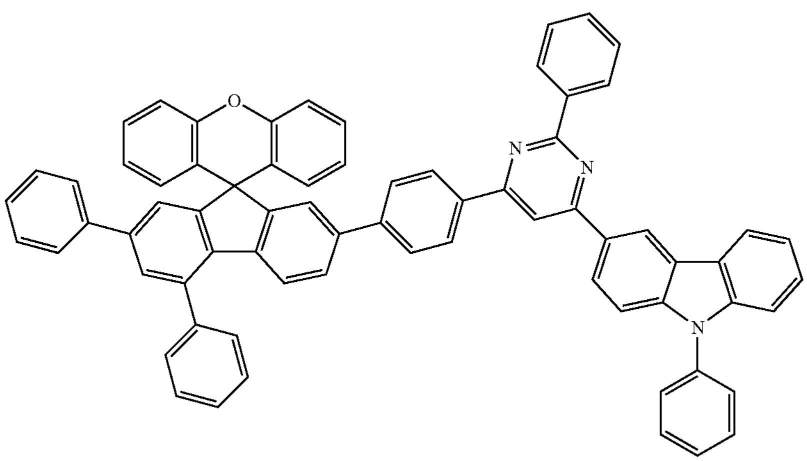
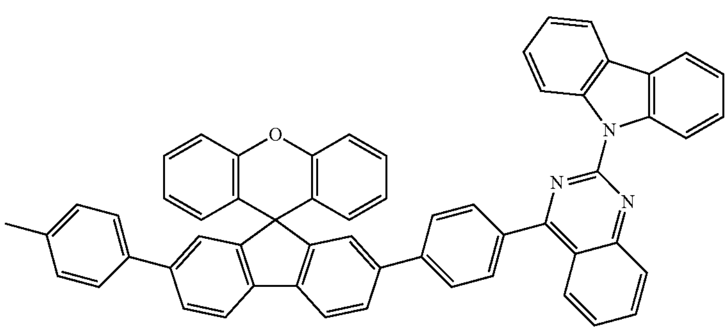

-continued
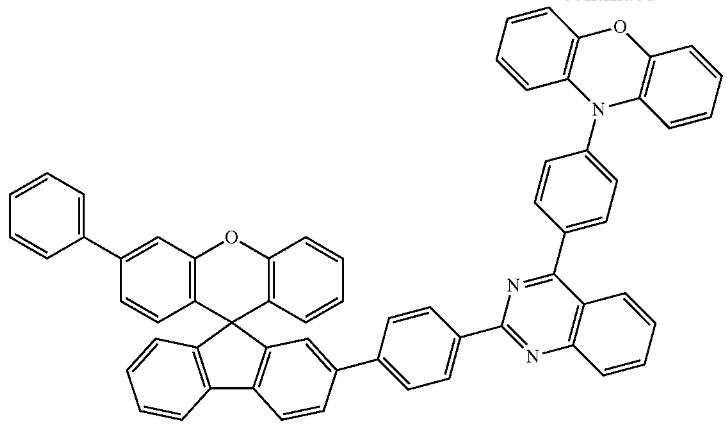
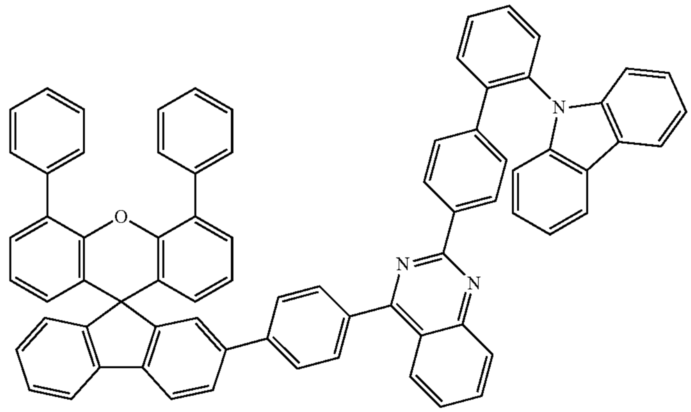
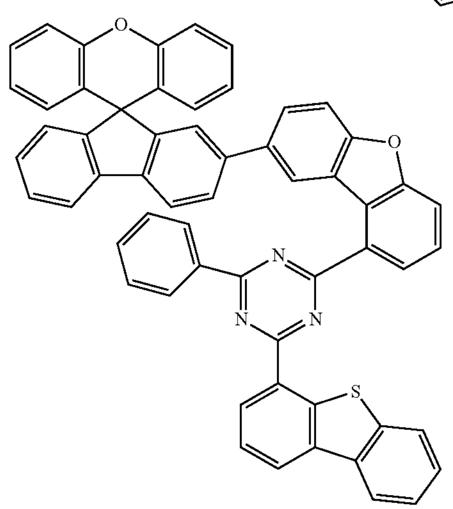
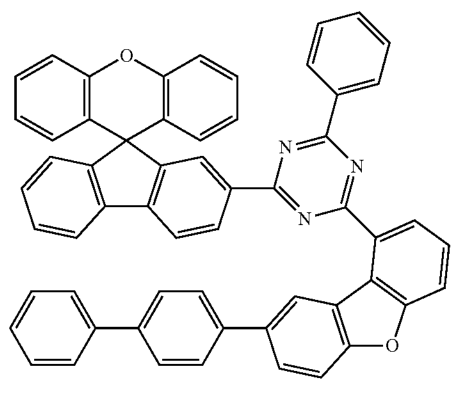
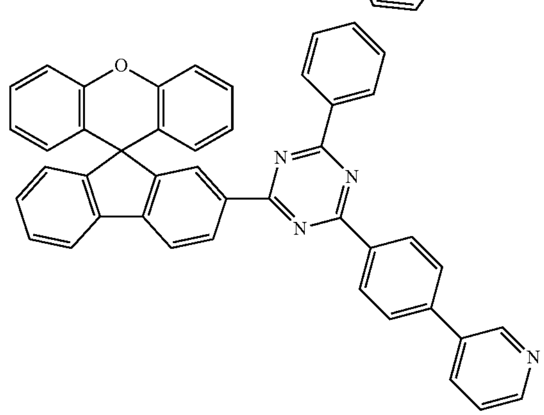
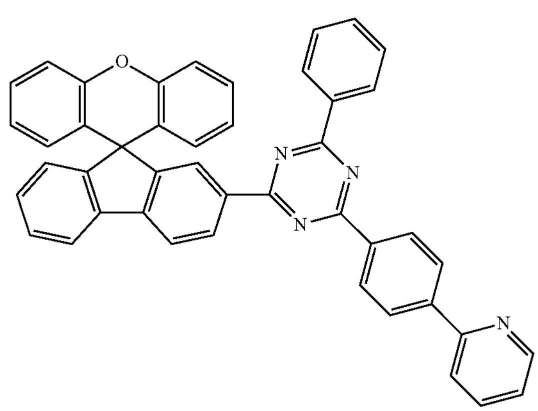

-continued
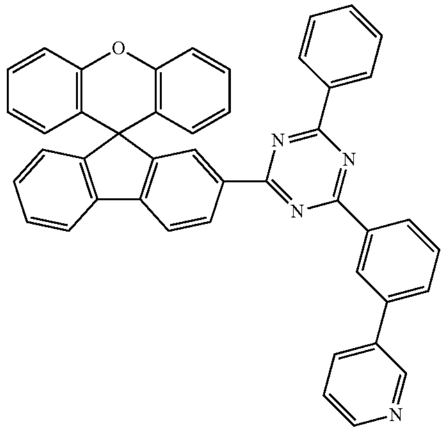
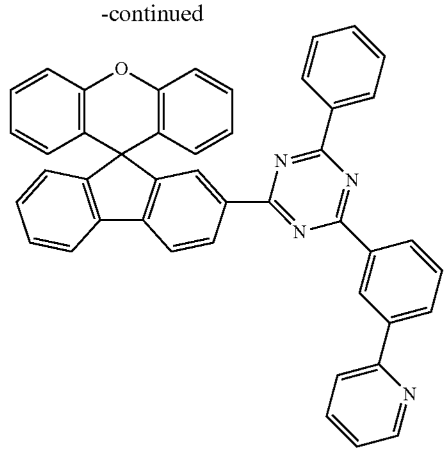
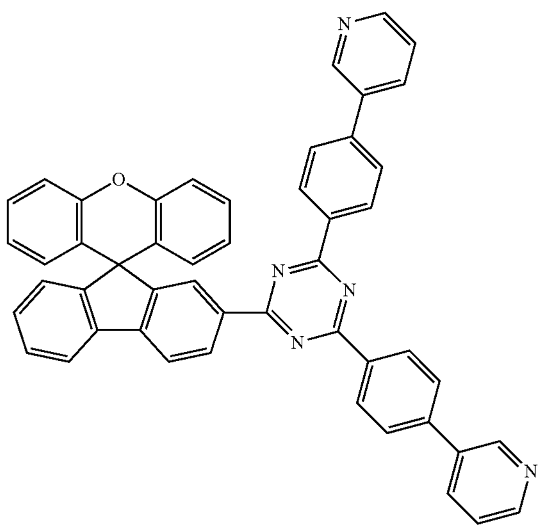
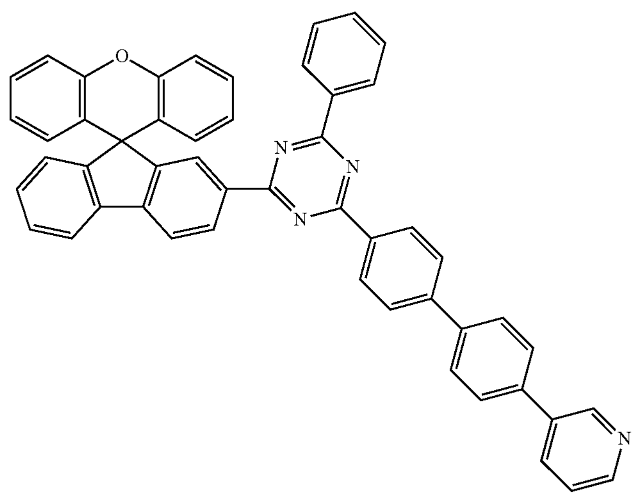
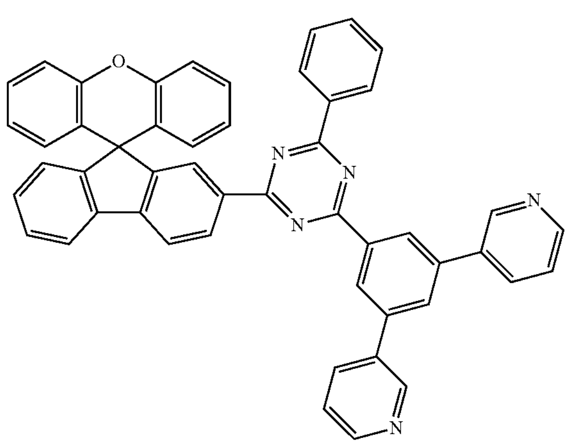
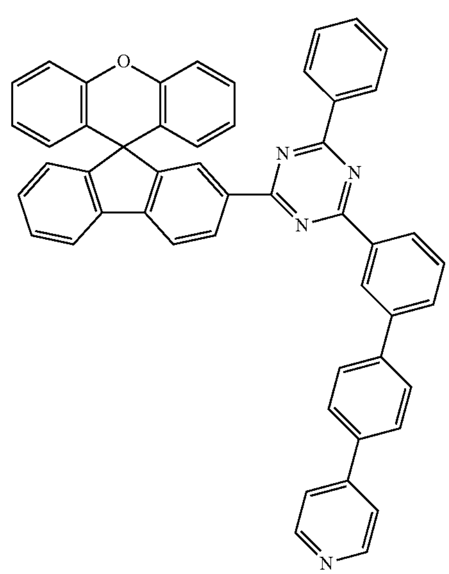

-continued
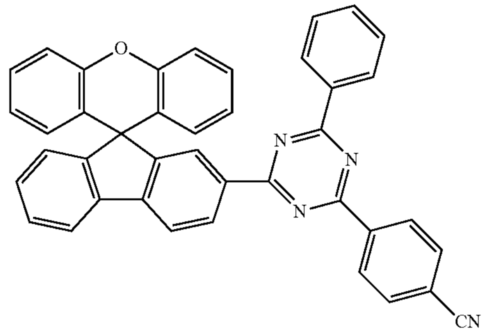
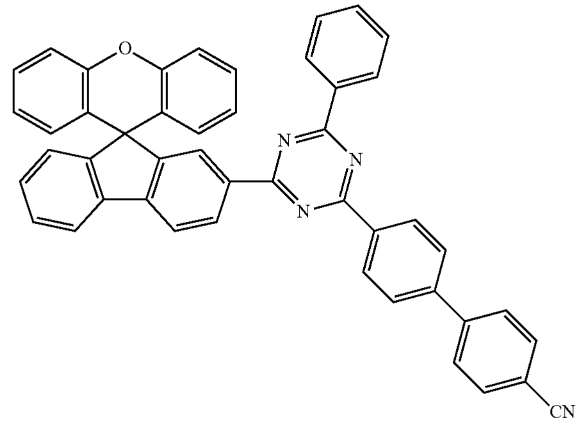
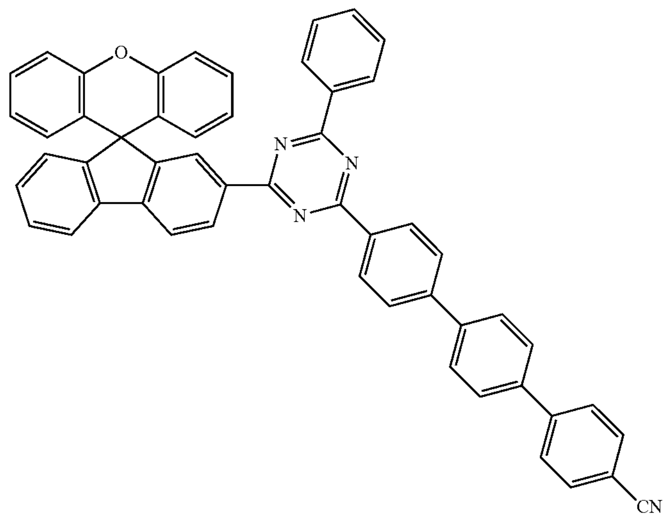
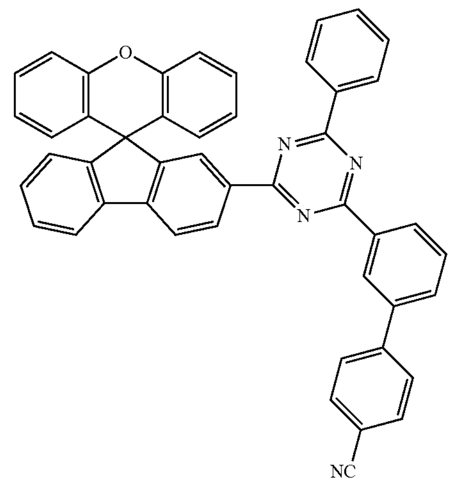
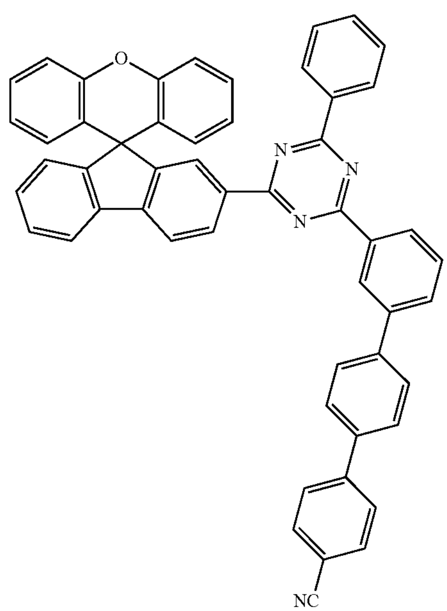
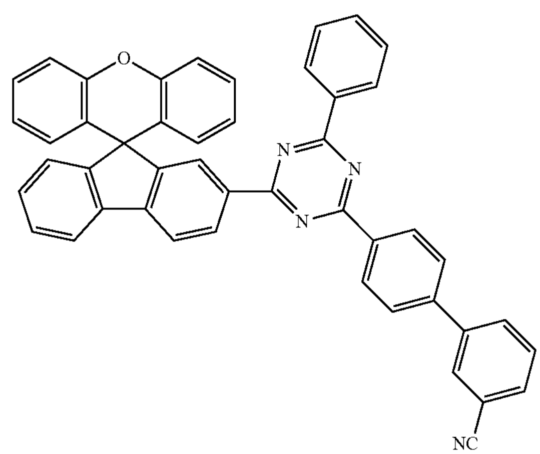

-continued
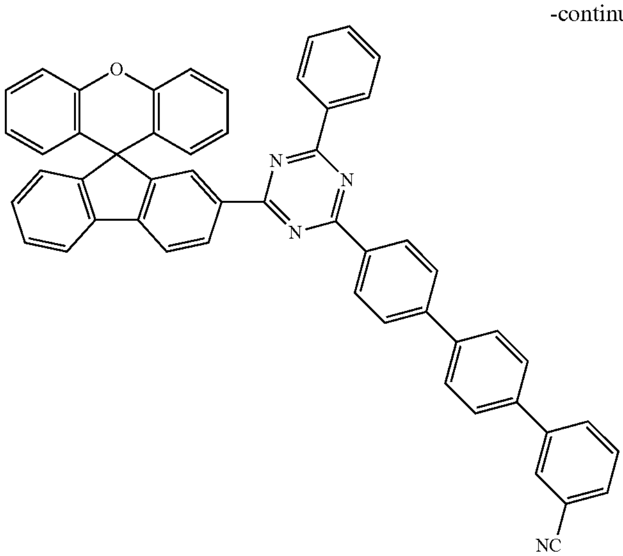
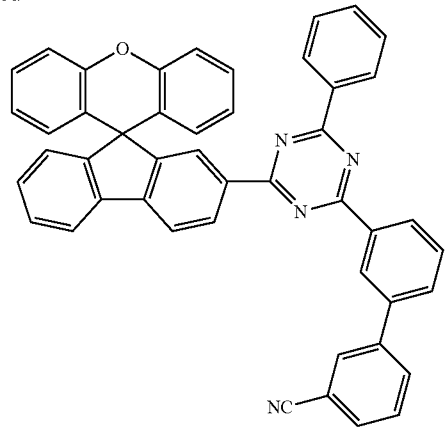
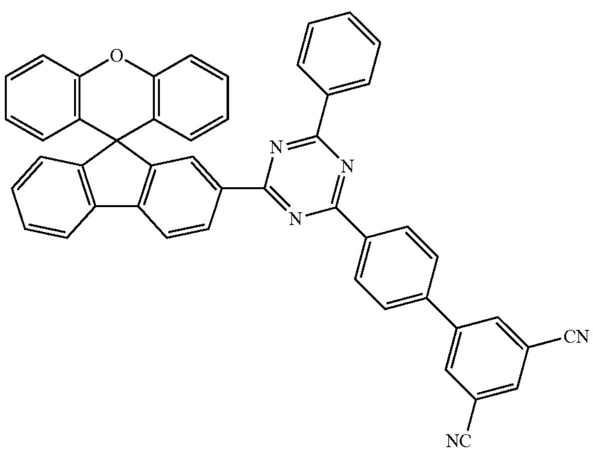
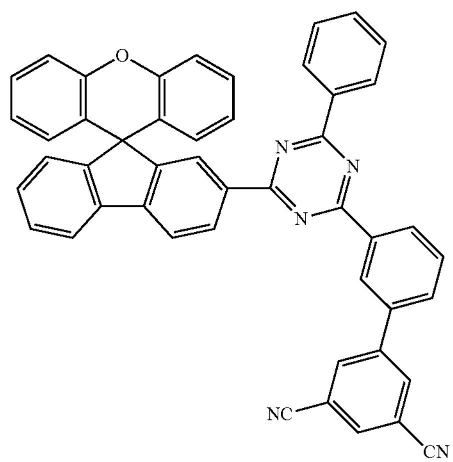
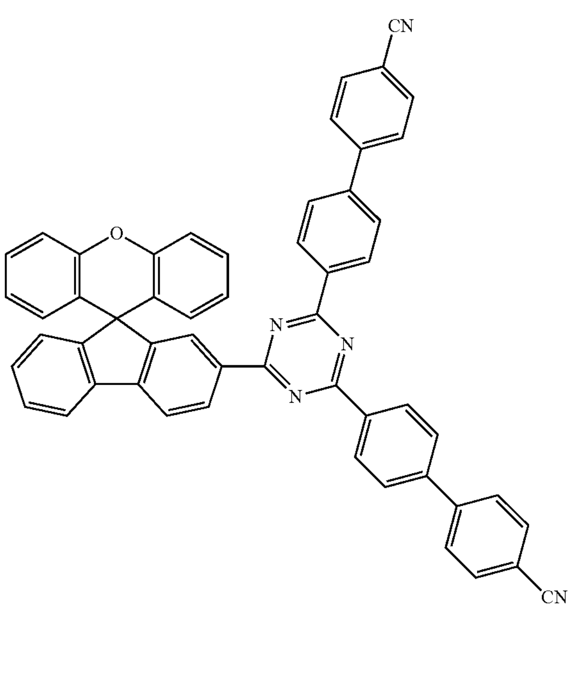

-continued
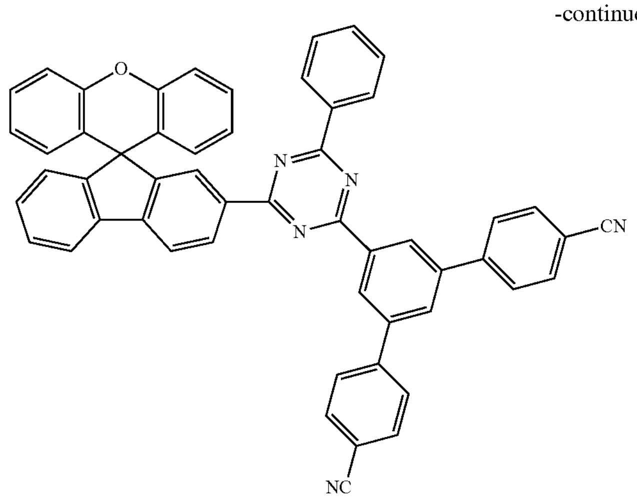
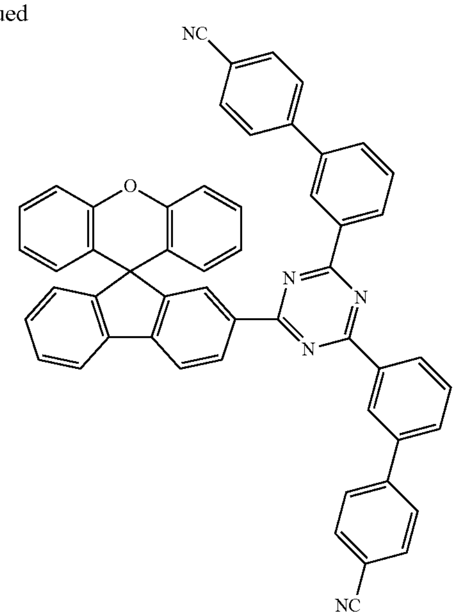
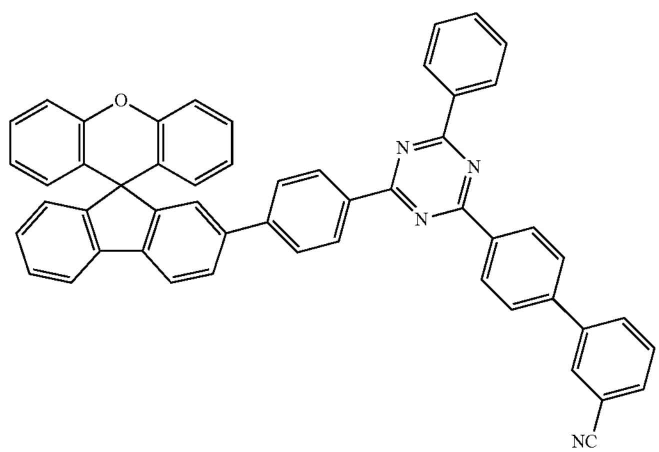
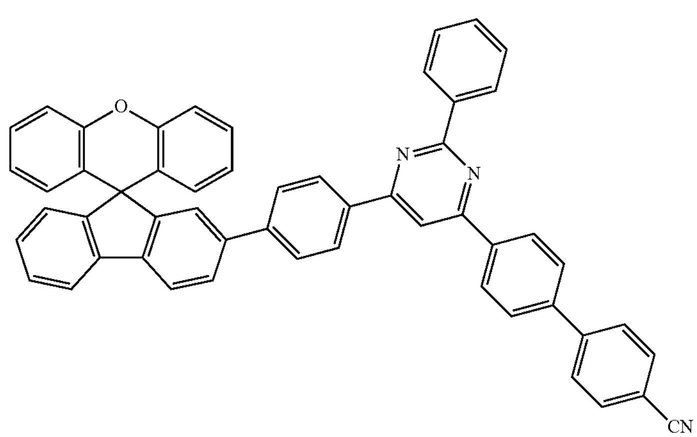

-continued
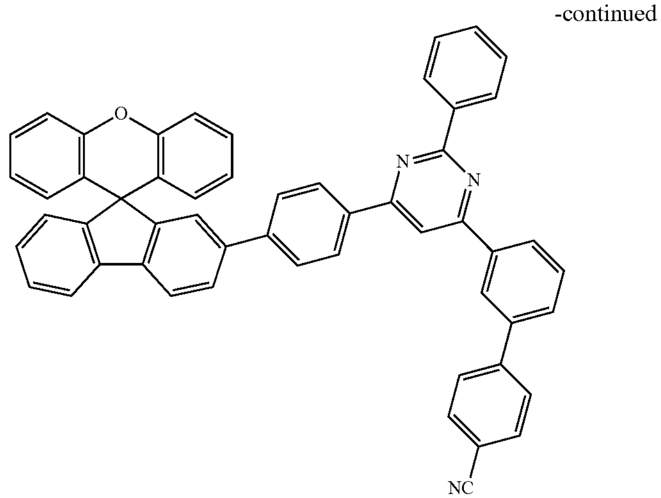
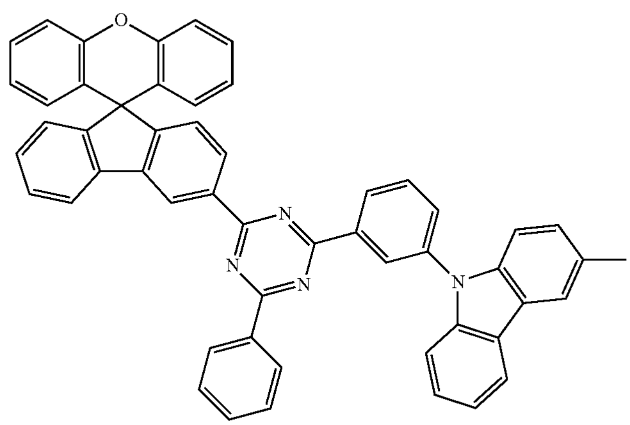
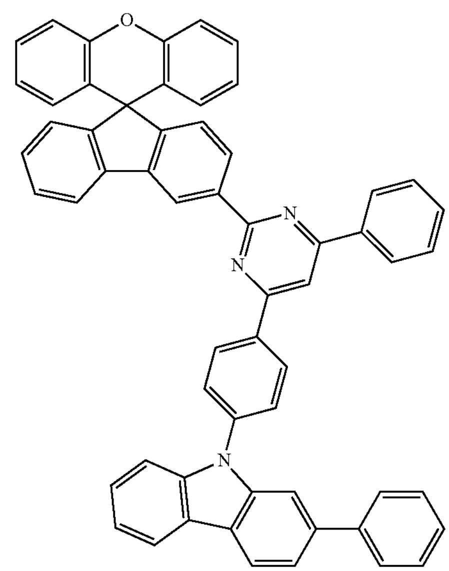
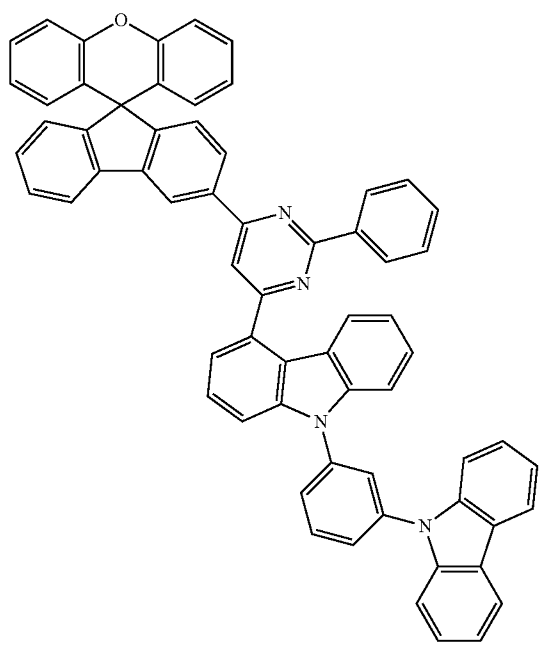

-continued
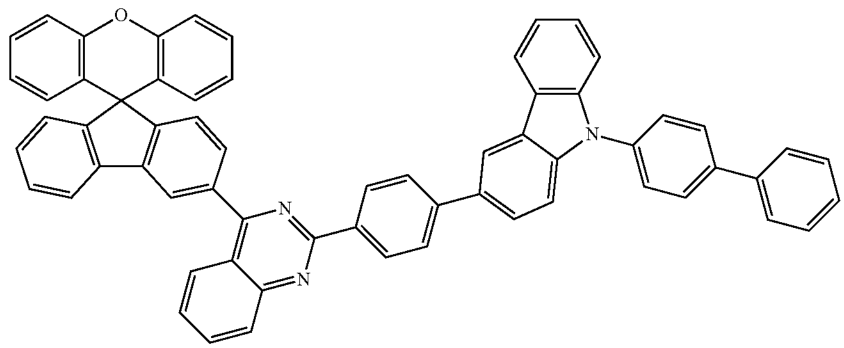
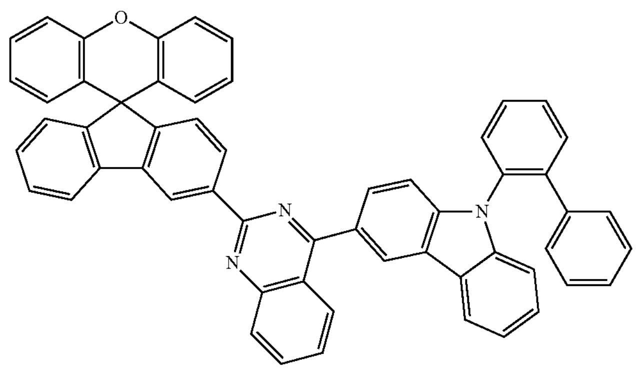
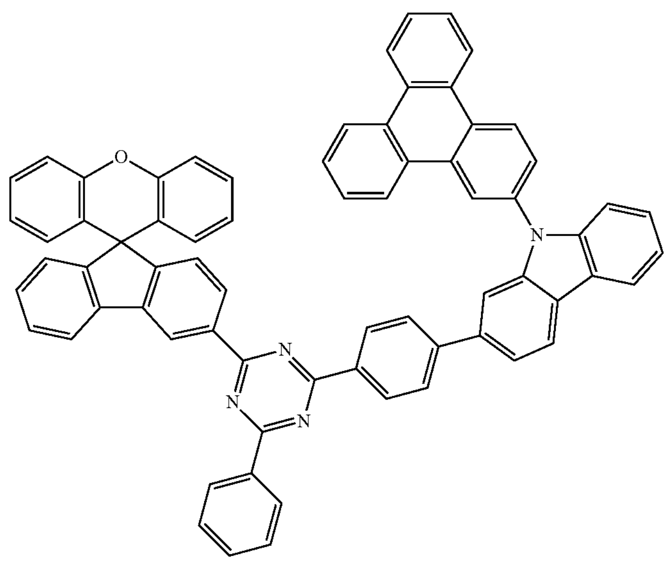
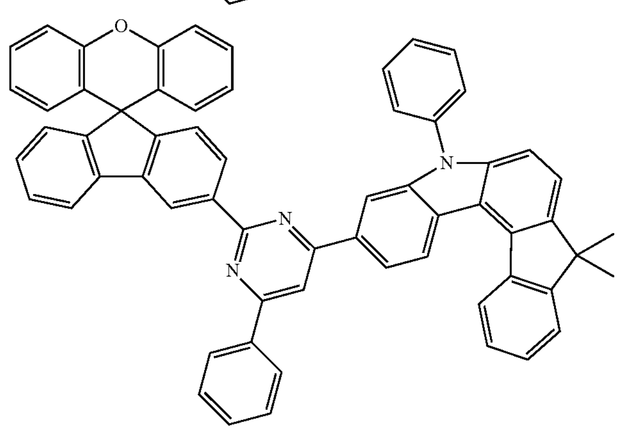

-continued
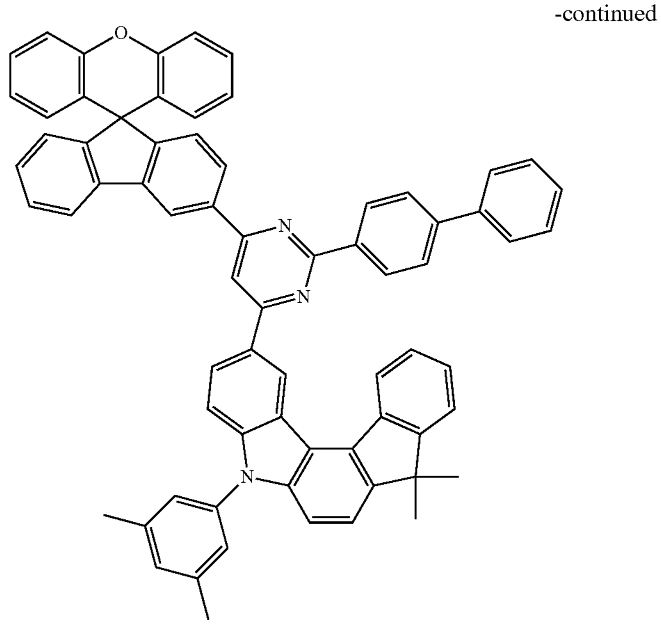
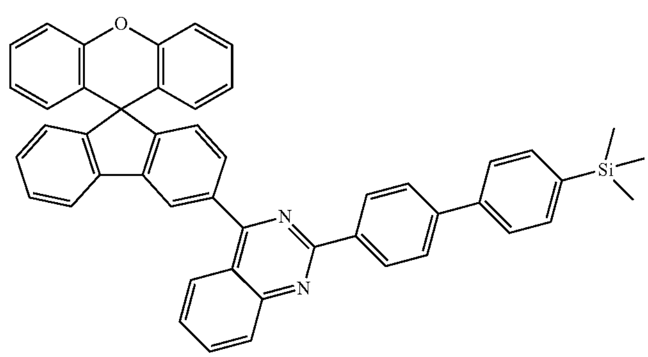
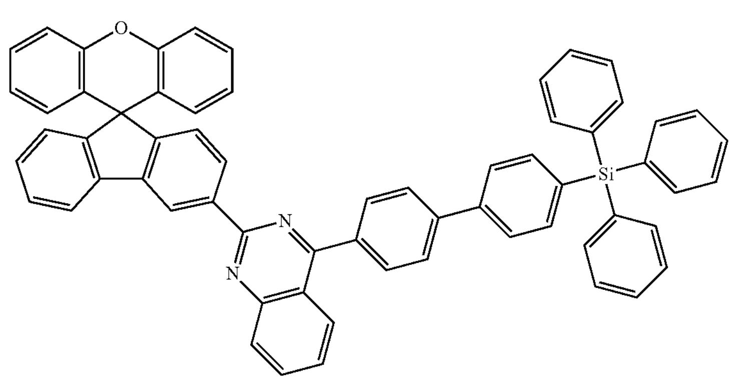

-continued
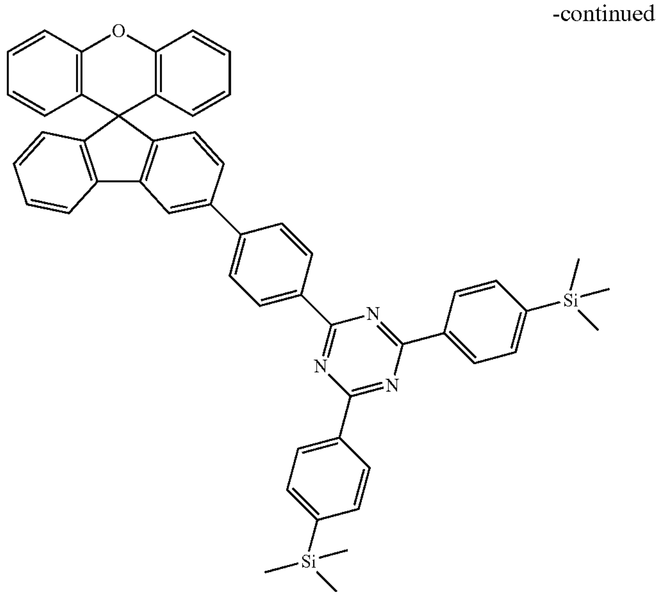
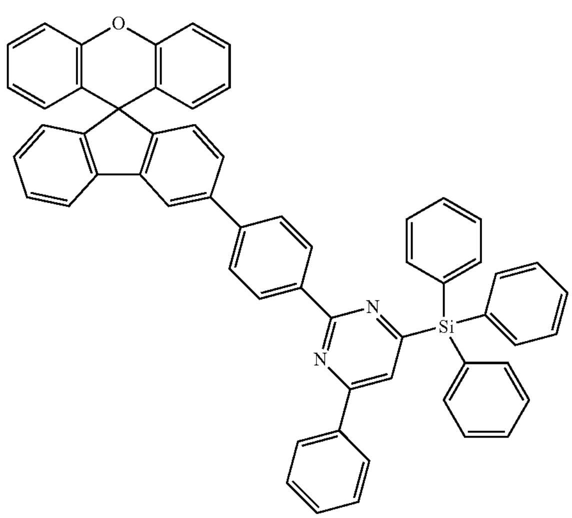
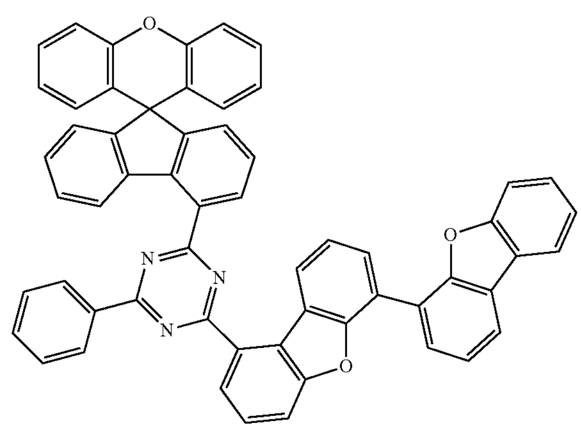
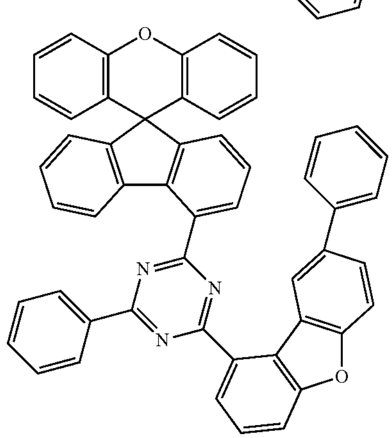
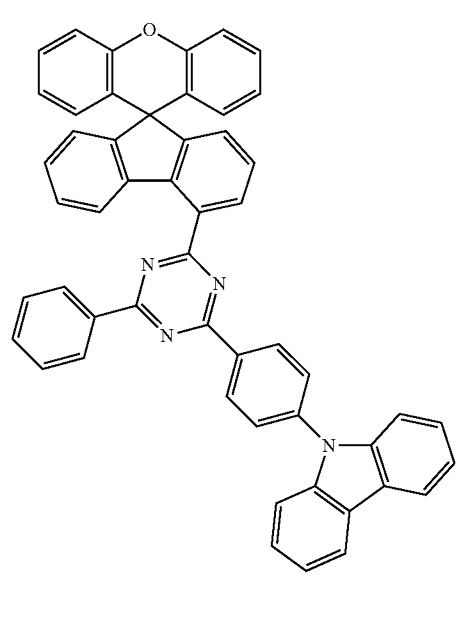

-continued
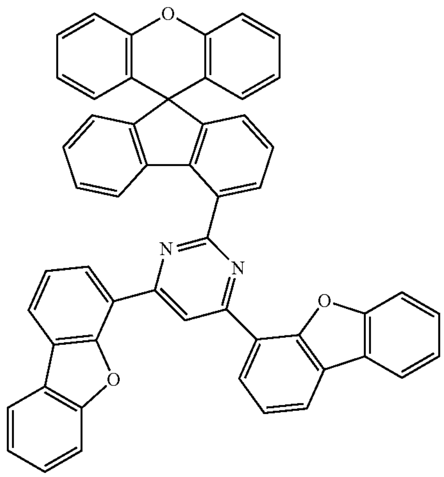
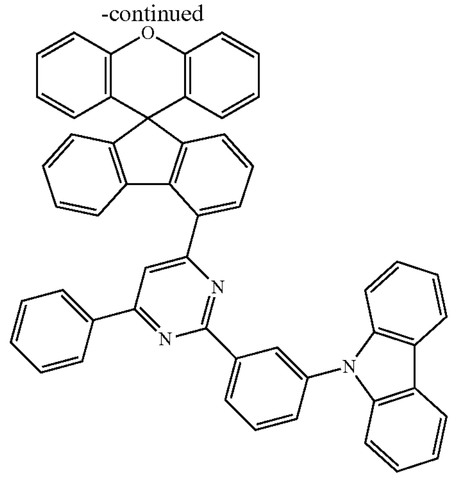
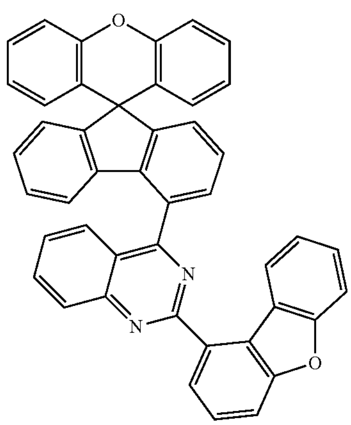
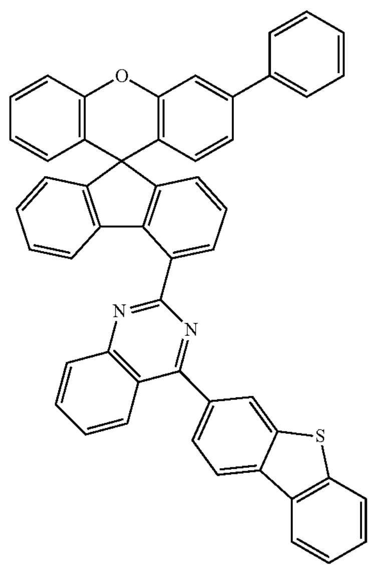
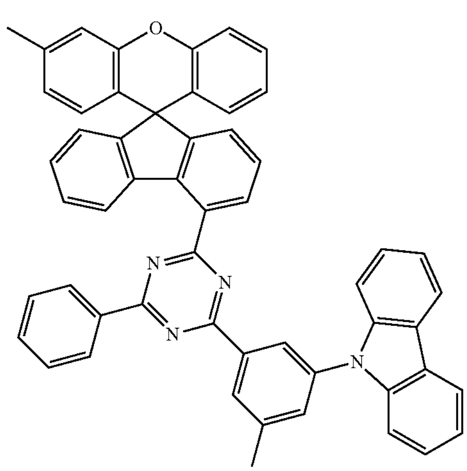
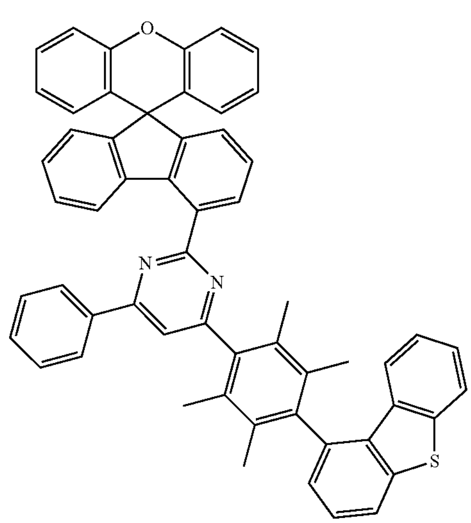

-continued
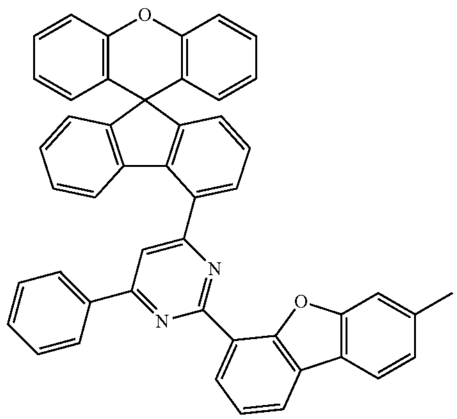
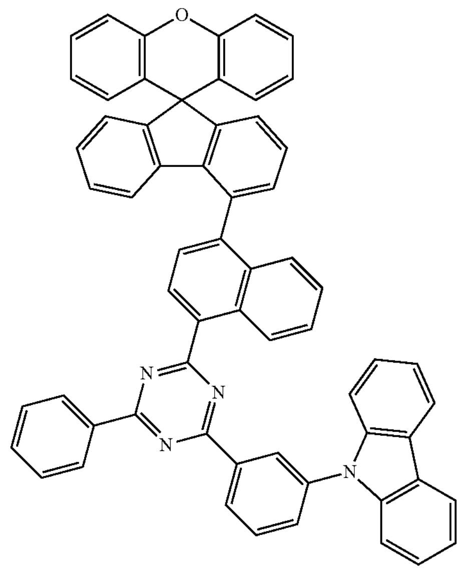
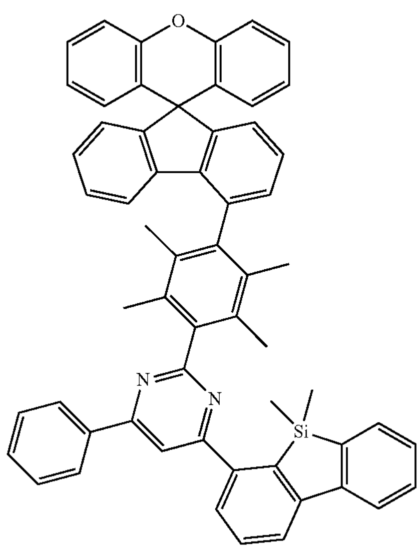
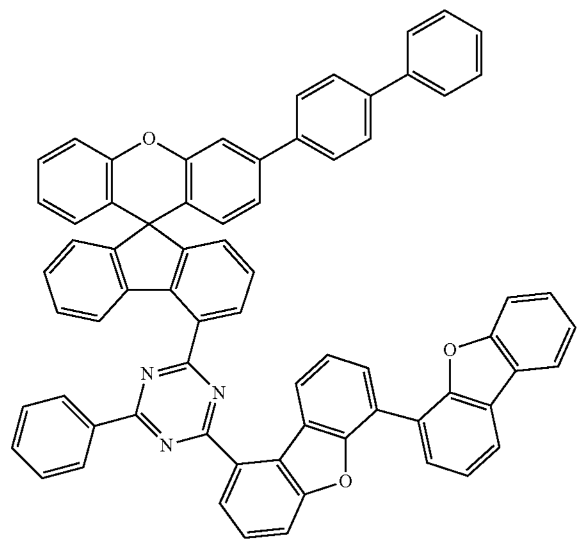
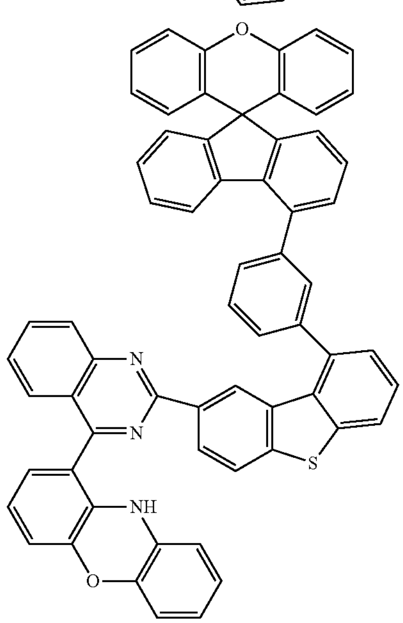
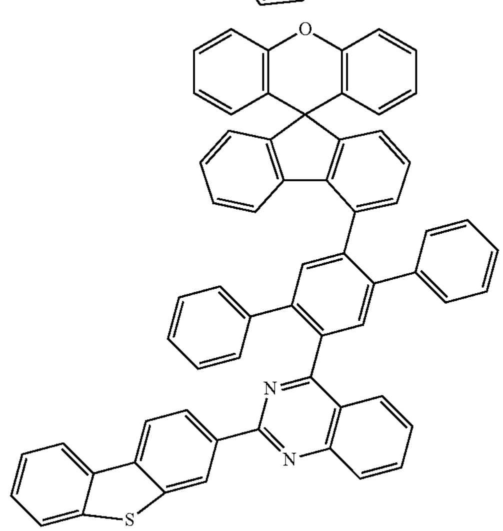

-continued
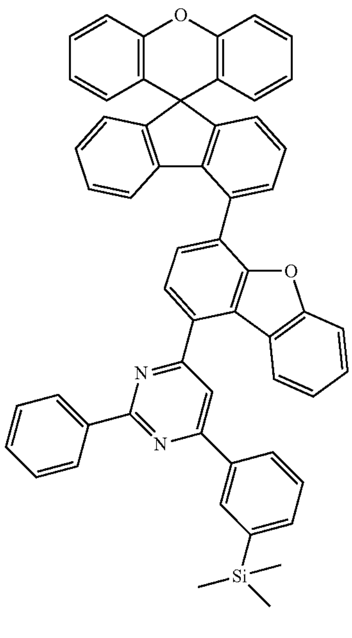
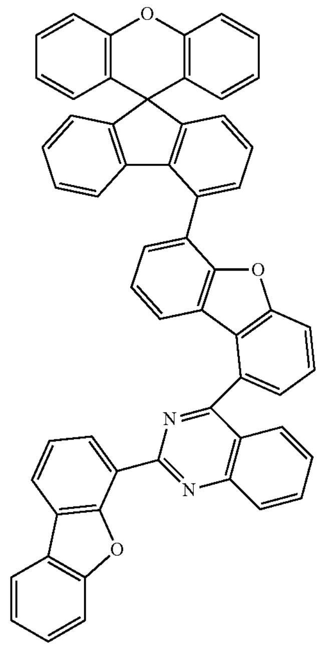
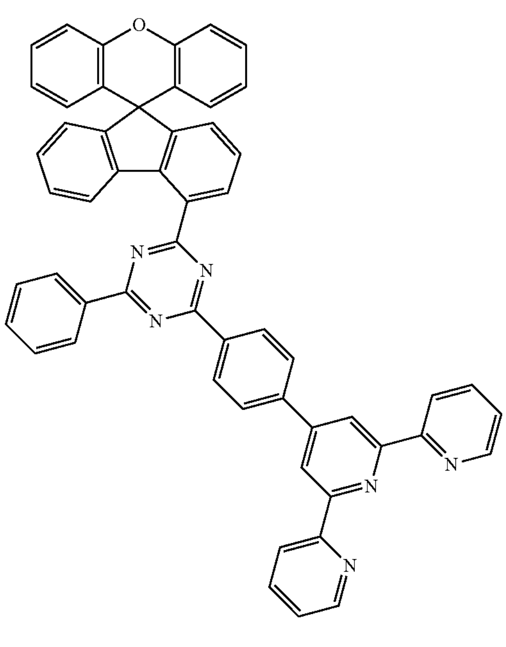
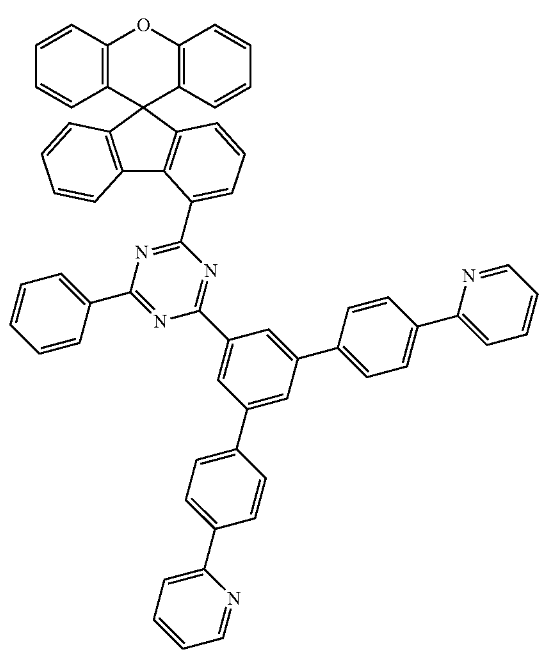

-continued
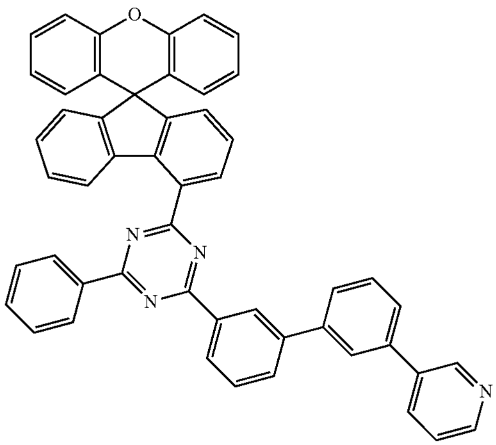
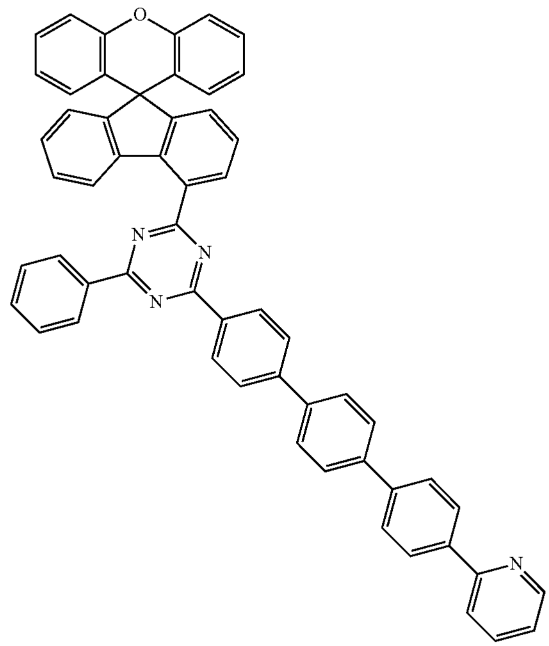
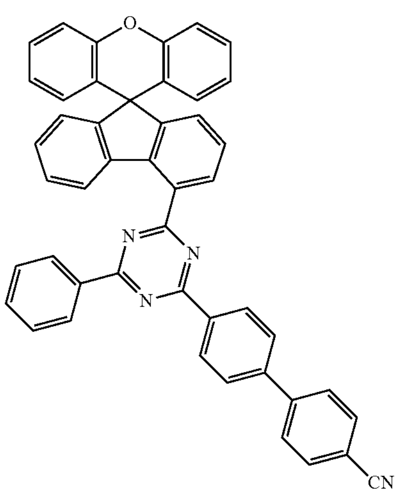
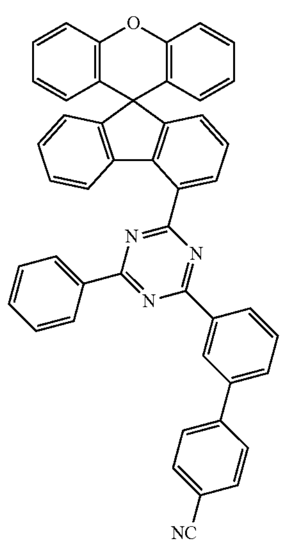
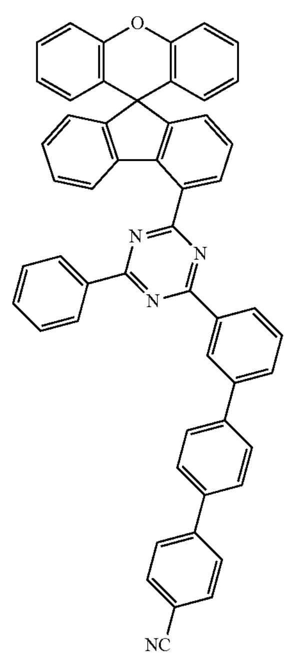

-continued
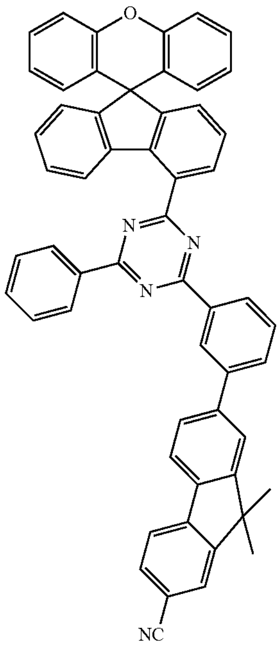
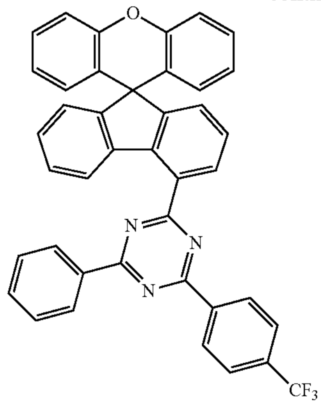
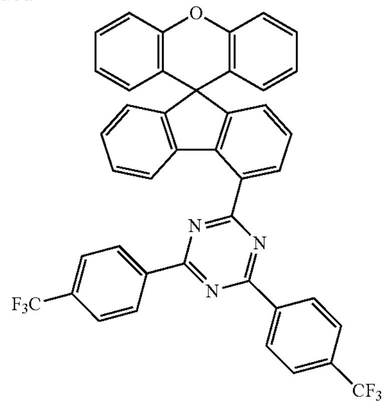
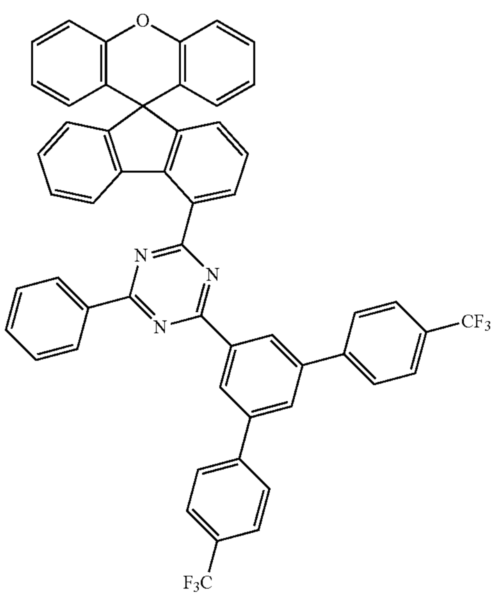
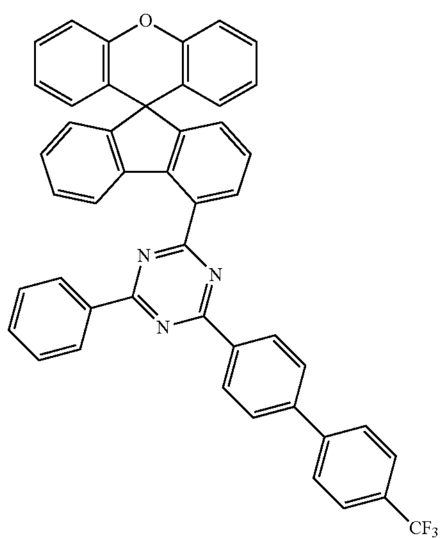
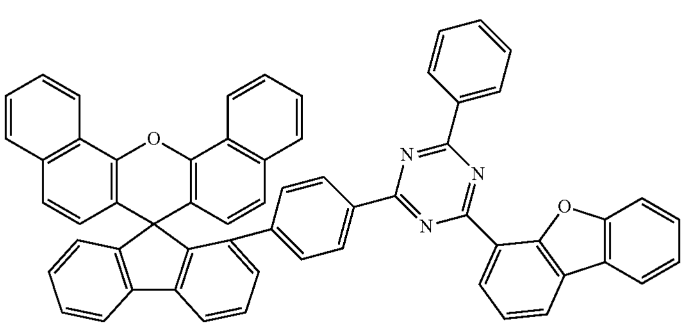

-continued
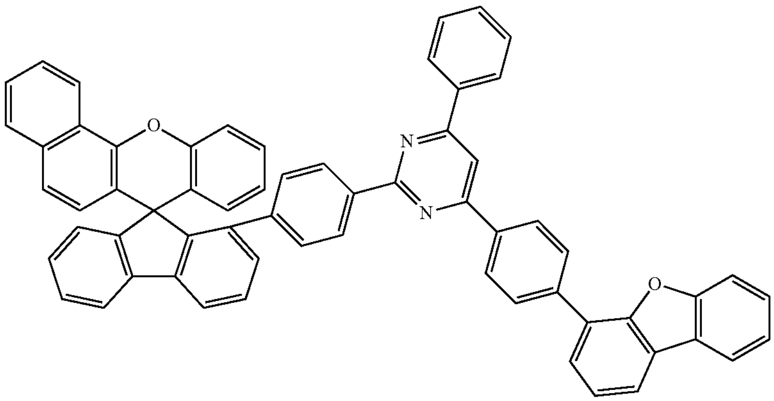
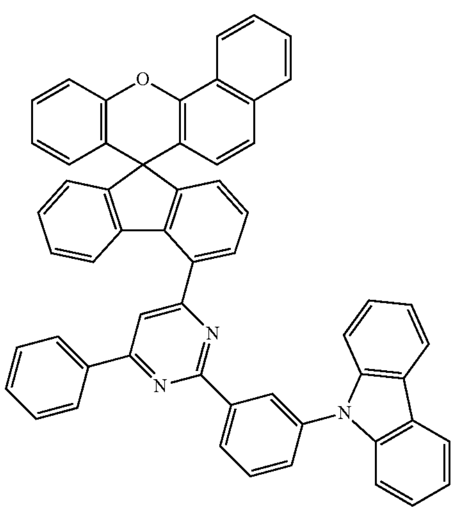
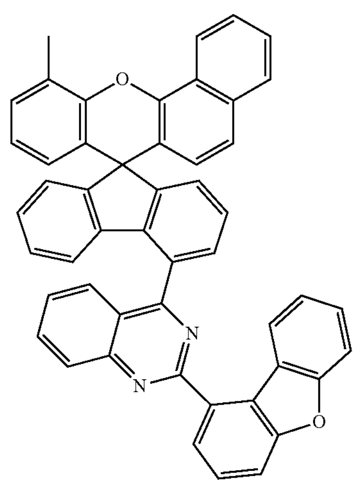
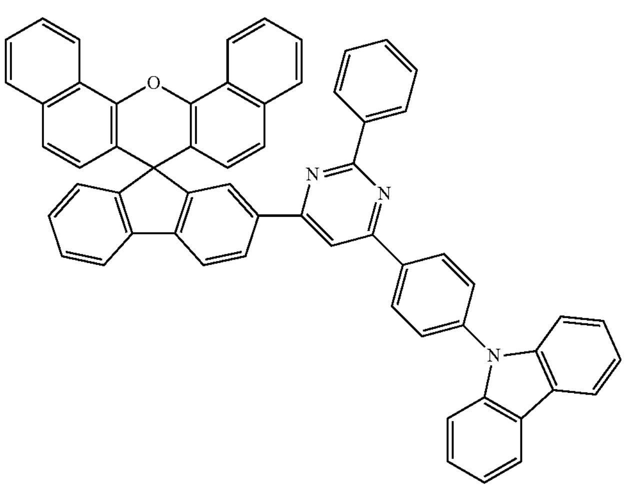
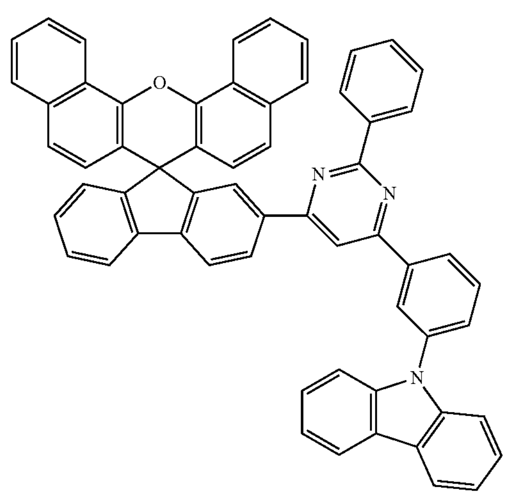

-continued
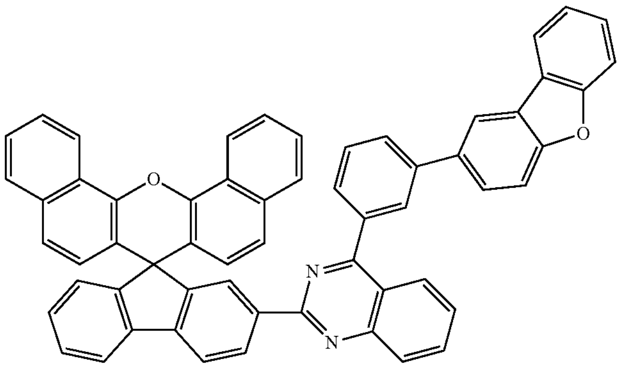
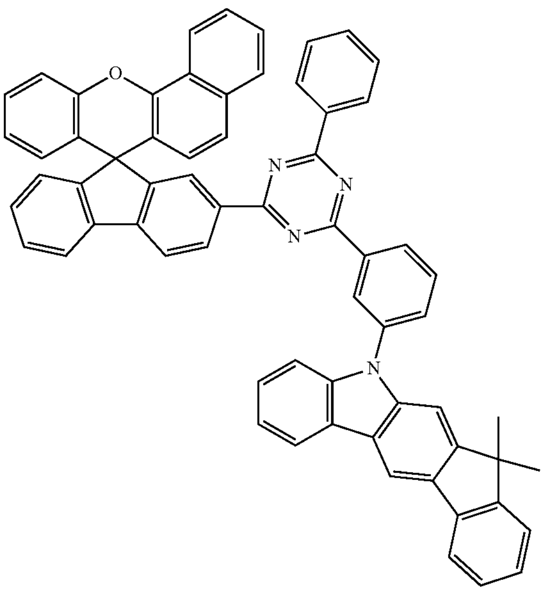
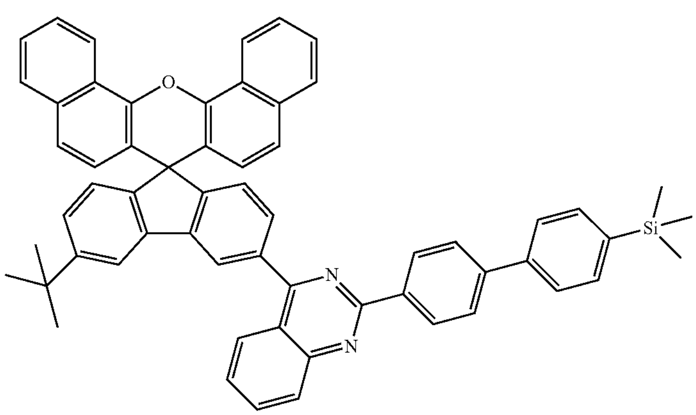
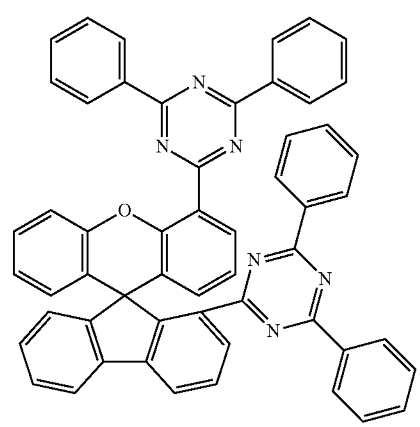

-continued
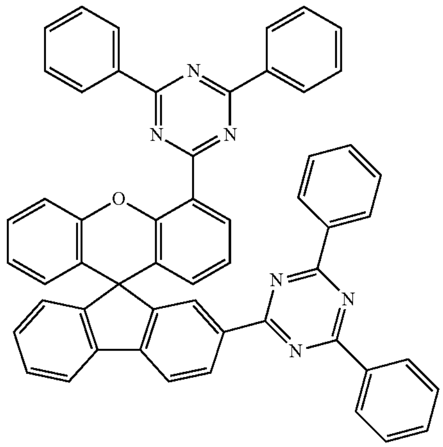
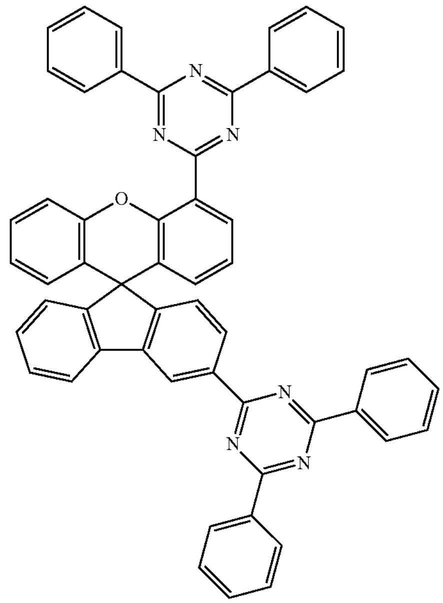
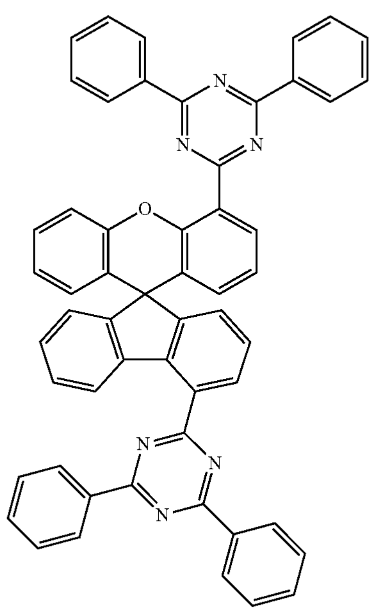
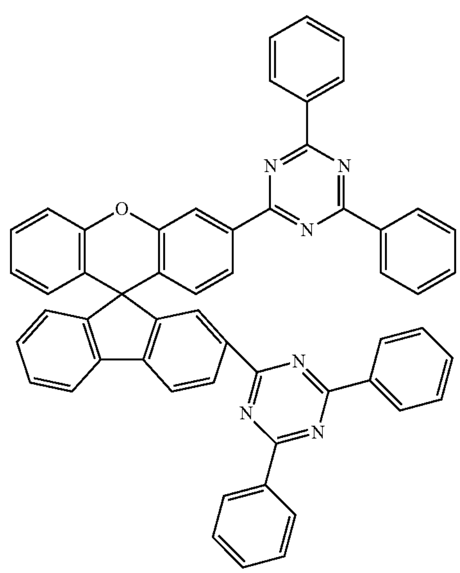

-continued
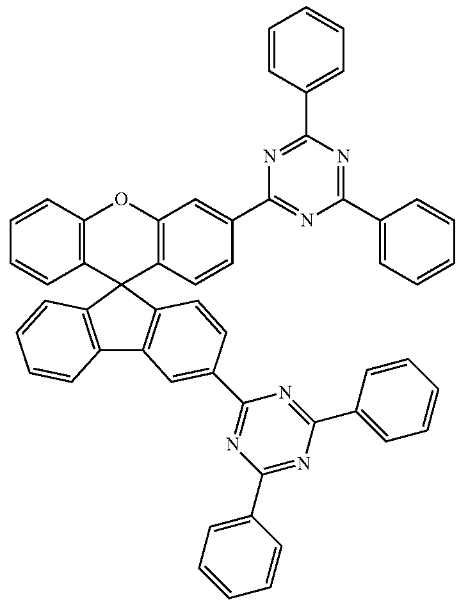
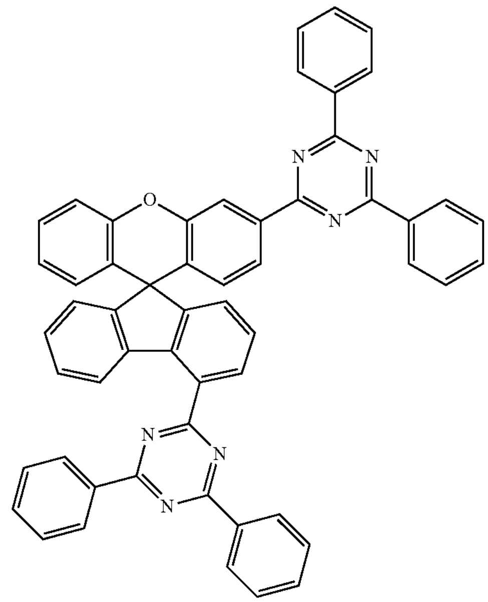
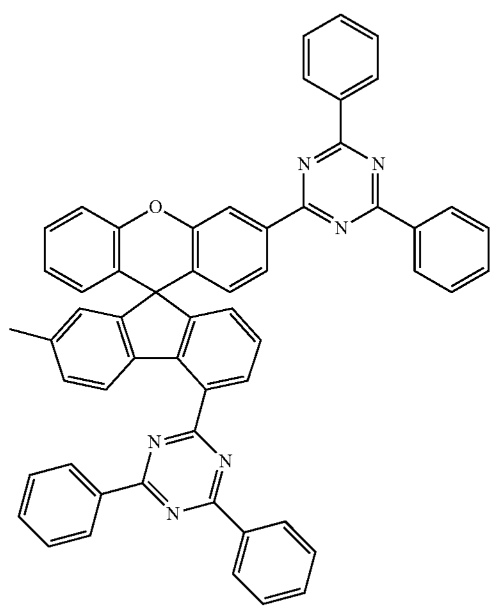
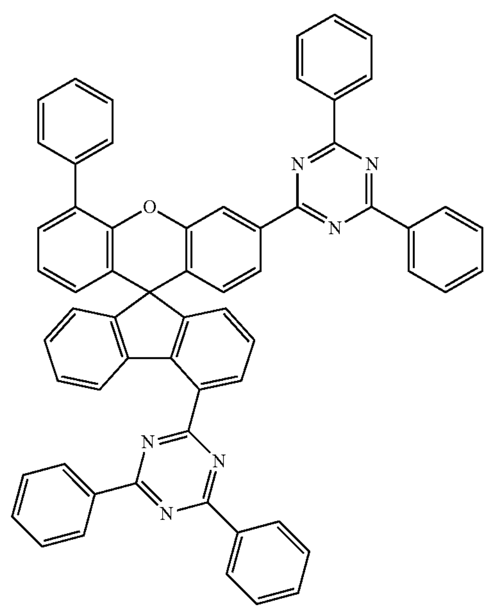

-continued
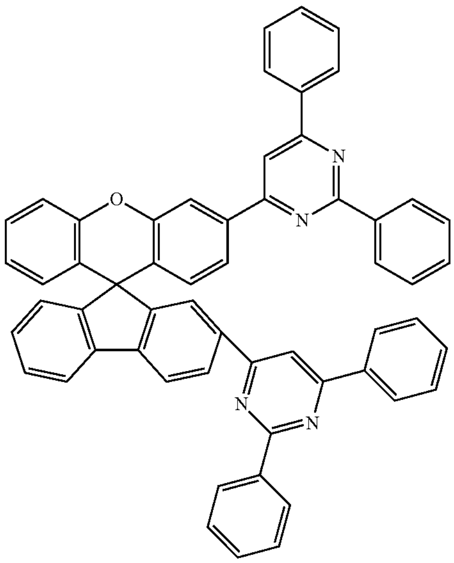
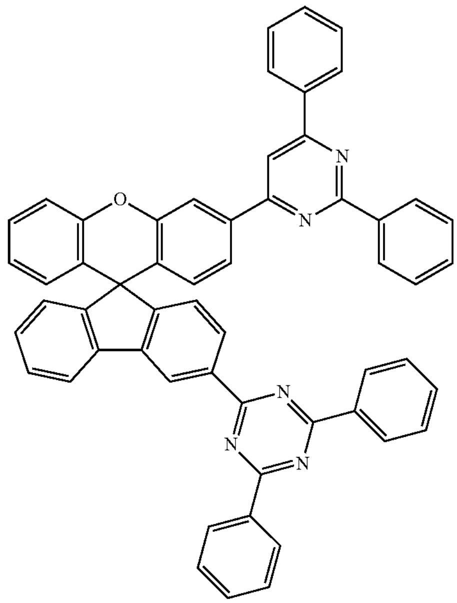
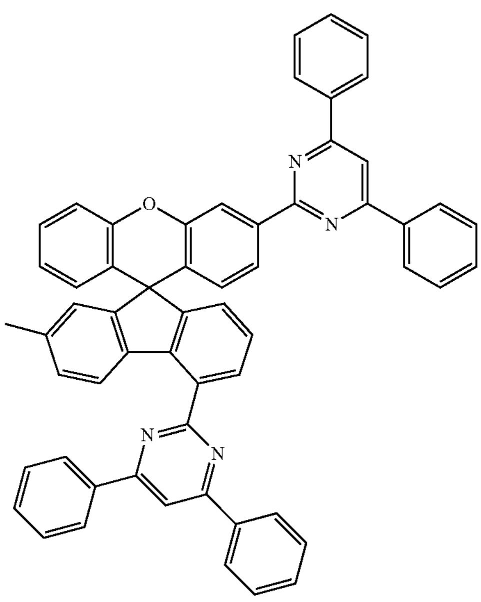
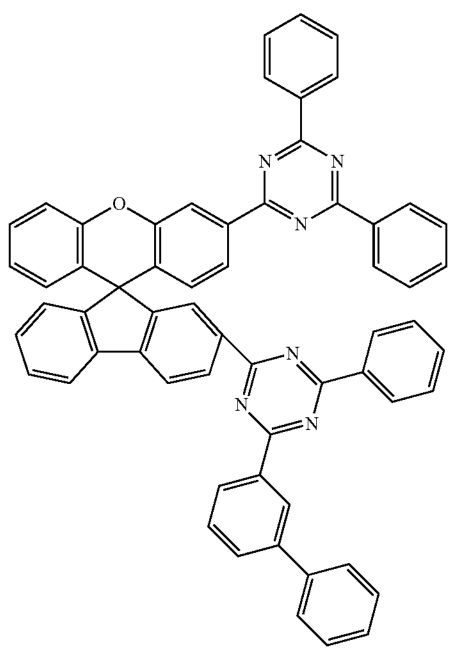

-continued
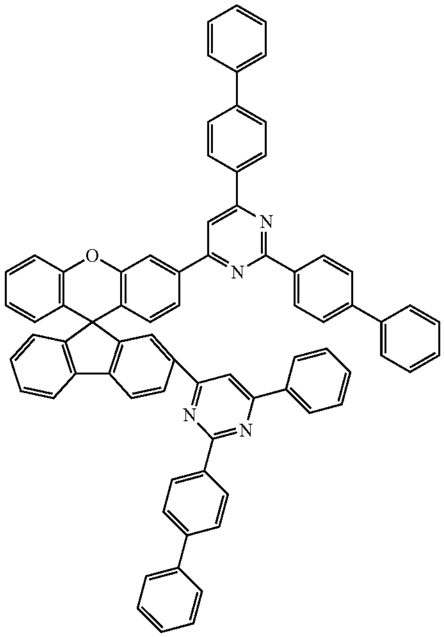
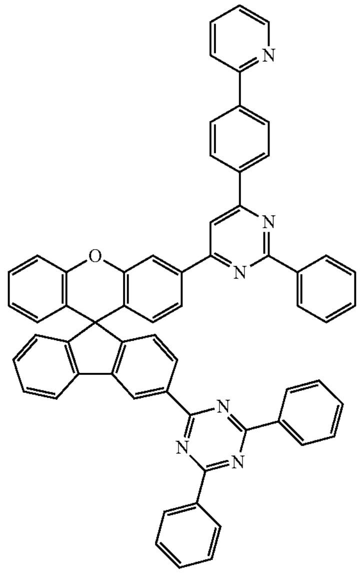
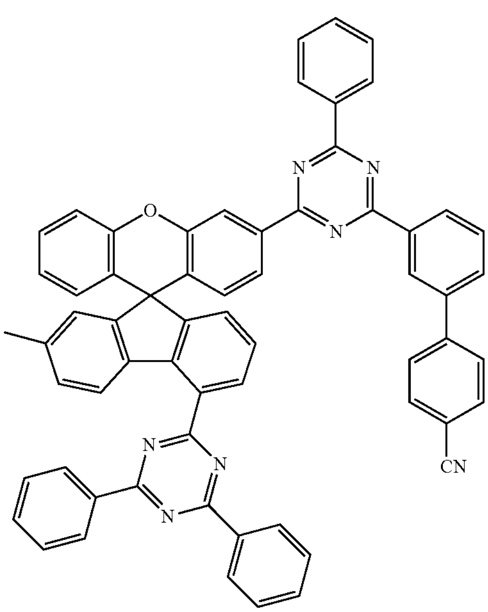
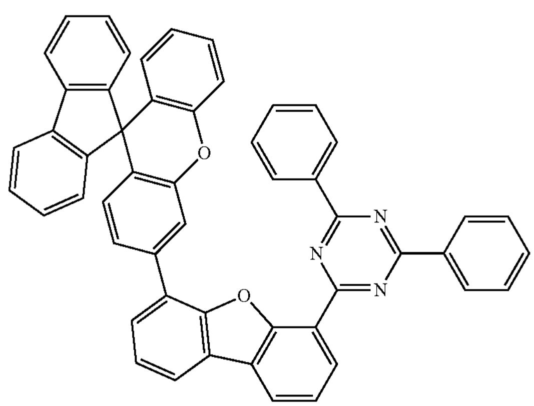

-continued
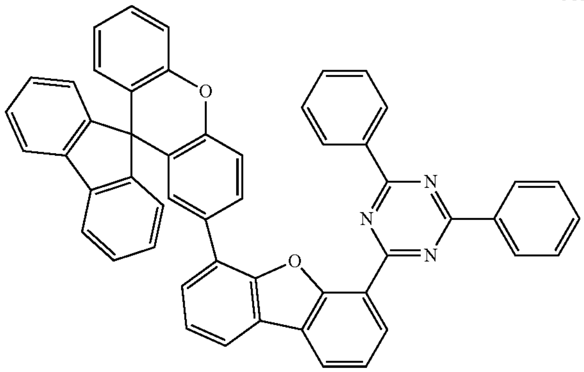
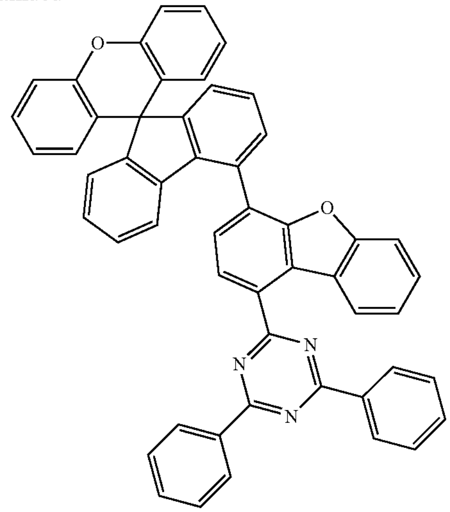
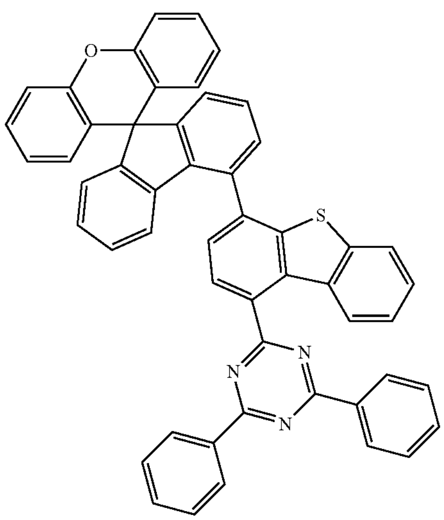
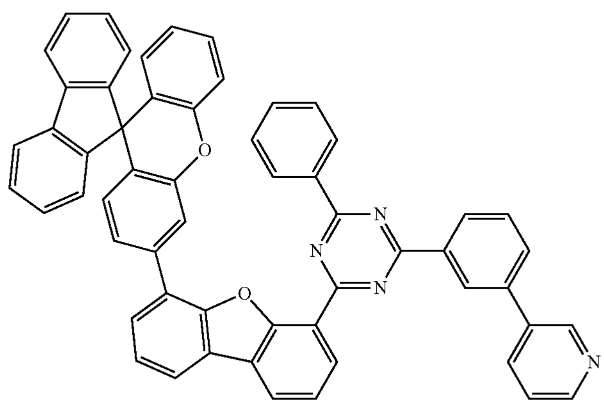
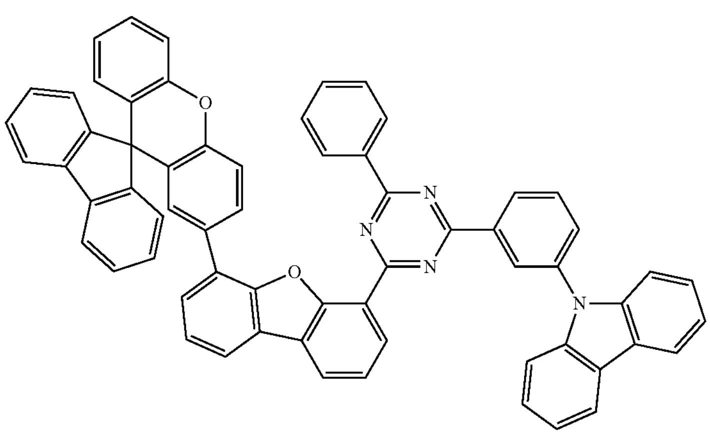

-continued
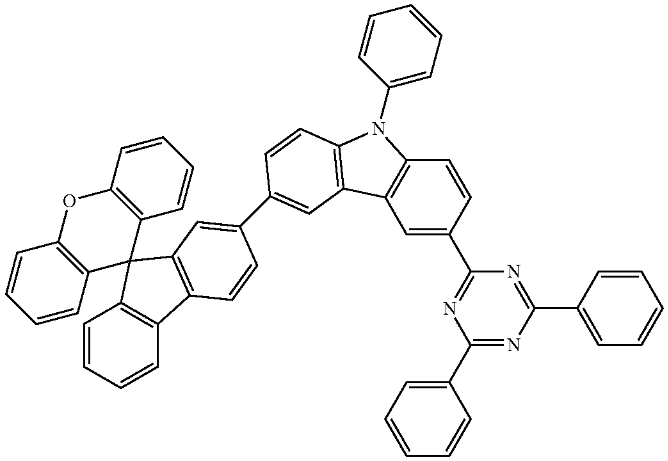
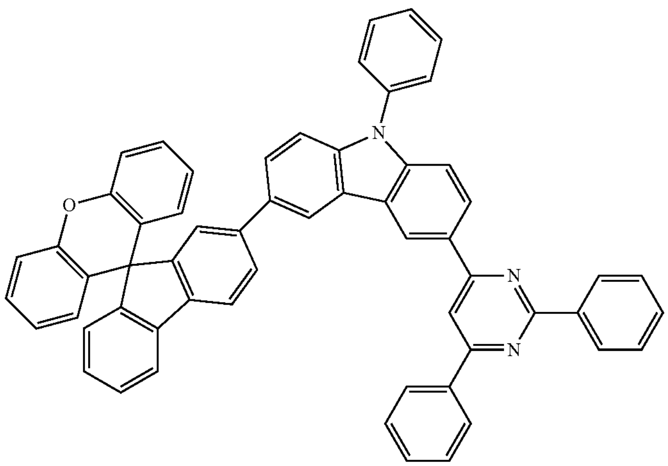
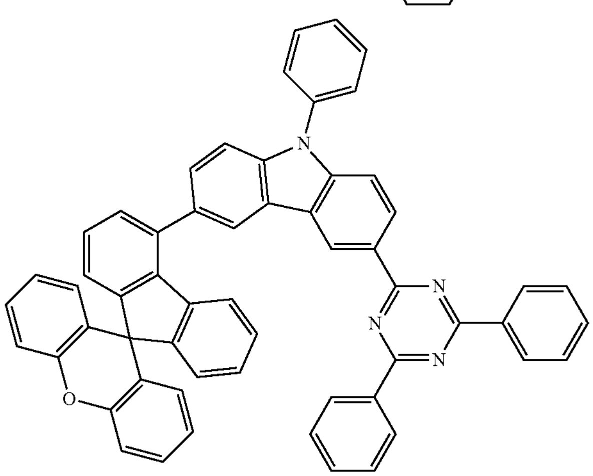
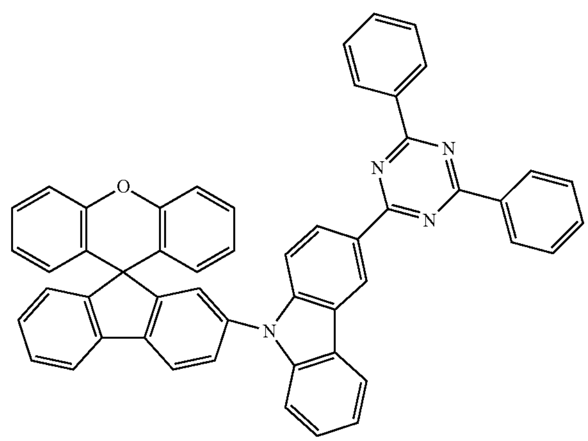
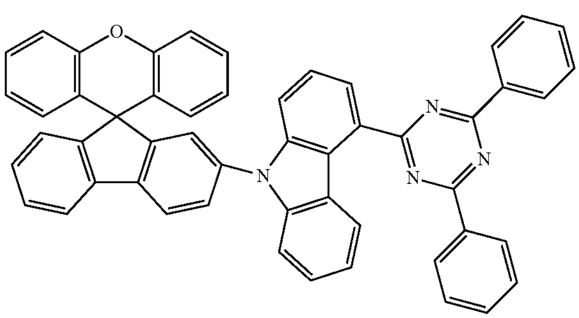
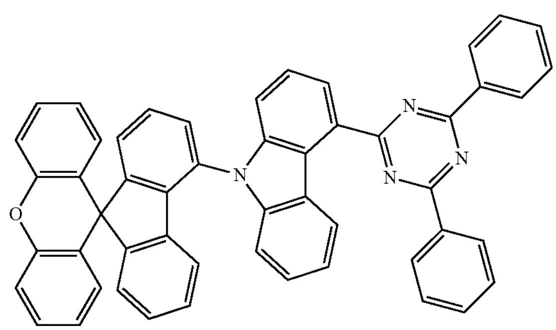

-continued
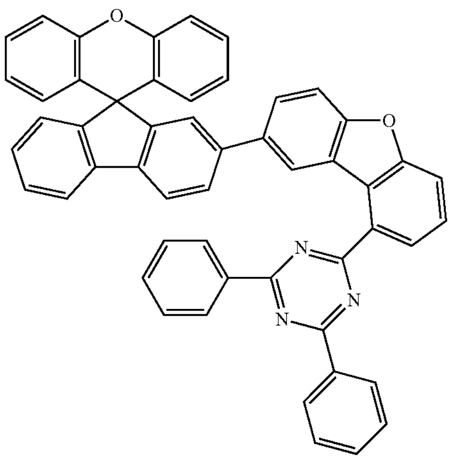
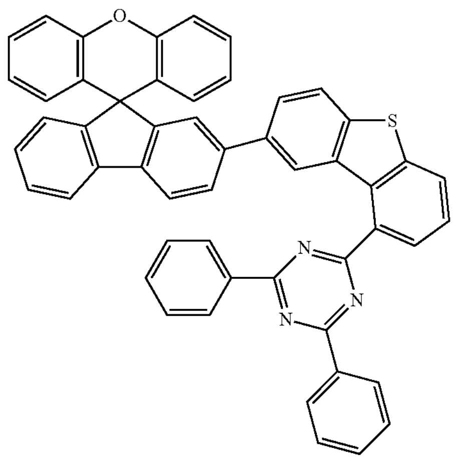
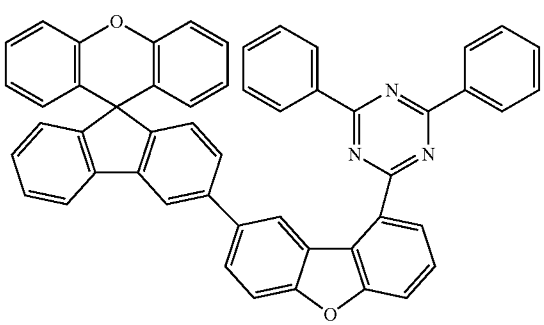
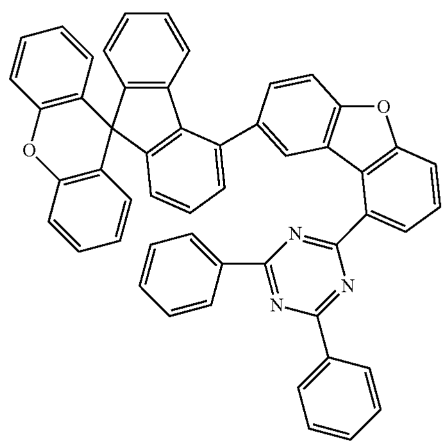
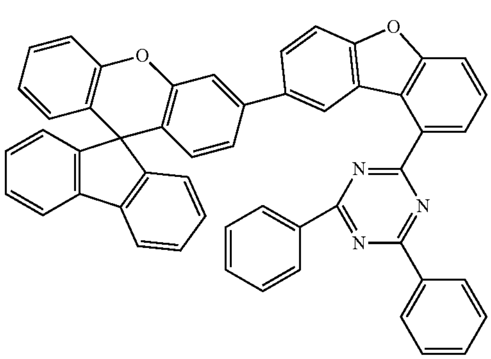
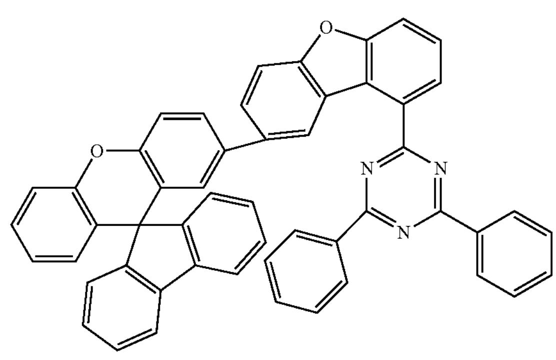

-continued
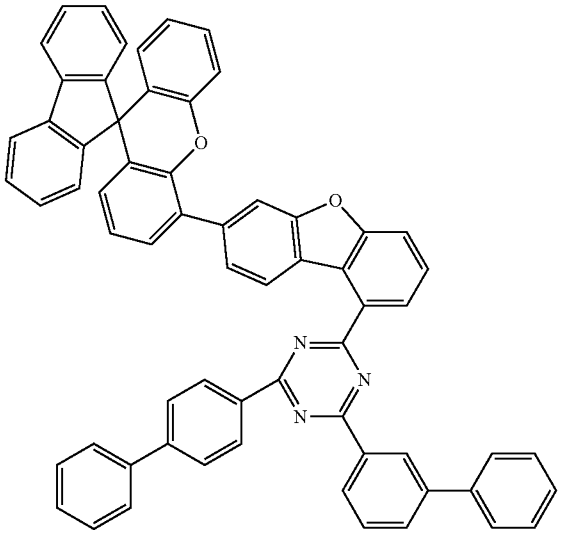
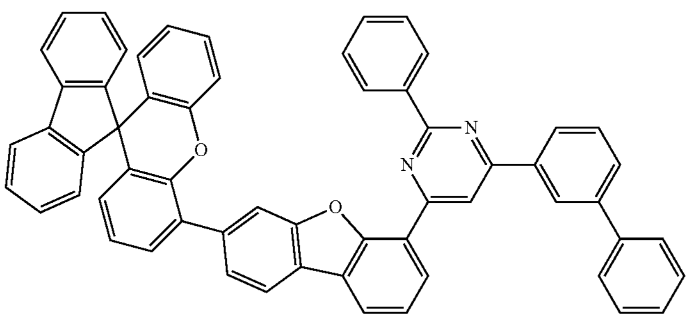
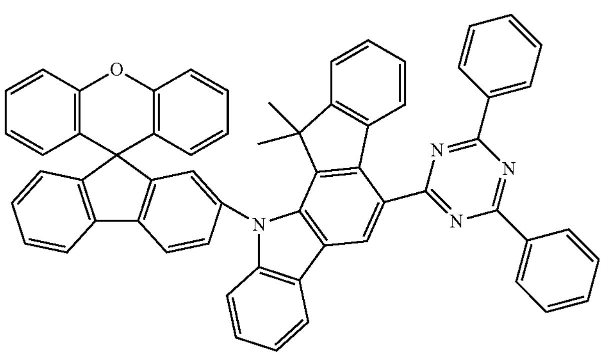
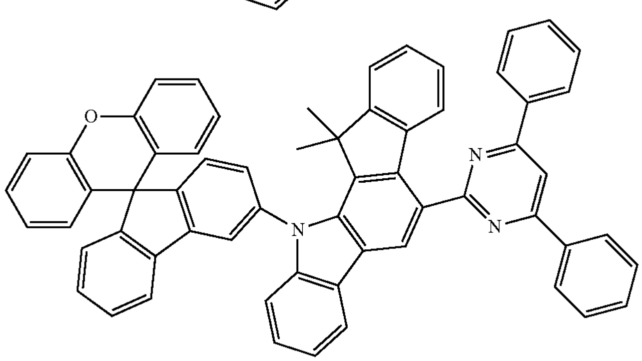

-continued
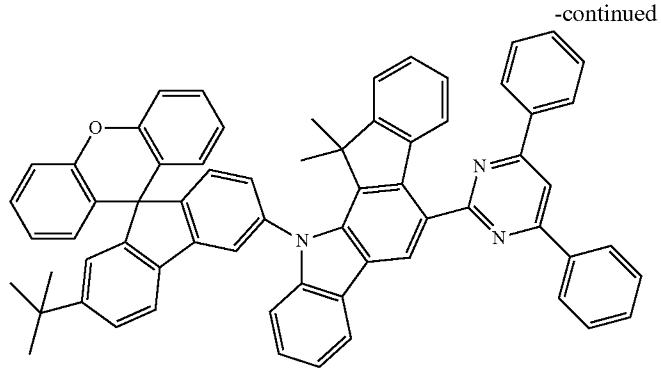
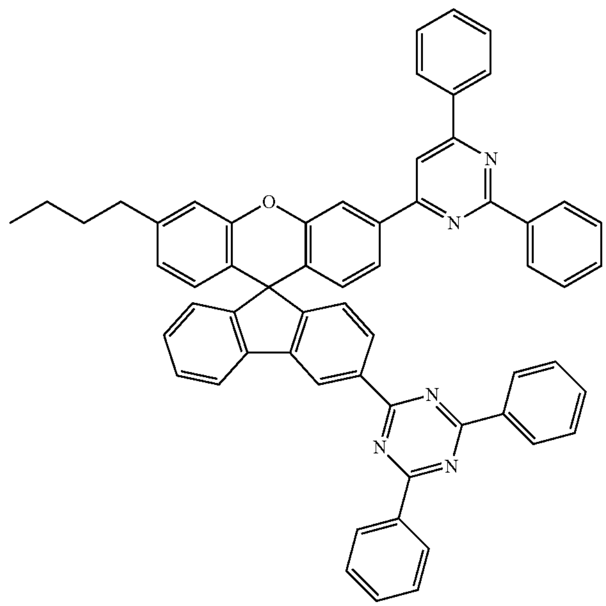
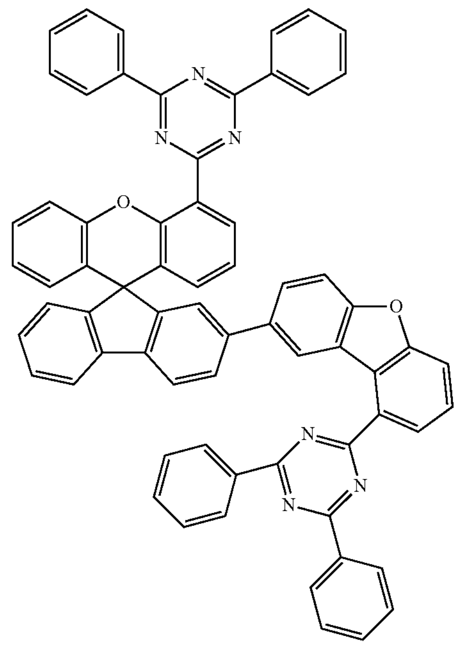
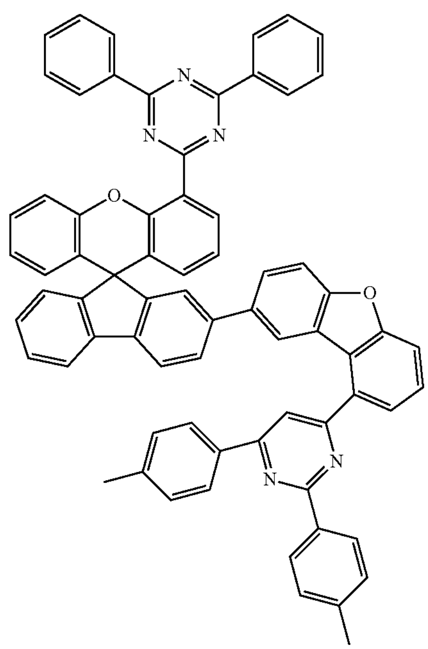
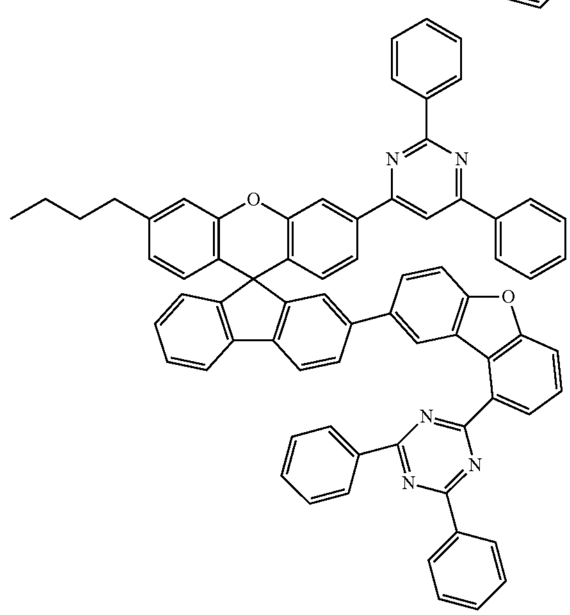

-continued
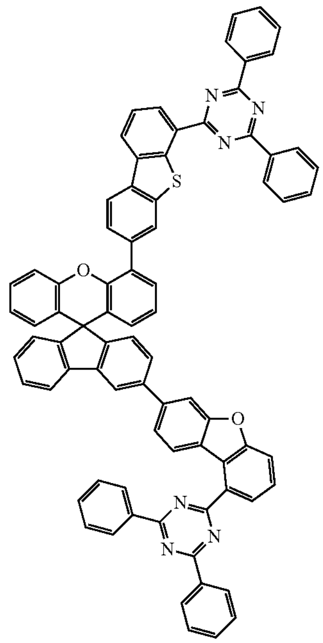
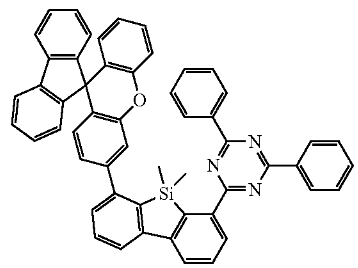
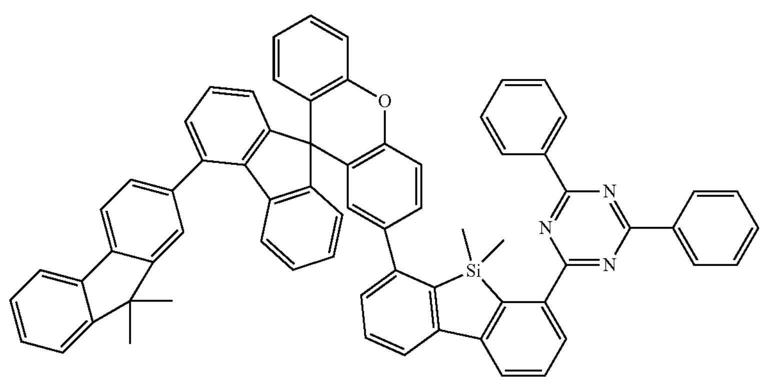
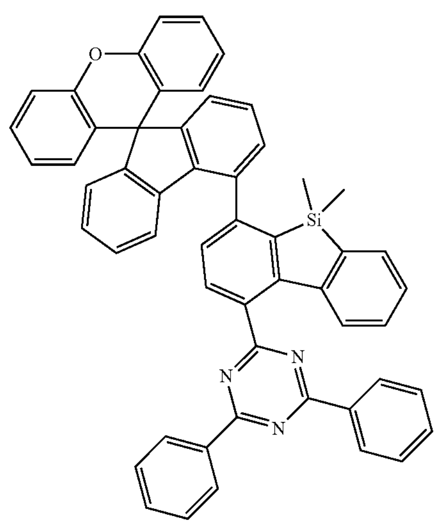
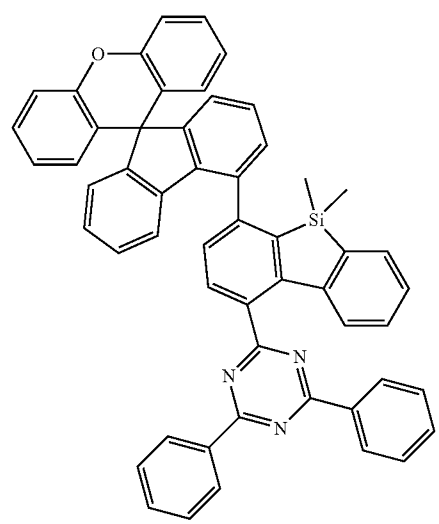

-continued
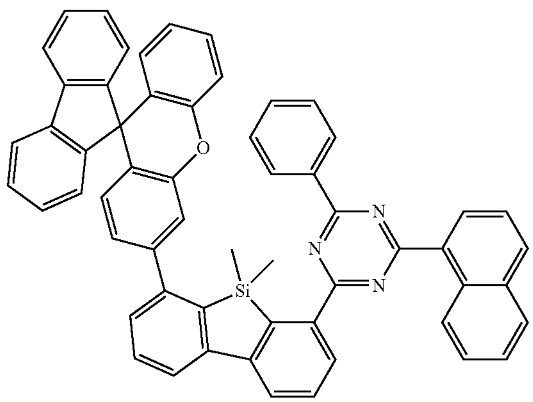
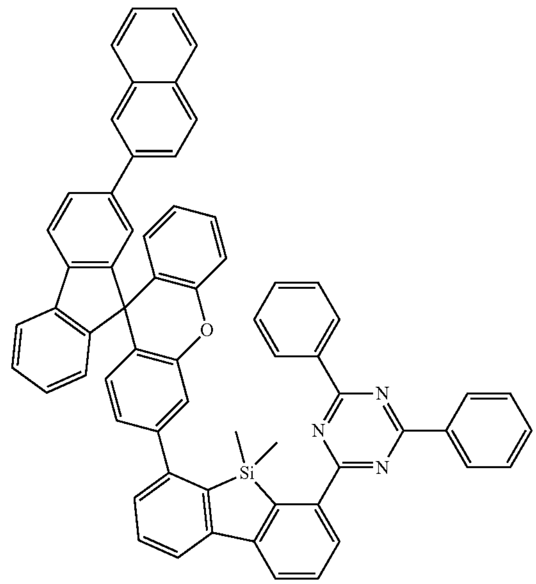
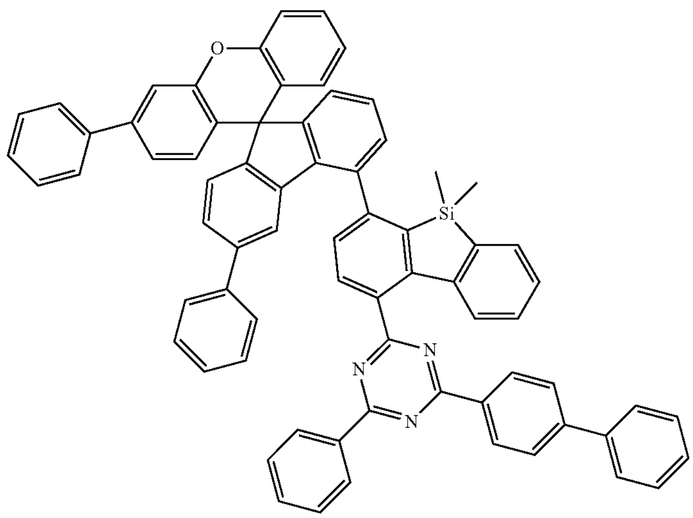
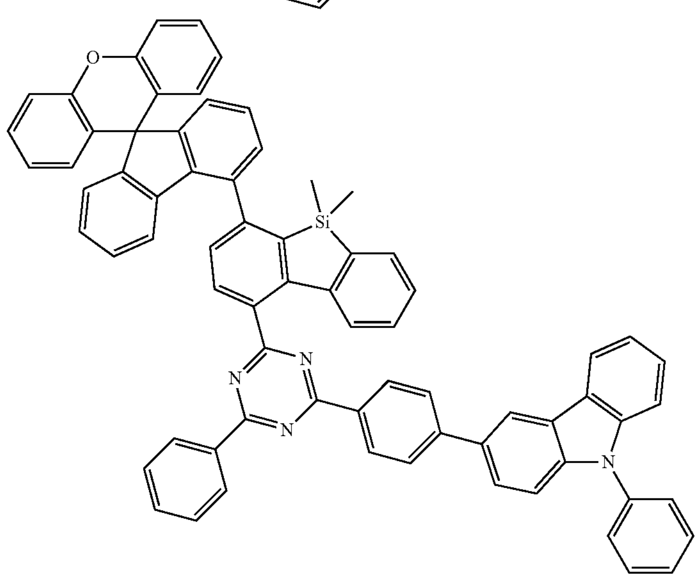
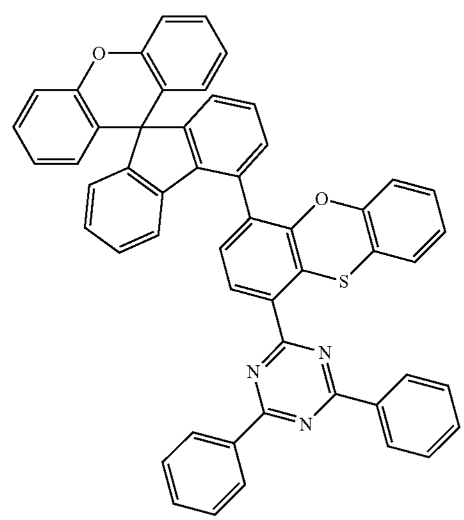

-continued
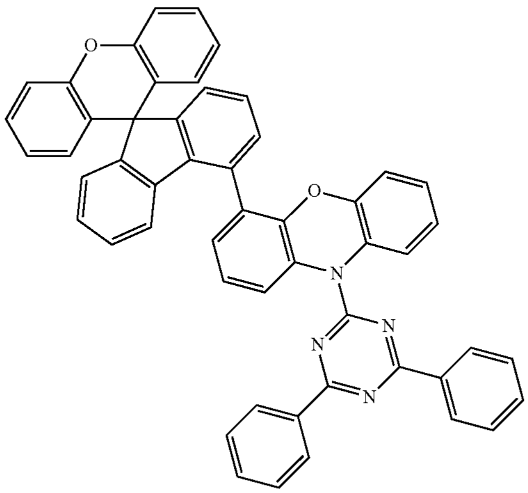
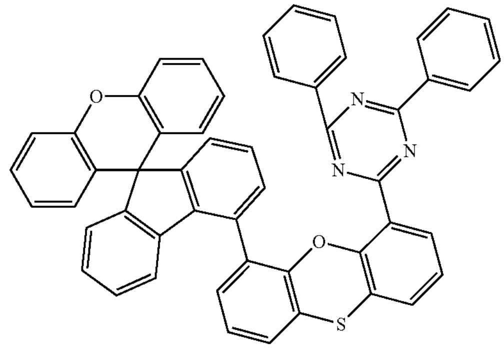
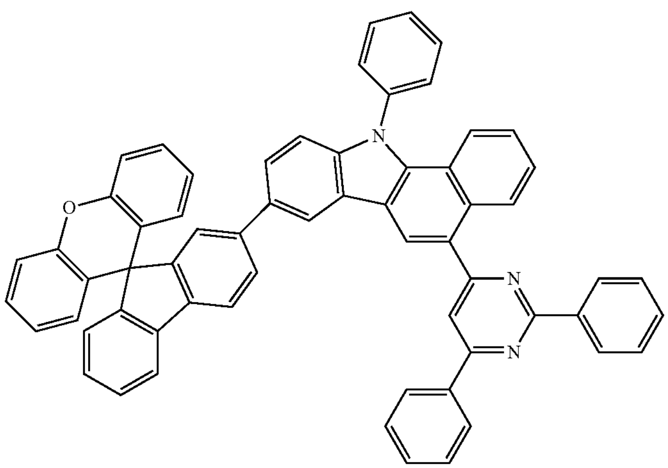
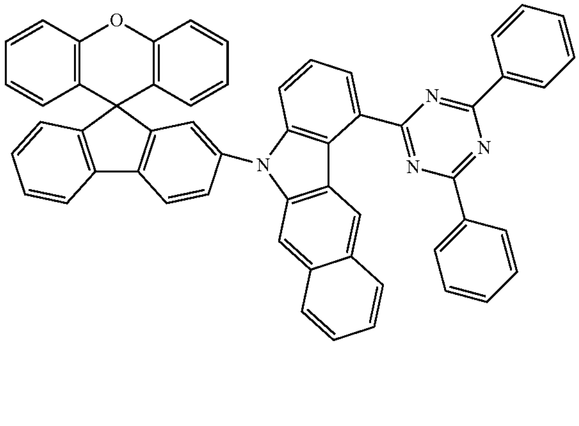
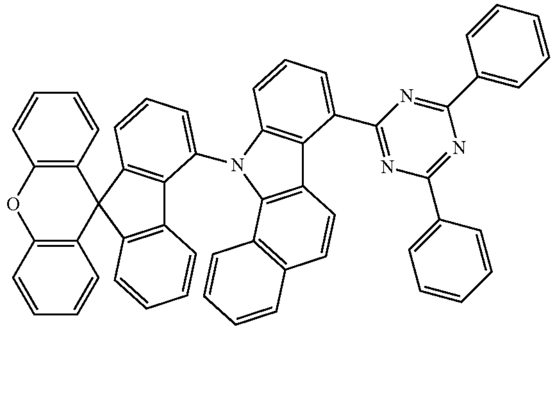

-continued
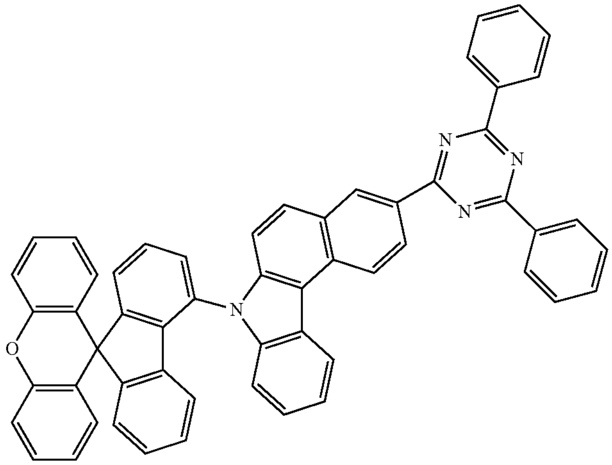
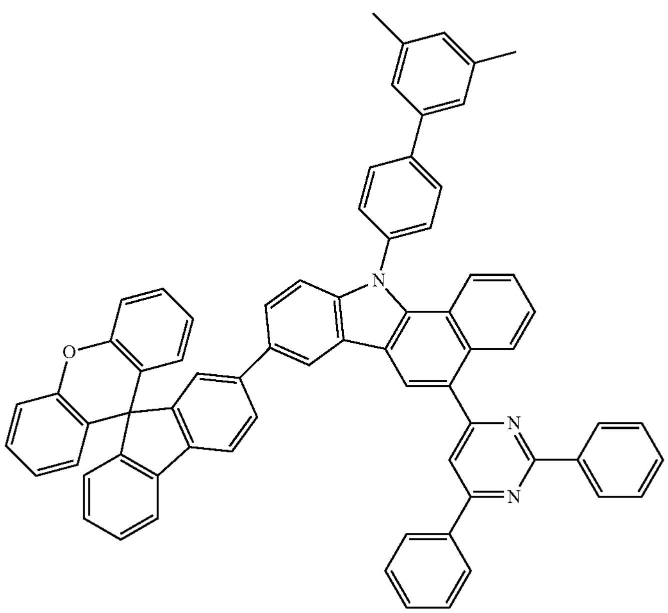
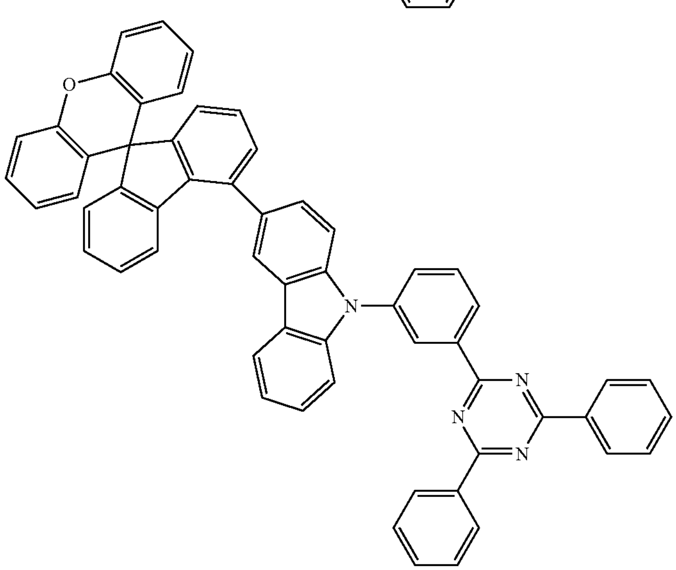

-continued
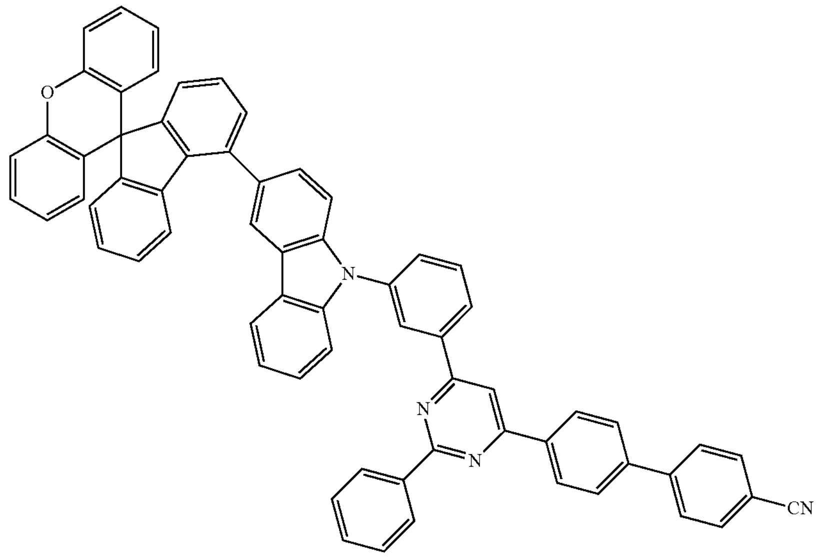
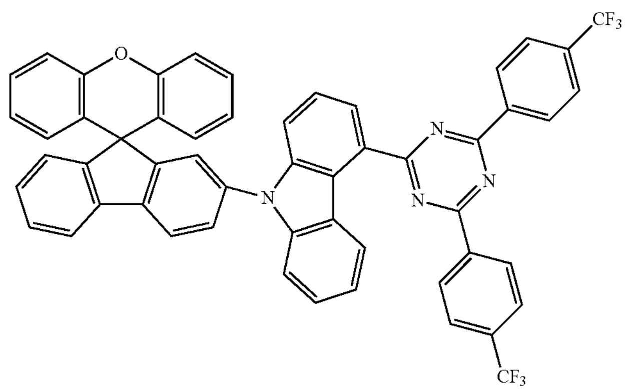
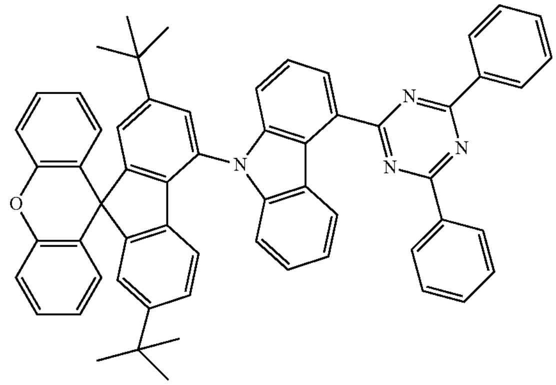
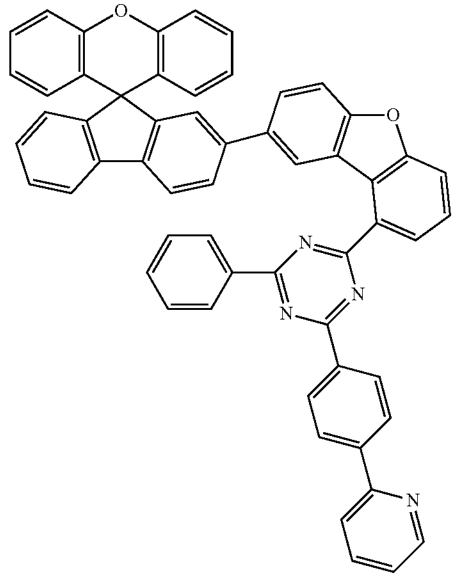
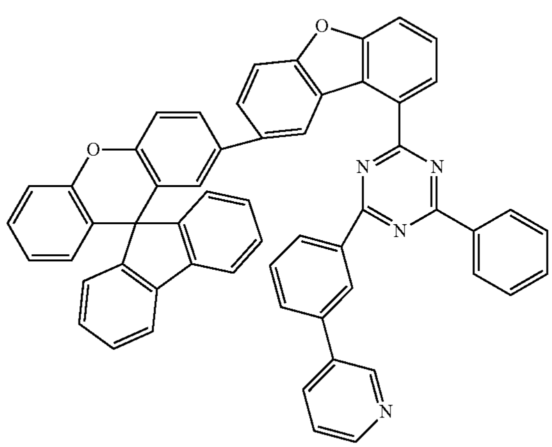

-continued
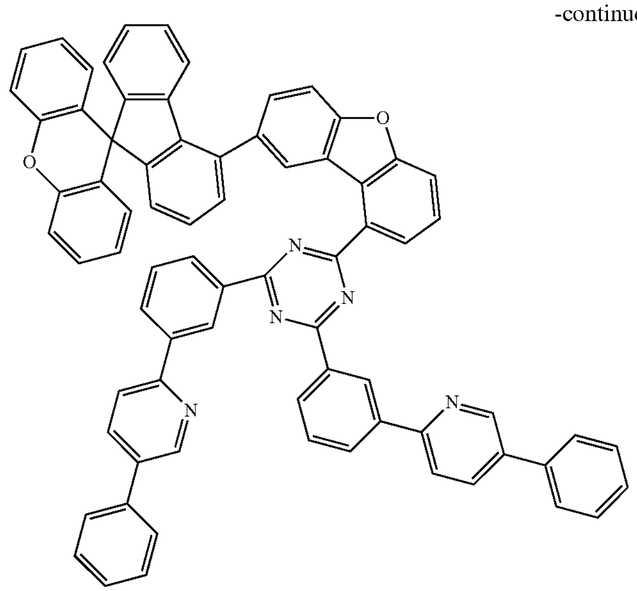
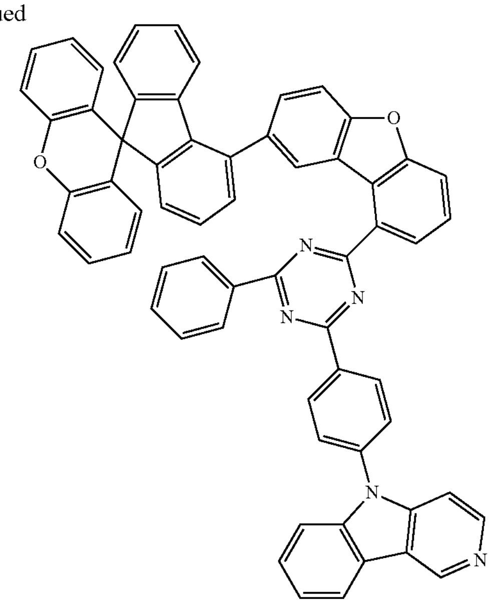
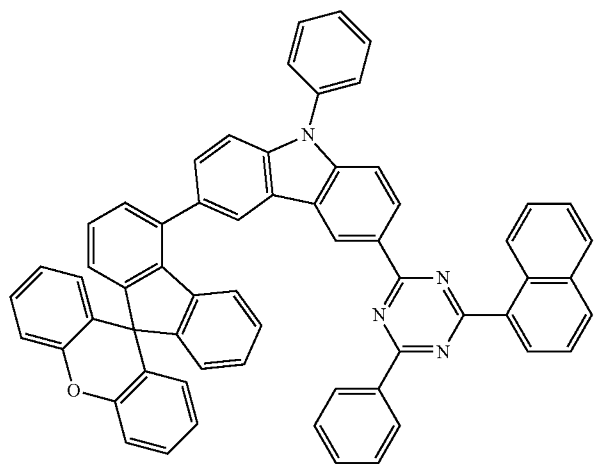
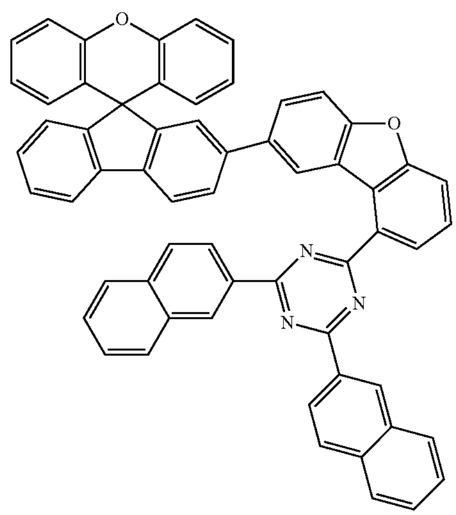
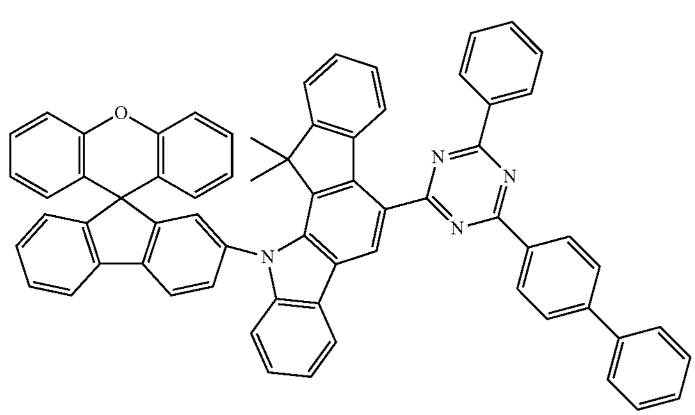

-continued
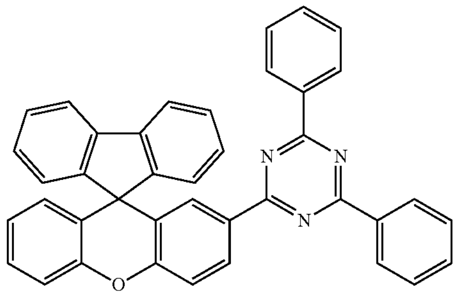
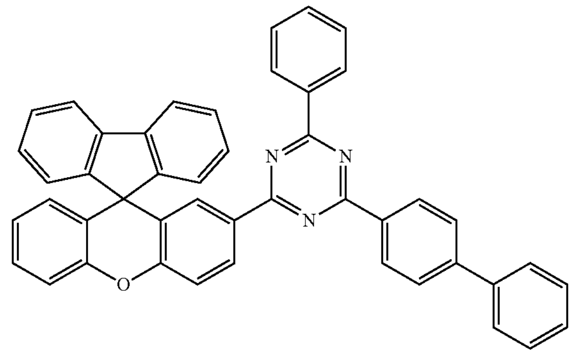
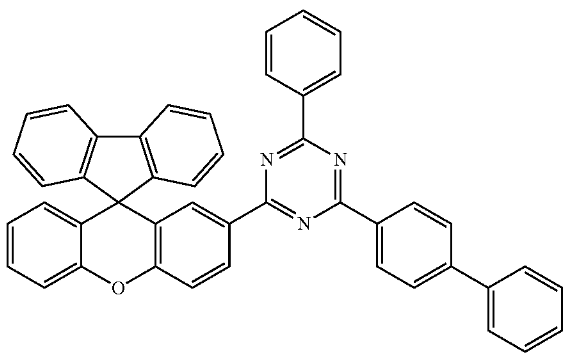
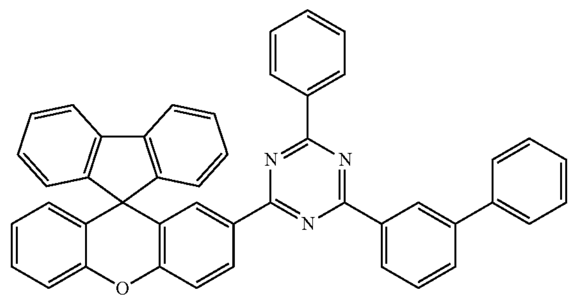
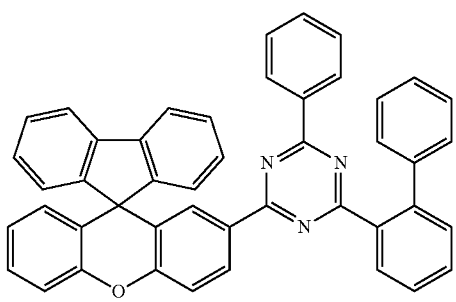
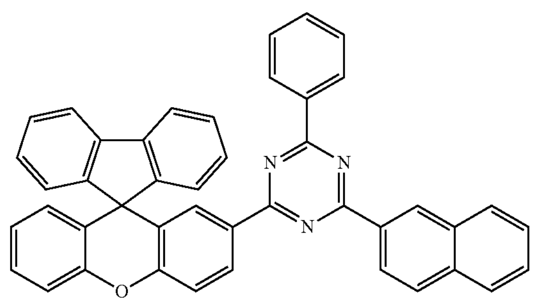
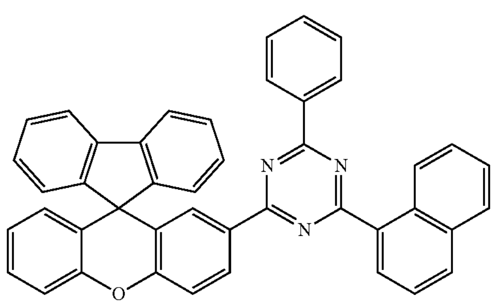
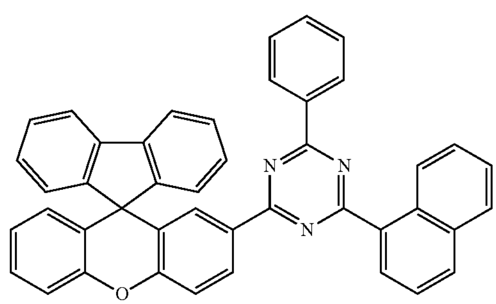
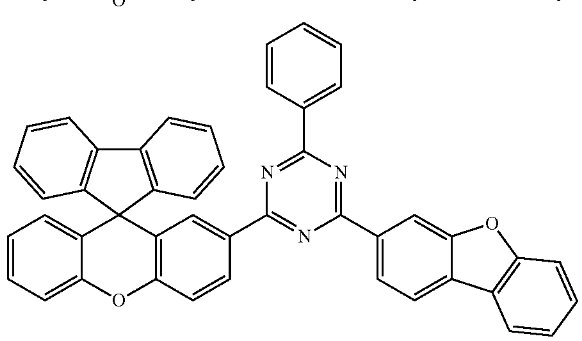
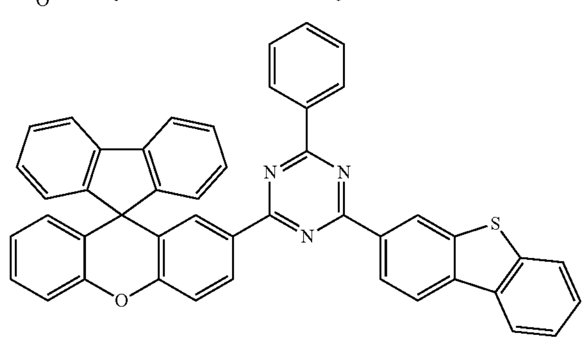

-continued
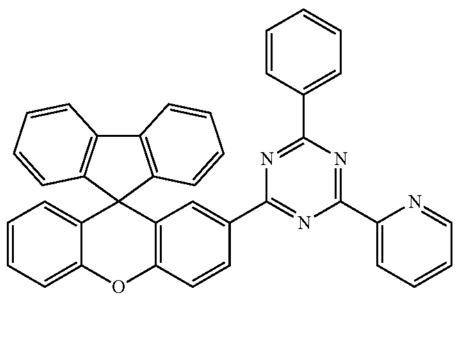
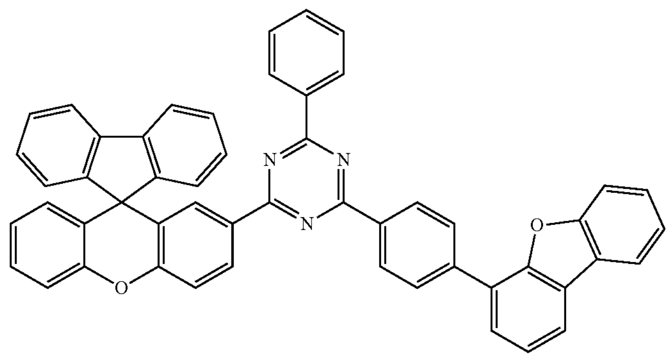
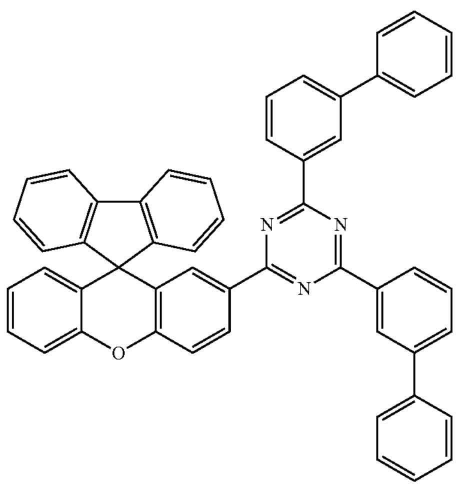
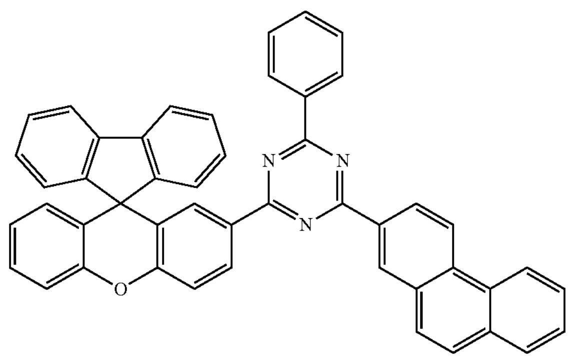
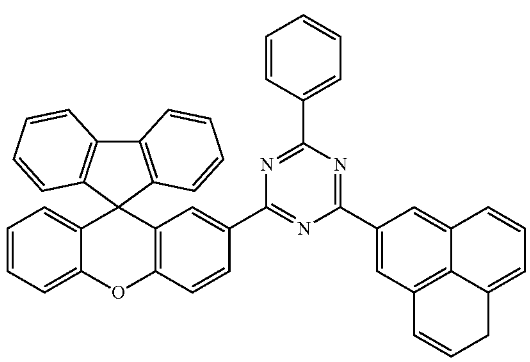
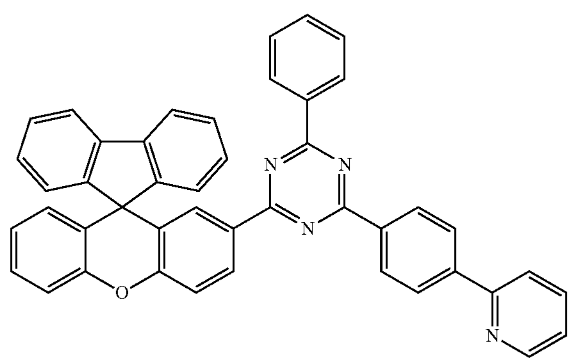
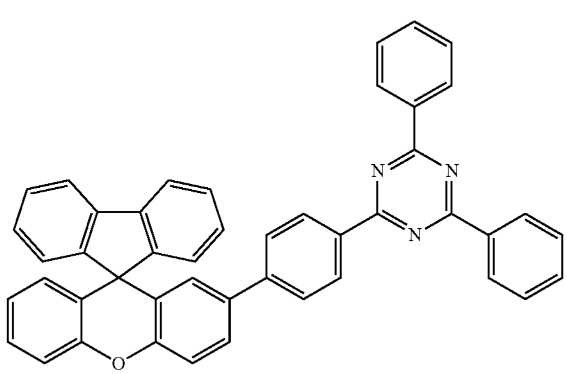

-continued
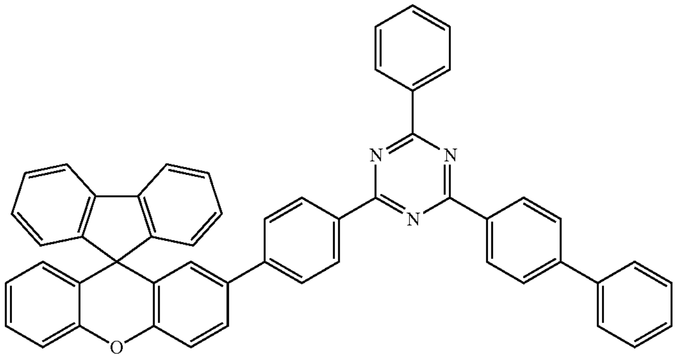
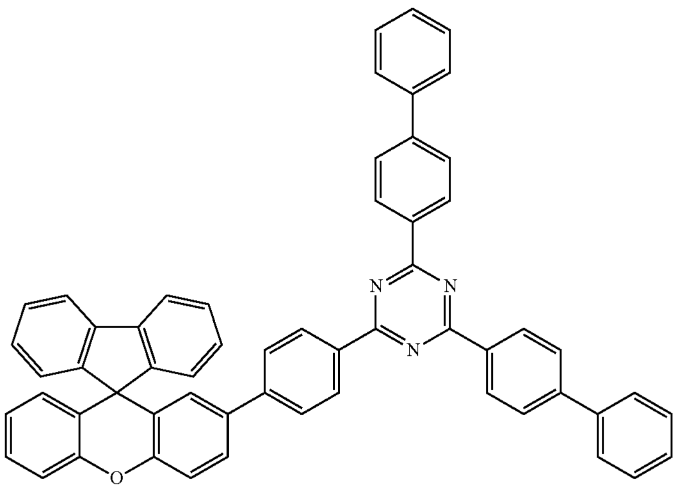
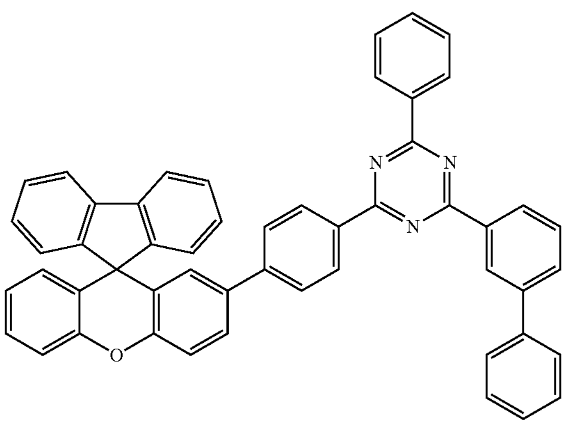
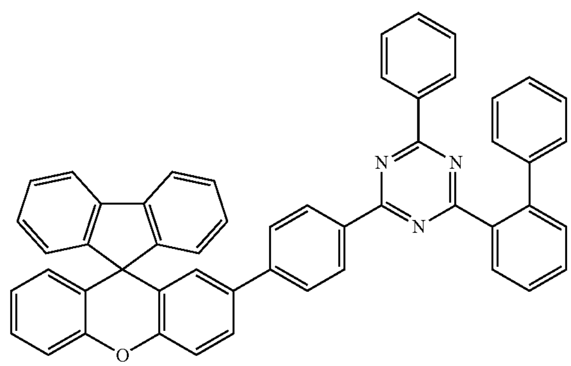
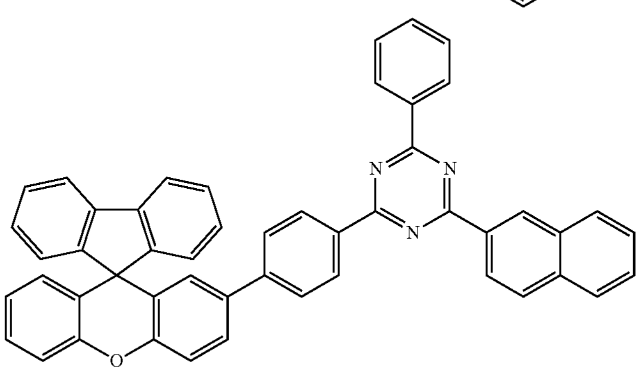

-continued
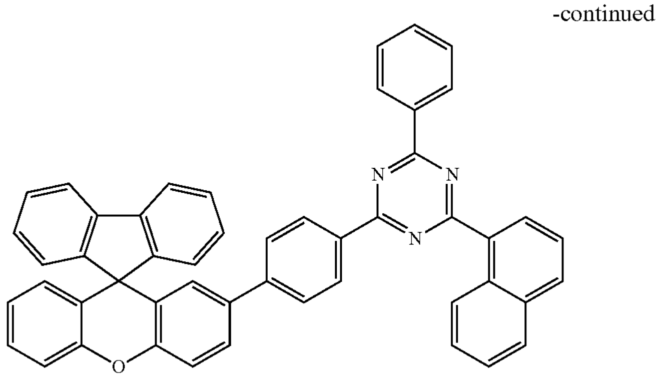
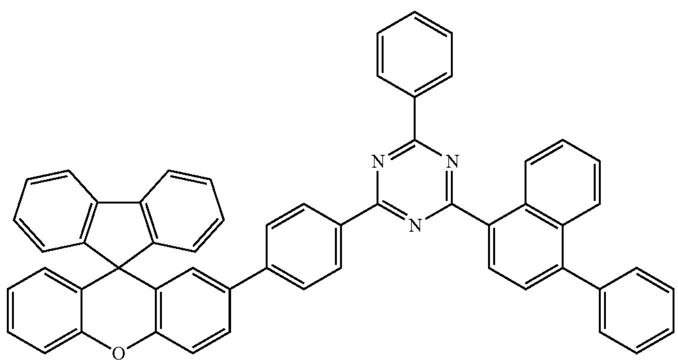
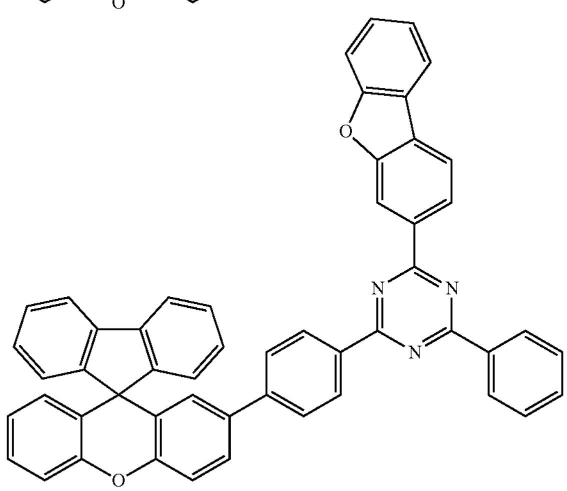
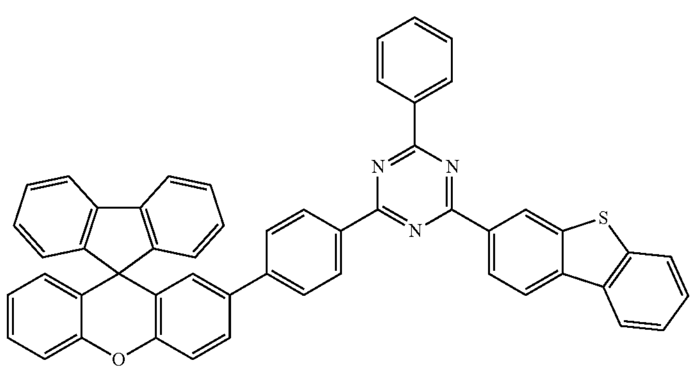

-continued
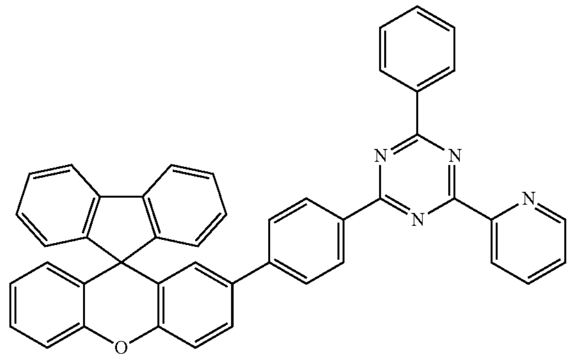
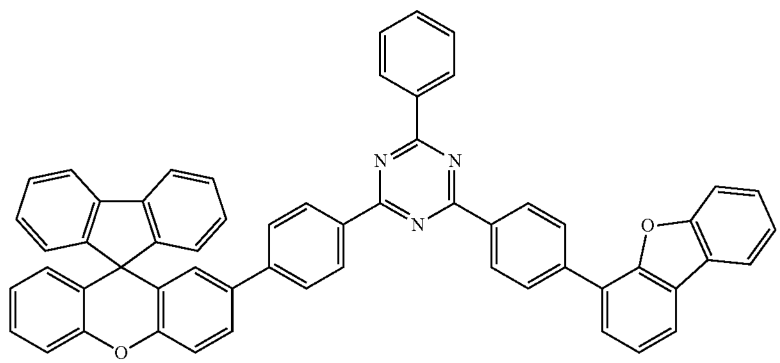
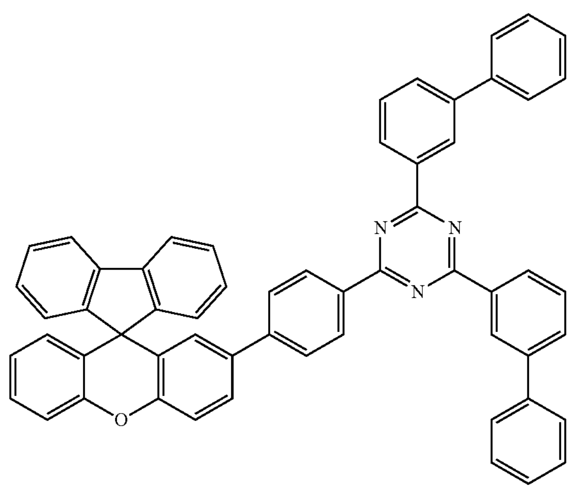
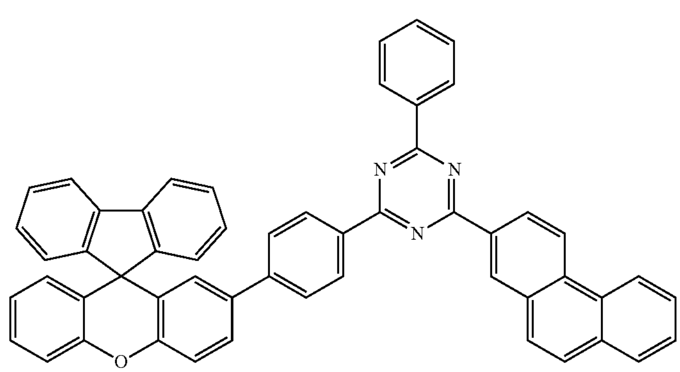

-continued
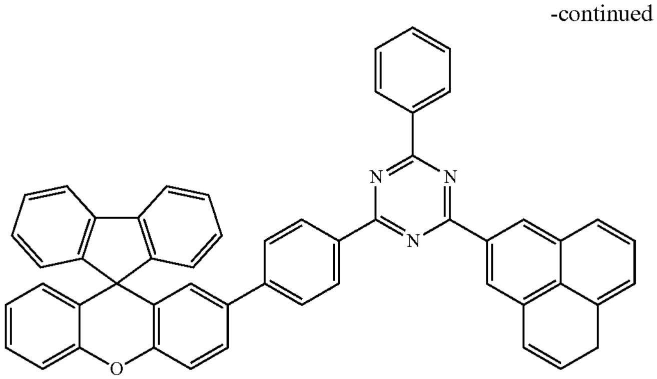
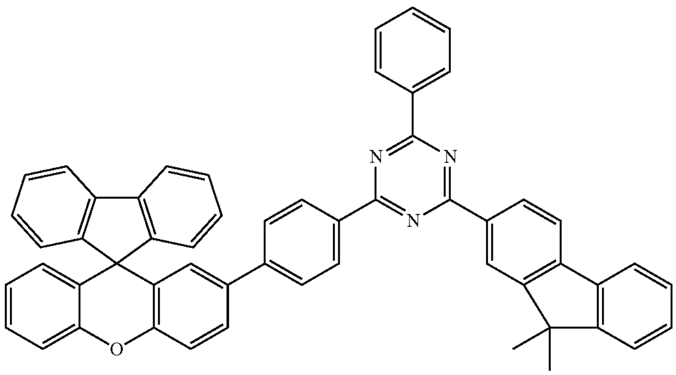
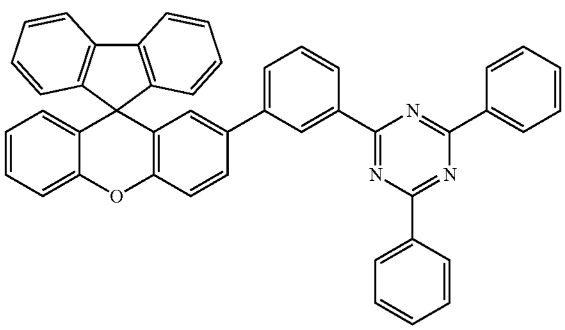
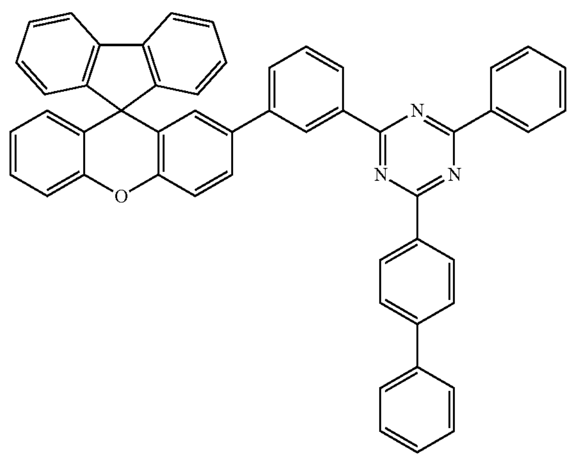
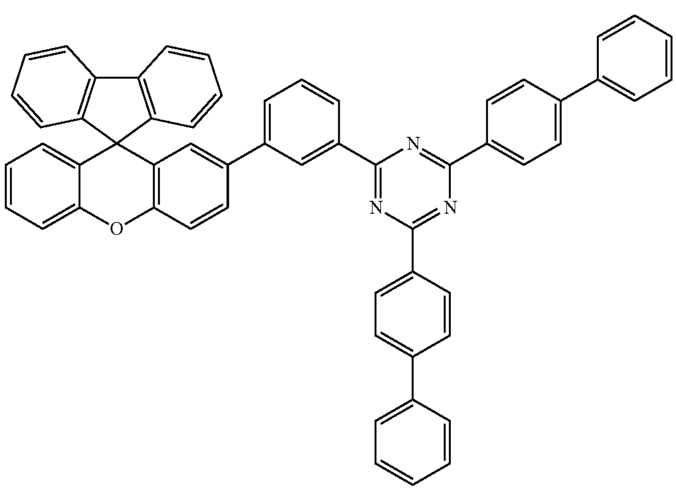

-continued
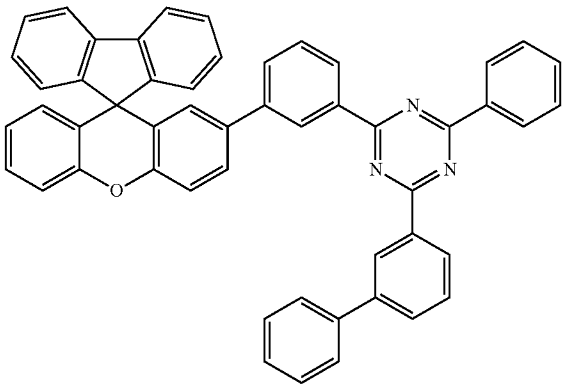
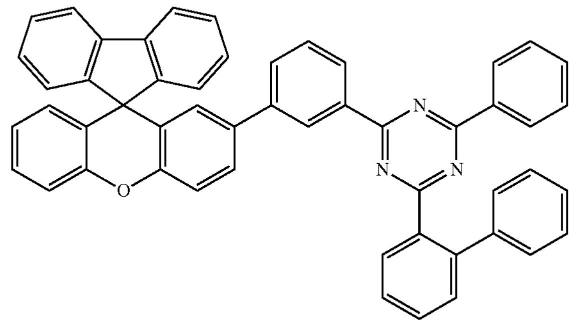
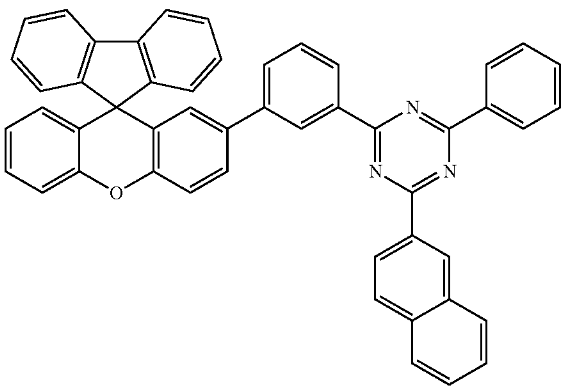
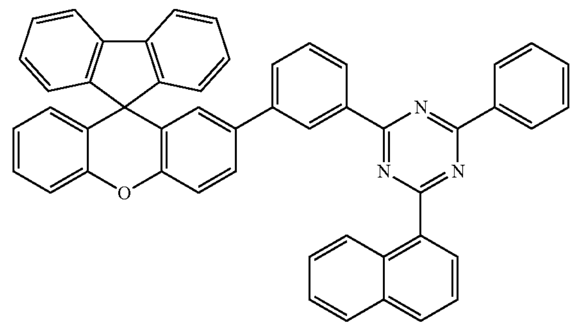
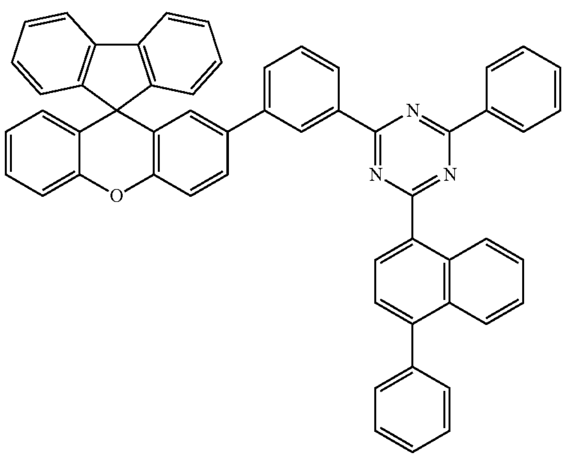
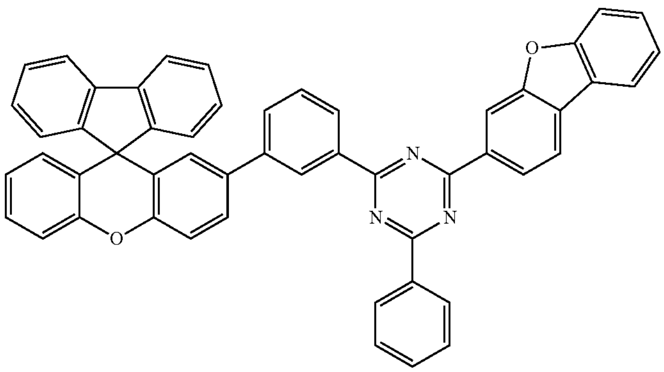

-continued
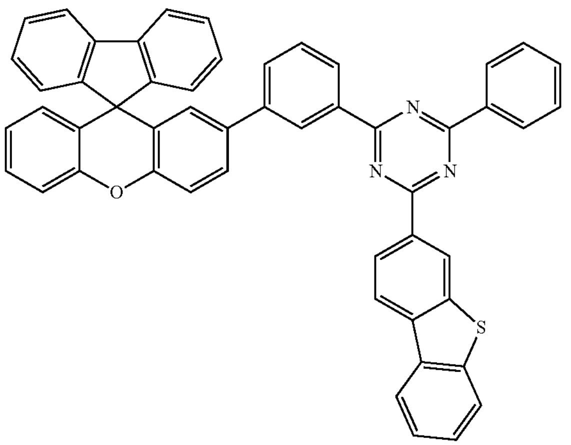
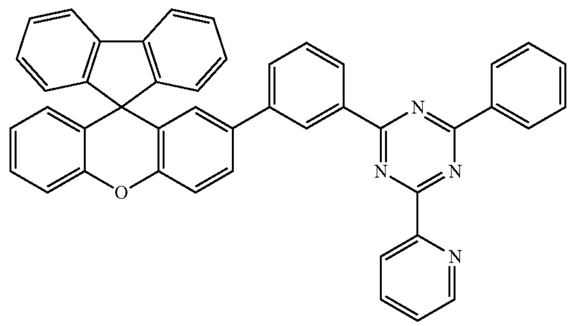
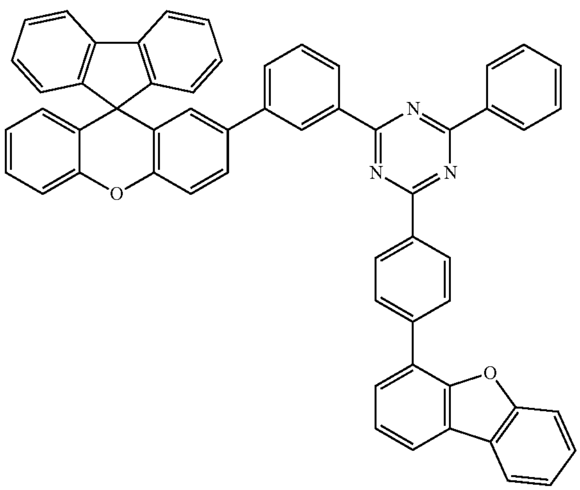
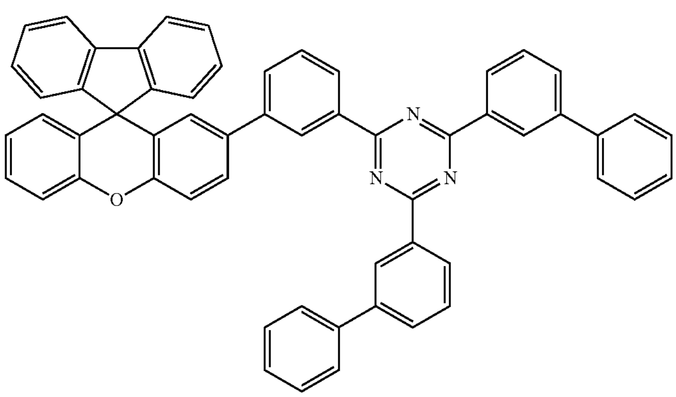

-continued
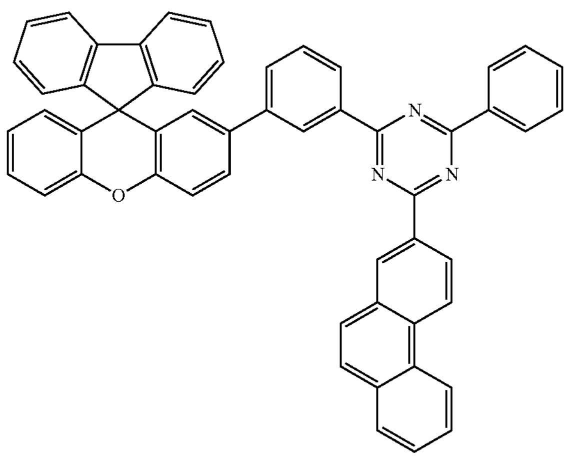
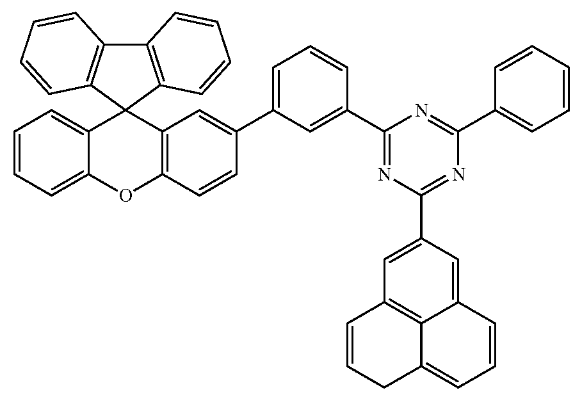
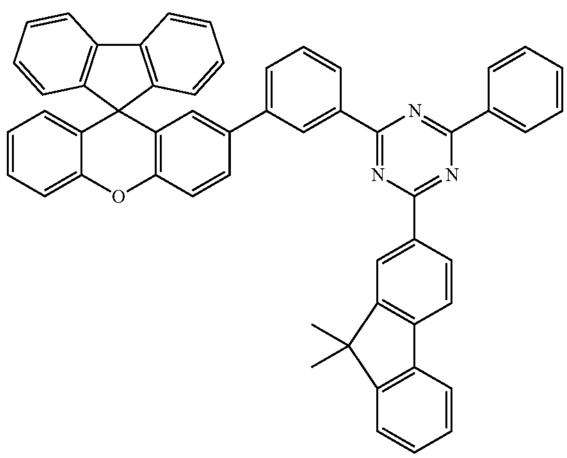
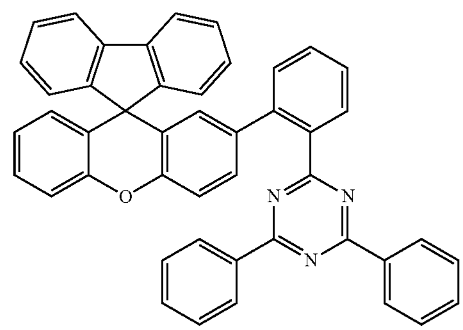
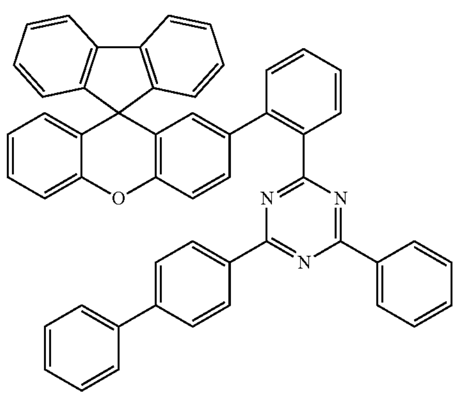
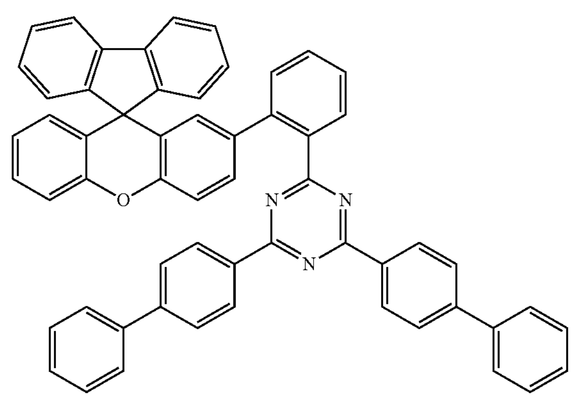
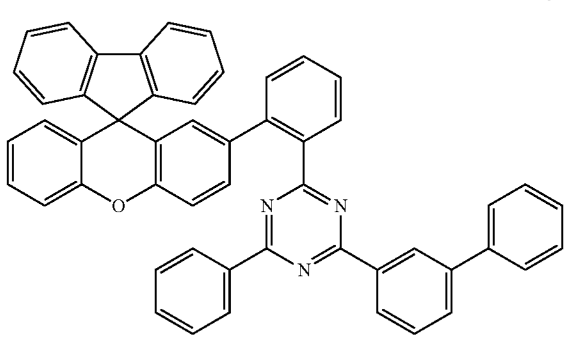
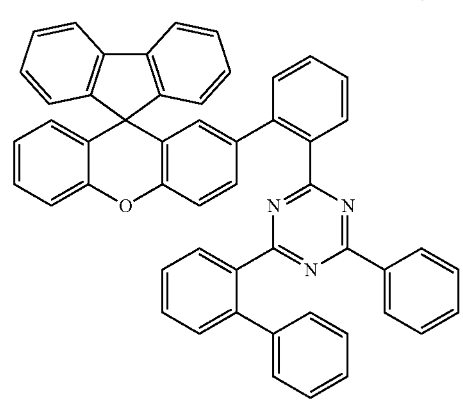

-continued
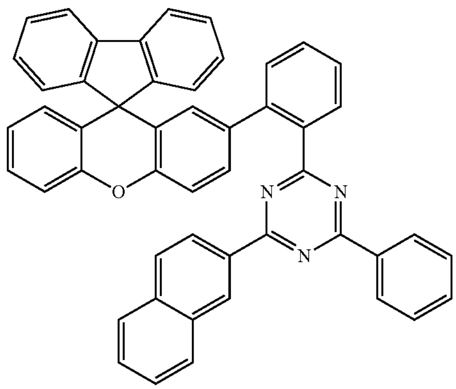
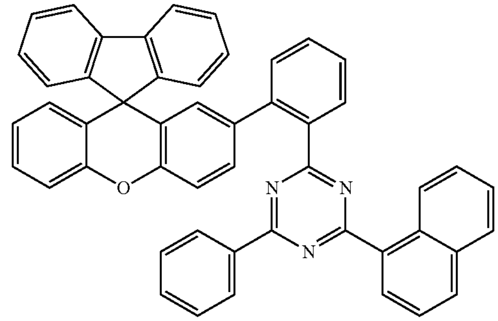
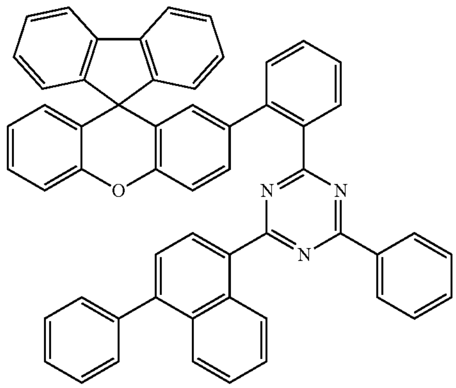
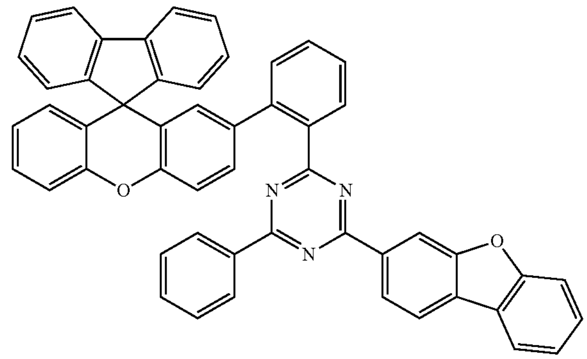
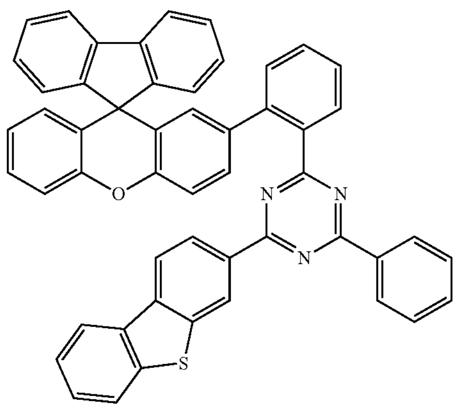
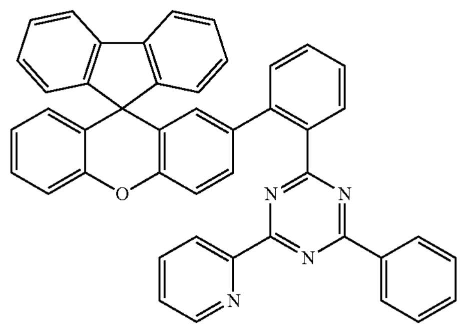
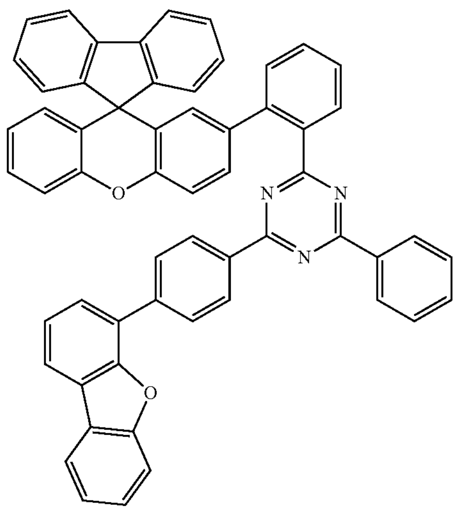
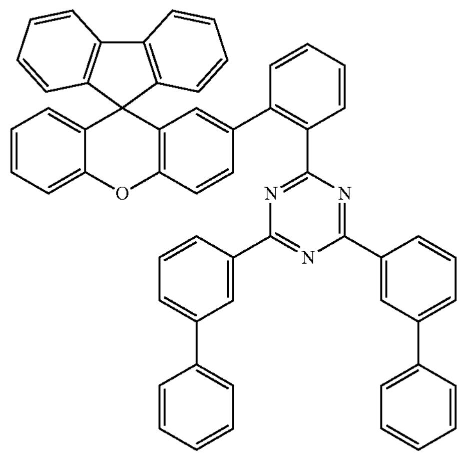

-continued
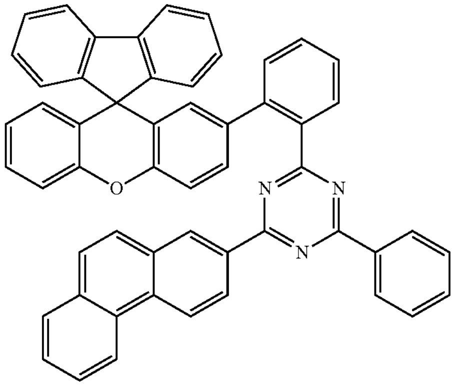
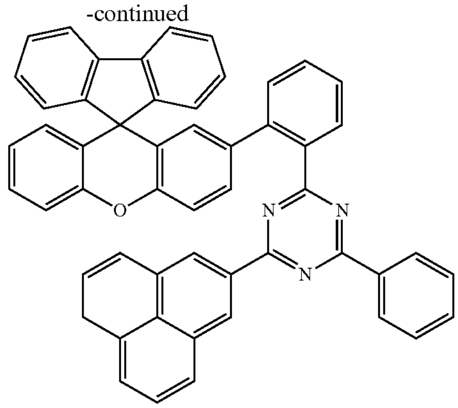
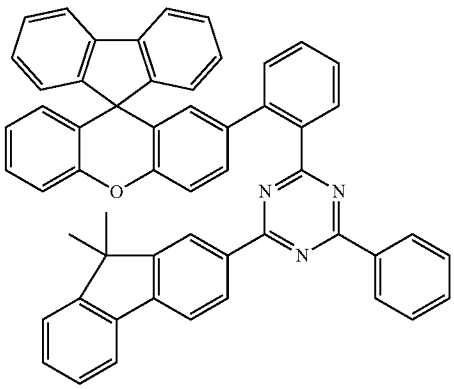
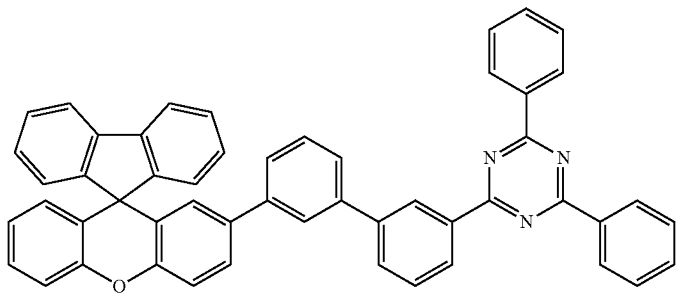
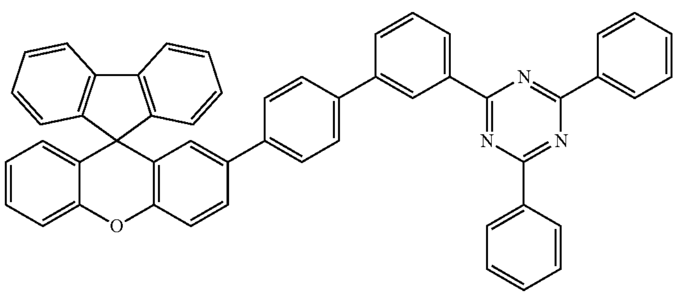
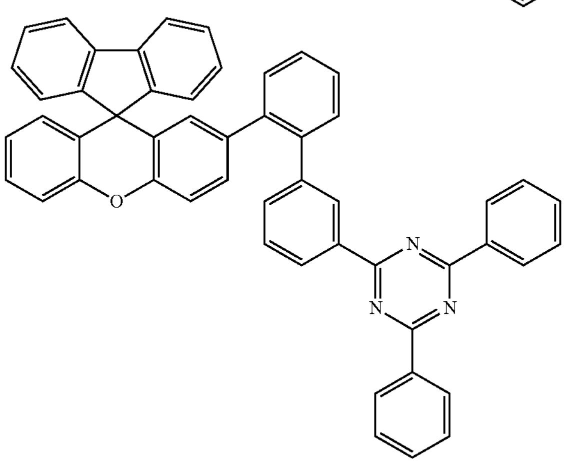
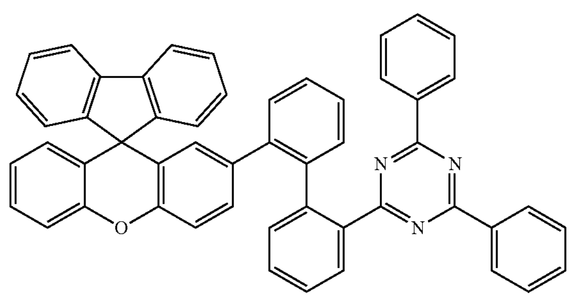

-continued
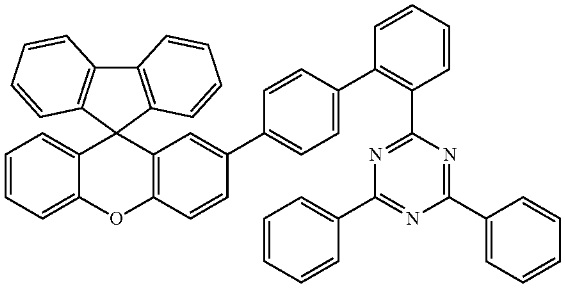
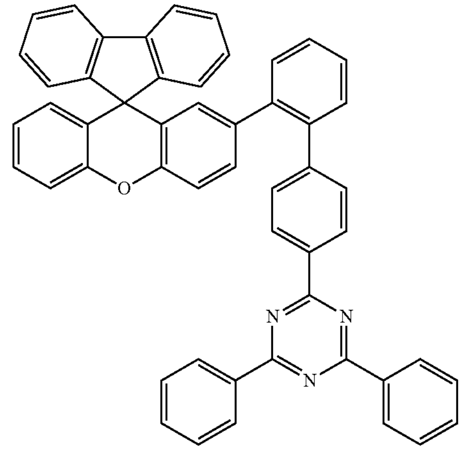
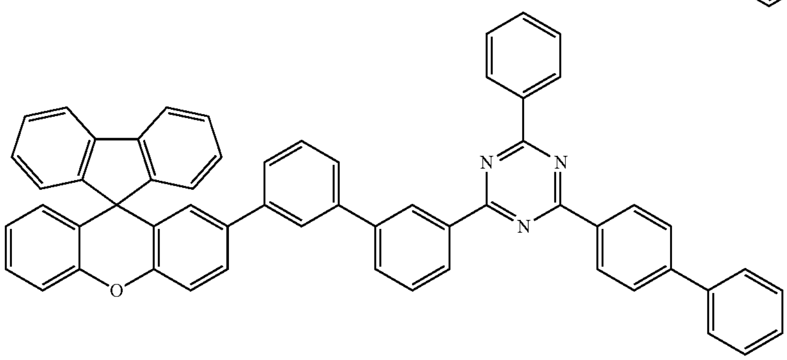
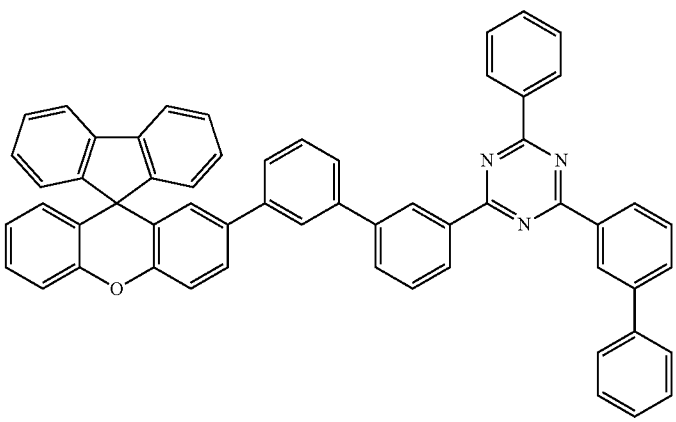
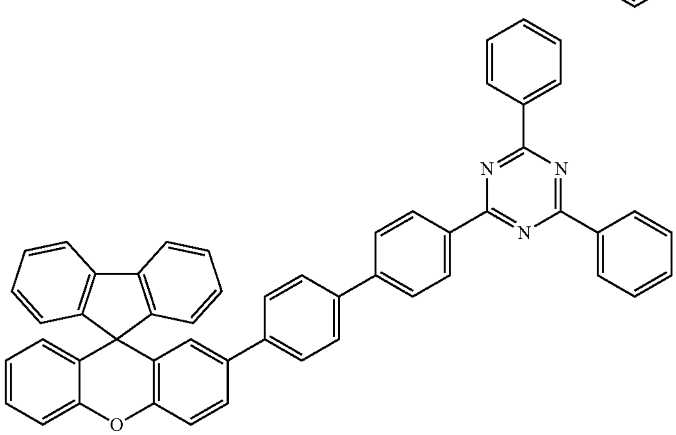
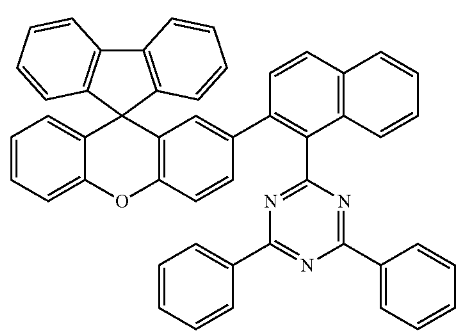

-continued
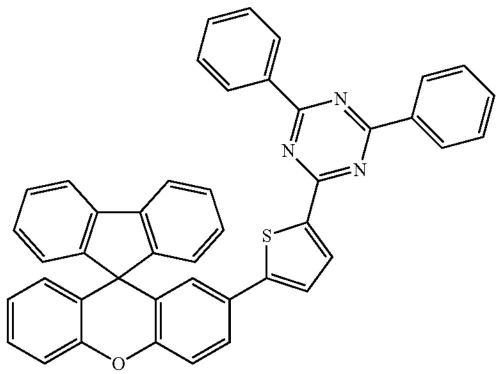
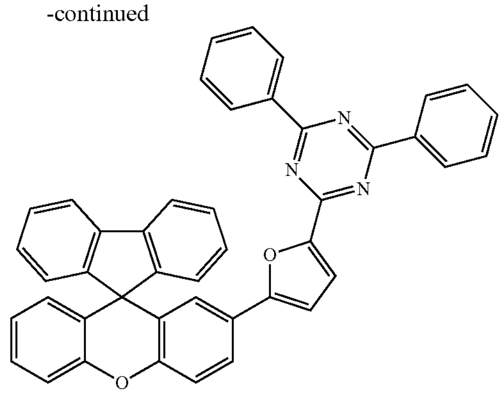
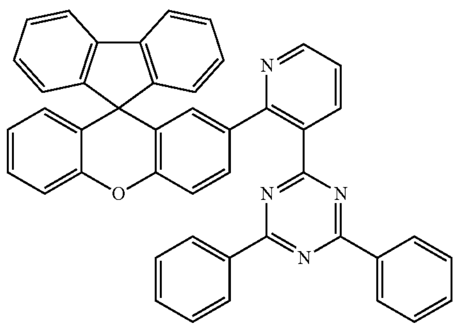
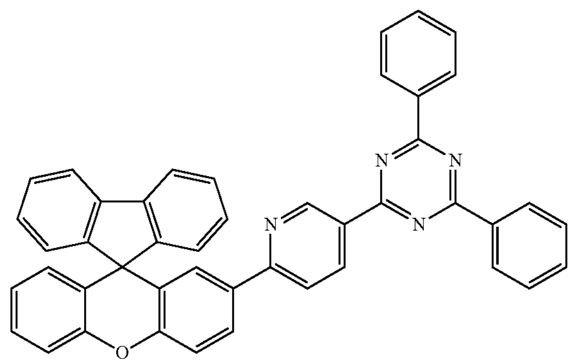
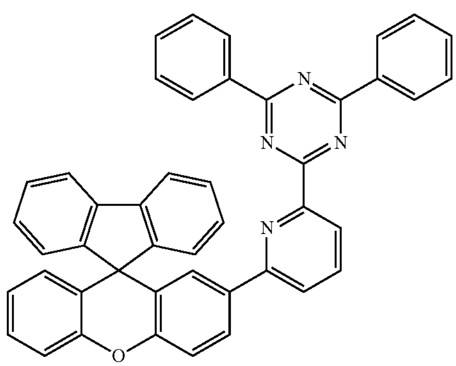
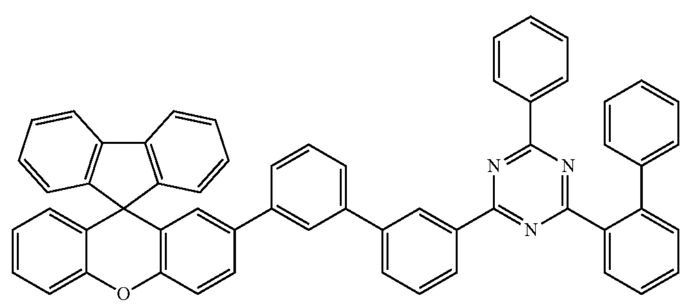
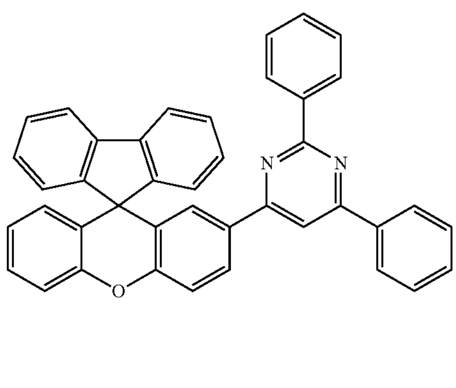
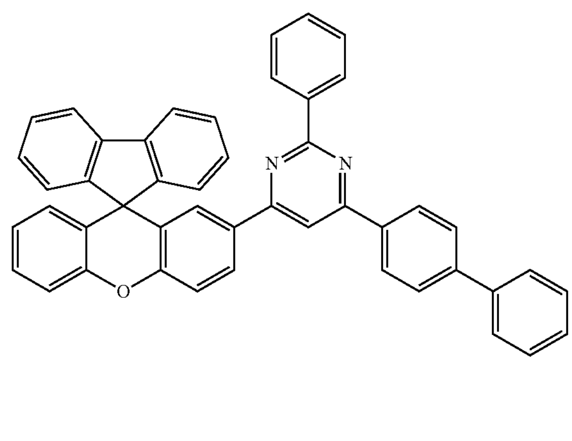

-continued
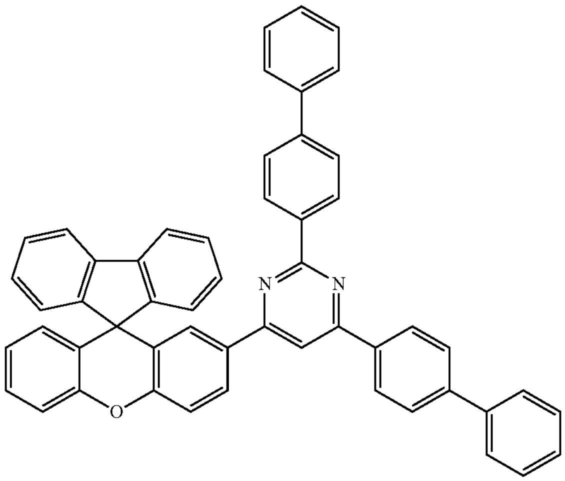
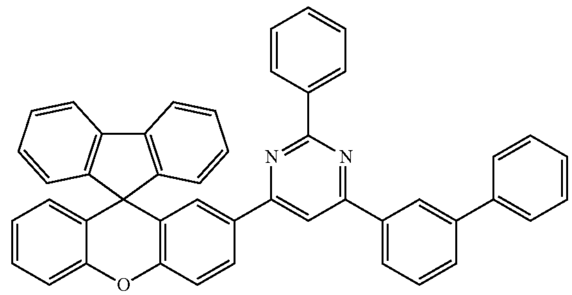
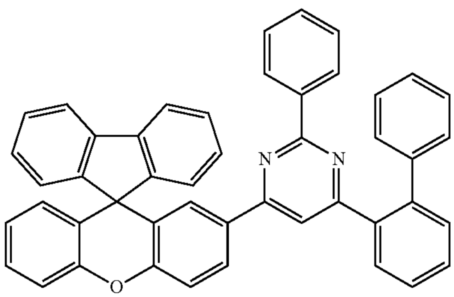
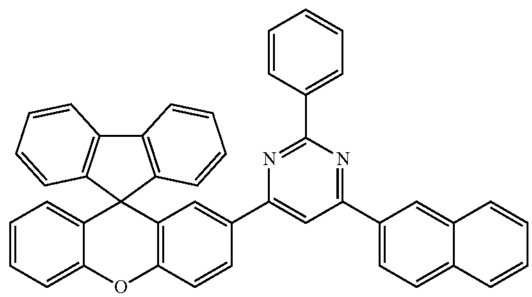
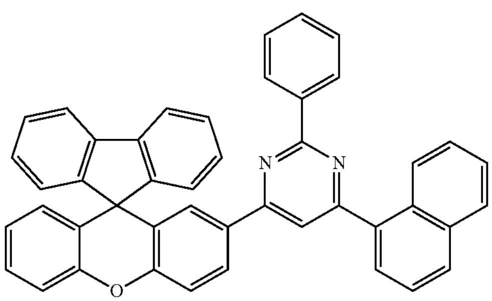
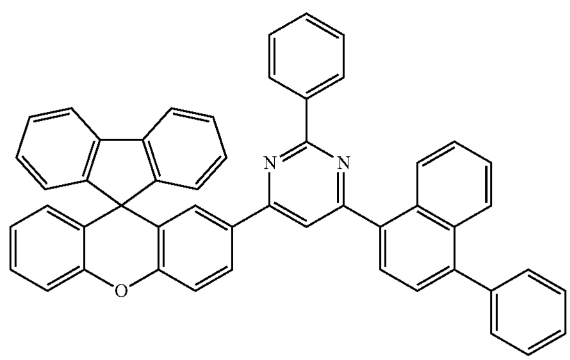
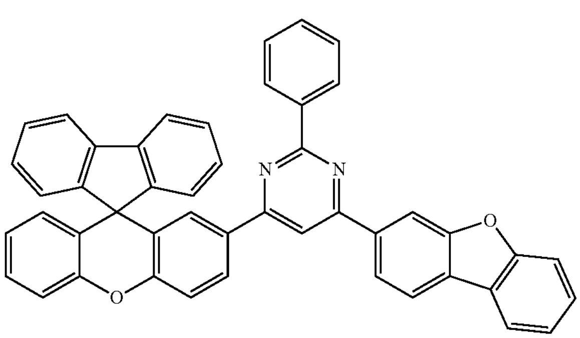
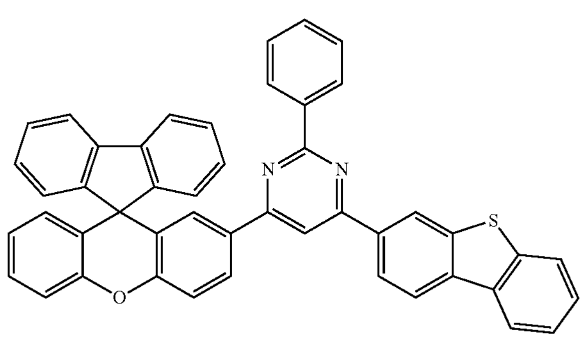

-continued
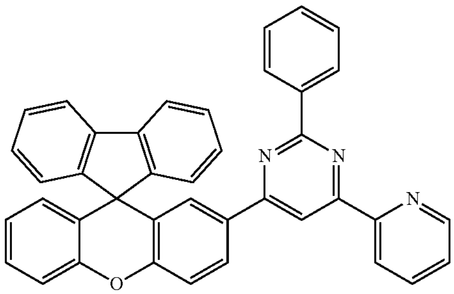
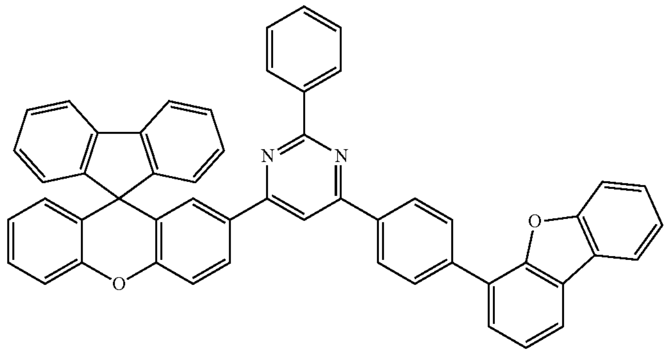
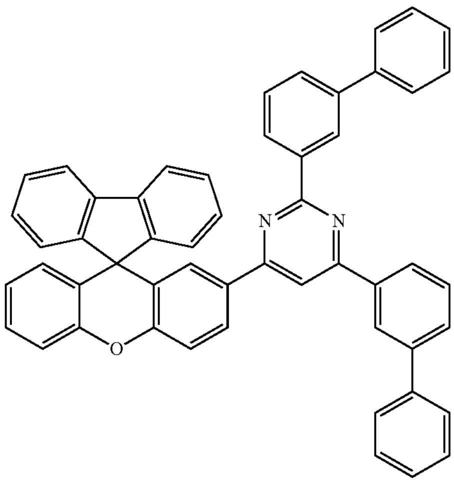
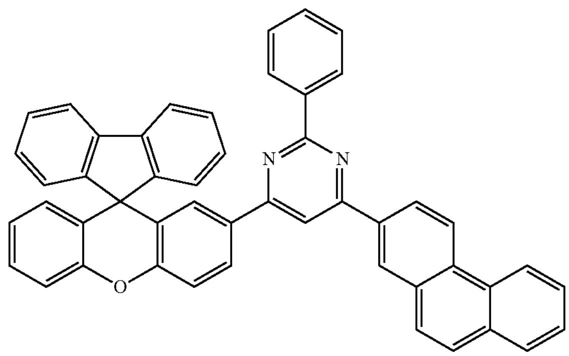
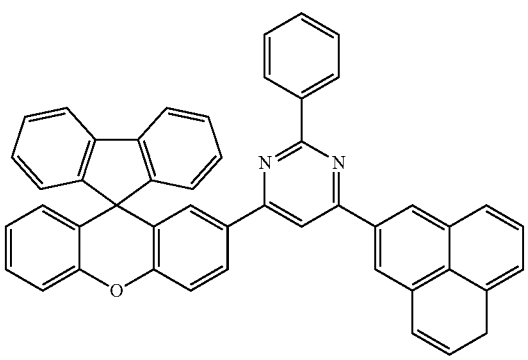
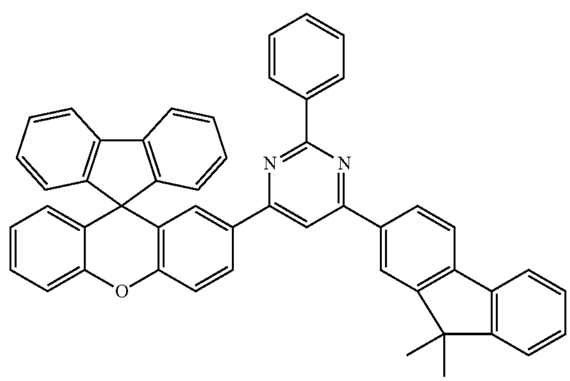
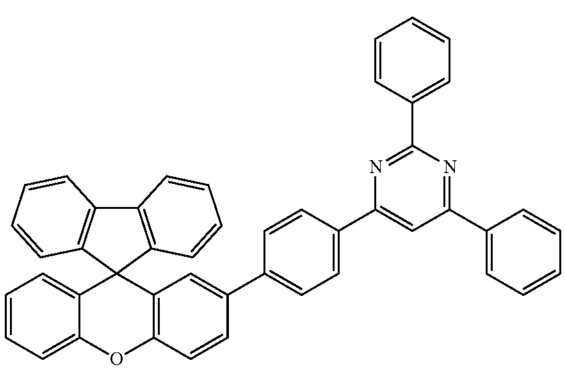

-continued
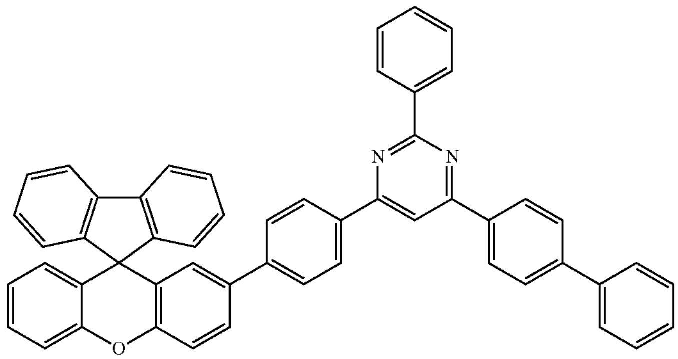
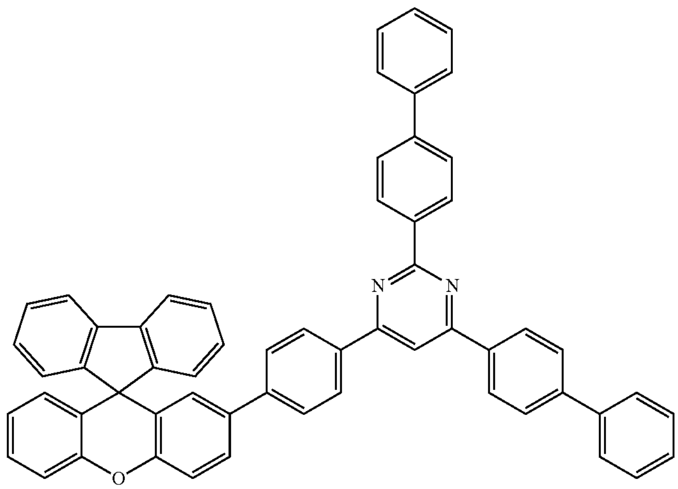
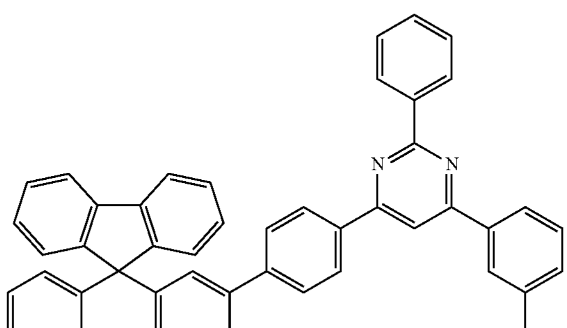
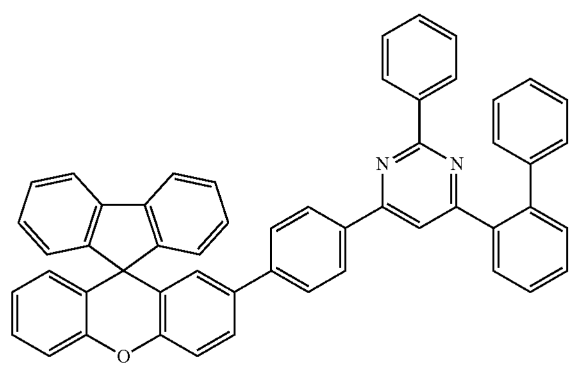
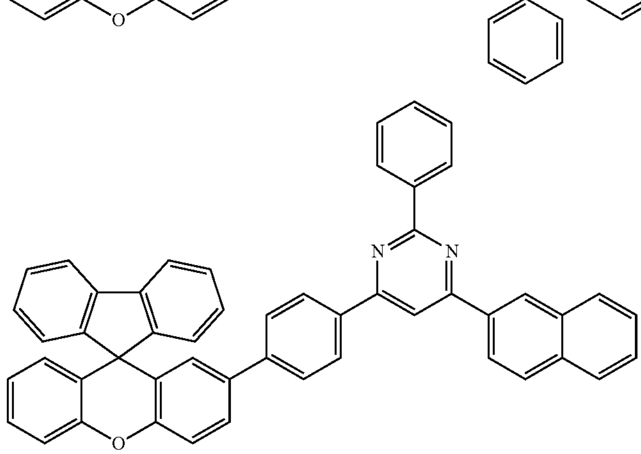

-continued
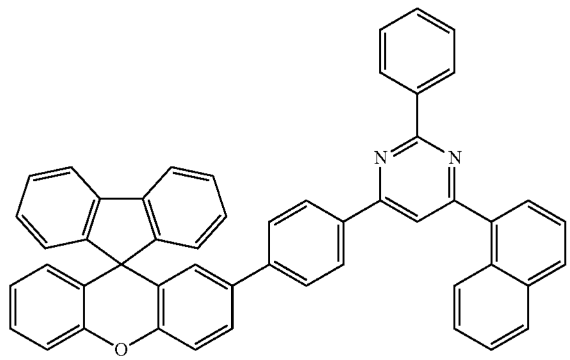
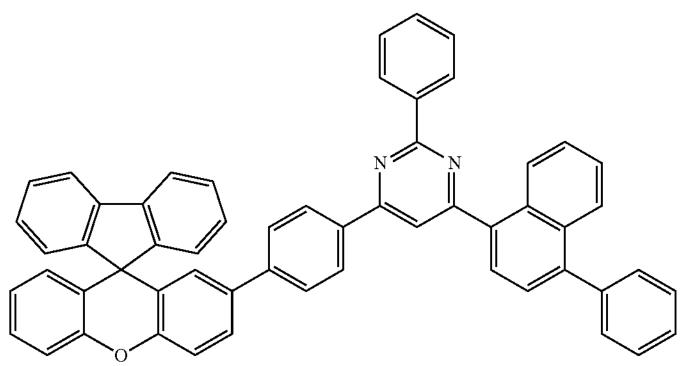
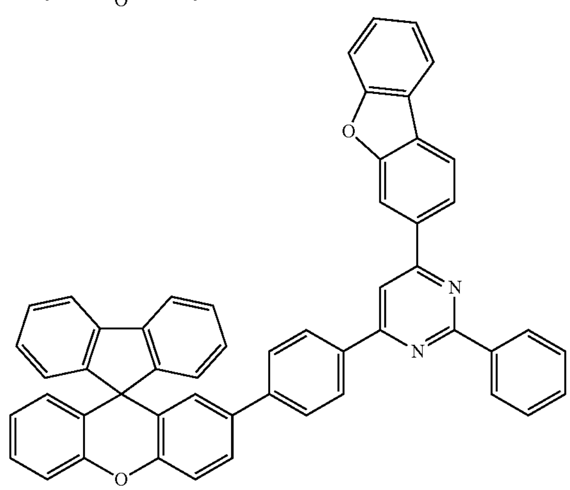
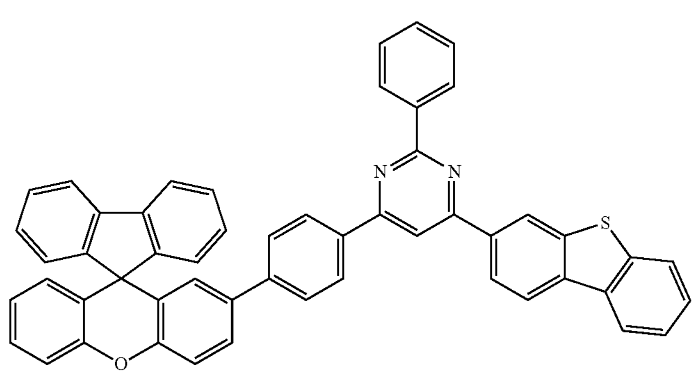

-continued
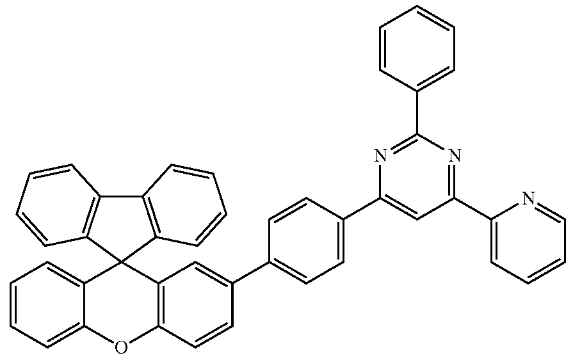
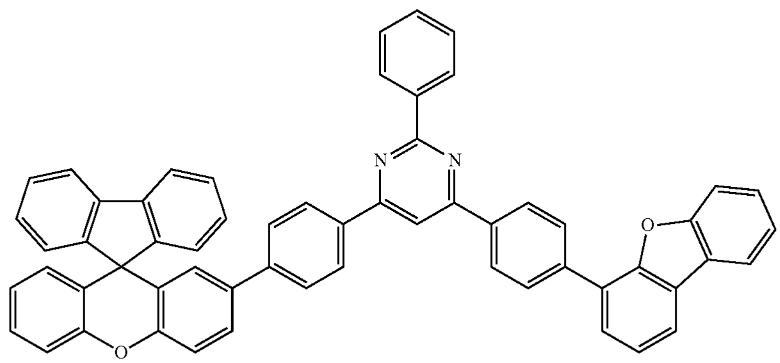
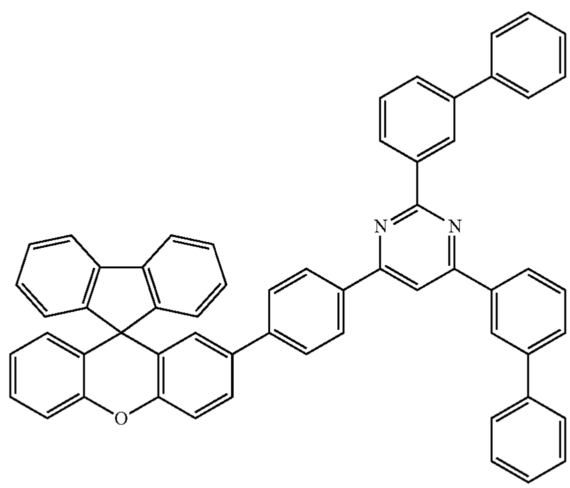
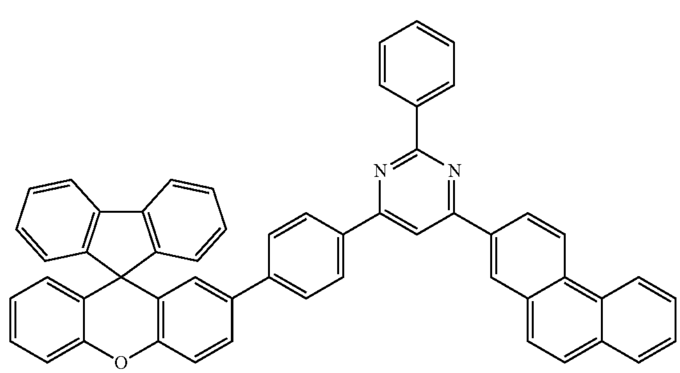

-continued
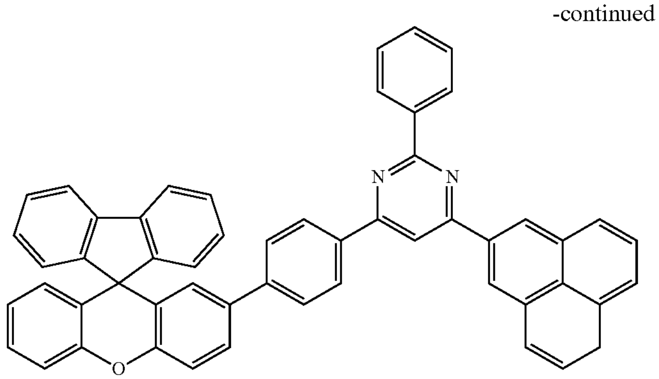
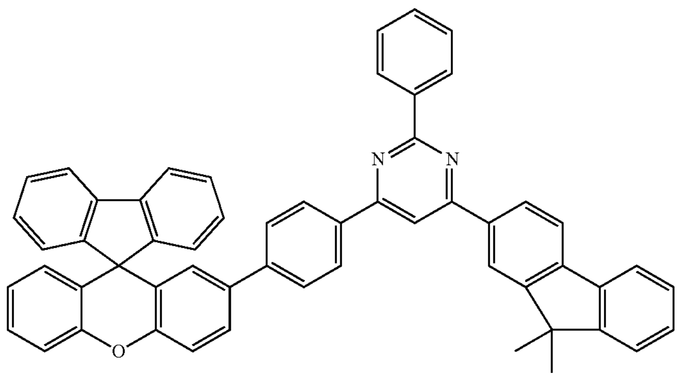
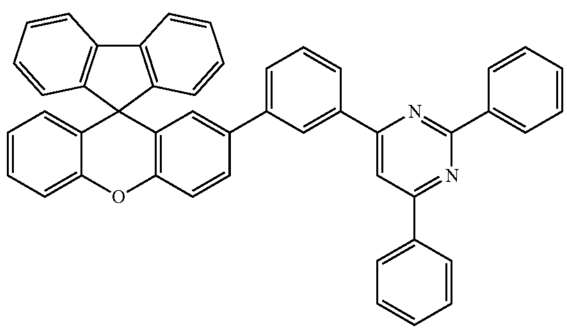
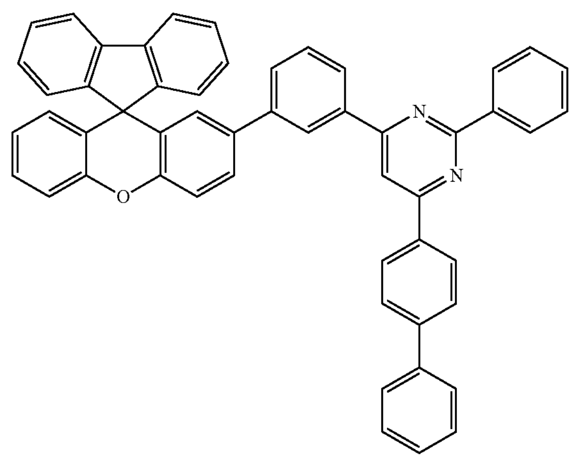
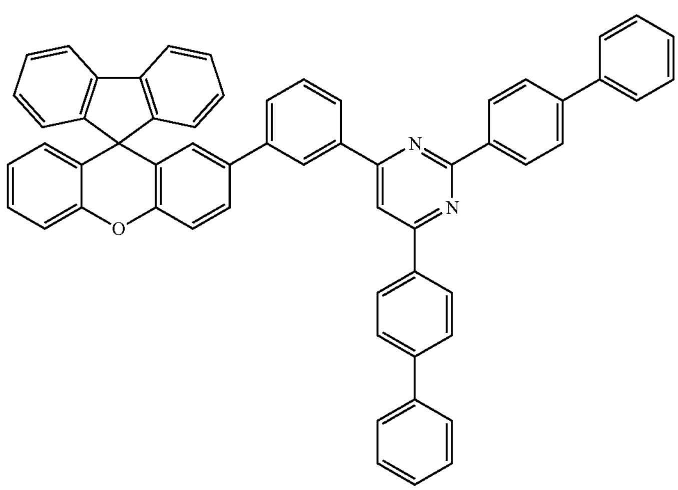

-continued
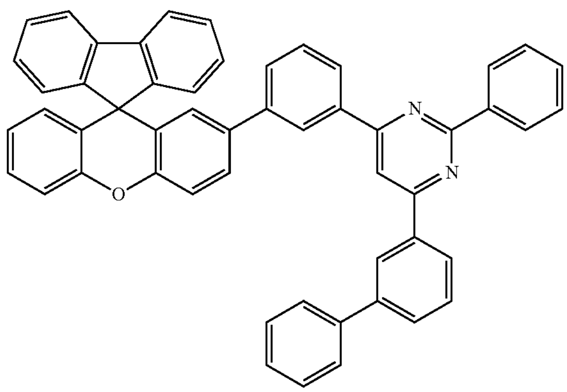
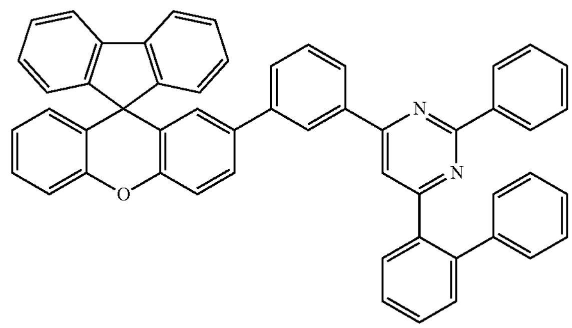
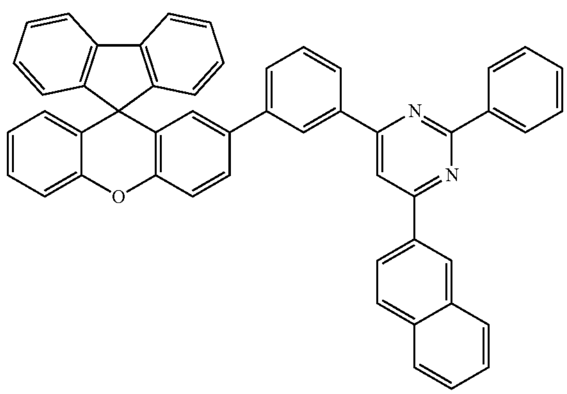
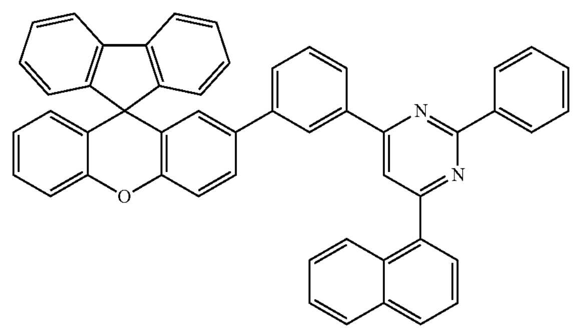
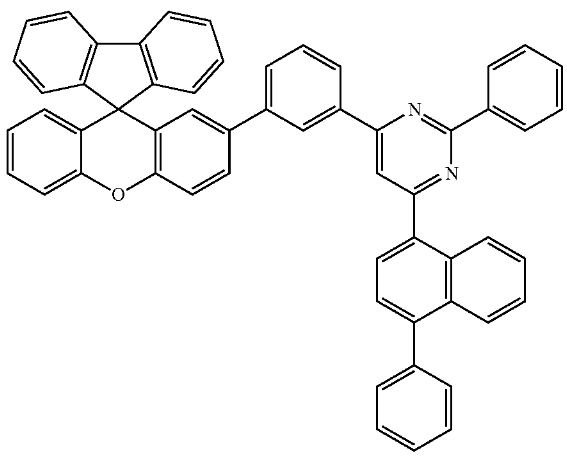
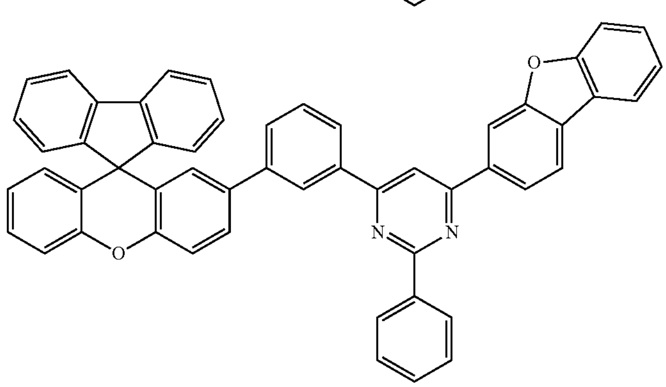

-continued
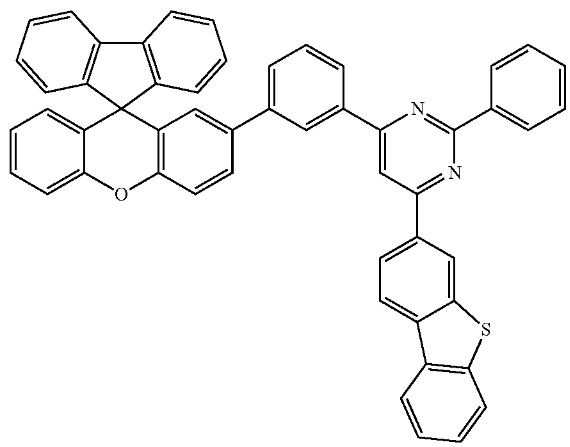
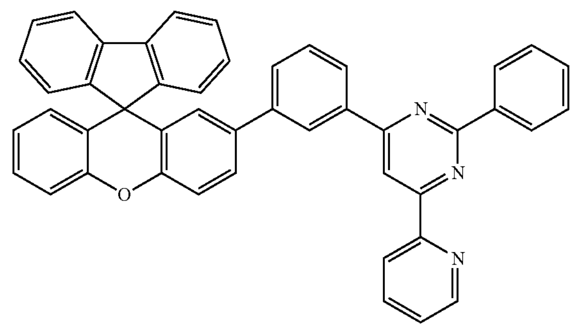
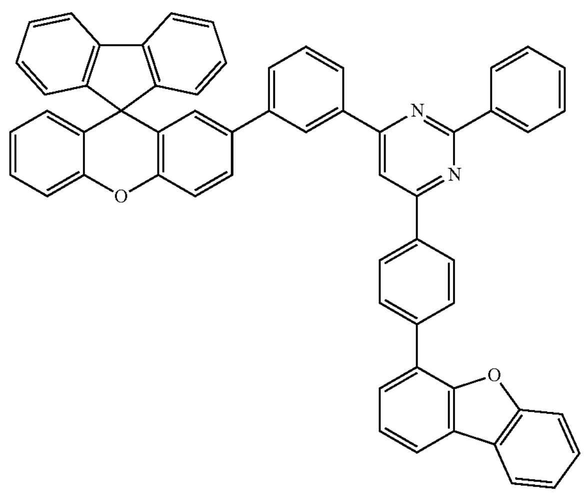
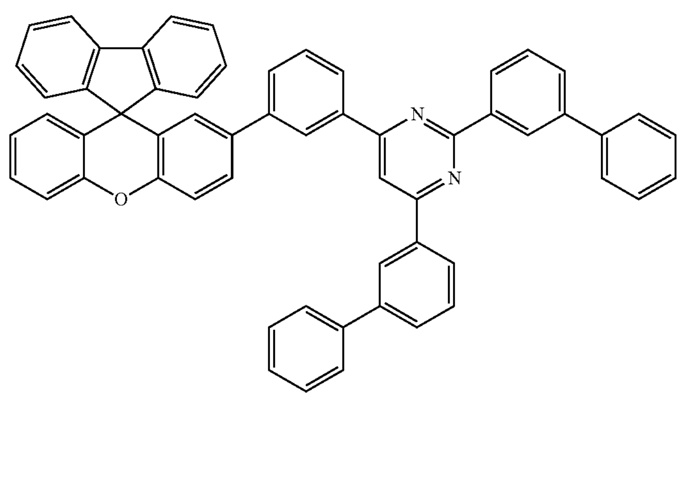

-continued
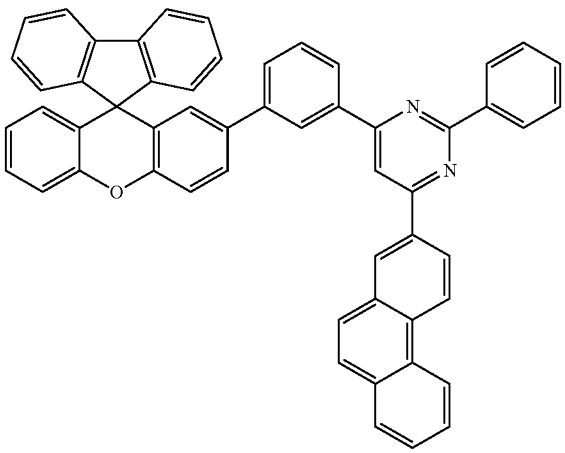
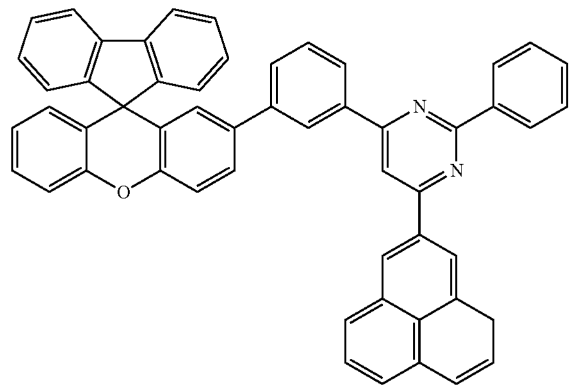
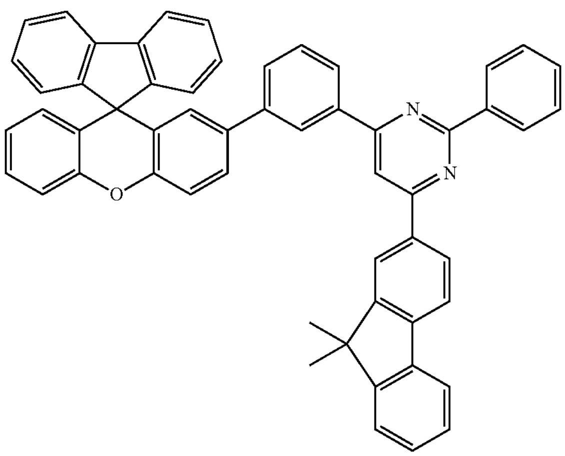
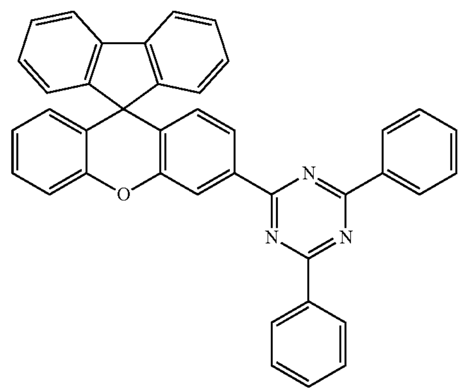
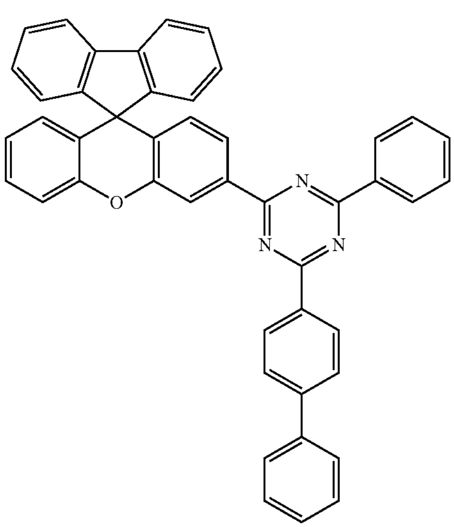
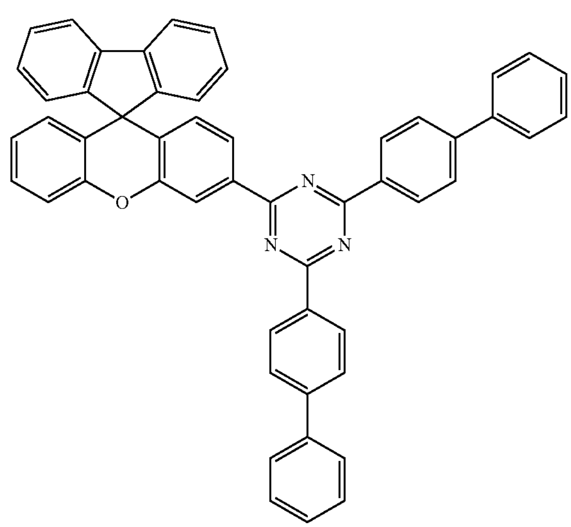

-continued
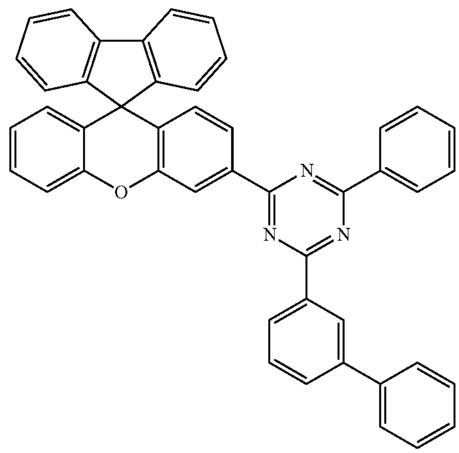
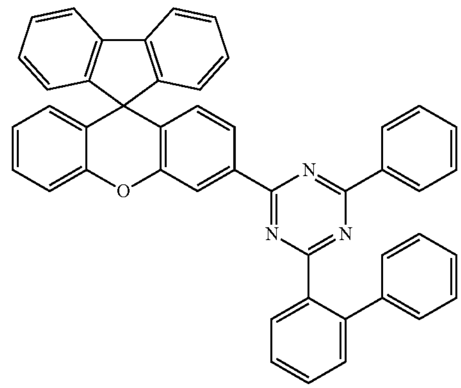
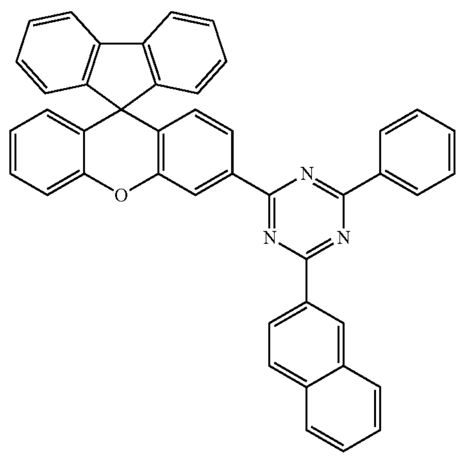
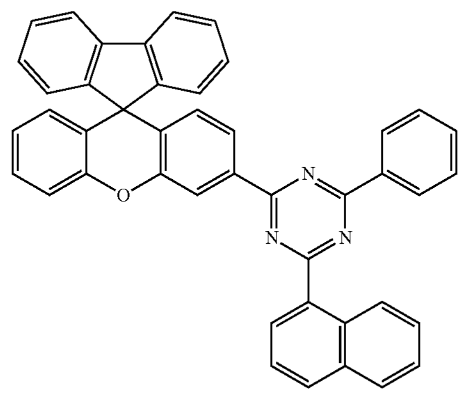
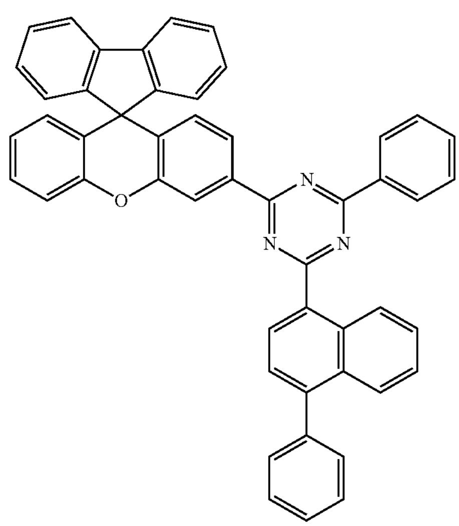
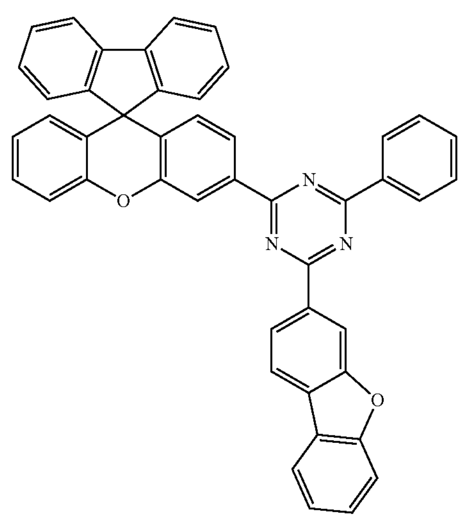

-continued
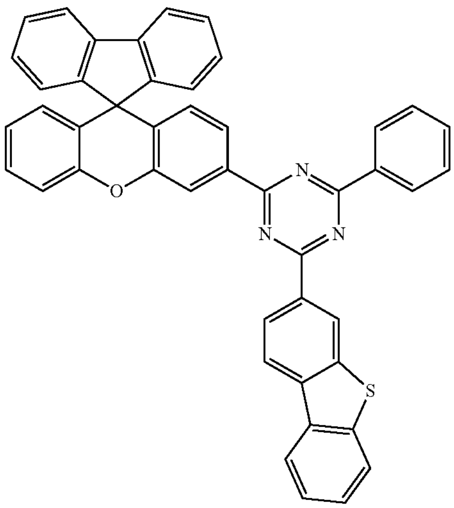
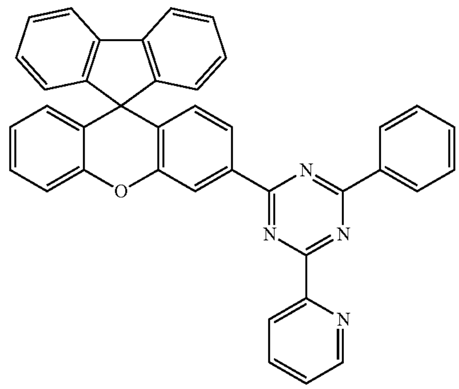
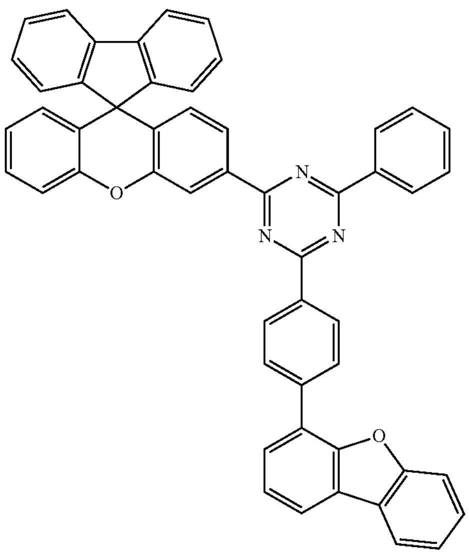
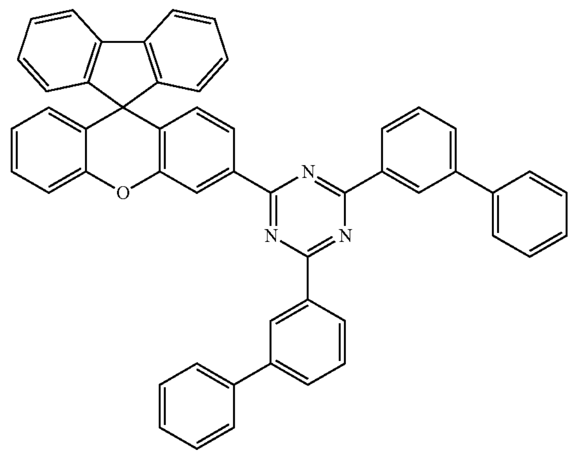
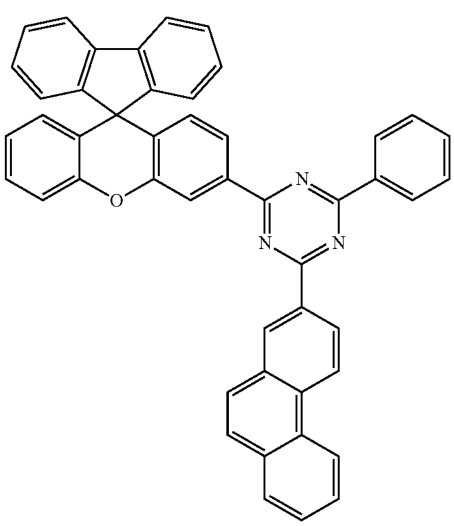
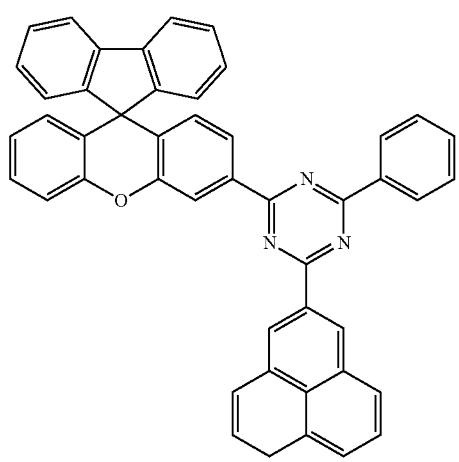

-continued
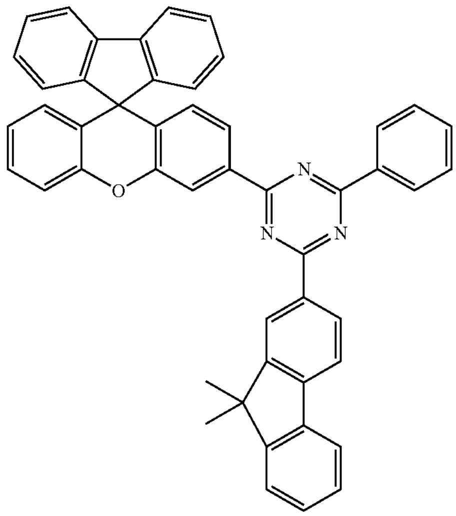
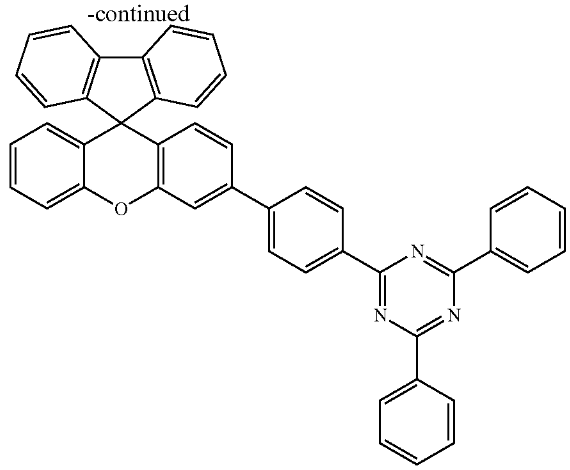
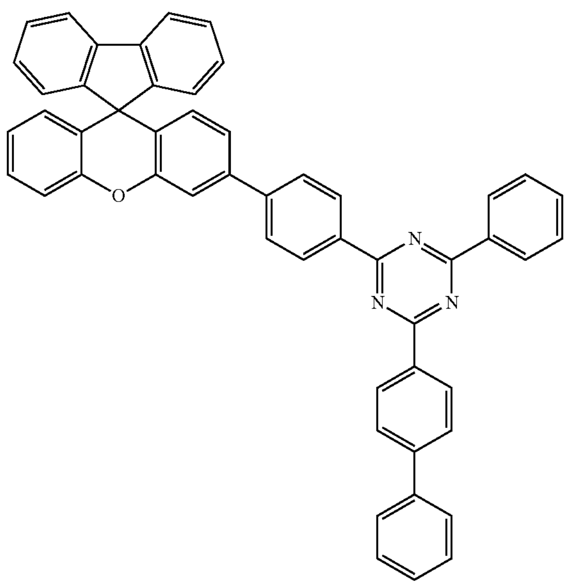
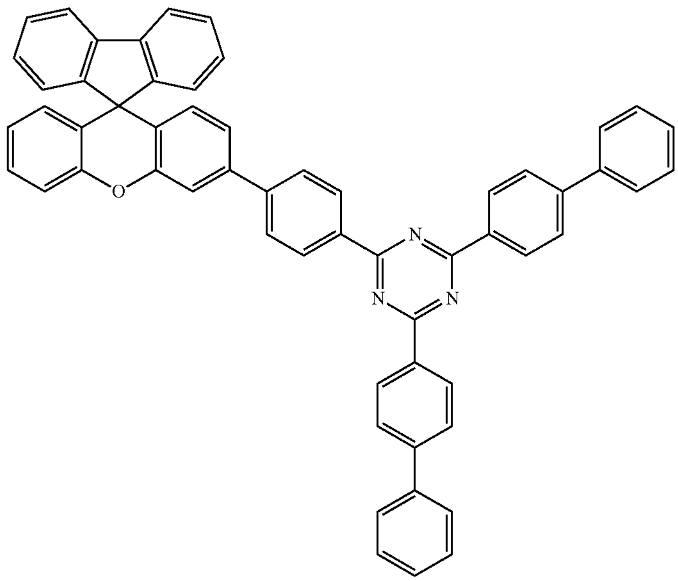

-continued
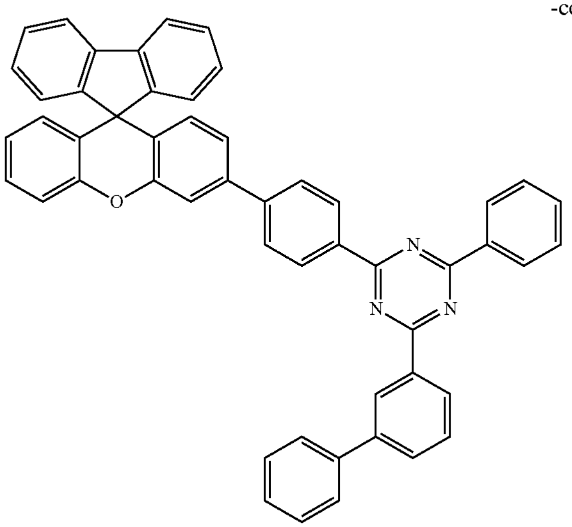
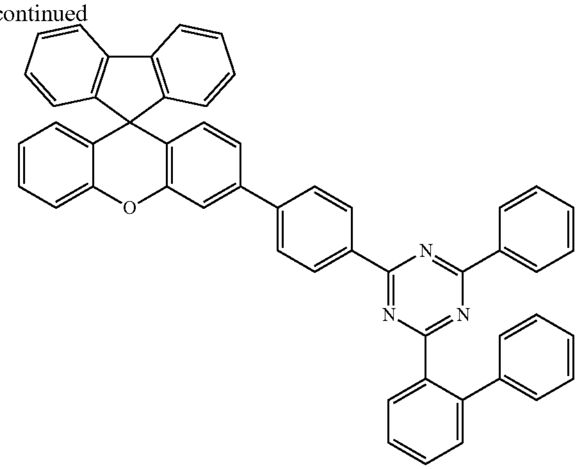
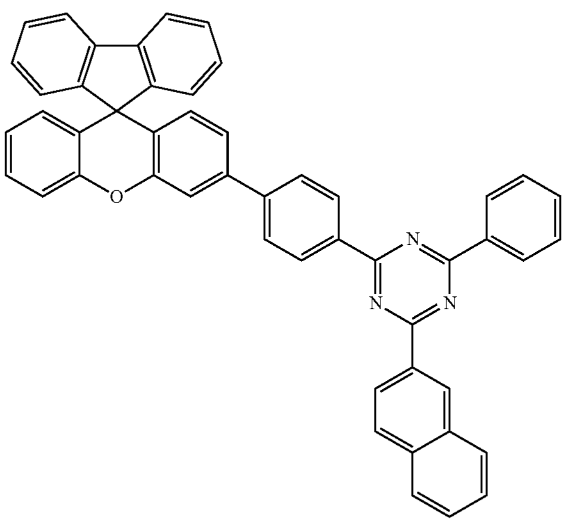
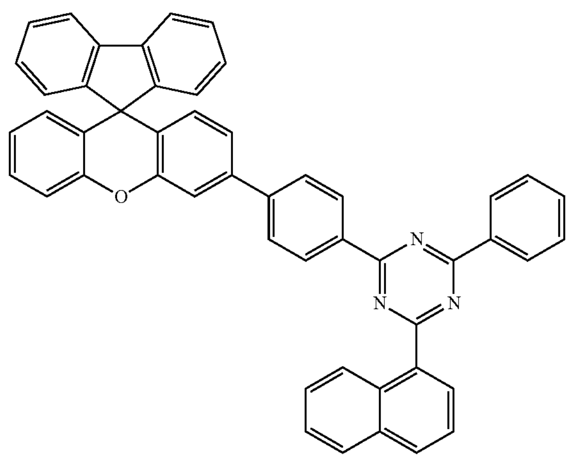
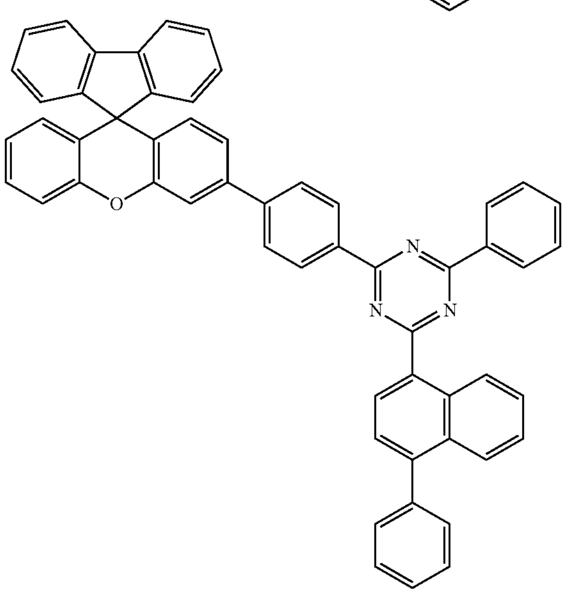

-continued
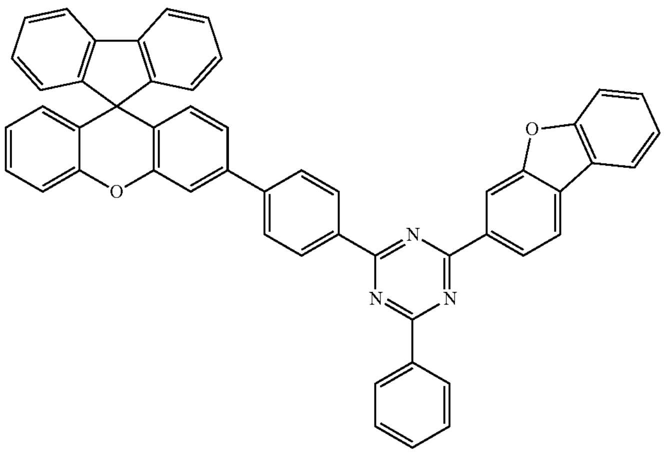
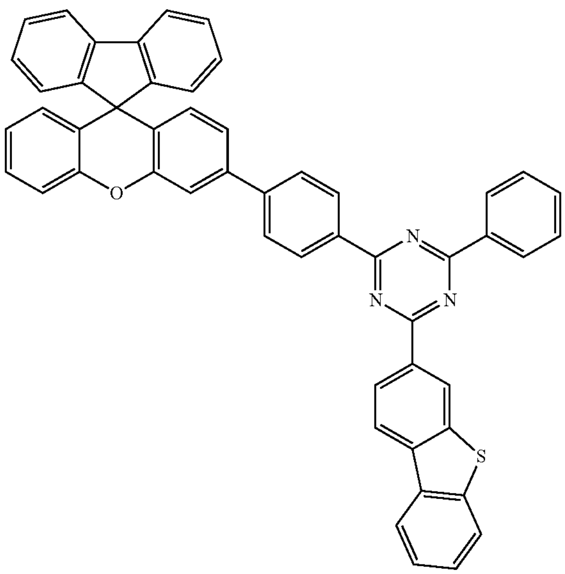
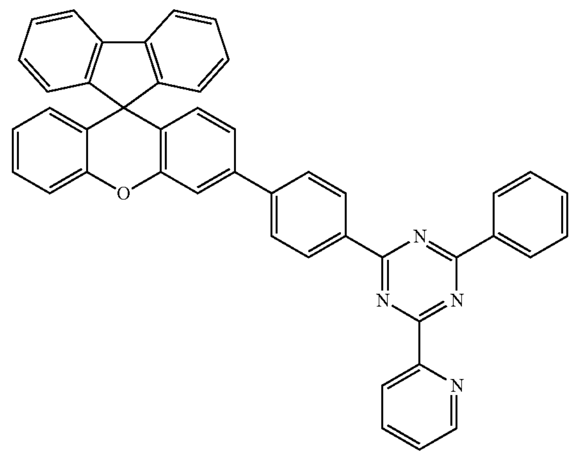
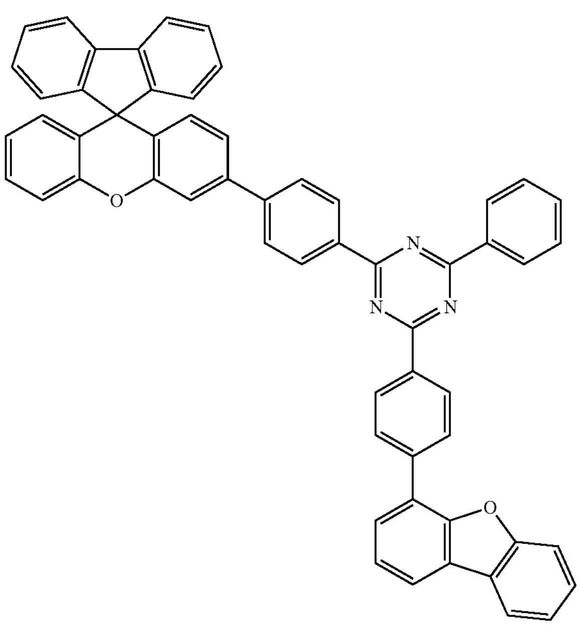

-continued
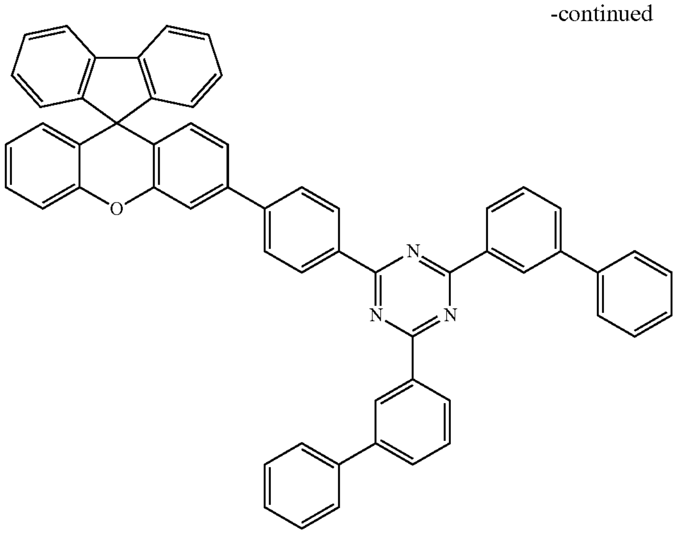
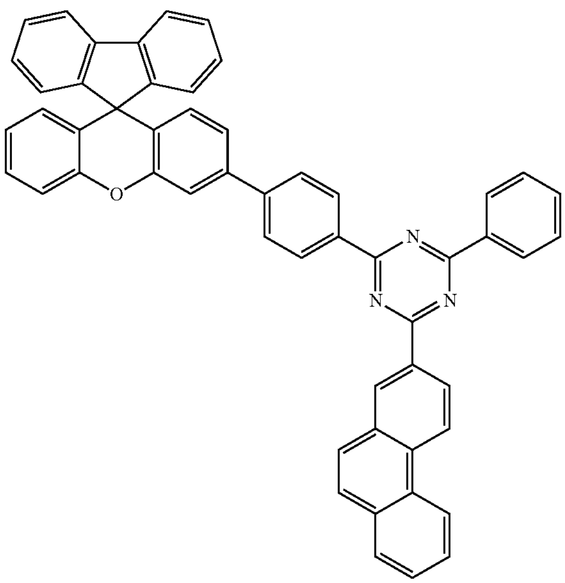
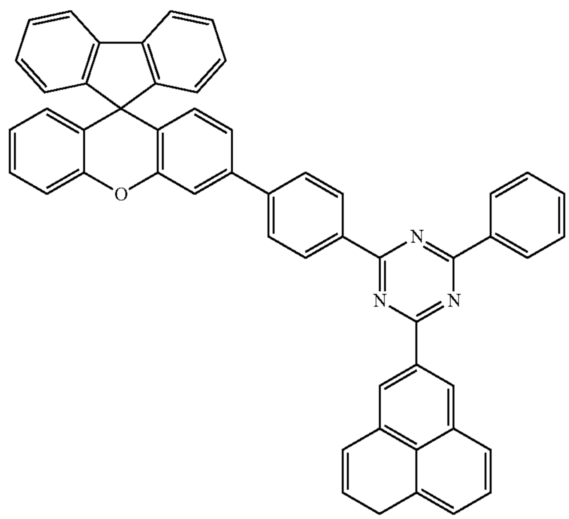
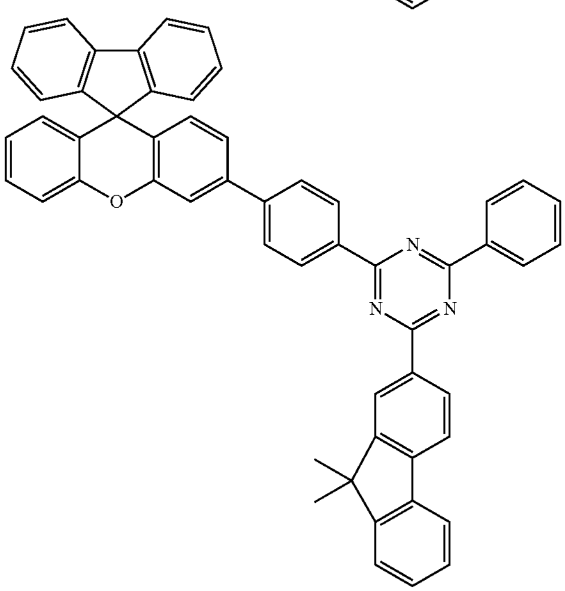
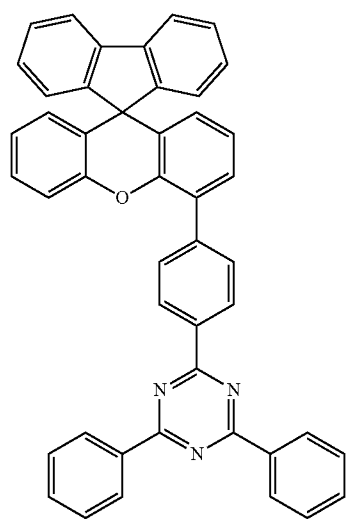

-continued
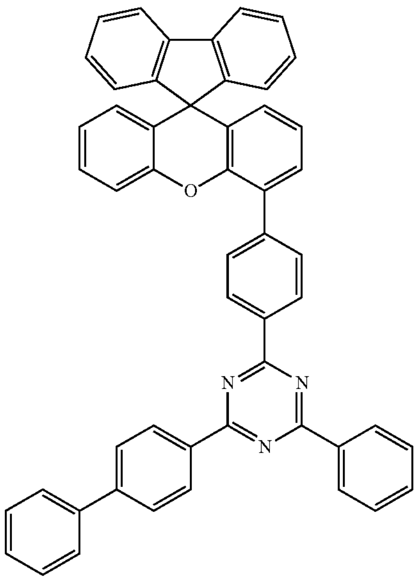
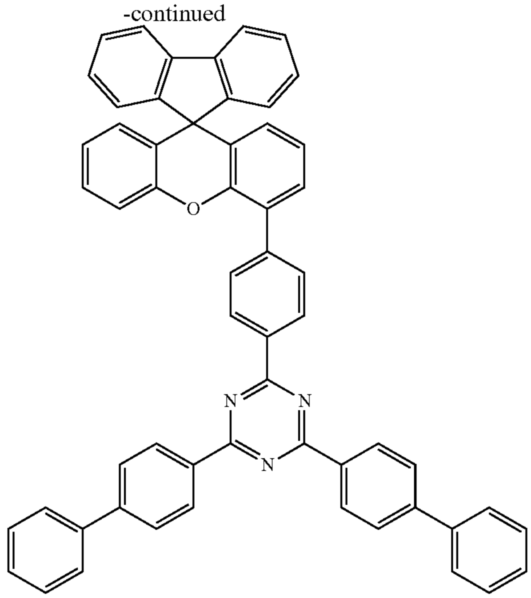
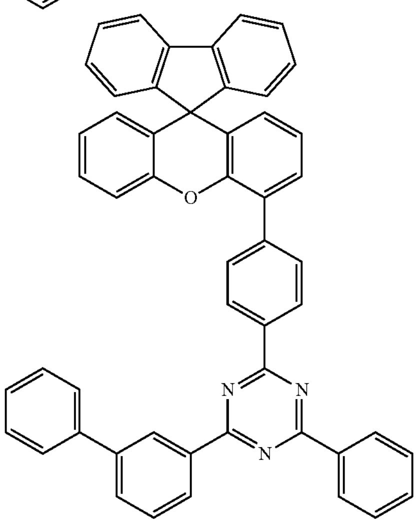
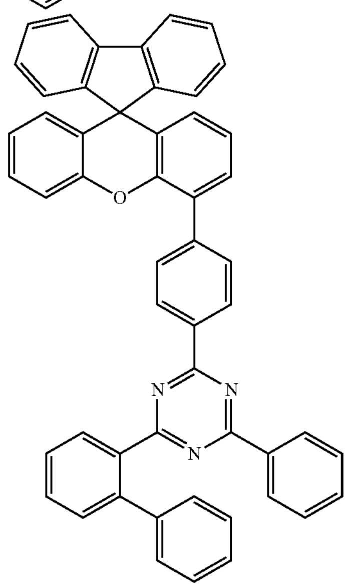
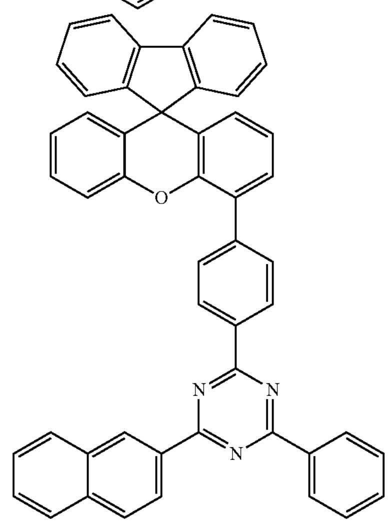
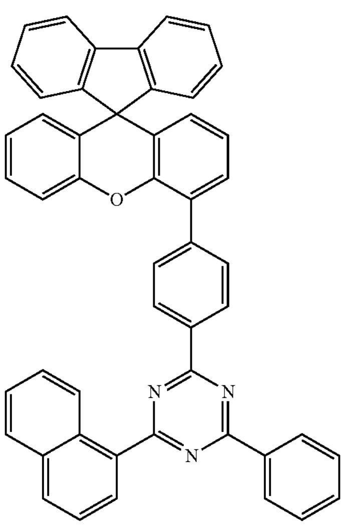
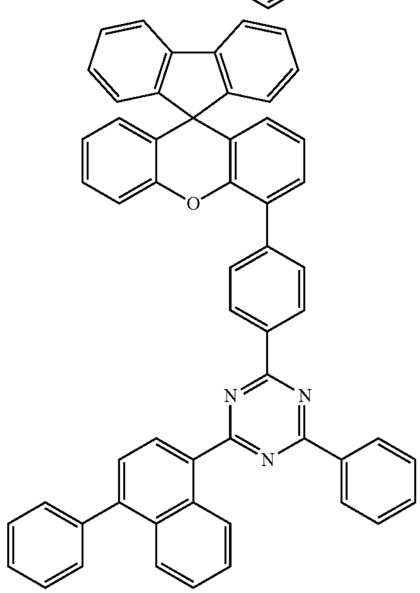

-continued
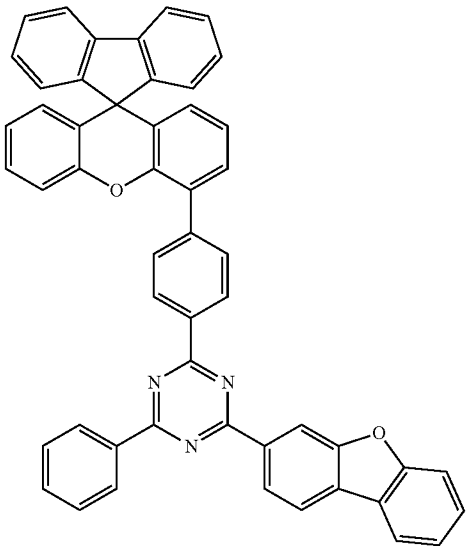
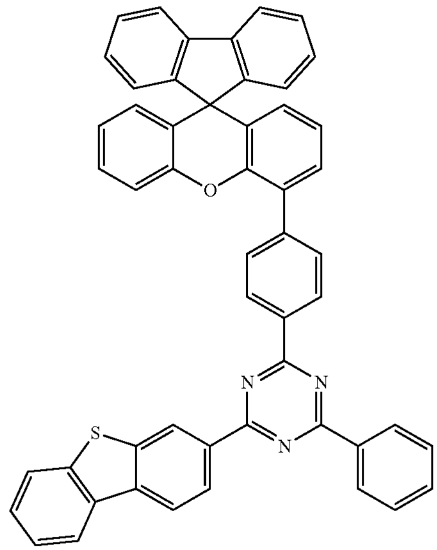
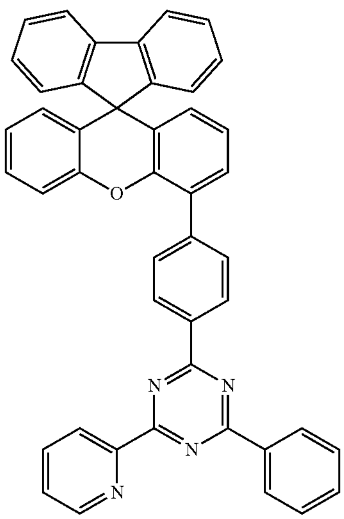
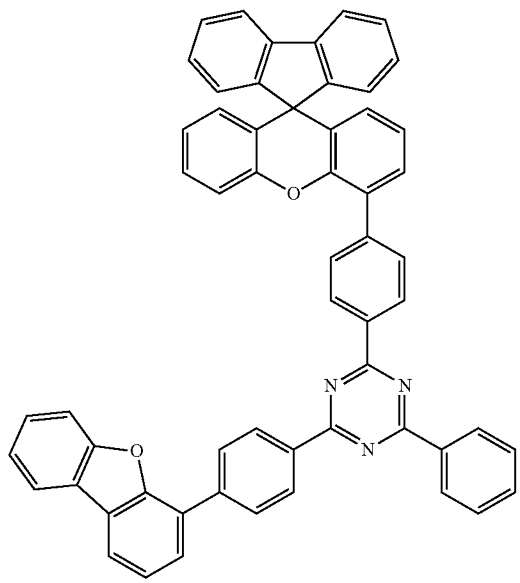
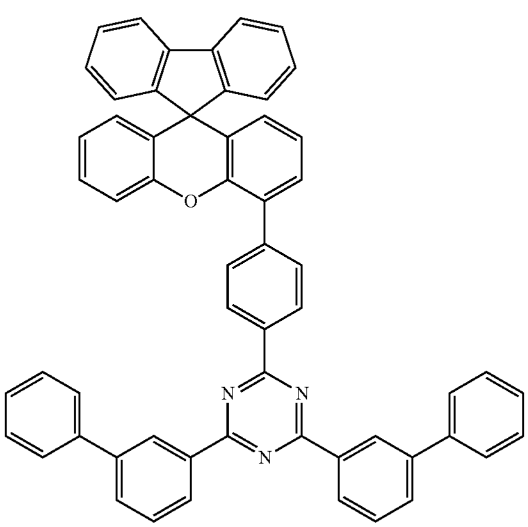
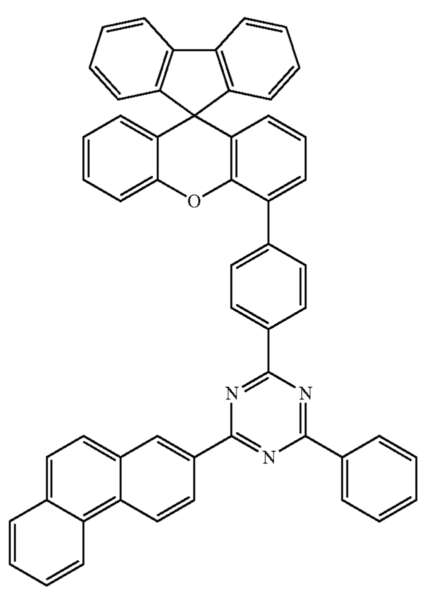

-continued
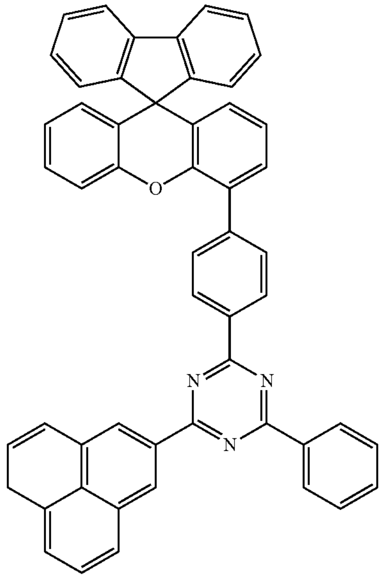
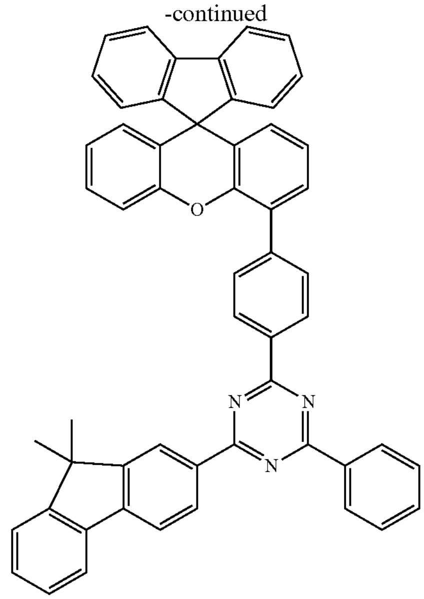
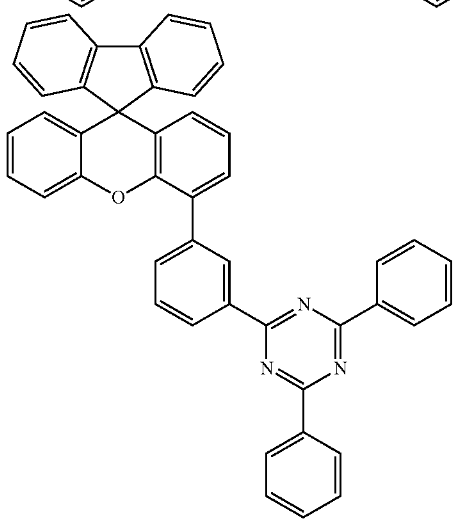
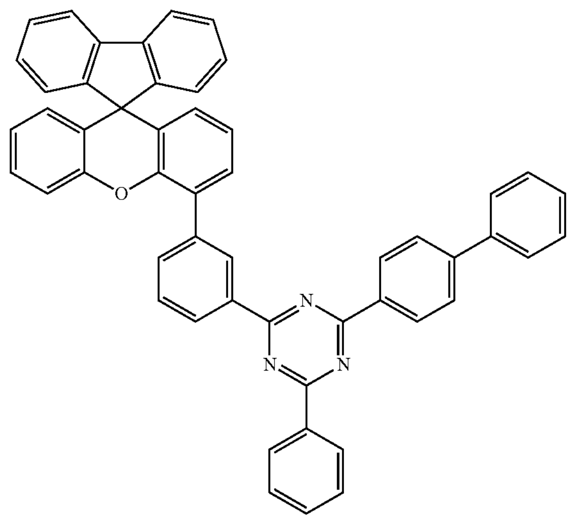
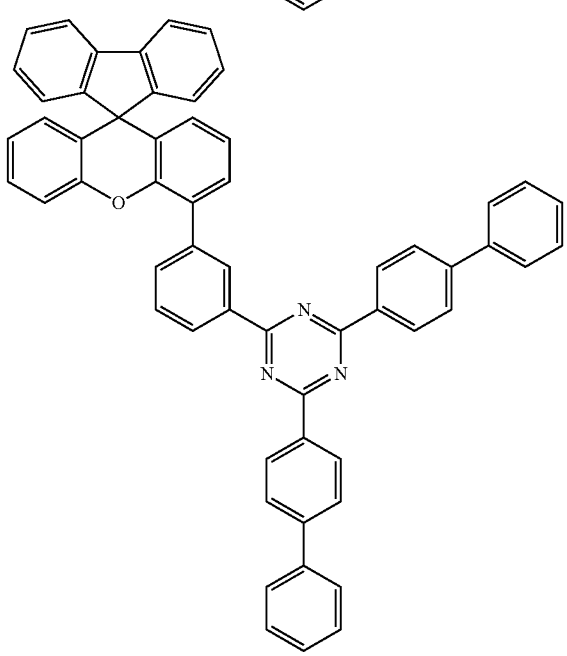
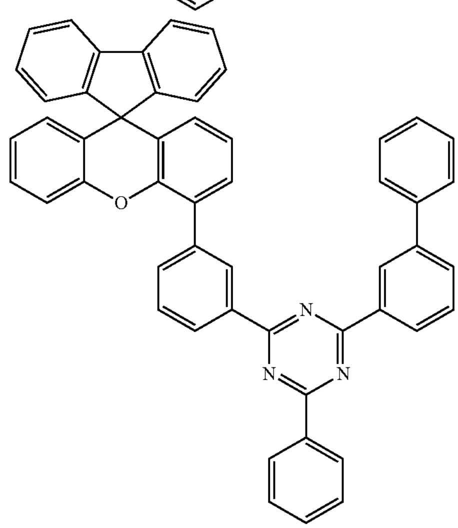

-continued
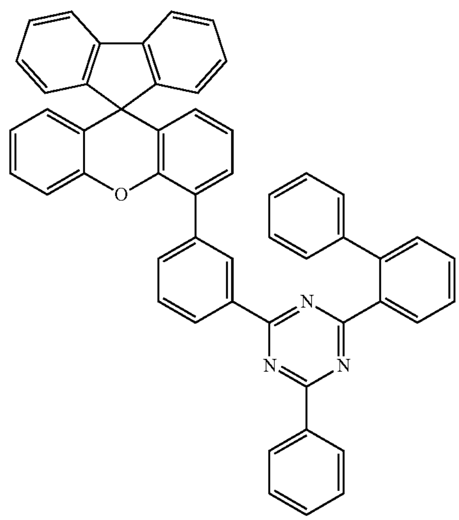
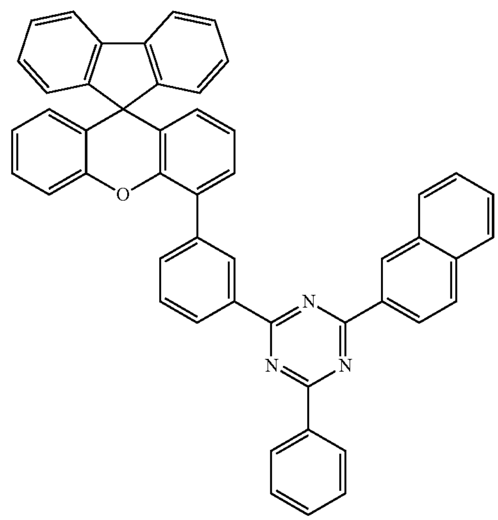
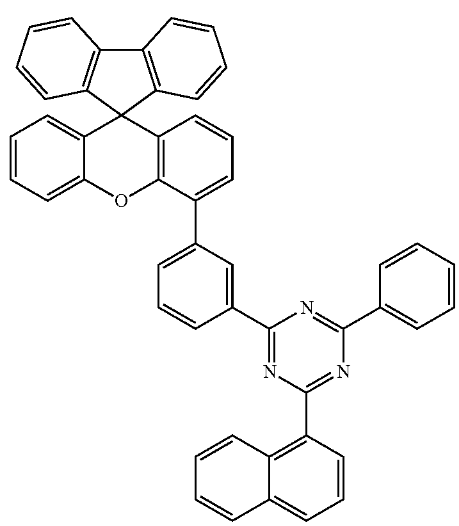
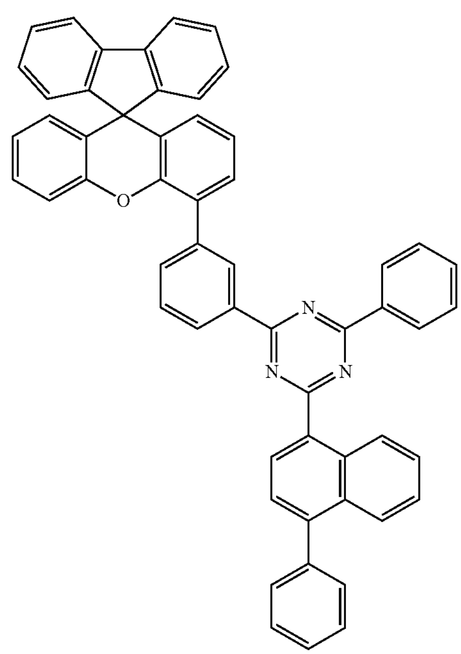

-continued
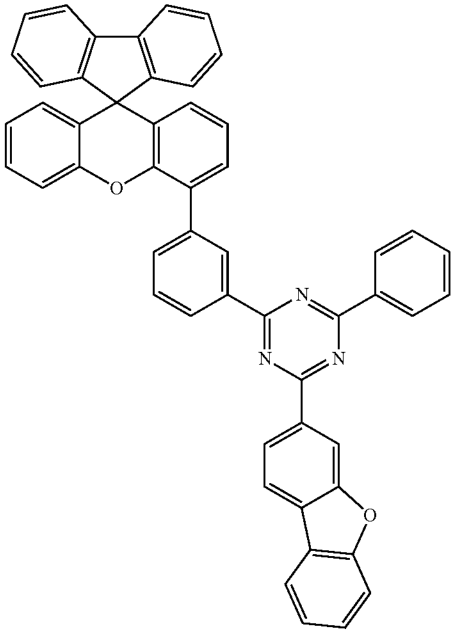
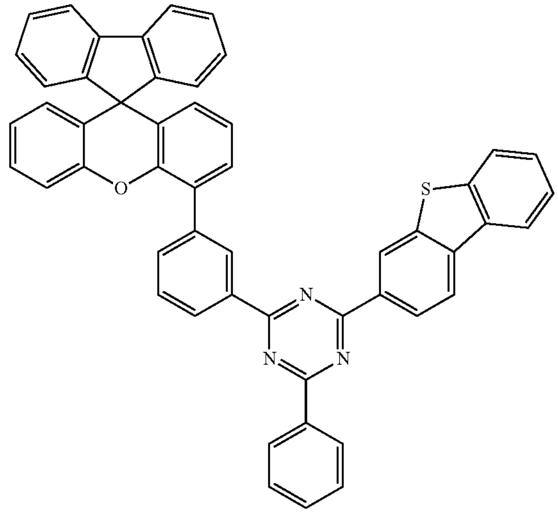
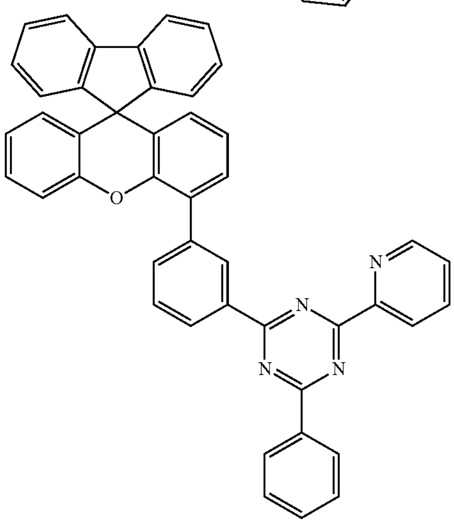
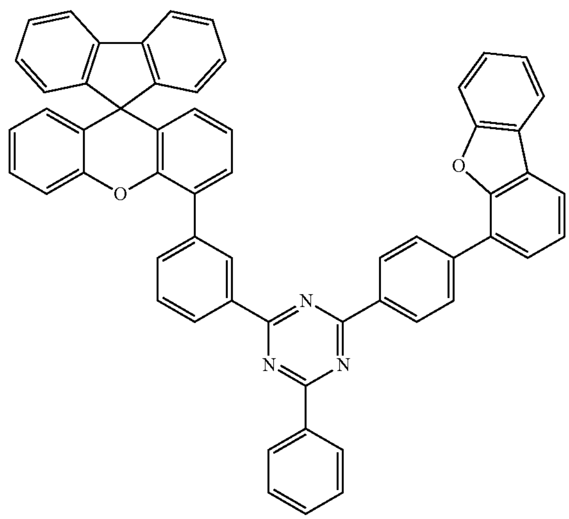
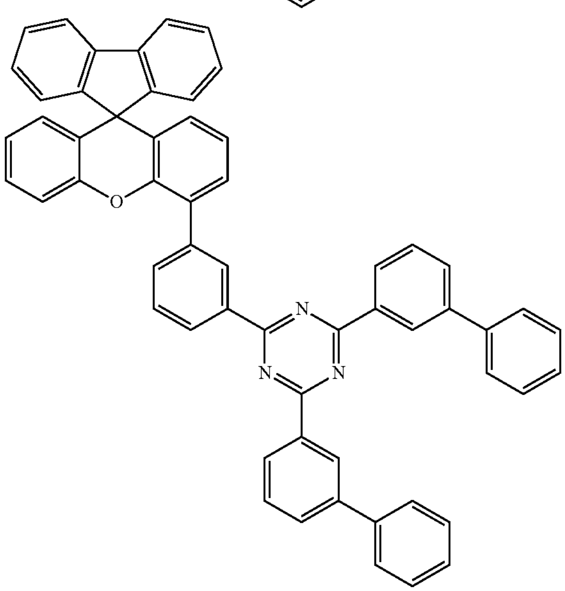
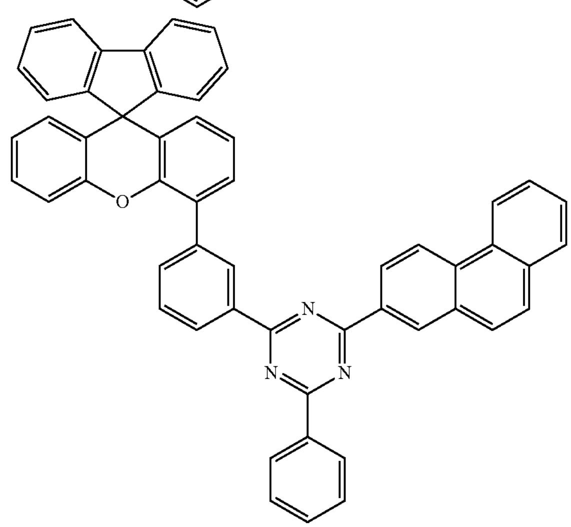

-continued
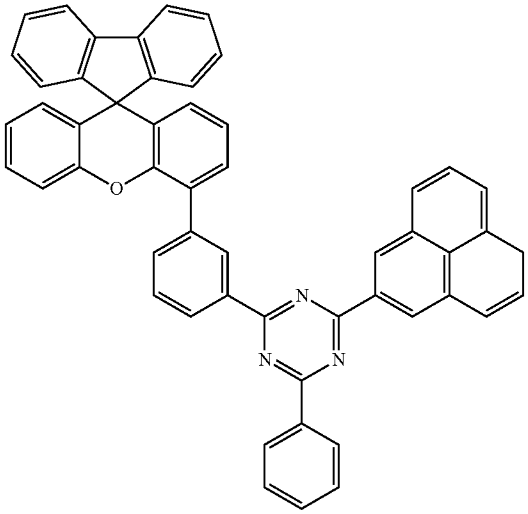
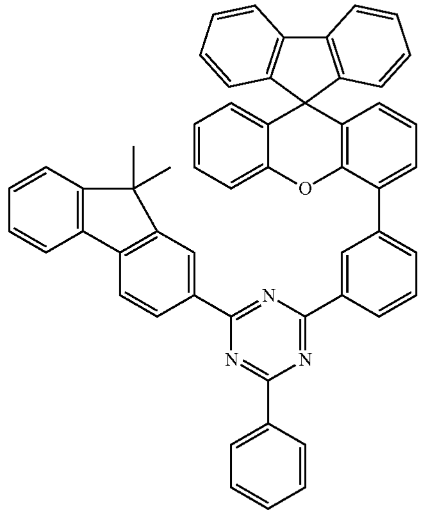
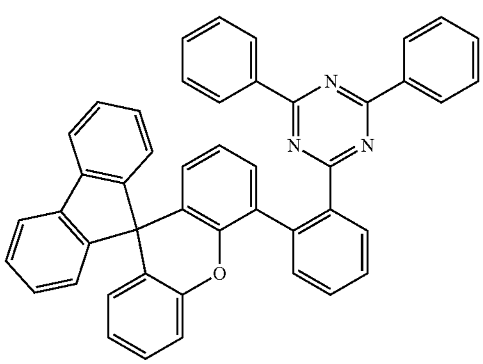
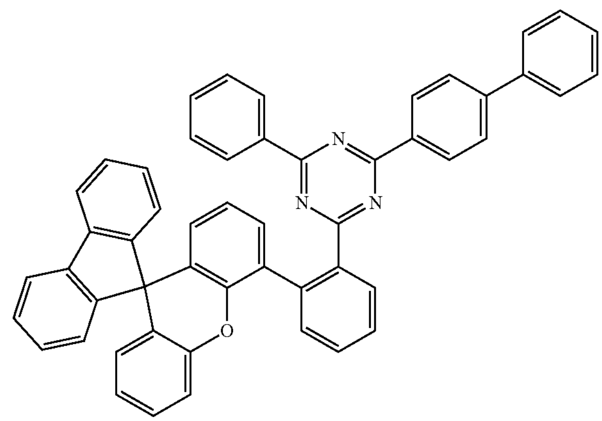
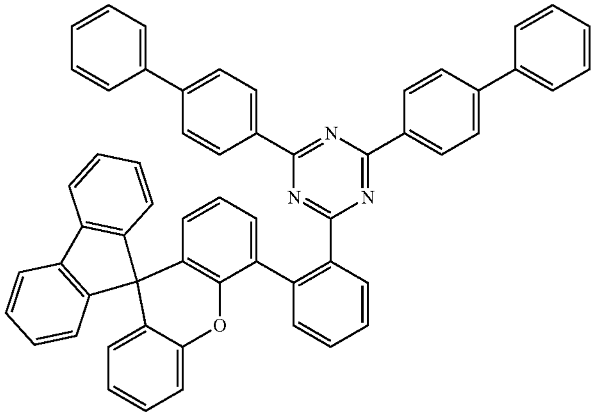
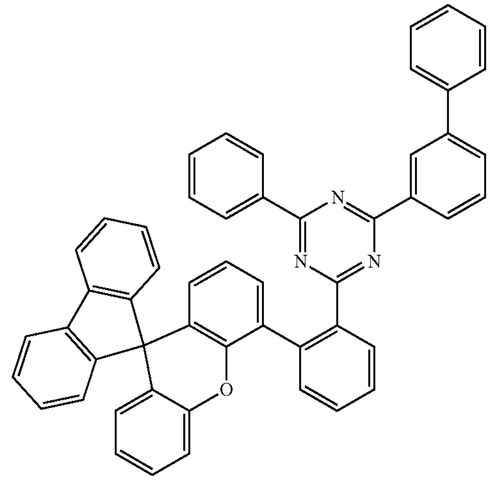

-continued
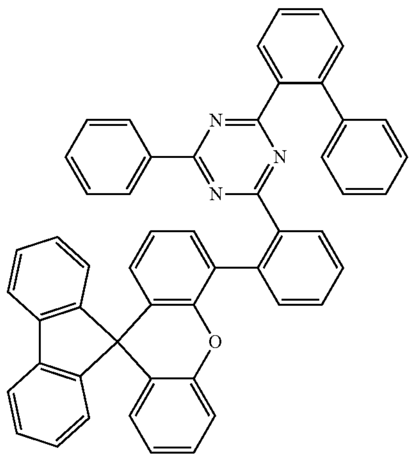
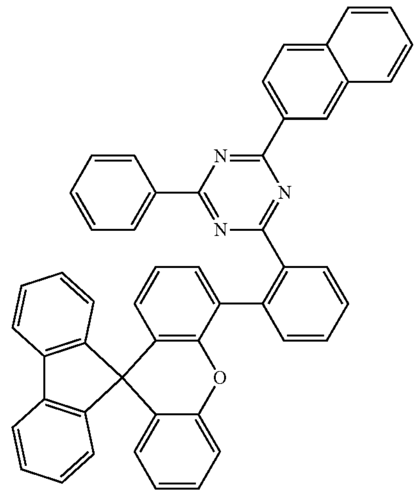
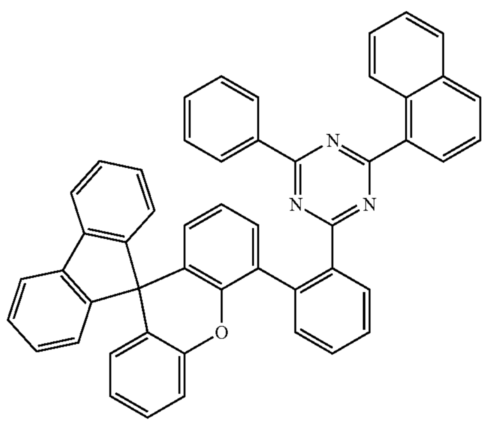
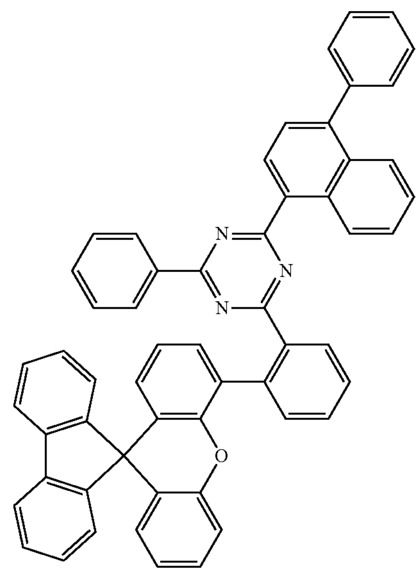
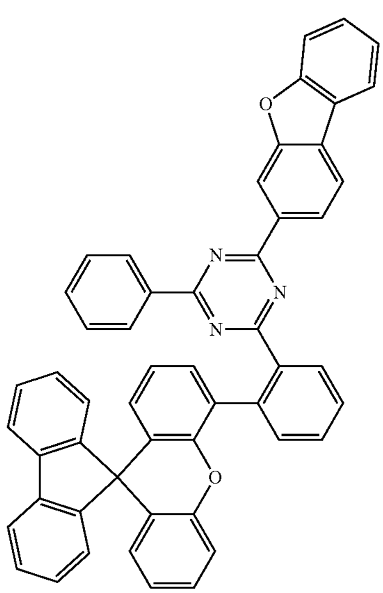
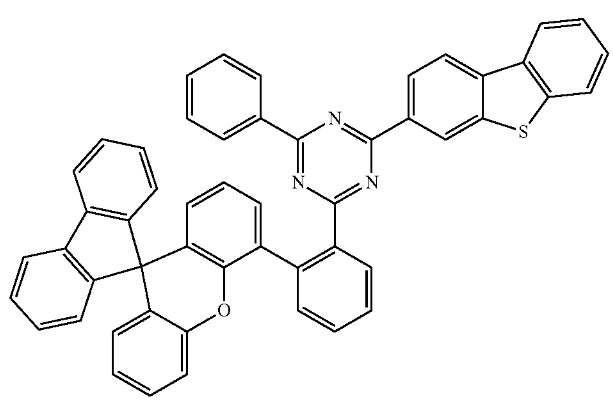

-continued
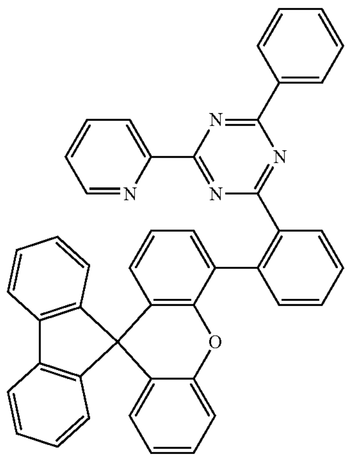
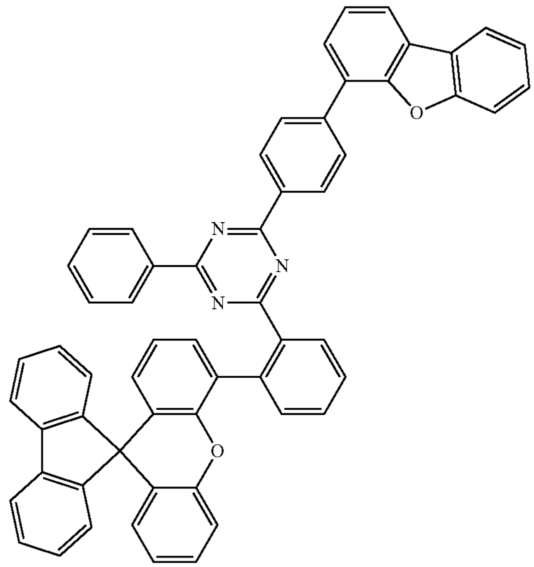
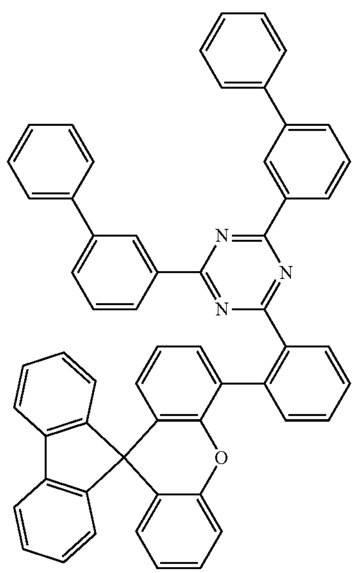
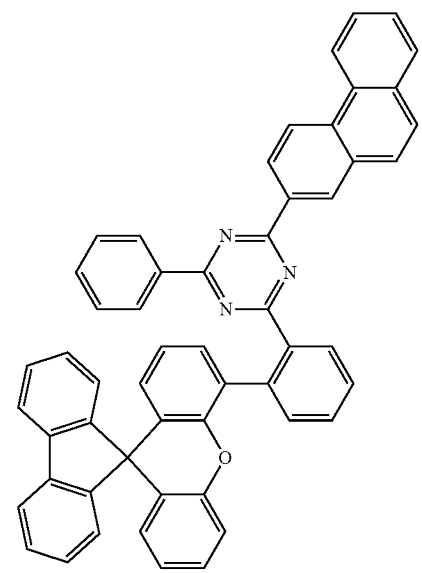
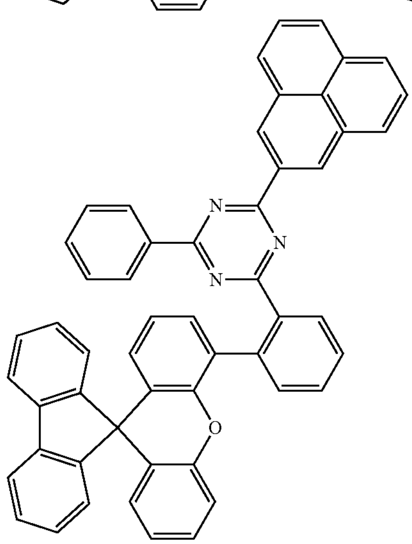
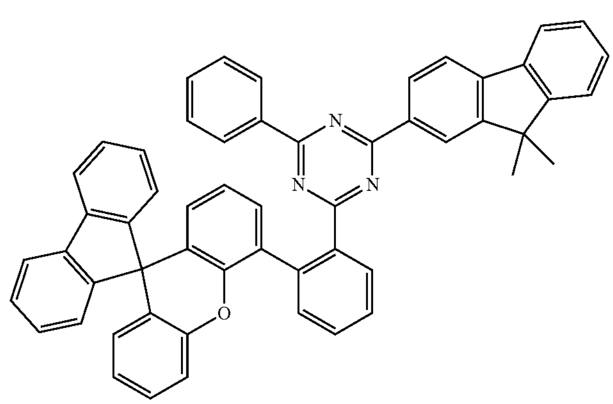

-continued
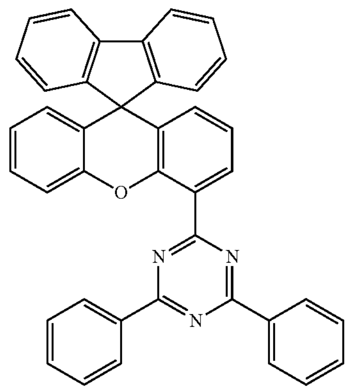
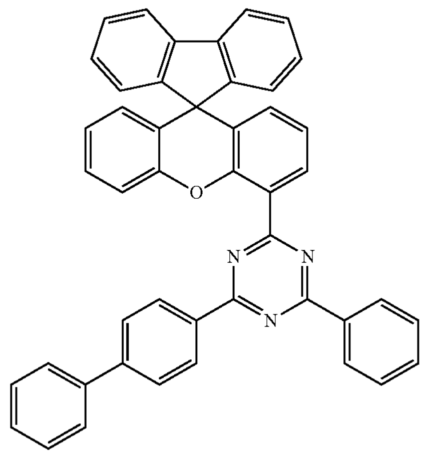
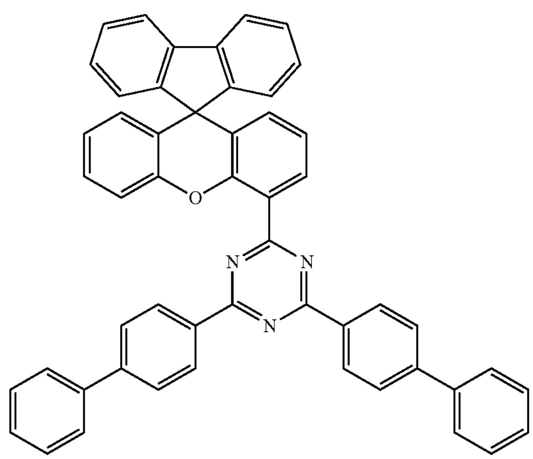
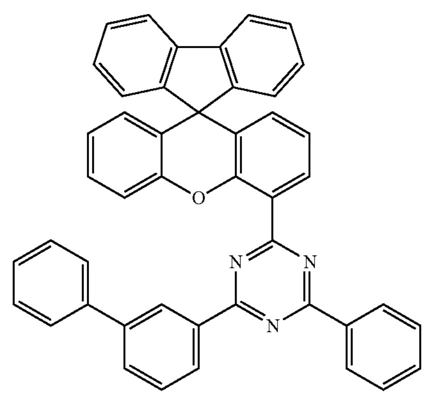
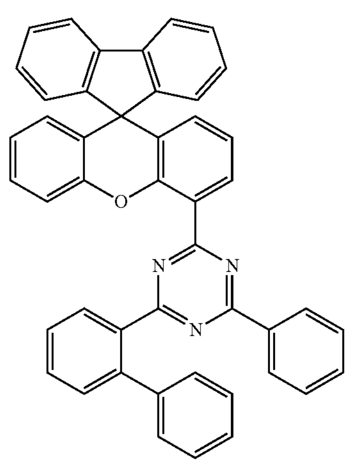
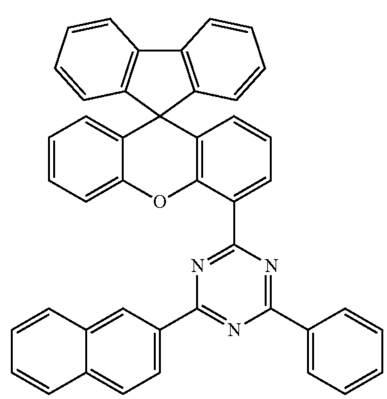
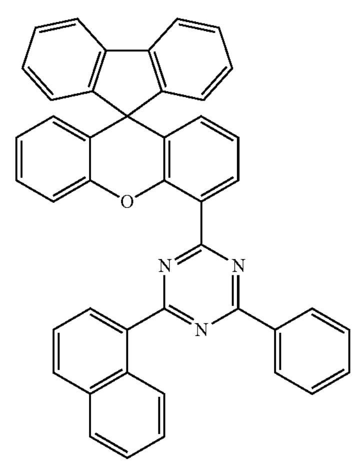

-continued
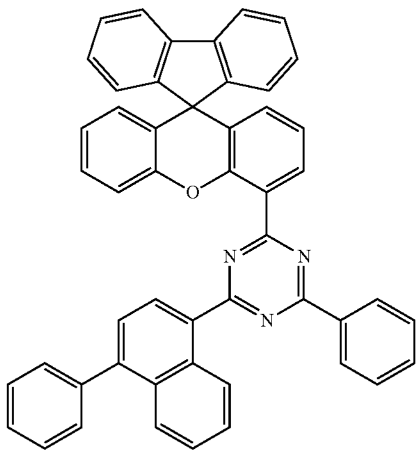
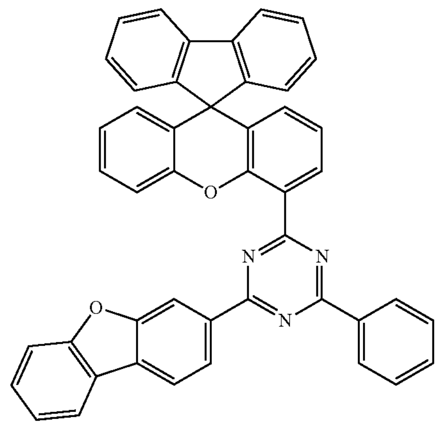
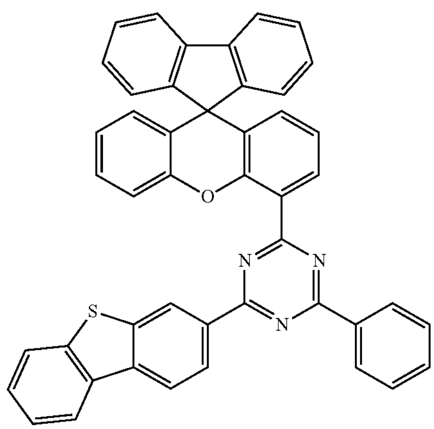
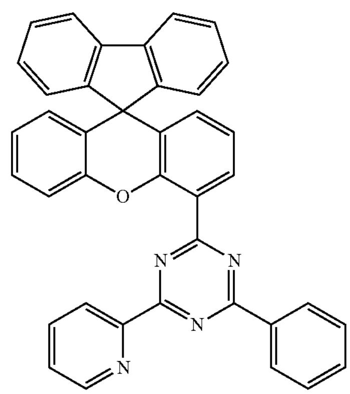
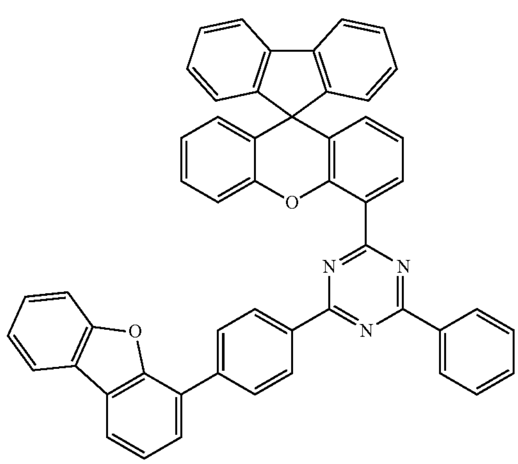
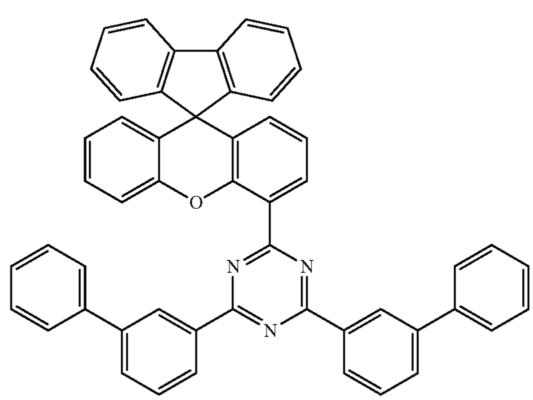

-continued

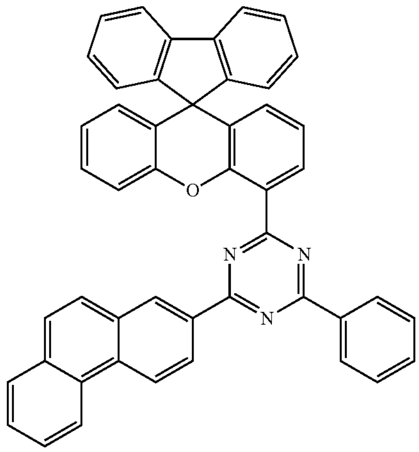

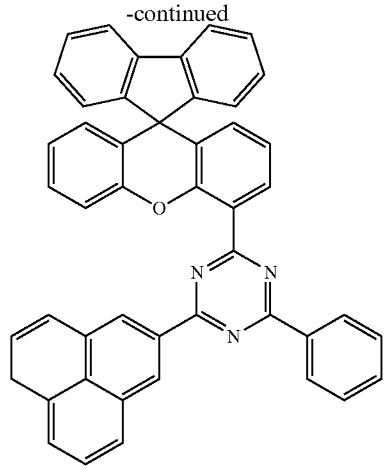

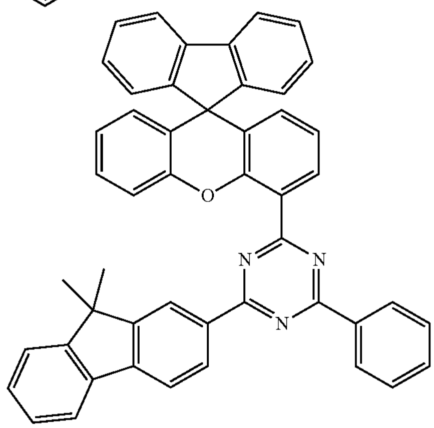

According to one embodiment of the present disclosure, the first organic material layer is a light emitting layer, the light emitting layer includes the compound of Chemical Formula 1 described above, and a maximum light emission peak of the light emitting layer is from 400 nm to 500 nm.

According to one embodiment of the present disclosure, the organic light emitting device further includes one or more light emitting layers. The one or more light emitting layers may each include the fluorescent dopant or the phosphorescent dopant described above.

According to another embodiment, the organic light emitting device further includes one or more light emitting layers having a maximum light emission peak appearing in a wavelength range different from a wavelength range of a maximum light emission peak that the light emitting layer including one or more types of the compound of Chemical Formula 1 has. Herein, a maximum light emission peak of the light emitting layer including one or more types of the compound of Chemical Formula 1 is from 400 nm to 500 nm, and the one or more light emitting layers having a maximum light emission peak appearing in a wavelength range different from a wavelength range of a maximum light emission peak that the light emitting layer including one or more types of the compound of Chemical Formula 1 has may have a maximum light emission peak appearing at 510 nm to 580 nm; or 610 nm to 680 nm.

According to one embodiment of the present disclosure, the first organic material layer of the organic light emitting device is a light emitting layer, the light emitting layer includes the compound of Chemical Formula 1 described above and further includes a fluorescent dopant, the organic light emitting device further includes one or more light emitting layers, and the one or more light emitting layers include a phosphorescent dopant.

In another embodiment, the organic light emitting device includes one or more light emitting layers having a maximum light emission peak appearing in a wavelength range that is the same as a wavelength range of a maximum light emission peak that the light emitting layer including one or more types of the compound of Chemical Formula 1 has. Herein, a maximum light emission peak of the light emitting layer is from 400 nm to 500 nm.

According to one embodiment of the present disclosure, the first organic material layer of the organic light emitting device is a light emitting layer, the light emitting layer includes the compound of Chemical Formula 1 described above and further includes a fluorescent dopant, the organic light emitting device further includes one or more light emitting layers, and the one or more light emitting layers include a fluorescent dopant.

In addition, when the organic light emitting device of the present disclosure includes two or more light emitting layers, the two or more light emitting layers may be consecutively laminated in a vertical direction, or may be laminated side by side in a horizontal direction.

FIGS. 1 to 4 each illustrate a laminated structure of the organic light emitting device of the present disclosure including two or more light emitting layers.

FIG. 1 illustrates the organic light emitting device in which a substrate (0), a cathode (1), an electron transfer layer (2), a hole blocking layer or an electron control layer (7), a light emitting layer (101), a hole transfer layer (3) and an anode (4) are consecutively laminated, and, as the light emitting layer (101), a light emitting layer 1 (11) and a light emitting layer 2 (12) are laminated side by side in a horizontal direction.

FIG. 2 illustrates the organic light emitting device in which a substrate (0), a cathode (1), an electron transfer layer (2), a hole blocking layer or an electron control layer (7), a light emitting layer 1 (11), an organic material layer (5), a light emitting layer 2 (12), a hole transfer layer (3) and an anode (4) are consecutively laminated in a vertical direction.

FIG. 3 illustrates the organic light emitting device in which a substrate (0), a cathode (1), an electron transfer layer (2), a hole blocking layer or an electron control layer (7), a light emitting layer 1 (11), an organic material layer (5), a light emitting layer 2 (12), an organic material layer (6), a light emitting layer 3 (13), a hole transfer layer (3) and an anode (4) are consecutively laminated in a vertical direction.

FIG. 4 illustrates the organic light emitting device in which a substrate (0), an anode (4), a hole injection layer (102), a hole transfer layer (103), a light emitting layer (101), a hole blocking layer or an electron control layer (104), an electron injection and transfer layer (105) and a cathode (1) are consecutively laminated in a vertical direction.

Compounds having various energy band gaps may be synthesized in the present disclosure by introducing various substituents to the core structures of Chemical Formula 1 and Chemical Formula 2. In addition, HOMO and LUMO energy levels of the compound may also be controlled in the present disclosure by introducing various substituents to the core structures having structures as above.

The organic light emitting device of the present disclosure may be manufactured using common organic light emitting device manufacturing methods and materials except that the first organic material layer is formed using the compound of Chemical Formula 1 described above, and the second organic material layer is formed using the compound of Chemical Formula 2 described above.

When manufacturing an organic light emitting device in which the first organic material layer including the compound of Chemical Formula 1 and the second organic material layer including the compound of Chemical Formula 2 are formed, a solution coating method may be used as well as a vacuum deposition method when forming the organic material layer. Herein, the solution coating method means spin coating, dip coating, inkjet printing, screen printing, a spray method, roll coating and the like, but is not limited thereto.

The organic light emitting device of the present disclosure may be formed with one or more organic material layers among a hole transfer layer, a hole injection layer, an electron blocking layer, a hole control layer, a layer carrying out hole transfer and hole injection at the same time, a light emitting layer, an electron injection layer, an electron transfer layer, a hole blocking layer, an electron control layer, and a layer carrying out electron transfer and electron injection at the same time, and the first organic material layer is a light emitting layer and the second organic material layer is a hole blocking layer and/or an electron control layer. However, a structure of the organic light emitting device of the present specification is not limited thereto, and may include a larger number of organic material layers.

In one embodiment of the present specification, the first electrode is an anode, and the second electrode is a cathode.

According to another embodiment, the first electrode is a cathode, and the second electrode is an anode.

The organic light emitting device according to the present disclosure may be manufactured by forming an anode on a substrate by depositing a metal, a metal oxide having conductivity, or an alloy thereof using a physical vapor deposition (PVD) method such as sputtering or e-beam evaporation, forming an organic material layer including one or more layers formed with a hole injection layer, a hole transfer layer, a light emitting layer, an electron blocking layer, an electron transfer layer, a layer carrying out hole transfer and hole injection at the same time, a hole blocking layer, a layer carrying out electron transfer and electron injection at the same time, and an electron injection layer, and then depositing a material capable of being used as a cathode thereon. In addition to such a method, the organic light emitting device may also be manufactured by consecutively depositing a cathode material, an organic material layer and an anode material on a substrate.

The organic material layer may have a multilayer structure including a hole injection layer, a hole transfer layer, a layer carrying out hole injection and hole transfer at the same time, an electron blocking layer, a hole blocking layer, a light emitting layer, an electron transfer layer, an electron injection layer, a layer carrying out electron injection and electron transfer at the same time and the like, but is not limited thereto, and may have a single layer structure.

The anode is an electrode injecting holes, and as the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly [3,4-(ethylene-1,2-dioxy)thiophene] (PEDOT), polypyrrole and polyaniline, but are not limited thereto.

The cathode is an electrode injecting electrons, and as the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto. In addition, the cathode may be formed in one or two layers.

In the organic light emitting device of the present disclosure, the organic material layer may include an electron blocking layer, and as the electron blocking layer, materials known in the art may be used.

The hole injection layer is a layer performing a role of smoothly injecting holes from an anode to a light emitting layer, and the hole injection material is a material capable of favorably receiving holes from an anode at a low voltage. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer may perform a role of smoothly transferring holes. As the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

In the present disclosure, the light emitting layer may emit blue, green or red light, may be formed with a phosphorescent material or a fluorescent material, and the light emitting layer includes a host and a dopant.

The host of the light emitting layer may include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, carbazole derivatives, dibenzofuran derivatives, ladder-type furan compounds, pyrimidine derivatives and the like may be included, however, the host material is not limited thereto, and the compound of Chemical Formula 1 described above may be used.

When the light emitting layer emits red light, phosphorescent materials such as bis(1-phenylisoquinoline)acetylacetonate iridium (PIQIr(acac)), bis(1-phenylquinoline)acetylacetonate iridium (PQIr(acac)), tris(1-phenylquinoline) iridium (PQIr) or octaethylporphyrin platinum (PtOEP), or fluorescent materials such as tris(8-hydroxyquinolino)aluminum ($Alq_3$) may be used as the light emitting dopant, however, the light emitting dopant is not limited thereto. When the light emitting layer emits green light, phosphorescent materials such as fac tris(2-phenylpyridine)iridium ($Ir(ppy)_3$), or fluorescent materials such as tris(8-hydroxyquinolino)aluminum ($Alq_3$) may be used as the light emitting dopant, however, the light emitting dopant is not limited thereto. When the light emitting layer emits blue light, phosphorescent materials such as $(4,6\text{-}F2ppy)_2Irpic$, or fluorescent materials such as spiro-DPVBi, spiro-6P, distyrylbenzene (DSB), distyrylarylene (DSA), PFO-based polymers or PPV-based polymers may be used as the light emitting dopant, however, the light emitting dopant is not limited thereto.

The electron transfer layer may perform a role of smoothly transferring electrons. As the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto.

The electron injection layer may perform a role of smoothly injecting electrons. As the electron injection material, compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis (10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, may be provided between an electron transfer layer and a light emitting layer, and may be generally formed under the same condition as a hole injection layer. Specific examples thereof may include oxadiazole derivatives, triazole derivatives, phenanthroline derivatives, BCP, aluminum complexes and the like, however, the compound of Chemical Formula 2 described above may be used.

The electron control layer is a layer controlling electron migration to a light emitting layer, and materials known in the art may be used, and the compound of Chemical Formula 2 described above may be used.

The hole control layer is a layer controlling hole migration to a light emitting layer, and materials known in the art may be used.

The organic light emitting device according to the present disclosure may be a top-emission type, a bottom-emission type or a dual-emission type depending on the materials used.

EXEMPLARY EMBODIMENTS

Hereinafter, the present specification will be described in detail with reference to examples. However, the examples according to the present specification may be modified to various other forms, and the scope of the present application is not to be construed as being limited to the examples described below. Examples of the present application are provided in order to more fully describe the present specification to those having average knowledge in the art.

Synthesis Example

The following compounds 2-1 to 2-7 were prepared in reference with methods described in Korean Patent Nos. 10-1593368 and 10-1755986.

2-1

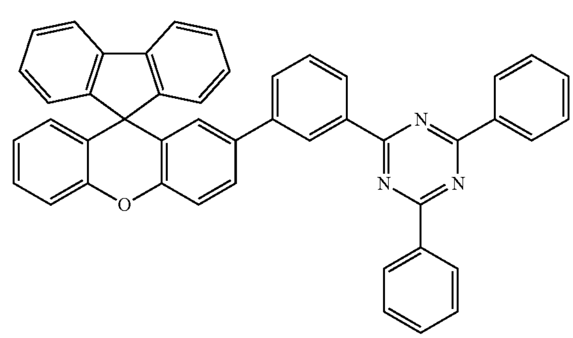

-continued
2-2
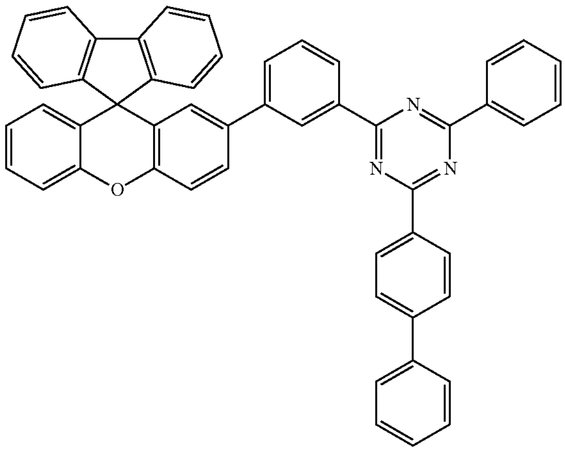
2-3
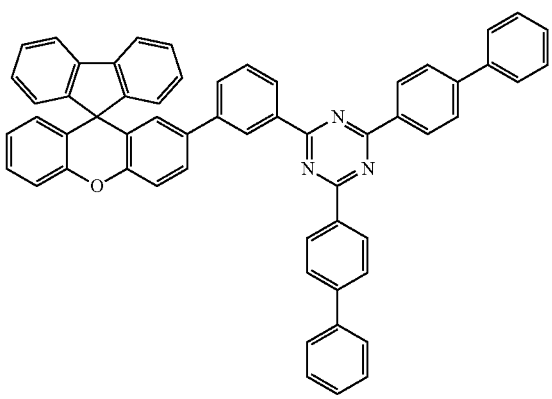
2-4
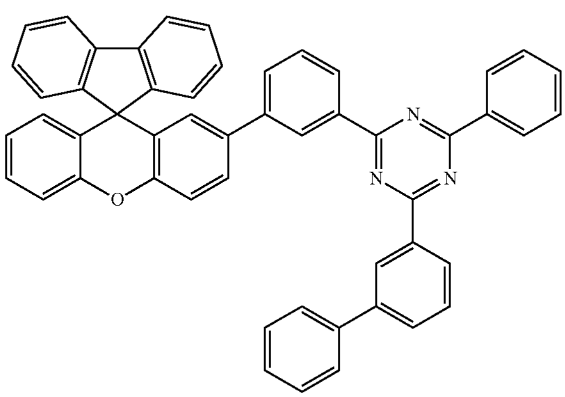
-continued
2-5
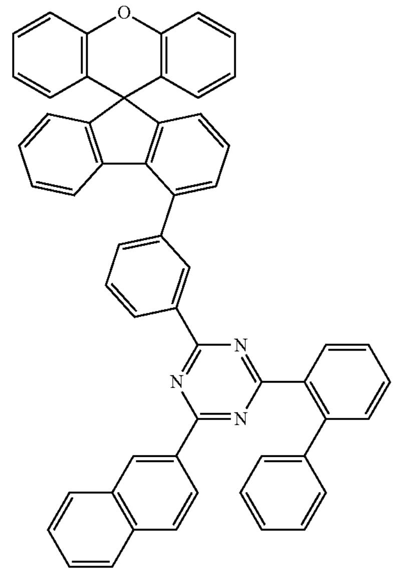
2-6
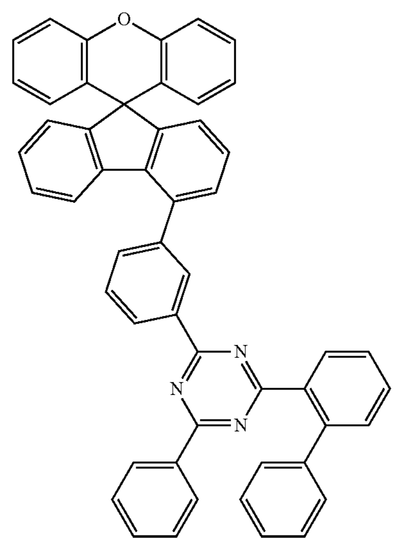
2-7
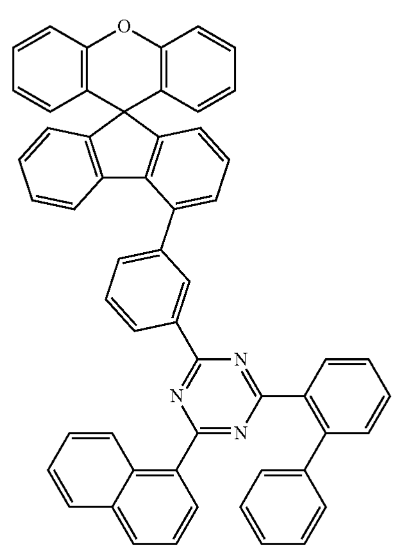

Example and Comparative Example

Example 1-1

A glass substrate (corning 7059 glass) on which indium tin oxide (ITO) was coated as a thin film to a thickness of 1000 Å was placed in dispersant-dissolved distilled water and ultrasonic cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol in this order, and then dried.

On the transparent ITO electrode prepared as above, a hole injection layer was formed by thermal vacuum depositing hexanitrile hexaazatriphenylene (HAT-CN) to a thickness of 500 Å. After vacuum depositing HT1 (400 Å), a material transferring holes, thereon, a host BH1 compound and a dopant BD1 compound (weight ratio of BH1:BD1=97.5:2.5) were vacuum deposited to a thickness of 300 Å thereon as a light emitting layer. On the light emitting layer, Compound 2-1 of Example 1 of Table 1 was deposited to a thickness of 50 Å as a hole blocking layer (electron control layer), and then Compound ET1 and lithium quinolate (LiQ) were vacuum deposited in a weight ratio of 1:1 to form an electron injection and transfer layer to a thickness of 350 Å. On the electron injection and transfer layer, a cathode was formed by consecutively depositing lithium fluoride (LiF) and aluminum to a thickness of 12 Å and 2,000 Å, respectively, and as a result, an organic light emitting device was manufactured.

In the above-mentioned process, the deposition rates of the organic materials were maintained at 0.4 Å/sec to 0.7 Å/sec, the deposition rates of the lithium fluoride and the aluminum of the cathode were maintained at 0.3 Å/sec and 2 Å/sec, respectively, and the degree of vacuum during the deposition was maintained at $2\times10^{-7}$ torr to $5\times10^{-6}$ torr.

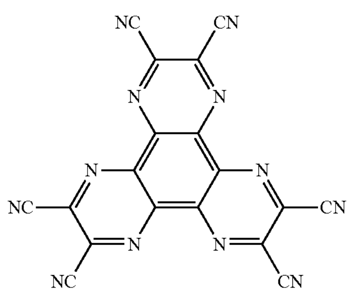

HAT-CN

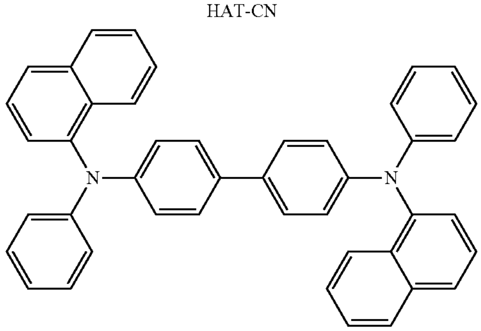

HT1

-continued

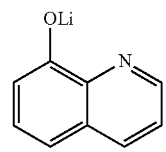

LiQ

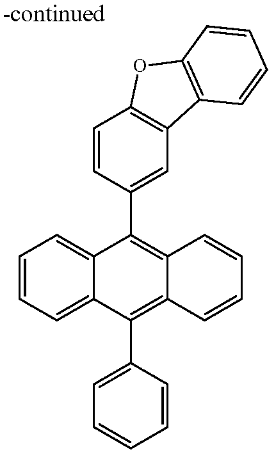

BH1

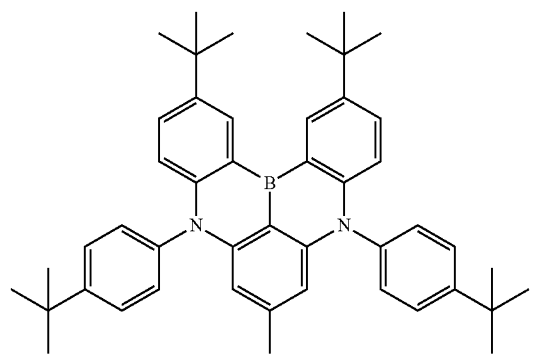

BD1

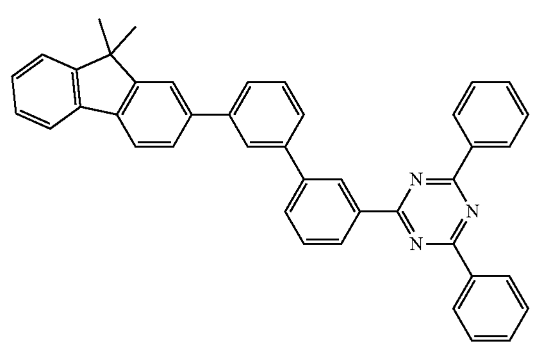

ET1

Examples 1-2 to 1-7

Organic light emitting devices were manufactured in the same manner as in Example 1-1 except that Compounds 2-2 to 2-7 were used instead of 2-1.

-continued
2-1
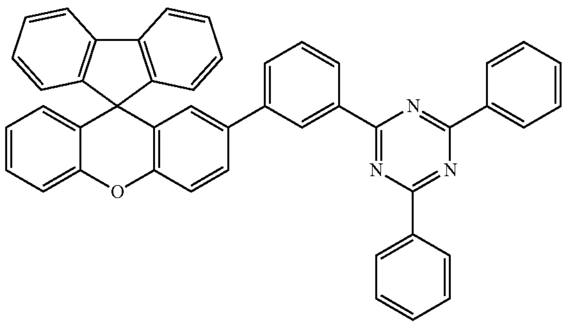
2-2
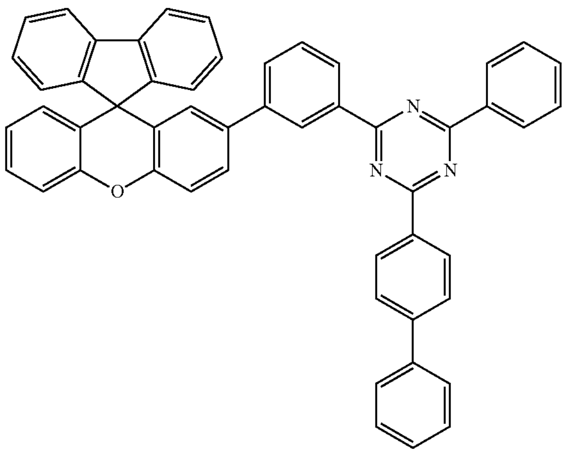
2-3
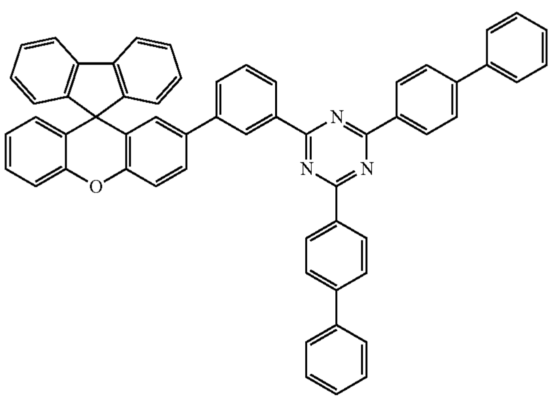
2-4
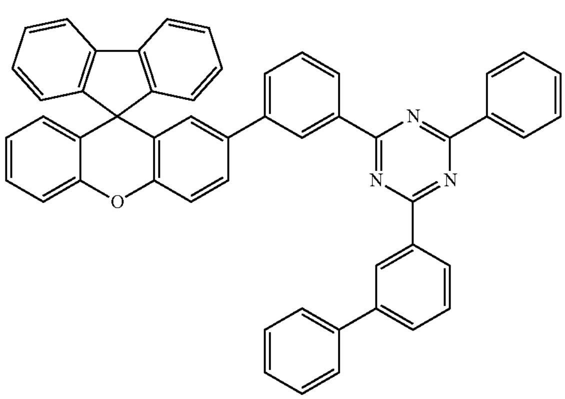
2-5
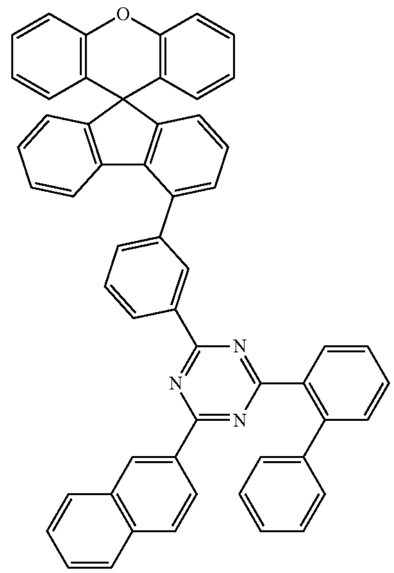
2-6
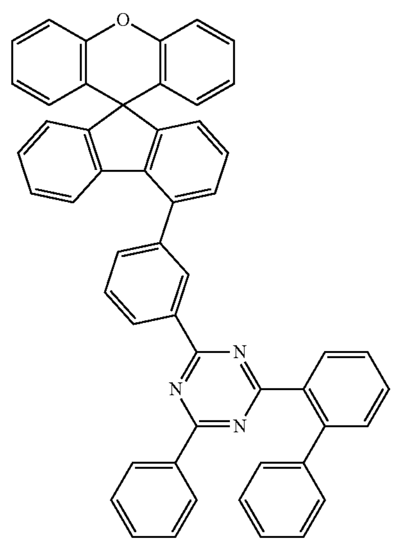
2-7
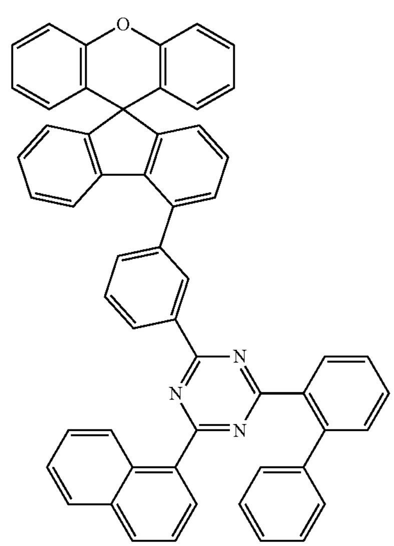

Examples 2-1 to 2-3

Organic light emitting devices were manufactured in the same manner as in Example 1-1 except that Compounds BH2 to BH4 were used instead of Compound BH1.

BH2

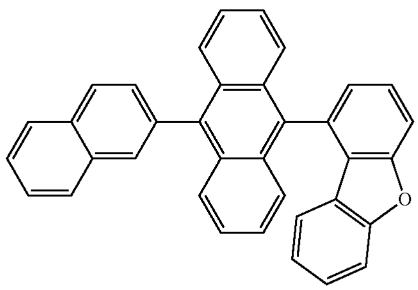

BH3

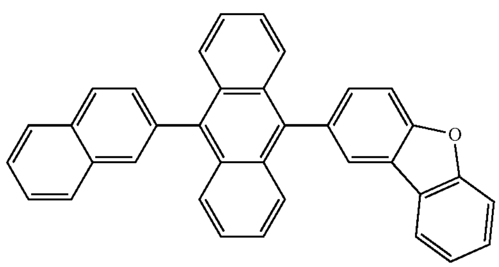

BH4

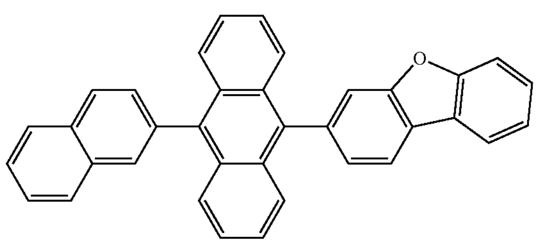

Comparative Examples 1 to 8

Organic light emitting devices were manufactured in the same manner as in Example 1-1 except that compounds of the following Table 1 were used instead of Compound BH1, and compounds of the following Table 1 were used instead of Compound 2-1.

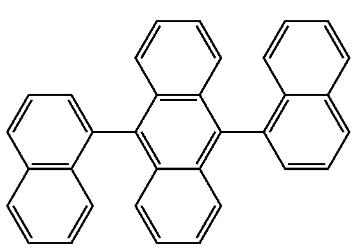

BH5

-continued

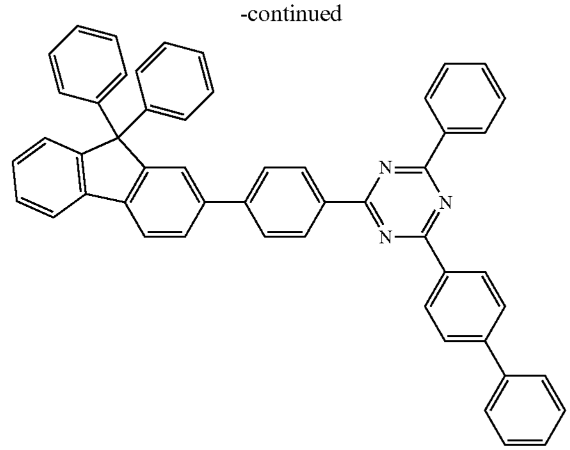

ET2

When applying a current of 10 mA/cm 2 to each of the organic light emitting devices manufactured in the examples and the comparative examples, voltage, efficiency and lifetime were measured, and the results are shown in the following Table 1. Meanwhile, LT98 means time taken for luminance decreasing to 98% from initial luminance.

TABLE 1

| | First Organic Material Layer (Light Emitting Layer Host) | Second Organic Material Layer (Hole Blocking Layer) | Voltage (V) | Efficiency (cd/A) | LT98 (hr) |
|---|---|---|---|---|---|
| Example 1-1 | BH1 | 2-1 | 3.74 | 5.25 | 49 |
| Example 1-2 | BH1 | 2-2 | 3.99 | 4.92 | 68 |
| Example 1-3 | BH1 | 2-3 | 3.92 | 5.12 | 58 |
| Example 1-4 | BH1 | 2-4 | 3.90 | 5.30 | 49 |
| Example 1-5 | BH1 | 2-5 | 4.12 | 4.77 | 76 |
| Example 1-6 | BH1 | 2-6 | 4.15 | 4.70 | 74 |
| Example 1-7 | BH1 | 2-7 | 4.01 | 5.31 | 59 |
| Example 2-1 | BH2 | 2-1 | 3.81 | 4.91 | 61 |
| Example 2-2 | BH3 | 2-1 | 4.11 | 4.50 | 65 |
| Example 2-3 | BH4 | 2-1 | 3.84 | 5.28 | 44 |
| Comparative Example 1 | BH1 | (No Second Organic Material Layer) | 5.45 | 2.58 | 22 |
| Comparative Example 2 | — | 2-1 | 5.29 | 3.20 | 32 |
| Comparative Example 3 | 2-1 | BH1 | 4.83 | 4.44 | 34 |
| Comparative Example 4 | BH5 | ET2 | 4.23 | 3.59 | 19 |
| Comparative Example 5 | ET2 | BH5 | 7.08 | 1.05 | 5 |
| Comparative Example 6 | BH1 | ET2 | 4.31 | 3.92 | 38 |
| Comparative Example 7 | BH5 | 2-1 | 4.31 | 4.45 | 20 |
| Comparative Example 8 | BH5 | 2-4 | 4.38 | 4.41 | 21 |

Examples 1-1 to 1-7 and 2-1 to 2-3 used the compound of Chemical Formula 1 of the present application in which dibenzofuran bonds to anthracene as a host of a light emitting layer, and used the compound of Chemical Formula 2 in which an N-including heterocyclic group bonds to spirofluorenexanthene in a hole blocking layer. Meanwhile, Comparative Examples 1 to 8 used an anthracene compound in which only an aryl group bonds thereto as a host of a light emitting layer instead of the compound of Chemical Formula 1 of the present application, or used a compound in which an N-including heterocyclic group bonds to diphenylfluorene as a material of a hole blocking layer instead of the compound of Chemical Formula 2 of the present application.

As shown in Table 1, Examples 1-1 to 1-7 and 2-1 to 2-3 had properties of low driving voltage, high efficiency and long lifetime compared to when using only one of the compounds of Chemical Formulae 1 and 2.

The invention claimed is:

1. An organic light emitting device comprising:

a first electrode;

a second electrode provided opposite to the first electrode; and a first organic material layer and a second organic material layer provided between the first electrode and the second electrode, wherein the first organic material layer includes a compound of the following Chemical Formula 1; and the second organic material layer includes a compound of the following Chemical Formula 2:

Chemical Formula 1

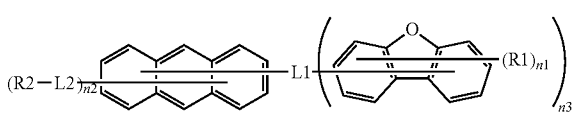

in Chemical Formula 1,

L1 and L2 are the same as or different from each other, and each independently a direct bond; or a substituted or unsubstituted arylene group;

R1 and R2 are the same as or different from each other, and each independently hydrogen; deuterium; a halogen group; a cyano group; a nitro group; a substituted or unsubstituted alkyl group; a substituted or unsubstituted haloalkyl group; a substituted or unsubstituted haloalkoxy group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring;

n1 is an integer of 0 to 7, and when n1 is 2 or greater, the two or more R1s are the same as or different from each other;

n2 is an integer of 0 to 9, and when n2 is 2 or greater, the two or more -L2-R2s are the same as or different from each other; and n3 is 1 or 2, and when n3 is 2, substituents in the two parentheses are the same as or different from each other, and $1 \leq n2+n3 \leq 10$, Chemical Formula 2

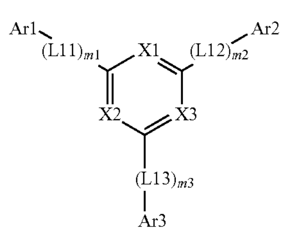

in Chemical Formula 2, at least one of X1 to X3 is N, and the rest are CR;

R and Ar1 to Ar3 are the same as or different from each other, and each independently hydrogen; deuterium; a cyano group; a nitrile group; a substituted or unsubstituted silyl group; a substituted or unsubstituted alkyl group; a substituted or unsubstituted haloalkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring, and at least one of Ar1 to Ar3 is of the following Chemical Formula 3;

L11 to L13 are the same as or different from each other, and each independently a direct bond; a substituted or unsubstituted arylene group; or a substituted or unsubstituted divalent heterocyclic group; and m1 to m3 are each an integer of 0 to 3, and when m1 to m3 are each 2 or greater, substituents in the two or more parentheses are the same as or different from each other, Chemical Formula 3

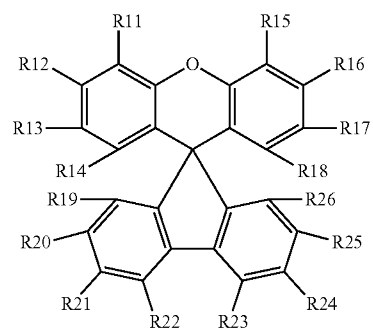

in Chemical Formula 3, any one of R11 to R26 is linked to any one of L11 to L13, and the rest are hydrogen; deuterium; a cyano group; a nitrile group; a substituted or unsubstituted alkyl group; a substituted or unsubstituted cycloalkyl group; a substituted or unsubstituted alkenyl group; a substituted or unsubstituted aryl group; or a substituted or unsubstituted heterocyclic group, or bond to adjacent groups to form a substituted or unsubstituted ring.

2. The organic light emitting device of claim 1, wherein the first organic material layer and the second organic material layer are provided adjacent to each other.

3. The organic light emitting device of claim 1, wherein the first organic material layer is a light emitting layer.

4. The organic light emitting device of claim 3, wherein the light emitting layer includes one or more types of the compound of Chemical Formula 1 as a host of the light emitting layer.

5. The organic light emitting device of claim 1, wherein the second organic material layer is a hole blocking layer or an electron control layer.

6. The organic light emitting device of claim 1, wherein the compound of Chemical Formula 1 is selected from among the following structures:

-continued
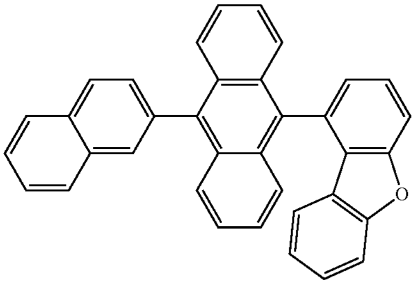
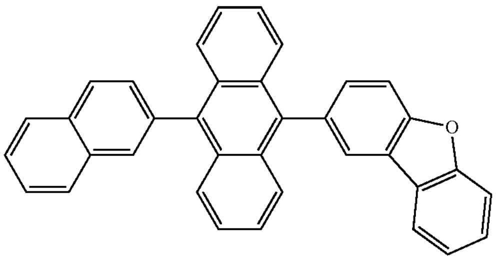
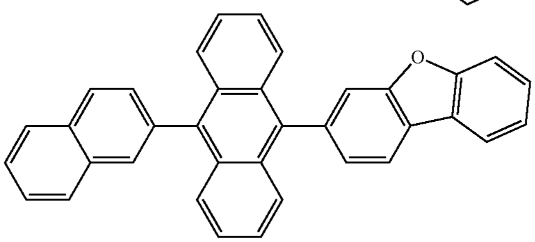
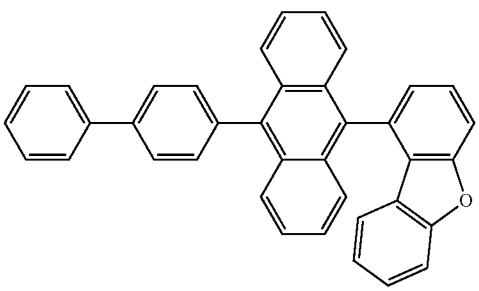
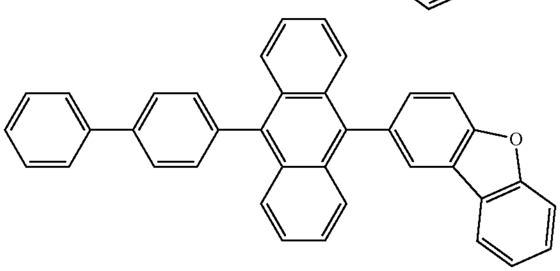
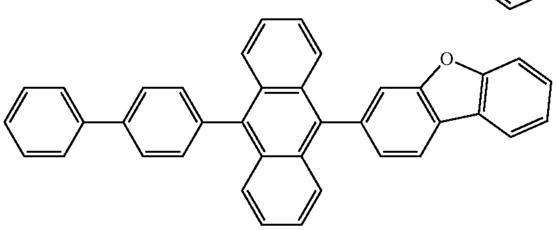
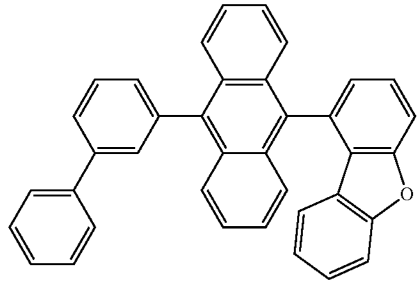
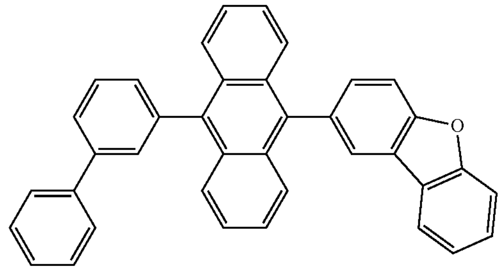
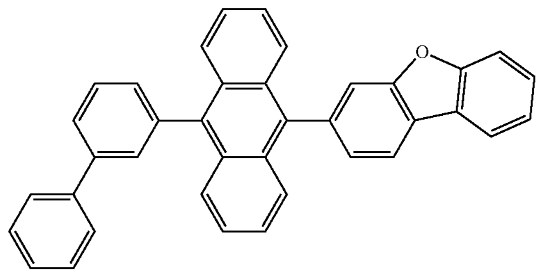
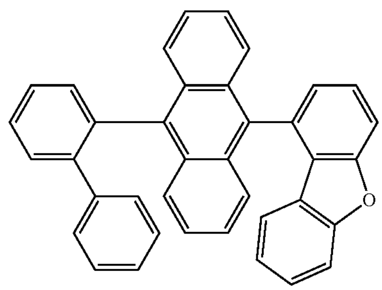
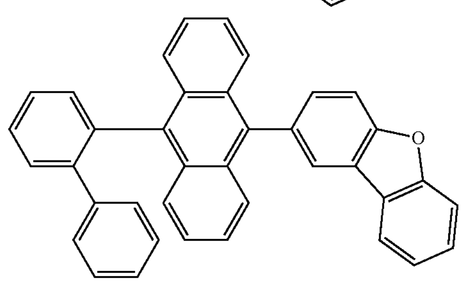
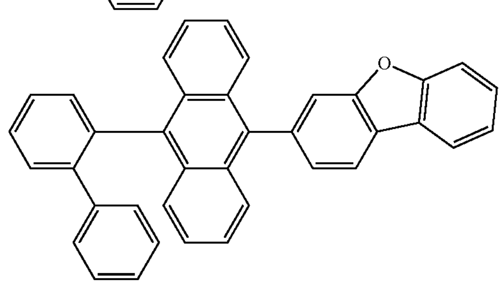

-continued
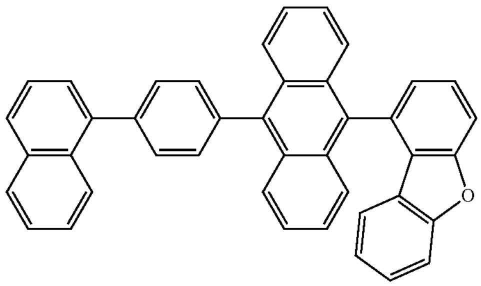
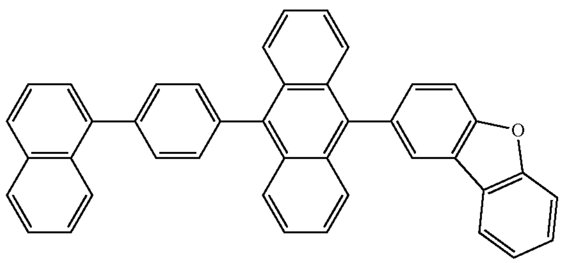
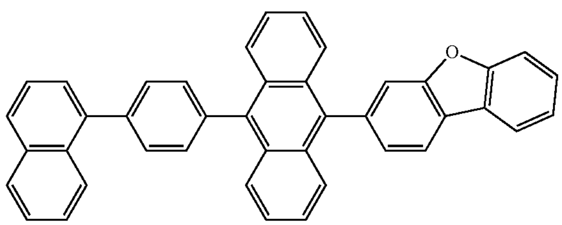
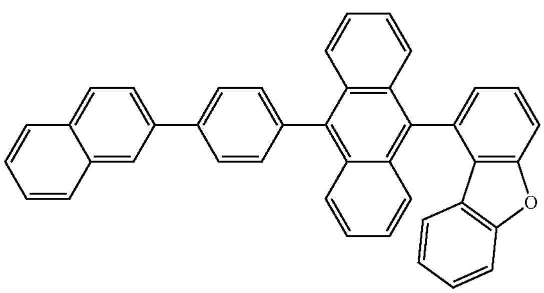
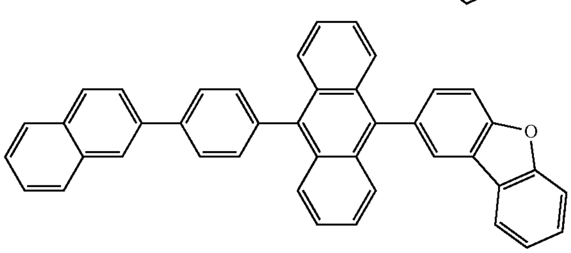
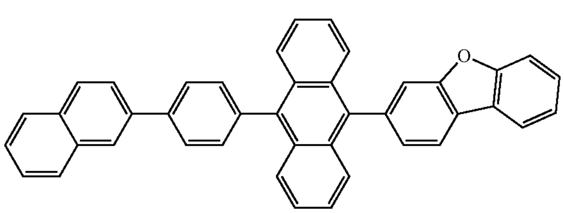
-continued
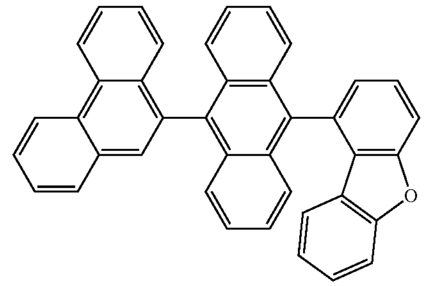
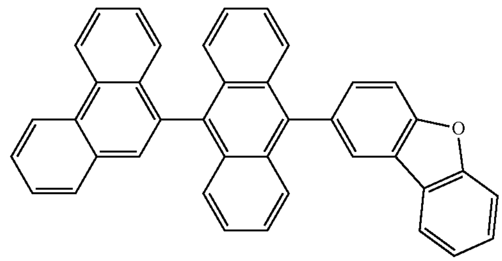
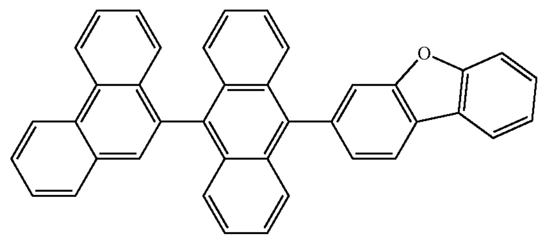
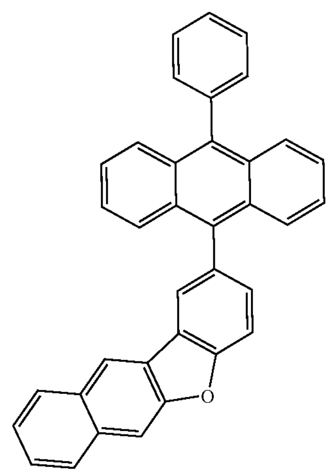
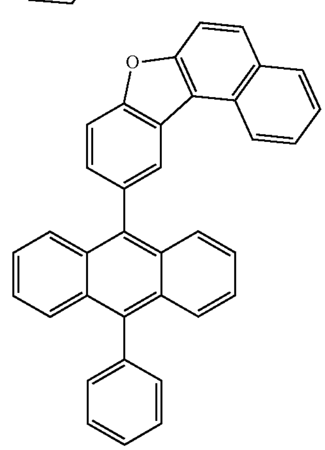

-continued
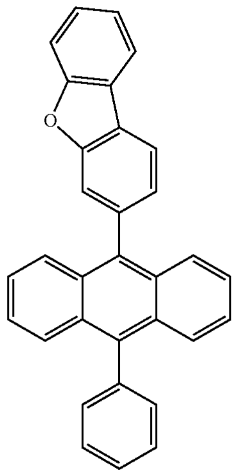
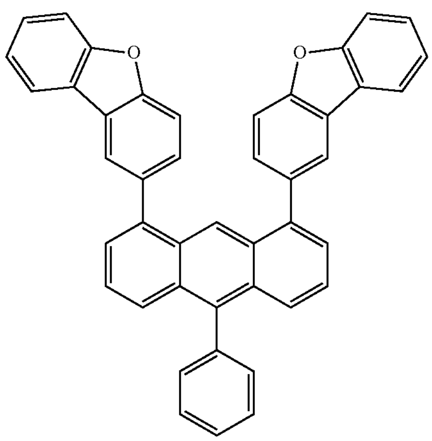
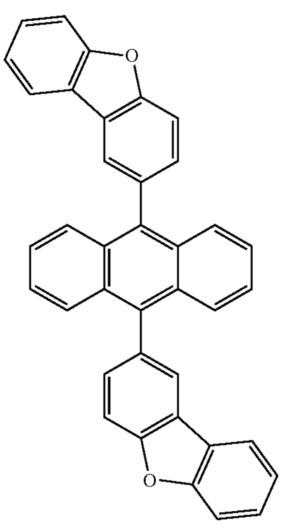
-continued
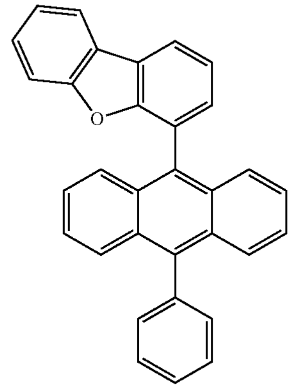
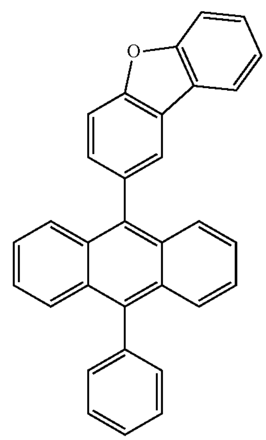
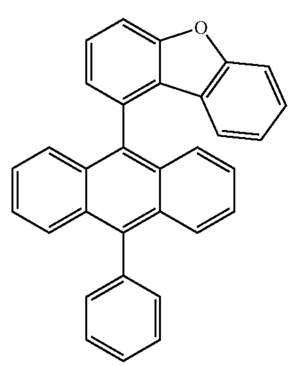

-continued
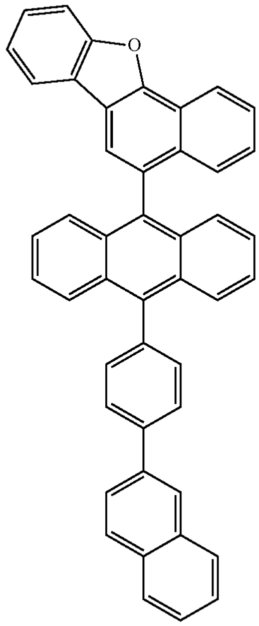
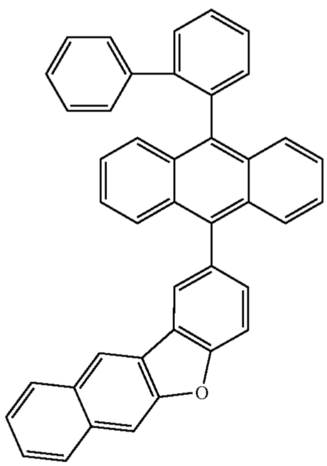
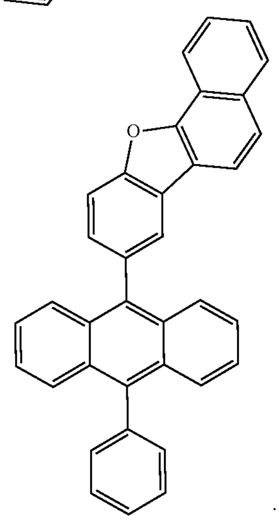
7. The organic light emitting device of claim 1, wherein the compound of Chemical Formula 2 is selected from among the following structures:
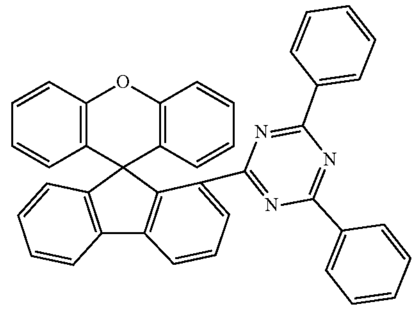
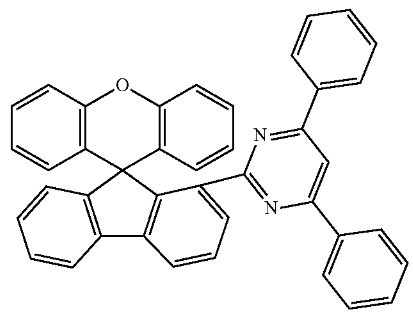
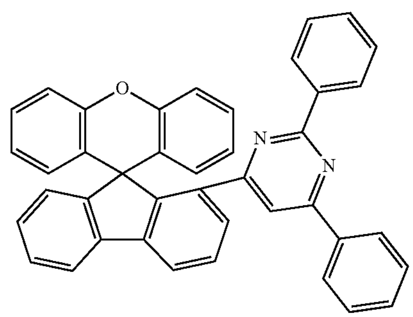
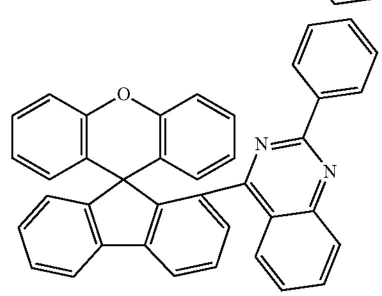
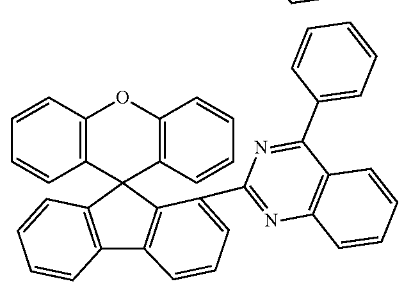

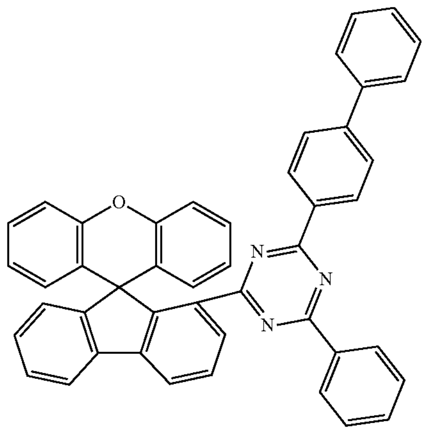
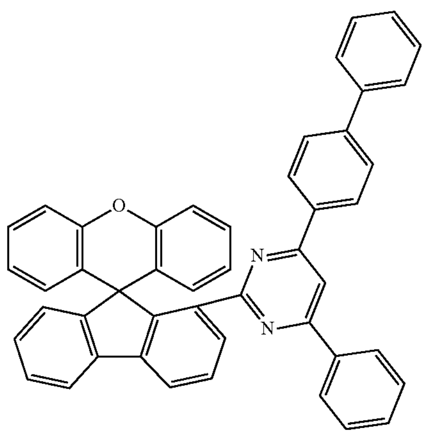
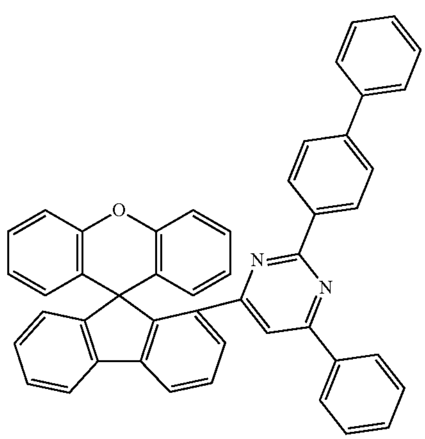
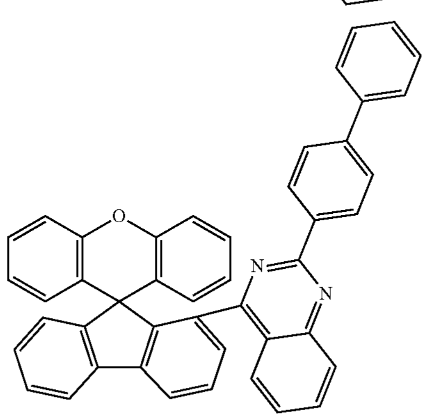
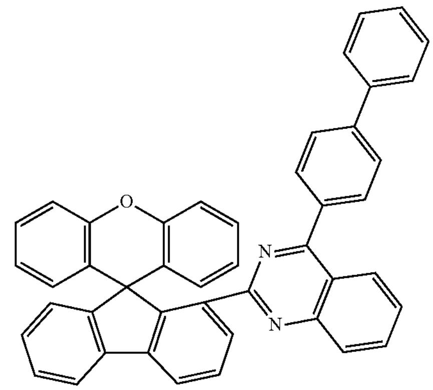
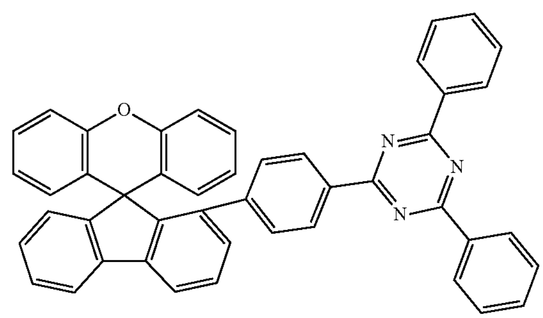
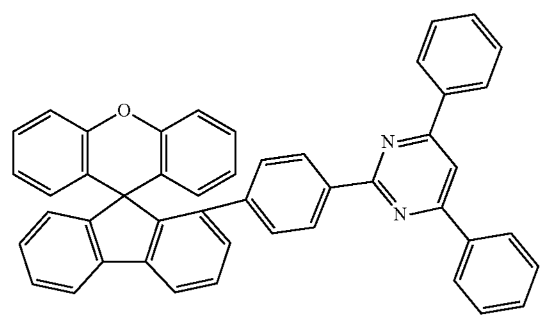
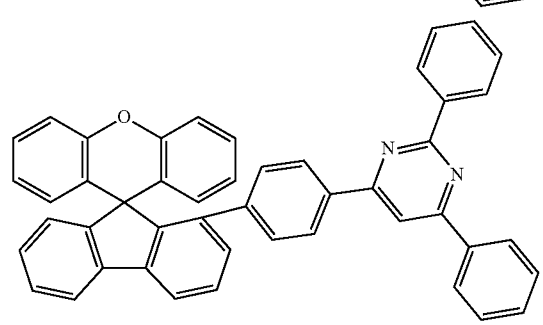
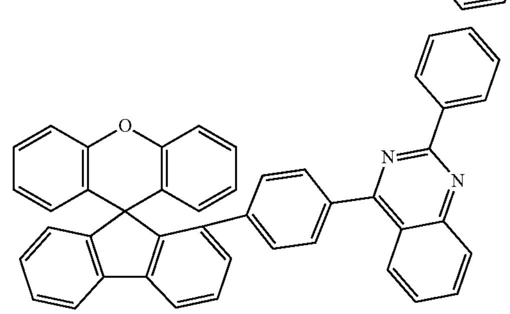

-continued
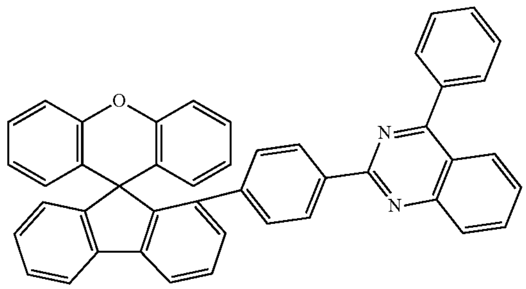
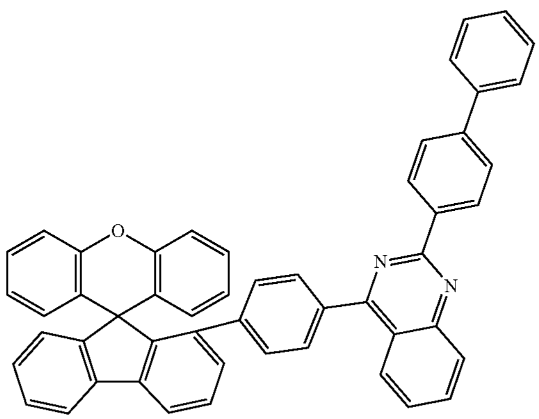
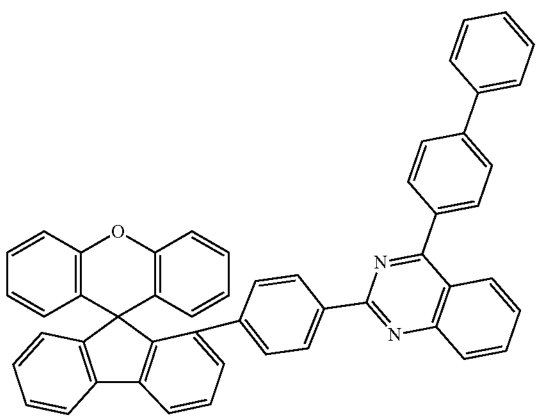
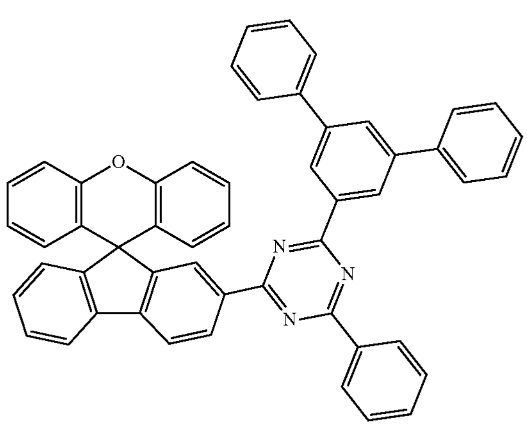
-continued
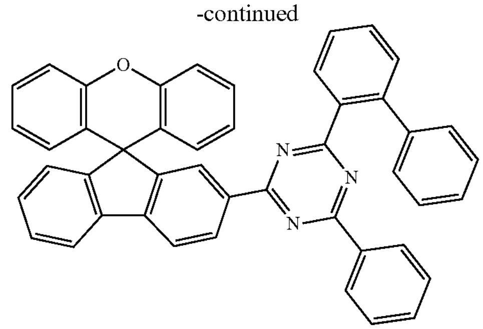
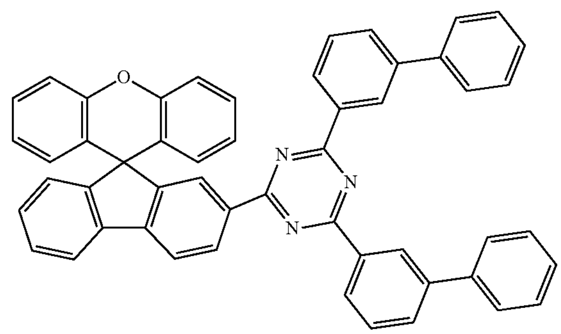
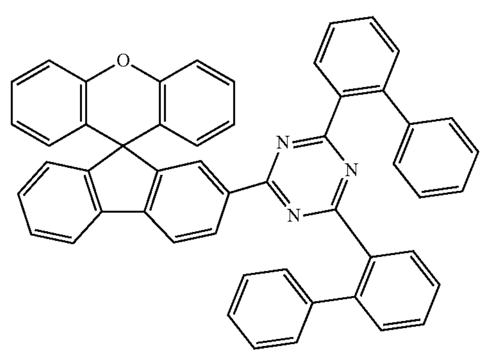
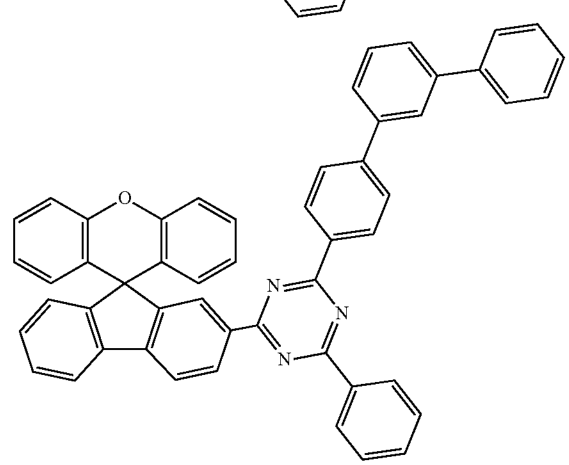

-continued
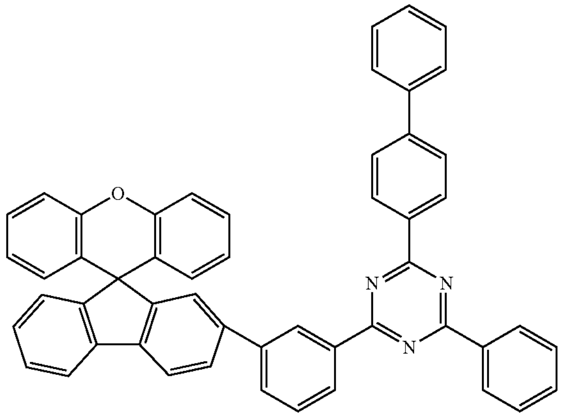
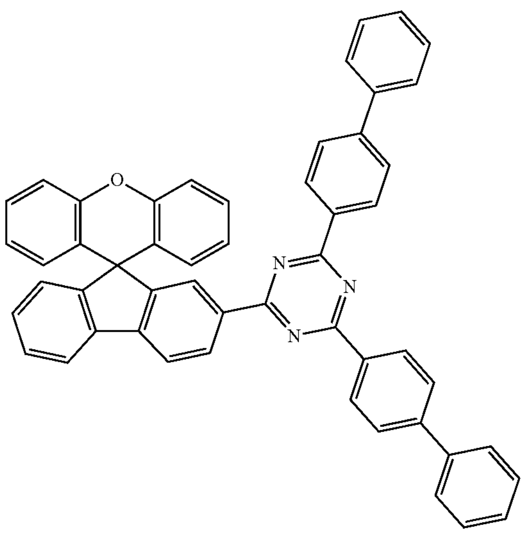
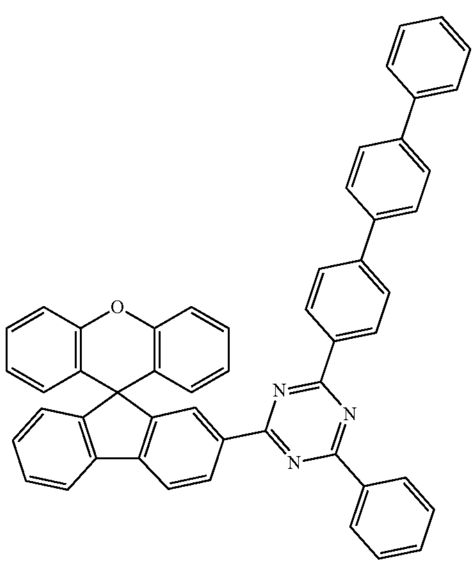
-continued
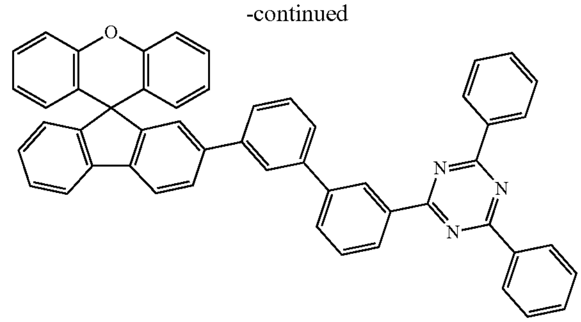
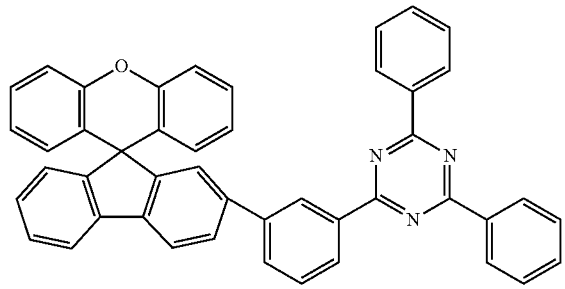
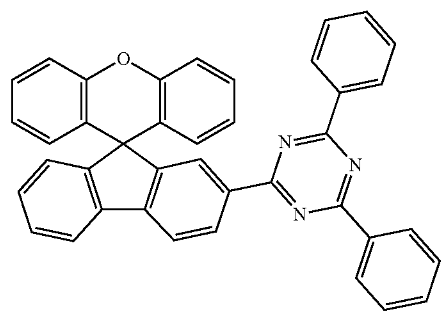
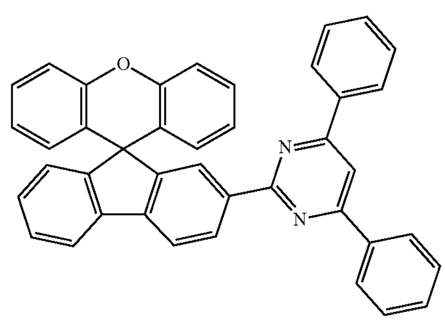
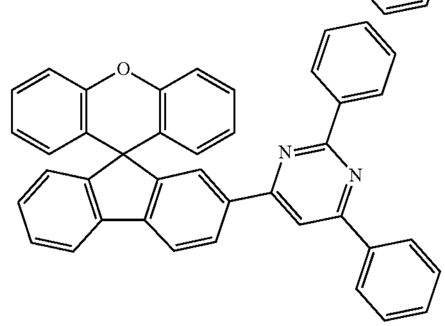

-continued
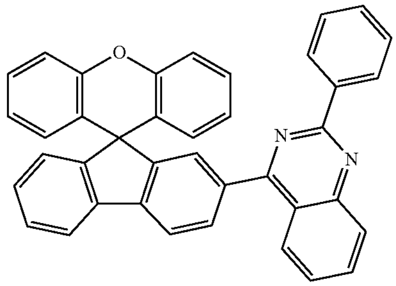
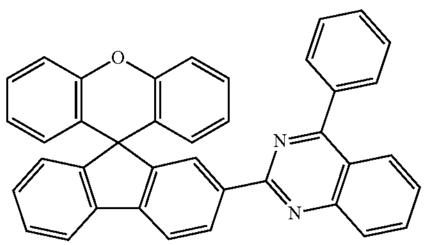
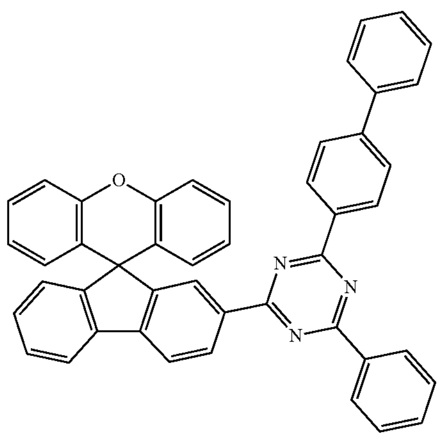
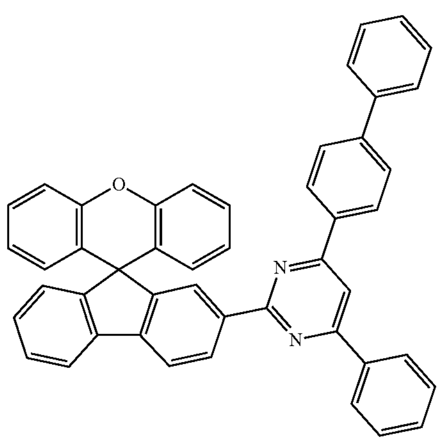
-continued
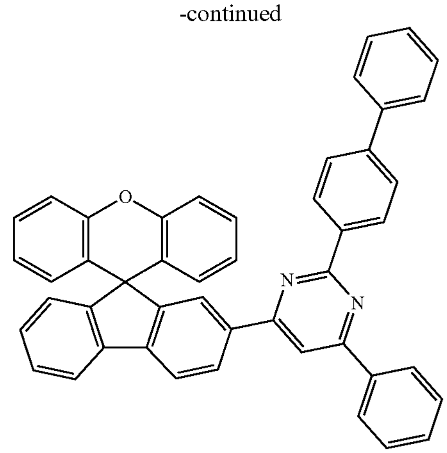
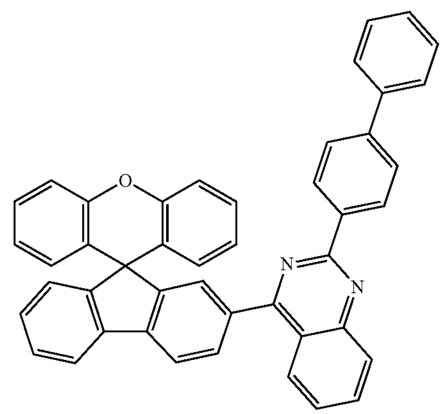
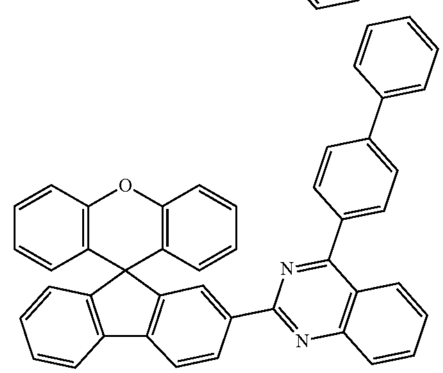
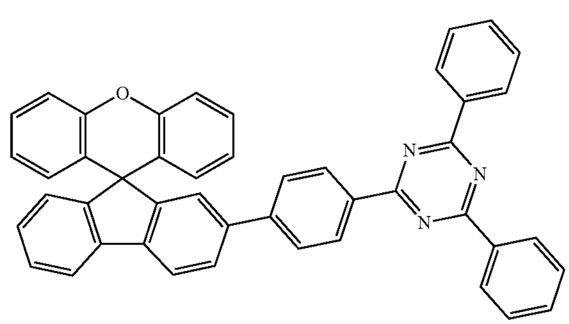

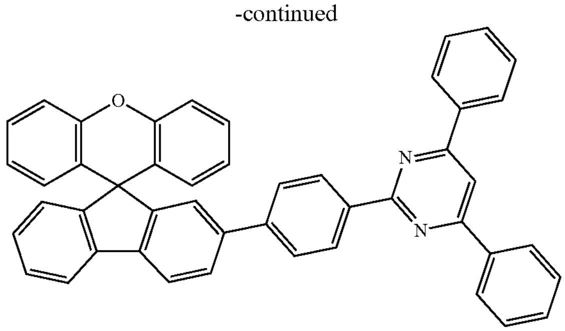
O
N
N
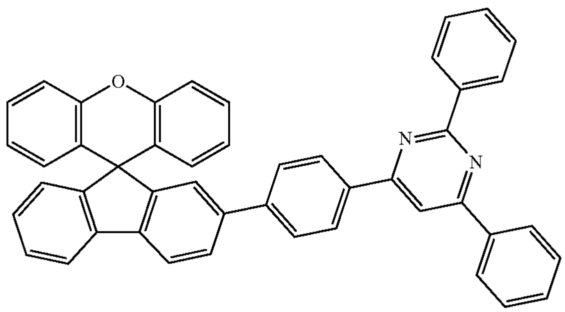
O
N
N
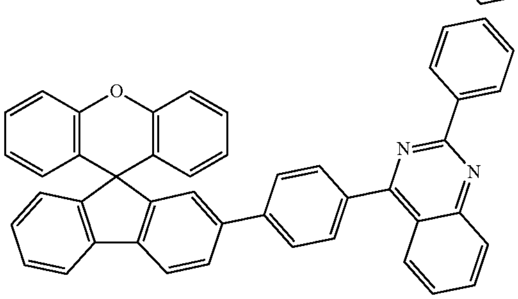
O
N
N
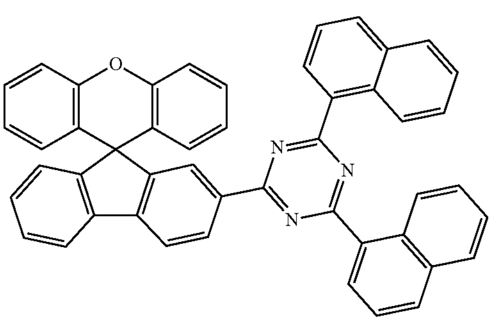
O
N
N
N
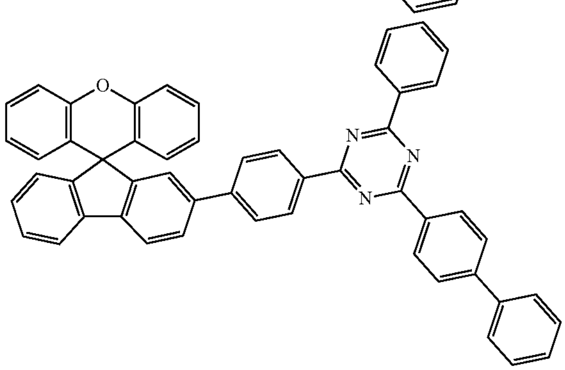
O
N
N
N
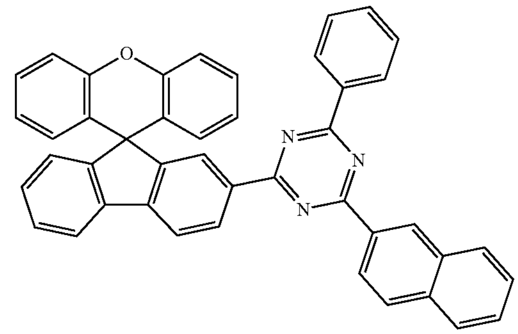
O
N
N
N
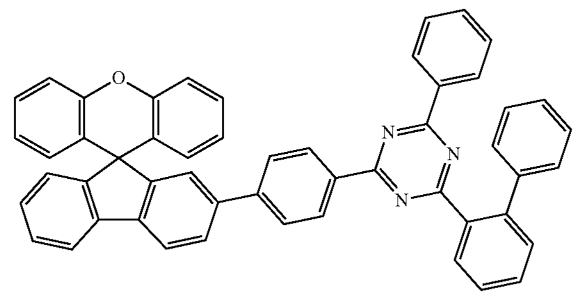
O
N
N
N
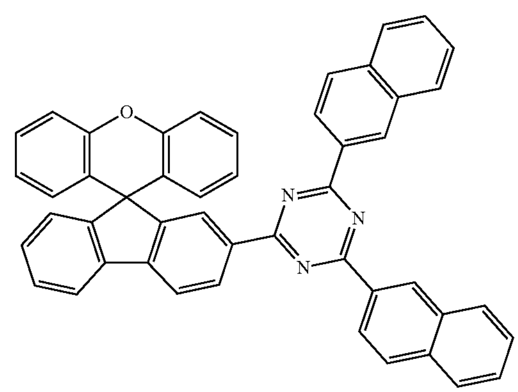
O
N
N
N
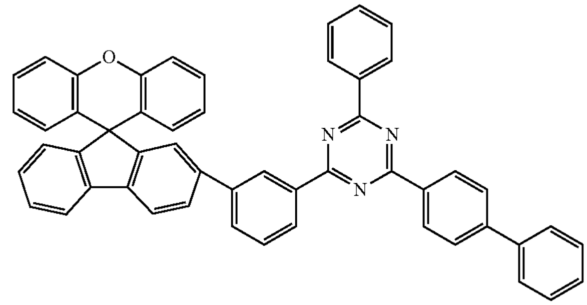
O
N
N
N -continued
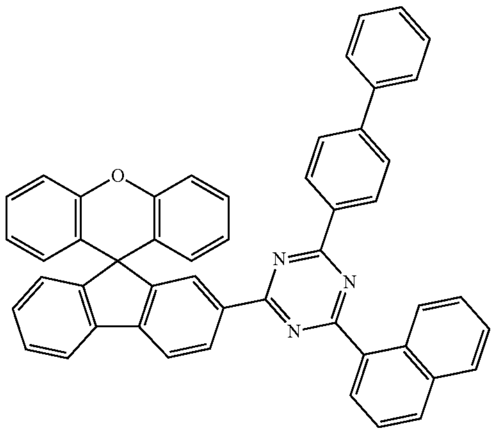
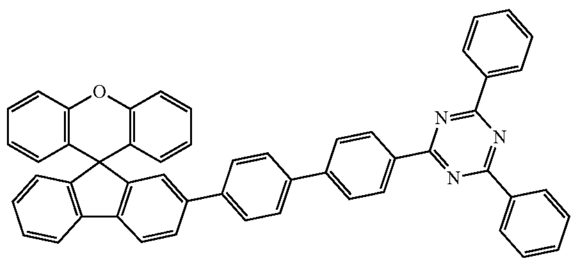
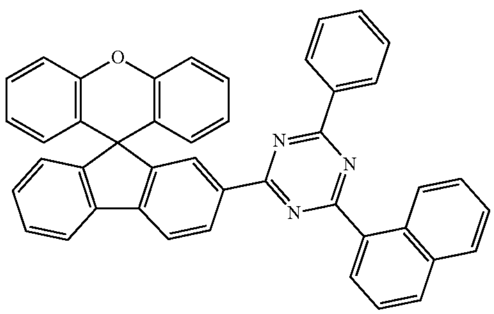
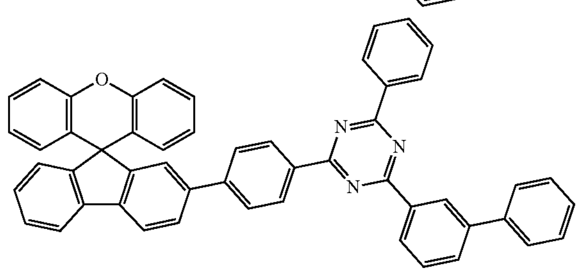
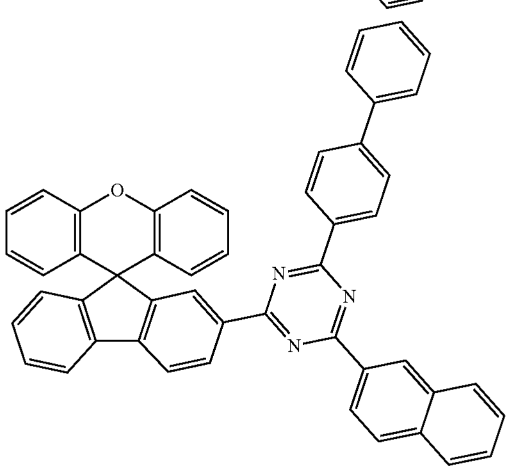
-continued
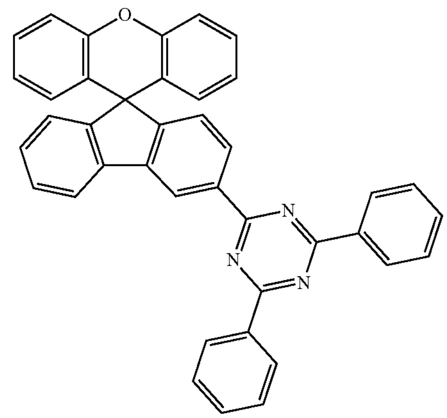
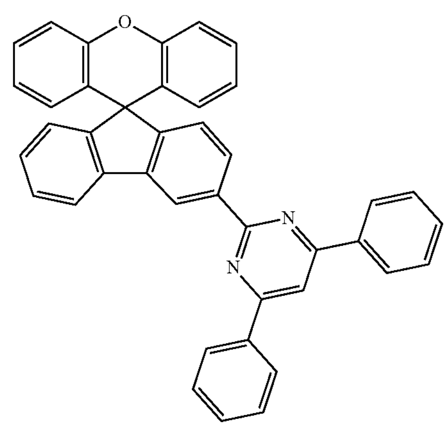
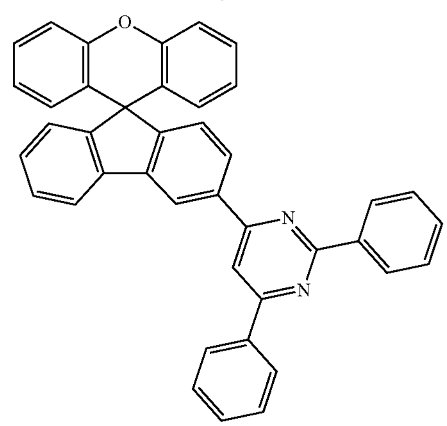
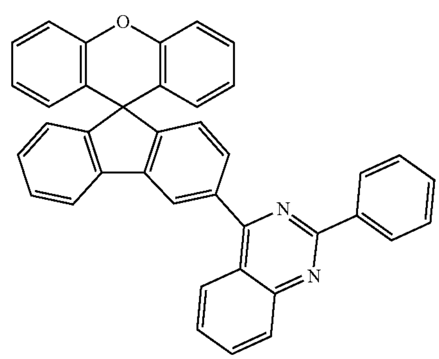

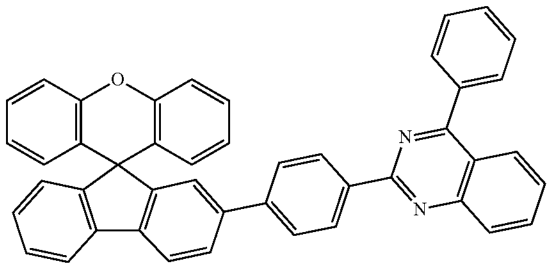
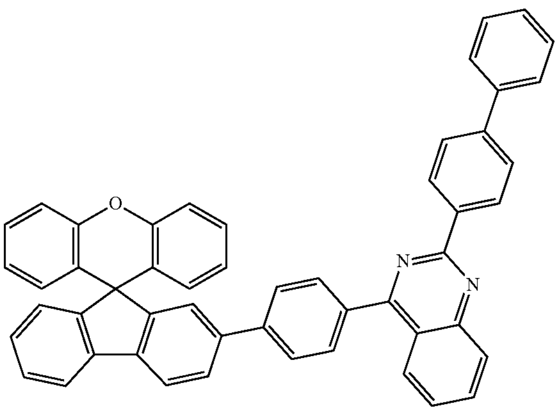
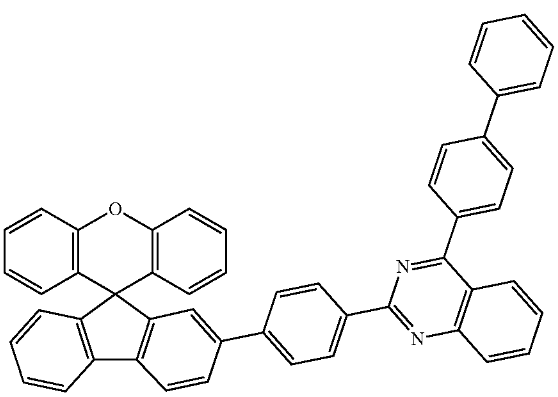
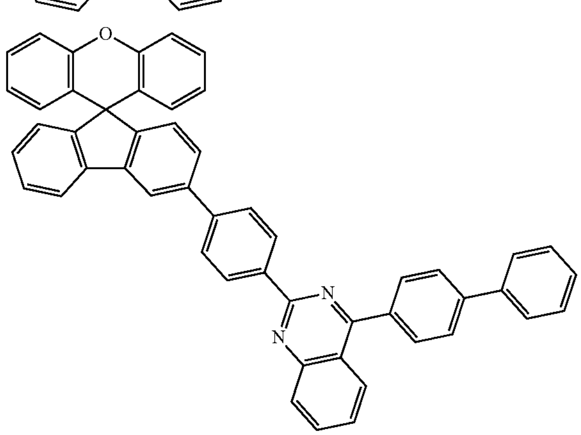
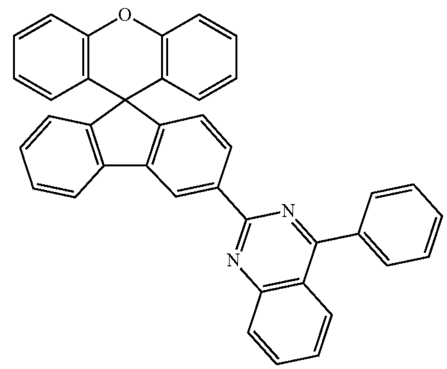
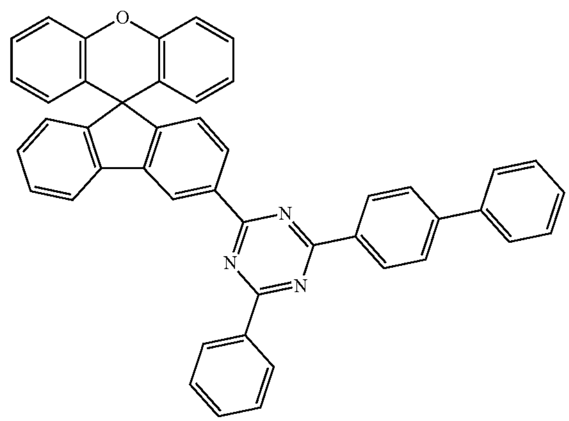
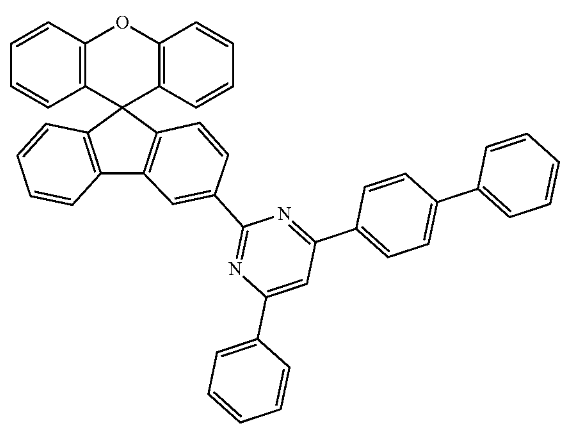
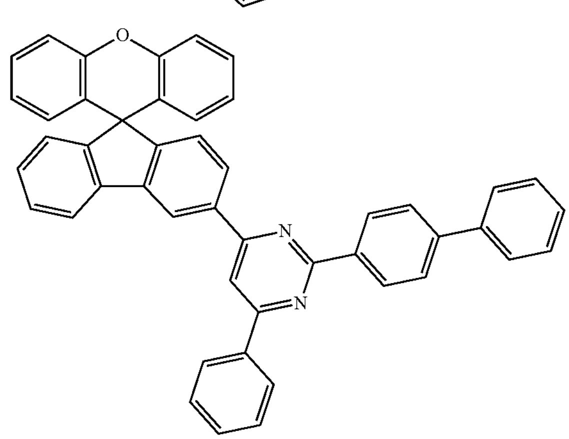

-continued
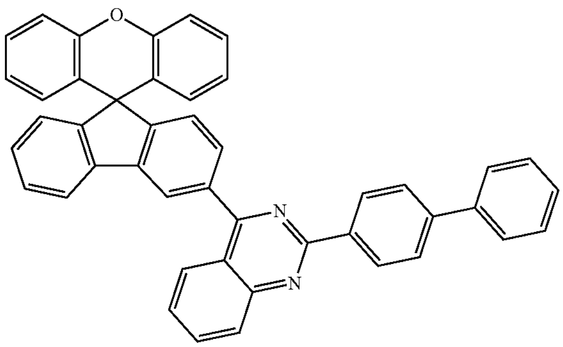
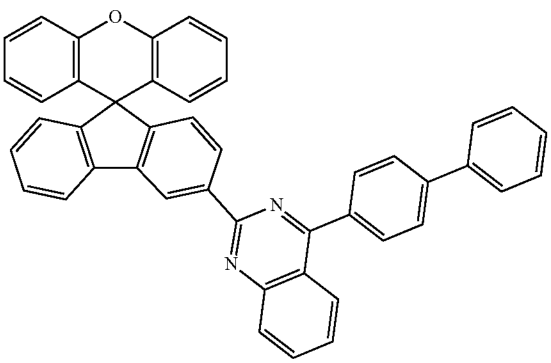
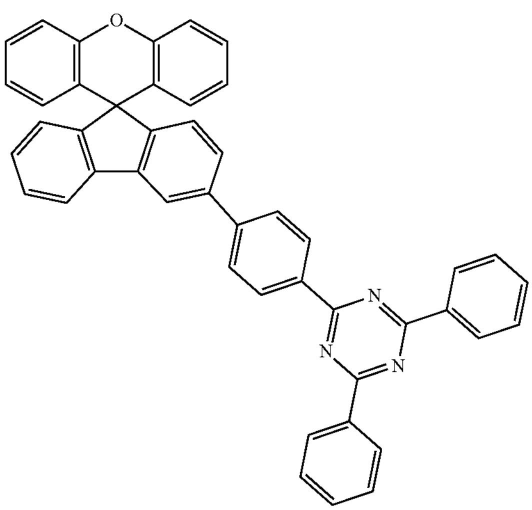
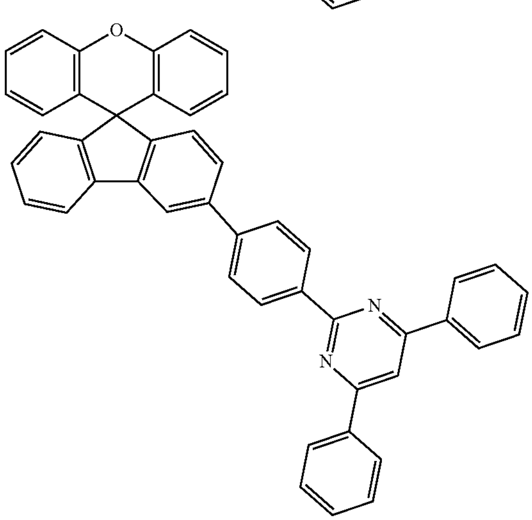
-continued
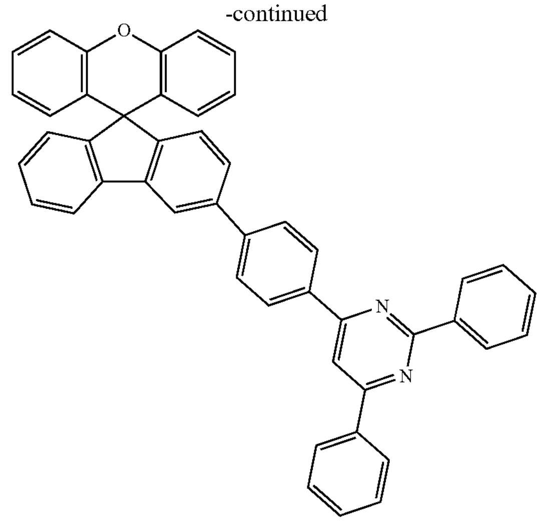
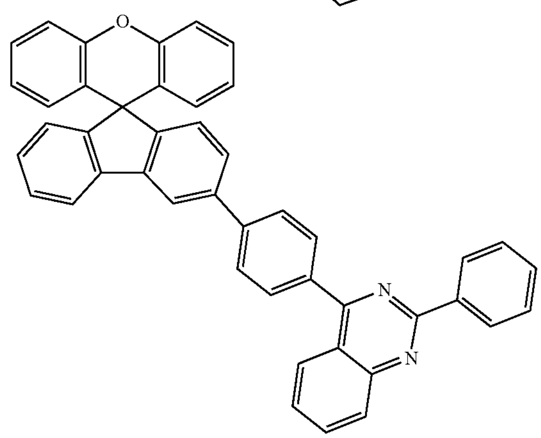
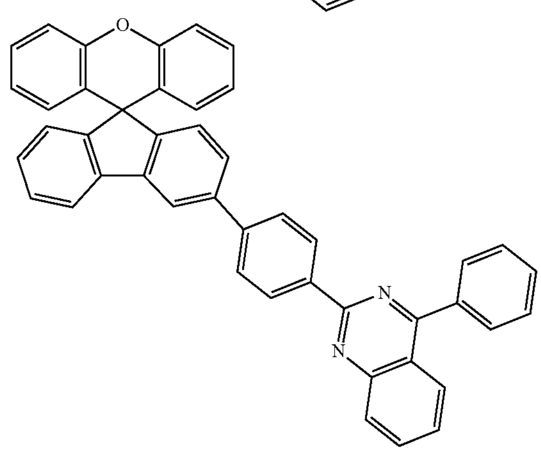
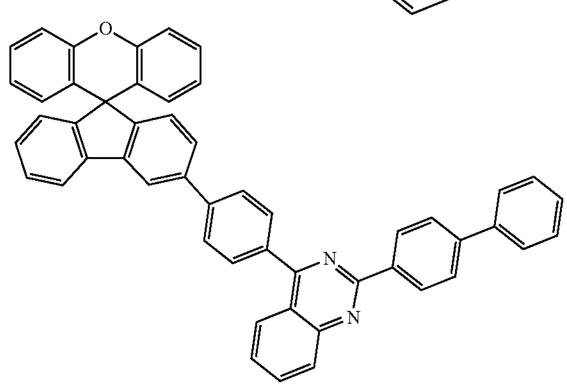

-continued
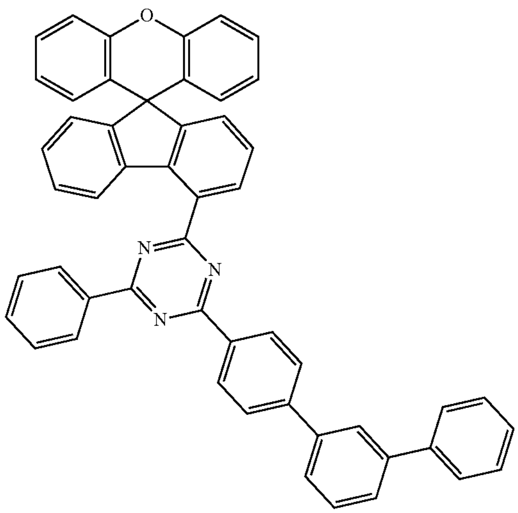
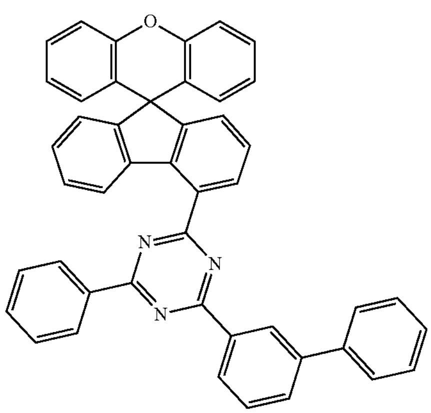
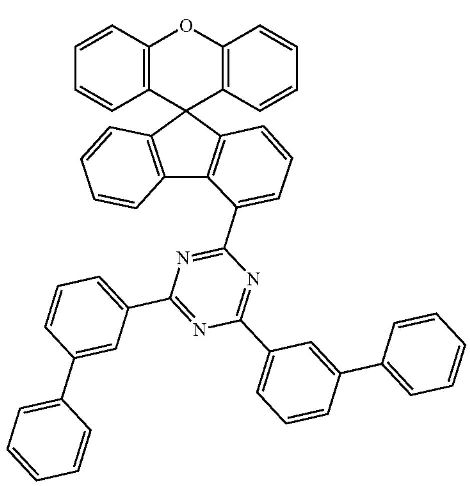
-continued
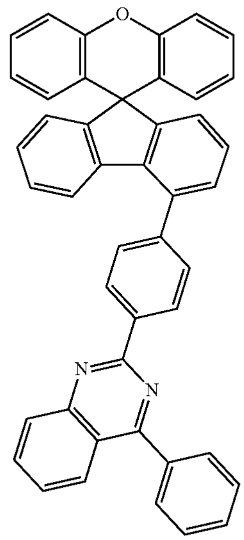
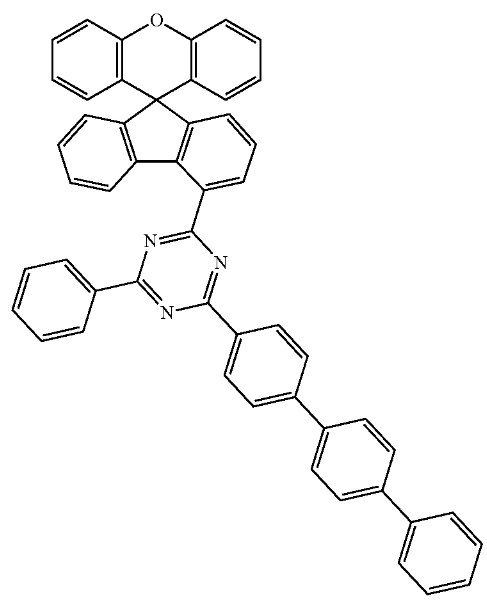
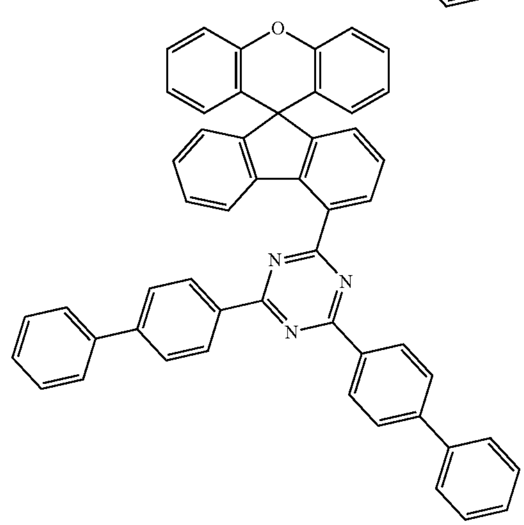

-continued
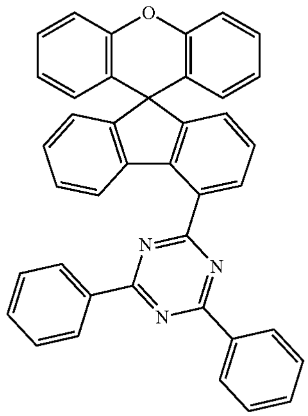
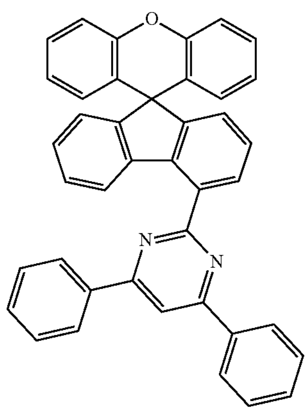
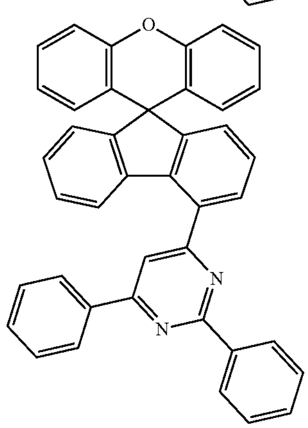
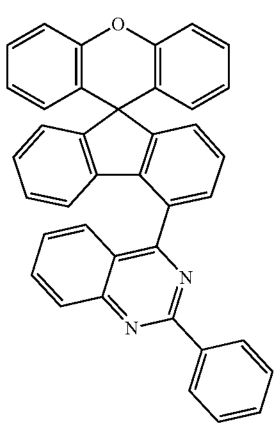
-continued
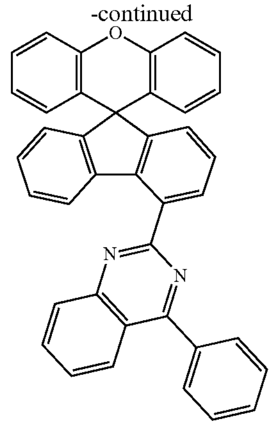
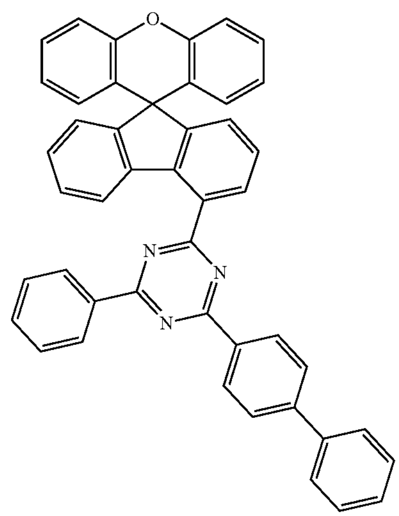
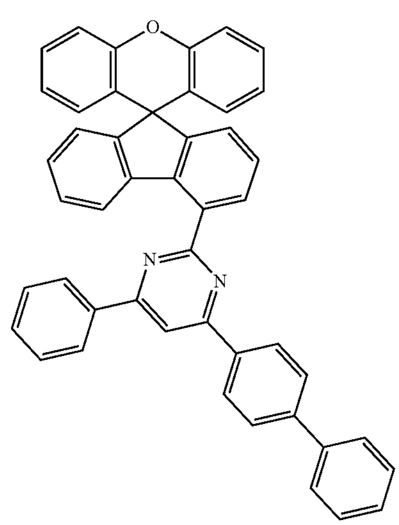

-continued
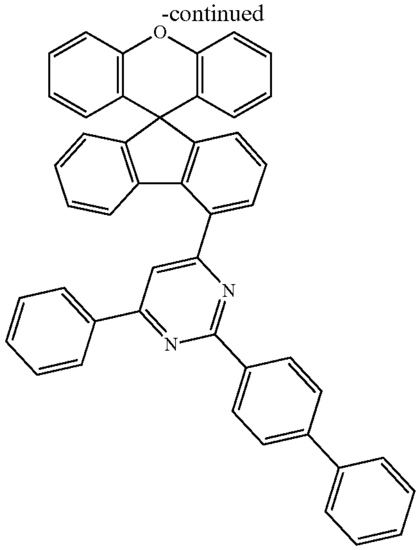
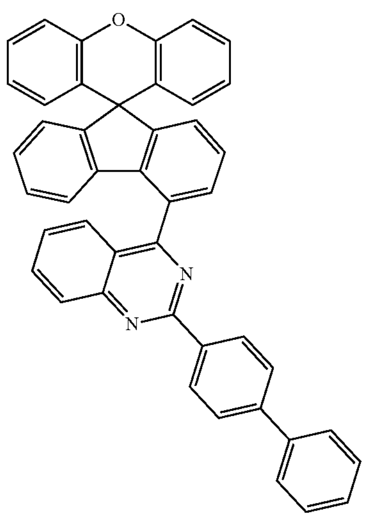
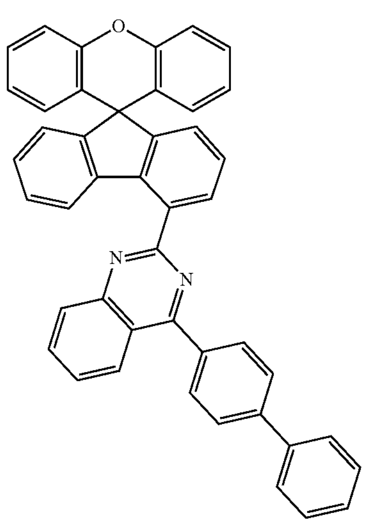 [SMILES: c1ccc(-c2ccc(-c3nc(-c4cccc5c4-c4ccccc4C54c5ccccc5Oc5ccccc54)nc4ccccc34)cc2)cc1]
-continued
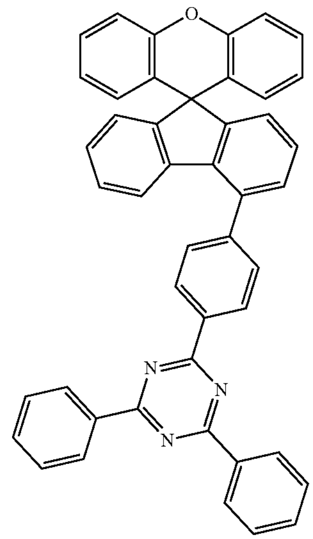
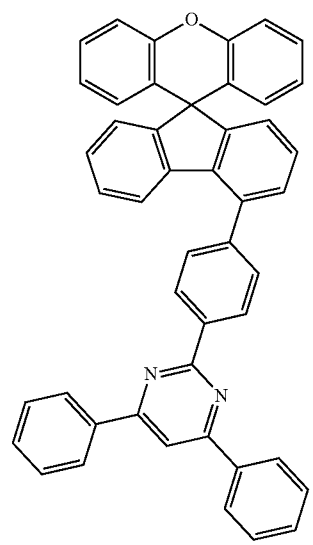
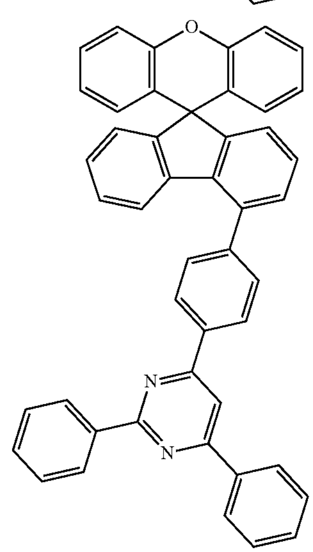

-continued
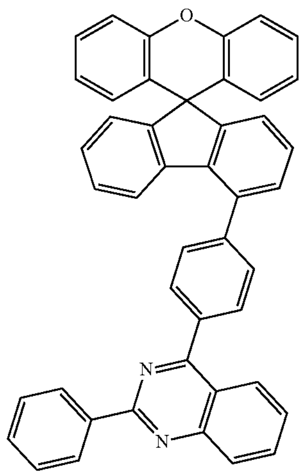
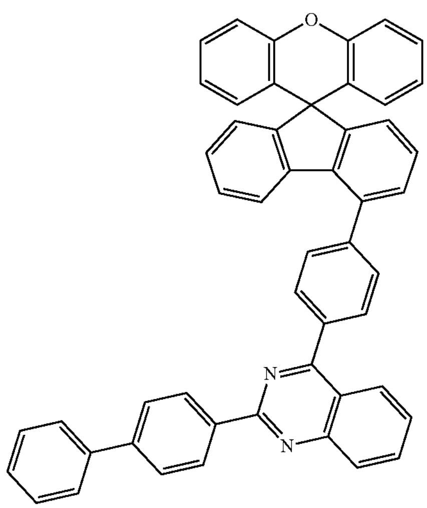
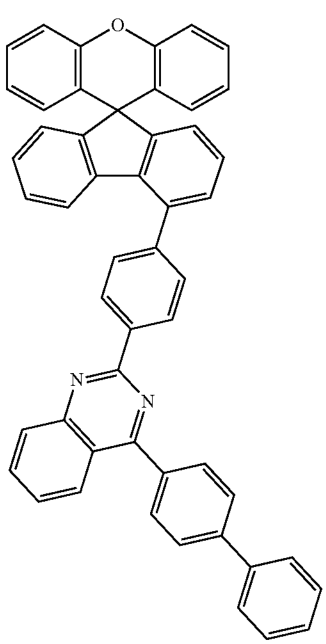
-continued
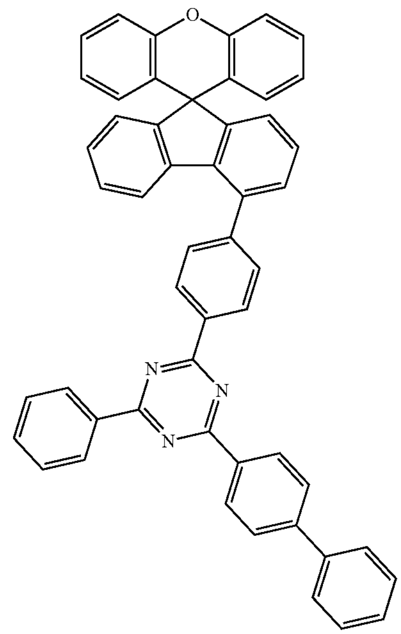
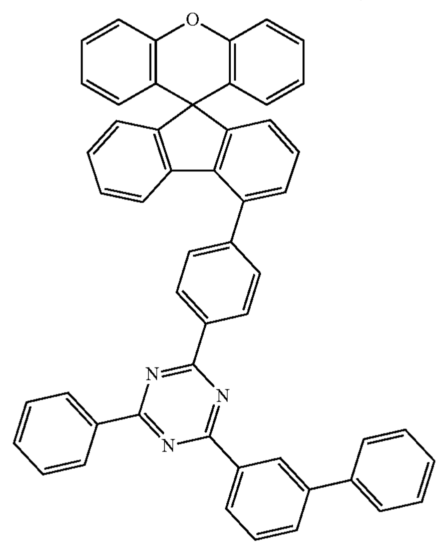
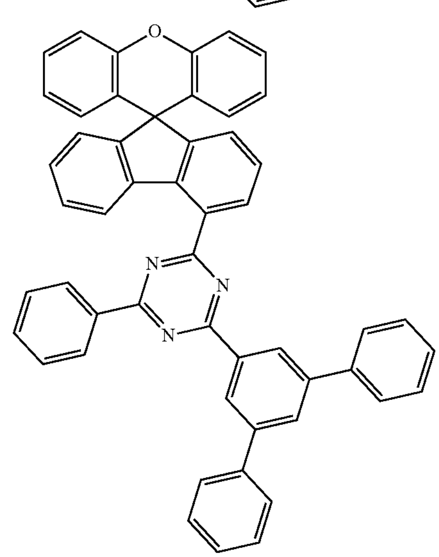

-continued
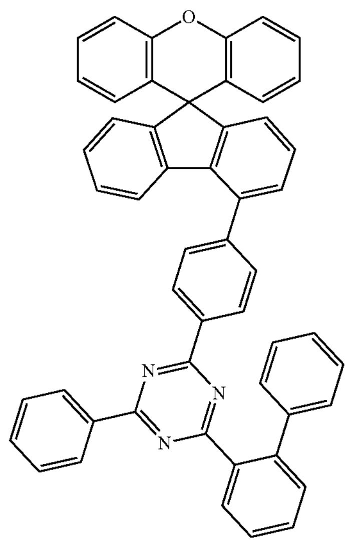
-continued
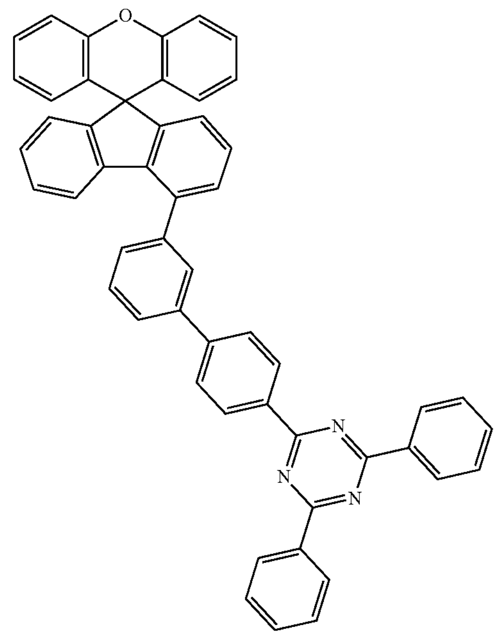
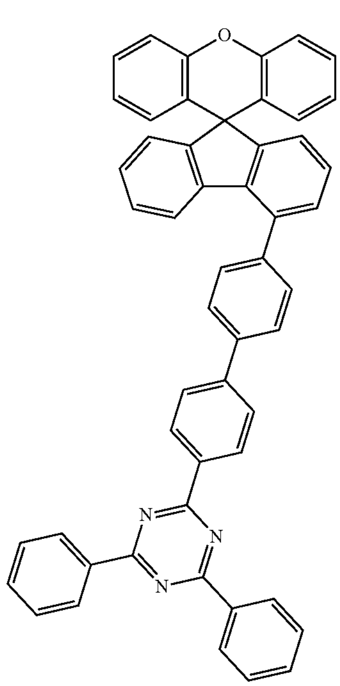
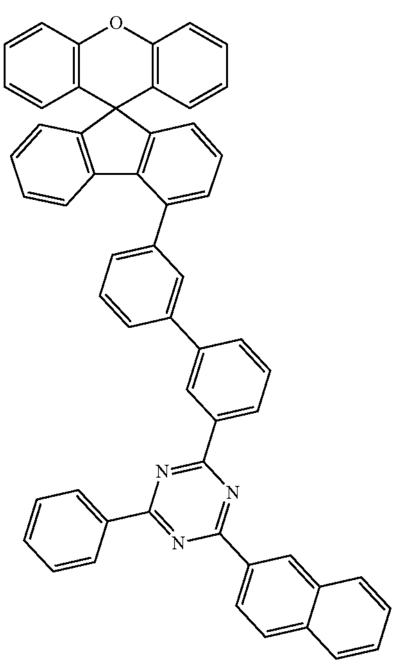

-continued
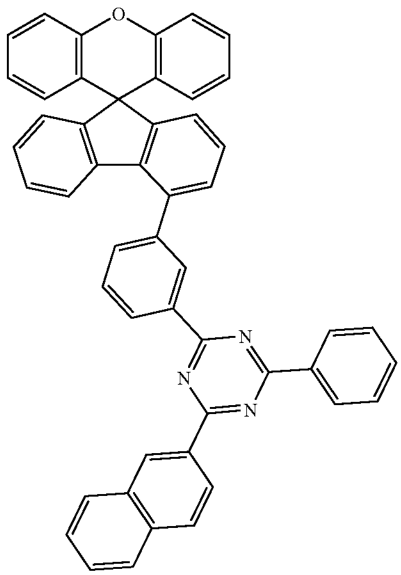
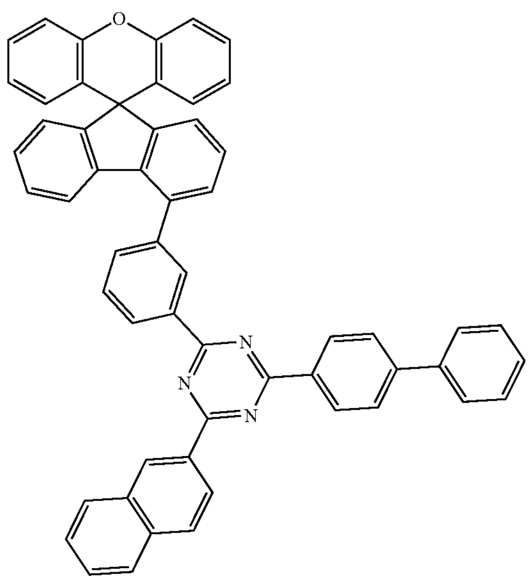
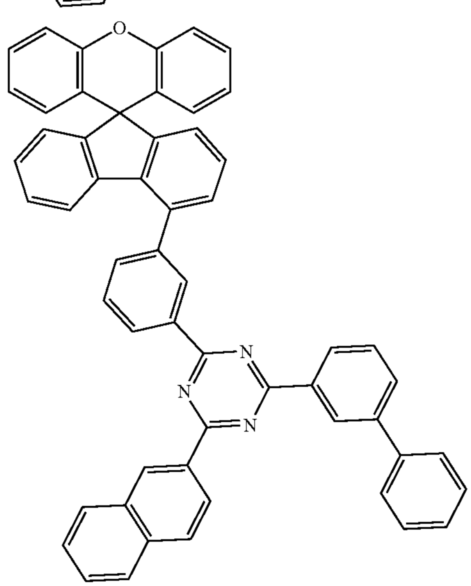
-continued
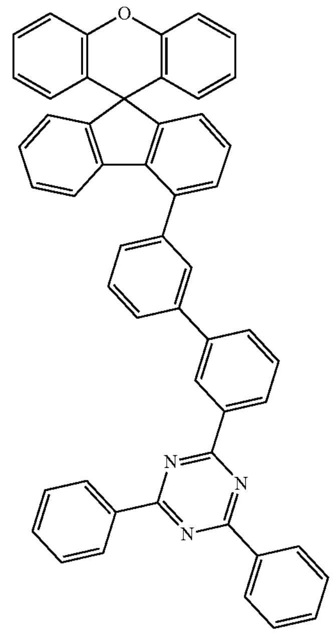
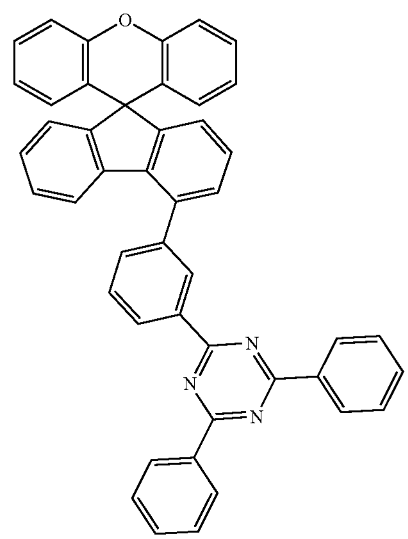
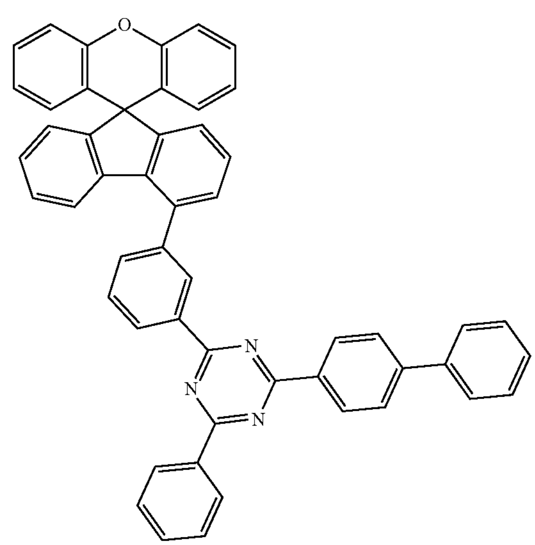

-continued
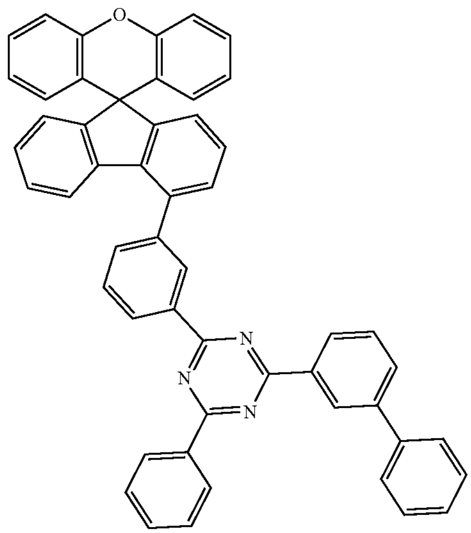
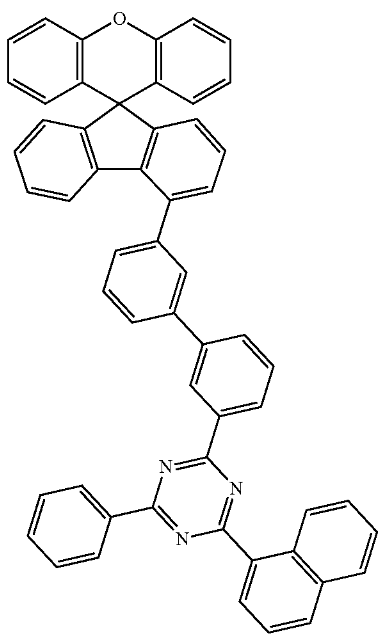
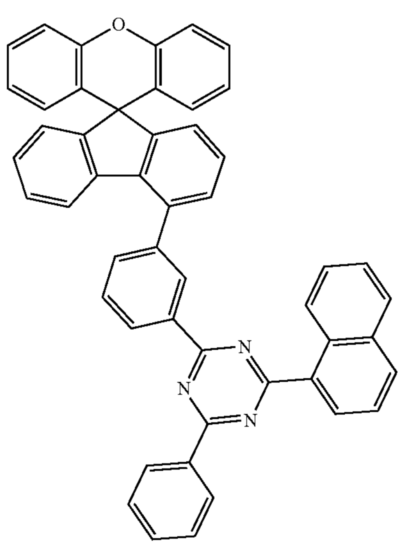
-continued
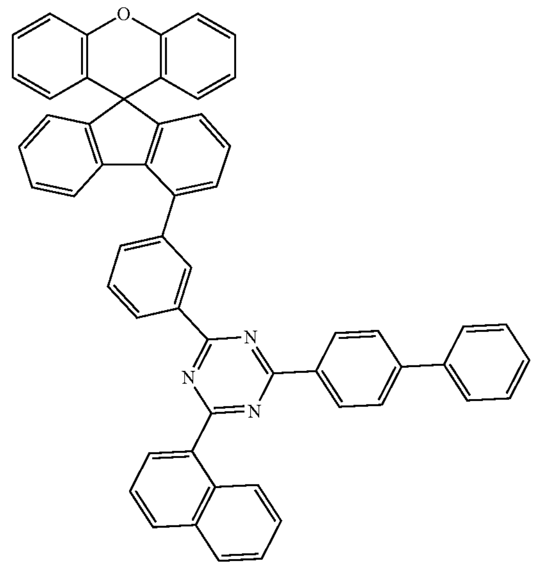
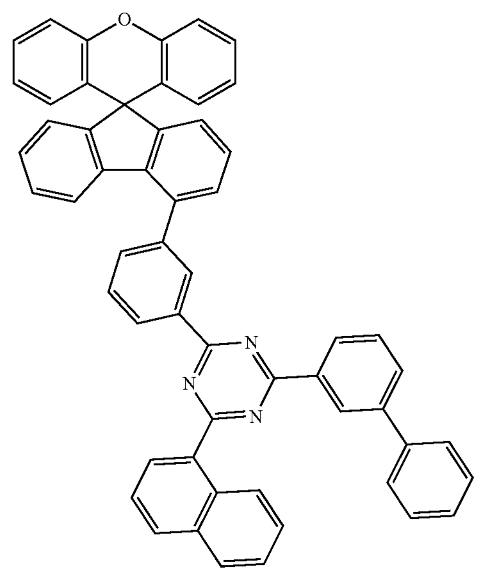
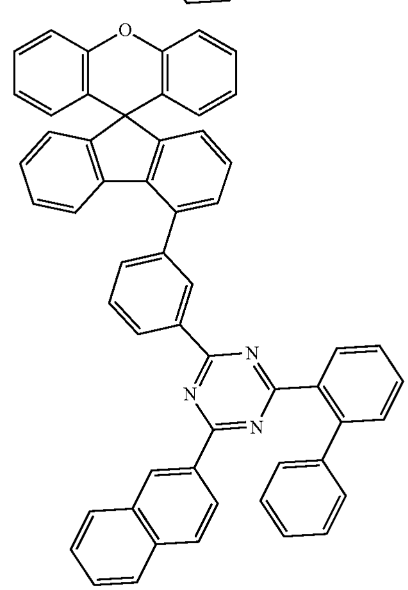

-continued
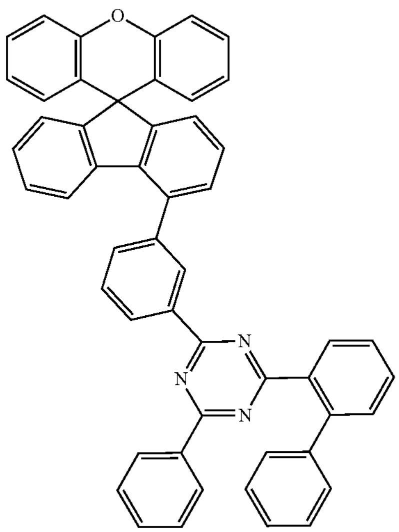
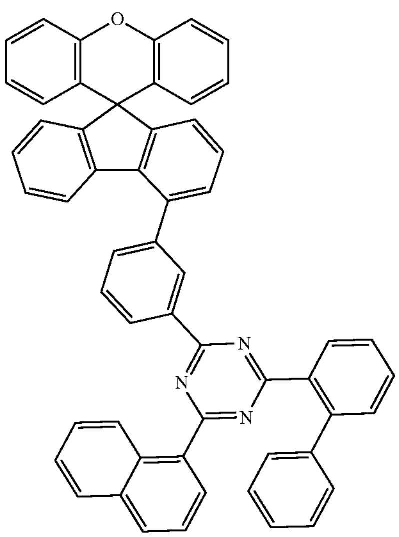
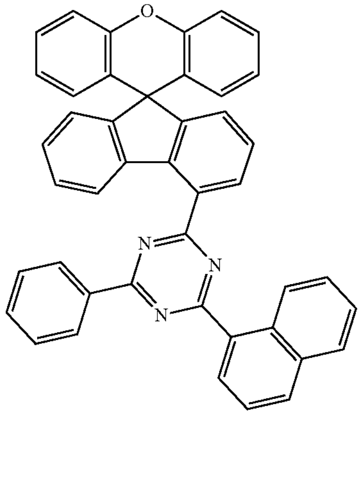
-continued
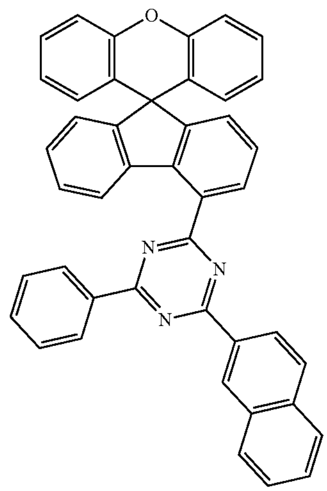
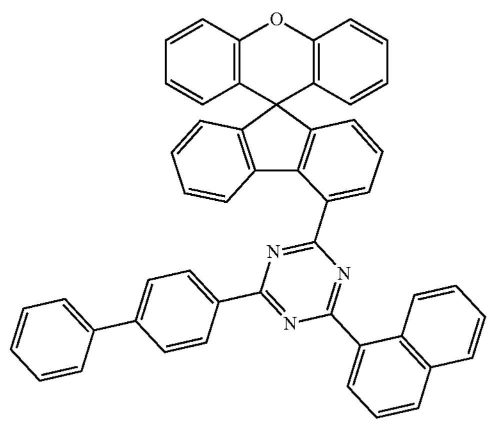
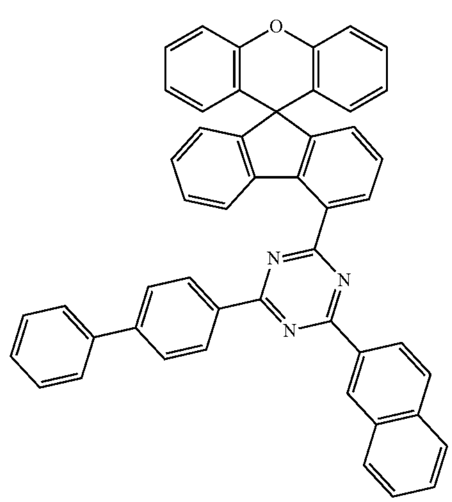

-continued
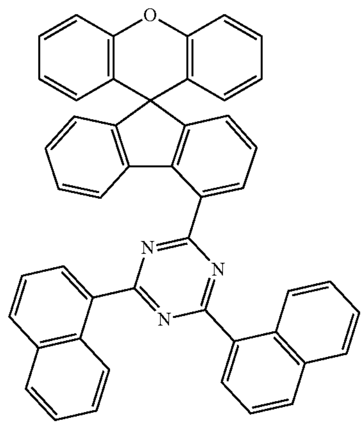
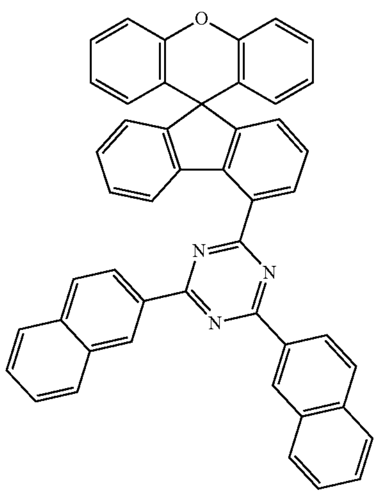
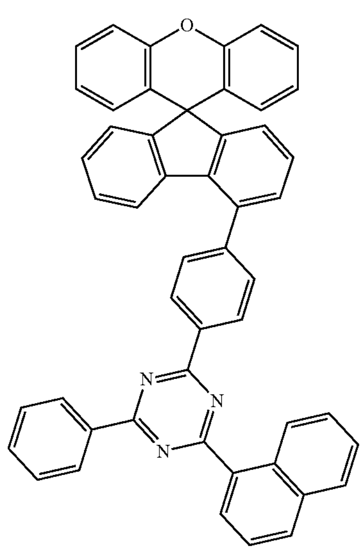
-continued
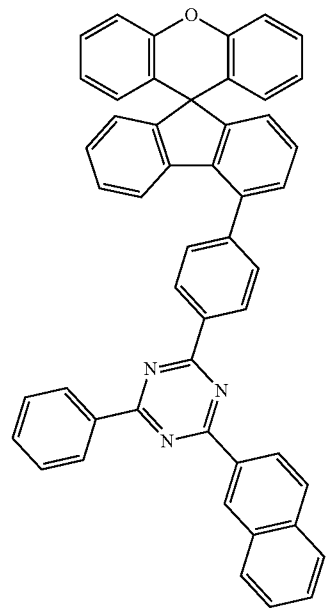
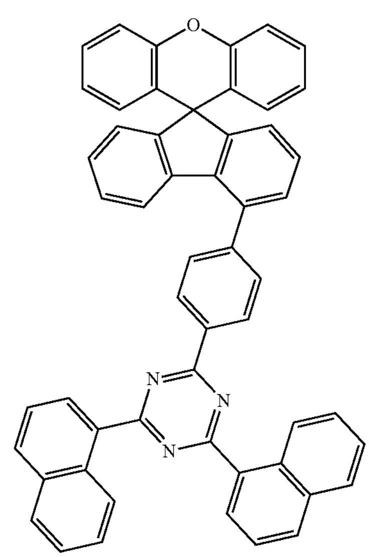

-continued
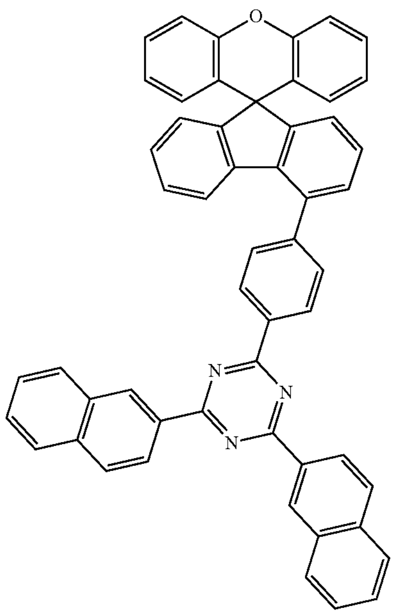 [SMILES: c1ccc2c(c1)Oc1ccccc1C21c2ccccc2-c2c(-c3ccc(-c4nc(-c5ccc6ccccc6c5)nc(-c5ccc6ccccc6c5)n4)cc3)cccc21]
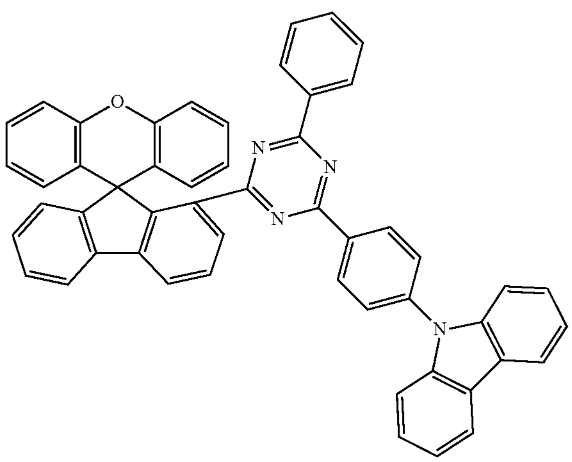
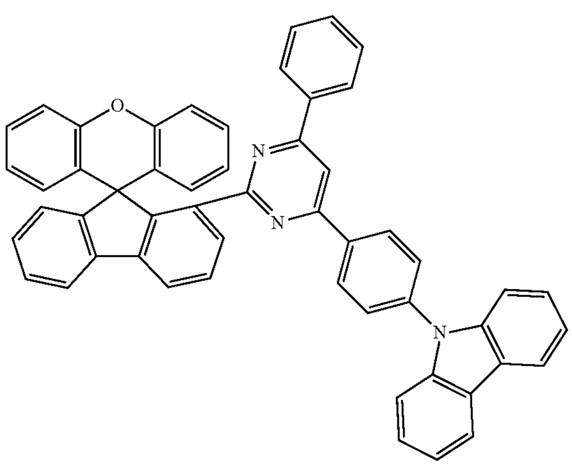
-continued
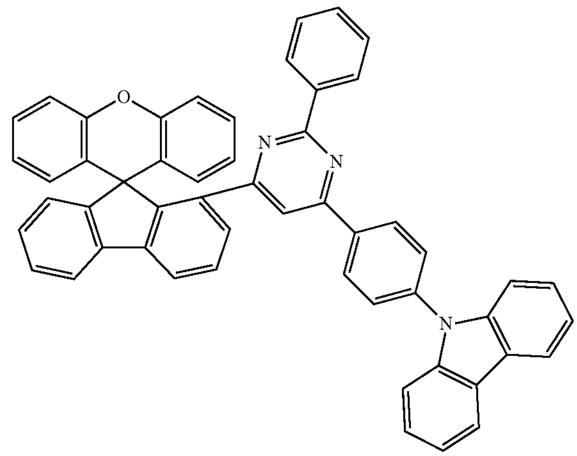
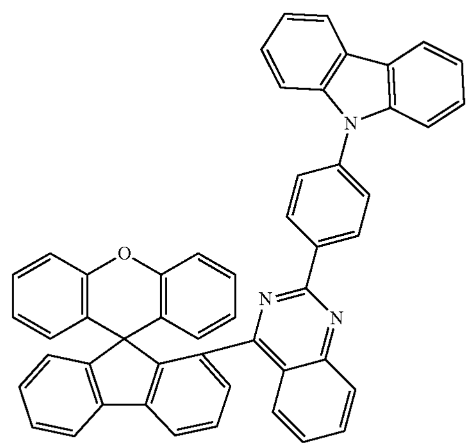
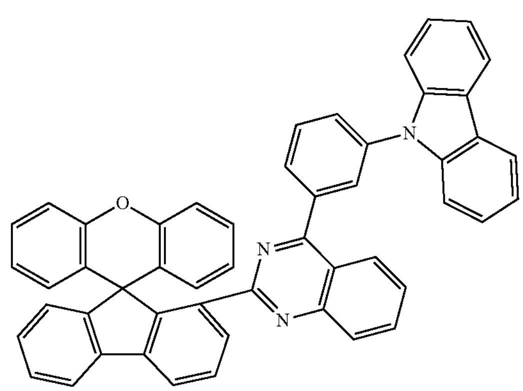

-continued
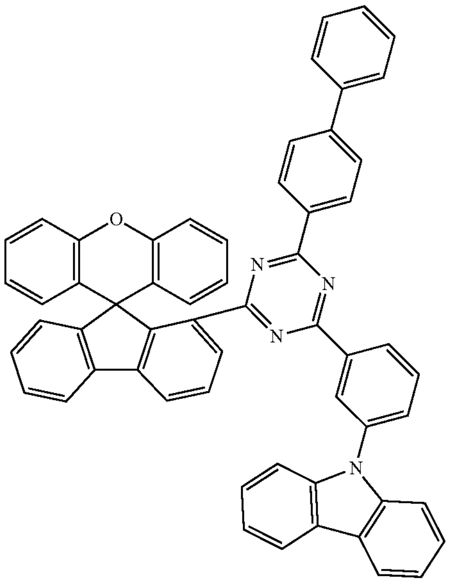
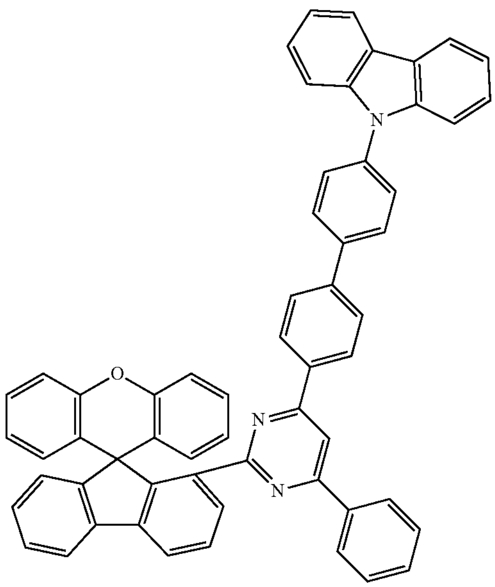
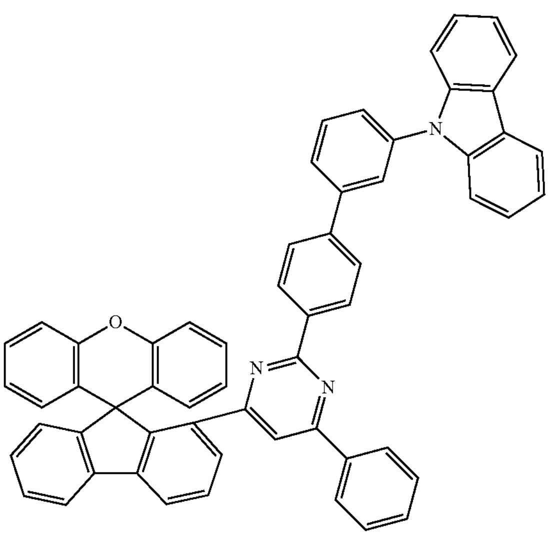
-continued
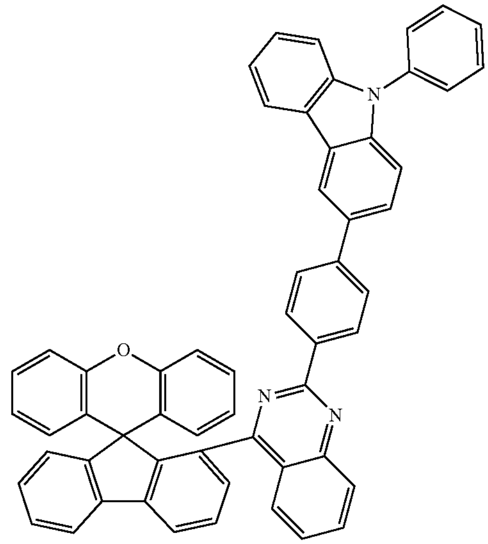
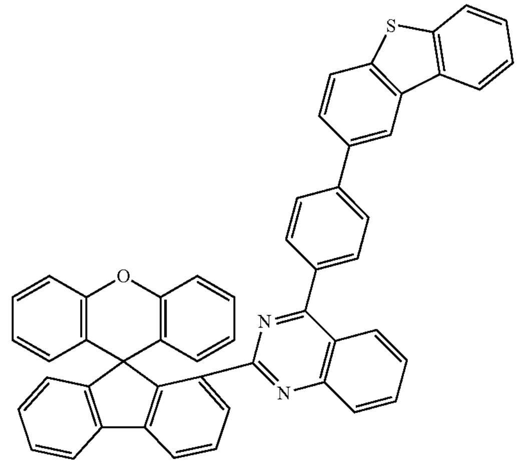
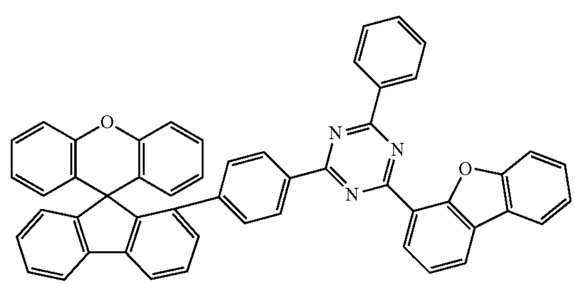
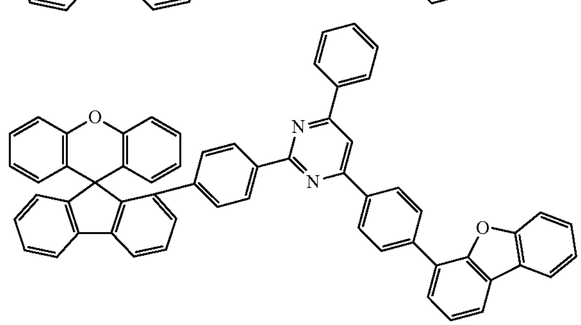

-continued
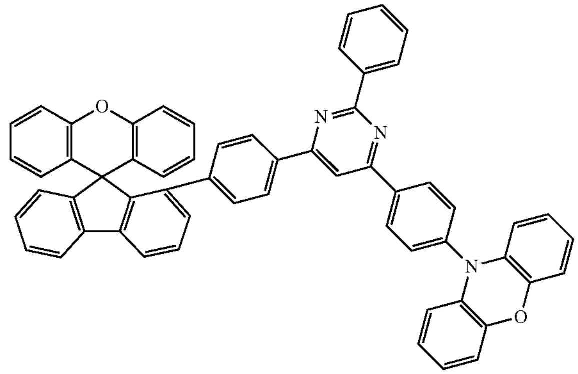
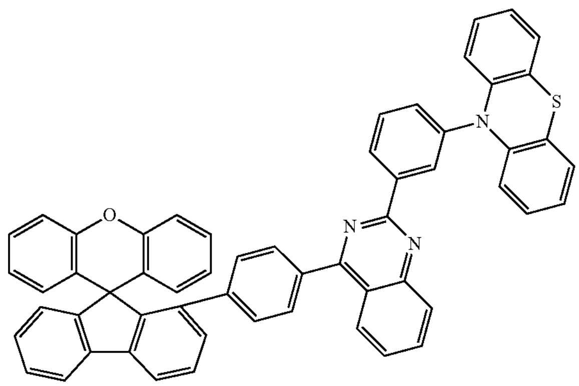
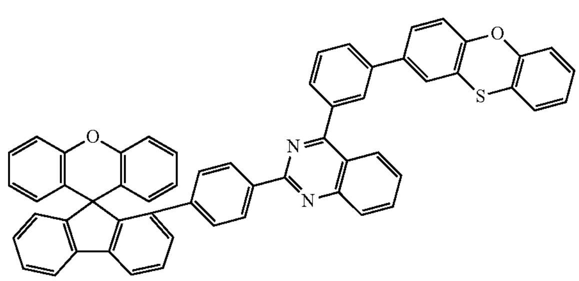
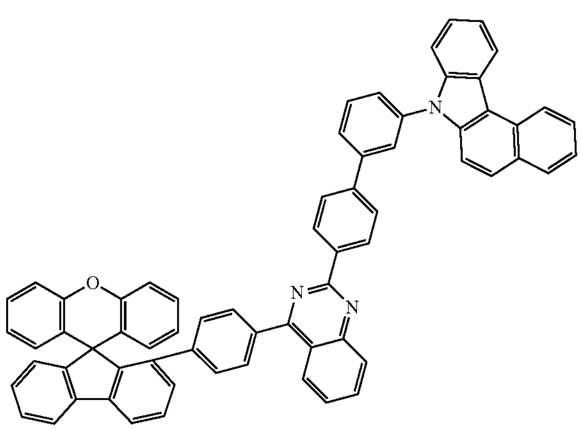
-continued
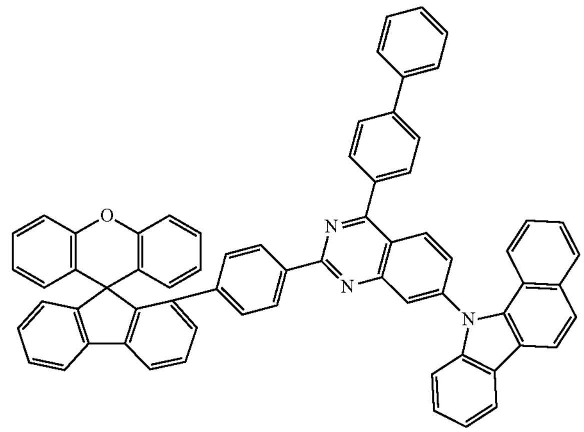
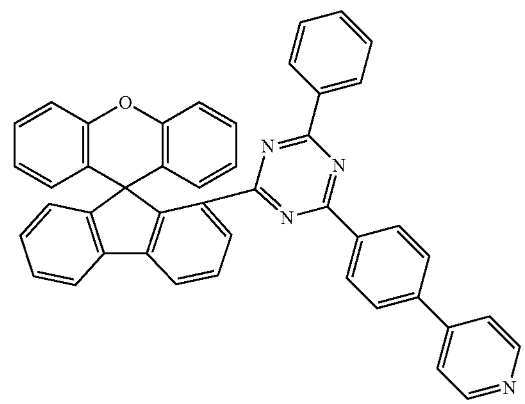
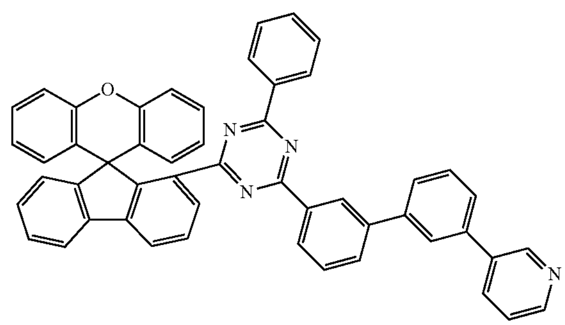
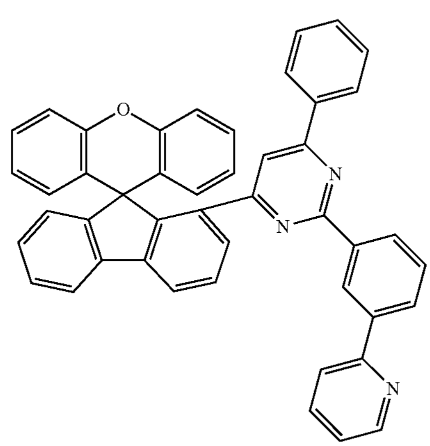

-continued
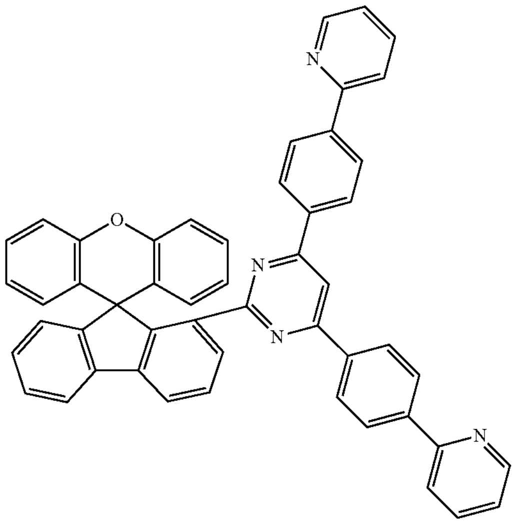
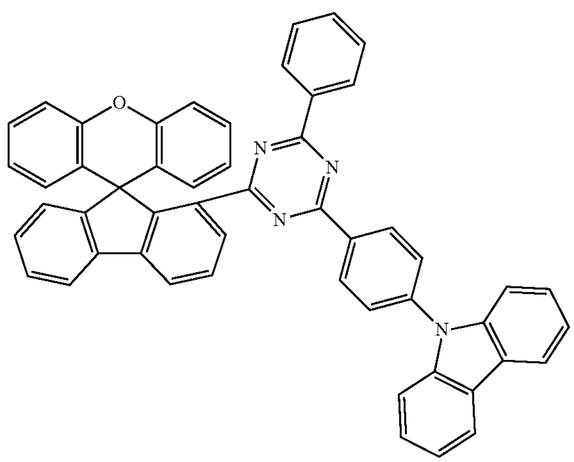
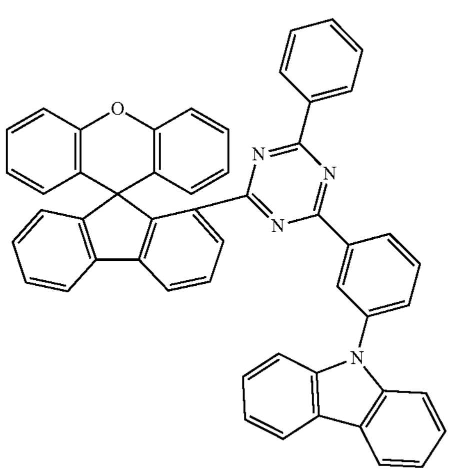
-continued
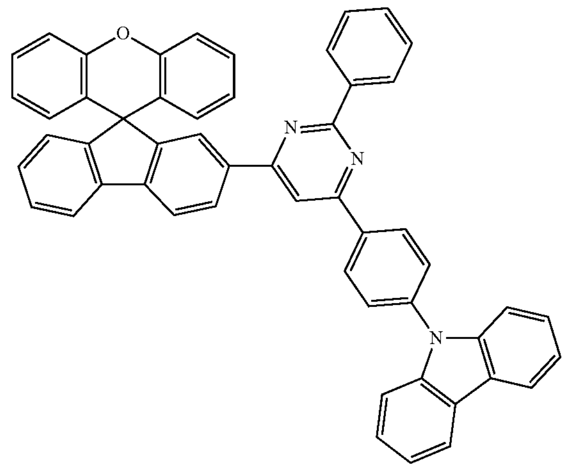
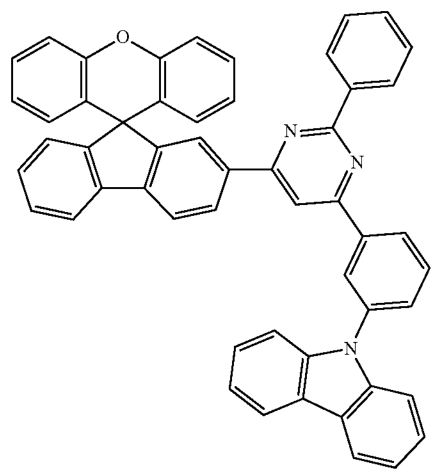
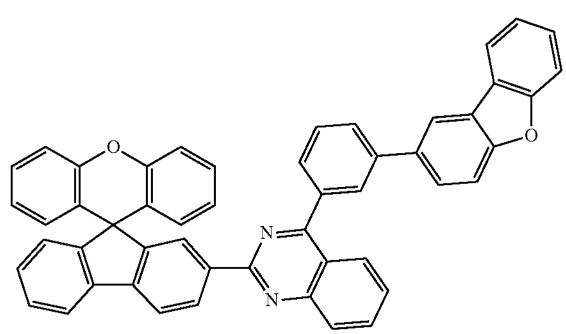

-continued
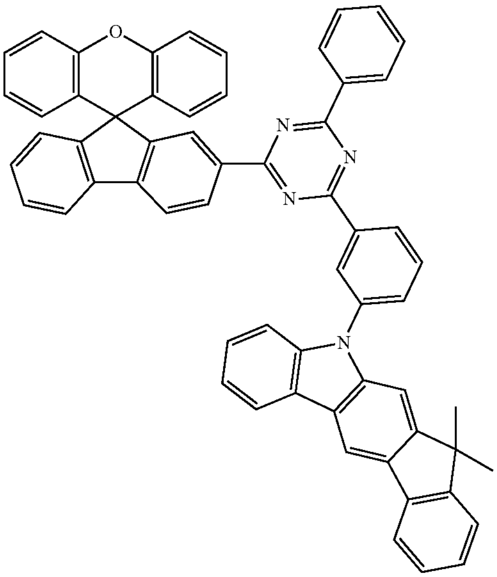
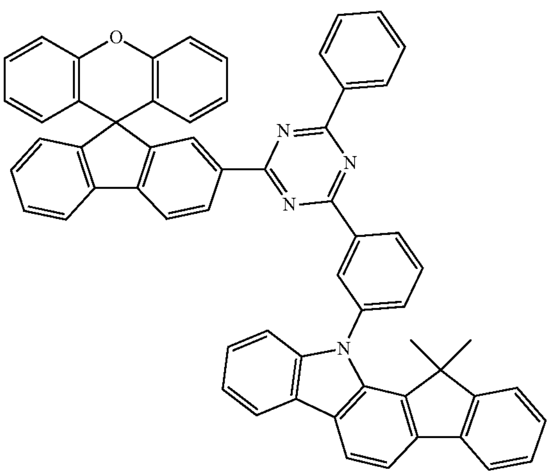
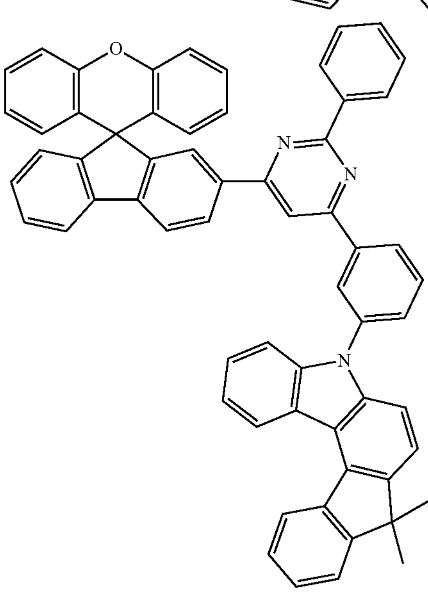
-continued
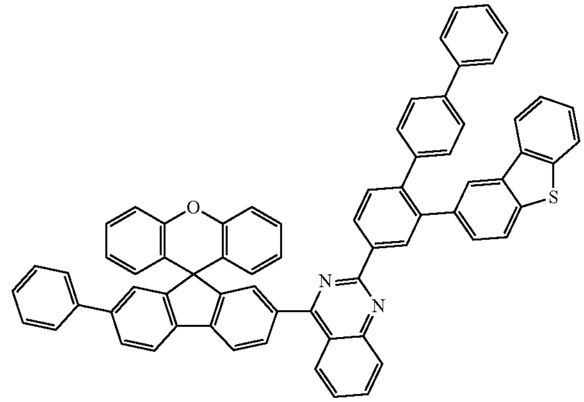
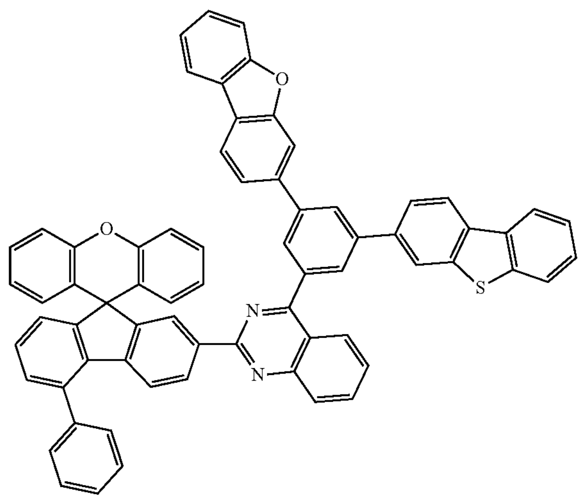
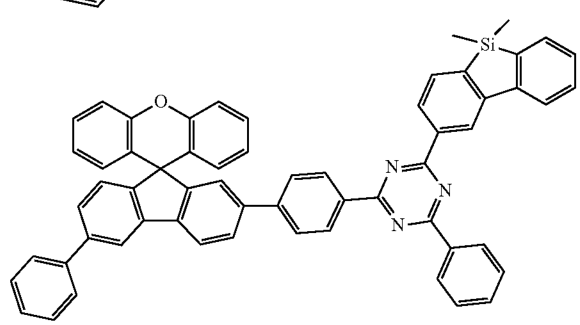
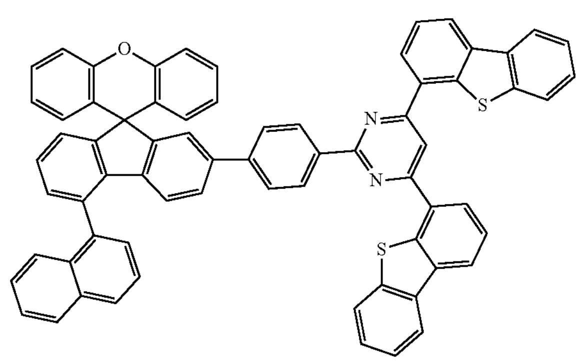

-continued
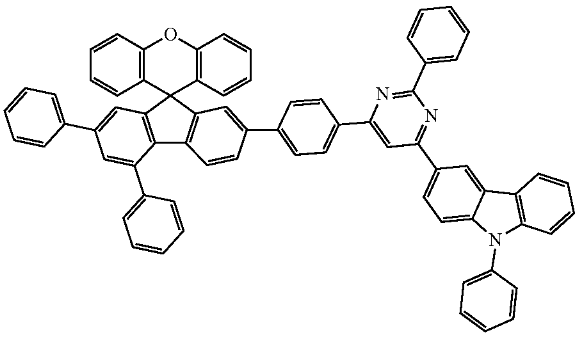
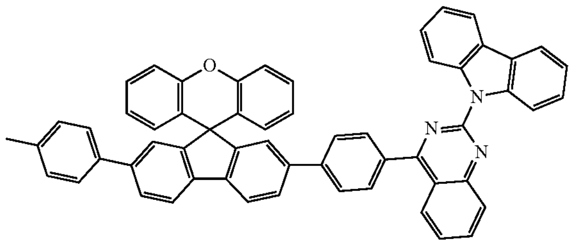
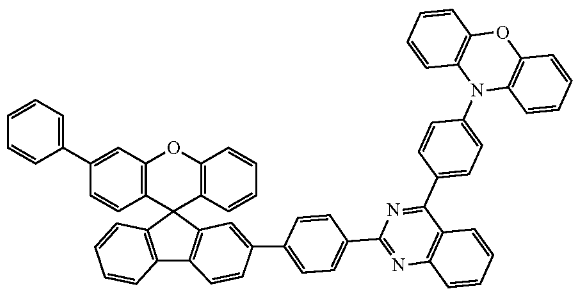
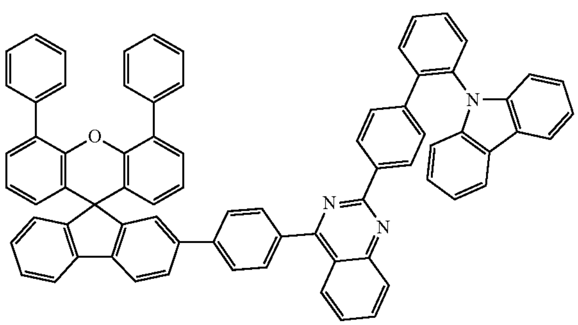
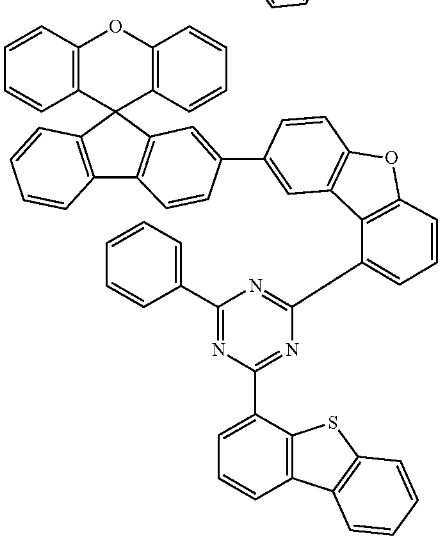
-continued
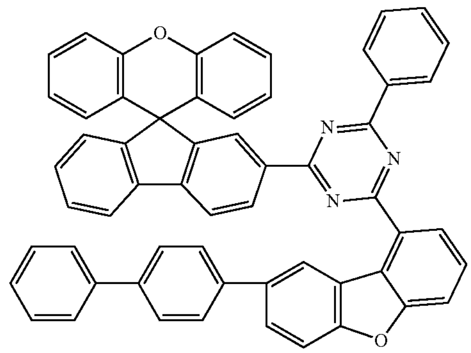
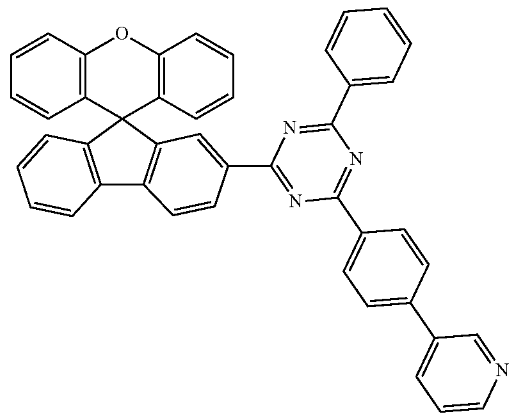
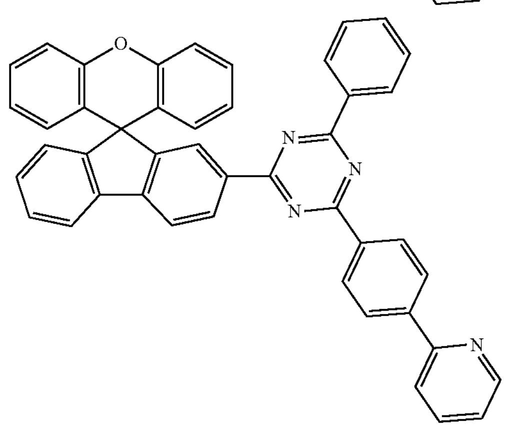
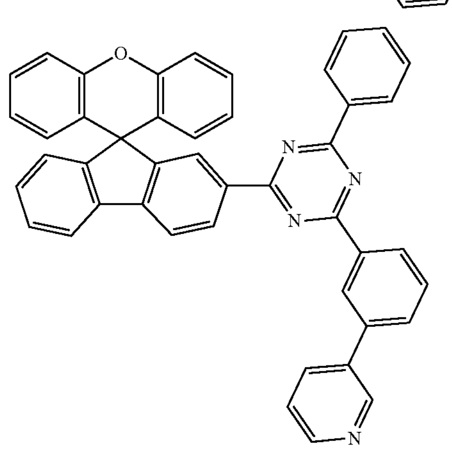

-continued
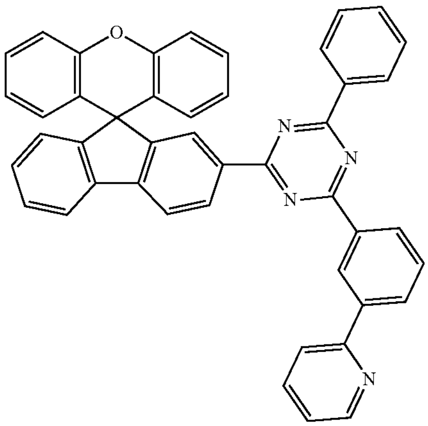
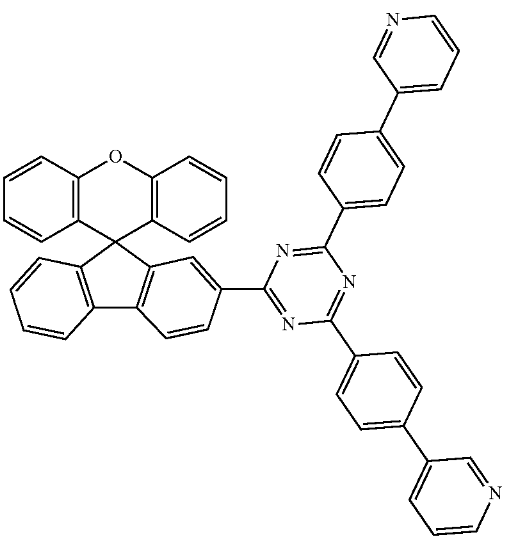
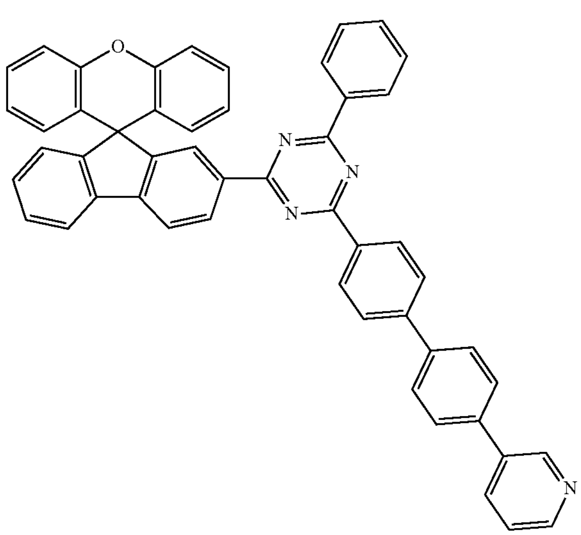
-continued
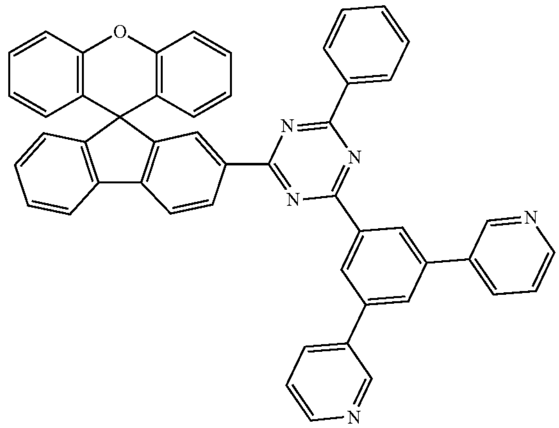
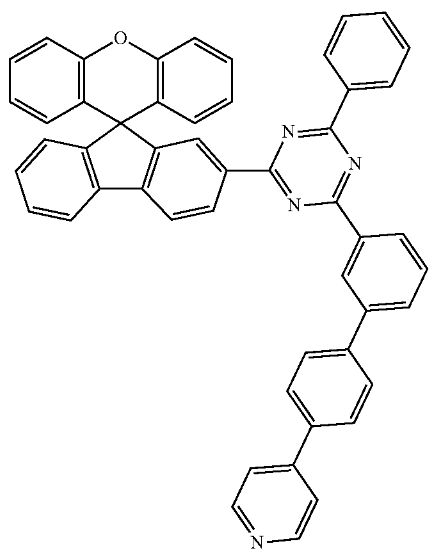
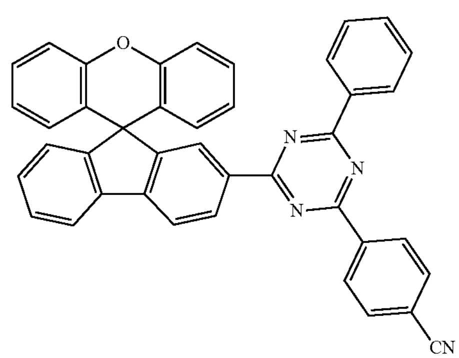

-continued
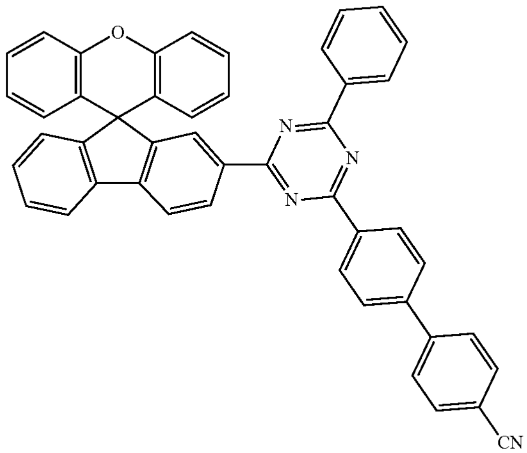
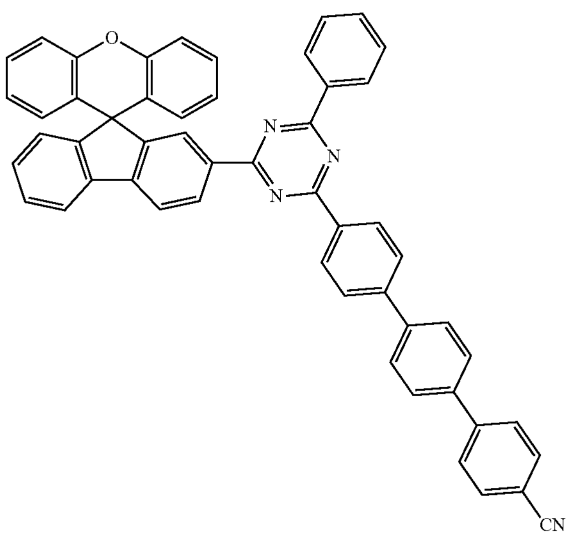
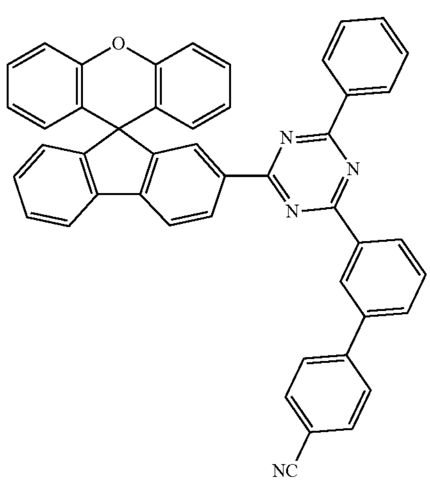
-continued
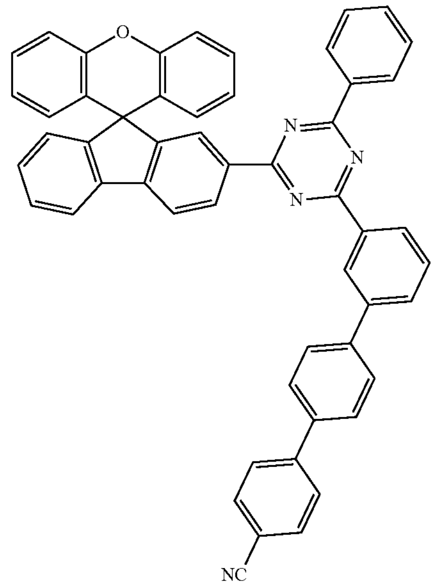
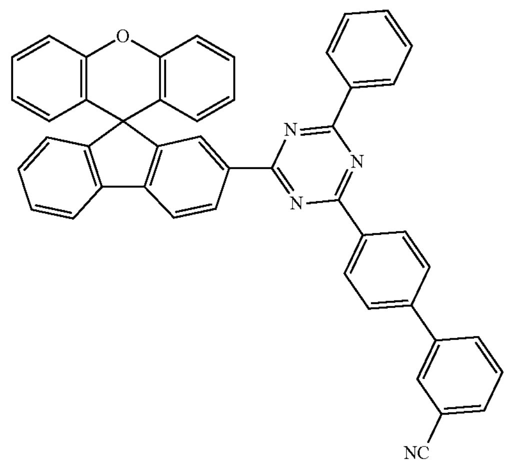
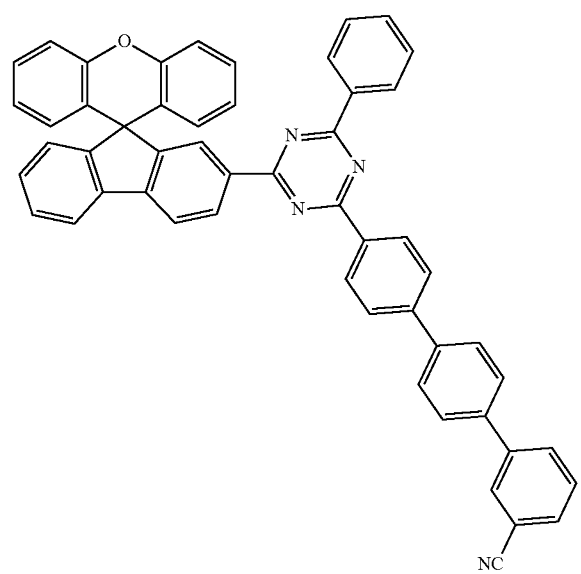

-continued
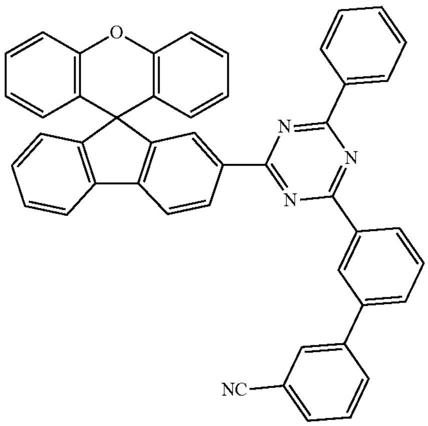
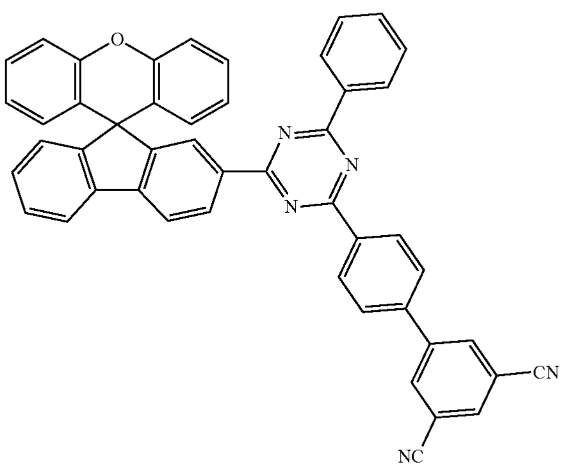
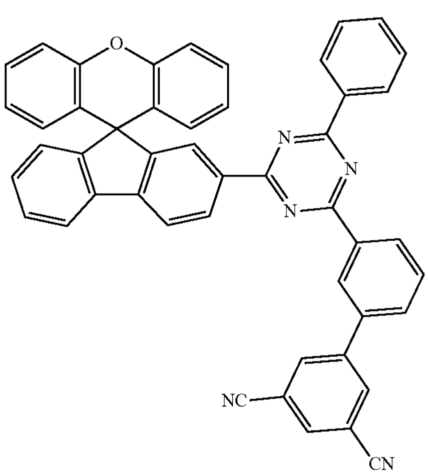
-continued
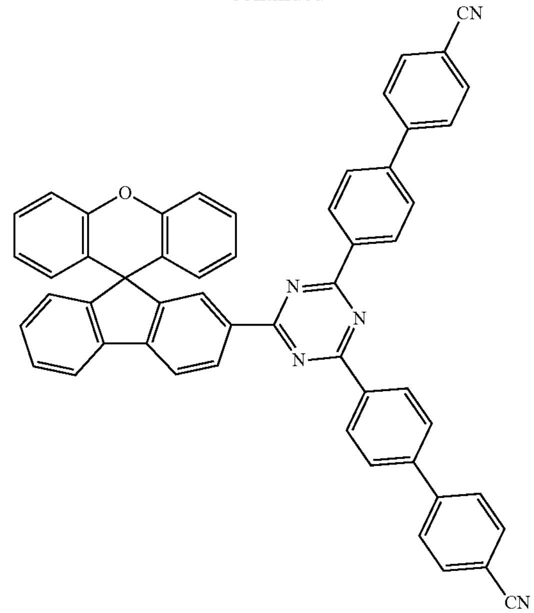
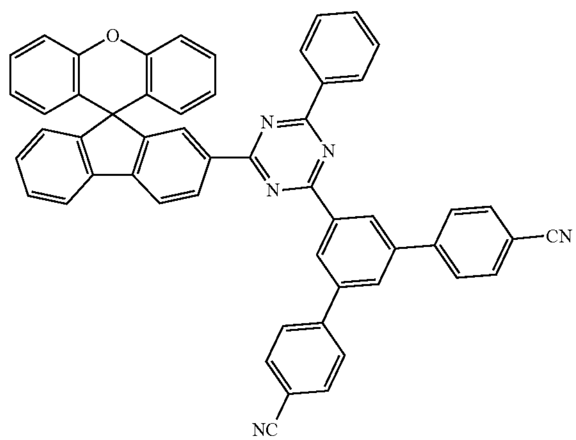
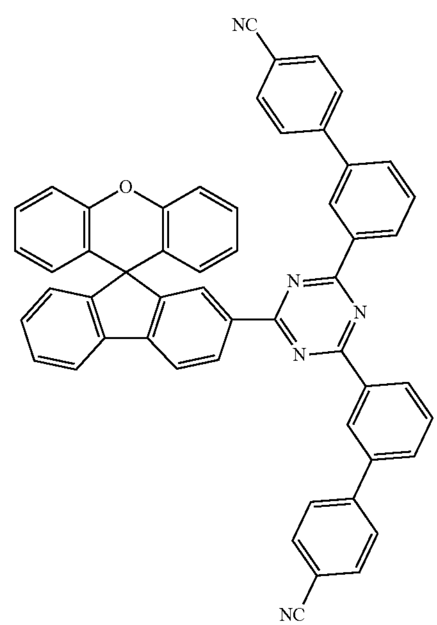

-continued
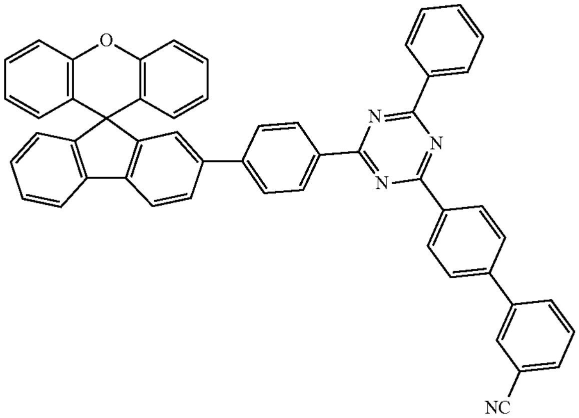
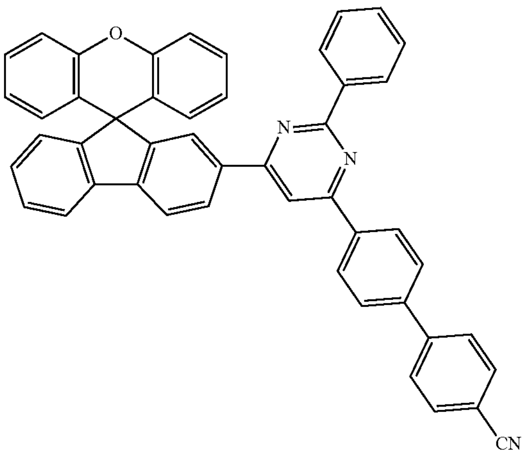
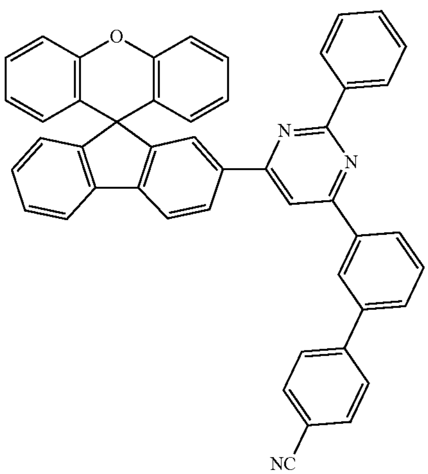
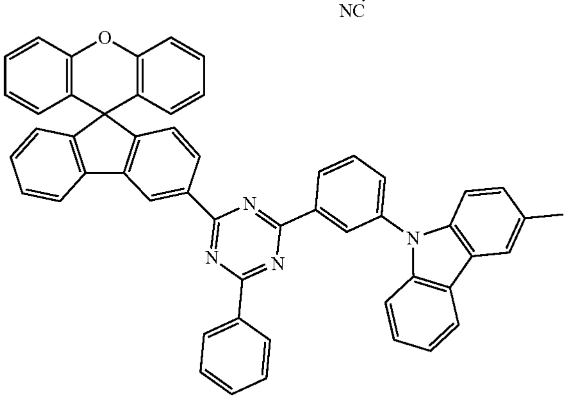
-continued
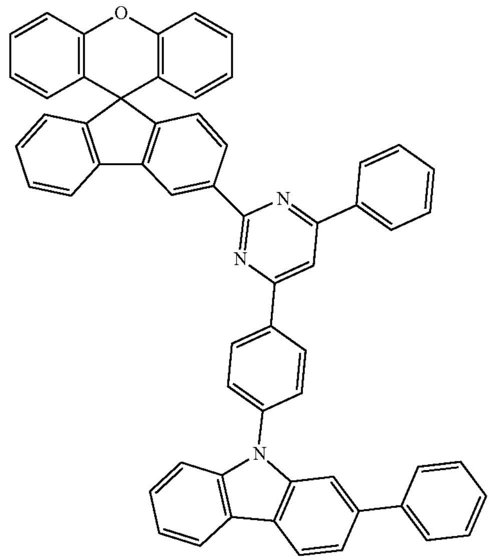
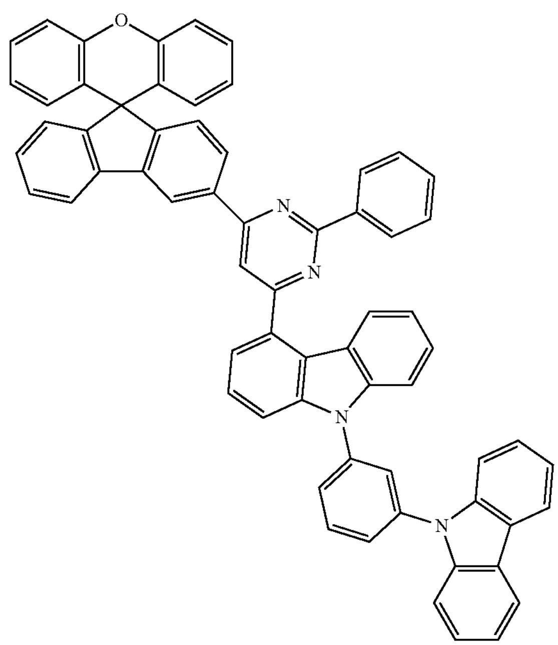
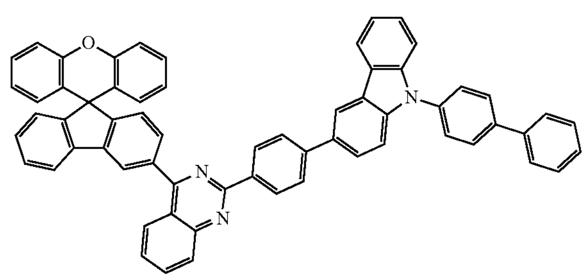

-continued
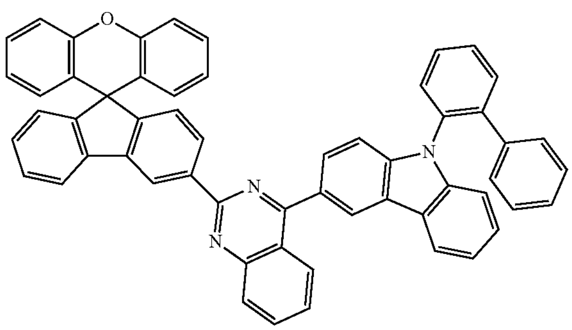
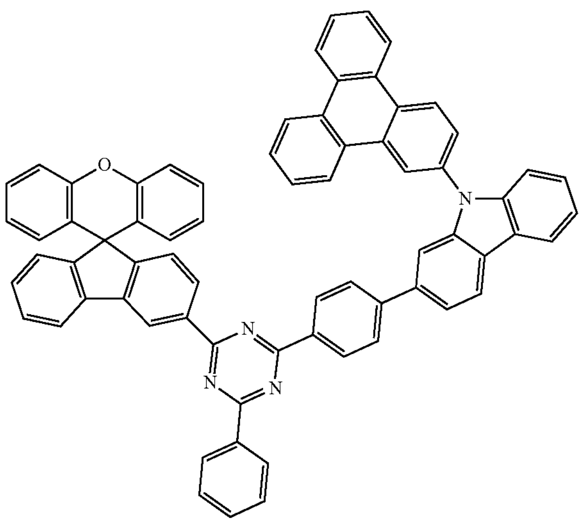
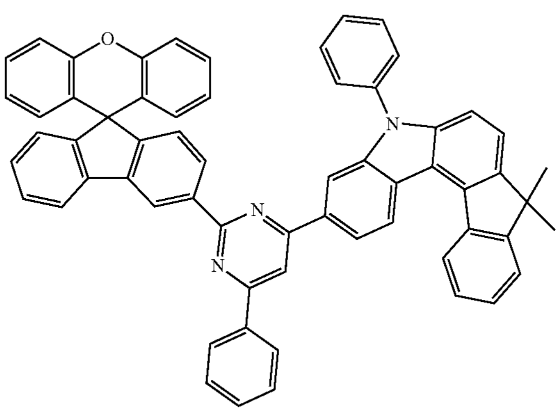
-continued
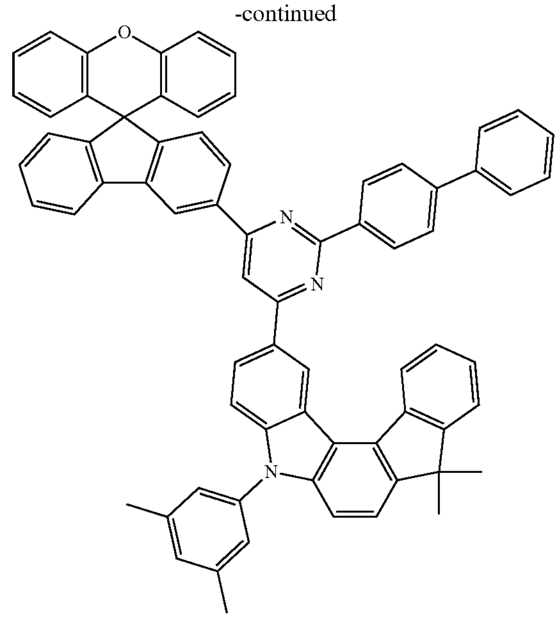
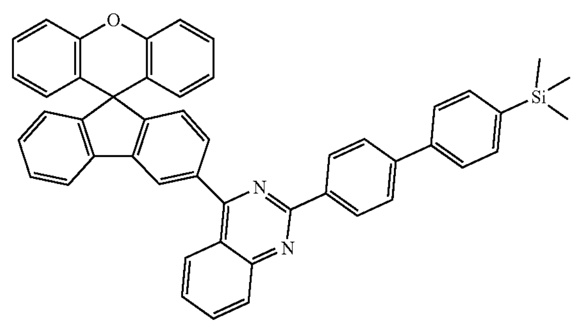
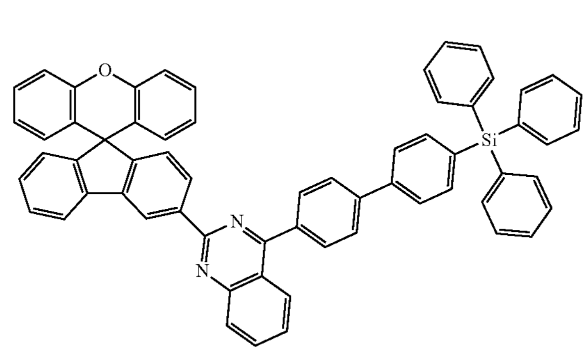

-continued
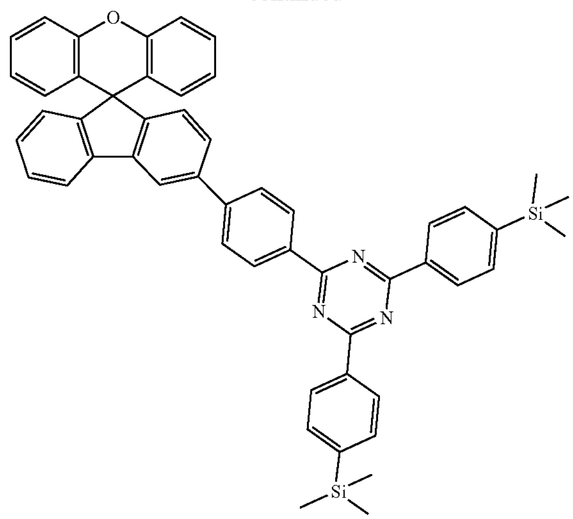
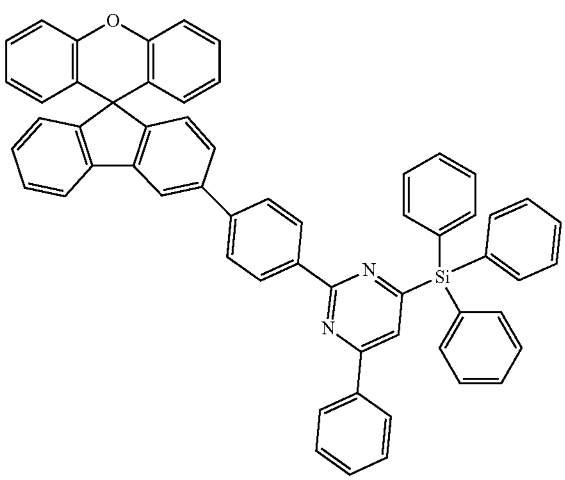
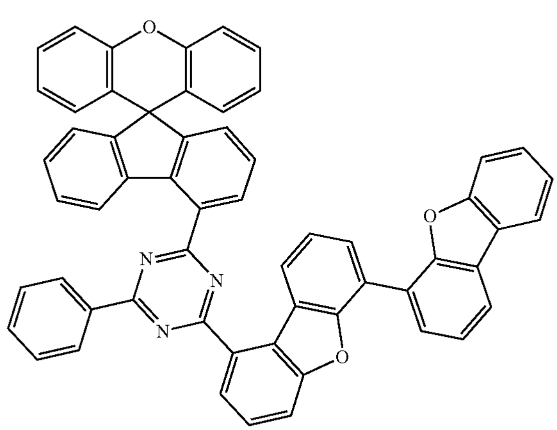
-continued
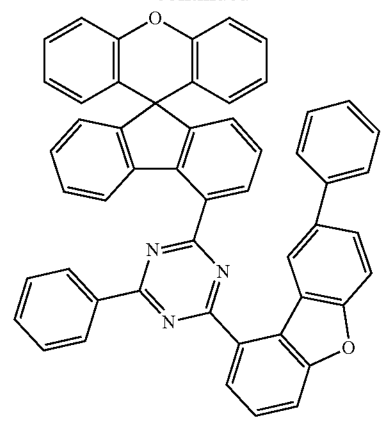
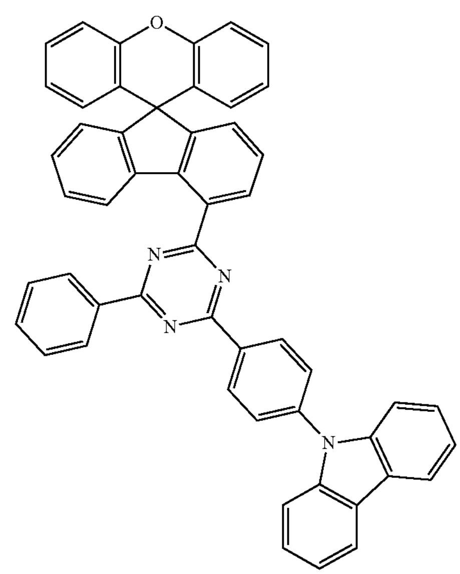
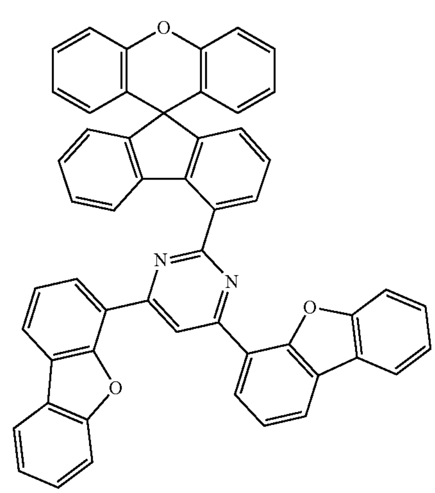

-continued
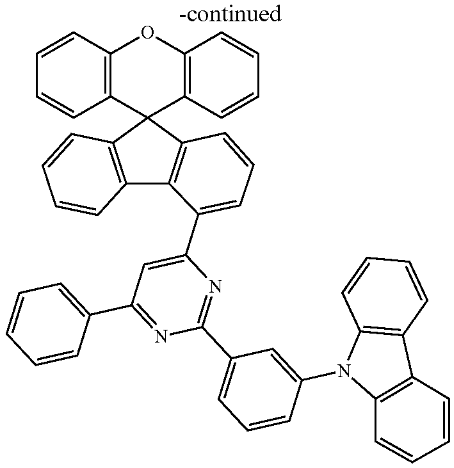
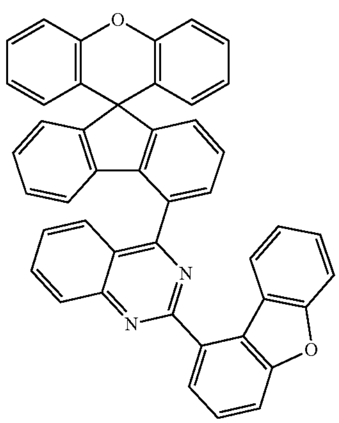
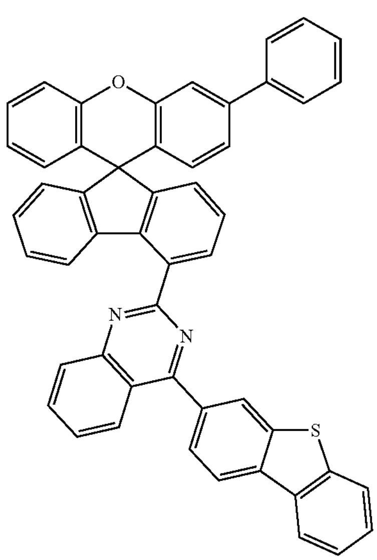 [SMILES: c1ccc(-c2ccc3c(c2)Oc2ccccc2C32c3ccccc3-c3c(-c4nc(-c5ccc6c(c5)sc5ccccc56)c5ccccc5n4)cccc32)cc1]
-continued
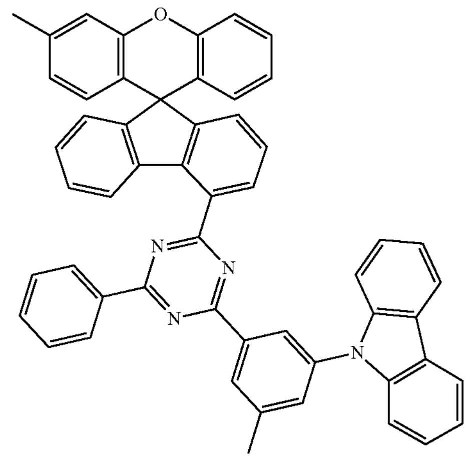
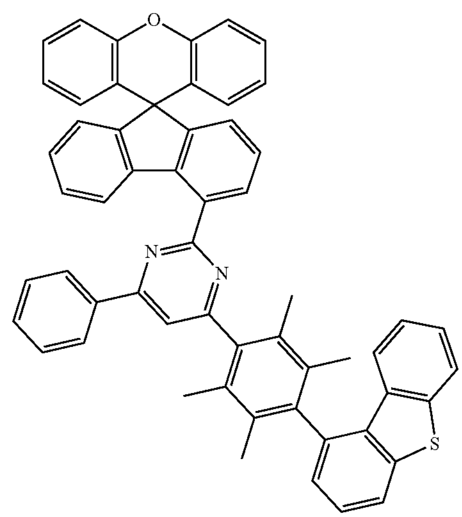
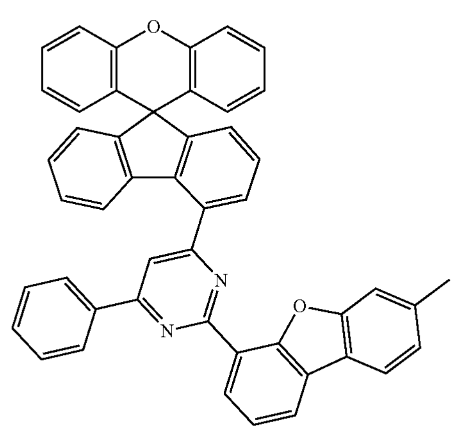

-continued
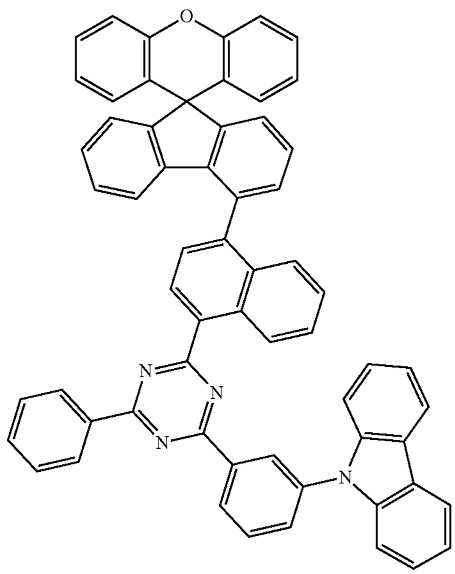
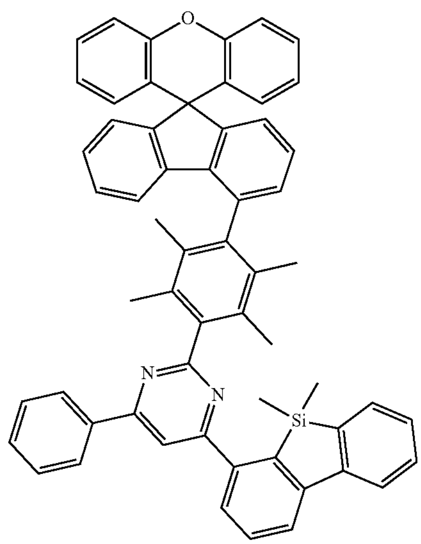
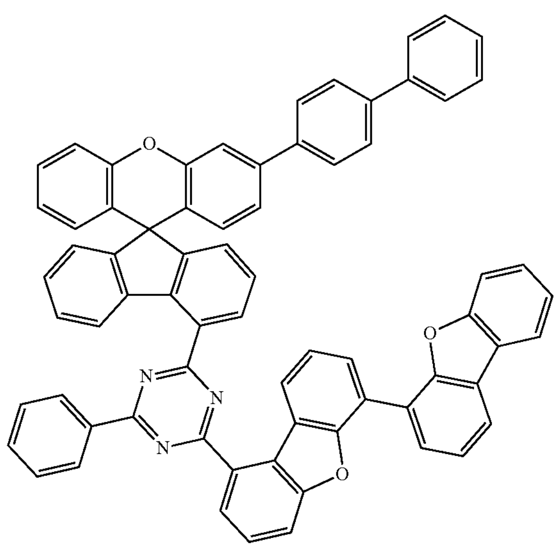
-continued
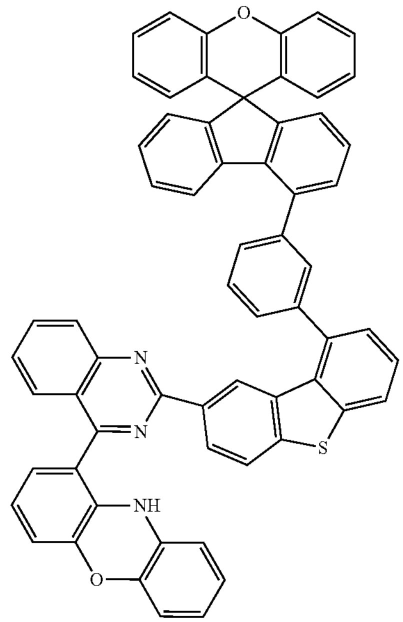
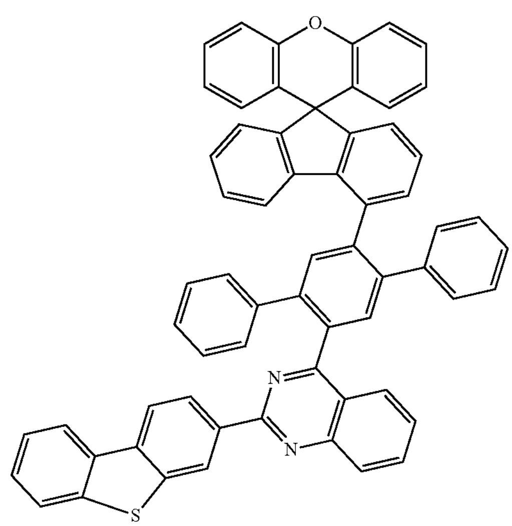

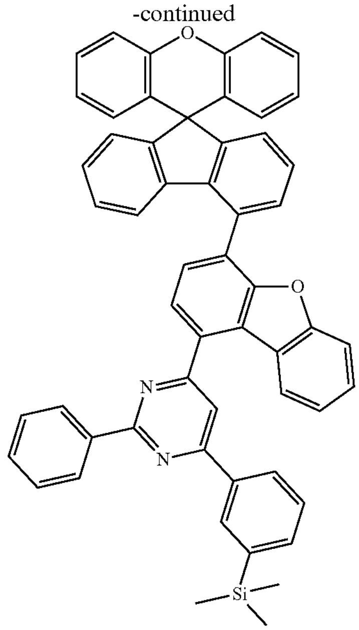
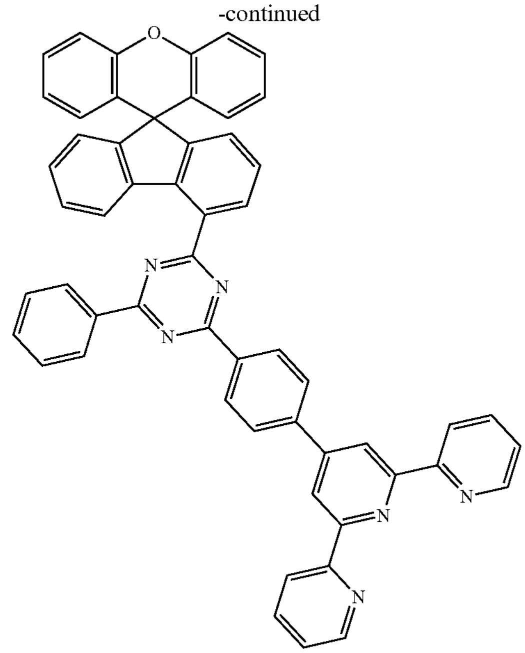
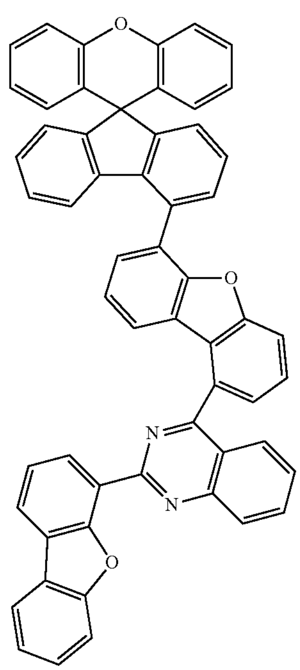
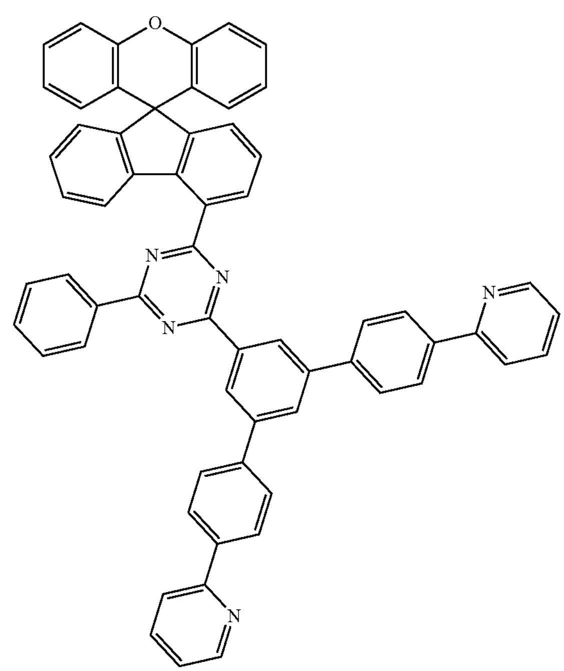

-continued
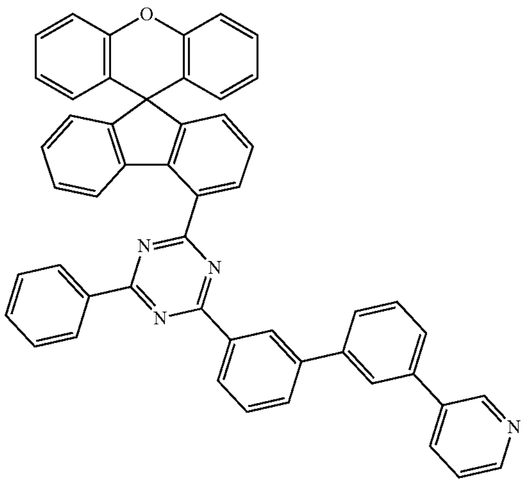
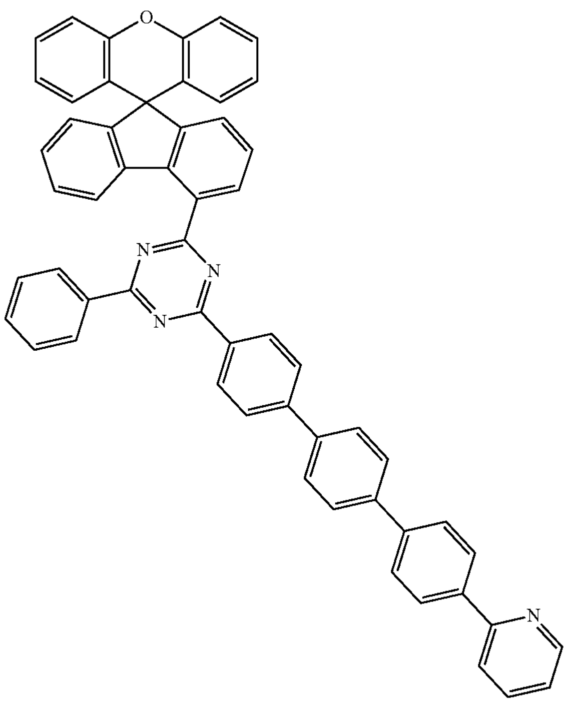
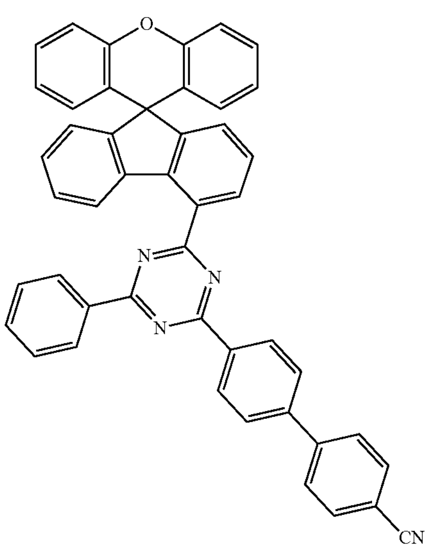
-continued
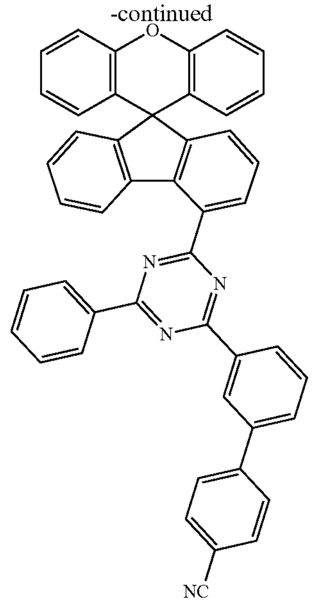
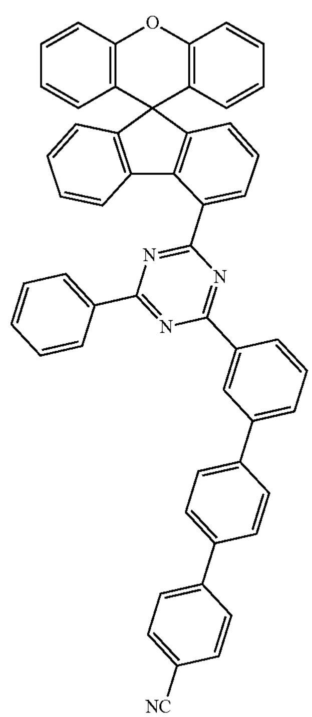

-continued
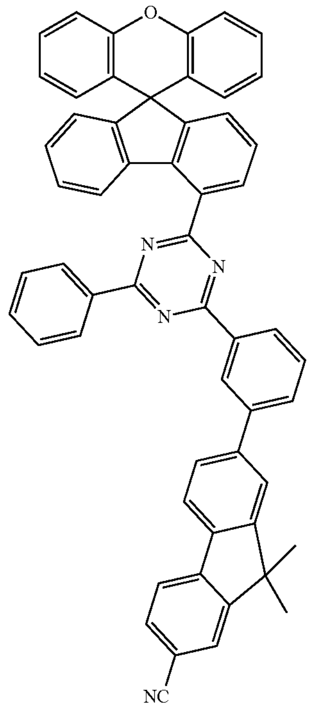
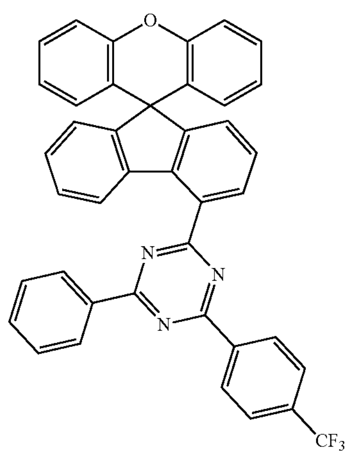
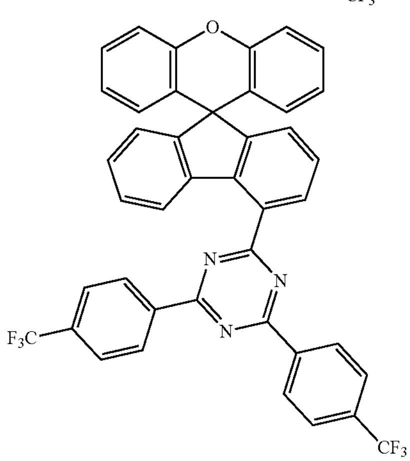
-continued
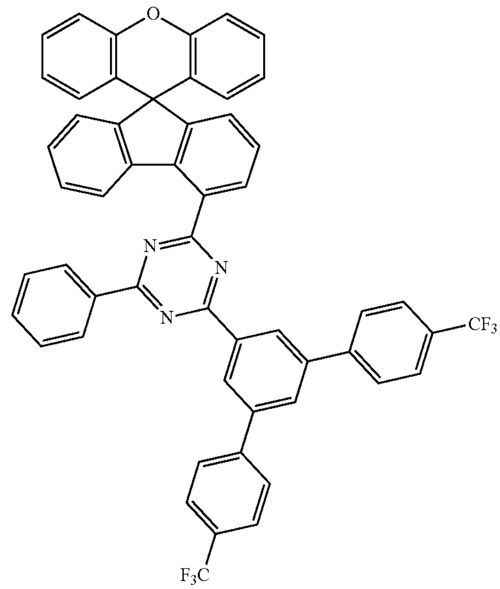
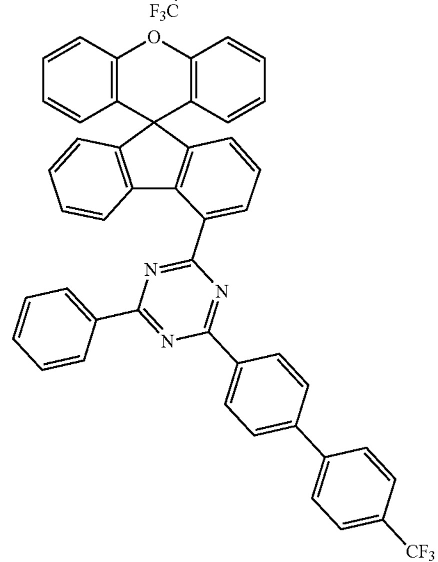
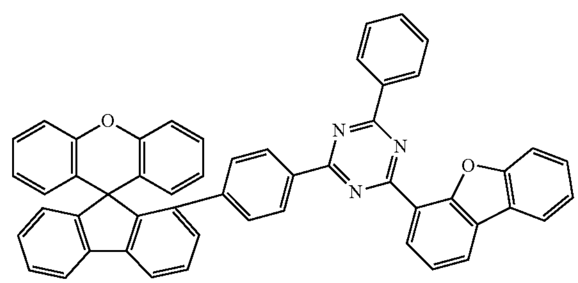
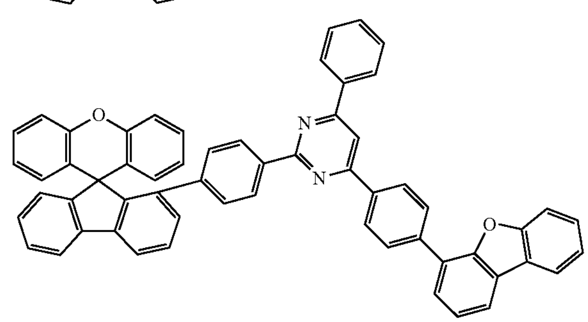

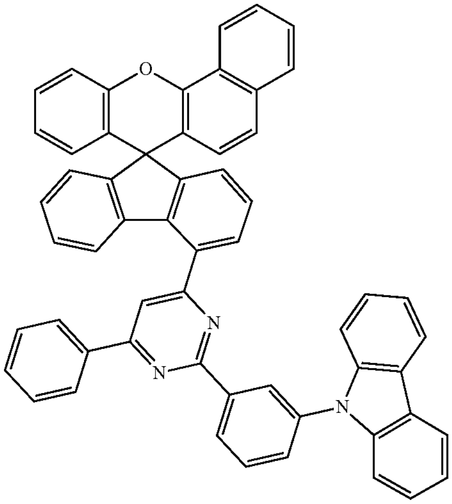
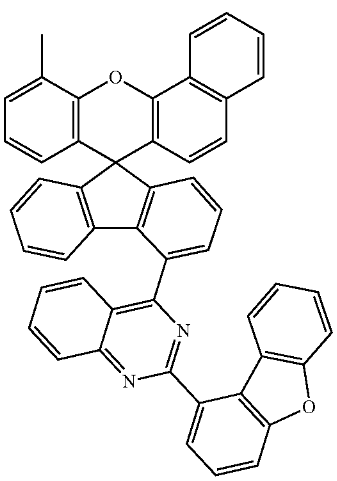
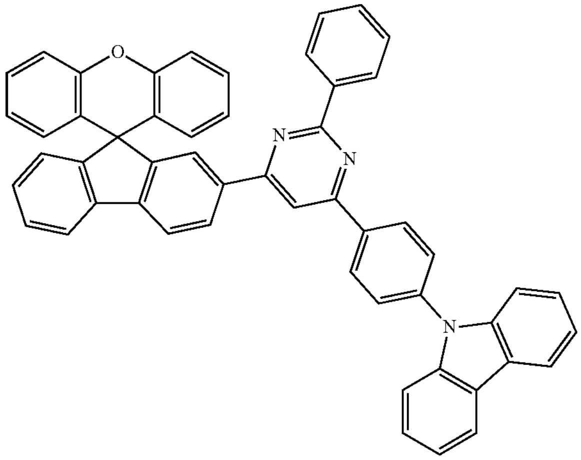
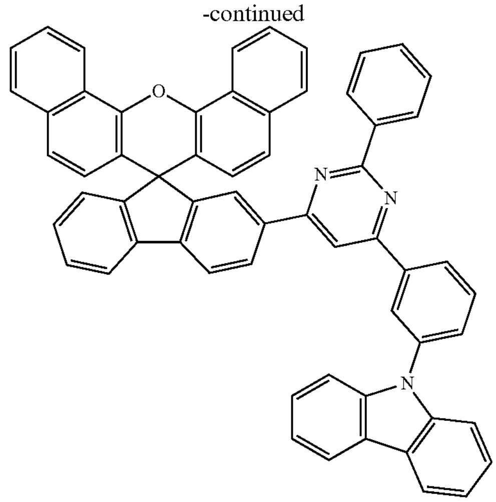
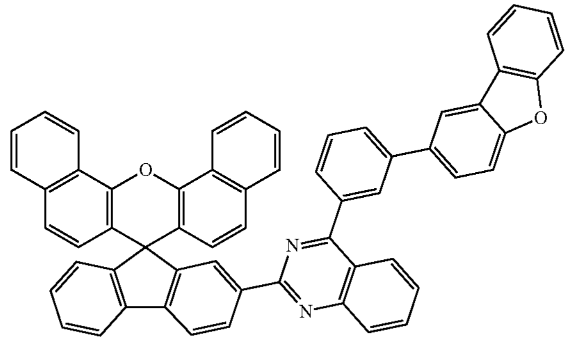
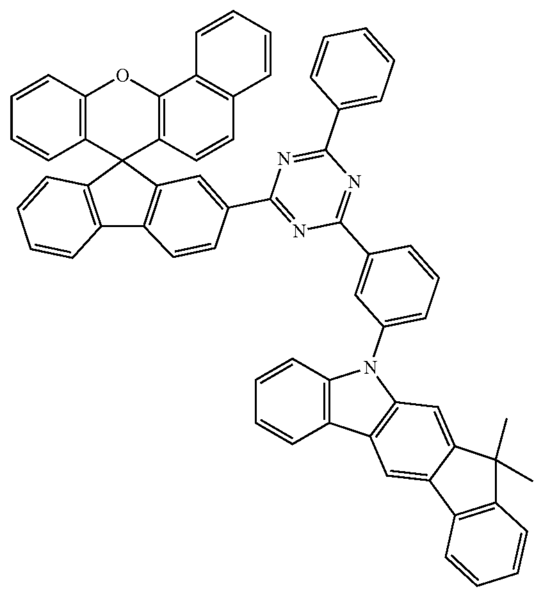
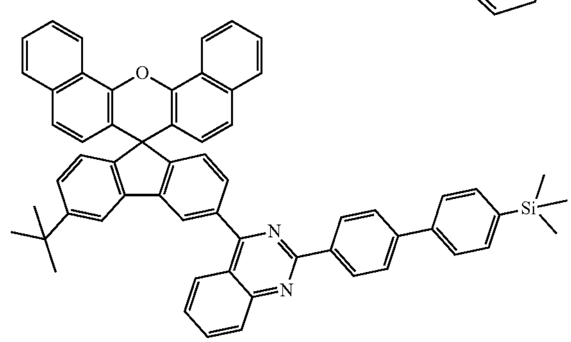

-continued
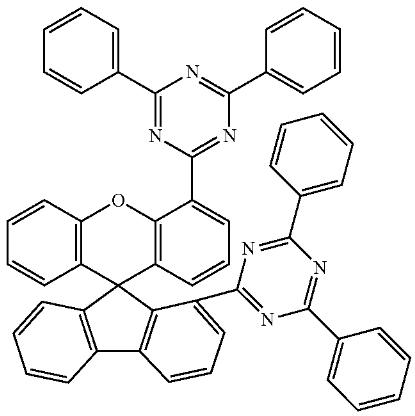
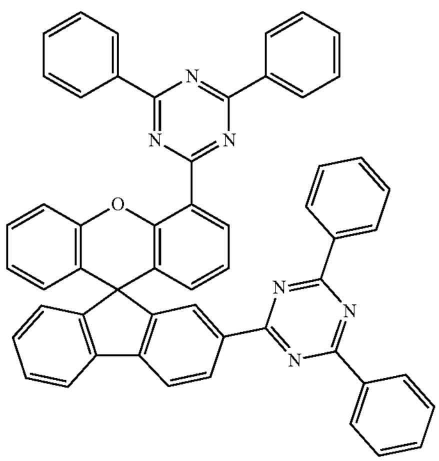
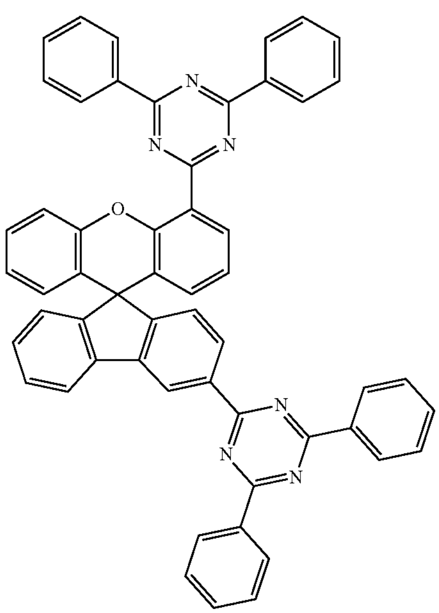
-continued
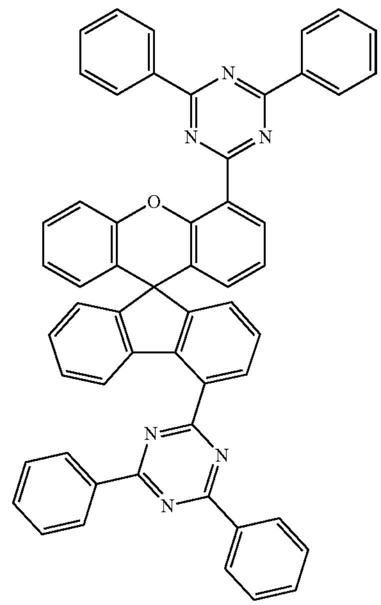
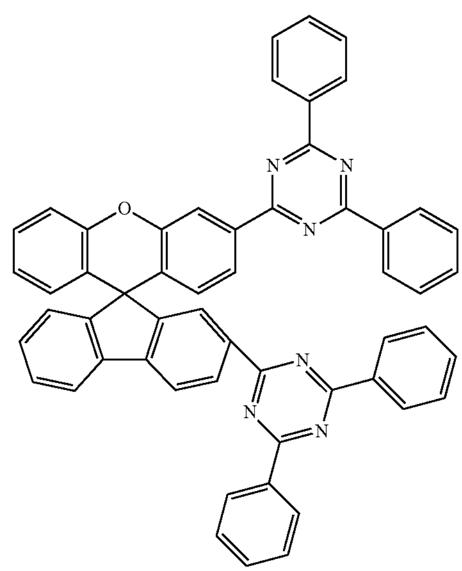

-continued
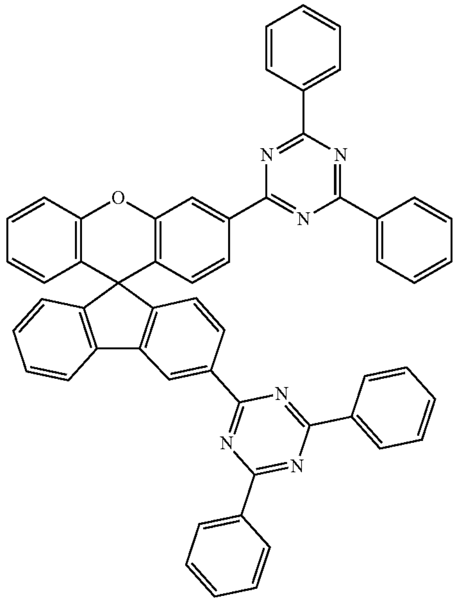
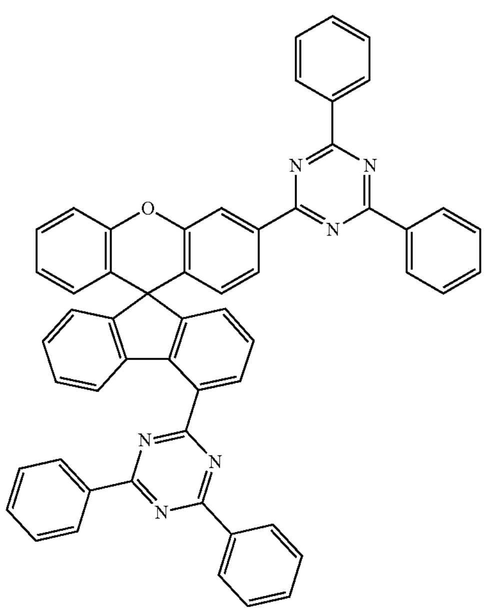
-continued
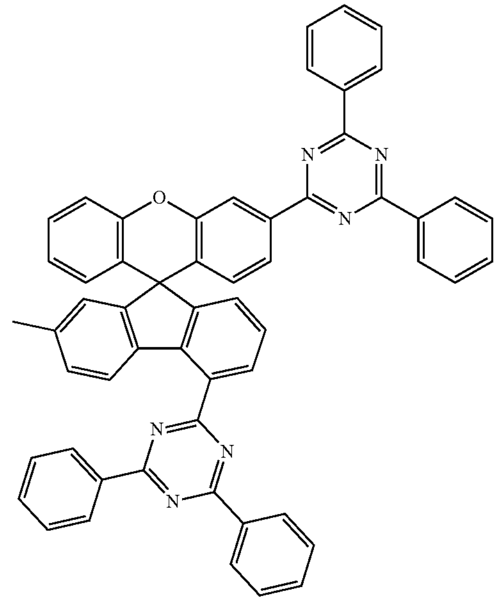
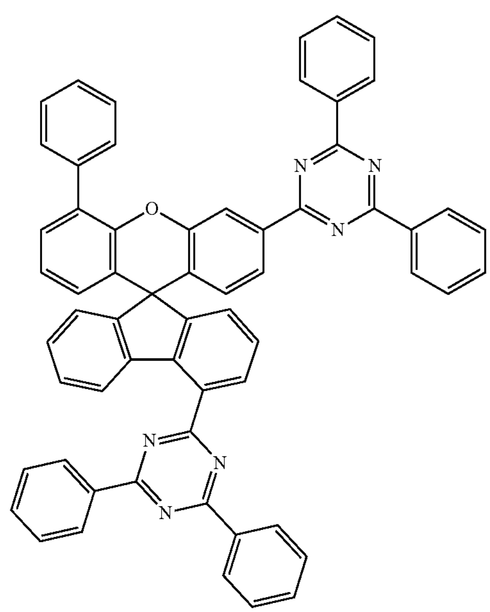

-continued
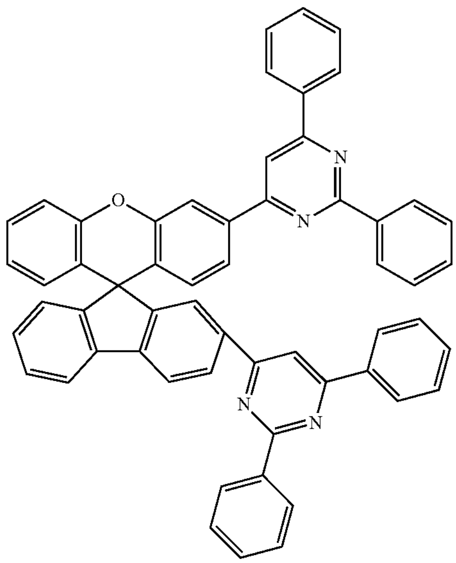
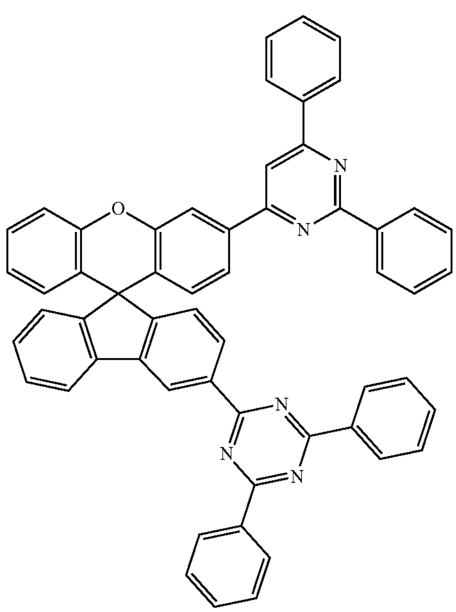
-continued
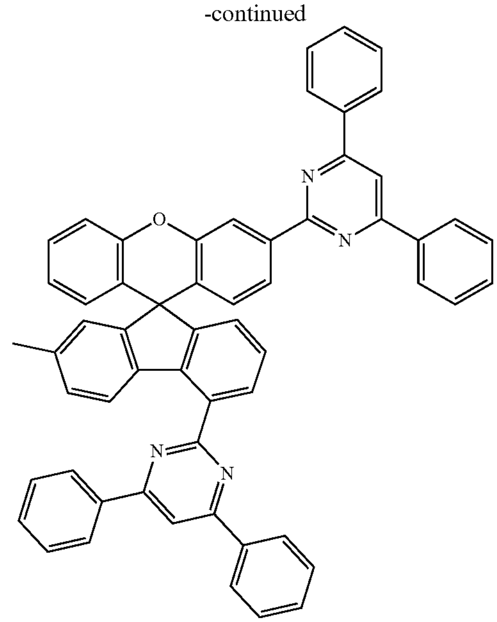
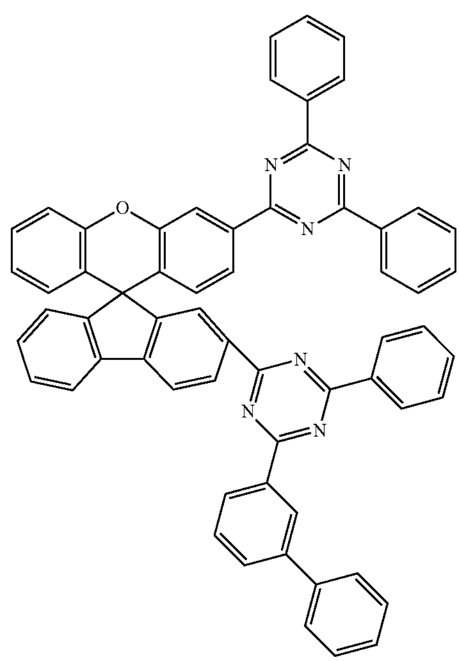

-continued
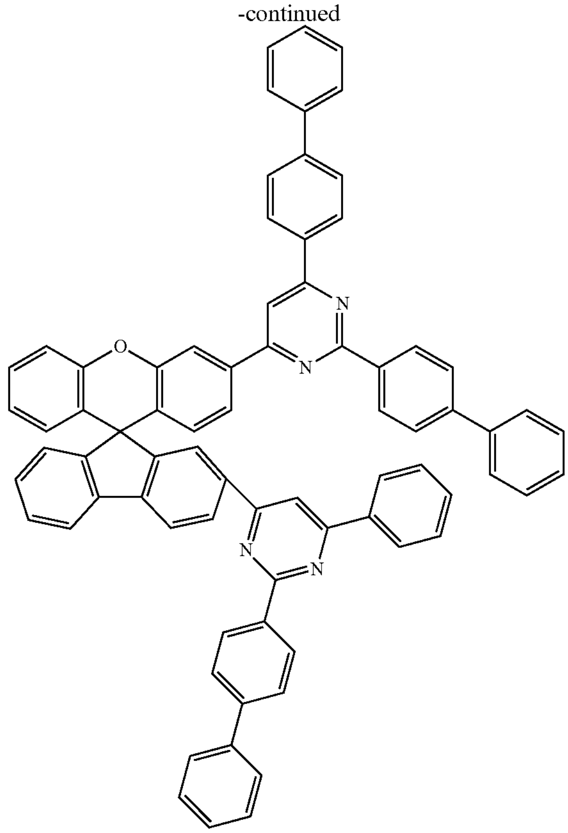
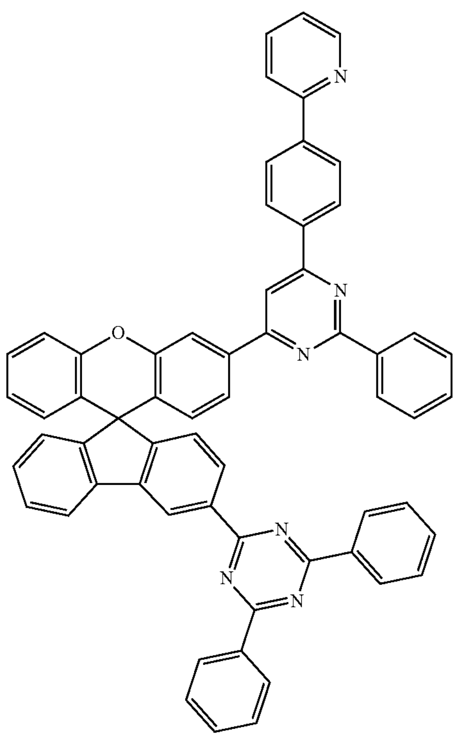
-continued
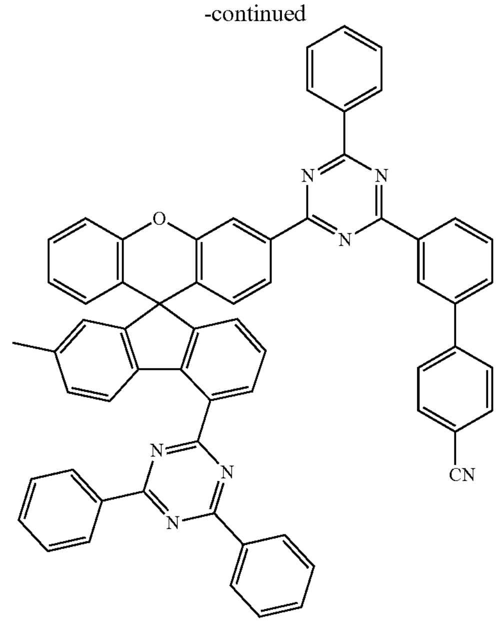
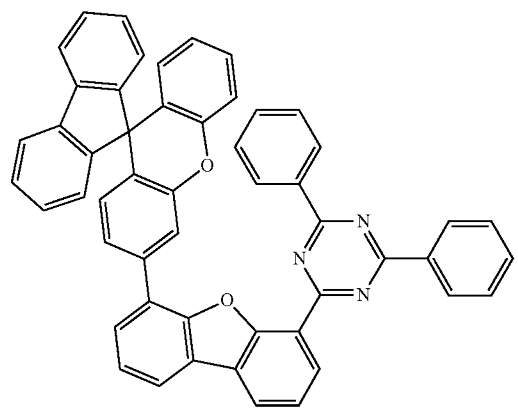
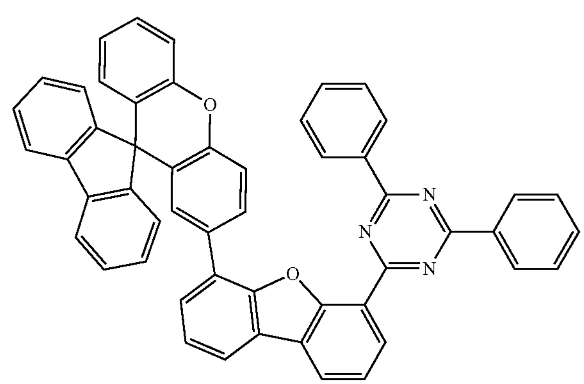

-continued
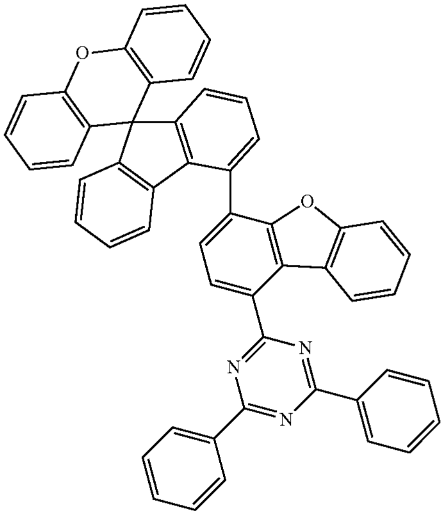
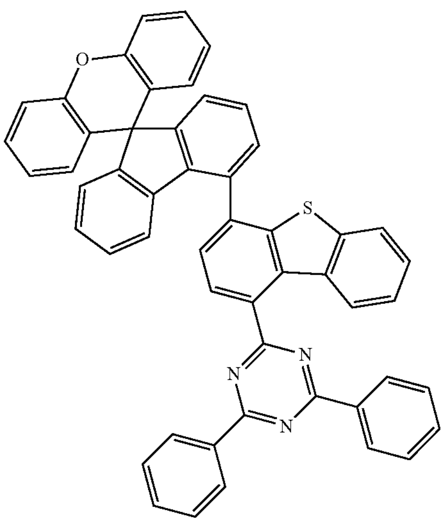
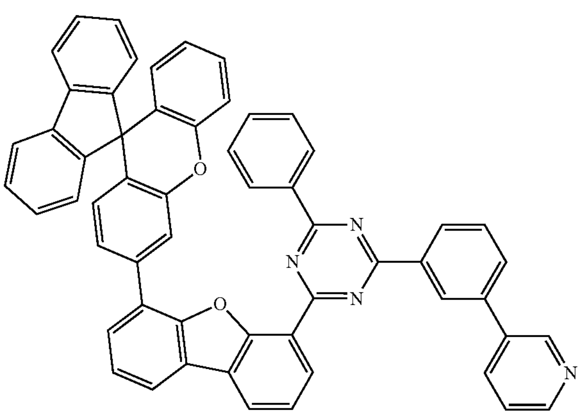
-continued
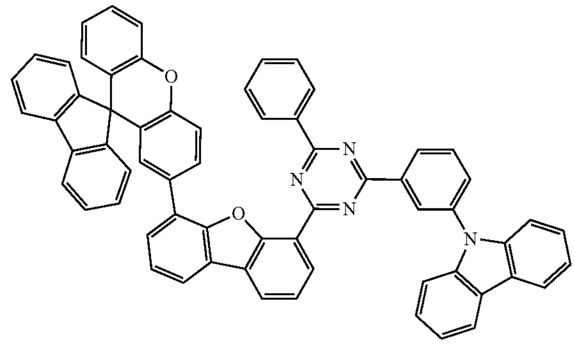
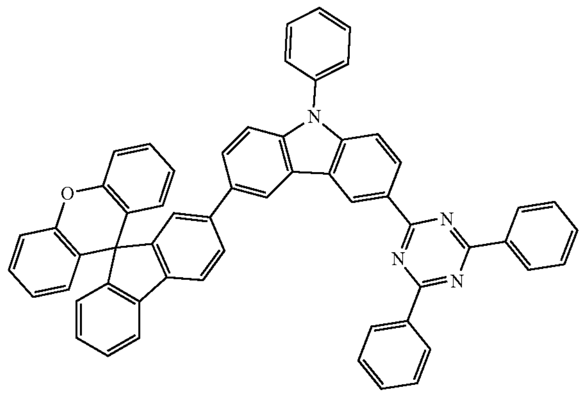
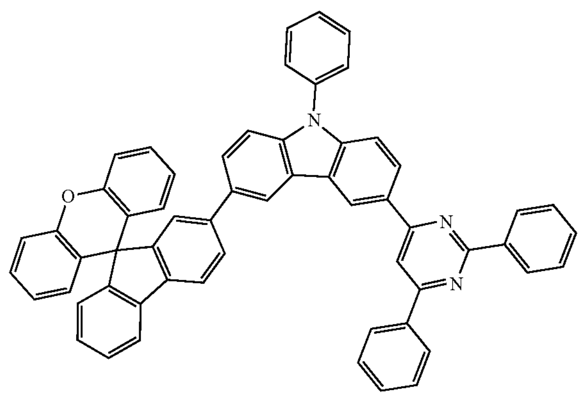
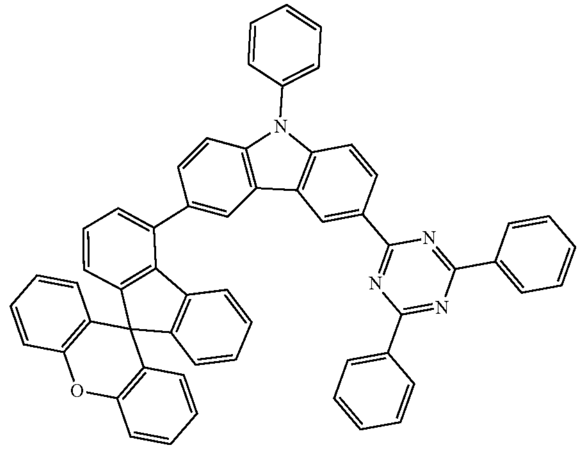

-continued
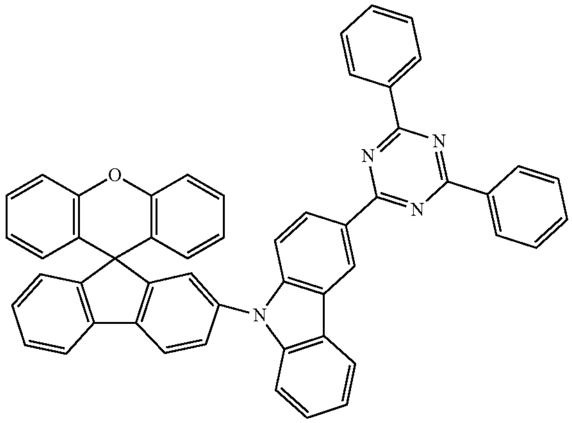
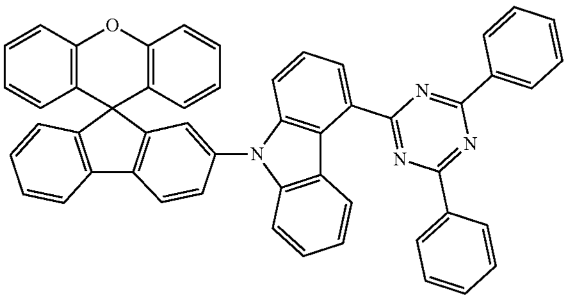
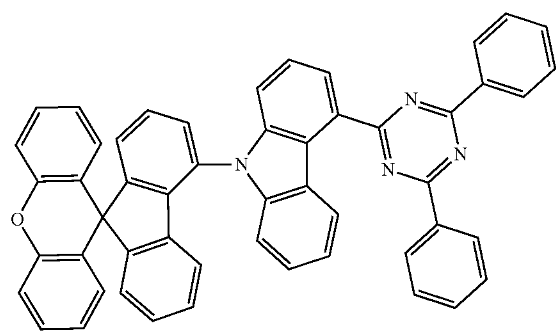
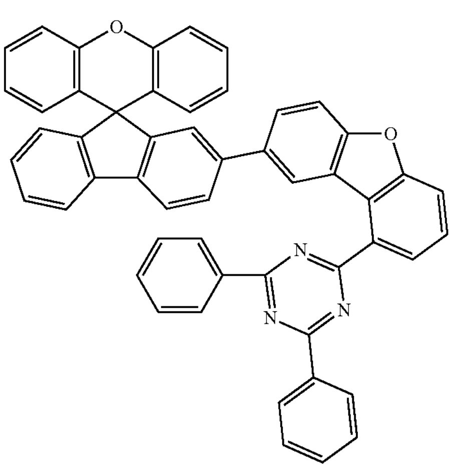
-continued
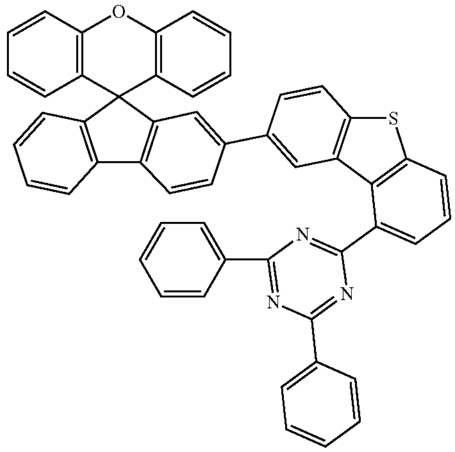
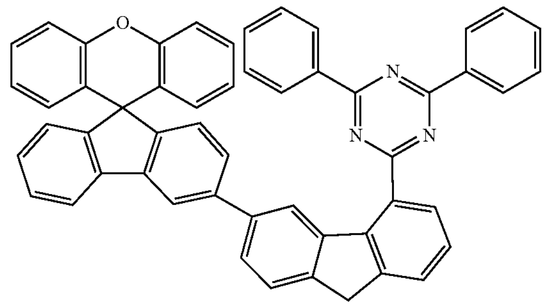
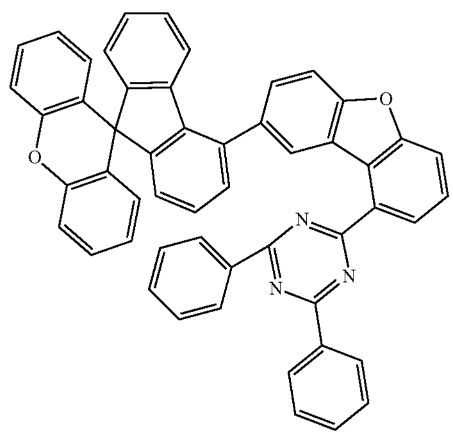
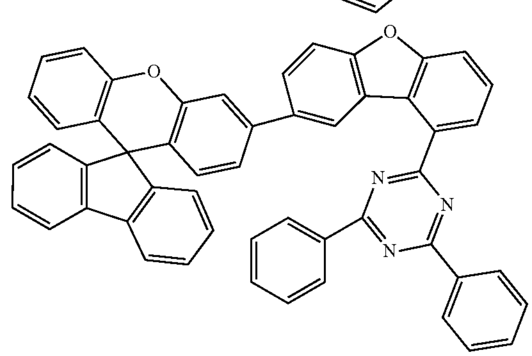

-continued
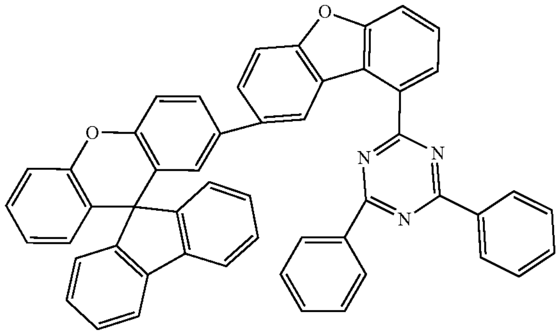
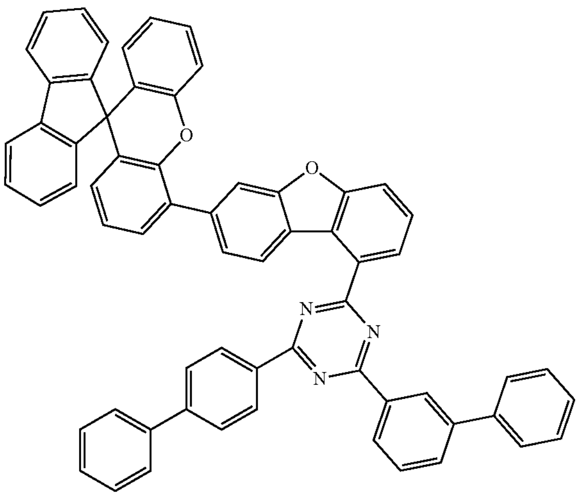
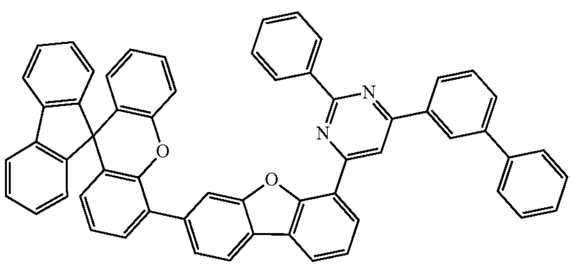
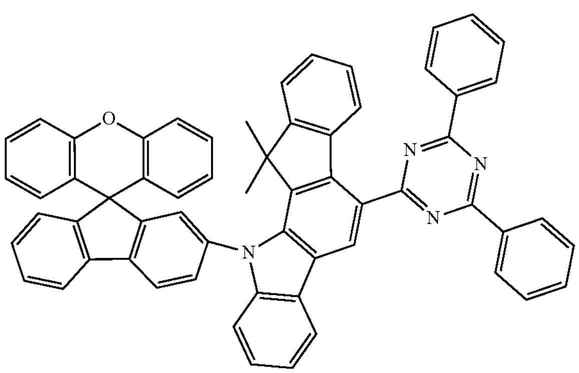
-continued
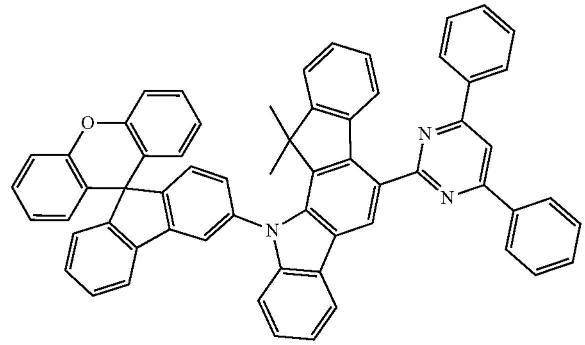
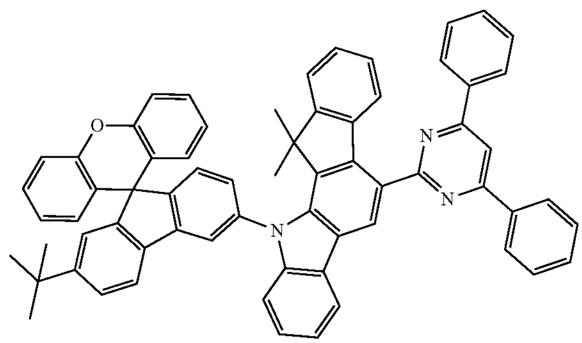
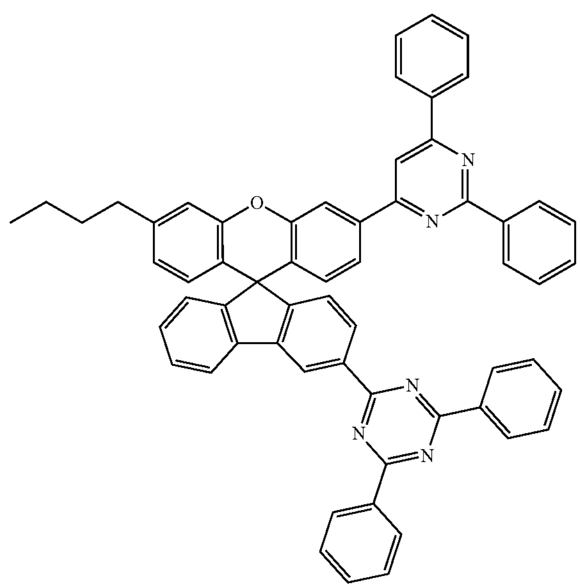

-continued
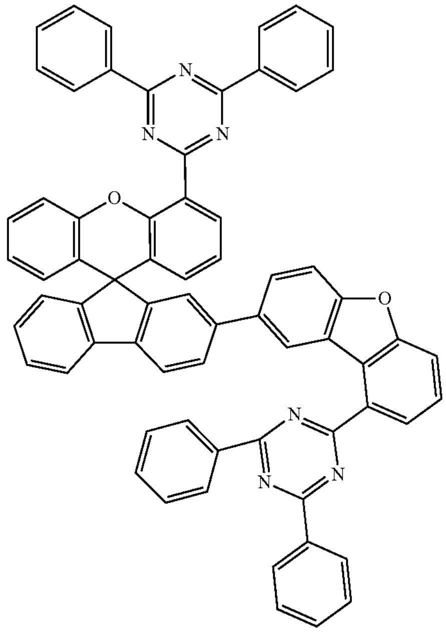
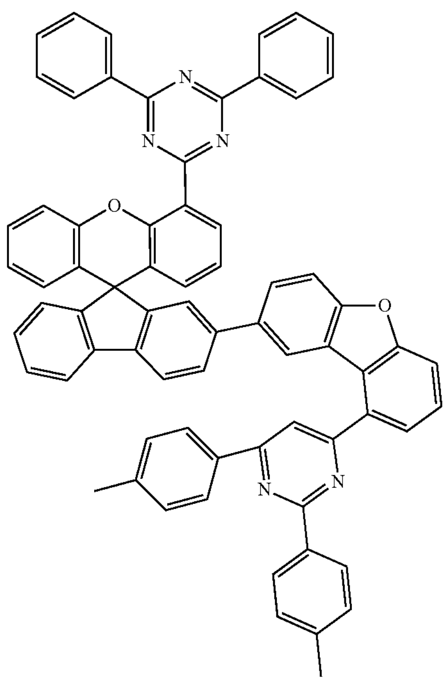
-continued
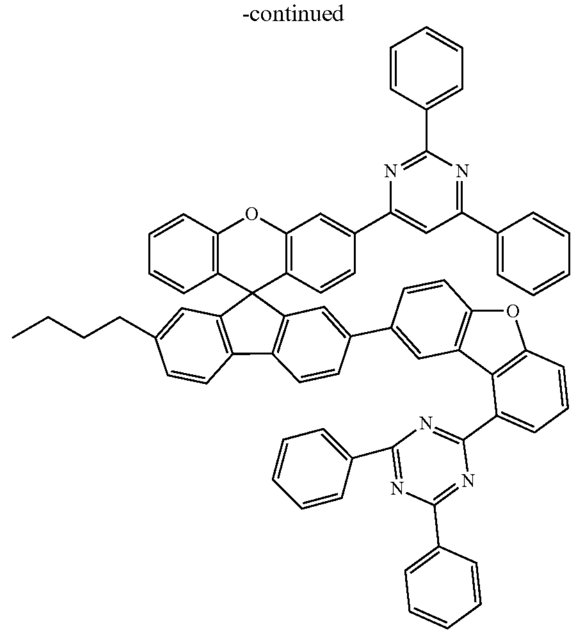
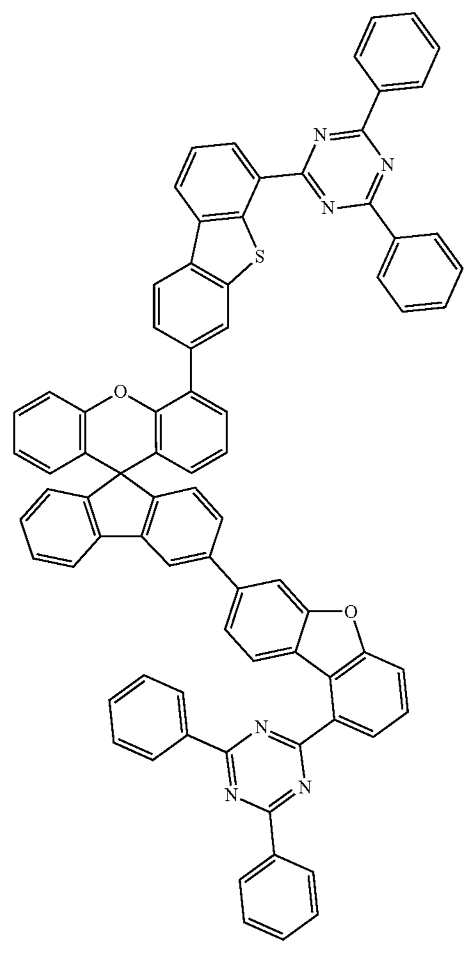

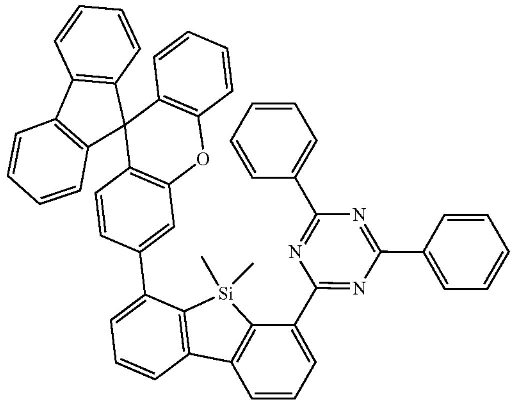
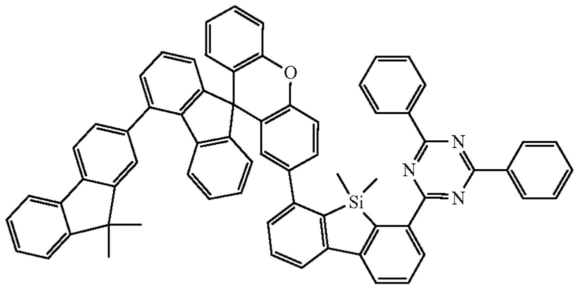
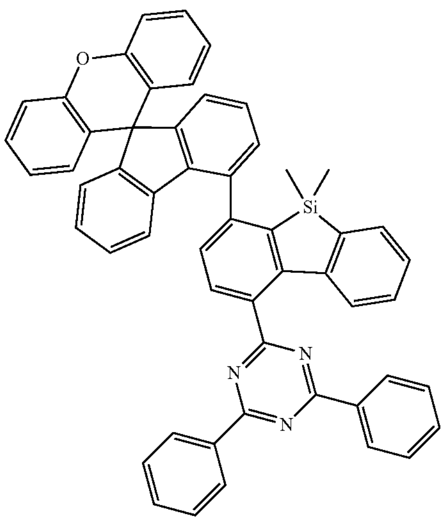
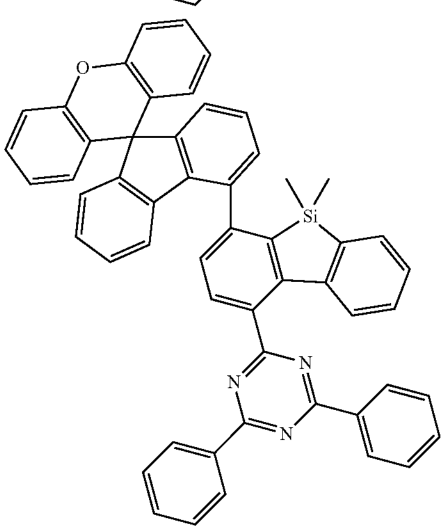
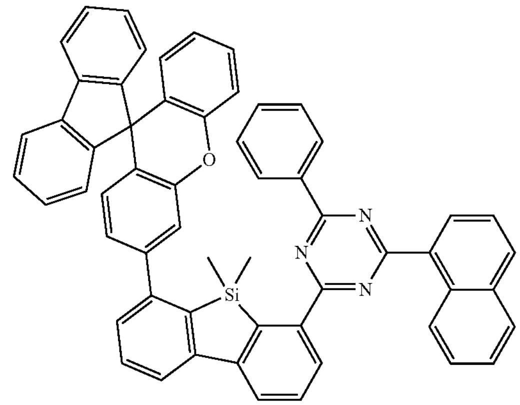
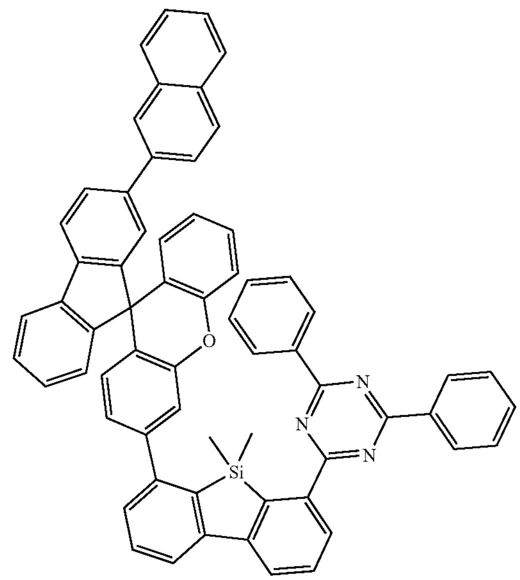
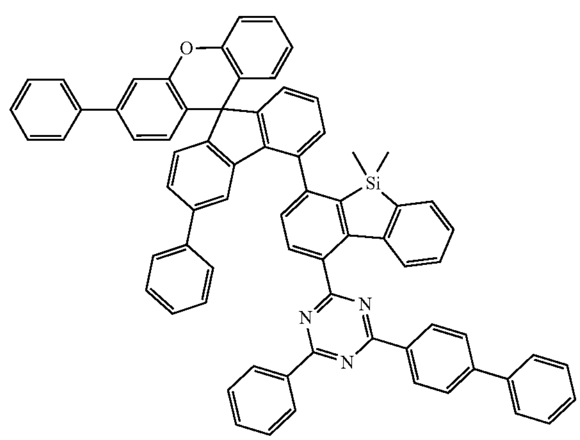

-continued
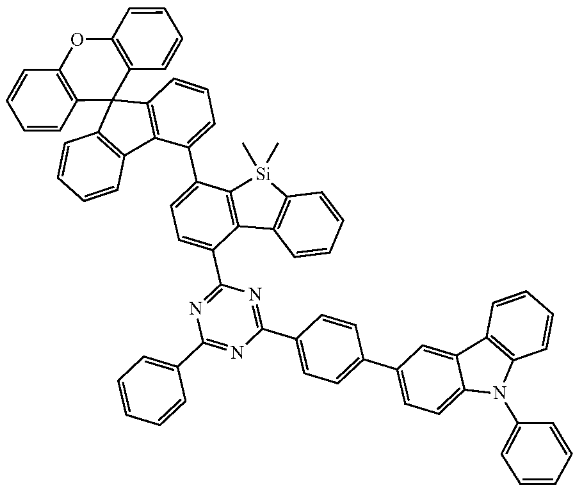
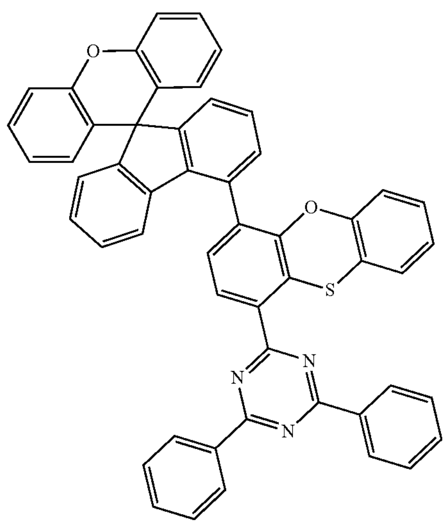
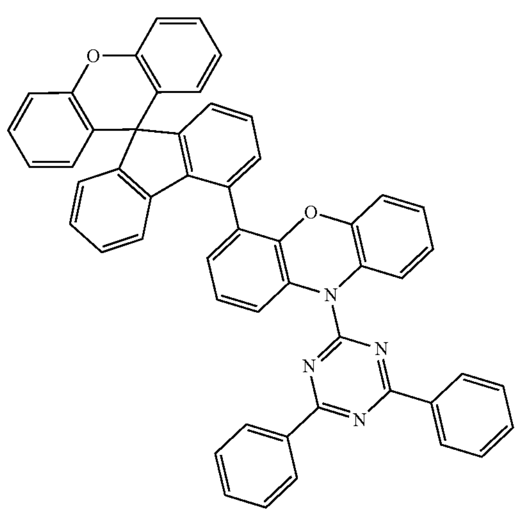
-continued
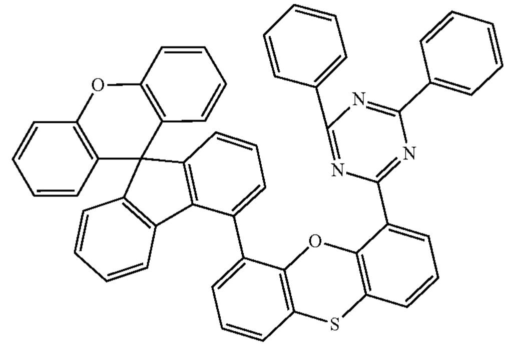
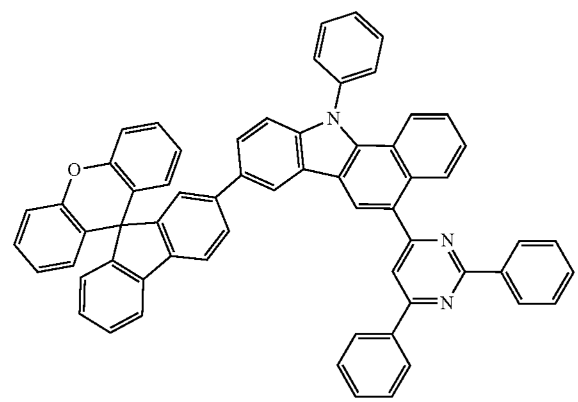
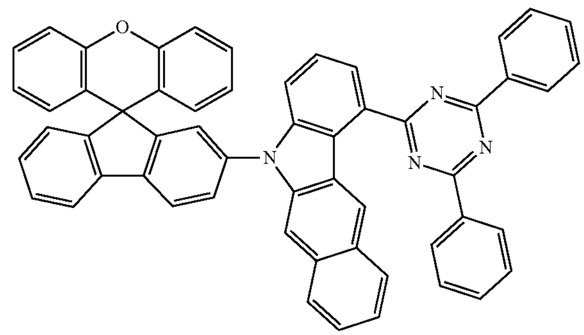
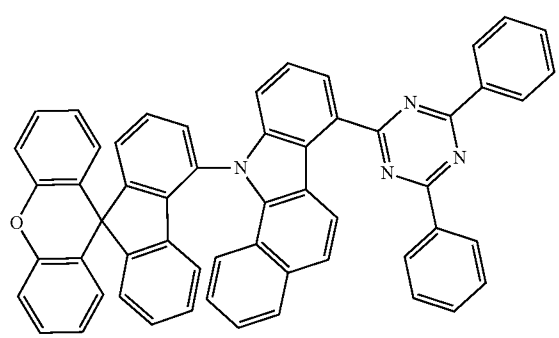

-continued
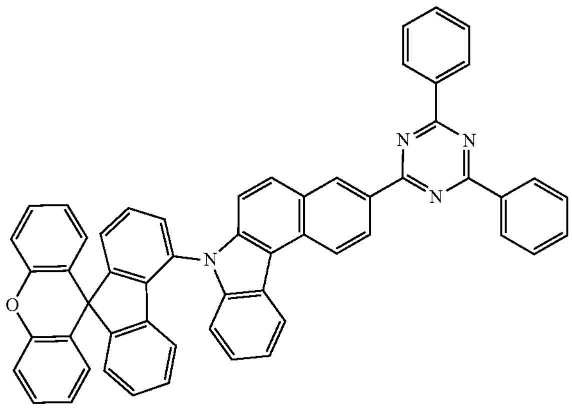
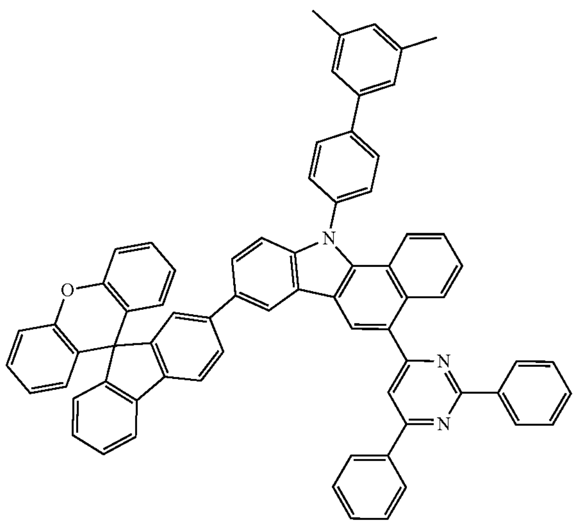
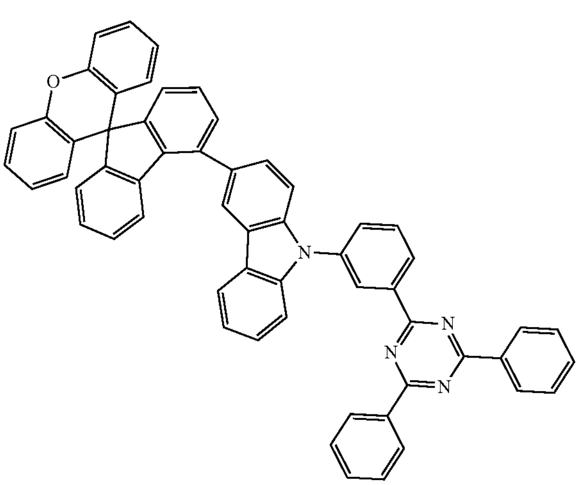
-continued
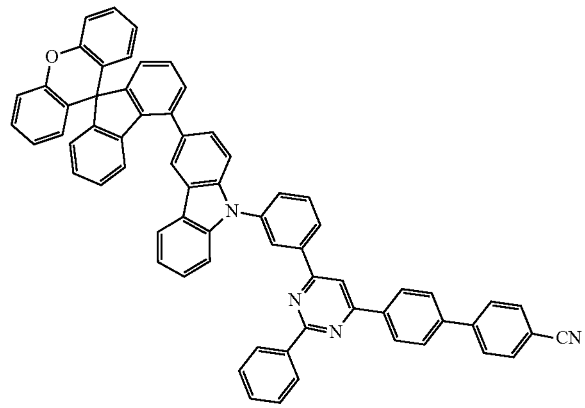
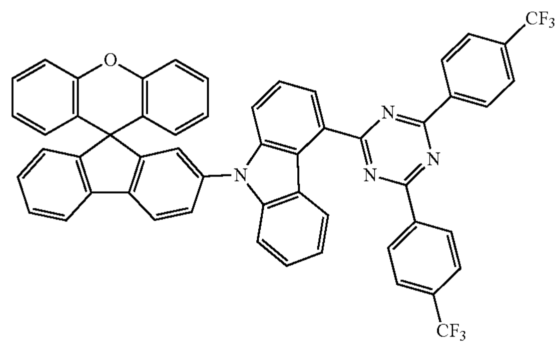
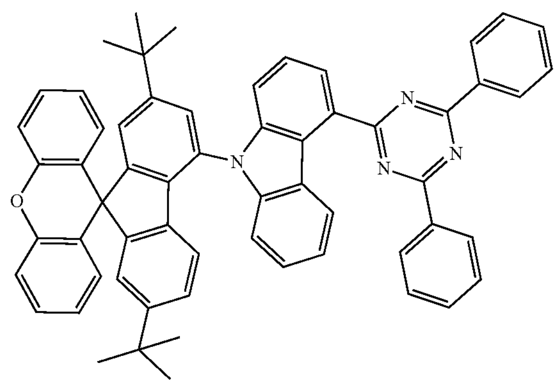
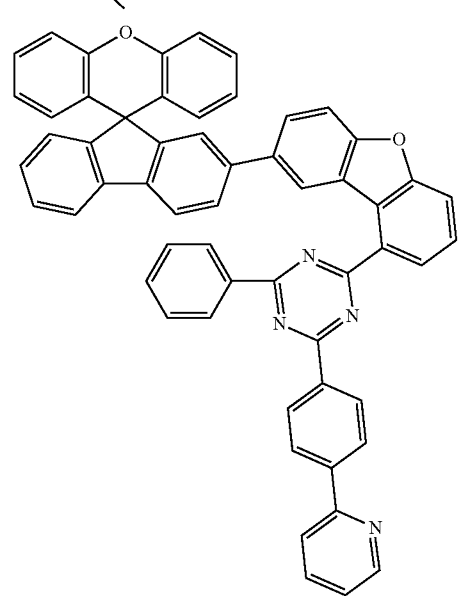

-continued
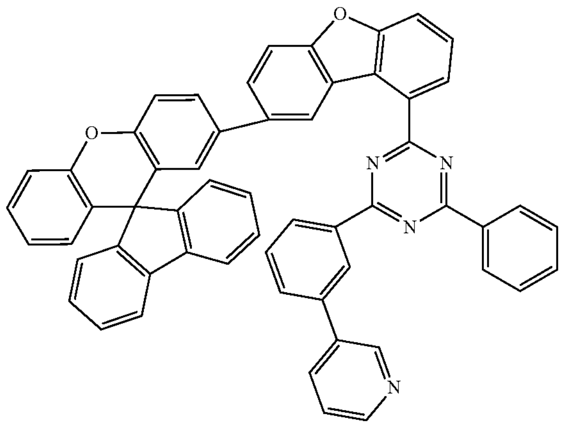
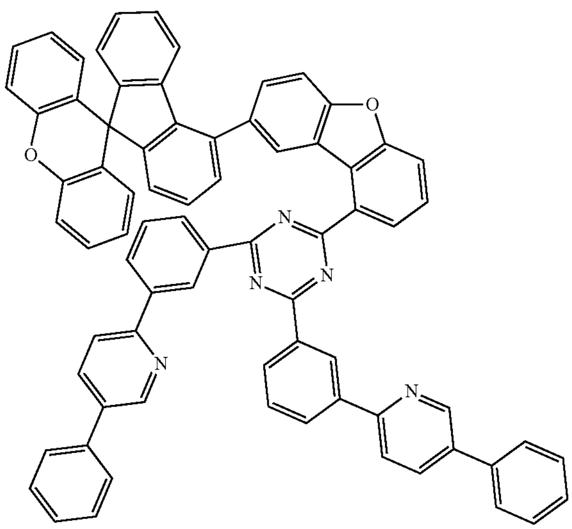
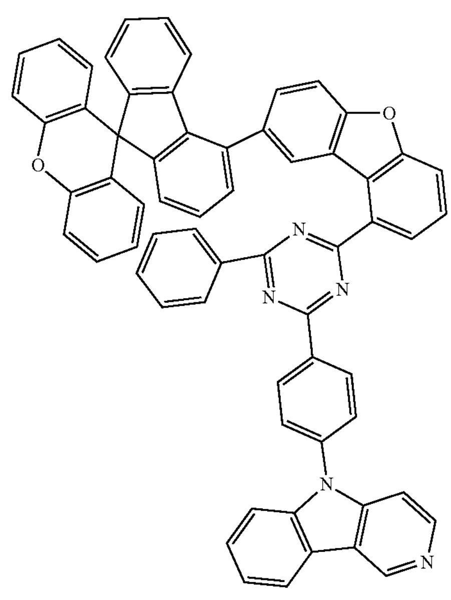
-continued
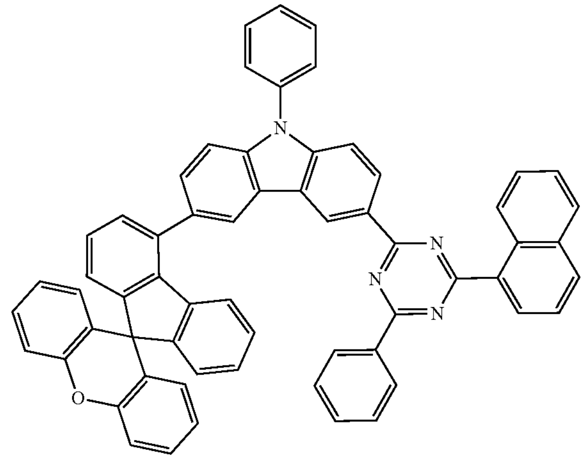
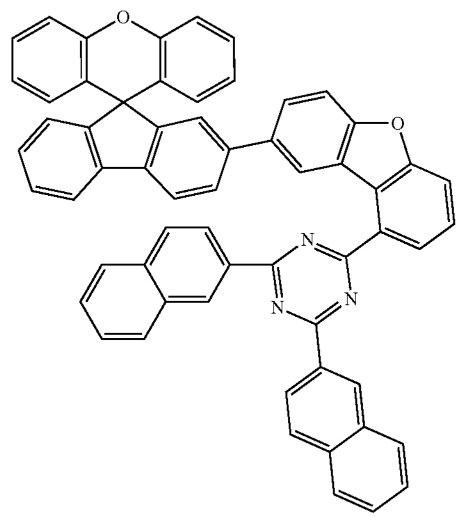
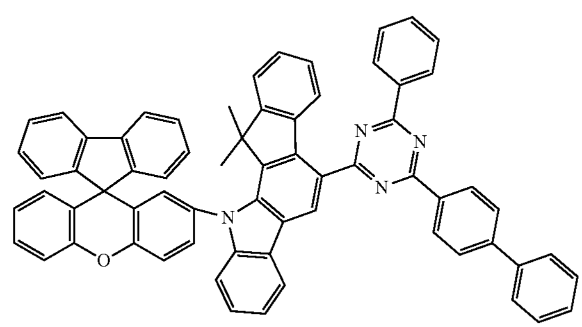 [SMILES: CC1(C)c2ccccc2-c2c(-c3nc(-c4ccccc4)nc(-c4ccc(-c5ccccc5)cc4)n3)cc3c4ccccc4n(-c4ccc5c(c4)C4(c6ccccc6O5)c5ccccc5-c5ccccc54)c3c21]
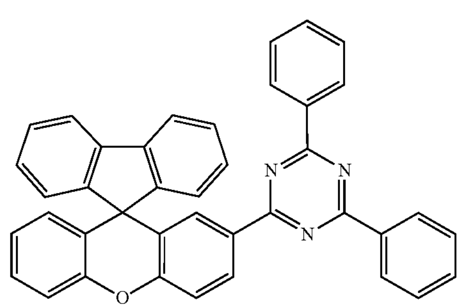

-continued
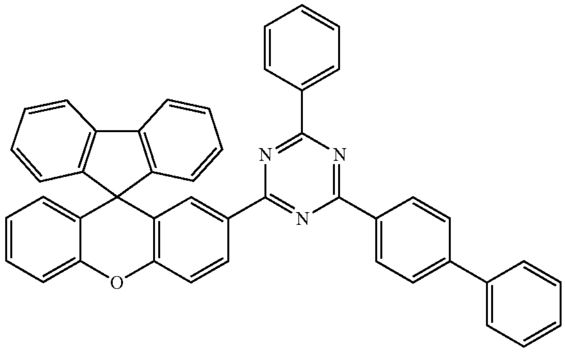
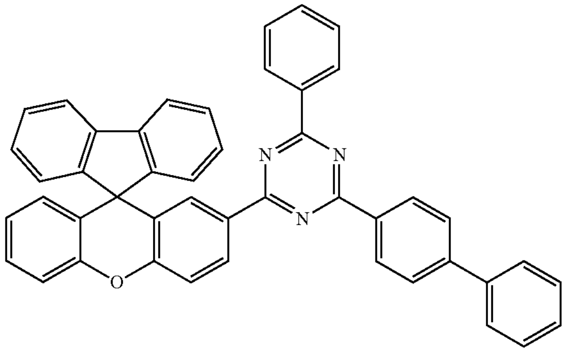
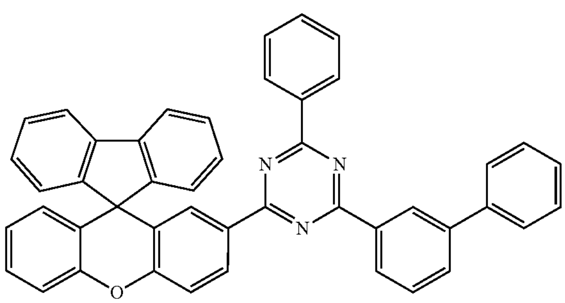
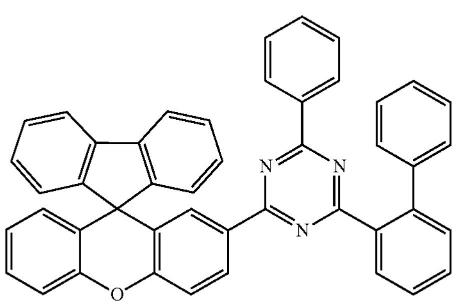
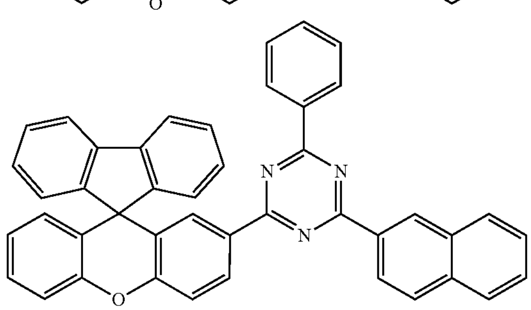
-continued
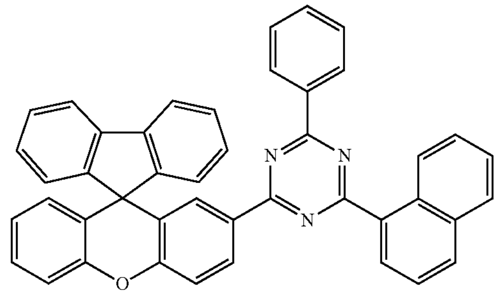
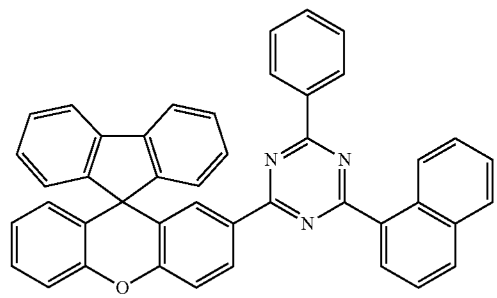
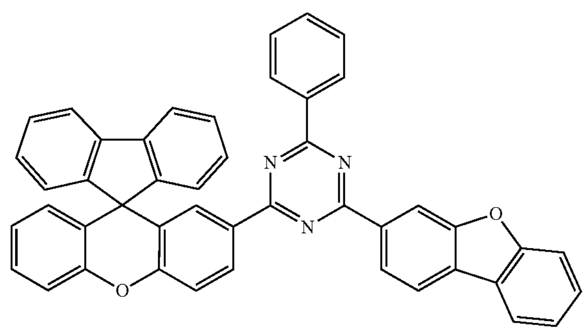
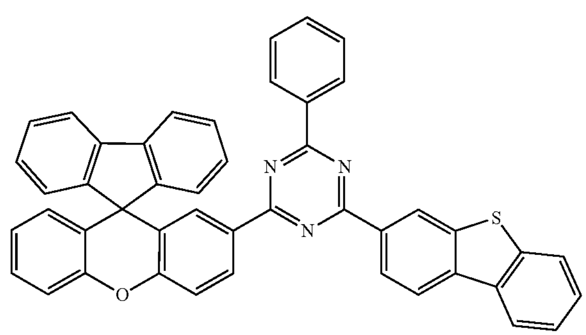
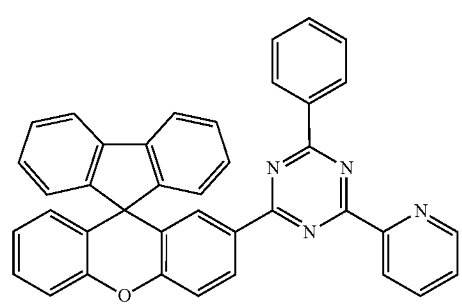

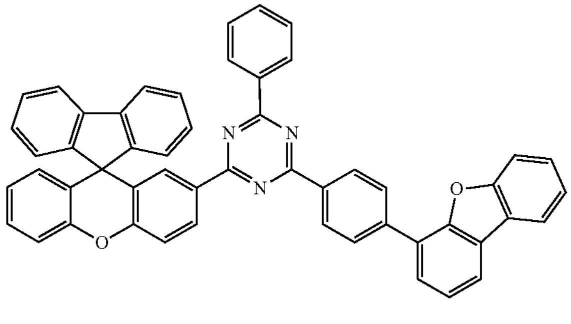
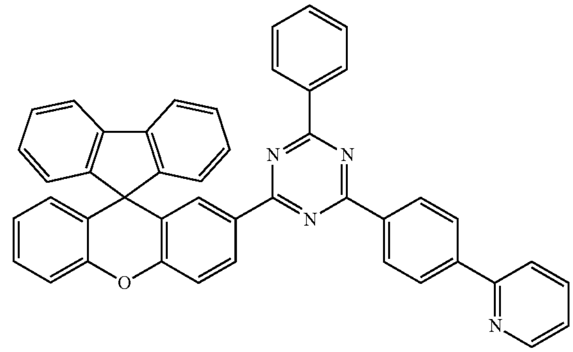 [SMILES: c1ccc(-c2nc(-c3ccc(-c4ccccn4)cc3)nc(-c3ccc4c(c3)C3(c5ccccc5O4)c4ccccc4-c4ccccc43)n2)cc1]
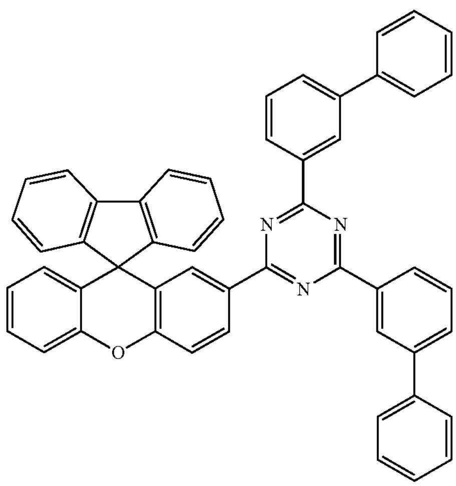
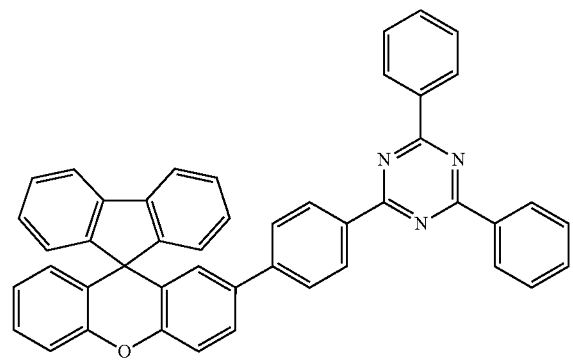
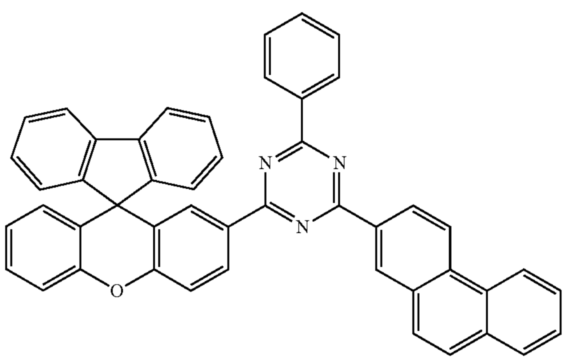
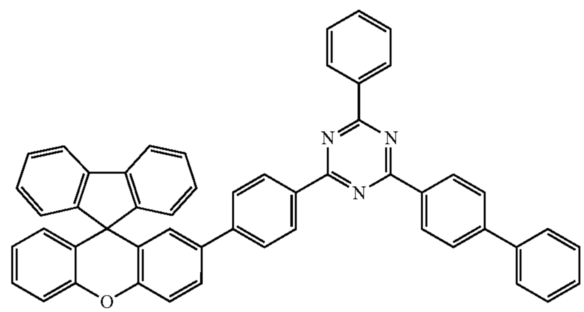
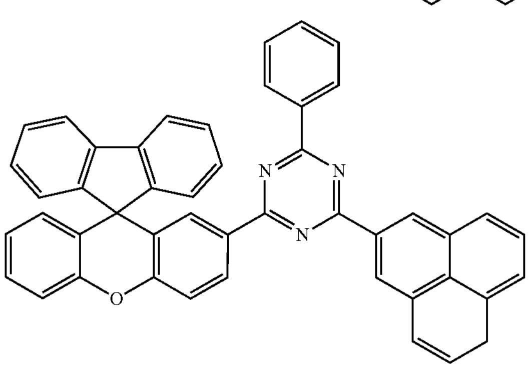
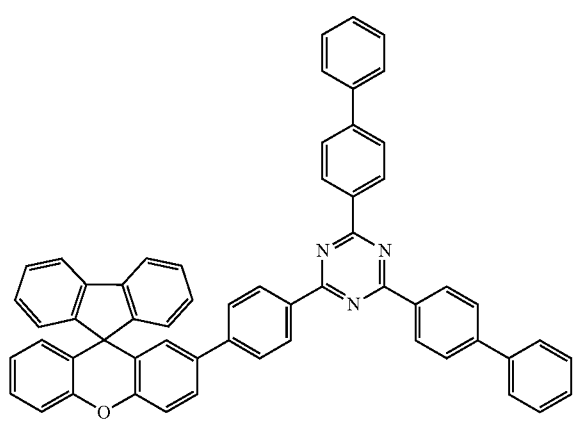

-continued
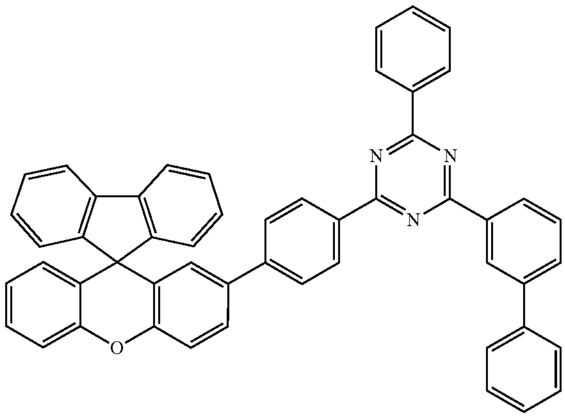
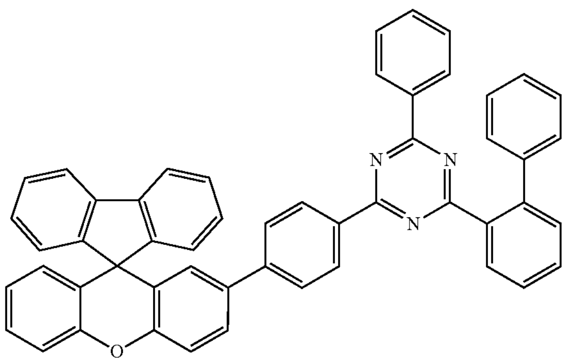
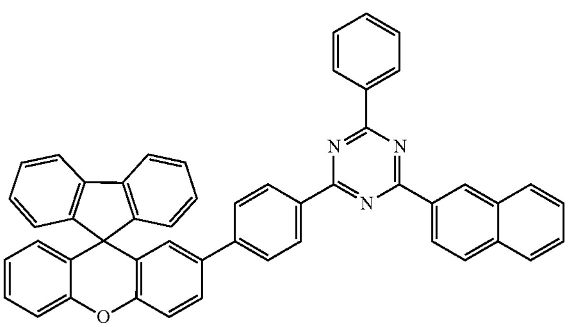
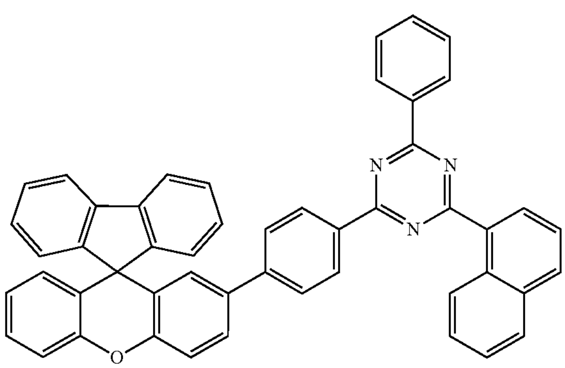
-continued
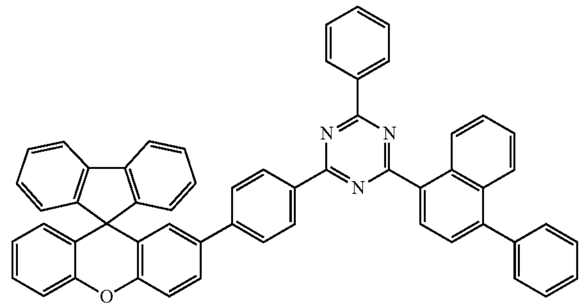
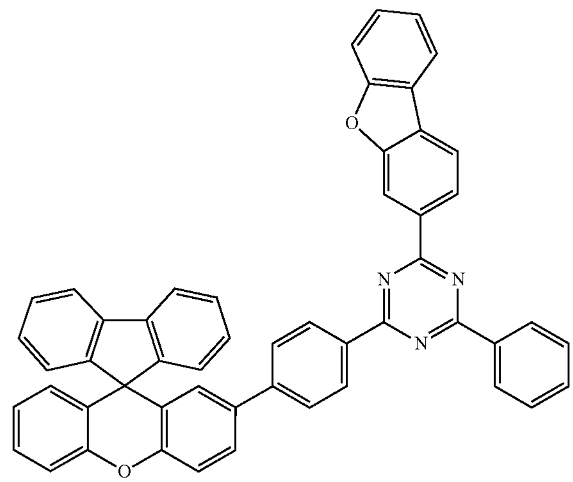
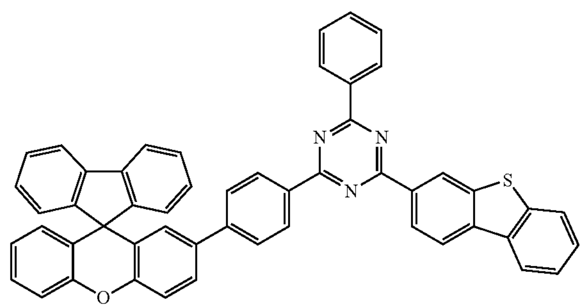
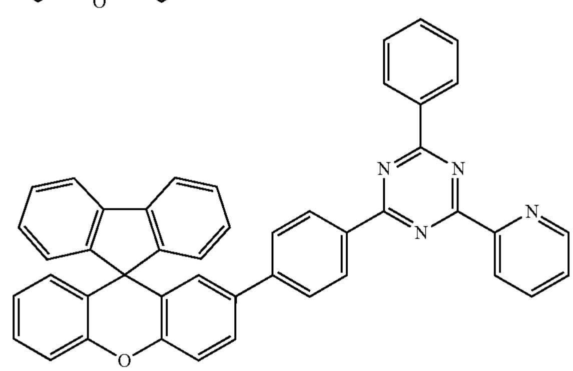
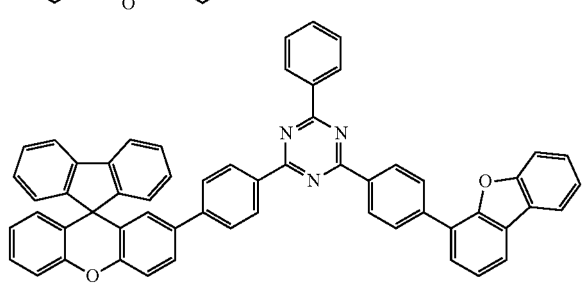

-continued
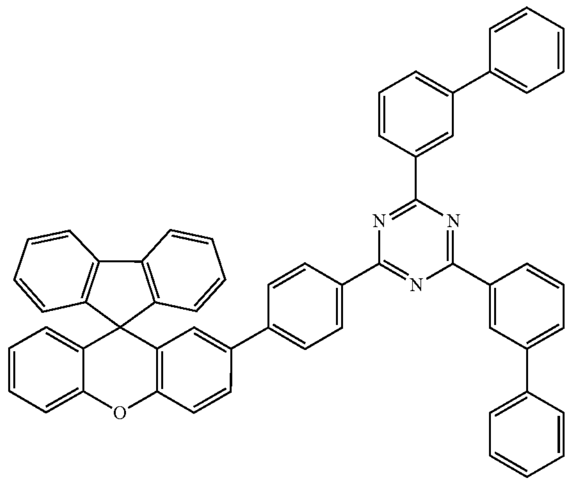
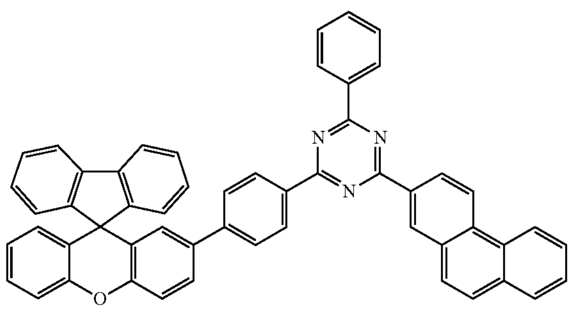
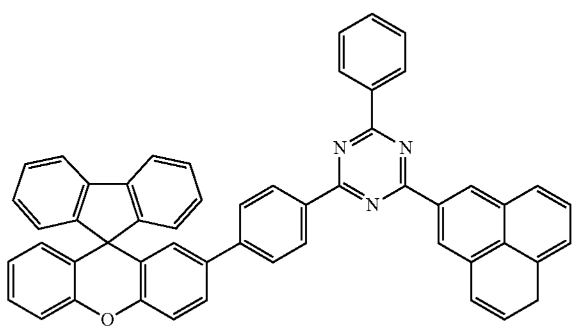
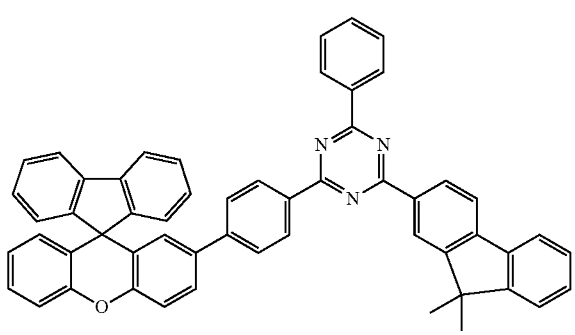 [SMILES: CC1(C)c2ccccc2-c2ccc(-c3nc(-c4ccccc4)nc(-c4ccc(-c5ccc6c(c5)C5(c7ccccc7O6)c6ccccc6-c6ccccc65)cc4)n3)cc21]
-continued
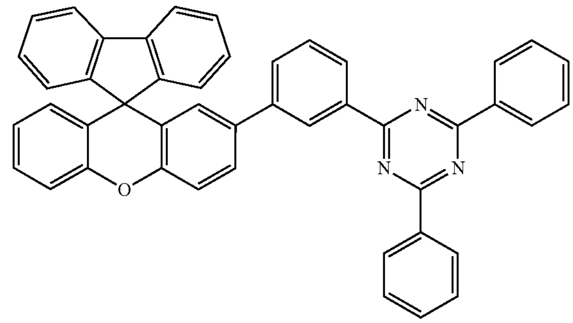
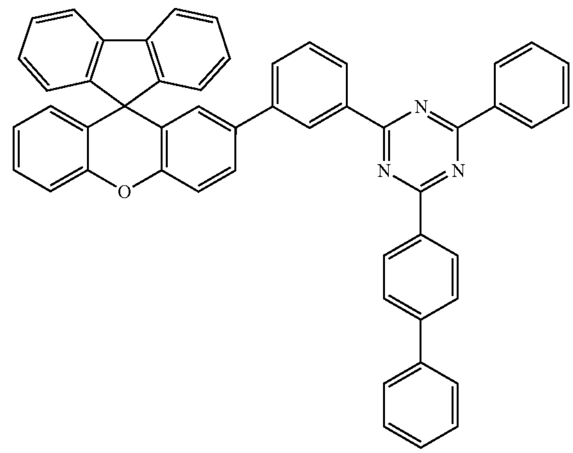
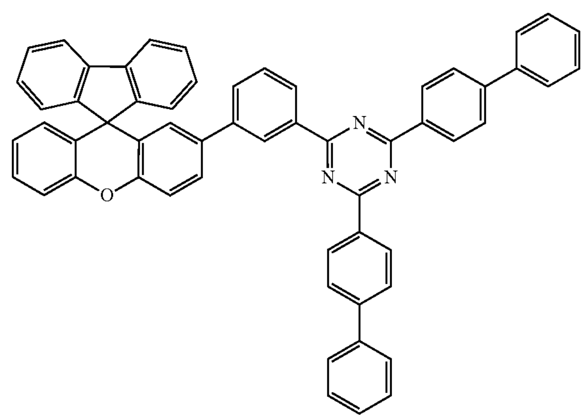
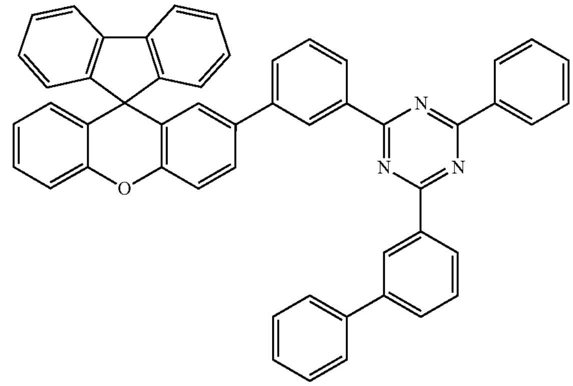

-continued
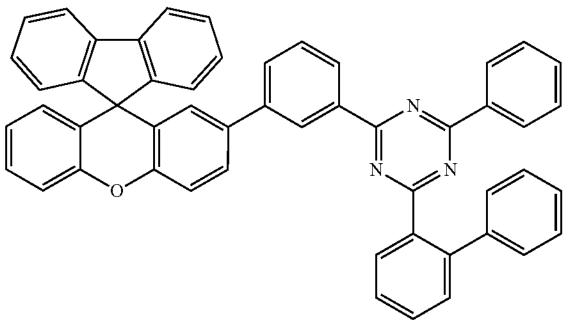
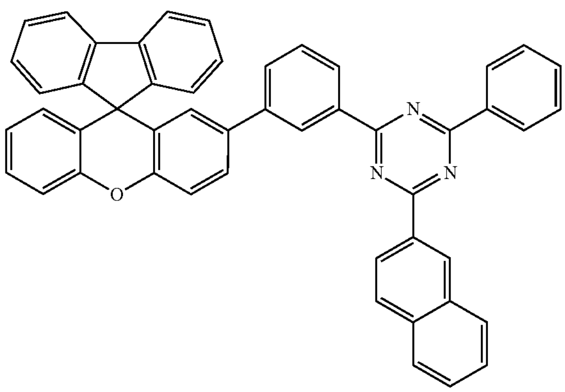
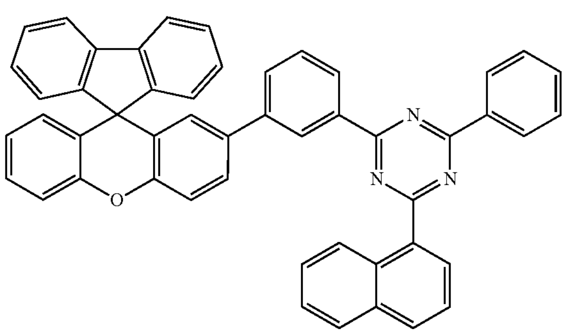
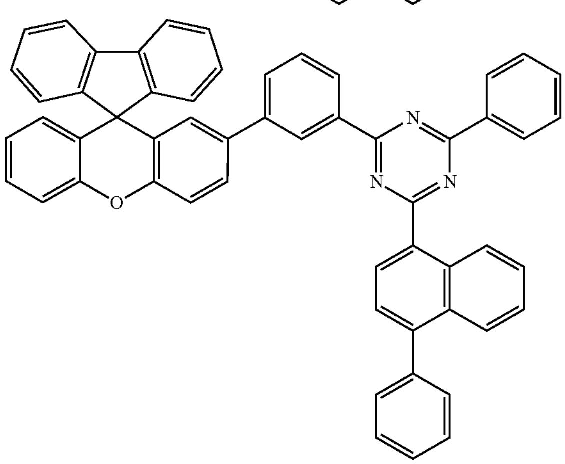
-continued
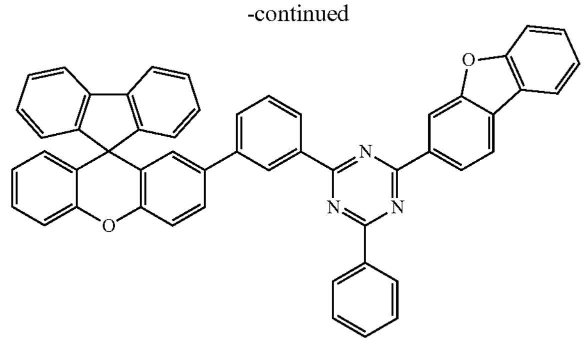
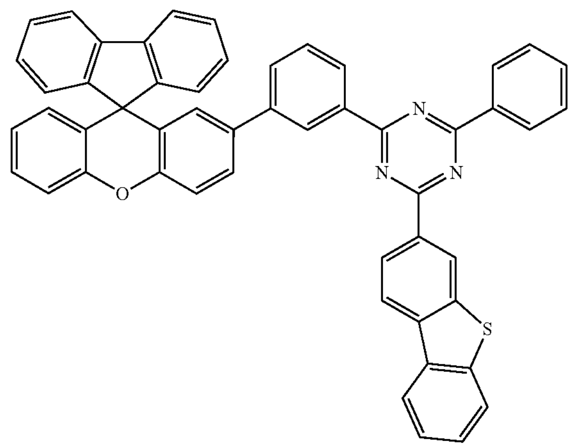
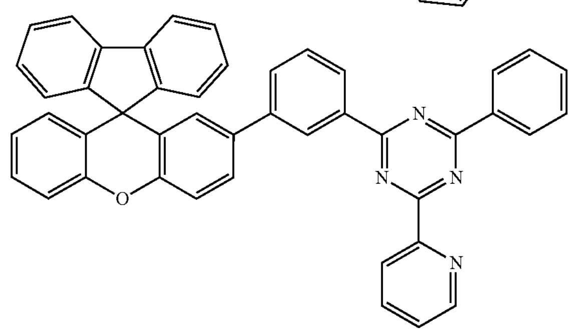
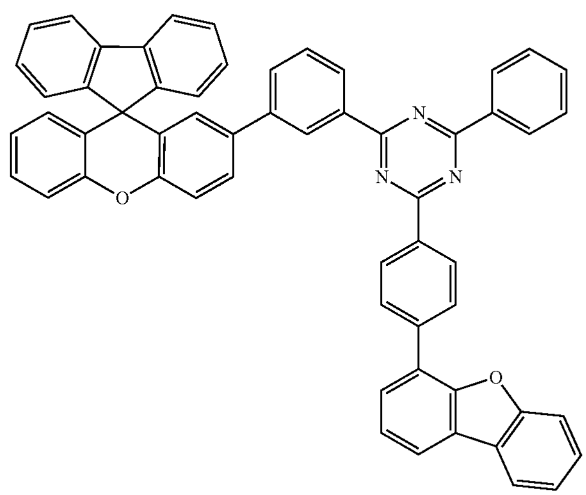

-continued
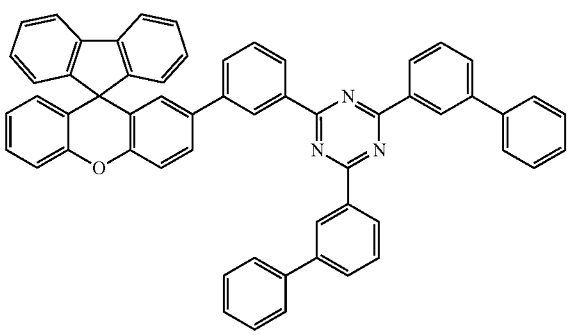
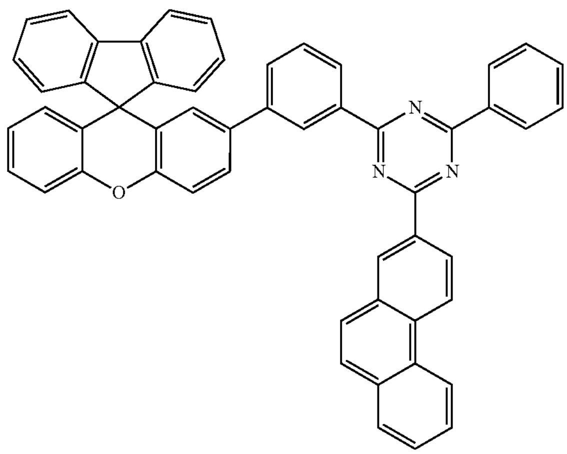
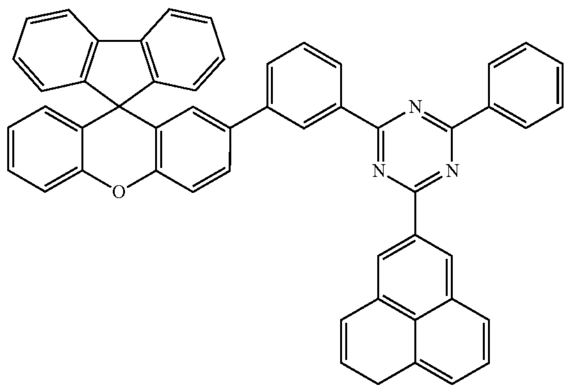
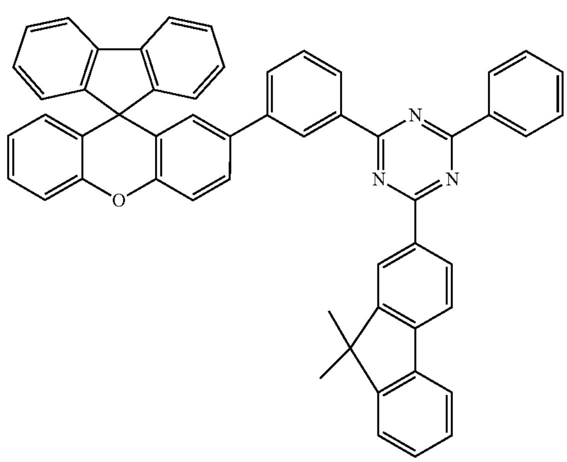 [SMILES: CC1(C)c2ccccc2-c2ccc(-c3nc(-c4ccccc4)nc(-c4cccc(-c5ccc6c(c5)C5(c7ccccc7O6)c6ccccc6-c6ccccc65)c4)n3)cc21]
-continued
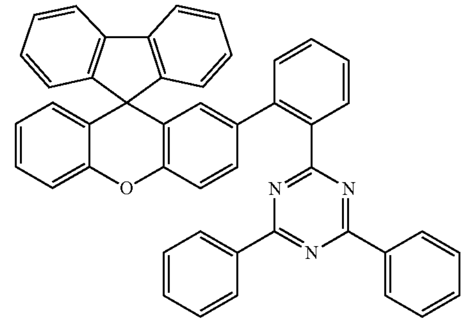
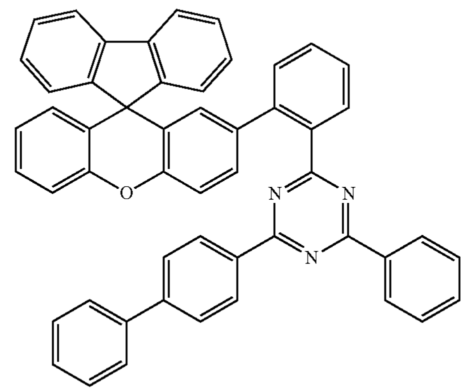
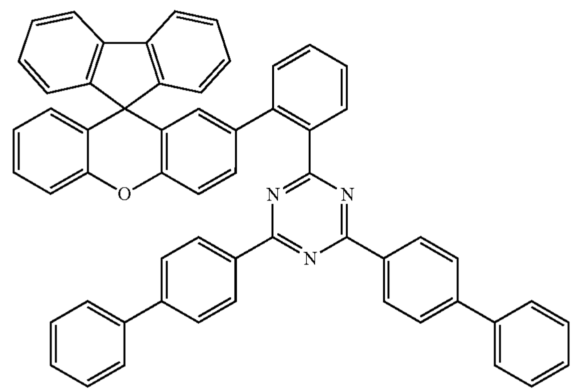
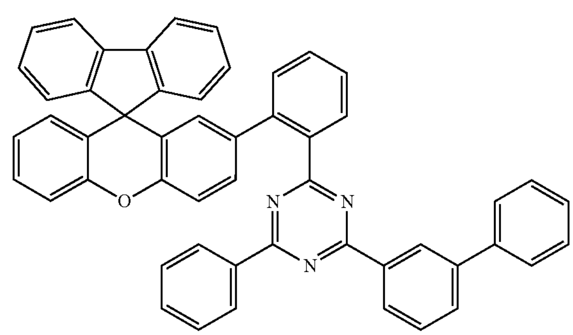

-continued
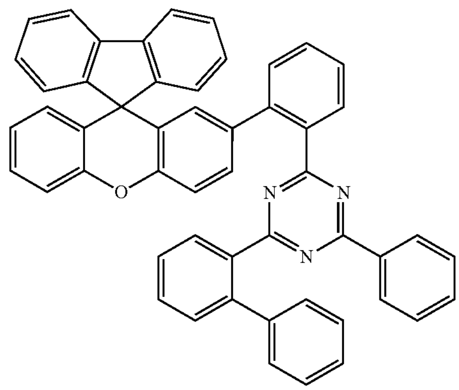
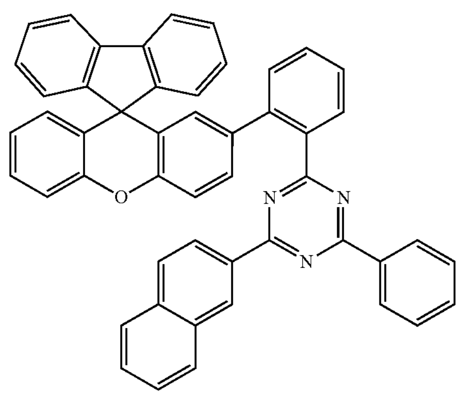
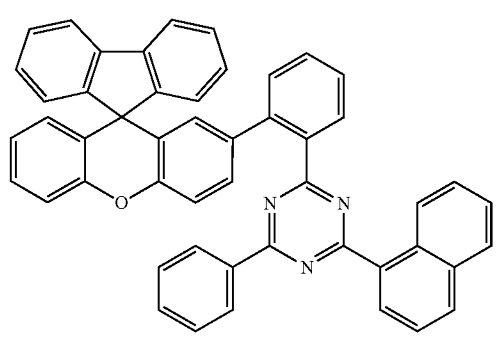
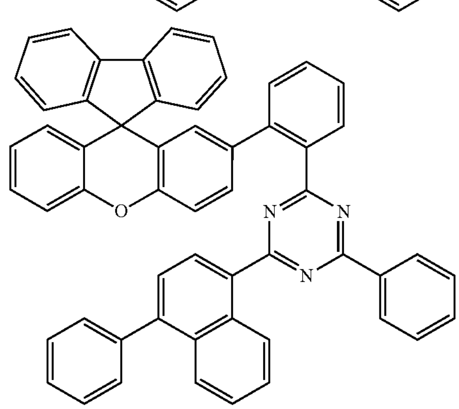
-continued
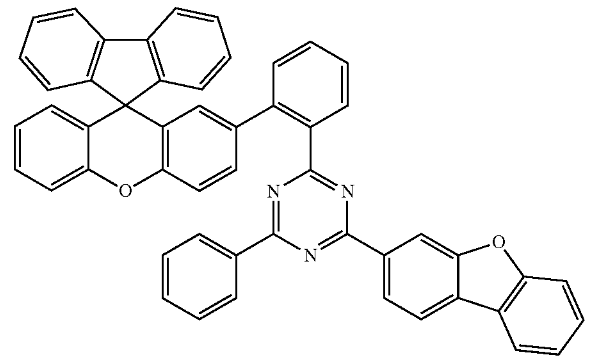
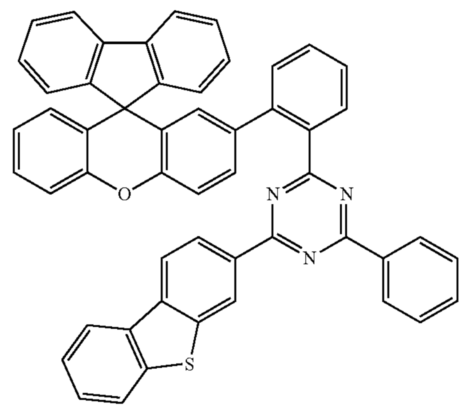
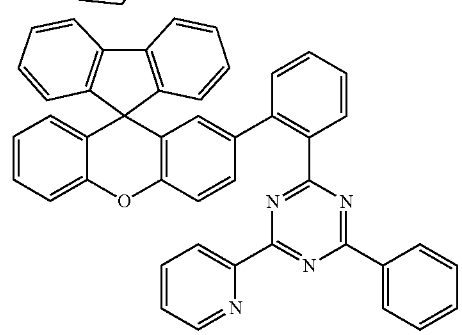
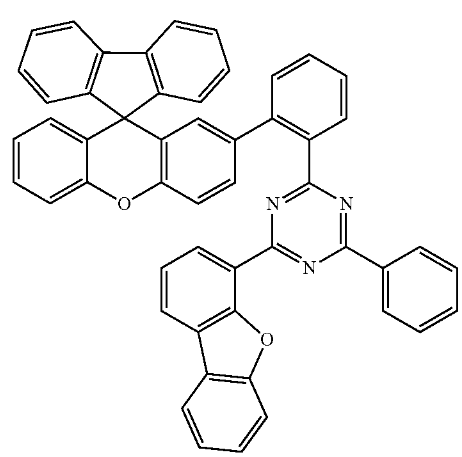

-continued
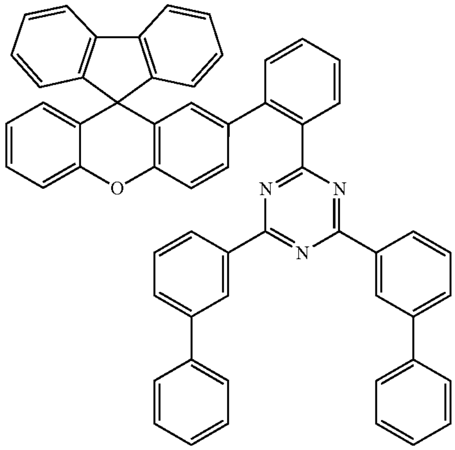
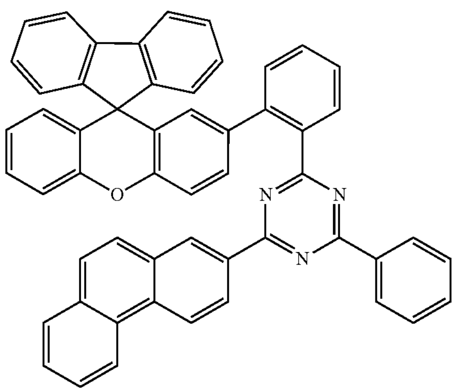
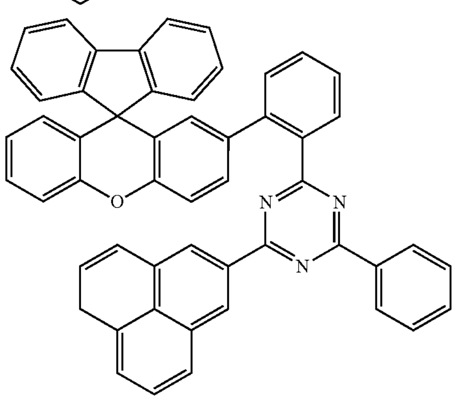
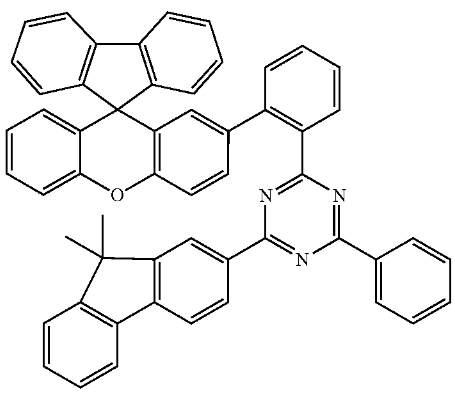 [SMILES: CC1(C)c2ccccc2-c2ccc(-c3nc(-c4ccccc4)nc(-c4ccccc4-c4ccc5c(c4)C4(c6ccccc6O5)c5ccccc5-c5ccccc54)n3)cc21]
-continued
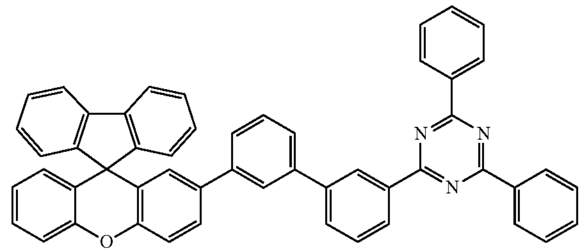
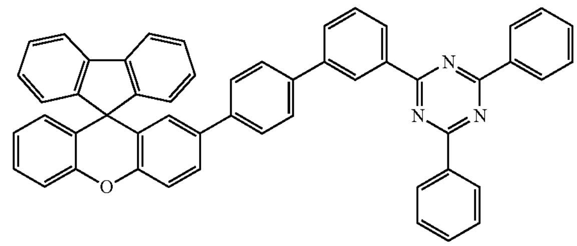
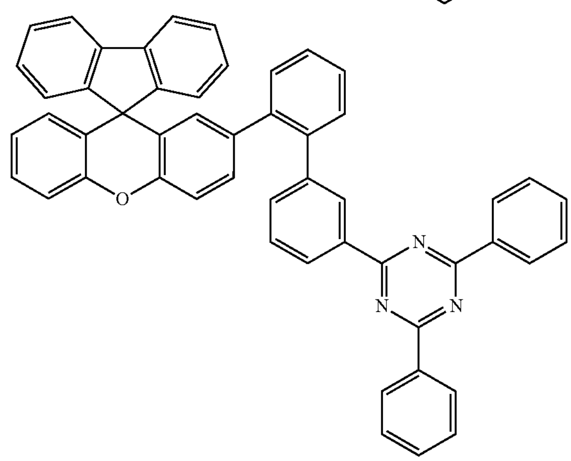
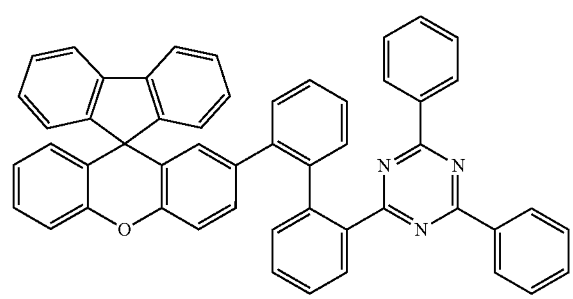
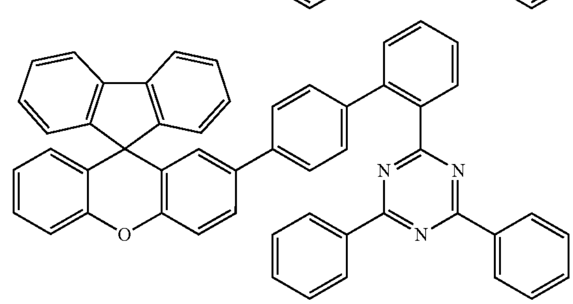

-continued
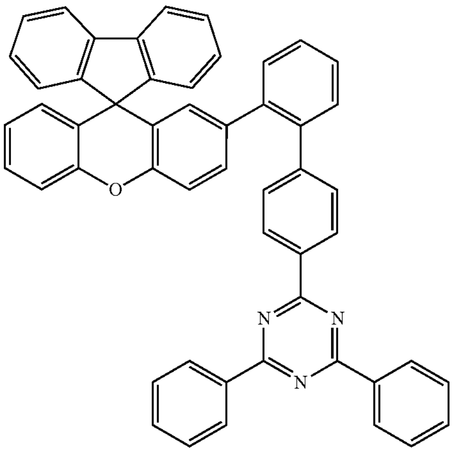
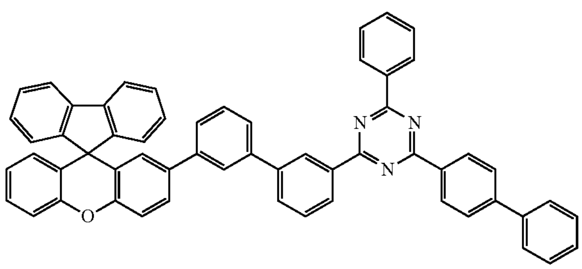
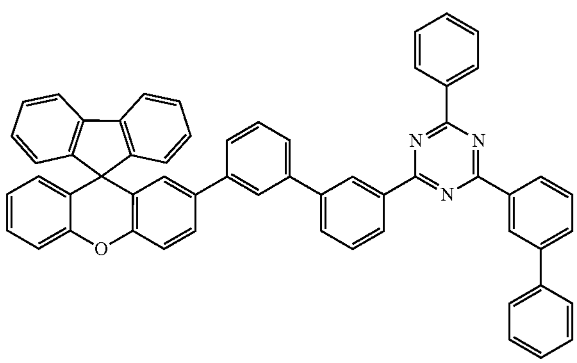
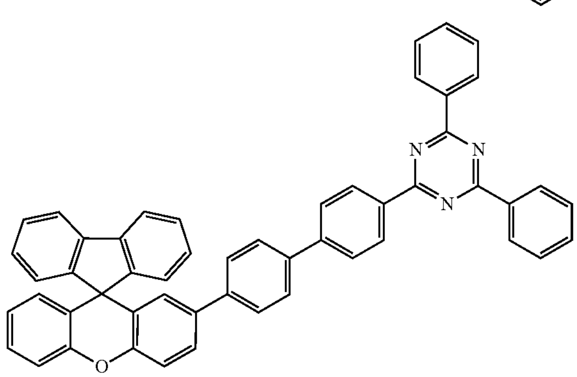
-continued
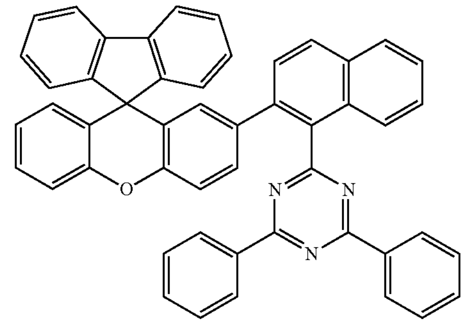
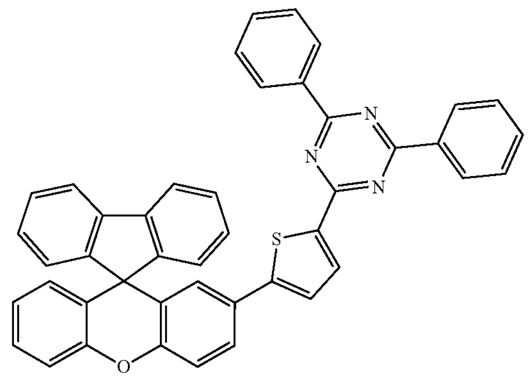
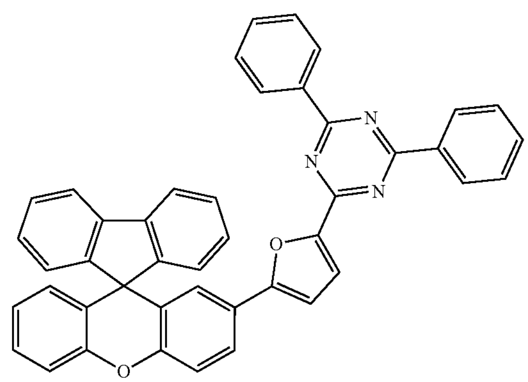
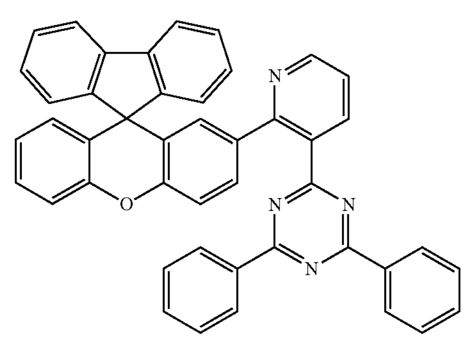

-continued
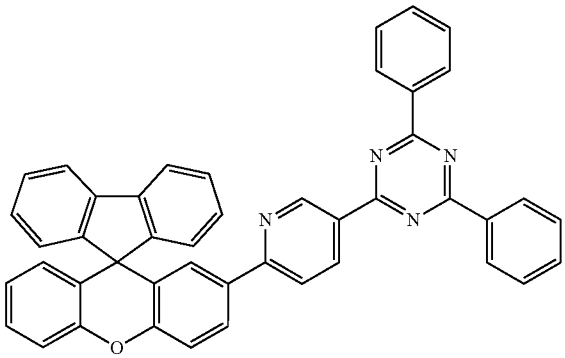
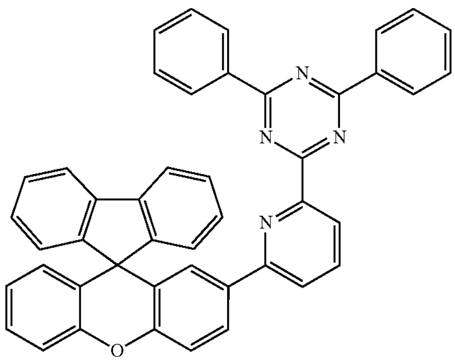
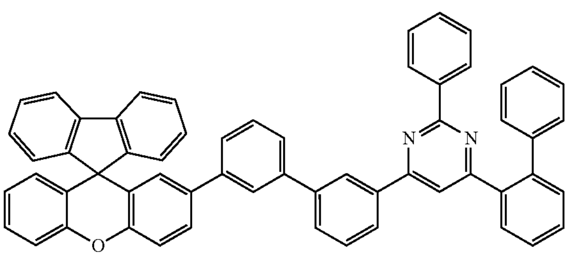
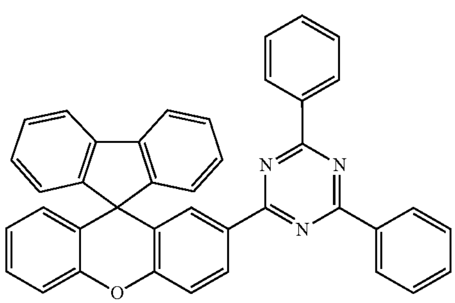
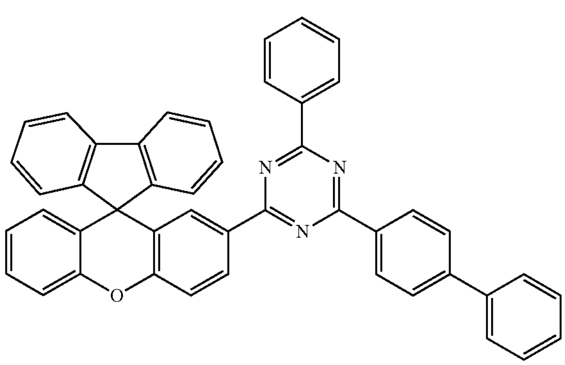
-continued
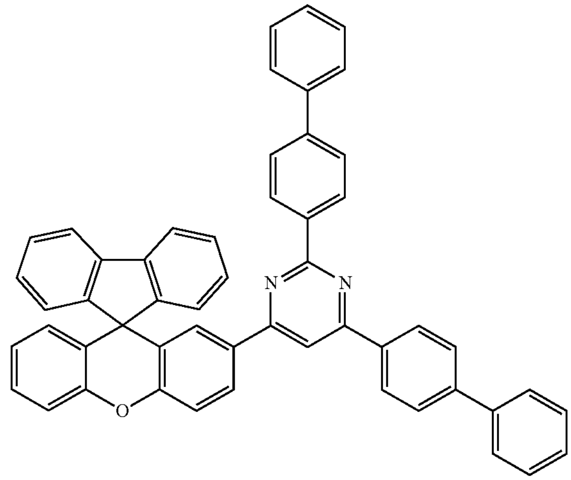
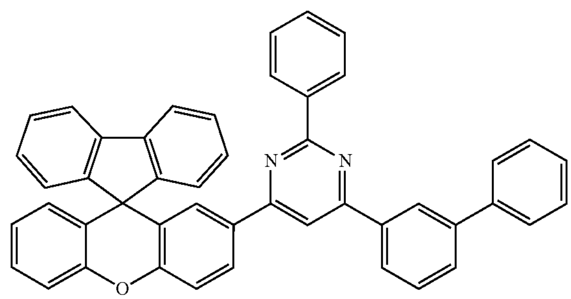
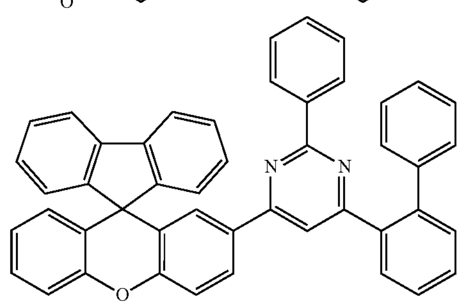
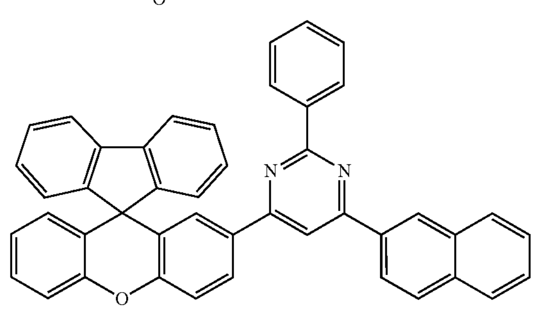
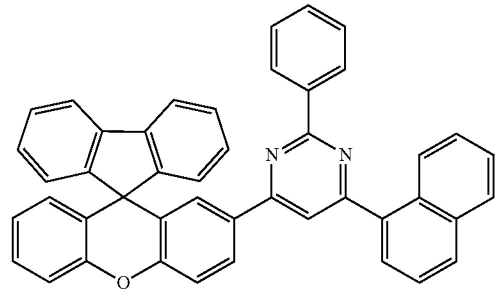

-continued
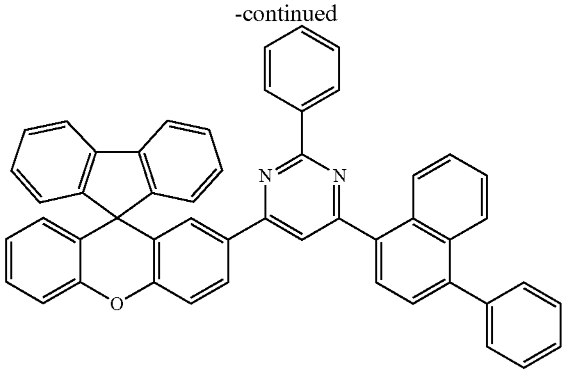
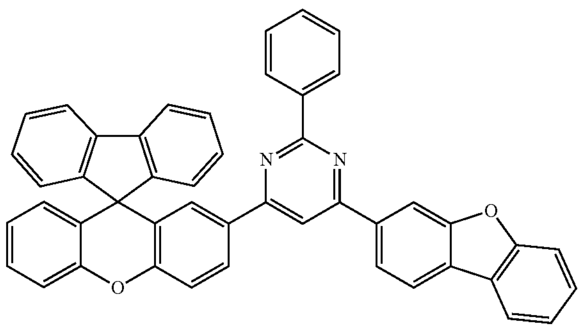
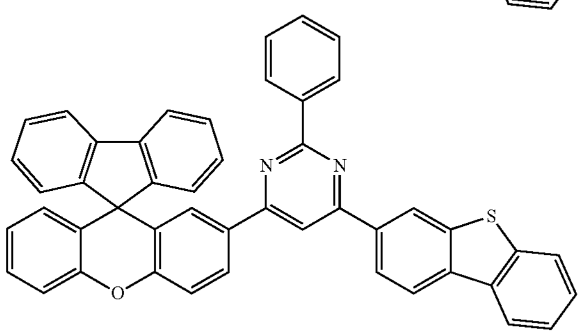
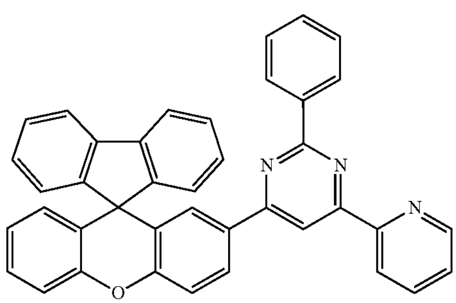
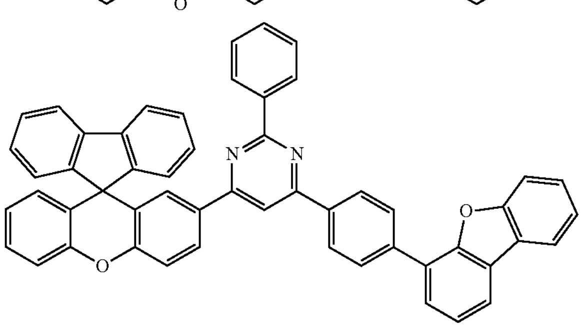
-continued
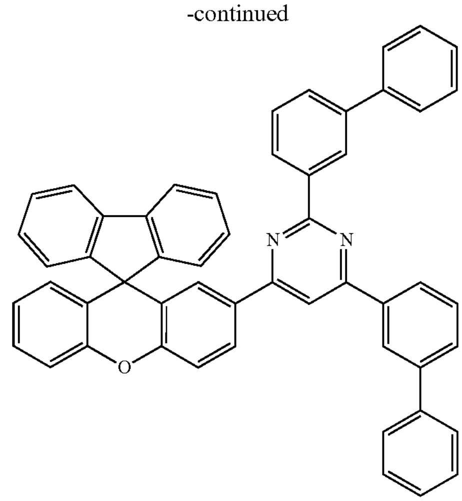
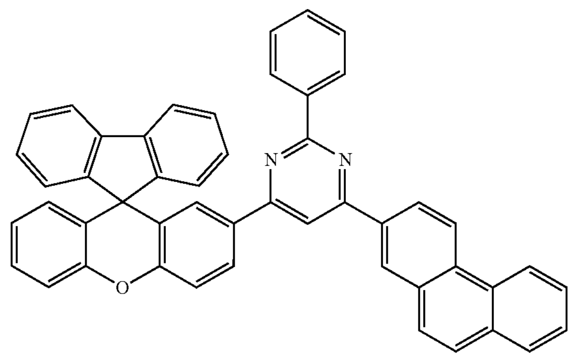
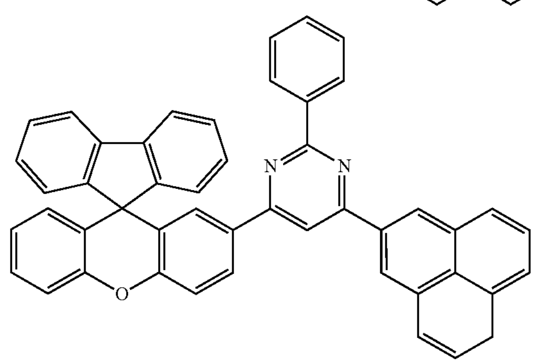
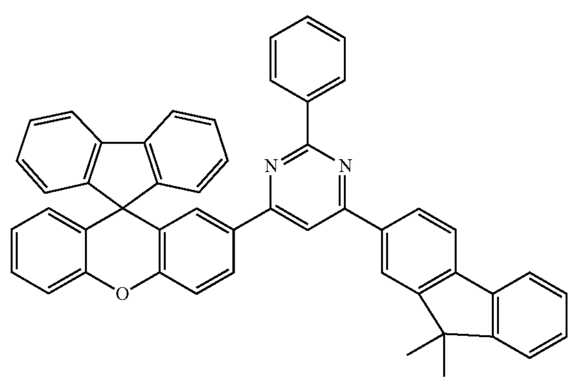

-continued
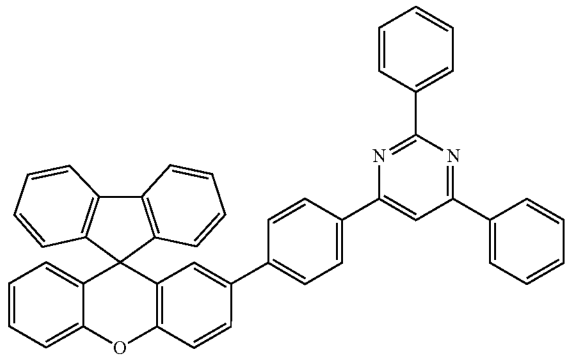
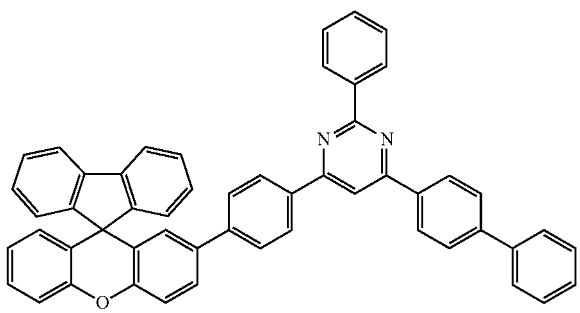
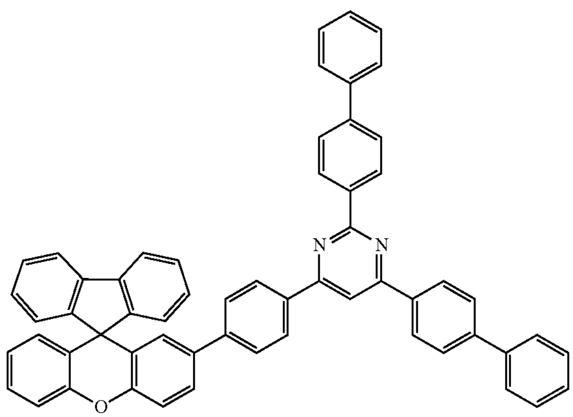
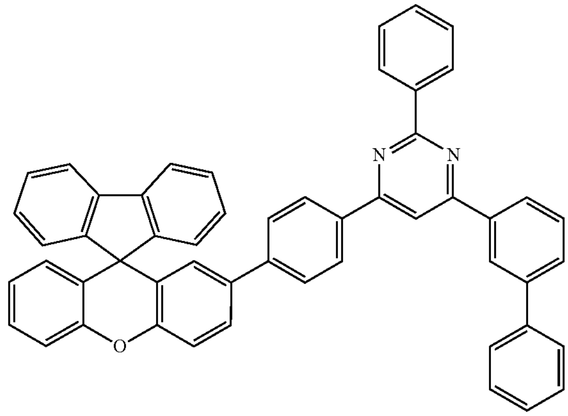
-continued
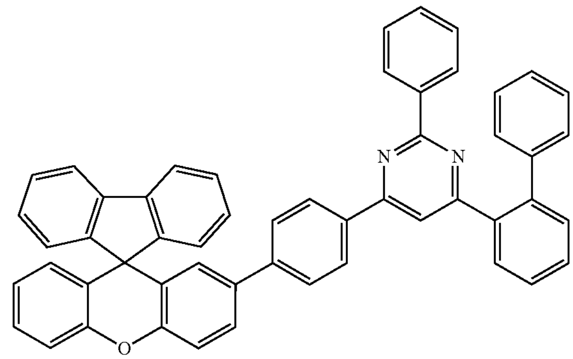
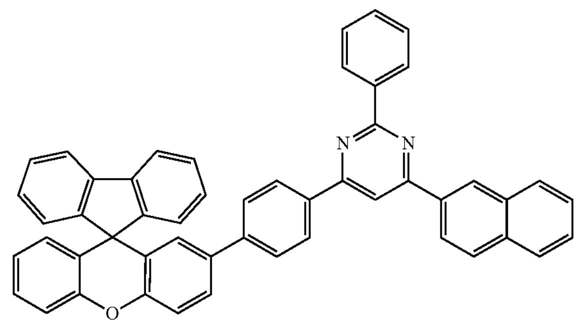
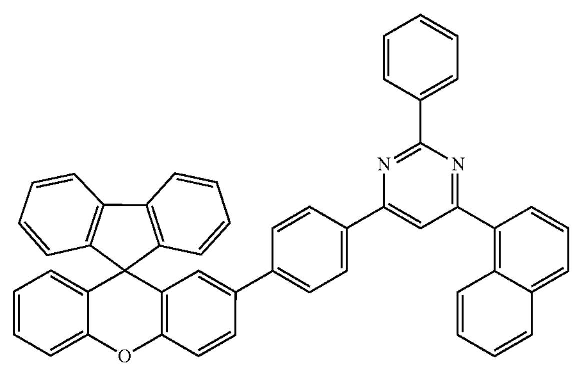
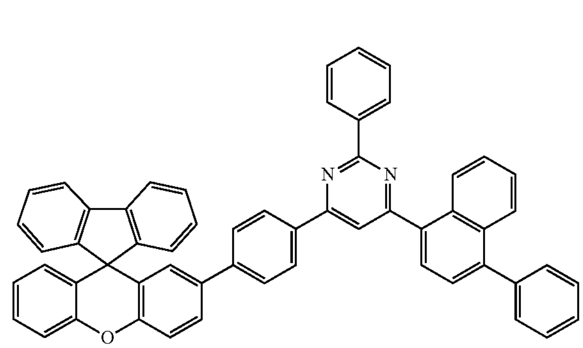

-continued
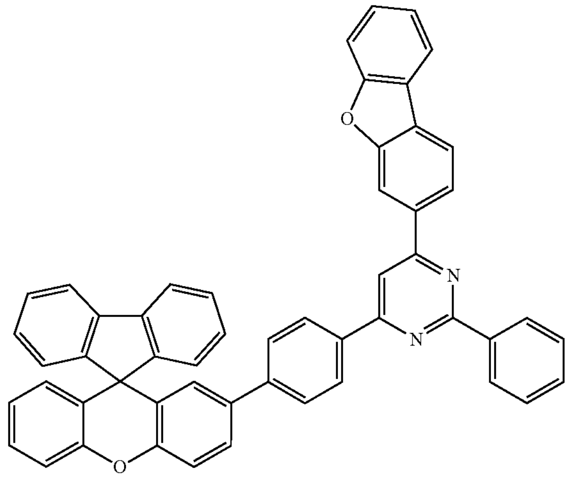
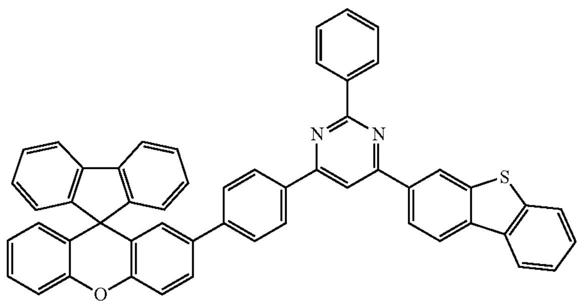
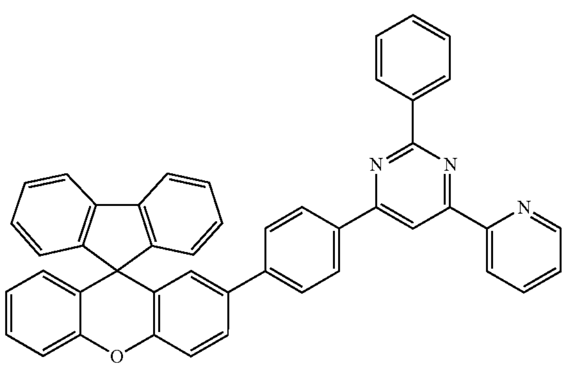
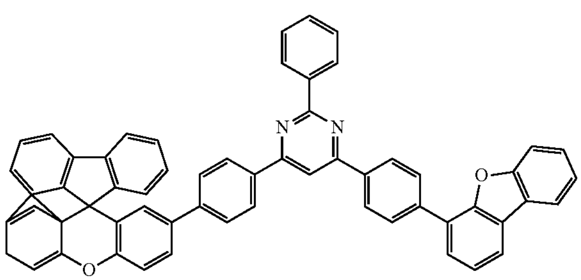
-continued
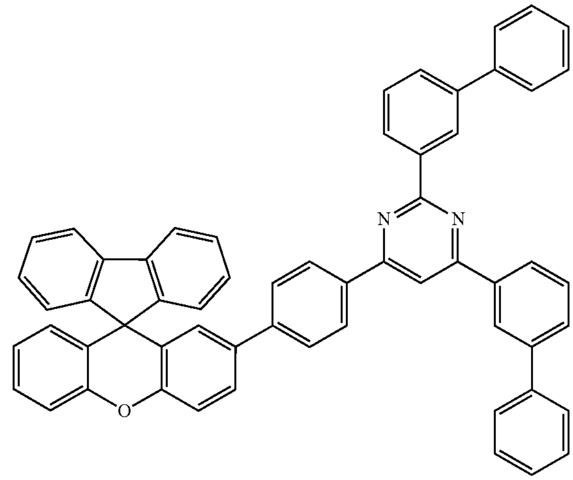
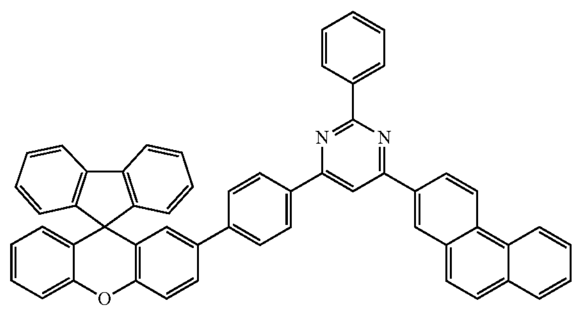
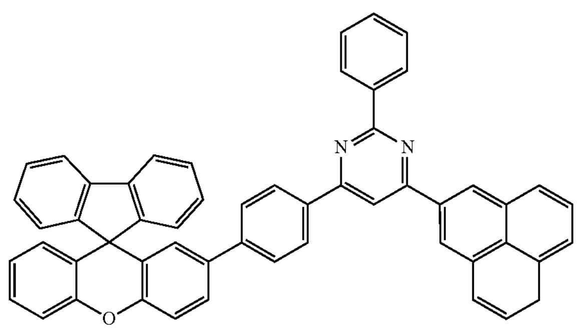
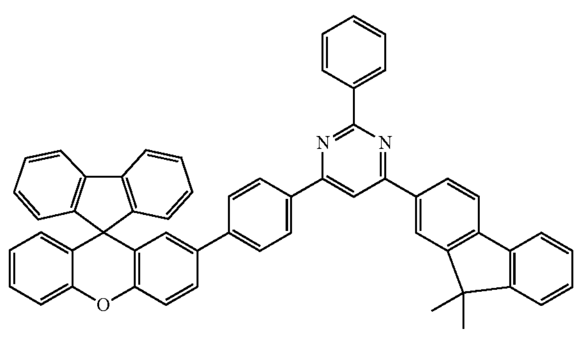 [SMILES: CC1(C)c2ccccc2-c2ccc(-c3cc(-c4ccc(-c5ccc6c(c5)C5(c7ccccc7O6)c6ccccc6-c6ccccc65)cc4)nc(-c4ccccc4)n3)cc21]

-continued
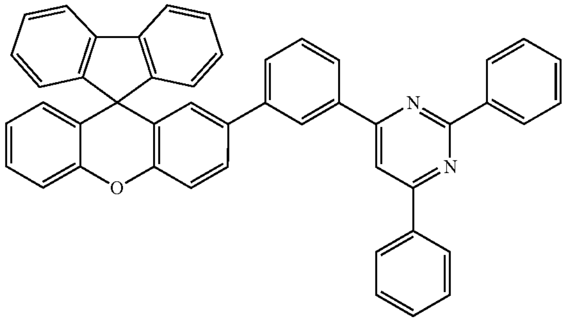
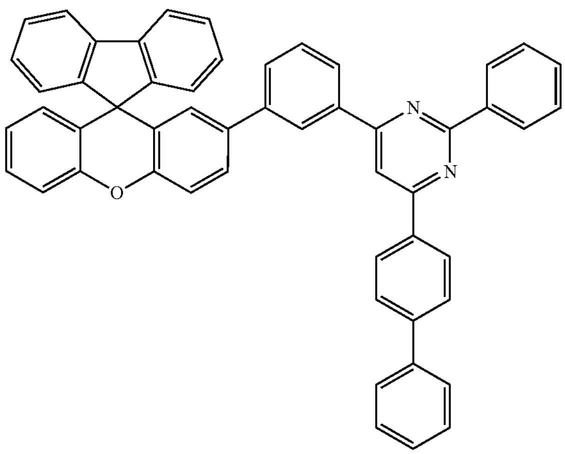 [SMILES: CC1(C)c2ccccc2-c2ccc(-c3cc(-c4cccc(-c5ccc6c(c5)C5(c7ccccc7O6)c6ccccc6-c6ccccc65)c4)nc(-c4ccccc4)n3)cc21]
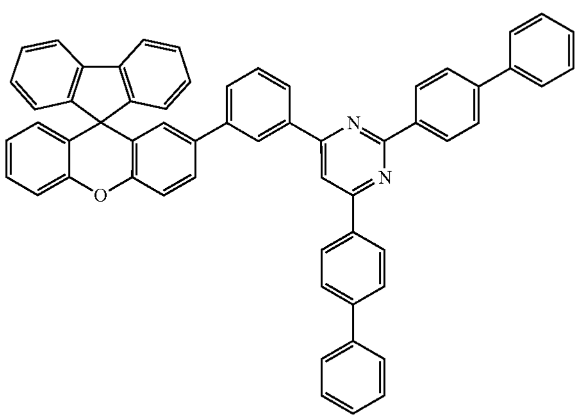
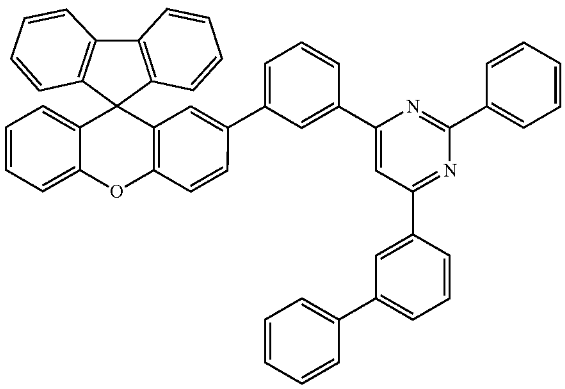
-continued
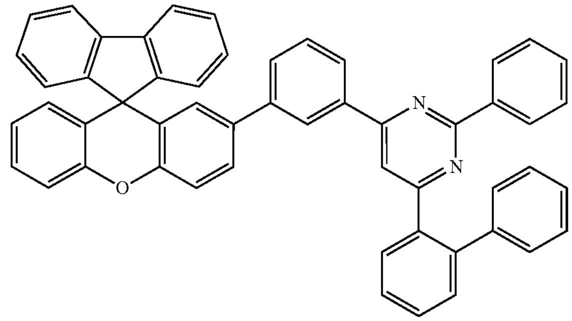
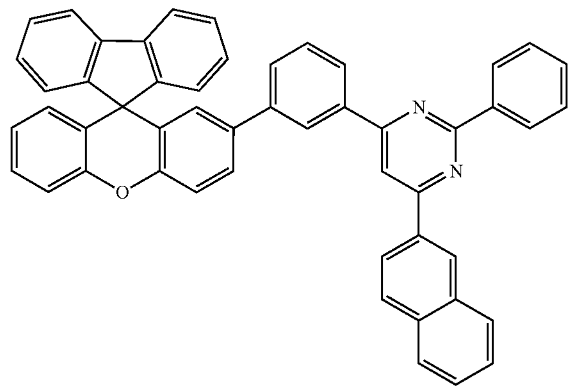
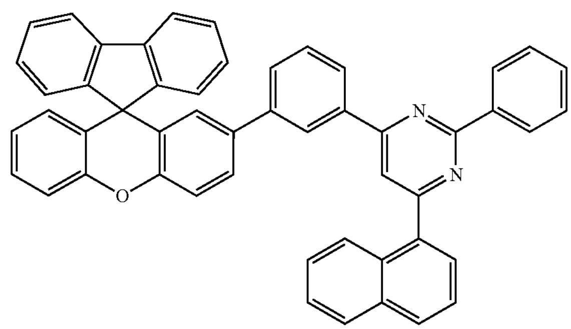
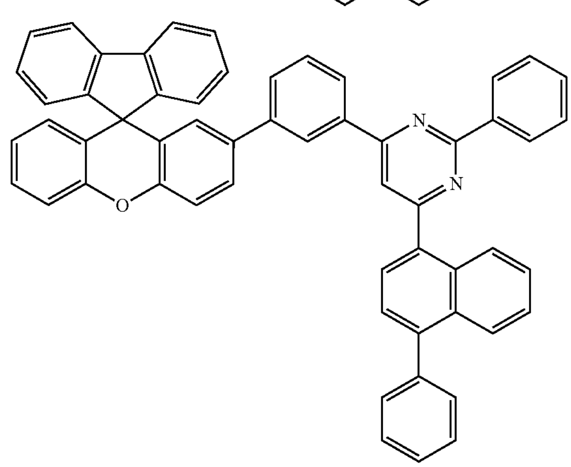

-continued
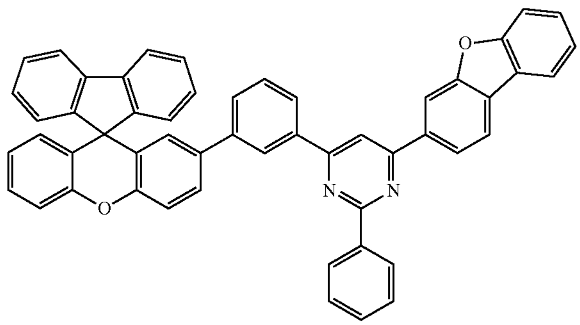
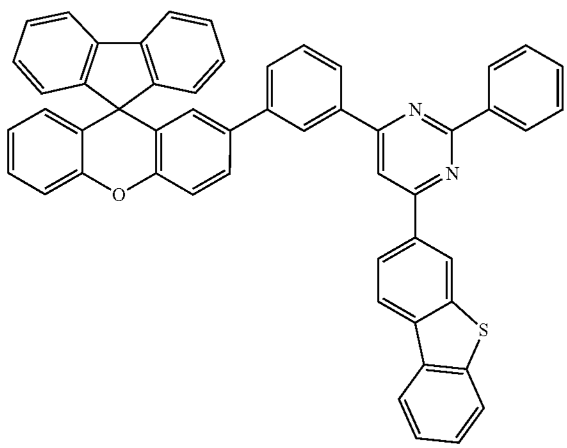
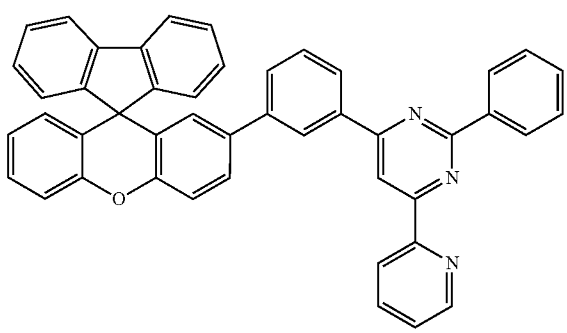
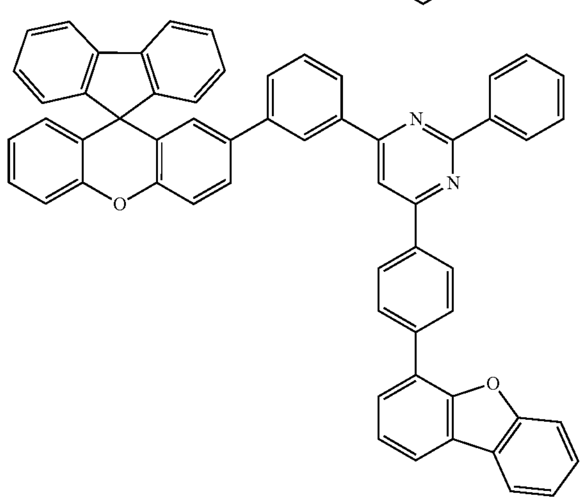
-continued
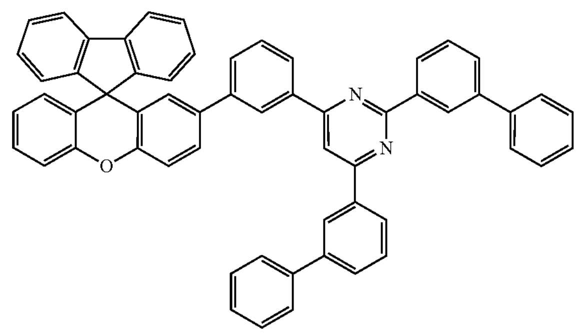
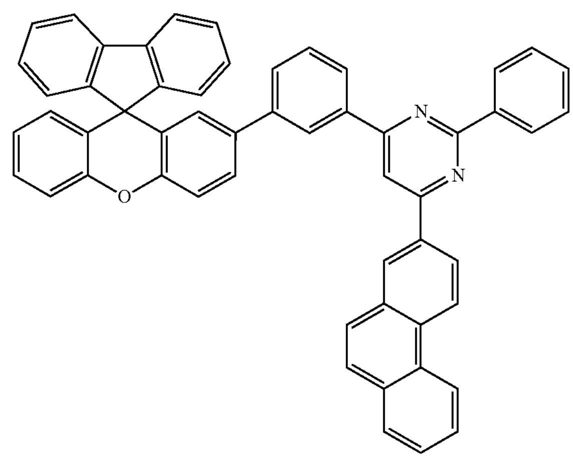
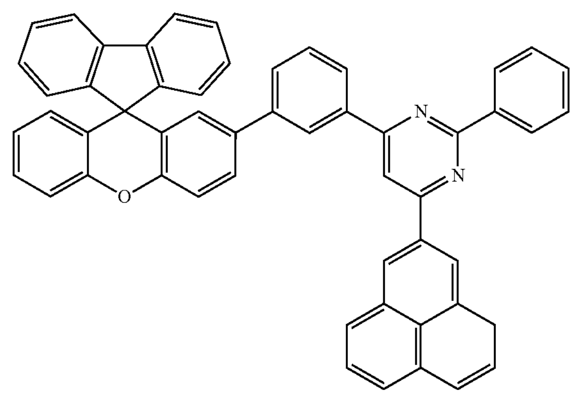
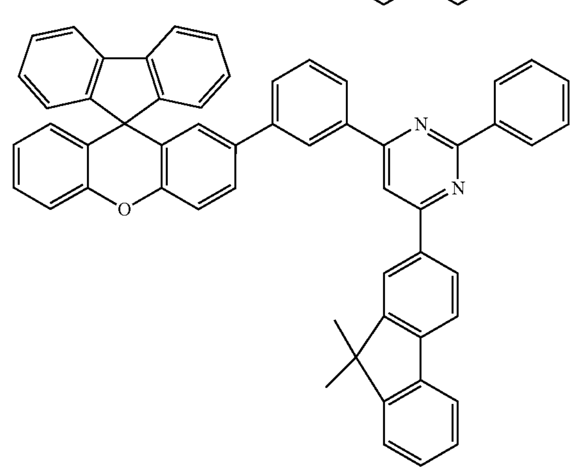

-continued
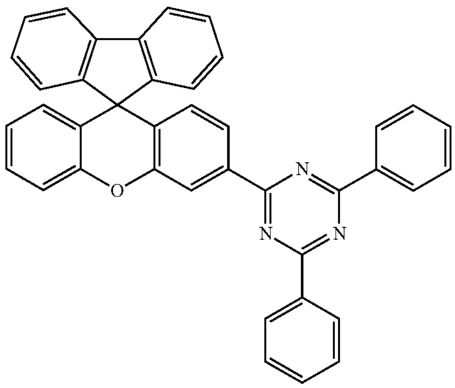
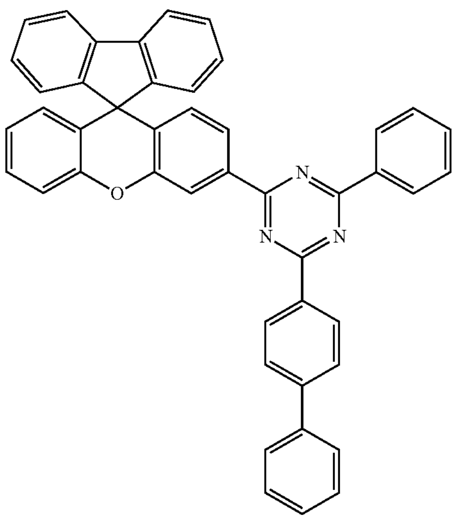
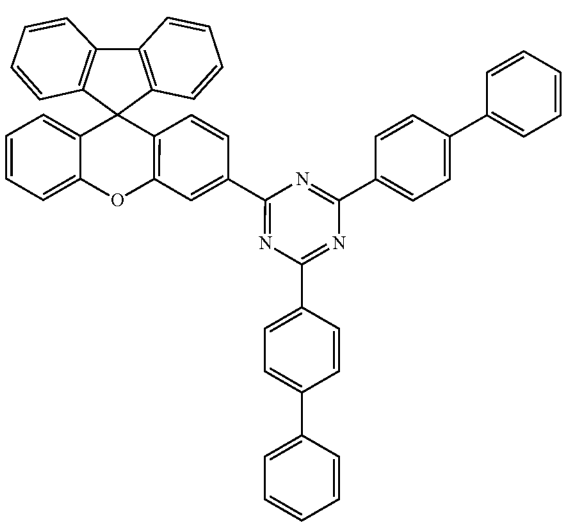
-continued
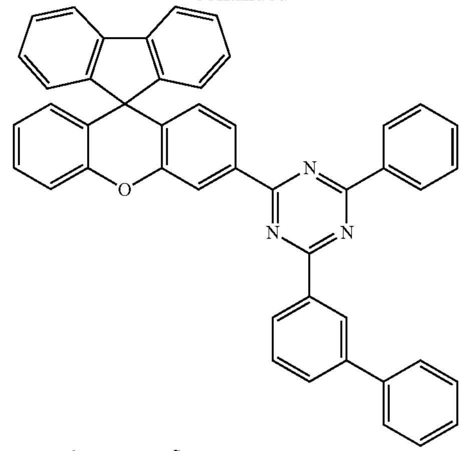
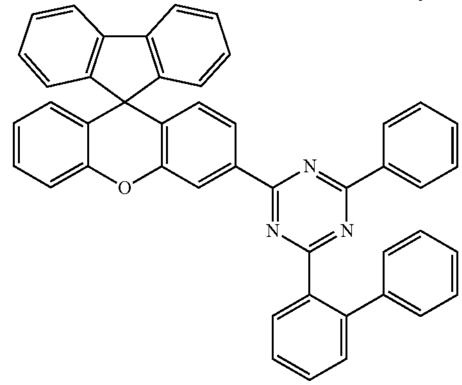
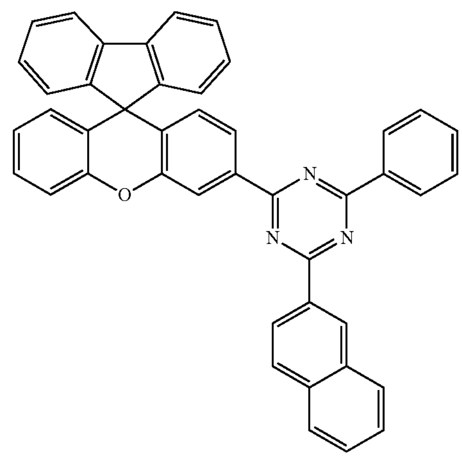
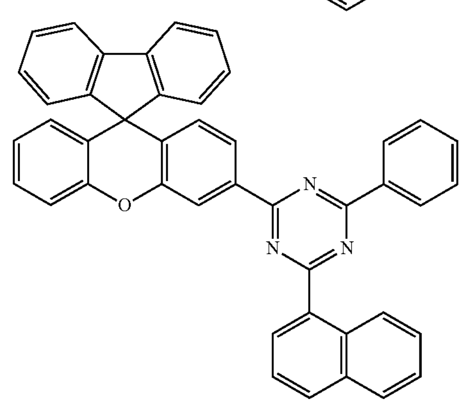

-continued
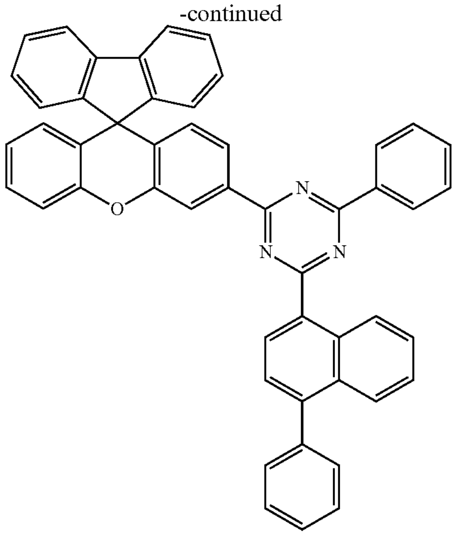
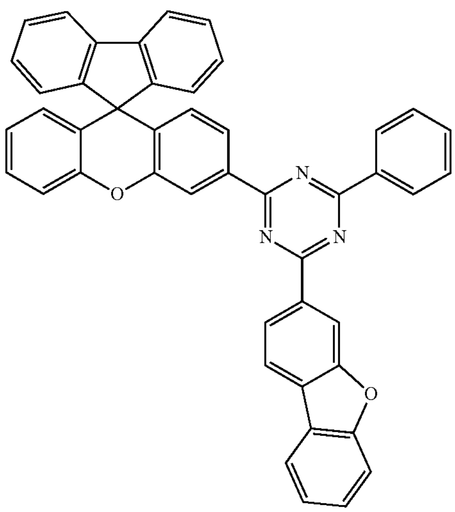
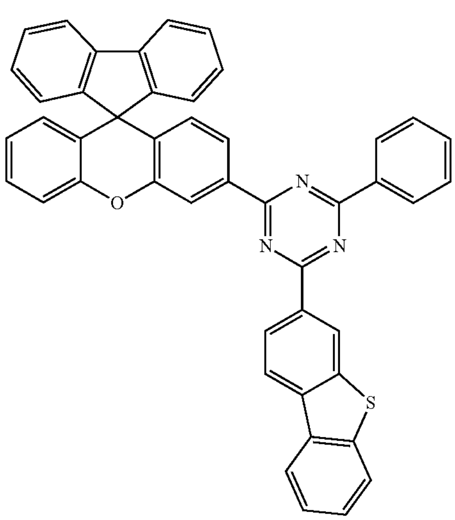
-continued
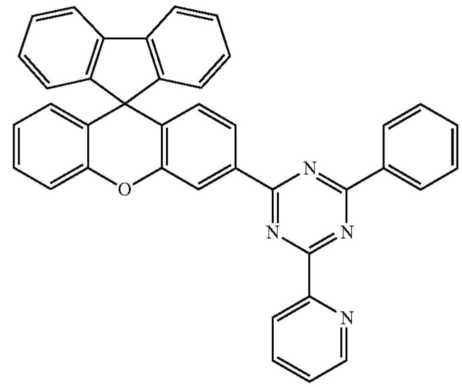
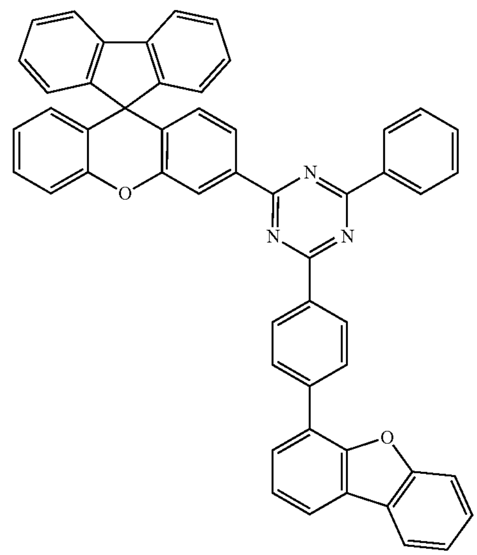
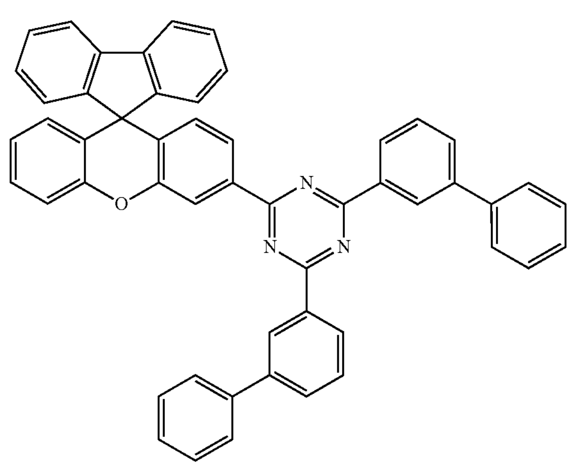

-continued
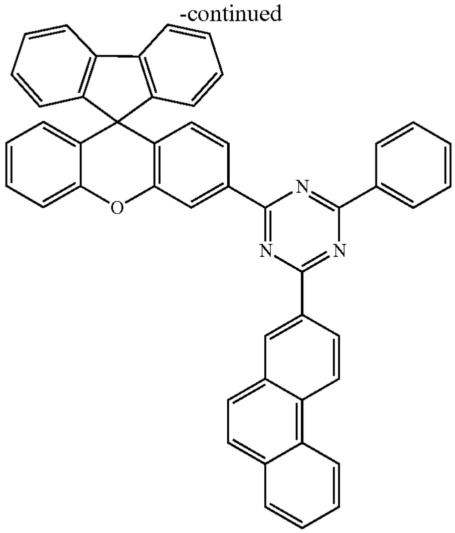
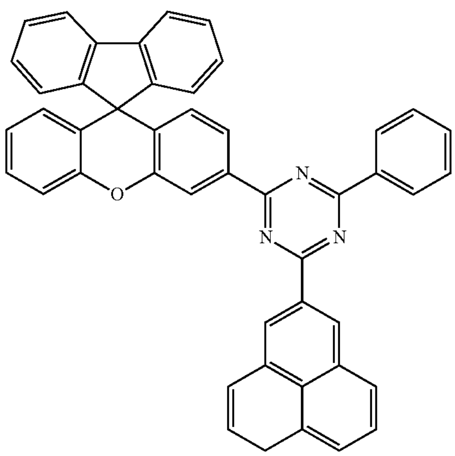
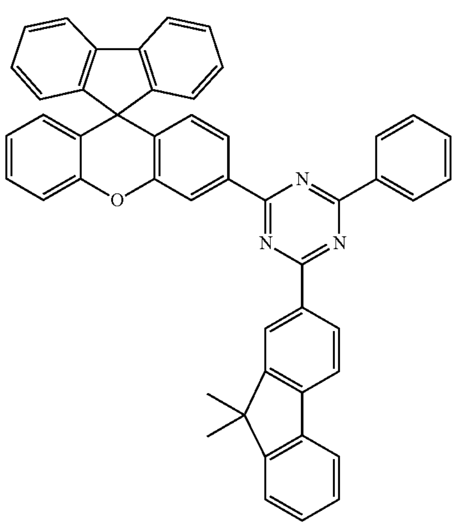 [SMILES: CC1(C)c2ccccc2-c2ccc(-c3nc(-c4ccccc4)nc(-c4ccc5c(c4)Oc4ccccc4C54c5ccccc5-c5ccccc54)n3)cc21]
-continued
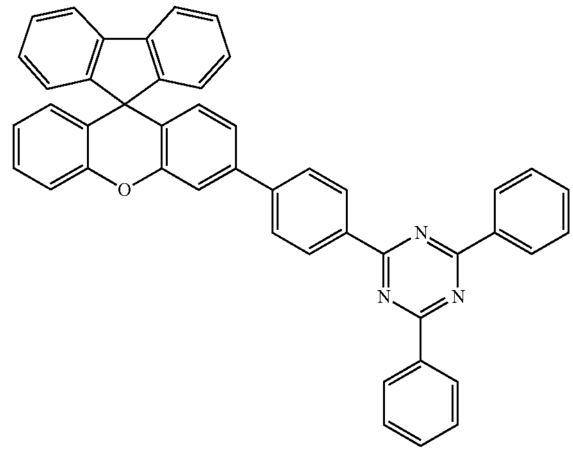
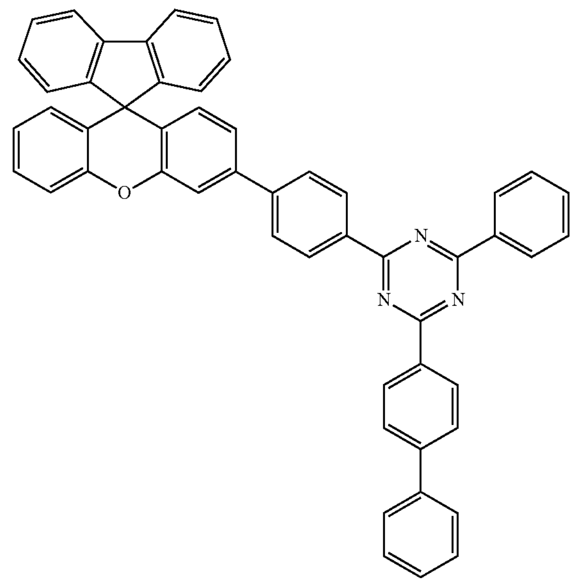
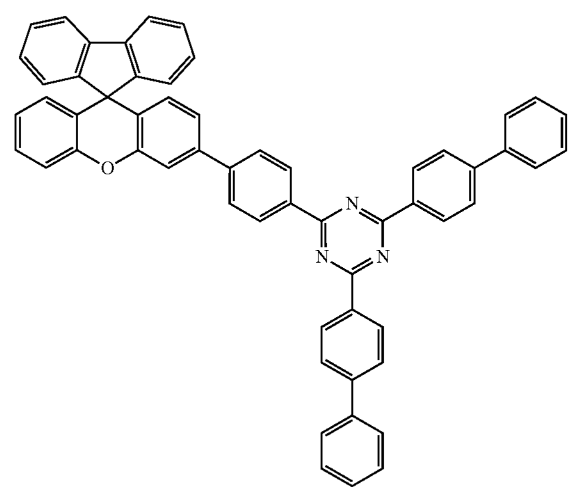

-continued
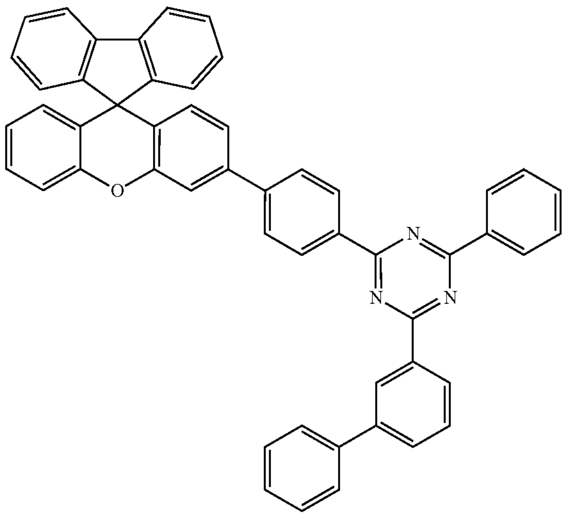
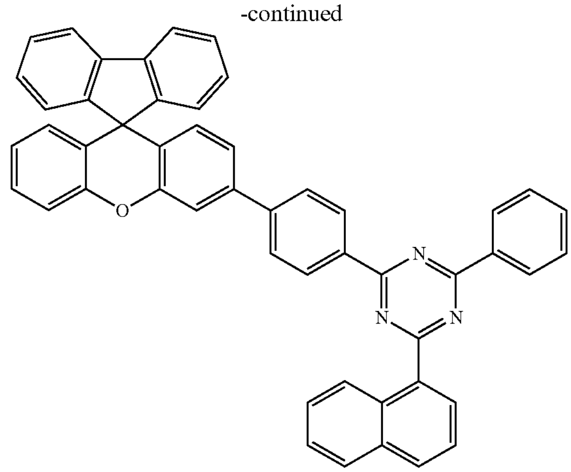
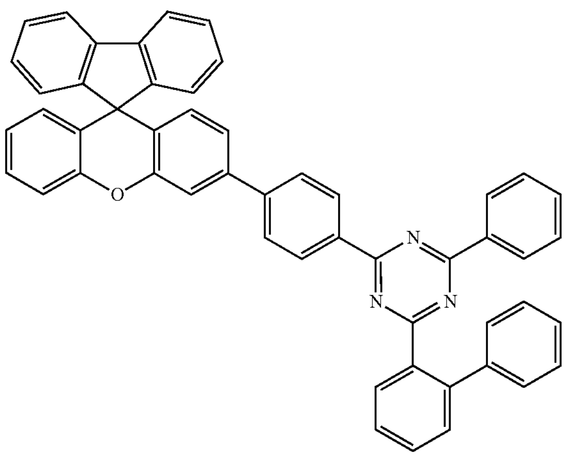
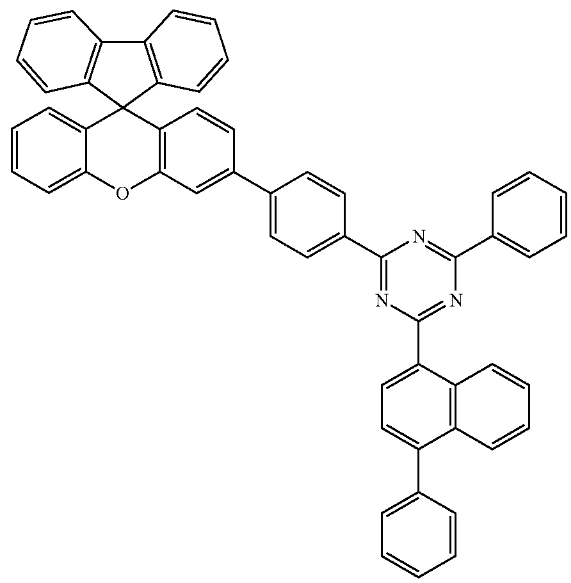
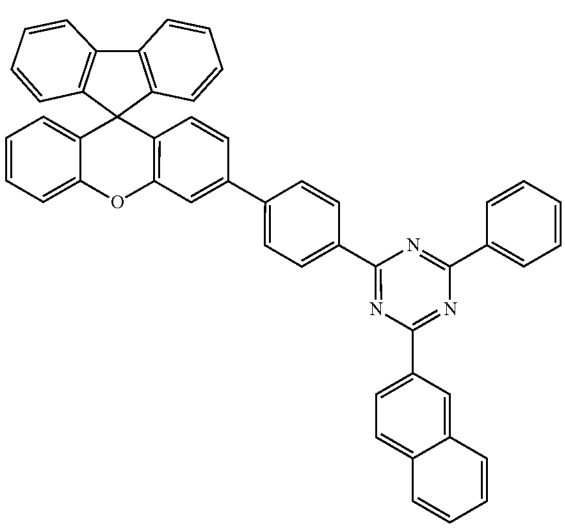
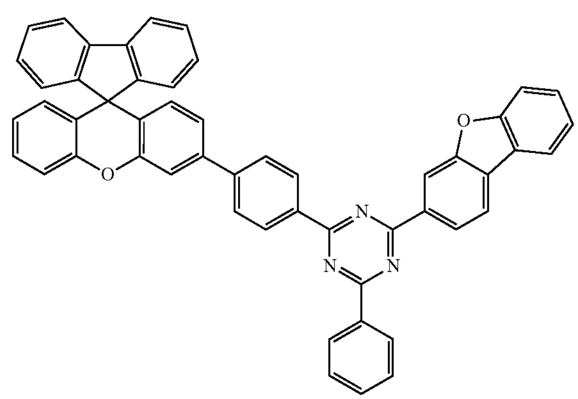
-continued -continued
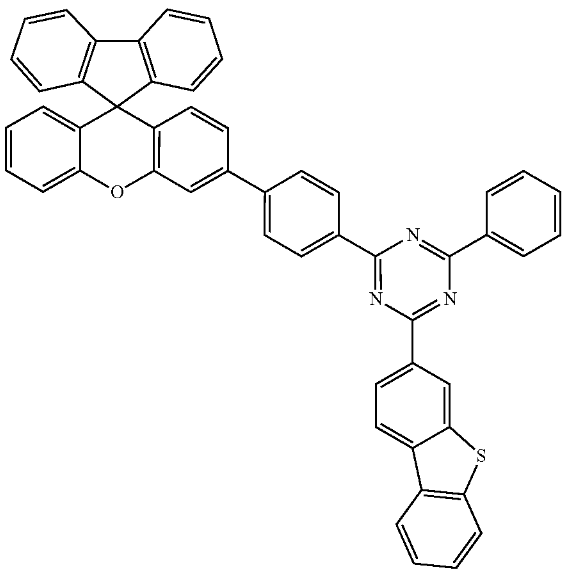
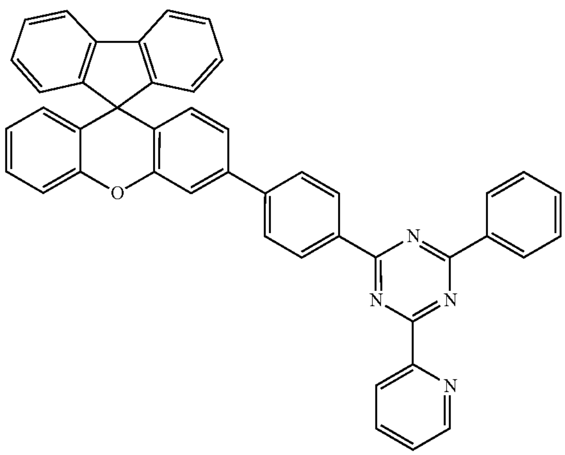
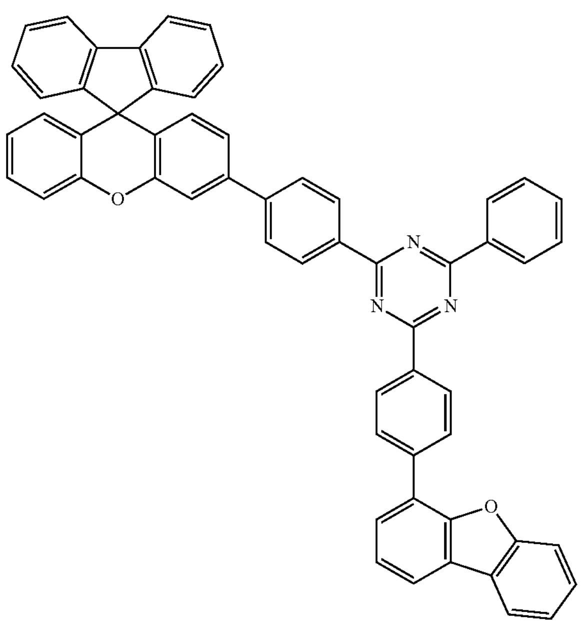
-continued
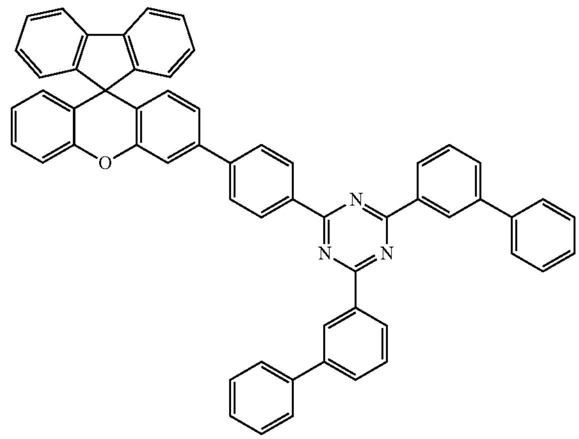
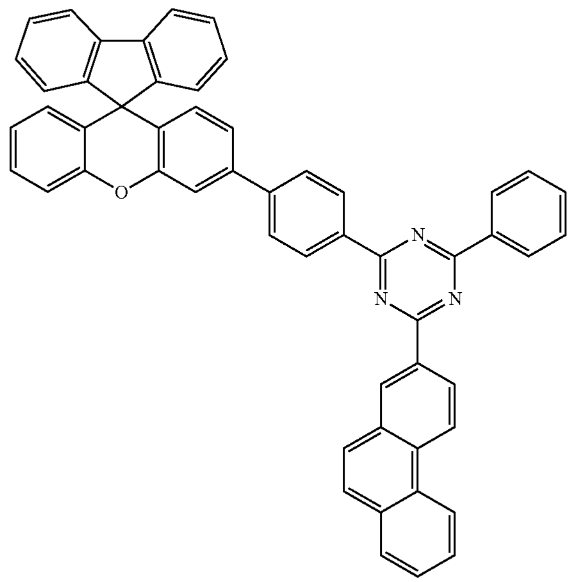
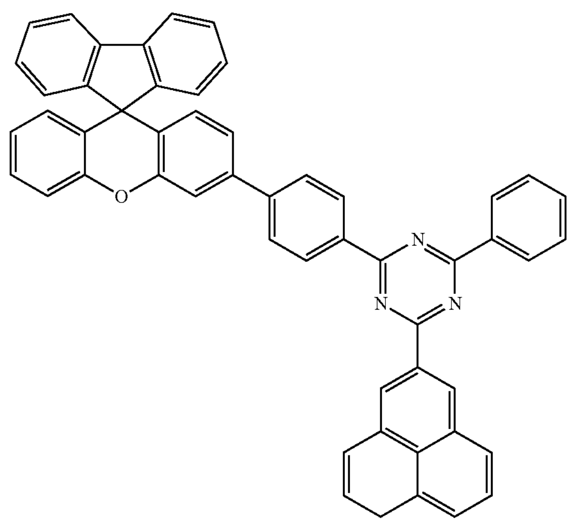

-continued
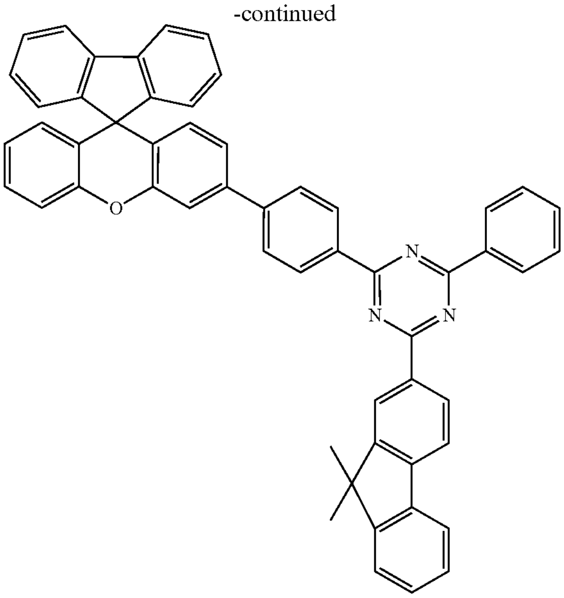
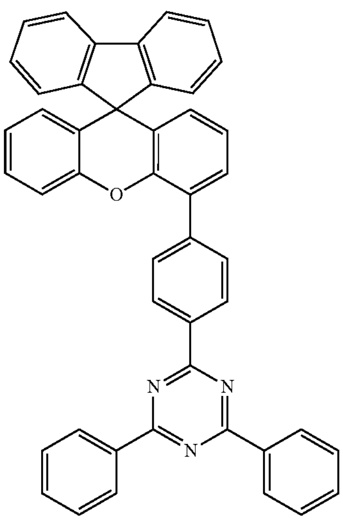
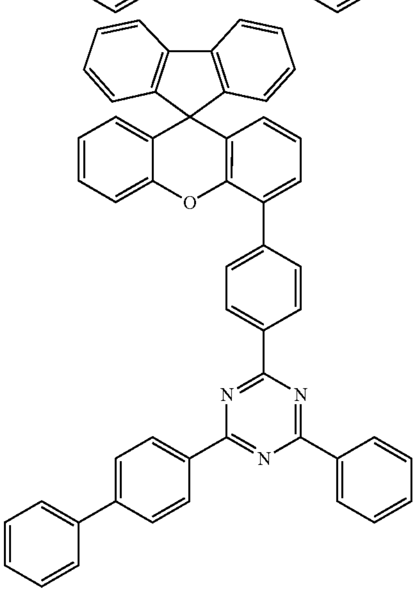
-continued
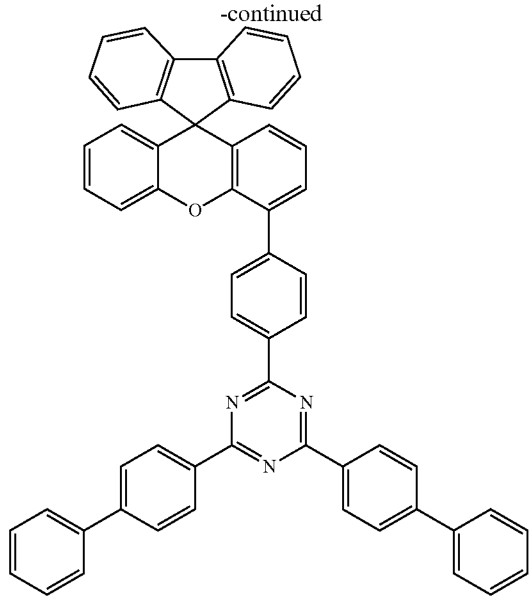
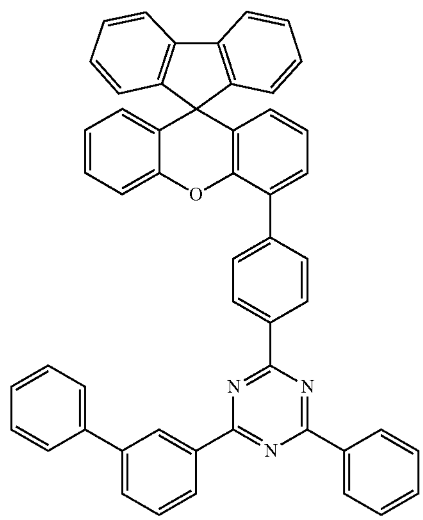
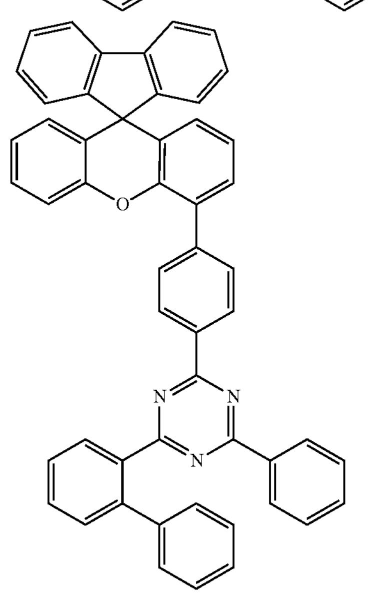

-continued
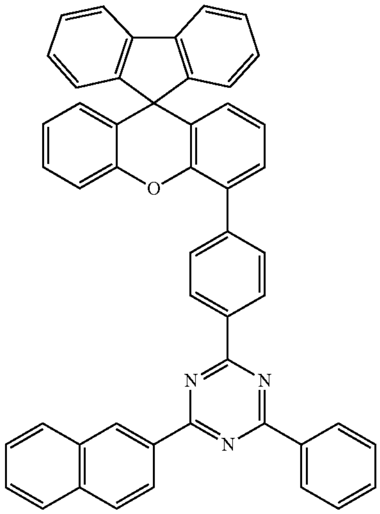
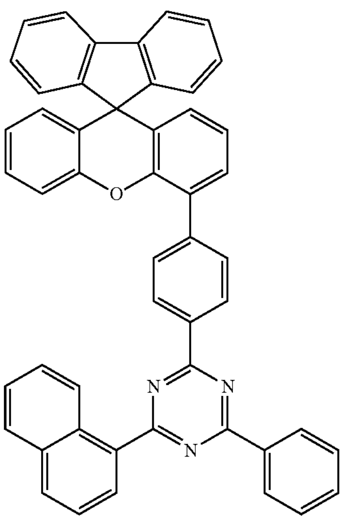
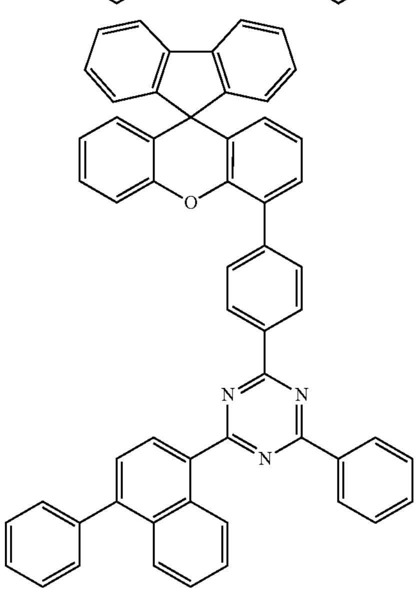
-continued
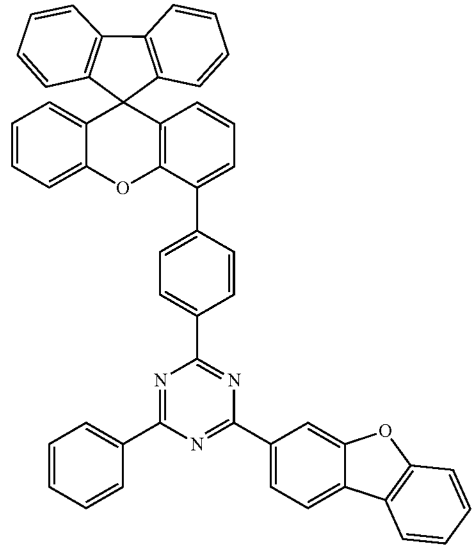
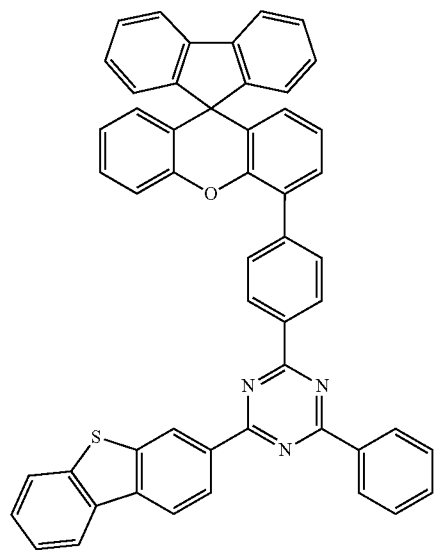
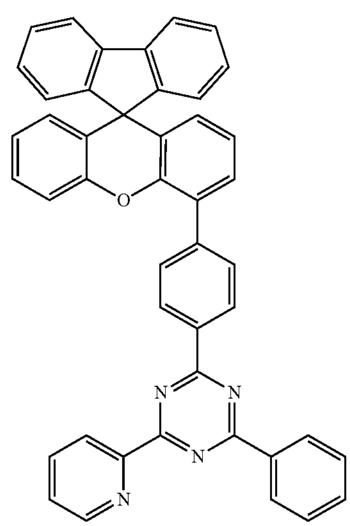

-continued
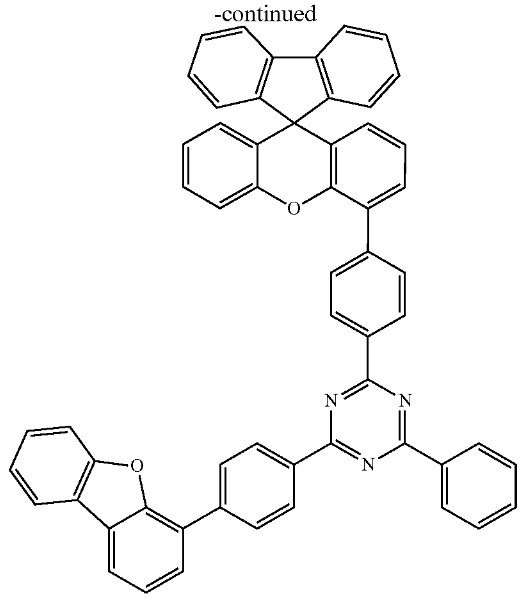
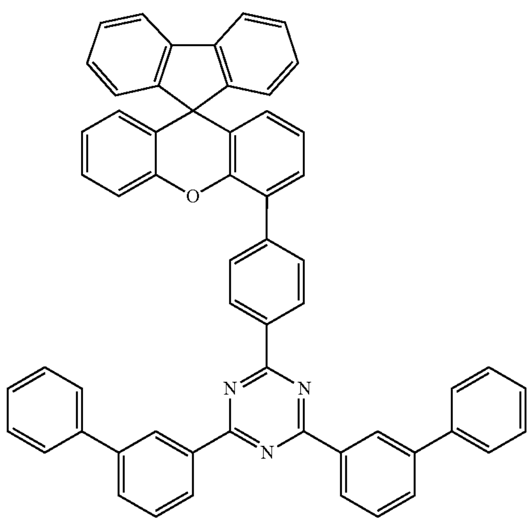
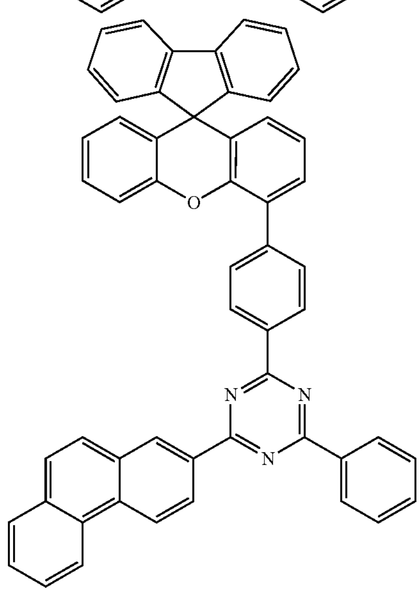
-continued
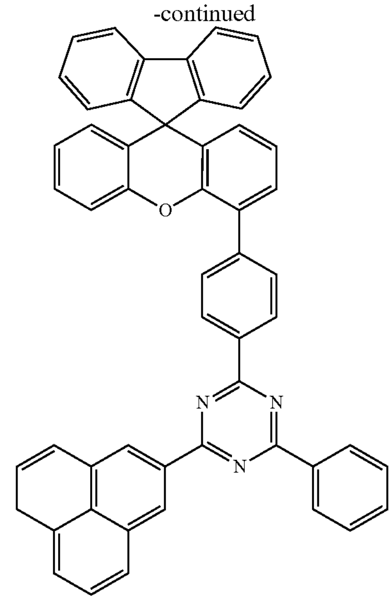
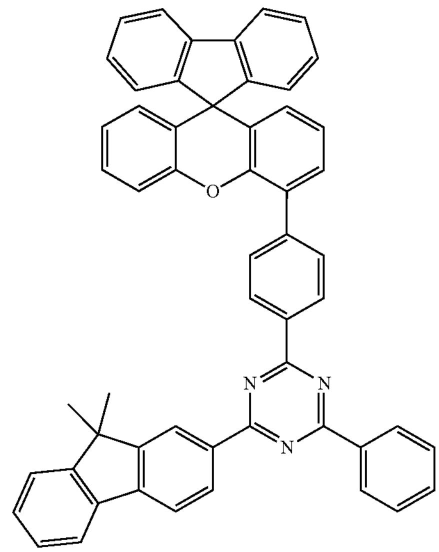
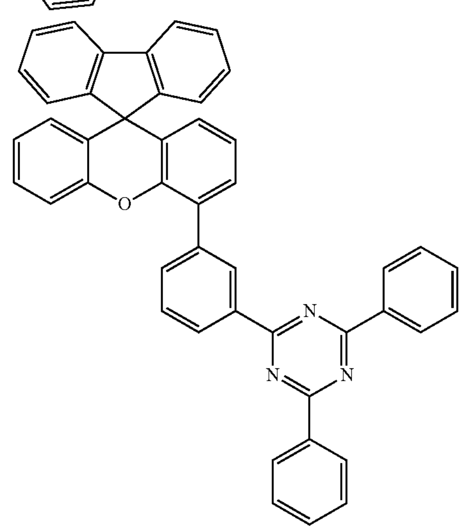

-continued
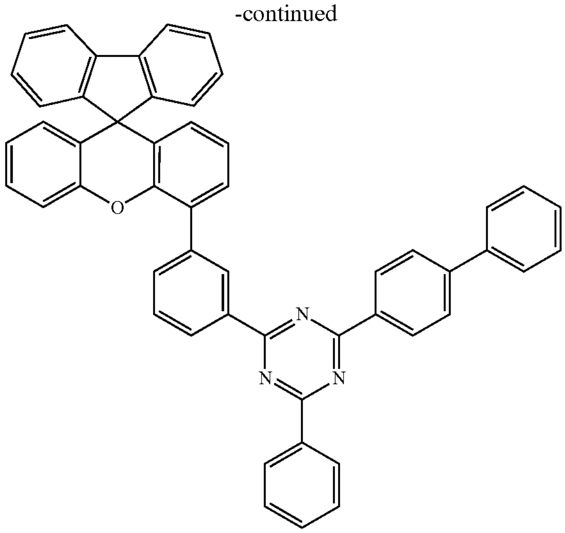
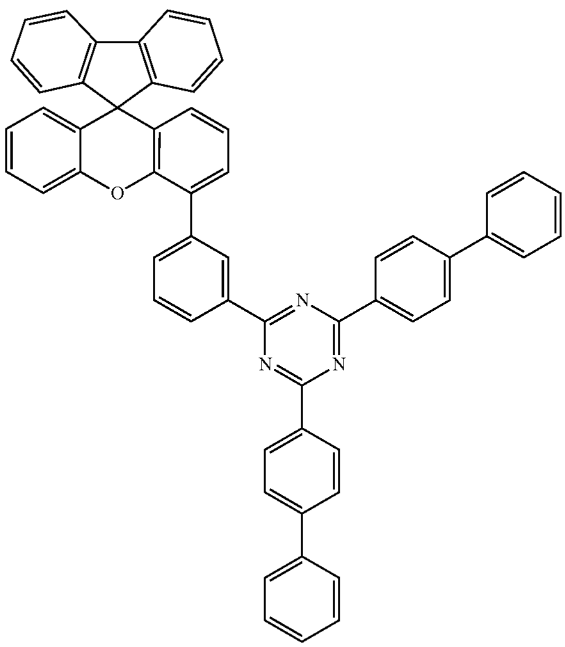
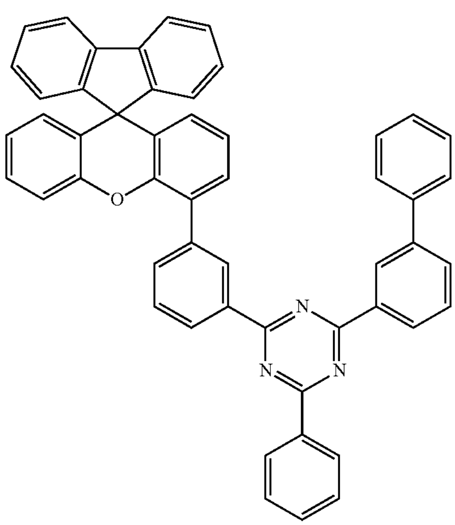
-continued
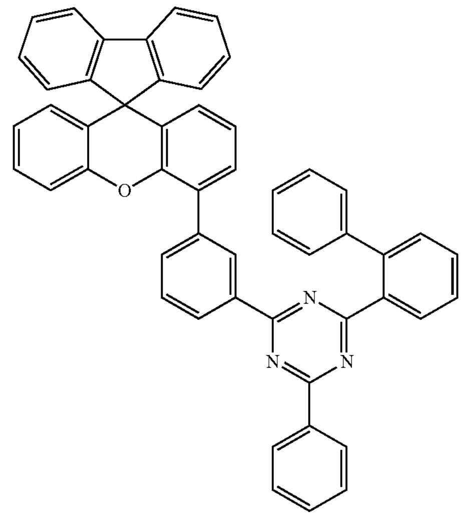
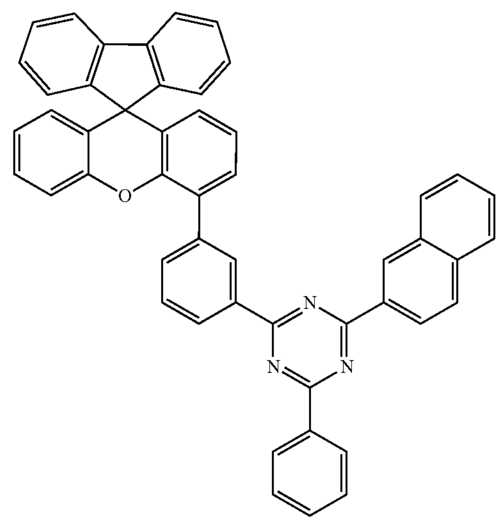
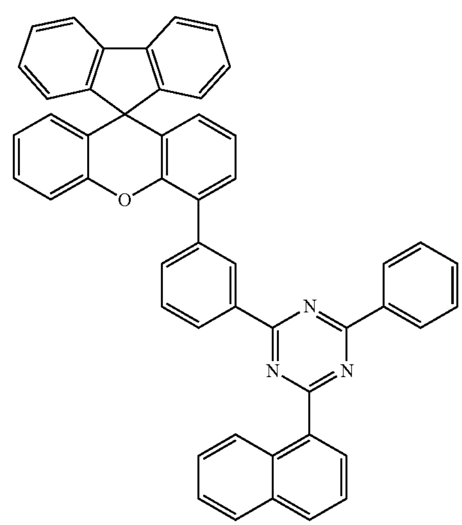

-continued
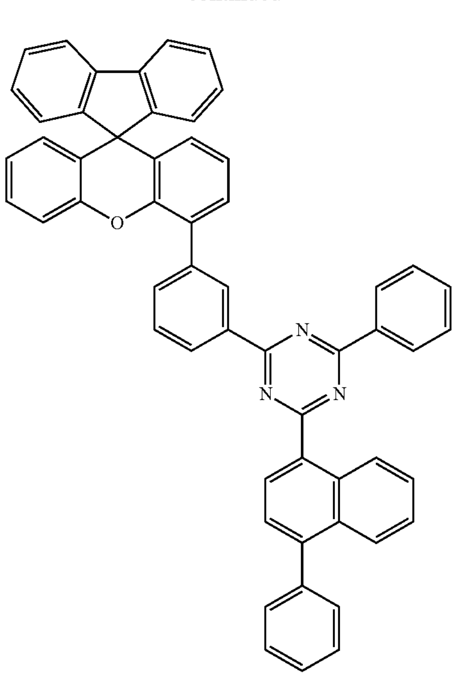
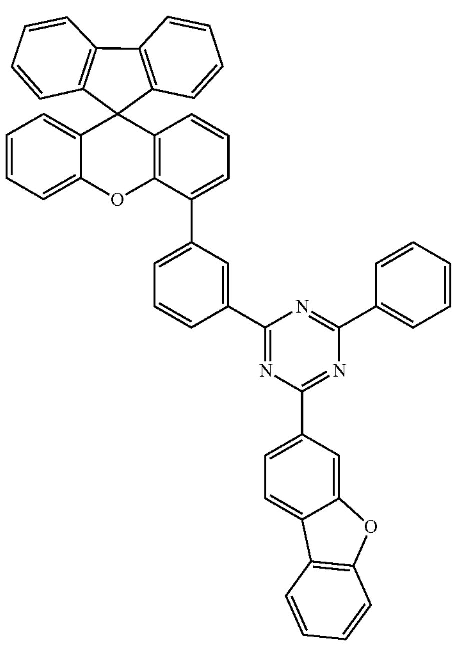
-continued
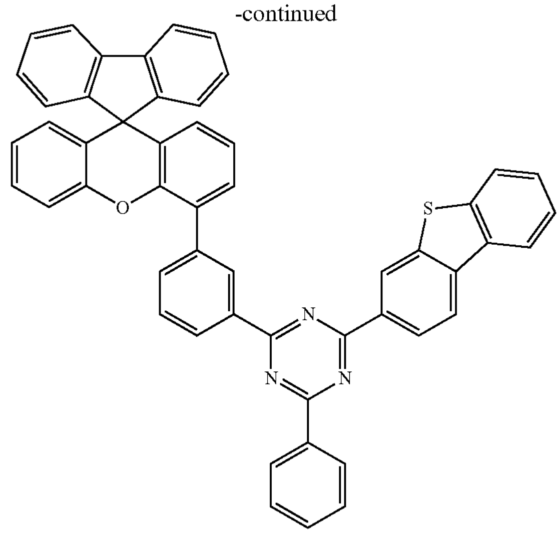
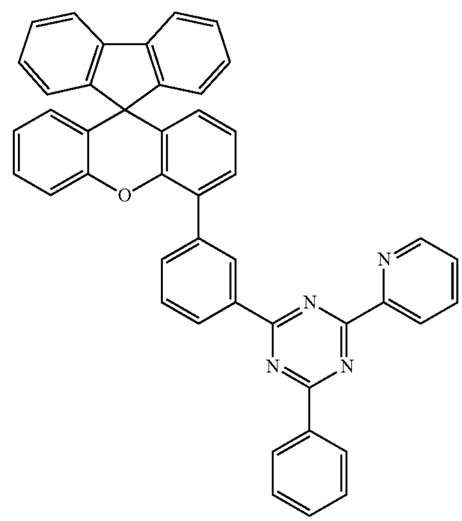
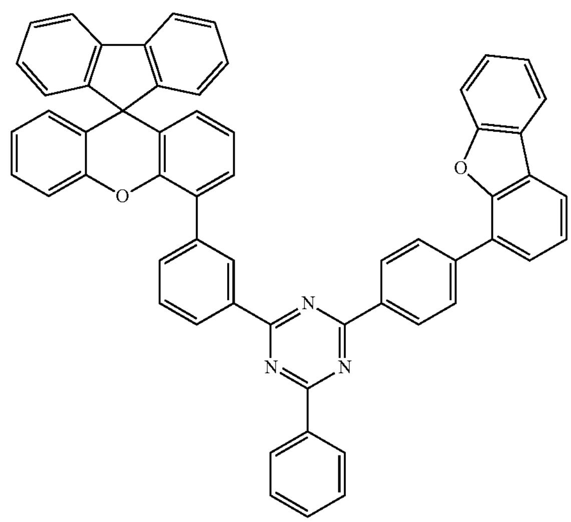

-continued
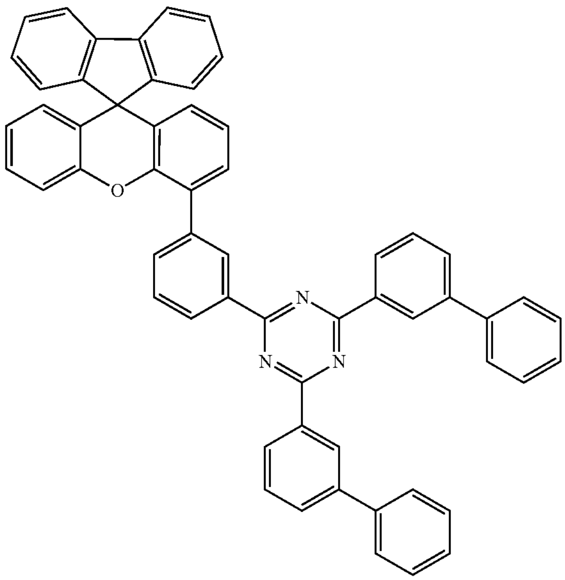
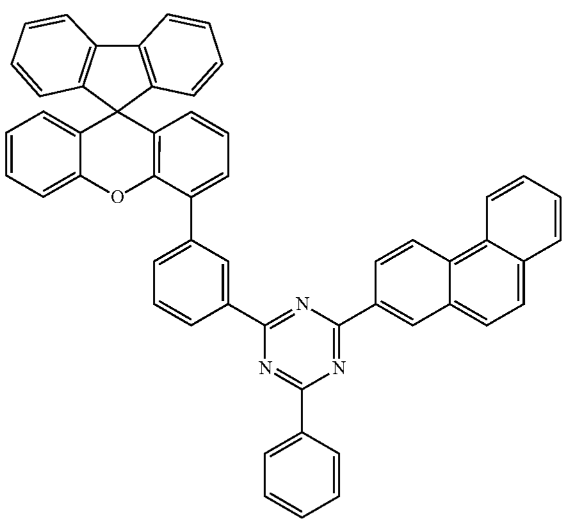
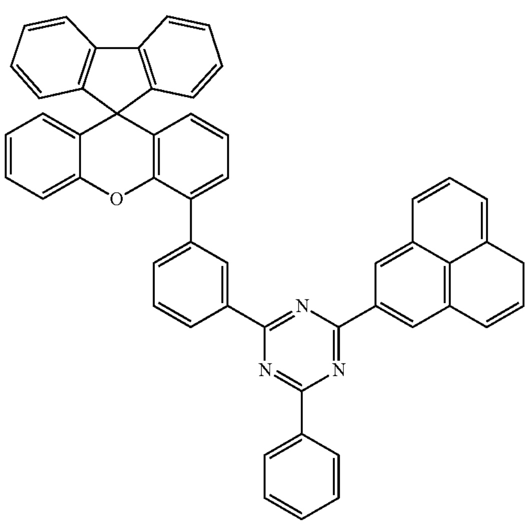
-continued
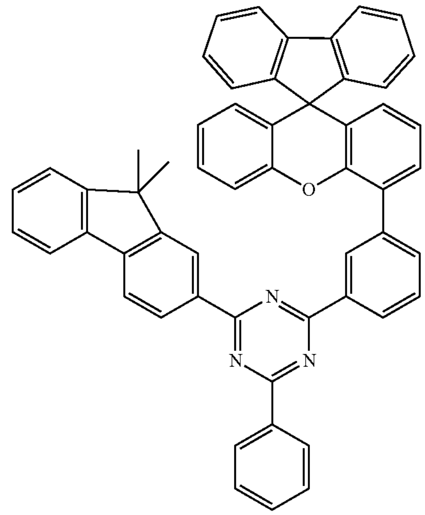
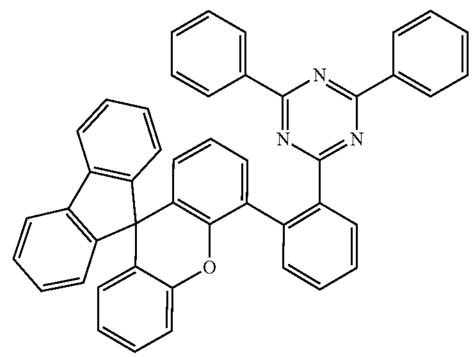
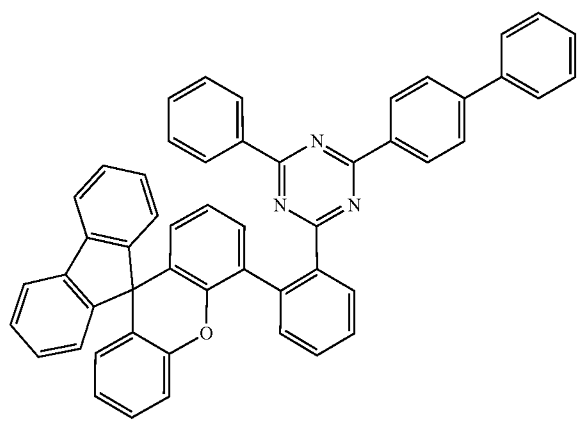
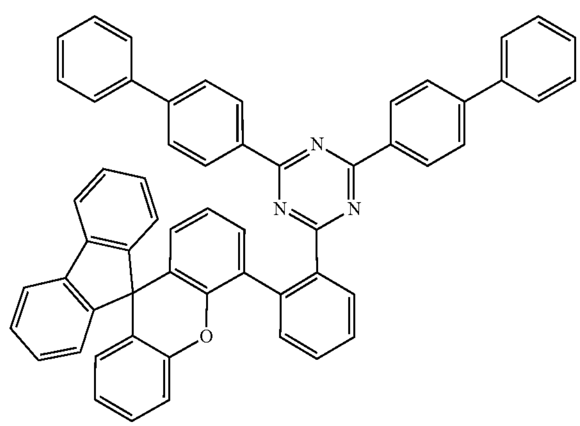

-continued
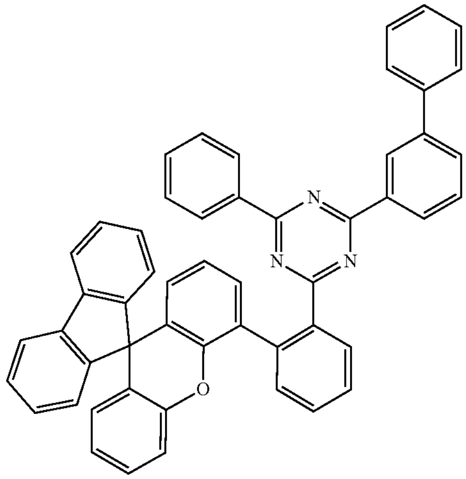
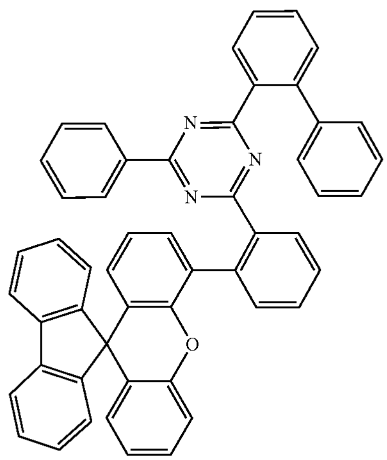
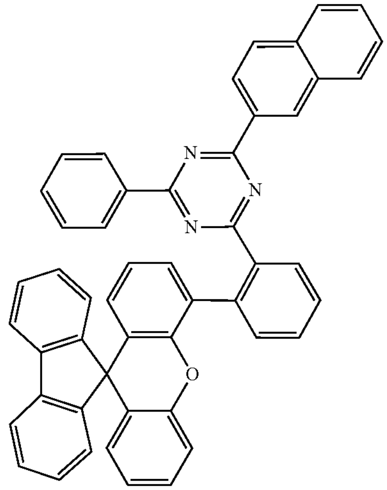
-continued
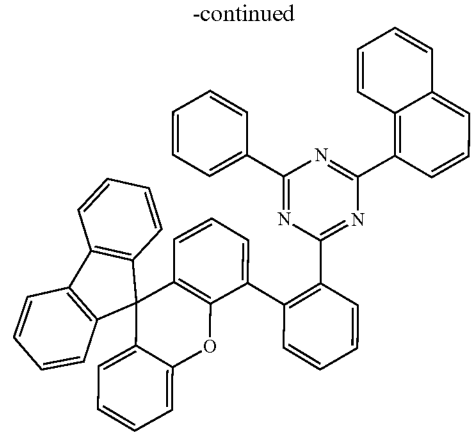
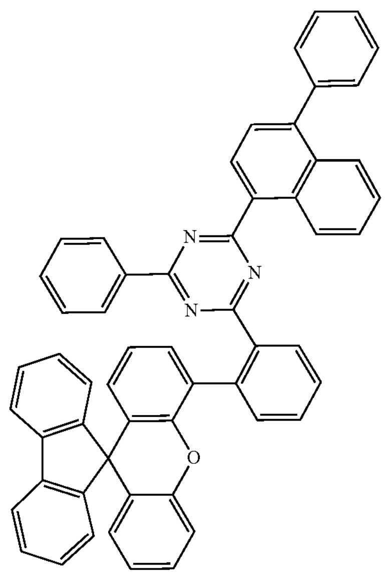
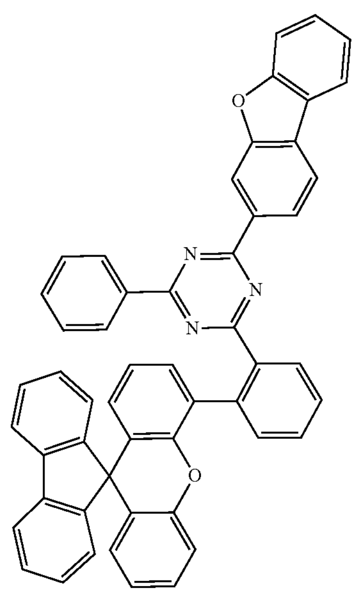

-continued
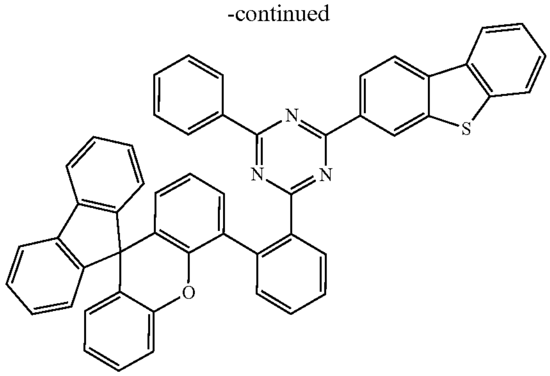
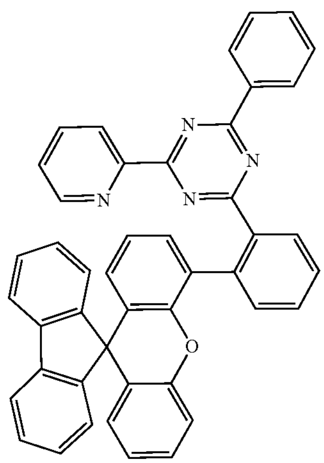
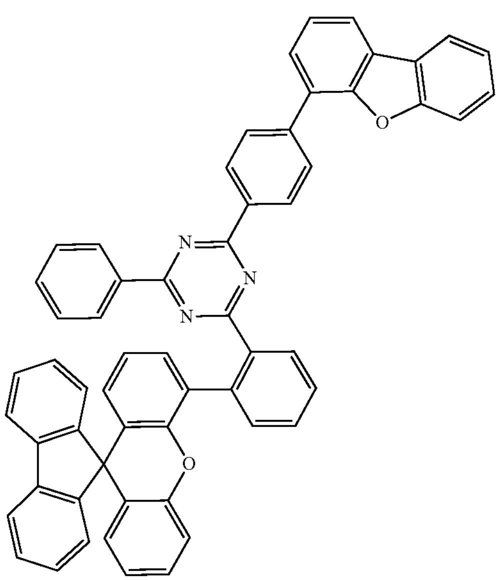
-continued
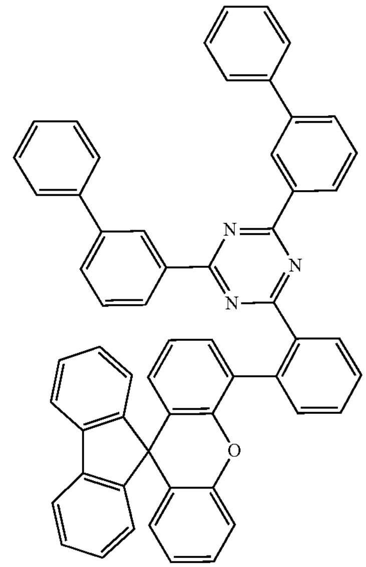
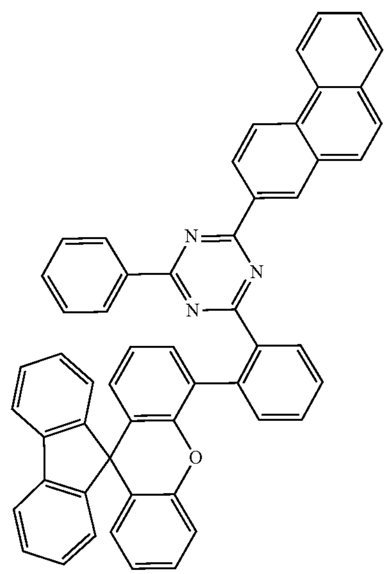
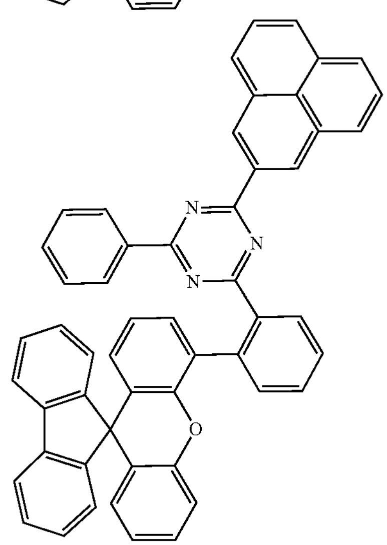

-continued
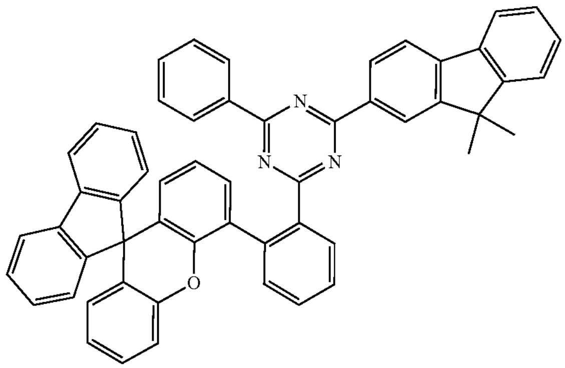
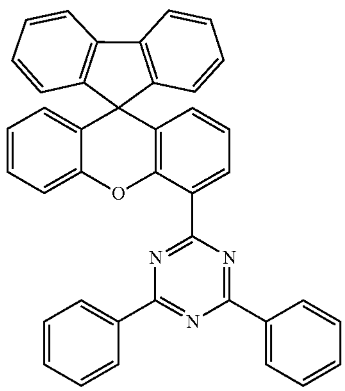
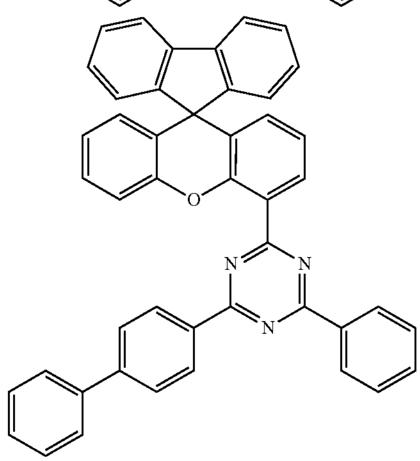
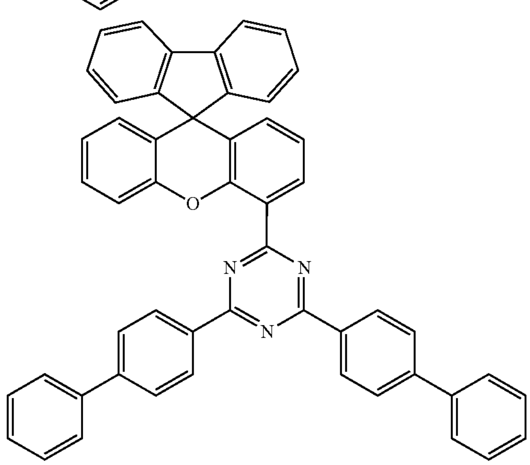
-continued
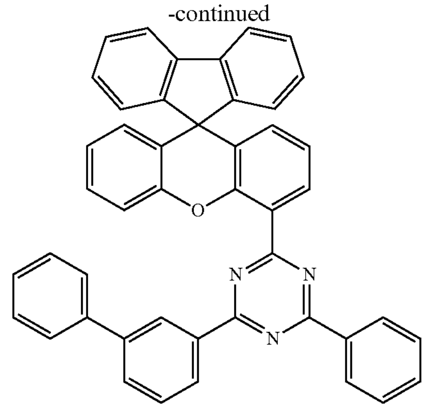
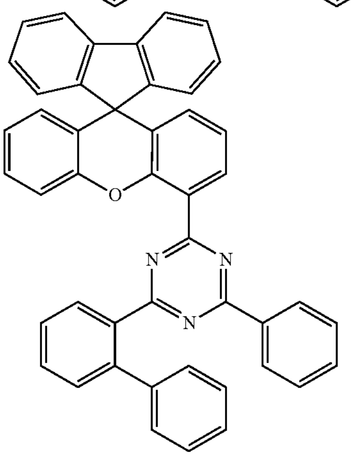
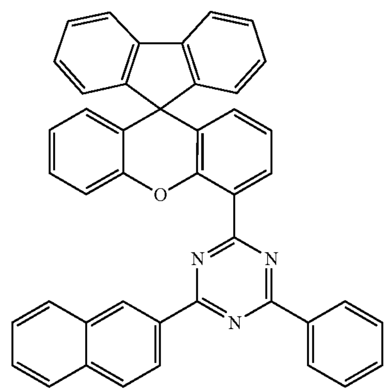
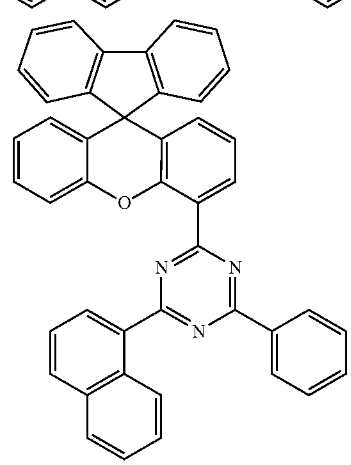

-continued
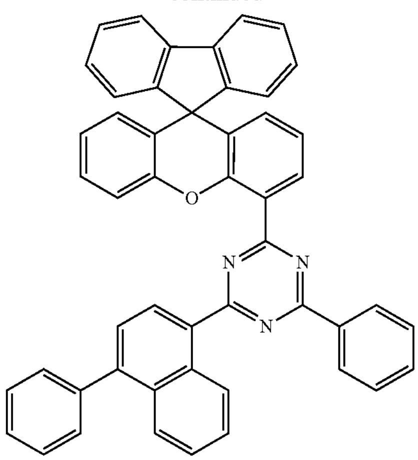
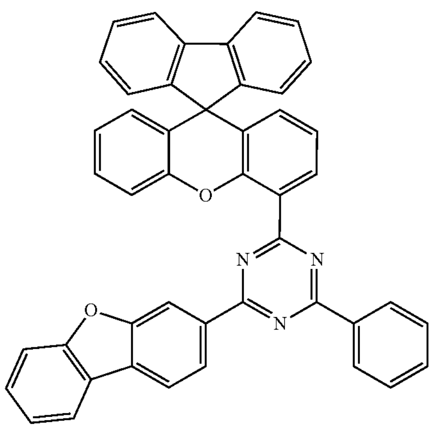
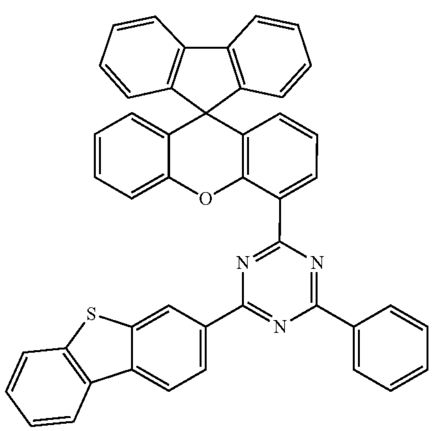
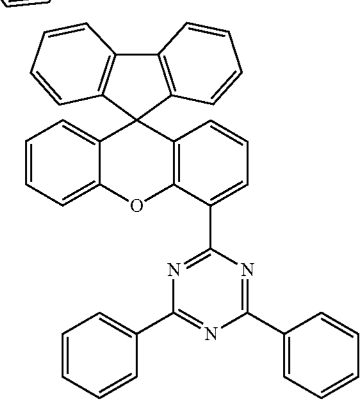
-continued
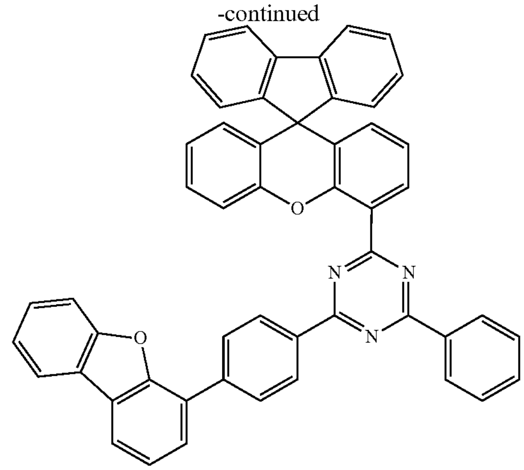
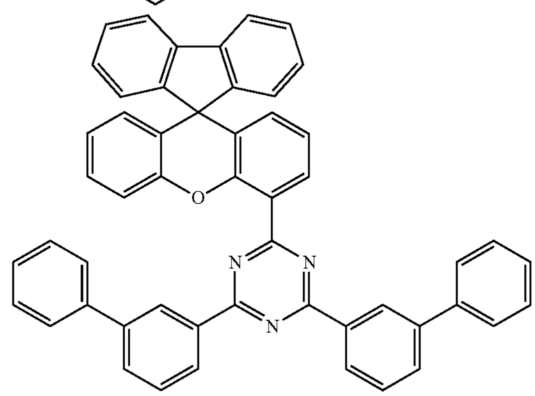
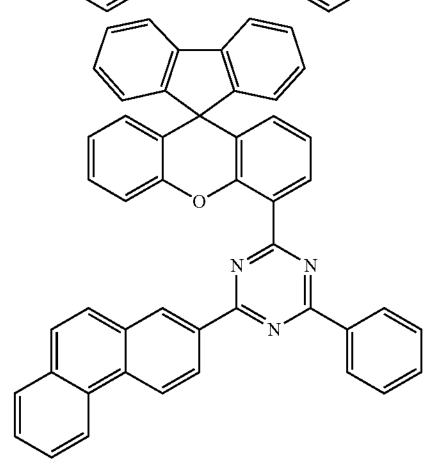
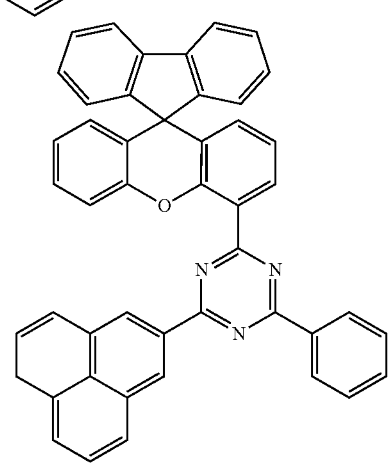

-continued

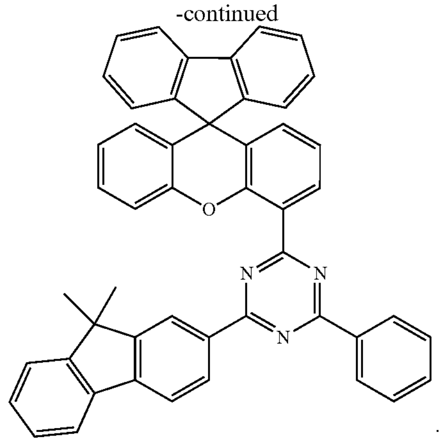

8. The organic light emitting device of claim 3, further comprising one or more light emitting layers.

9. The organic light emitting device of claim 3, further comprising one or more light emitting layers having a maximum light emission peak appearing in a wavelength range different from a wavelength range of a maximum light emission peak that the light emitting layer including one or more types of the compound of Chemical Formula 1 has.

10. The organic light emitting device of claim 8, wherein the light emitting layer including one or more types of the compound of Chemical Formula 1 further includes a fluorescent dopant.

11. The organic light emitting device of claim 9, wherein the one or more light emitting layers having a maximum light emission peak appearing in a wavelength range different from a wavelength range of a maximum light emission peak that the light emitting layer including one or more types of the compound of Chemical Formula 1 has include a phosphorescent dopant.

* * * * *